(12) United States Patent
Williams et al.

(10) Patent No.: US 7,202,536 B2
(45) Date of Patent: Apr. 10, 2007

(54) MODULAR BIPOLAR-CMOS-DMOS ANALOG INTEGRATED CIRCUIT AND POWER TRANSISTOR TECHNOLOGY

(75) Inventors: Richard K. Williams, Cupertino, CA (US); Michael E. Cornell, Campbell, CA (US); Wai Tien Chan, Hong Kong (HK)

(73) Assignees: Advanced Analogic Technologies, Inc., Sunnyvale, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 146 days.

(21) Appl. No.: 10/767,905

(22) Filed: Jan. 28, 2004

(65) Prior Publication Data

US 2004/0251497 A1   Dec. 16, 2004

Related U.S. Application Data

(63) Continuation of application No. 10/262,567, filed on Sep. 29, 2002, now Pat. No. 6,855,985.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............ 257/371; 257/335; 257/338; 257/350; 257/351; 257/357; 257/369; 257/370

(58) Field of Classification Search ........... 257/335, 257/338, 350–351, 357, 369–371, 311
See application file for complete search history.

(56) References Cited

U.S. PATENT DOCUMENTS

| | | | |
|---|---|---|---|
| 4,411,058 A | 10/1983 | Chen | 438/218 |
| 4,669,178 A | 6/1987 | Johnson | 438/529 |
| 4,887,142 A | 12/1989 | Bertotti et al. | 257/338 |
| 4,968,639 A * | 11/1990 | Bergonzoni | 438/231 |
| 5,041,895 A | 8/1991 | Contiero et al. | 257/370 |
| 5,055,417 A | 10/1991 | Akcasu | 428/133 |
| 5,138,420 A * | 8/1992 | Komori et al. | 257/371 |
| 5,156,989 A | 10/1992 | Williams et al. | 438/206 |
| 5,374,569 A | 12/1994 | Yilmaz et al. | 438/203 |
| 5,376,816 A * | 12/1994 | Nishigoori et al. | 257/370 |
| 5,413,944 A | 5/1995 | Lee | 438/228 |
| 5,414,292 A | 5/1995 | Williams | 257/373 |
| 5,416,039 A | 5/1995 | Yilmaz et al. | 438/363 |
| 5,426,328 A | 6/1995 | Yilmaz et al. | 257/552 |
| 5,439,833 A | 8/1995 | Hebert et al. | 438/203 |
| 5,439,842 A | 8/1995 | Chang et al. | 438/448 |
| 5,451,530 A | 9/1995 | Bell et al. | 438/526 |
| 5,455,189 A | 10/1995 | Grubisich | 438/207 |
| 5,478,759 A | 12/1995 | Mametani et al. | 438/228 |

(Continued)

*Primary Examiner*—Ida M. Soward
(74) *Attorney, Agent, or Firm*—Silicon Valley Patent Group LLP

(57) ABSTRACT

A family of semiconductor devices is formed in a substrate that contains no epitaxial layer. In one embodiment the family includes a 5V CMOS pair, a 12V CMOS pair, a 5V NPN, a 5V PNP, several forms of a lateral trench MOSFET, and a 30V lateral N-channel DMOS. Each of the devices is extremely compact, both laterally and vertically, and can be fully isolated from all other devices in the substrate.

18 Claims, 217 Drawing Sheets

U.S. PATENT DOCUMENTS

| | | | | |
|---|---|---|---|---|
| 5,478,761 A | 12/1995 | Komori et al. | | 438/228 |
| 5,485,027 A | 1/1996 | Williams et al. | | 257/343 |
| 5,514,608 A | 5/1996 | Williams et al. | | 438/286 |
| 5,569,620 A | 10/1996 | Linn et al. | | 438/406 |
| 5,573,963 A | 11/1996 | Sung | | 438/217 |
| 5,648,281 A | 7/1997 | Williams et al. | | 438/358 |
| 5,654,574 A | 8/1997 | Williams et al. | | 257/355 |
| 5,698,458 A | 12/1997 | Hsue et al. | | 438/451 |
| 5,744,845 A | * | 4/1998 | Sayama et al. | 257/371 |
| 5,751,054 A | | 5/1998 | Yilmaz et al. | 257/603 |
| 5,777,362 A | | 7/1998 | Pearce | 257/335 |
| 5,789,788 A | * | 8/1998 | Ema et al. | 257/371 |
| 5,793,085 A | * | 8/1998 | Vajana et al. | 257/370 |
| 5,798,295 A | | 8/1998 | Hoover et al. | 438/533 |
| 5,811,334 A | | 9/1998 | Buller et al. | 438/264 |
| 5,817,546 A | | 10/1998 | Ferla et al. | 438/138 |
| 5,898,007 A | | 4/1999 | Lee | 438/514 |
| 5,966,599 A | | 10/1999 | Walker et al. | 438/228 |
| 6,017,787 A | | 1/2000 | Chittipeddi et al. | 438/228 |
| 6,031,267 A | * | 2/2000 | Lien | 257/344 |
| 6,054,374 A | | 4/2000 | Gardner et al. | 438/528 |
| 6,096,625 A | | 8/2000 | Daniel et al. | 438/473 |
| 6,207,484 B1 | | 3/2001 | Kim et al. | 438/209 |
| 6,251,757 B1 | | 6/2001 | Yu | 438/528 |
| RE37,424 E | | 10/2001 | Contiero et al. | 257/370 |
| 6,303,961 B1 | | 10/2001 | Shibib | 257/335 |
| 6,365,447 B1 | | 4/2002 | Hebert et al. | 438/203 |
| 6,391,700 B1 | | 5/2002 | Tsay | 438/224 |
| 6,391,754 B1 | | 5/2002 | Paranjpe | 438/592 |
| 6,392,275 B1 | | 5/2002 | Jang | 257/343 |
| 6,476,457 B2 | | 11/2002 | Oh | 257/492 |
| 6,501,131 B1 | | 12/2002 | Divakaruni et al. | 257/344 |
| 6,586,297 B1 | | 7/2003 | U'Ren et al. | 438/235 |
| 6,630,699 B1 | | 10/2003 | Wylie | 257/288 |
| 6,649,983 B2 | * | 11/2003 | Chatterjee | 257/370 |
| 6,657,242 B1 | | 12/2003 | Norstrom et al. | 257/197 |
| 6,657,262 B2 | | 12/2003 | Patti | 257/370 |
| 6,730,964 B2 | * | 5/2004 | Horiuchi | 257/347 |
| 6,744,250 B2 | | 6/2004 | Hauenstein | 324/252 |
| 6,747,319 B2 | * | 6/2004 | Kojima et al. | 257/369 |
| 6,777,758 B2 | * | 8/2004 | Yamashita et al. | 257/369 |
| 6,791,147 B1 | * | 9/2004 | Karasawa et al. | 257/371 |
| 6,855,985 B2 | | 2/2005 | Williams et al. | 257/338 |
| 6,900,091 B2 | | 5/2005 | Williams et al. | 438/228 |
| 6,943,413 B2 | * | 9/2005 | Lee | 257/371 |
| 2002/0063267 A1 | * | 5/2002 | Kumagai et al. | 257/202 |
| 2002/0063297 A1 | * | 5/2002 | Lee | 257/371 |
| 2002/0135023 A1 | * | 9/2002 | Madhukar et al. | 257/371 |
| 2003/0052371 A1 | * | 3/2003 | Matsuzaki et al. | 257/371 |
| 2003/0132453 A1 | | 7/2003 | Greenberg et al. | 257/197 |
| 2004/0032005 A1 | | 2/2004 | Williams et al. | 257/510 |
| 2004/0033666 A1 | | 2/2004 | Williams et al. | 438/297 |
| 2005/0023606 A1 | | 2/2005 | Williams et al. | 257/328 |
| 2005/0042815 A1 | | 2/2005 | Williams et al. | 438/202 |
| 2005/0142724 A1 | | 6/2005 | Williams et al. | 438/199 |
| 2005/0142792 A1 | | 6/2005 | Williams et al. | 438/369 |
| 2005/0158939 A1 | | 7/2005 | Williams et al. | 438/199 |

* cited by examiner

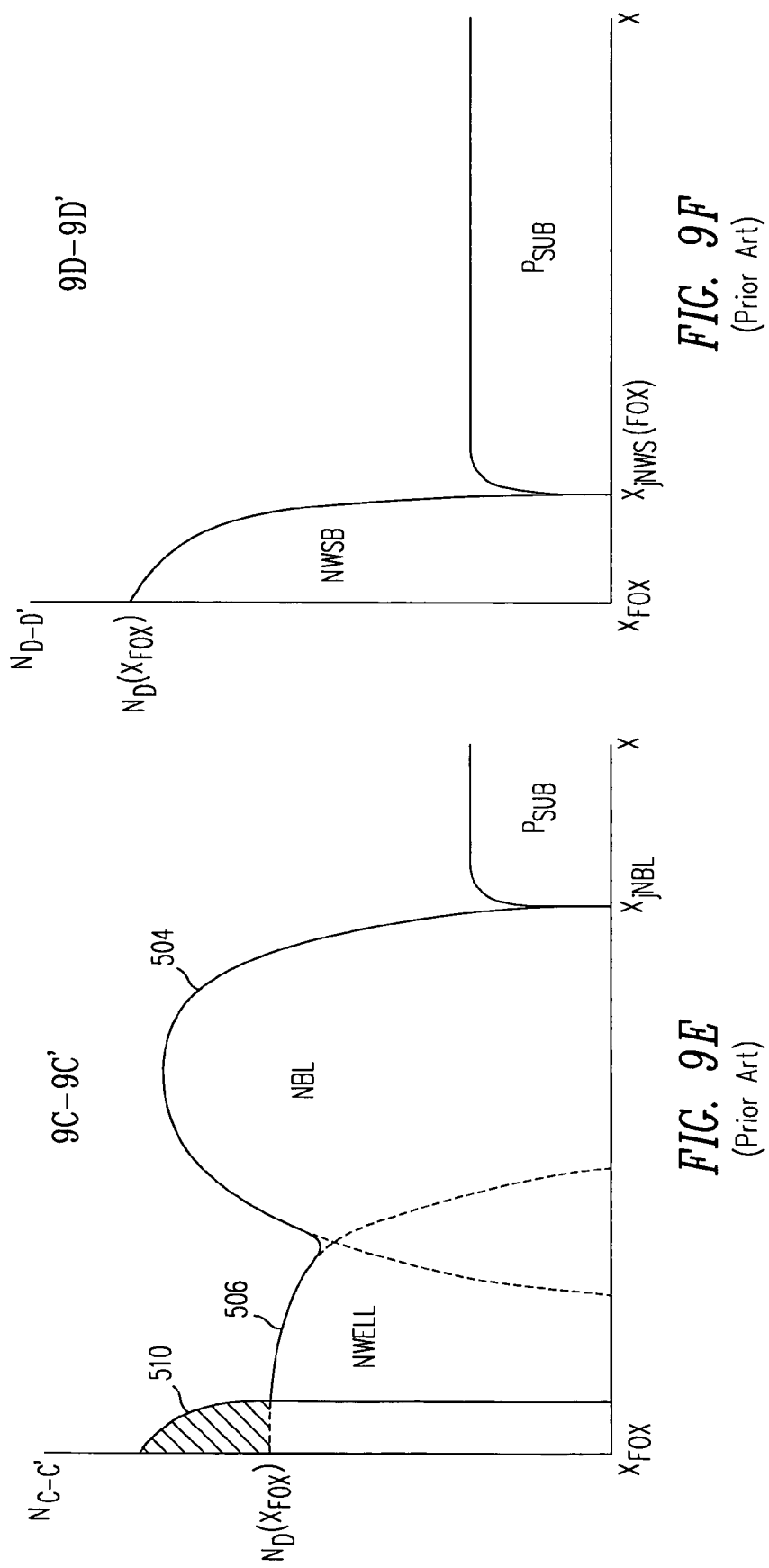

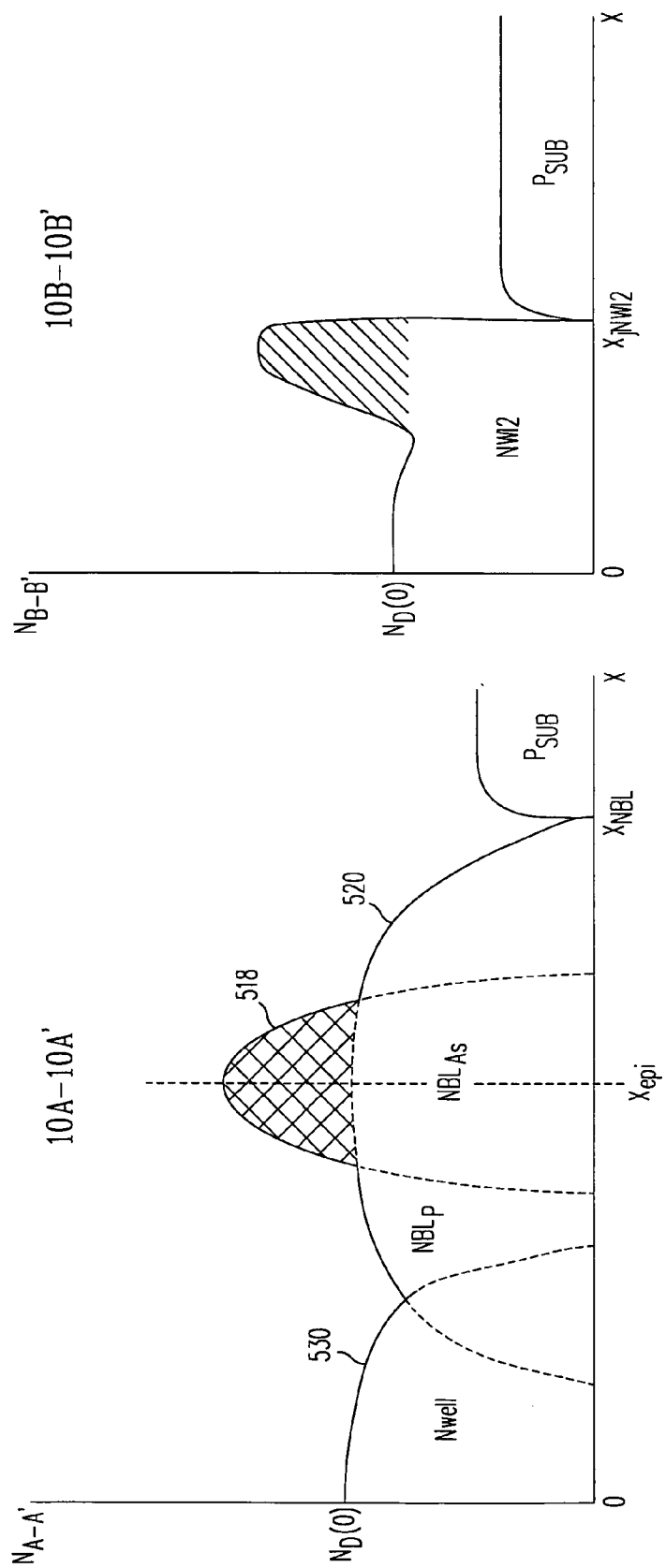

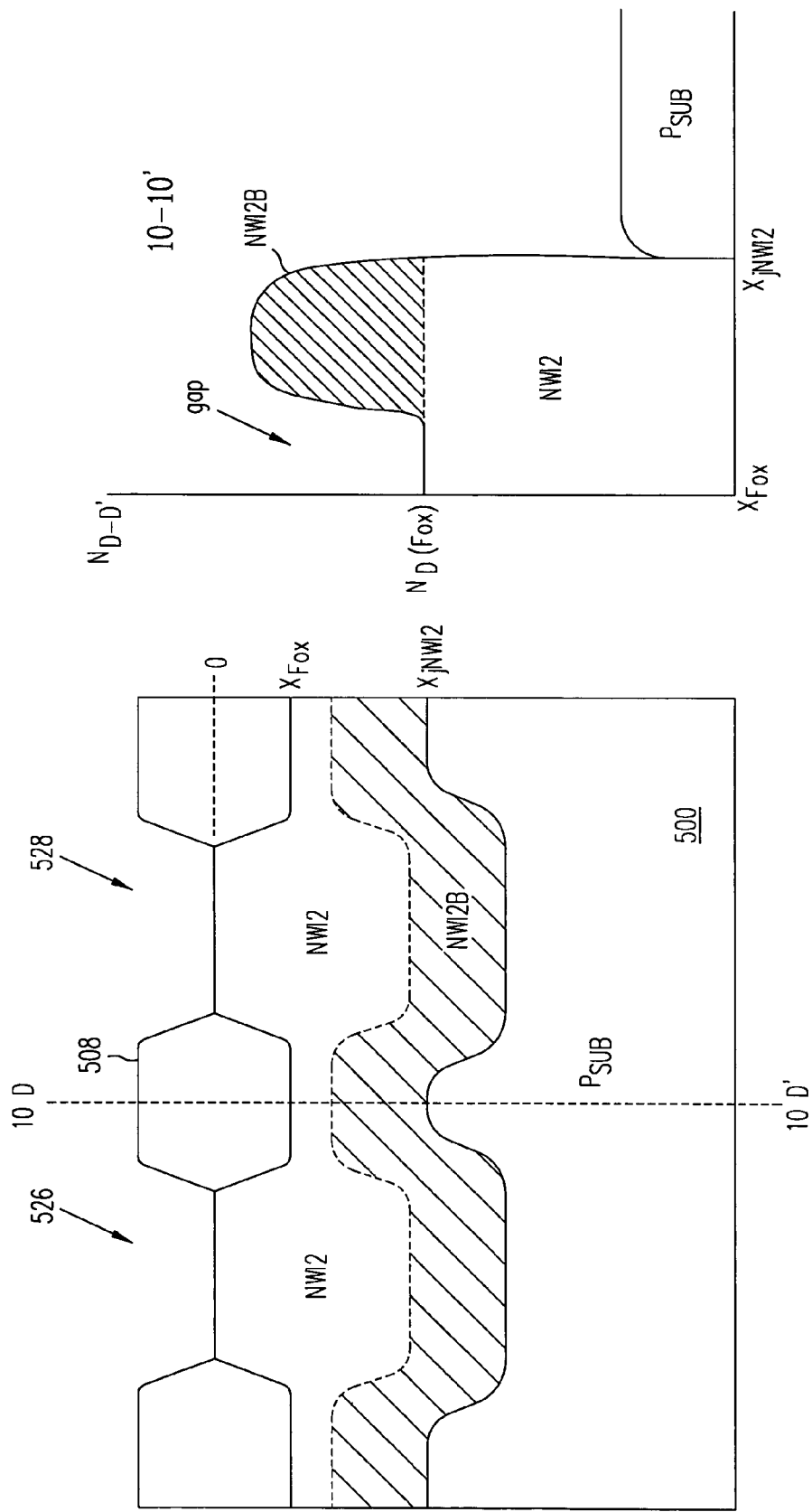

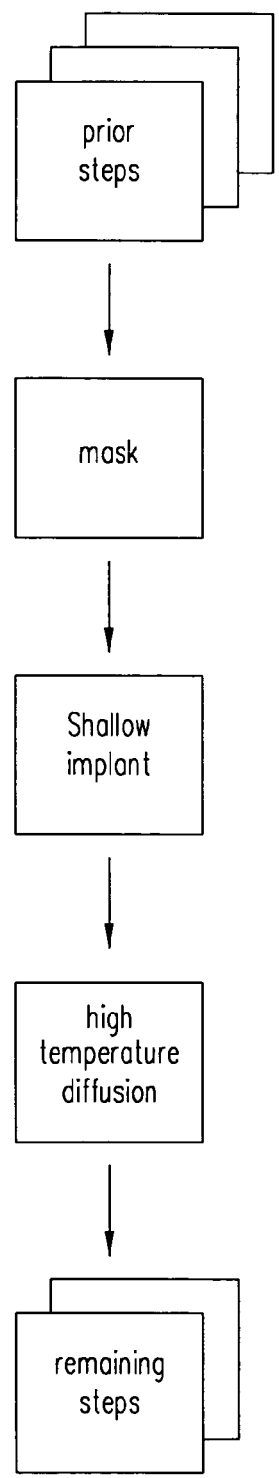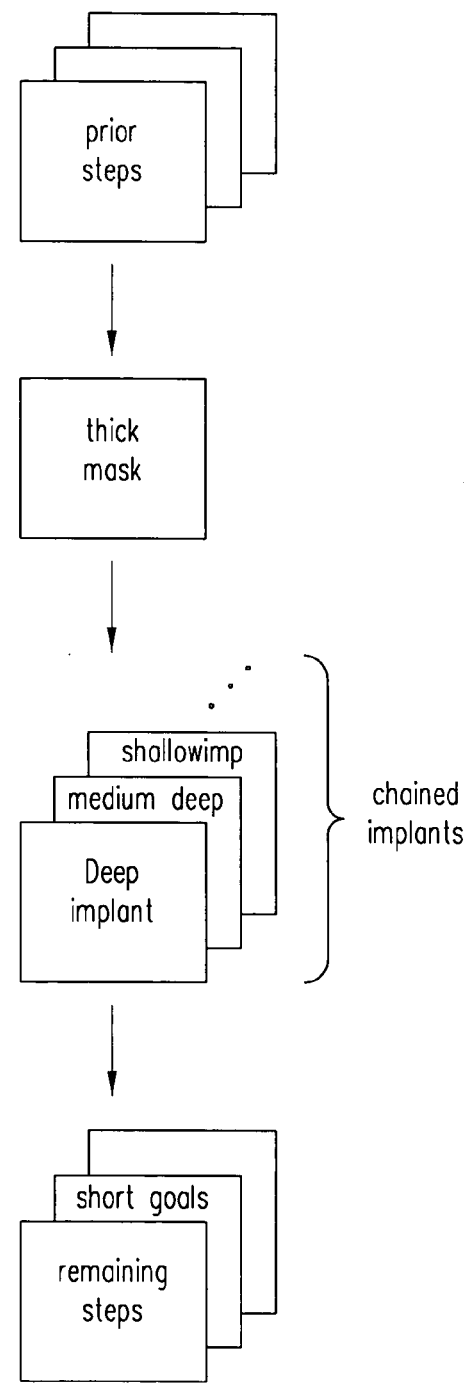
FIG. 17A
(Prior Art)
FIG. 17B

Key To

| FIG. 18B-1 | FIG. 18B-2 |
| --- | --- |
| FIG. 18B-3 | FIG. 18B-4 |

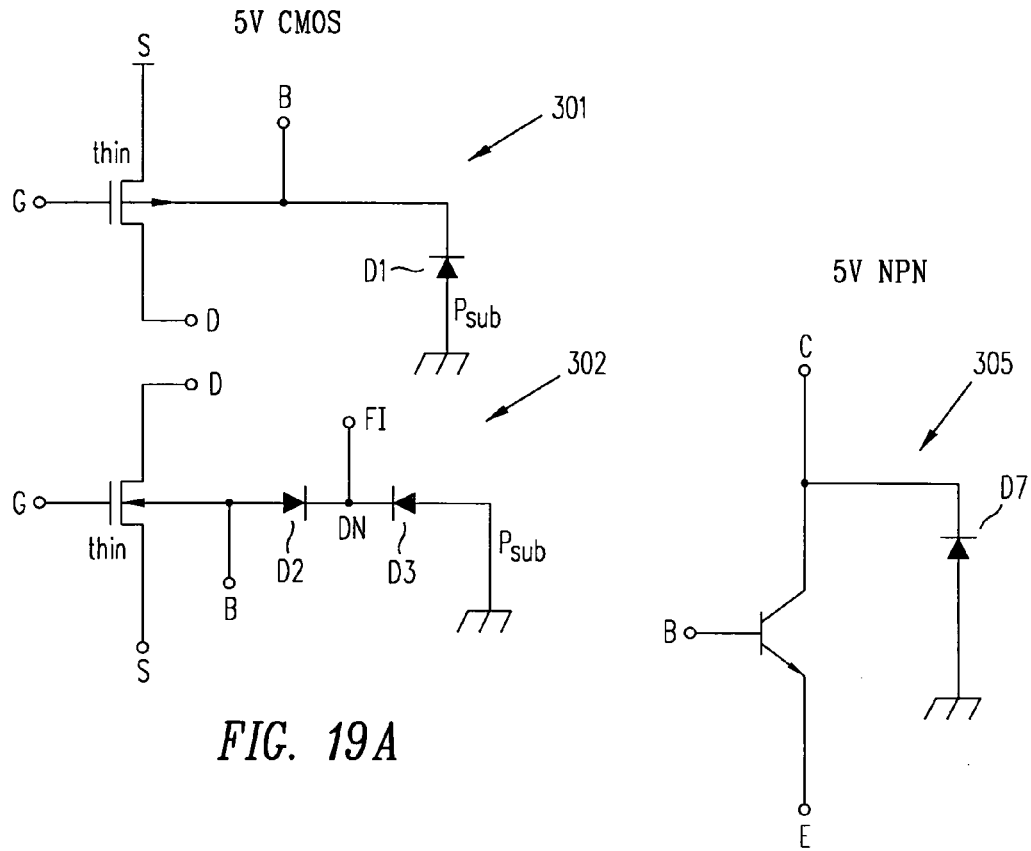
*FIG. 19A*
*FIG. 19C*
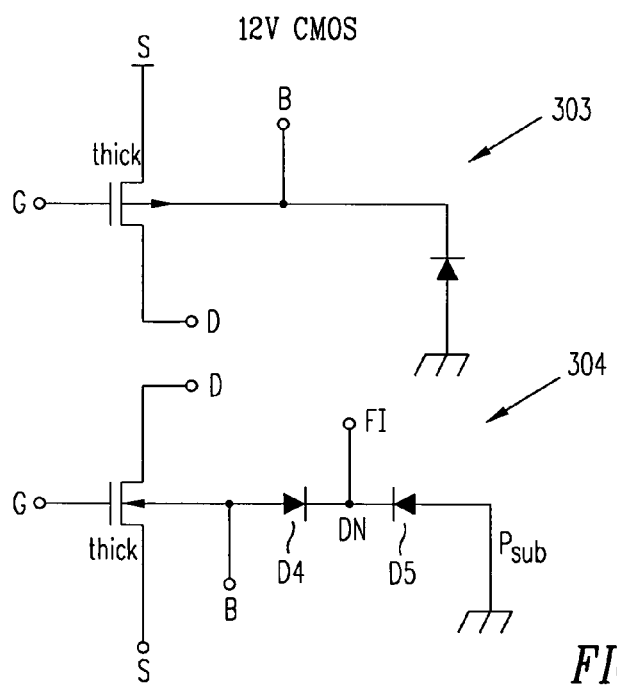
*FIG. 19B*

Key To

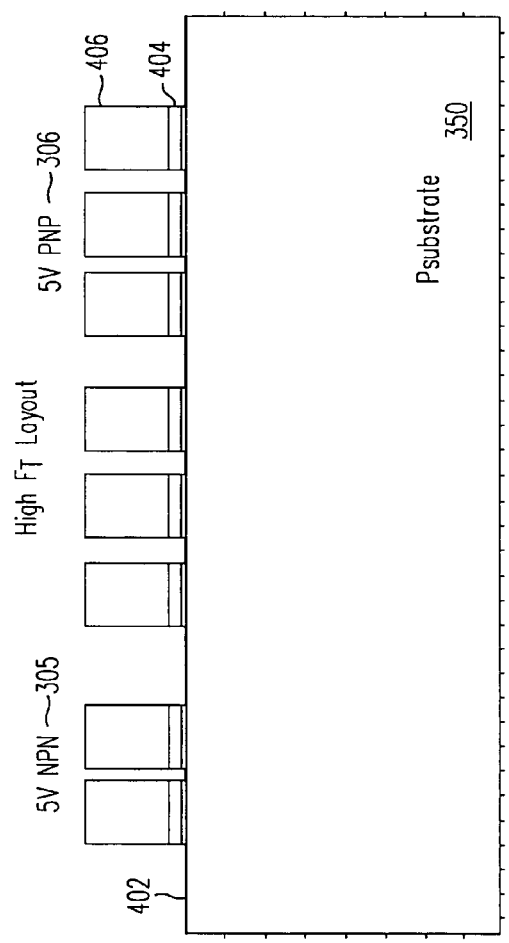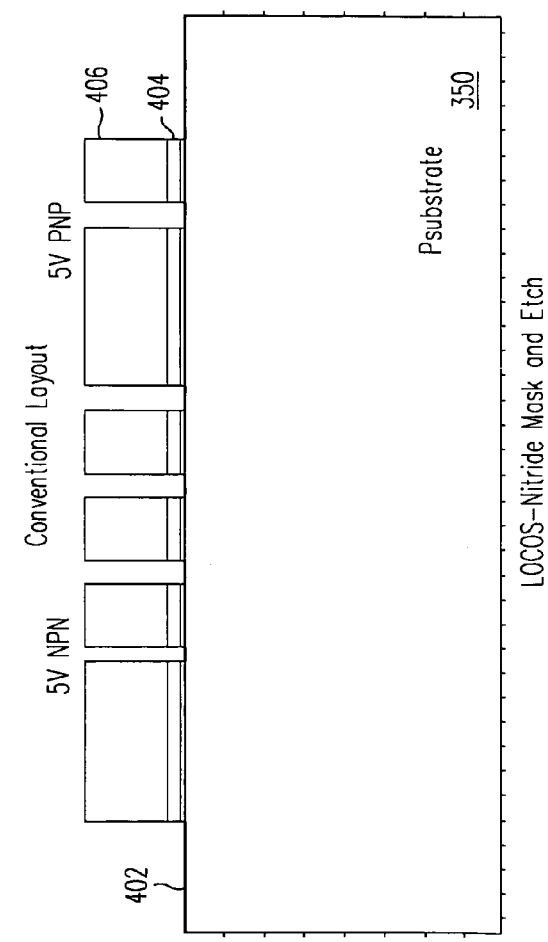

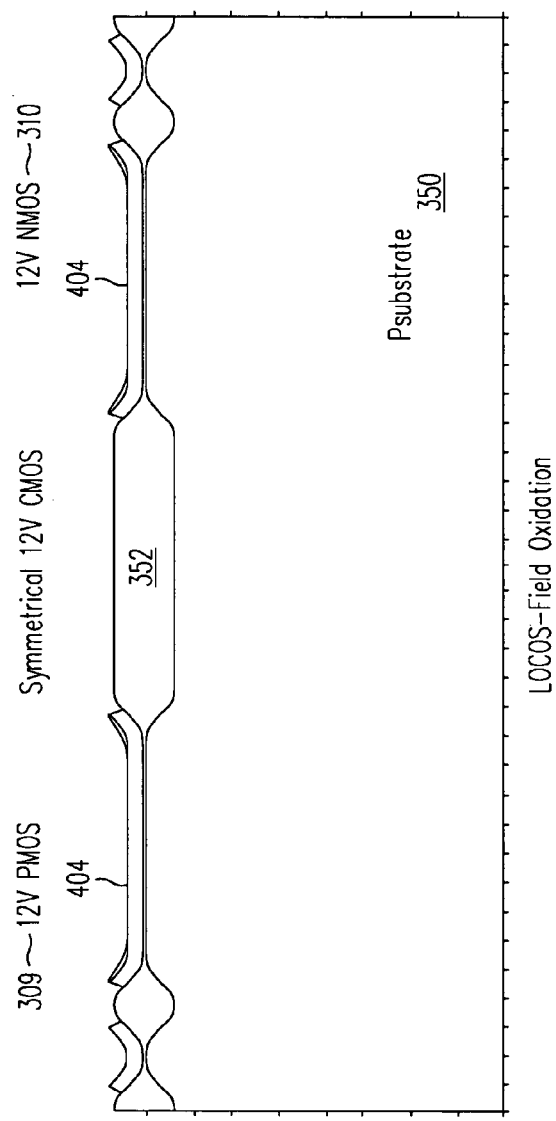

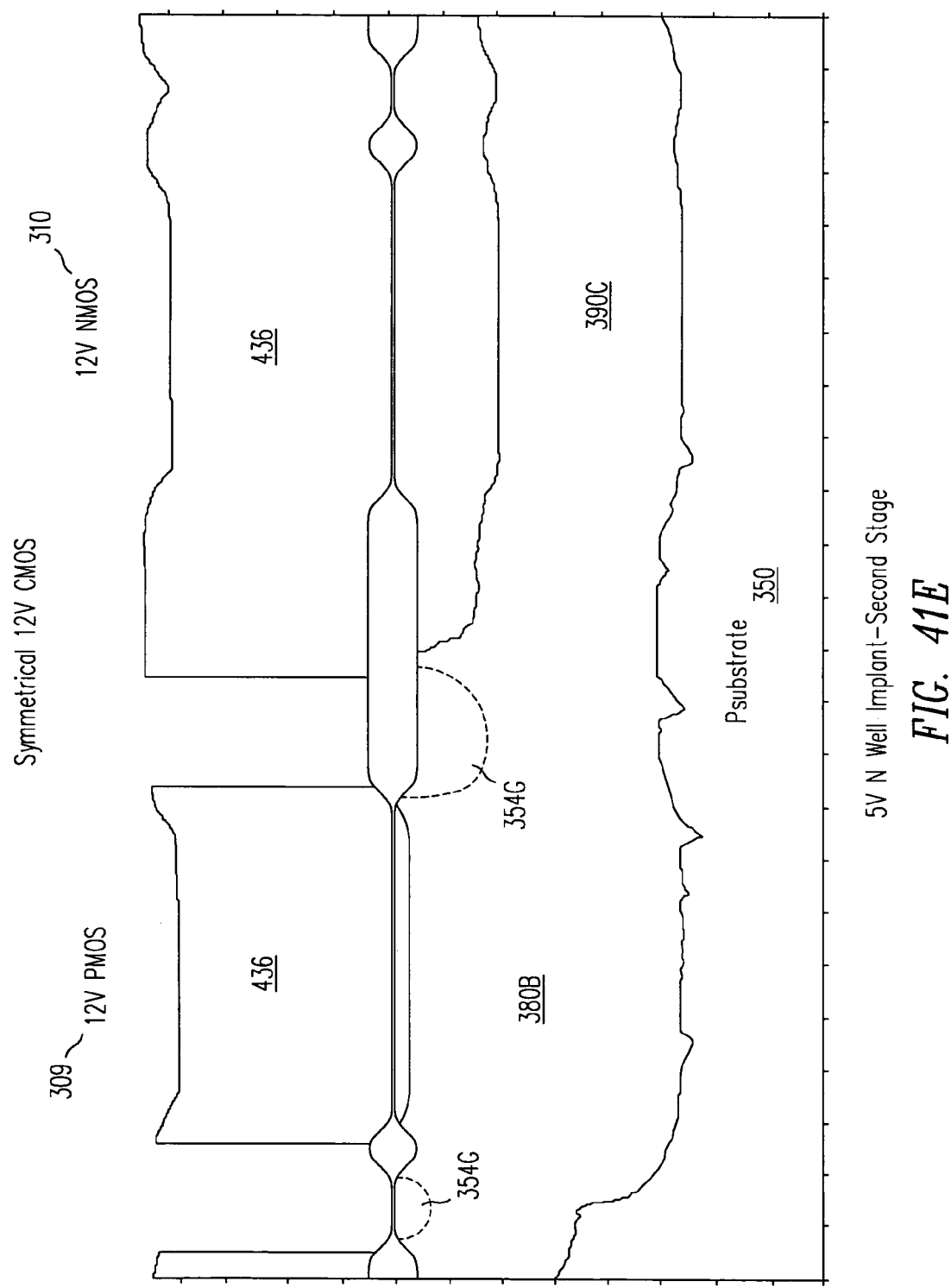

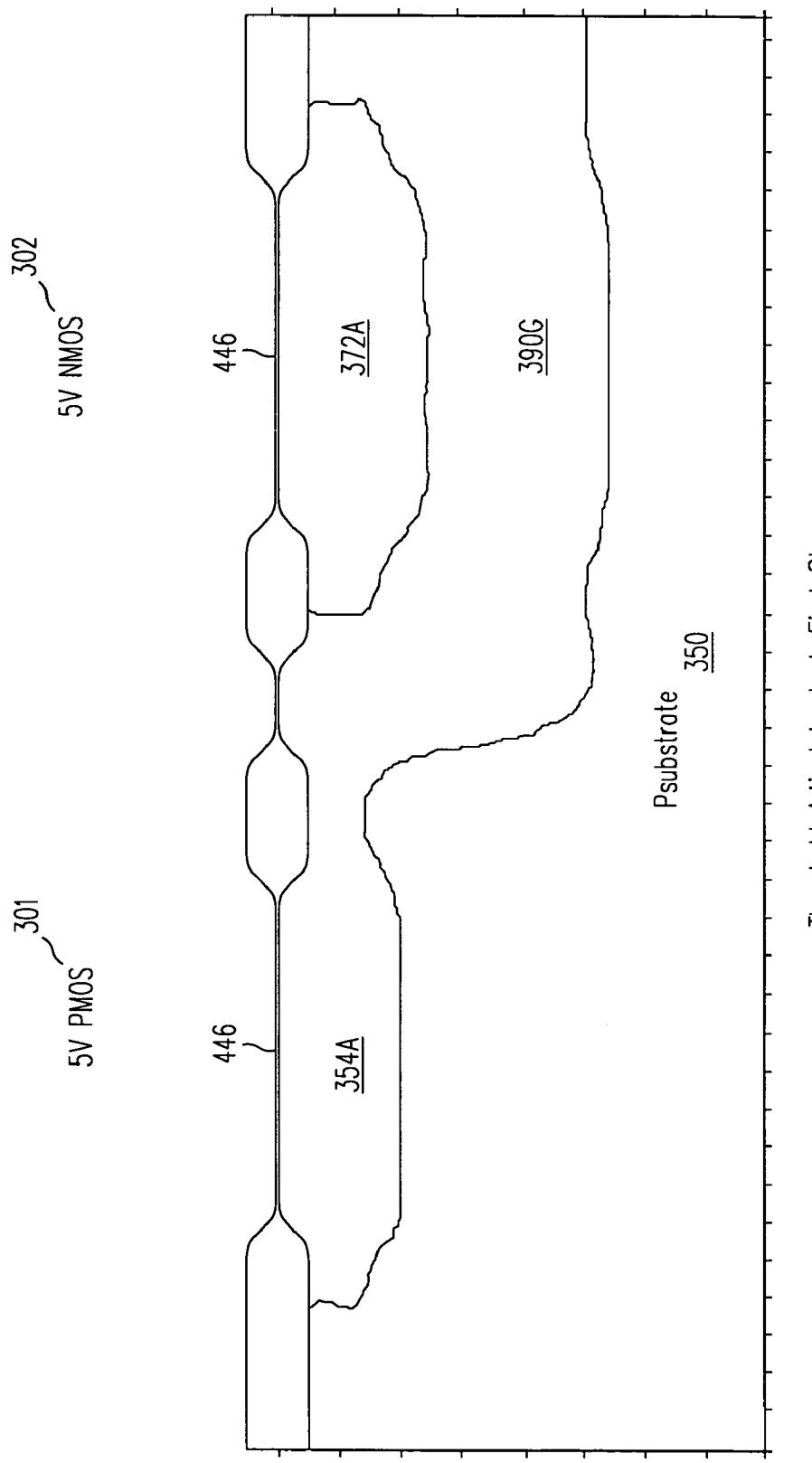

Threshold Adjust Implant-Second Stage
First Planar Gate Oxide Removal

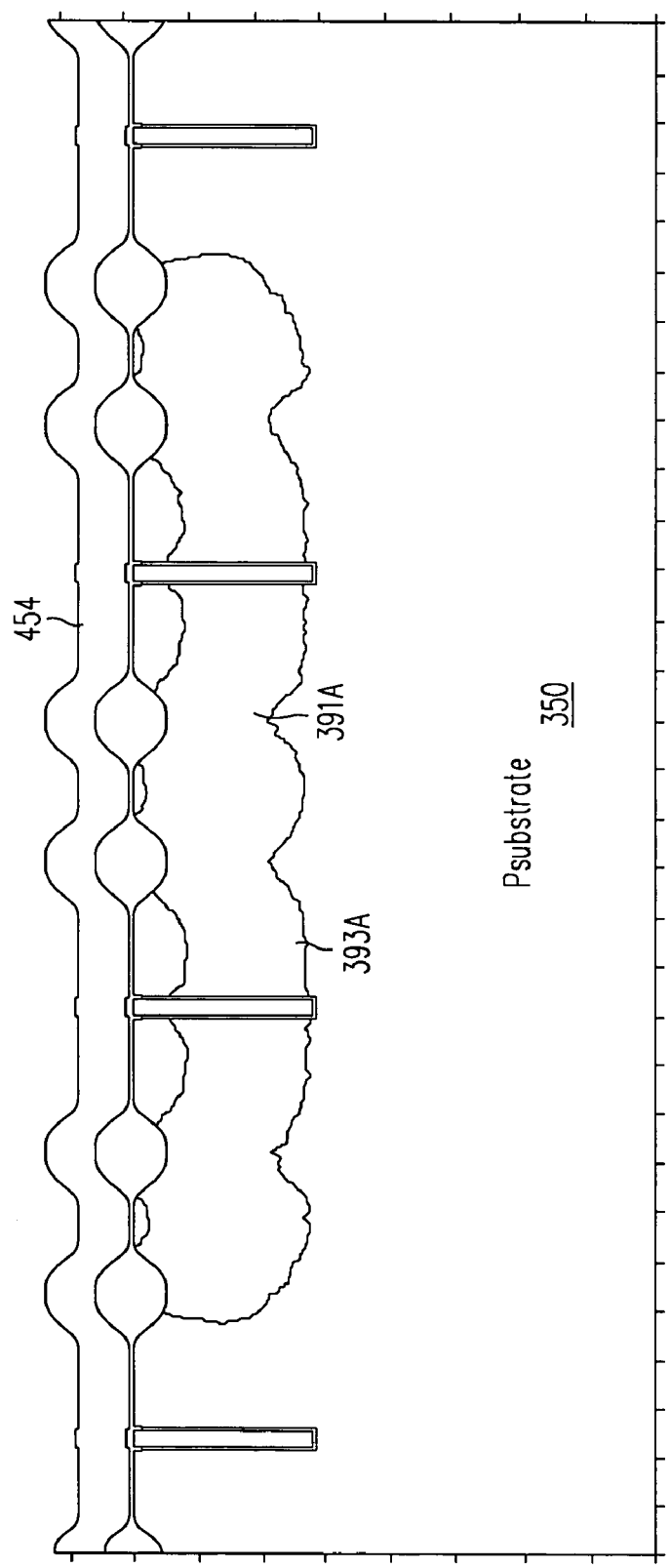

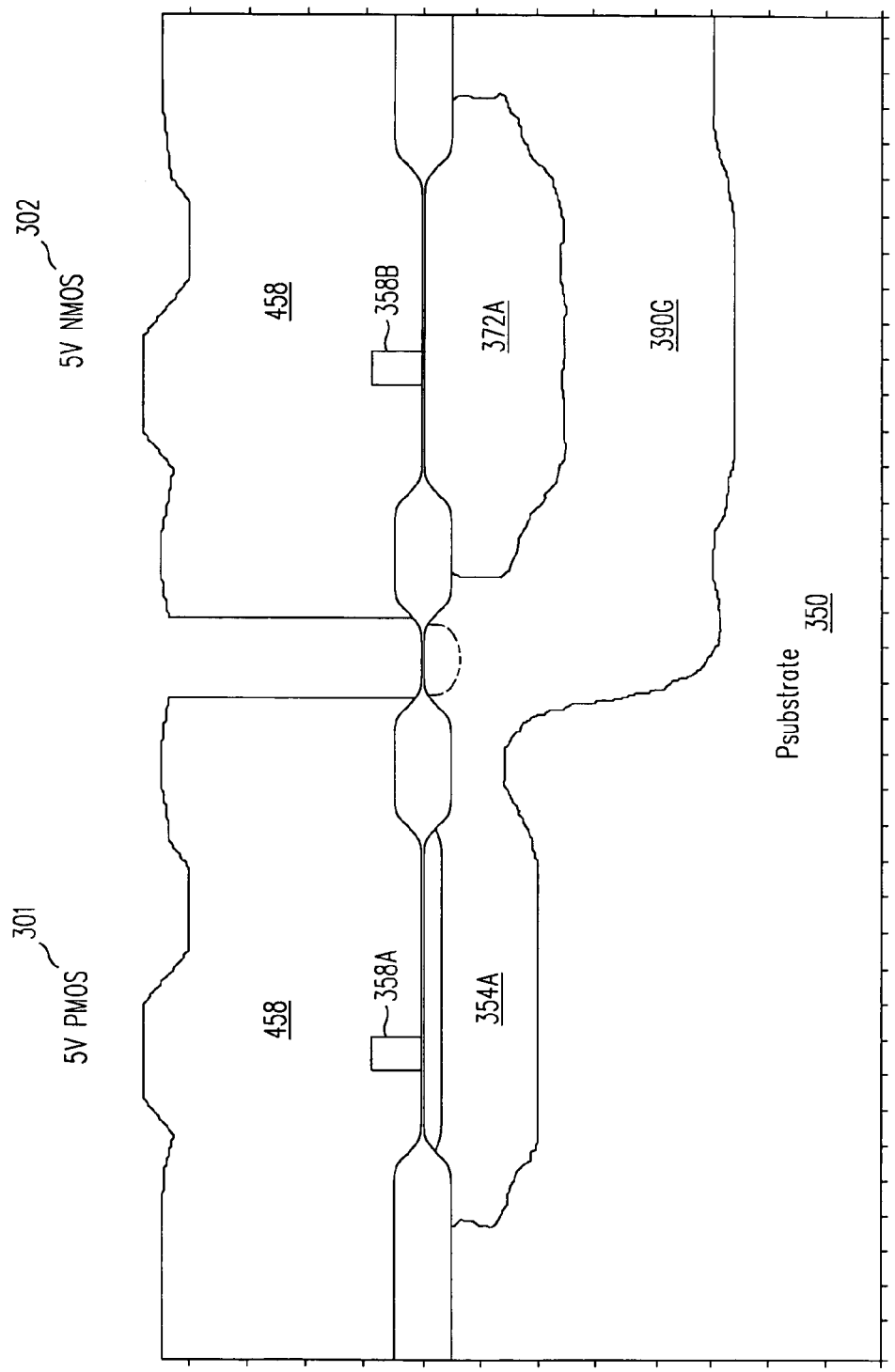
FIG. 54A   N-Base Mask and Implant

Interlayer Dielectric Deposition and Etch

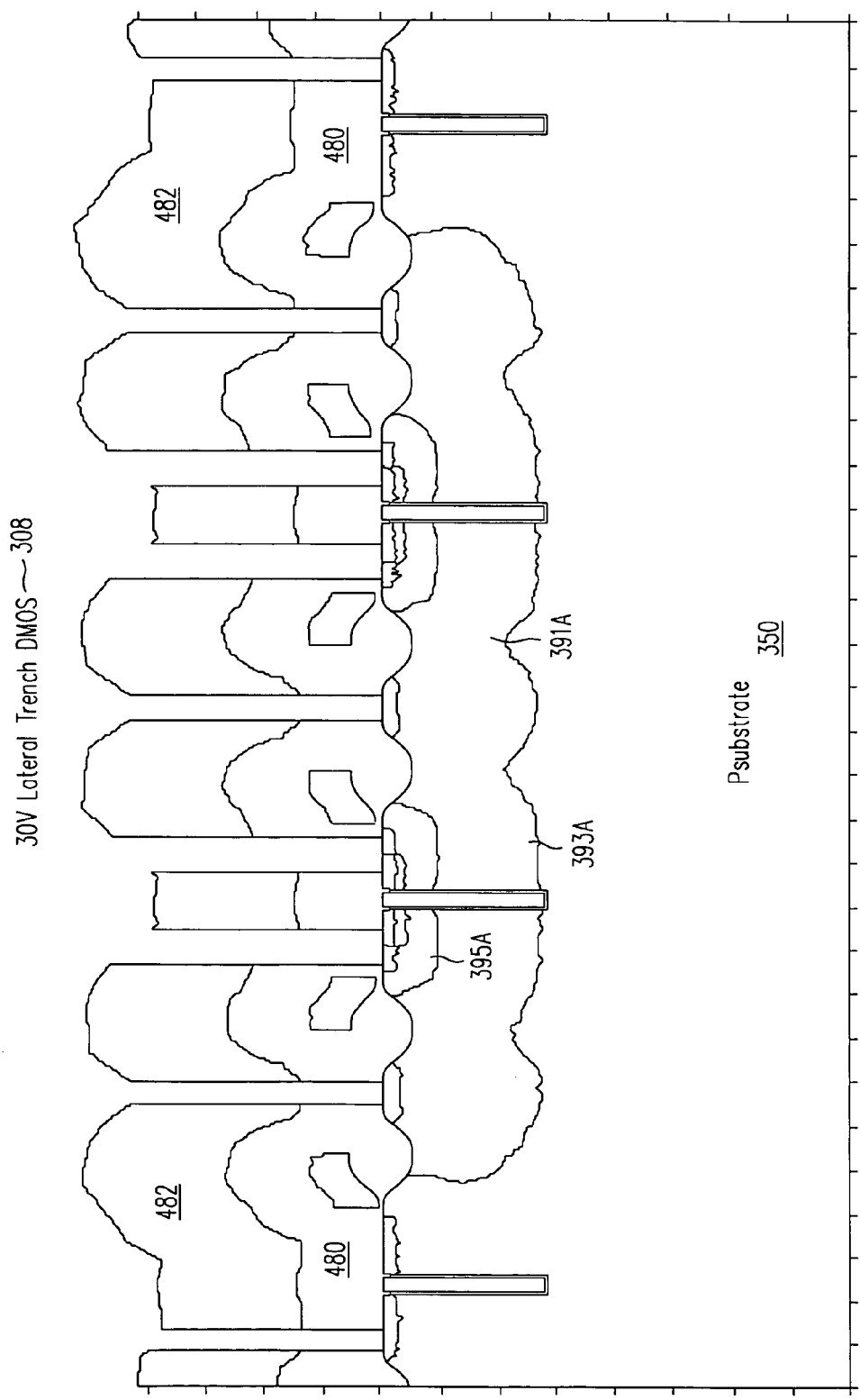
FIG. 64D Interlayer Dielectric Deposition and Etch

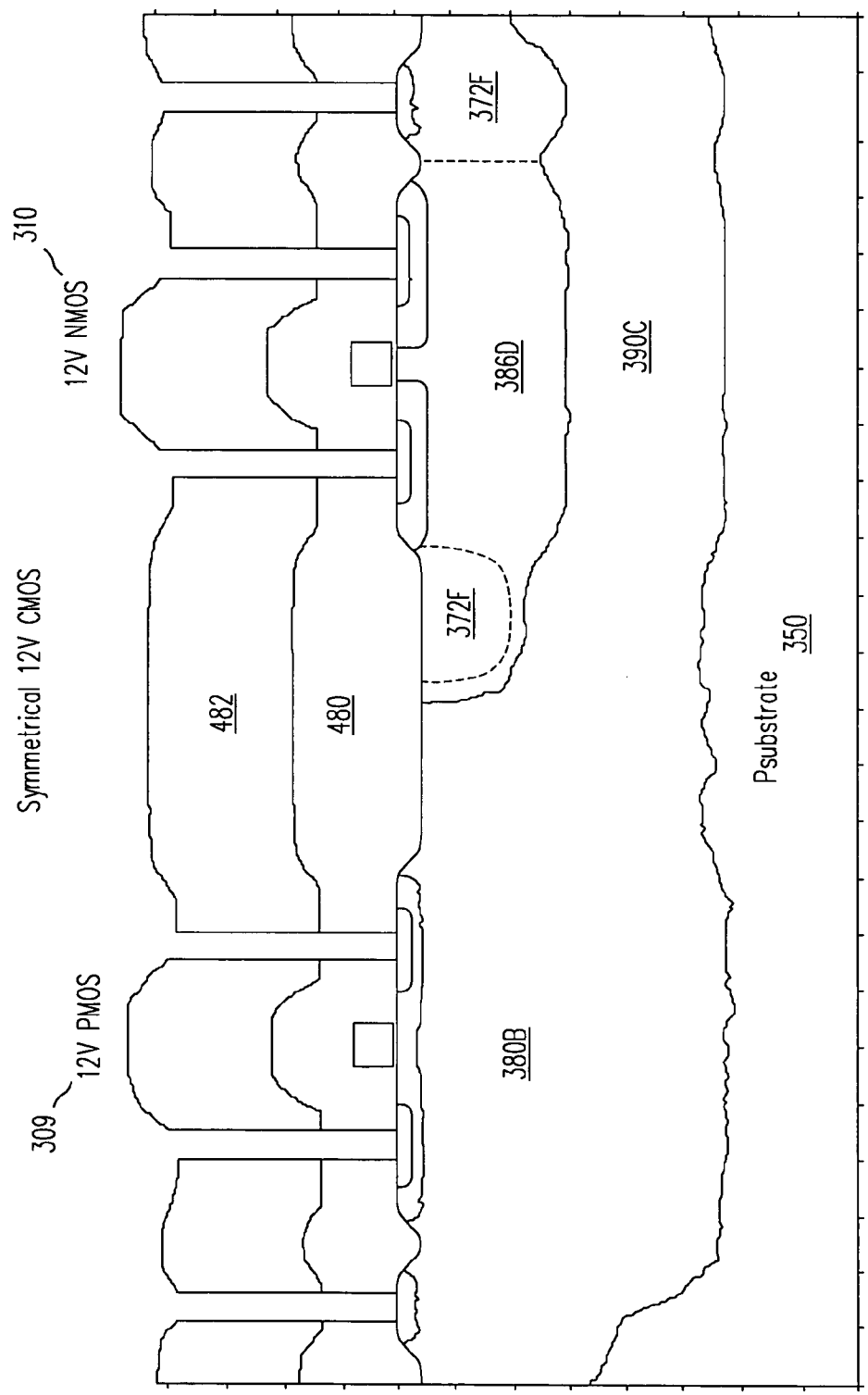
FIG. 64E Interlayer Dielectric Deposition and Etch

N-plug Mask and Implant

MODULAR BIPOLAR-CMOS-DMOS ANALOG INTEGRATED CIRCUIT AND POWER TRANSISTOR TECHNOLOGY

CROSS-REFERENCE TO RELATED APPLICATIONS

This application is a continuation of application Ser. No. 10/262,567, filed Sep. 29, 2002, now U.S. Pat. No. 6,855, 985 which is incorporated herein by reference in its entirety. This application is related to application Ser. No. 10/218, 668, filed Aug. 14, 2002, and application Ser. No. 10/218, 678, filed Aug. 14, 2002, each of which is incorporated herein by reference in its entirety.

FIELD OF THE INVENTION

This invention relates to semiconductor device fabrication and in particular to the fabrication, on a single semiconductor chip, of field effect and bipolar transistors or other semiconductor devices having the capability of being fully isolated from one another, and having different operating voltage ratings. In addition, this invention relates to semiconductor devices having the characteristics of avoiding parasitic conduction between devices, suppressing noise and crosstalk between devices and circuits, and exhibiting other characteristics, such as producing nearly ideal current sources especially for use in analog and mixed signal applications, and producing robust low-resistance power MOSFETs for the on-chip integration of power switches used in high-current or high-voltage power applications.

BACKGROUND OF THE INVENTION

While many integrated circuits today are digital, comprising memory, logic, digital signal processing, microprocessors, logic arrays, and so on, a number of products and electronic functions still rely on analog circuitry, either alone or combined with digital circuitry into mixed signal applications. Analog integrated circuits form a branch of semiconductor technology that is concerned with integrated circuits that operate in what is often referred to as the "analog" or "linear" circuit operating regime. In analog ICs, some of the integrated devices are used in power applications to switch currents, but there are other uses for analog devices as well, especially when operating as constant current sources or controlled current sources in voltage references, current mirrors, oscillators, and amplifiers. This branch of the semiconductor industry is in general sharply distinguished from the digital branch, in terms of the electrical characteristics of the devices, the voltages and currents that the devices must handle, and the processes and techniques that are used to manufacture the devices.

Typically, digital devices are subjected to low currents and voltages, and they are used to switch these low currents on and off, performing logical and arithmetic functions. The signal inputs to digital chips are generally themselves digital signals, and the power supply input generally constitutes a well regulated input with only a few percent maximum variation. All input and output pins are generally well behaved, staying within the designated supply voltage range, mostly emanating from the outputs of other digital ICs. Most outputs drive loads that are capacitive or resistive in nature and often only the inputs of other digital ICs.

Analog ICs, in contrast, must experience a far wider range of operating environments. First of all, many analog and power ICs are connected directly to the battery or power input of a product and are therefore subjected to a full range of potential over-voltage and noise conditions. In fact, the regulated supply used to power digital ICs is generally an analog voltage regulator IC protecting the digital IC from the variations in the raw power source, variations exceeding several tens of percents. Furthermore, the inputs to analog ICs often are themselves analog signals which may include noise mixed into the signal being monitored or detected. Lastly, the outputs of analog ICs often must drive high voltage or high current loads. These loads may include inductors or motors, causing the output pin of the IC to exceed the supply voltage or go below ground potential, and may result in the forward biasing of PN junctions leading to undesirable parasitic bipolar transistor conduction.

The technologies used to fabricate analog and power ICs, especially processes combining CMOS and bipolar transistors, may benefit both digital and analog ICs in performance and in chip size. But in most instances digital ICs use fabrication processes optimized to produce transistors that consume the smallest possible area, even if the ideality or performance of the semiconductor devices must suffer in order to reduce area. In analog and power ICs, the operating characteristics as well as the size are both important parameters, where one cannot be sacrificed completely at the expense of the other. Some characteristics especially beneficial to analog, mixed signal, and power ICs include:

Fabricating devices of different voltage ratings on a single chip, (including for MOSFET devices of different gate-to-source and drain-to-source voltage ratings and for bipolar transistors different collector-to-emitter voltage ratings), Isolating devices from one another and from their common shared substrate, especially if they operate at different voltages or perform widely disparate functions within an IC, Isolating a group of devices from a common substrate into an isolation pocket or tub so that the bias potential imposed on said devices can be maintained at a low voltage, while the entire pocket "floats" at a high voltage above the substrate potential, Isolating a group of devices from a common substrate to prevent small signal noise from interfering from their proper circuit operation, Suppressing the spread of minority carriers into the common substrate (parasitic bipolar conduction) from forward biased PN junctions, Minimizing the possible effects of voltage drops and spatial variations in potential along the substrate (so called "ground bounce") on other devices and circuits, Integrating transistors whose output characteristics are optimized to operate as constant current sources with minimal voltage dependence, i.e. with flat output I-V characteristics (often described for bipolars as having a high Early Voltage $V_A$, and for MOSFETs for having a high small-signal saturated output impedance $r_o$), Integrating high voltage transistors capable of "level-shifting" control signals to aforementioned "floating" pockets of low-voltage circuitry.

Integrating low-resistance MOSFETs for high current capable switches, especially with fast signal propagation throughout a large device array, Integrating high current and/or high voltage devices capable of surviving limited durations of operation in avalanche breakdown without incurring permanent damage, degradation or immediate failure (also known as rugged devices), Integrating large area passives such as high-value resistors, and large-area voltage-independent capacitors with a minimum use of silicon real estate, Integrating precisions analog circuitry, especially accurate current sources, and temperature independent voltage references which vary little from wafer lot to wafer lot For these reasons, and others, the process technologies used to fabricate non-digital integrated circuits are unique, and oftentimes mix bipolar and CMOS devices into a single process. Merged bipolar-CMOS processes include names like BiCMOS (bipolar-CMOS), and CBiC (complementary bipolar-CMOS) processes. If a power MOSFET is also integrated, the power MOSFET may use the standard CMOS components, or may employ a DMOS device (the "D" in DMOS was originally an acronym for double diffused). The mix of bipolar, CMOS, and DMOS transistors into one process architecture is often referred to as a BCD process. Most of these processes require a complex process flow to achieve isolation between devices, especially when NPN or PNP bipolars are included.

The industry has adopted a fairly standard set of procedures in the manufacture of analog, bipolar-CMOS, BCD, and power applicable integrated devices. Typically, an epitaxial (epi) layer is grown on top of a semiconductor substrate. Dopants are often implanted into the substrate before the epi is grown. As the epi layer is formed, these dopants diffuse both downward into the substrate and upward into the epi layer, forming a "buried layer" at the interface between the substrate and the epi layer at the completion of the epi layer. The process is complicated by the fact that the buried layer implant must be diffused well away from the surface prior to epitaxial growth to avoid unwanted and excessive updiffusion of the buried layer into the epitaxial layer. This long pre-epitaxial diffusion is especially needed to avoid unwanted removal of the buried implant layer during the etch-clean that occurs at the beginning of epitaxial deposition (which removes the top layers of the substrate by etching to promote defect-free crystal growth).

Transistors and other devices are normally formed at or near the surface of the epi layer. These devices are typically formed by implanting dopants into the epi layer and then subjecting the substrate and epi layer to elevated temperatures to cause the dopants to diffuse downward into the epi layer. Depending on the dose of the implant, the diffusivity of the dopant, and the temperature and duration of the thermal process, regions of various sizes and dopant concentrations can be formed in the epi layer. The energy of these implants is generally chosen to penetrate through any thin dielectric layers located atop the area to be implanted, but not to penetrate deeply into the silicon, i.e. implants are located in shallow layers near the epitaxial surface. If a deeper junction depth is required, the implant is then subsequently diffused at a high temperature between (1000° C. to 1150° C.) for a period of minutes to several hours. If desired, these regions can be diffused downward until they merge with buried layers initially formed at the interface of the substrate and the epi layer.

There are numerous aspects of this standard fabrication process that impose limitations on the characteristics and variety of devices that can be formed in the epi layer. First, during the thermal process (sometime referred as an "anneal") the dopants diffuse laterally as well as vertically. Thus, to cause the dopants to diffuse deeply into the epi layer, one must accept a significant amount of lateral diffusion. As a rule of thumb, the lateral diffusion or spreading is equal to about 0.8 times the vertical diffusion. Obviously, this limits the horizontal proximity of the devices to each other, since a certain horizontal spacing must be provided between the implants in anticipation of the lateral spreading that will occur during the anneal. This limits the packing density of the devices on the wafer.

Second, since all of the devices in a given wafer are necessarily exposed to the same thermal processes, it becomes difficult to fabricate devices having diverse, preselected electrical characteristics. For example, Device A may require an anneal at 900° C. for one hour in order to achieve a desired electrical characteristic, but an anneal at 900° C. for one hour may be inconsistent with the electrical characteristics required for Device B, moving or redistributing the dopants in an undesirable way. Once a dopant has been implanted, it will be subjected to whatever "thermal budget" is applied to the wafer as a whole thereafter, making dopant redistribution unavoidable.

Third, the dopant profile of the diffusions is generally Gaussian, i.e., the doping concentration is highest in the region where the dopant was originally implanted, typically near the surface of the epi layer, and decreases in a Gaussian function as one proceeds downward and laterally away from the implant region. Sometimes it may be desired to provide other dopant profiles, e.g., a "retrograde" profile, where the doping concentration is at a maximum at a location well below the surface of the epi layer and decreases as one moves upward towards the surface. Such retrograde profiles are not possible using an all-diffused process. Another desirable profile includes flat or constant dopant concentrations, ones that do not substantially vary with depth. Such profiles are not possible using an all-diffused process. Attempts have been made to produce such flat profiles using multiple buried layers alternating with multiple epitaxial depositions, but these processes are prohibitively expensive since epitaxy is inherently a slower, more expensive process step than other fabrication operations.

Fourth, deeper junctions produced by long diffusions require minimum mask features that increase in dimension in proportion to the depth of the junction and of the epitaxial layer to be isolated. So a 10 micron epitaxial layer requires an isolation region whose minimum mask dimension is roughly twice that of a 5 micron layer. Since thicker layers are needed to support higher voltage isolated devices, there is a severe penalty between the voltage rating of a device and the wasted area needed to isolate it. High voltage devices therefore have more area devoted to isolation, pack fewer active devices per unit area, and require larger die areas for the same function than lower voltage processes. Larger die area results in fewer die per wafer, resulting in a more expensive die cost.

Fifth, in epitaxial processes, the epitaxial layer thickness must be chosen to integrate the highest voltage device needed on a given chip. As explained previously, higher voltage devices requires deeper, less area-efficient isolation diffusions. These thick, wide-isolation diffusions are then required even in the lower voltage sections of the chip, wasting even more area. So in conventional processes, the highest voltage device sets the area efficiency of all isolated regions.

Sixth, many IC processes do not have the capability to integrate a voltage independent capacitor like poly-to-poly, poly-to-metal, or metal to poly, nor do they contain a high sheet resistance material for high value resistors.

FIGS. 1–6 illustrate some of the problems associated with various prior art devices.

FIG. 1A shows a conventional CMOS device that contains a P-channel MOSFET (PMOS) 101 and an N-channel MOSFET (NMOS) 102. PMOS 101 is formed in an N well 132; NMOS 102 is formed in a P well 134. N well 132 and P well 134 are both formed in a P substrate 130. The device also contains polysilicon gates 140 that are covered with a metal layer 142 such as a silicide to improve the conductivity of the gate. Sidewall spacers 146 are formed on the walls of gates 140, and in PMOS 101 these sidewall spacers allow the formation of P lightly-doped regions 144 adjacent the P+ source/drain regions 136, 138 to improve the breakdown characteristics of the device. Sidewall spacers 146 are formed by directionally etching an oxide layer from the horizontal surfaces of the device. P lightly-doped regions 144 are aligned to the gate 140 and P+ source/drain regions 136, 138 are aligned to sidewall spacers 146. P lightly-doped regions 144 are implanted before the formation of sidewall spacers 146, and P+ source/drain regions 136, 138 are implanted after the formation of sidewall spacers 146. Each of these steps requires a mask. P+ source/drain regions 136, 138 are contacted by a metal layer 148 with a barrier metal layer 150, typically TiN (titanium-nitride) being formed at the interface with P+ source/drain regions 136, 138.

NMOS 102 contains similar components with opposite polarities. PMOS 101 and NMOS 102 are separated by a field oxide layer 152. Normally there is a field dopant (not shown) under the field oxide layer. In some cases the surface concentration of P well 134 or N well 132 can be sufficiently high to raise the field threshold between adjacent NMOS or PMOS devices to a value greater than the supply voltage, and to maintain the minimum threshold criteria despite normal variations in doping, oxide thickness, or operating temperature.

A problem with this device is that NMOS 102 is not isolated from the P substrate 130, since there is no PN junction between P substrate 130 and P well 134. P well 134 cannot float. Instead there is simply a resistive connection between P substrate 130 and P well 134. Noise can be coupled into NMOS 102. Current having nothing to do with the circuit connection of NMOS 102 can flow from substrate 130 into P well 134. Since every MOSFET contains four electrical terminals; a gate, a source, a drain, and a back-gate (also known as the channel or body of the device), then by this nomenclature the body of NMOS 102 comprising P well 134 is directly tried to the substrate (herein referred to as electrical ground) and cannot be biased to a potential above the grounded substrate 130. Since the P well 134 is grounded, any bias on the source pin of NMOS 102, will raise its threshold and degrade the MOSFET's performance.

In contrast, N well 132 can be reverse-biased relative to P substrate 130, isolating the PMOS 101 from the substrate potential. Since the device is isolated, the source 148/136 of the PMOS can be shorted to N well 132, the body of the PMOS, and allow operation above ground without degrading the PMOS's electrical performance.

Since N well 132 has a limited amount of doping present in such well region, the PMOS may not always operate in an ideal manner, especially due to parasitic bipolar conduction. Specifically, N well 132 forms a parasitic PNP bipolar transistor (PNP) between the P+ source/drain regions 136, 138 and the P substrate 130. If either the PN junction between P substrate 130 and N well 132, or (more likely) the PN junction between one of the P+ source/drain regions 136, 138 and P substrate 130, becomes forward-biased, the parasitic PNP could turn on and conduct unwanted current into P substrate 130. Also, there are typically parasitic NPN transistors elsewhere in the IC chip (e.g. comprising N well 132, P substrate 130 and any other N+ region located within P substrate 130), and these NPNs can combine with the PNP in N well 132 to produce a latch-up condition (parasitic thyristor action).

In digital applications these problems may not be significant. Typically the PN junctions do not become forward-biased. The wells are heavily doped and there is no particular concern with having high breakdown voltages or a flat output current characteristic when the transistor is turned on.

PMOS 101 and NMOS 102 work reasonably well in a circuit of the kind shown in FIG. 1B, where the source and body of PMOS 101 are both tied to Vcc, and the source and body of NMOS 102 are both tied to ground. Thus the body-drain junctions of both devices are reverse-biased so long as the drain potential of PMOS 101 and NMOS 102 remains at a voltage equal to or intermediate to the ground and Vcc supply rails.

The situation is different, however, where the devices are formed in or operate as a circuit of the kind shown in FIG. 1C. There the body of NMOS 102 is resistively tied to ground and the source is typically shorted to ground and the device therefore cannot be isolated. Also, there is a NPN bipolar transistor (dashed lines) between the source and the drain. In PMOS 101, the diode that represents the PN junction between P substrate 130 and N well 132 forms a part of the parasitic PNP transistor (also shown in FIG. 1A) between P substrate 130 and P+ region 138. As a result, the devices cannot be floated in circuit that is not reasonably near the ground potential, without risk of the PNP conducting or exhibiting snapback breakdown, especially at high temperatures.

A modified structure that has been used in the power MOSFET area to extend the voltage range of the devices is shown in FIG. 2A. The voltage range of PMOS 103 has been extended by forming an extended P− "drift" region 156 adjacent the P+ drain region 154 in N well 132. The current flows from the P+ source region 162 and through N well 132 and into P drift region 156 and P+ drain region 154. However, PMOS 103 still has the same parasitic PNP transistor (dashed lines) described before for PMOS 101.

In NMOS 104, P well 134 has been limited to enclose only the N+ source region 160 and the P+ body contact region 162, and an N well 158 has been formed adjacent to and enclosing N+ drain region 164. Gate 166 overlaps the field oxide region 152 and onto thin gate oxide (active region) overlapping the surface channel formed by the N sidewall spacer of N+ 160 acting as source, Pwell 134 acting as body, and Nwell 158 acting as drain of a high voltage N-channel MOSFET 104. In NMOS 104, the current flows from the N+ source region 160 and through P well 134 (the channel region) and N well 158 to N+ drain region 164. N well 158 acts as an N− drift region which, if it is doped lightly enough will deplete and extend the voltage range of NMOS 104.

NMOS 104, however, has an additional problem that is illustrated in FIG. 2B. If NMOS 104 becomes saturated, as it often does during switching, in the constant-current mode, N well 158 may become substantially depleted. When the electrons emerge from channel 168, they enter an area of N well 158 located between field oxide region 152 and P well 134, where the strength of the electric field is high (as indicated by the equipotential lines II), especially adjacent the field oxide region 152 and the thin gate oxide portion underlying gate 166. As result, impact ionization may occur, generating hot carriers, particularly adjacent field oxide region 152 where the defects associated with the LOCOS process are present. If N well 158 is substantially depleted, the current is not constrained within N well 158. Thus, if NMOS 104 is driven into saturation, the hot carriers may rupture the gate oxide and destroy the thin oxide underlying gate 166.

FIG. 2C is a graph of the drain current $I_D$ through NMOS 104 as a function of the drain-to-source voltage $V_{DS}$. Curve A shows the situation when the device is turned off. The ideal operation is for the current to remain at zero until breakdown occurs and then rise with $V_{DS}$ remaining essentially constant (curve A1), the device acting as a voltage clamp. Where there are parasitic bipolar transistors, or where impact ionization occurs, so many carriers are generated the voltage collapses or "snaps back" after breakdown (curve A2) and if the current rises too much the device will be destroyed. As shown by curve B, a similar result can occur when NMOS 104 is turned on. Hot carriers are generated by the channel current through the device and these hot carriers can cause the device to snap back in what is sometimes referred to as a safe operating area (SOA) failure. The fact that the doping concentrations and profiles cannot be controlled very accurately, because the dopants are being thermally diffused, makes these problems worse, especially considering that Gaussian dopant profiles have their highest concentrations at the silicon surface, where the electric fields are also highest.

FIG. 2D illustrates a problem that can occur with PMOS 103 as a result of the inability to control the doping profile of N well 132. Even though PMOS 103 is isolated from P substrate 130, if the source-body voltage $V_{DD}$ gets to be too far above ground (e.g., 12V in a 5V device, 18V in a 12V device, etc.), the depletion region will spread upward in N well 132 towards the surface of the substrate. Since the doping profile of N well 132 cannot be controlled, the diffusion times must be increased to drive the PN junction far into the substrate to prevent the depletion region from reaching the surface of the substrate. Normally, there is a compromise. The N well 132 is not as deep as would be desirable, and the depletion does reach back into the N well. This narrows the width of the parasitic bipolar transistor in PMOS 103, since the actual net electrical width of the base is the depth of the PN junction between N well 132 and P substrate 130, less the width of the depletion region within N well 132.

Moreover, if the junction between N well 132 and P substrate 130 ever becomes even slightly forward-biased, the device will have a tendency to snap back, because the base of the parasitic bipolar transistor between P substrate 130 and P+ drain 154 (dashed lines) has a very resistive contact and therefore the parasitic bipolar will experience what is essentially an "open-base" breakdown ($BV_{CEO}$). This breakdown voltage is much lower than the normal reverse-bias junction breakdown between N well 132 and P substrate 130. If this happens the device will most likely be destroyed. If PMOS 103 becomes saturated, hot carriers will be generated that may also lead to this phenomenon.

Probably the biggest single problem with PMOSs 101, 103 is that they are not floating, meaning they cannot be biased at a high N well-to-P substrate potential without snapping back. Similarly, one of the biggest problems with NMOSs 102, 104 is that they are not floating, meaning their body connection cannot be biased above the substrate potential at all. This limits greatly the types of circuits in which they can be used.

FIG. 3 illustrates how this problem occurs in an illustrative power conversion circuit 105. Circuit 105 includes low-side circuitry 170, which would be biased near ground (e.g., 5V or less above ground), and high-side circuitry 172, which could float 20V or 30V above ground (the substrate). MOSFET M1 would typically be a high-voltage N-channel device that sends a signal through a resistor R1 to high-side circuitry 172 and would have a breakdown voltage of 20V to 30V, even though the input signal at the gate of M1 might only be 5V. MOSFET M2 would be a high-voltage P-channel device that level-shifts a signal through a resistor R2. MOSFETs M3 and M4 constitute a 5V or 12V CMOS pair that drives the gate of an N-channel output high-side MOSFET M7. The source of MOSFET M3 needs to float 20V or 30V above the substrate, but MOSFETs M3 and M4 are themselves low-voltage devices. This minimizes the area they occupy on the chip.

MOSFETs M5 and M6 are a CMOS pair similar to MOSFETs M3 and M4, but the source of MOSFET M5 is connected to ground. MOSFETs M5 and M6 drive the gate of an N-channel output low-side MOSFET M8.

Bootstrap capacitor C1 powers the floating high-side circuit and floats above ground. The voltage across capacitor C1 $V_{Bootstrap}$ is 5V. When output MOSFET M7 is turned on, raising the lower terminal of capacitor C1 to 20V, diode D10, which is used to charge capacitor C1, must block approximately 25V (i.e., $V_{DD}+V_{Bootstrap}$).

Thus, in a circuit such as circuit 105, one must have the flexibility to include high-voltage devices and dense, floating low-voltage devices on a single chip. The devices shown in FIGS. 1A and 2A do not meet the needs of circuit 105 shown in FIG. 3.

FIG. 4A shows the prior art's answer to this problem, although it represents a step backwards technologically. An N-type epitaxial (N-epi) layer 176 is grown on a P substrate 174. PMOS 107 is formed in N-epi layer 176, and NMOS 106 is formed in a P well 178 in N epi layer 176. Thus NMOS 106 and PMOS 107 constitute a CMOS pair that floats above P substrate 174.

The chip also includes an N-channel lateral DMOS 108 that is isolated from P substrate 174 by the junction between N-epi layer 176 and P substrate 174 and from the CMOS pair by a P-type isolation diffusion 180. An N buried layer 184 provides isolation for the CMOS pair.

One problem with this structure is that it requires long diffusions. For example, P isolation diffusion 180 must be diffused through the entire N-epi layer 176 to reach P substrate 174, and P body 182 of lateral DMOS 108 likewise requires a long diffusion at a high temperature (e.g., 12 hours at 1100° C. or more).

Moreover, to align P body 182 to gate 186 of lateral DMOS 108 requires that gate 186 be formed before P body 182 is implanted. The CMOS pair typically has a threshold adjust implant that would be performed before the polysilicon gates 188 are deposited. The long anneal required to diffuse P body 182, however, would render useless any threshold adjust implant that was previously performed in the CMOS pair. The only way to avoid this problem would be to deposit the gate 186 of lateral DMOS before the gates 188 of the CMOS, but this would add considerable complexity to the process.

The devices typically have a channel length of 0.8–2.0 µm rather than 0.35 µm. One could use a 0.35 µm process to fabricate this structure but the number of masking steps could become excessive. The number of steps to form the isolation structures would be added to the steps for the 0.35 µm process and the threshold adjust. Normally the prior art has settled for lower density and less complexity in order to get this isolation capability. Moreover, the effort to reduce the size of CMOS devices and the resulting benefit in reduced die size are mostly lost when the large wasted area of isolation diffusions 180 is considered.

FIG. 4B shows N-channel quasi-vertical DMOSs 109 that are formed in N-epi layer 176 and are isolated from P substrate 174. In each device, the current flows from N+ source region 192, laterally through a channel in P body 194 under gate 190, downward in N-epi layer 176 to N buried layer 196, laterally in N buried layer 196, and upward through N+ sinker 198. An advantage of the devices is that the current is pinched off by spreading depletion regions between the P bodies when the devices are reverse-biased, and this protects the gate oxide layer. On the other hand, the on-resistance of the devices is increased by the distance that the current must flow through the N buried layer 196. To keep this resistance within acceptable limits N+ sinkers must be positioned periodically and frequently between the DMOSs, and this reduces the packing density of the chip. The higher the off-state blocking voltage $BV_{DSS}$ of such a DMOS device, the deeper N+ sinker diffusion 198 and P isolation diffusion 180 must be driven, wasting more die area for such deep and wide diffused regions.

FIG. 4C shows an NPN transistor (NPN) 110 that can be formed in the same process. The base 141 of NPN 110 would typically be formed by the same P diffusion as P body 182 N-channel LDMOS 108 (FIG. 4A) and therefore may not be optimal. The current characteristics of NPN 110 are generally quite good, but it must be large to accommodate the N+ sinker 143 and deep P isolation diffusion 147.

In high-voltage PMOS 111, the parasitic bipolar between P substrate 174 and N+ source region 151 is suppressed by N buried layer 149. To obtain the high-voltage feature, however, N epi layer 176 must be 6 μm to 10 μm thick and this further increases the length of the diffusion required for N+ sinker 143 and P isolation region 147. A greater vertical diffusion means a greater horizontal diffusion, so this further increases the size of the device.

FIG. 5A shows an alternative technique of forming an isolation region that limits somewhat the length of the diffusion and helps reduce lateral spreading of such deep diffusions. A P isolation region 153 is implanted near the surface of N-epi layer 176 (after epitaxial growth), and a P buried layer 155 is formed at the interface of N-epi layer 176 and P substrate 174 (prior to epitaxial growth). During the implant anneal, P isolation region 153 diffuses downward and P buried layer 155 diffuses upward until they merge somewhere in the middle of N-epi layer 176.

This process also raises the possibility of fabricating an isolation structure that includes a P buried layer 159 on top of an N buried layer 157, as shown in FIG. 5A. A relatively slow-diffusing dopant such as antimony or arsenic can be used to form N buried layer 157, and a relatively fast-diffusing dopant such as boron can be used to form P buried layer 159. Buried layers 157 and 159 are heavily doped, and the dopants must be driven deep into P substrate 174 to prevent them from coming out during the growth of N-epi layer 176. This is a highly variable process that is difficult to control. Furthermore, P isolation layer 153 must be aligned to PBL region 157 through the entire thickness of epitaxial layer 176. It is difficult to guarantee good alignment with this procedure, requiring extra spacing to be included in the design rules of a device and wasting silicon area.

This process does permit the fabrication of a fully isolated PNP, however, as shown in FIG. 5B. In PNP 112 an N buried layer 161 and a P buried layer 165 are formed at the interface between P substrate 174 and N-epi layer 176. N buried layer 161 is contacted via N+ sinkers 163, and P buried layer 165 and P isolation region 167 become the collector of PNP 112.

PNP 112 is isolated from adjacent devices by P isolation regions 171, which are diffused downward to merge with up-diffusing P buried layers 169. P buried layers 169 and PBL 165 are generally the same P buried layer.

The use of a P buried layer can also help overcome the "hot carrier" problem described in connection with FIG. 2B. As shown in FIG. 5C, P buried layer 173, formed under the P body 134 of NMOS 104, "squeezes" the depletion regions back into the area directly under field oxide layer 152, where the breakdown fields are higher and more voltage can be tolerated, and therefore reduces the strength of the electric field at the surface of N-epi layer 176 under gate 166.

If the charge Q in N-epi layer 176 is chosen to be in the range of $1.0–1.3\times10^{12}$ atoms $cm^{-2}$, then N-epi layer 176 fully depletes before it breaks down, and a much higher voltage can be applied to the device (e.g., hundreds of volts). This is known as a "resurf" device in the prior art. The charge Q is equal to the doping concentration times the depth of N-epi layer 176 (strictly speaking the charge is equal to the integral of the concentration integrated over the thickness of the epitaxial layer).

FIG. 6A shows a different approach to the problem. Here, a P-epi layer 179 is grown on P substrate 174. An isolated P pocket 187 is formed in P-epi layer 179 by down-diffusing N isolation regions 185, up-diffusing N buried layers 183, and forming an N buried layer 181. N regions 185 and N buried layers 183 are doped with a relatively fast-diffusing dopant such as phosphorus, whereas N buried layer 181 is formed of a relatively slow-diffusing dopant such as antimony or arsenic. As a result, an "N tub" is formed surrounding P pocket 187. An N well 190 and optionally a P well (dashed lines) are formed in isolated P pocket 187. A PMOS 113 is formed in N well 191, and an NMOS 114 is formed in P pocket 187 (or in the P well). PMOS 113 and NMOS 114 are similar to PMOS 101 and NMOS 102, shown in FIG. 1A, except that they may or may not include sidewall spacers. Outside the "N tub" a high-voltage lateral DMOS (HV LDMOS) 115 is fabricated, similar to NMOS 104 shown in FIG. 2A, except that a P body diffusion 193 may be used in place of the P well 134 (dashed lines) and an N field doping 195 under field oxide layer 152 serves as the "drift" region of HV LDMOS 115. HV LDMOS 115 does not have a P buried layer similar to P buried layer 173 shown in FIG. 5C to reduce the strength of the electric field under the gate.

In fabricating PMOS 113, P-epi layer 179 must be thick enough to ensure that, taking into account the variability in the thickness of P-epi layer 179, N buried layer 181 does not overlap N well 191 Otherwise, N buried layer 181, which is heavily doped, may influence the electrical characteristics of PMOS 113. Another approach is shown in FIG. 6B, where instead of having two separate phosphorus buried layers 183, a single phosphorus N buried layer 197 up-diffuses and merges with N isolation regions 185. The arsenic or antimony N buried layer 181 remains well below N well 191, but the up-diffusing phosphorus merges into N well 191. Because the doping concentration of the portion of N buried layer 197 that overlaps N well 191 is low, the electrical characteristics of PMOS 113 are not significantly effected by N buried layer 197.

FIG. 6B also shows that an NPN 116 can be fabricated in the same process. The base of NPN 116 is wider than the base of NPN 110, shown in FIG. 4C, because the base includes some of P-epi layer 179 rather than just the P body diffusion 141. Since the width of P-epi layer 179 is variable, NPN 116 is not as reproducible as NPN 110.

FIG. 6C summarizes the options for the fast-diffusing (phosphorus) and slow-diffusing (arsenic or antimony) N buried layers in the embodiments of FIGS. 6A and 6B. The fast and slow-diffusing N buried layers can be separate, as shown on the left side of FIG. 6C, or they can be superimposed on one another, perhaps using the same mask, as shown on the right side of FIG. 6C. In both cases, the fast diffusant (labeled UI as an acronym for up isolation) extends both above and below the vertical extent of the slow diffusing NBL.

The devices shown in FIGS. 1A–1C, 2A–2D, 3, 4A–4C, 5A–5C, 6A–6C share a common set of problems. They generally require long thermal cycles to diffuse dopants to desired depths in a substrate or epitaxial layer. These diffusions cause redistribution of every dopant present within the silicon at the time of the diffusion, including devices where it would be preferable to prevent or limit dopant diffusion. For example, any well diffusion cycle performed after field oxidation occurs causes the dopant concentration at the silicon surface directly under the field oxide to decline, lowering the "field threshold" of parasitic surface MOSFETs formed between adjacent like-type devices. This unwanted redistribution may allow a parasitic PMOS to be formed between adjacent PMOSs sharing a common N well, or parasitic NMOS conduction between adjacent NMOSs sharing a common P well. To raise the field threshold and counter the adverse affects of diffusion, a higher field threshold implant is required. A higher implant dose, however, raises the surface concentration leading to lower surface breakdowns and higher surface fields.

Moreover, a higher surface concentration is also subject even greater diffusion due to a higher concentration gradient. To avoid these effects, the possible process architectures are limited to sequences where the dopants that must not diffuse must be introduced late in the process, after gate oxidations, field oxidations, well diffusions, etc. Such a limitation imposes many restrictions in the device type and device optimization possible.

High temperature diffusions also generally produce Gaussian dopant profiles in the resulting wells or other regions. One cannot fabricate regions having predetermined yet arbitrary, non-Gaussian dopant profiles. For example, a retrograde profile having a higher subsurface concentration than its surface concentration cannot be performed using purely diffused techniques. Such diffusions (and diffusions in general) are difficult to accurately control, and the actual results may vary widely from what is desired especially when the variability from wafer-to-wafer (from a single wafer batch) and variability from wafer-batch to wafer-batch (so called "run-to-run variation") are considered. The variability comes from poor temperature control and from dopant segregation occurring during oxidation.

Moreover, the diffusions, while intended primarily to introduce dopants deeper into the substrate, also spread the dopants laterally, and this increases the size of the devices, in some cases by substantial amounts.

To the extent that an epitaxial layer is used to fabricate the devices, these effects are further magnified by the effects of growing the epitaxial layer. Until now, the need for epitaxy has been virtually mandated by the integration of fully-isolated "analog quality" bipolars (i.e. excluding digital- and RF-optimized bipolars). Yet epitaxy remains the single most expensive step in wafer fabrication, making its use undesirable. Variability in epitaxial thickness and in concentration compound device optimization, and the epitaxial process necessarily occurs at a high temperature, typically over 1220° C. Such high-temperature processing causes unwanted updiffusion of the substrate in some regions of an IC, and of buried layers in other regions. The updiffusion produces a thinner epitaxial layer than the actual grown thickness, meaning added deposition time and thickness must be used to offset the updiffusion, making the epi layer as deposited thicker than it otherwise would need to be. Isolating a thicker epitaxial layer requires even longer diffusion times for the isolation diffusion structure, leading to excessively wide features.

In the event that multiple operating voltages are present within the same chip, the epitaxy needs to be selected for the maximum voltage device. The isolation width is then larger than necessary in sections of the IC not utilizing the higher voltage components. So, in essence, one component penalizes all the others. This penalty leads to poor packing densities for low voltage on-chip devices, all because of one higher voltage component. If the higher voltage device is not used, the wasted area lost to high voltage isolation (and related design-rule spacing) cannot be reclaimed without re-engineering the entire process and affecting every component in the IC. Such a process is not modular, since the addition or removal of one component adversely affects all the other integrated devices.

Accordingly, there is a clear need for a technology that would permit the fabrication of an arbitrary collection of optimized transistors or other devices, closely packed together in a single semiconductor wafer, fully isolated, in a modular, non-interacting fashion.

SUMMARY OF THE INVENTION

In accordance with this invention, an isolated pocket of a substrate of a first conductivity type is formed by forming a field oxide layer, the field oxide layer comprising a first section and a second section, the first and second sections being separated from each other by an opening. A first implant of a dopant of a second conductivity type is performed through the first and second sections of the field oxide layer and through the opening to form a deep layer of the second conductivity type, the deep layer comprising a deeper portion under the opening and shallower portions under the first and second sections of the field oxide layer. A mask layer is formed over the opening, and at least one additional implant of dopant of the second conductivity type is performed, the mask layer blocking dopant from the at least one additional implant from entering the area of the substrate below the opening. The dopant from the at least one additional implant passes through the first and second sections of the field oxide layer, however, to form sidewalls in the substrate, each sidewall extending from the bottom of the first and second sections of the field oxide layer, respectively, and into the deep layer, the deep layer and the sidewalls forming an isolation region enclosing an isolated pocket of the substrate.

BRIEF DESCRIPTION OF THE DRAWINGS

FIG. 1A is a cross-sectional view of a prior-art twin-well CMOS with sidewall spacers.

FIG. 1B is an idealized schematic representation of a CMOS transistor pair available in prior-art conventional (non-isolated) CMOS processes;

FIG. 1C is a detailed schematic representation of a CMOS pair available in prior-art conventional (non-isolated) CMOS processes illustrating parasitic elements;

FIG. 2A is a cross sectional view of a modified prior-art conventional (non-isolated) twin-well CMOS process integrating an N well-enclosed extended-drain PMOS and an extended N-channel lateral DMOS transistor (with a P well as a non-self-aligned body);

FIG. 2B describes the operation of a prior-art N-channel lateral DMOS transistor in saturation illustrating lines of current flow (labeled I(flow)) and contours of impact ionization (labeled II);

FIG. 2C shows conventional prior-art MOSFET drain-to-source current-voltage (I-V) characteristics illustrating ideal breakdown (curve A1), snapback breakdown (curve A2), and impact ionization induced snapback (curve B);

FIG. 4A is a cross sectional view of a prior-art conventional junction-isolated epitaxial (epi-JI) CMOS with integrated lateral N-channel DMOS and large down-only isolation diffusions;

FIG. 4B is a cross-sectional view of an N-channel quasi-vertical (up-drain) DMOS in prior-art conventional junction-isolated epitaxial (epi-JI) CMOS process;

FIG. 4C is a cross-sectional view of a quasi-vertical fully-isolated NPN and lateral high-voltage PMOS integrated prior-art conventional junction-isolated epitaxial (epi-JI) CMOS process (BCD version);

FIG. 5A is a cross-sectional view of isolation and buried layer structures available in prior art up-down isolation version of conventional epitaxial junction-isolated (epi-JI) processes;

FIG. 5B is a cross-sectional view of a prior-art fully-isolated quasi-vertical PNP in up-down isolated variant of conventional epitaxial junction-isolation (epi-JI) bipolar, CMOS, or BCD processes;

FIG. 5C is a cross-sectional view of a prior-art fully-isolated lateral N-channel DMOS with extended (RESURF) drain region fabricated in up-down isolation version of conventional epitaxial junction-isolated (epi-JI) process;

FIG. 6A is a cross-sectional view of a prior-art wrap-around junction-isolation epitaxial (epi-WAJI) process integrating CMOS and lateral DMOS;

FIG. 6B shows a modified version of a wrap-around junction-isolated epitaxial process (epi-WAJI) using hybrid buried layer comprising slow and fast diffusers, integrating CMOS and fully-isolated quasi-vertical NPN into a BiCMOS process (prior art)

FIG. 6C is a cross-sectional view of various combinations of N-type buried layers available in modified wrap-around isolation junction-isolation process (epi-WAJI)

FIG. 9E shows the doping profile at cross-section 9C–9C' of FIG. 9A.

FIG. 9F shows the doping profile at cross-section 9D–9D' of FIG. 9B.

FIG. 10C shows the doping profile at cross-section 10A–10A' of FIG. 10A.

FIG. 10D shows the doping profile at cross-section 10B–10B' of FIG. 10B.

FIG. 10J shows a cross-sectional view and FIG. 10K shows the doping profile that would obtain if only the 12V implant were performed through the field oxide layers in the structure of FIG. 10B.

FIG. 17AA illustrates the use of dielectric-filled trenches to constrain the lateral straggle of the implants shown in FIG. 17Y.

FIG. 17BB is a view of the doping profile obtained from the implants shown in FIG. 17AA.

FIG. 18A-1 shows a 5V PMOS and a 5V NMOS.

FIG. 18A-2 shows a 12V PMOS and a 12V NMOS.

FIG. 18A-3 shows a 5V NPN and a portion of a 5V PNP.

FIG. 18A-4 shows the remaining portion of the 5V PNP, a 30V channel stop and a 30lateral trench DMOS.

FIG. 18B-1 shows a 12V symmetrical isolated PMOS.

FIG. 18B-2 shows a 12V symmetrical isolated NMOS and a poly-to-poly capacitor.

FIG. 18B-3 shows a NPN with P-base mask (not standard).

FIG. 18B-4 shows a 12V channel stop and a 12V lateral trench DMOS.

FIG. 18C shows a 5V CMOS pair.

FIG. 18D shows a lateral trench MOSFET that contains alternating mesas that contain a P body region, with a single deep N layer underlying all of the mesas.

FIG. 18E shows a lateral trench MOSFET similar to that shown in FIG. 18D, except that separate deep N layers underlie only the mesas that contain no P body region.

FIG. 18F shows a lateral trench MOSFET similar to that shown in FIG. 18D, except that all of the mesas except one contain a P body region.

FIG. 18G shows a 30V lateral N-channel DMOS.

Figures 1, 18A:
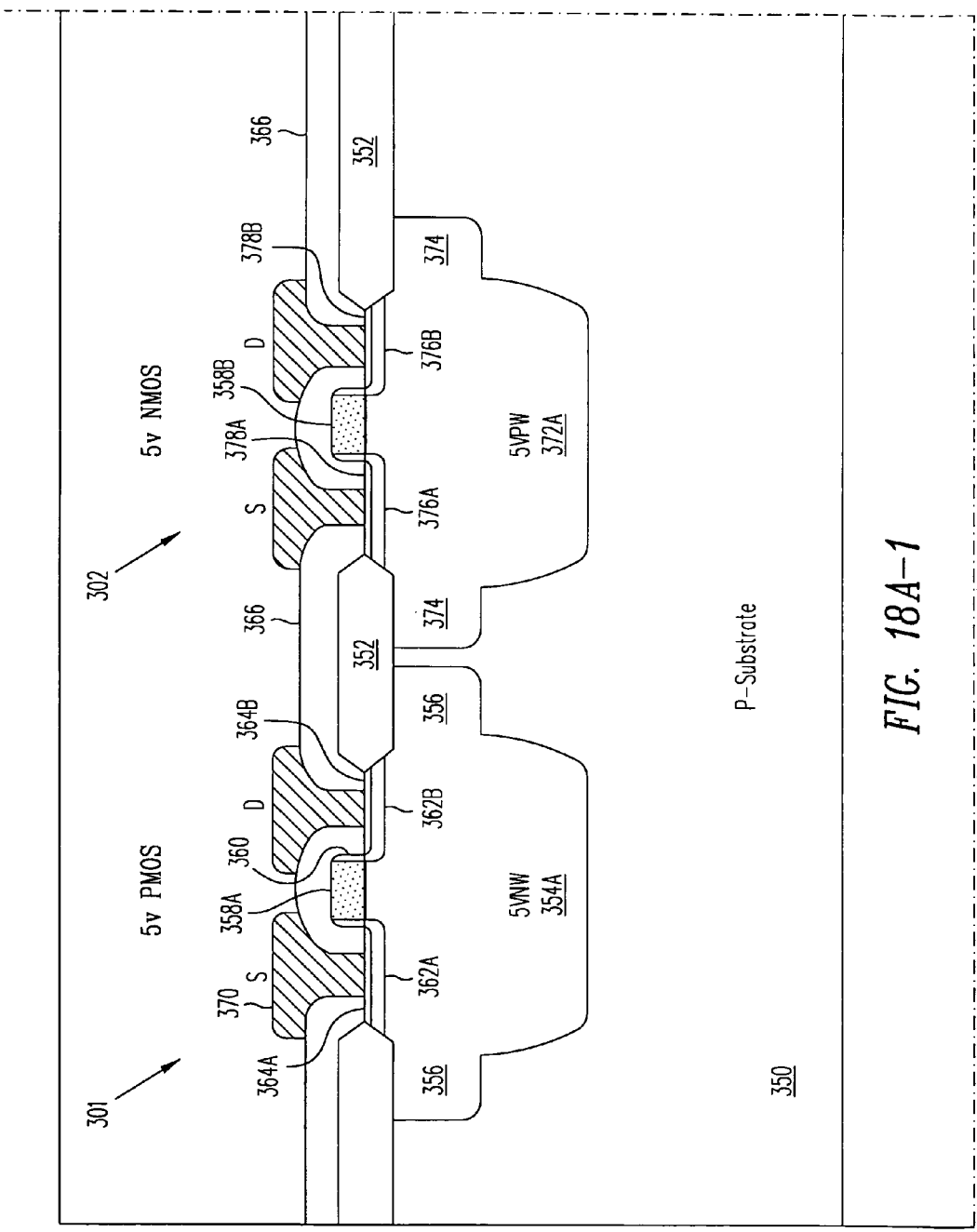
FIGS. 18A-1 to 18A-4, 18B-1 to 18B-4, and 18C–18H are cross-sectional views of a "device arsenal" that can be fabricated simultaneously in a substrate using a process of this invention.
Figures 2, 18A:
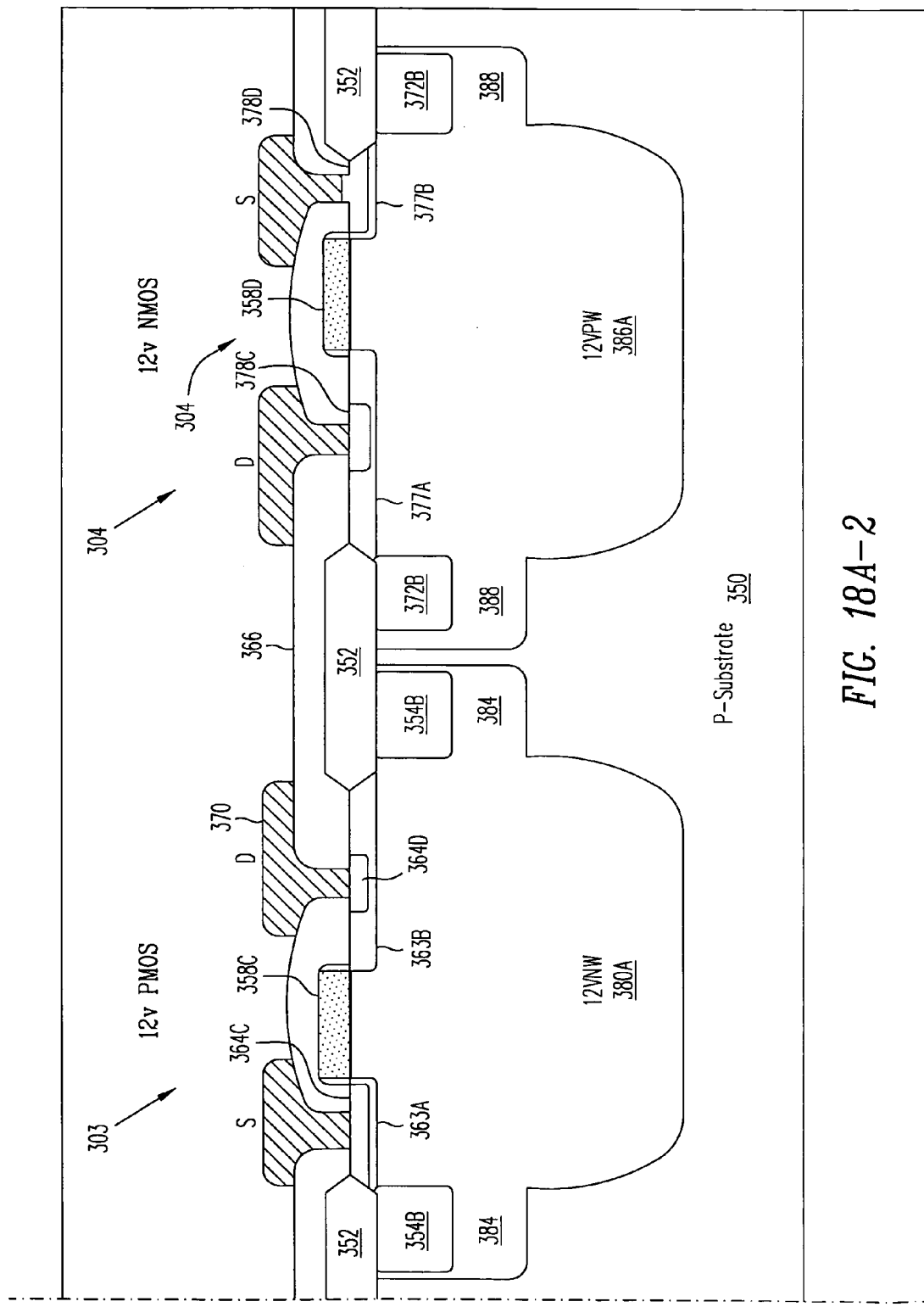
Figures 3, 18A:
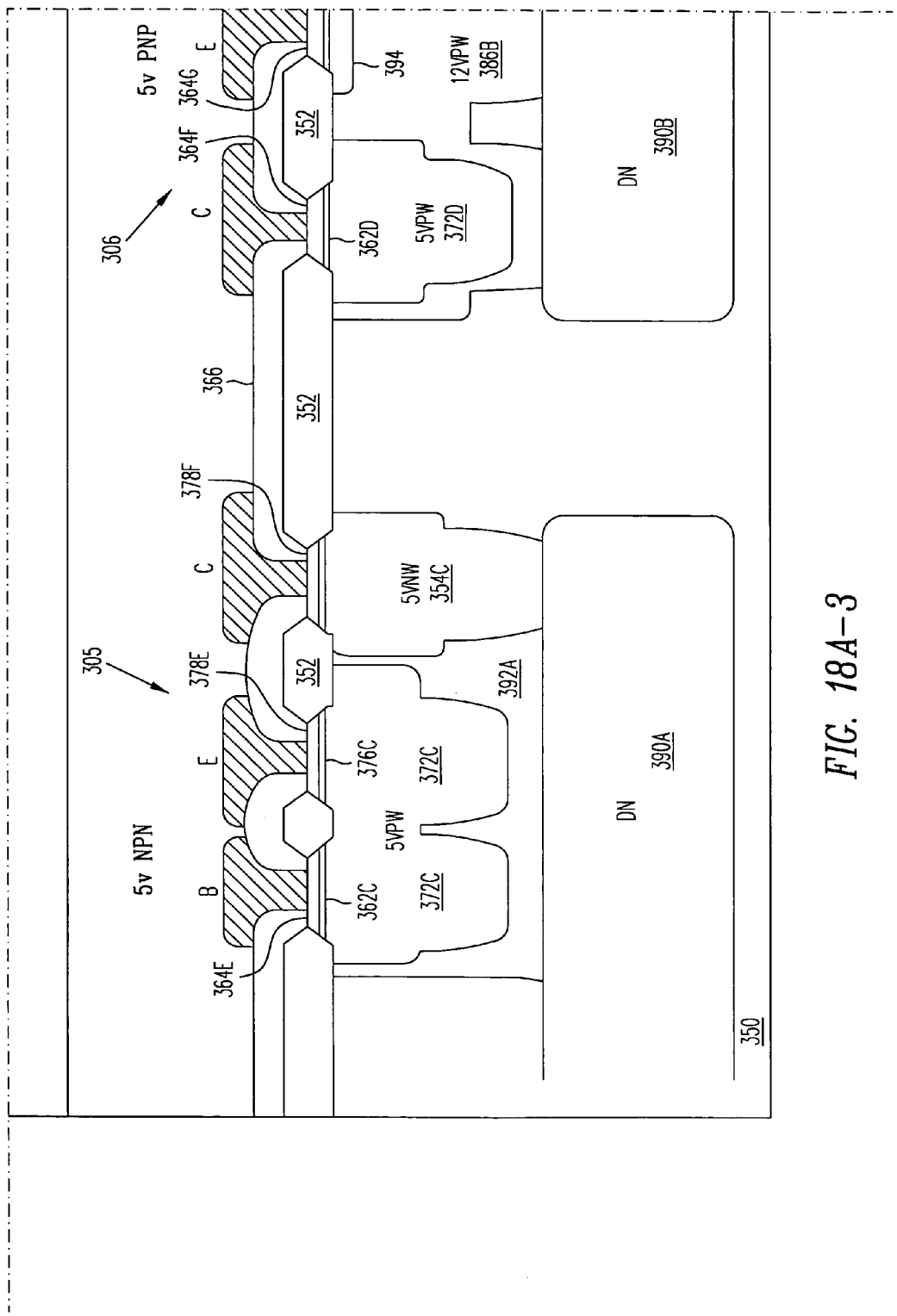
Figures 4, 18A:
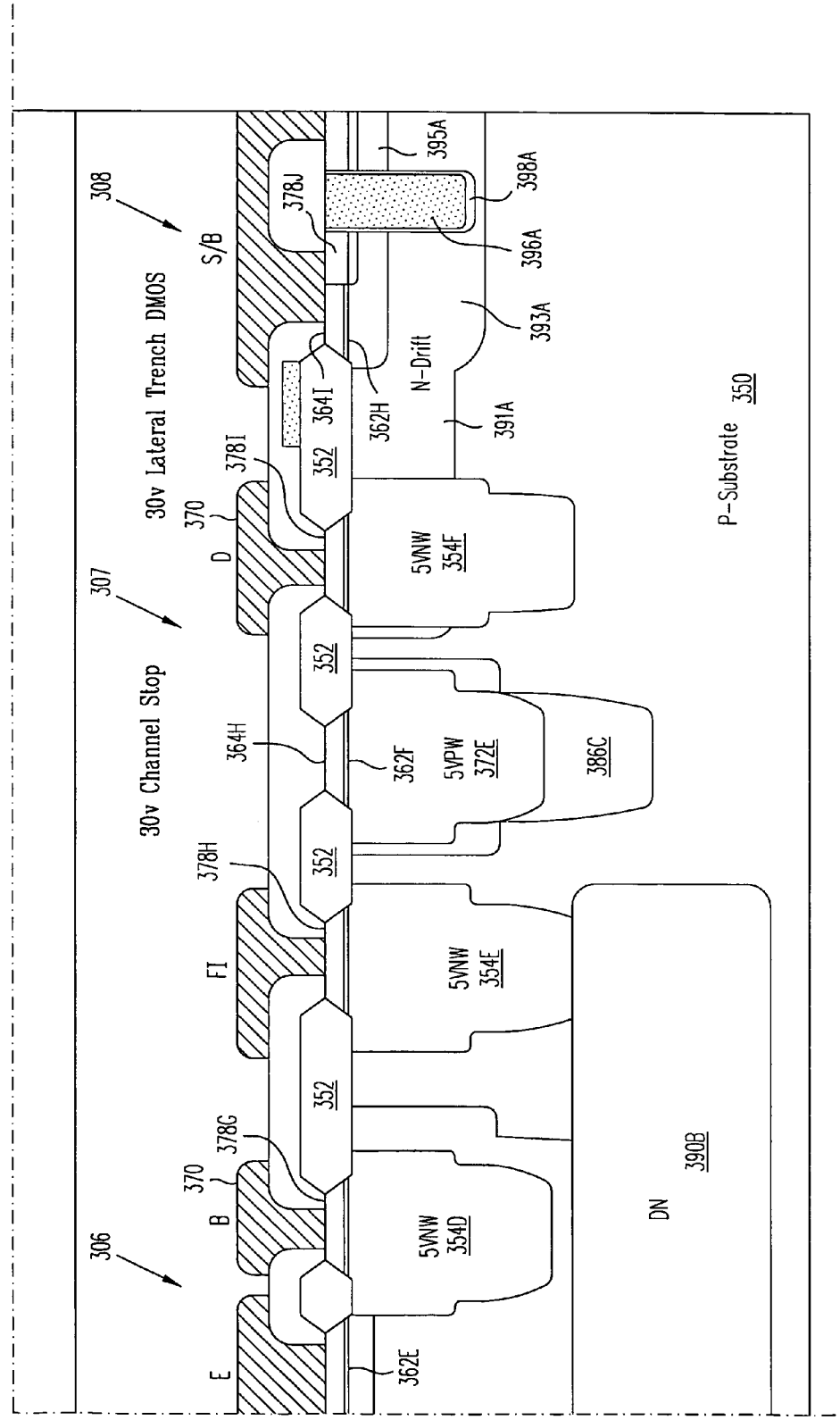
Figures 1, 18B:
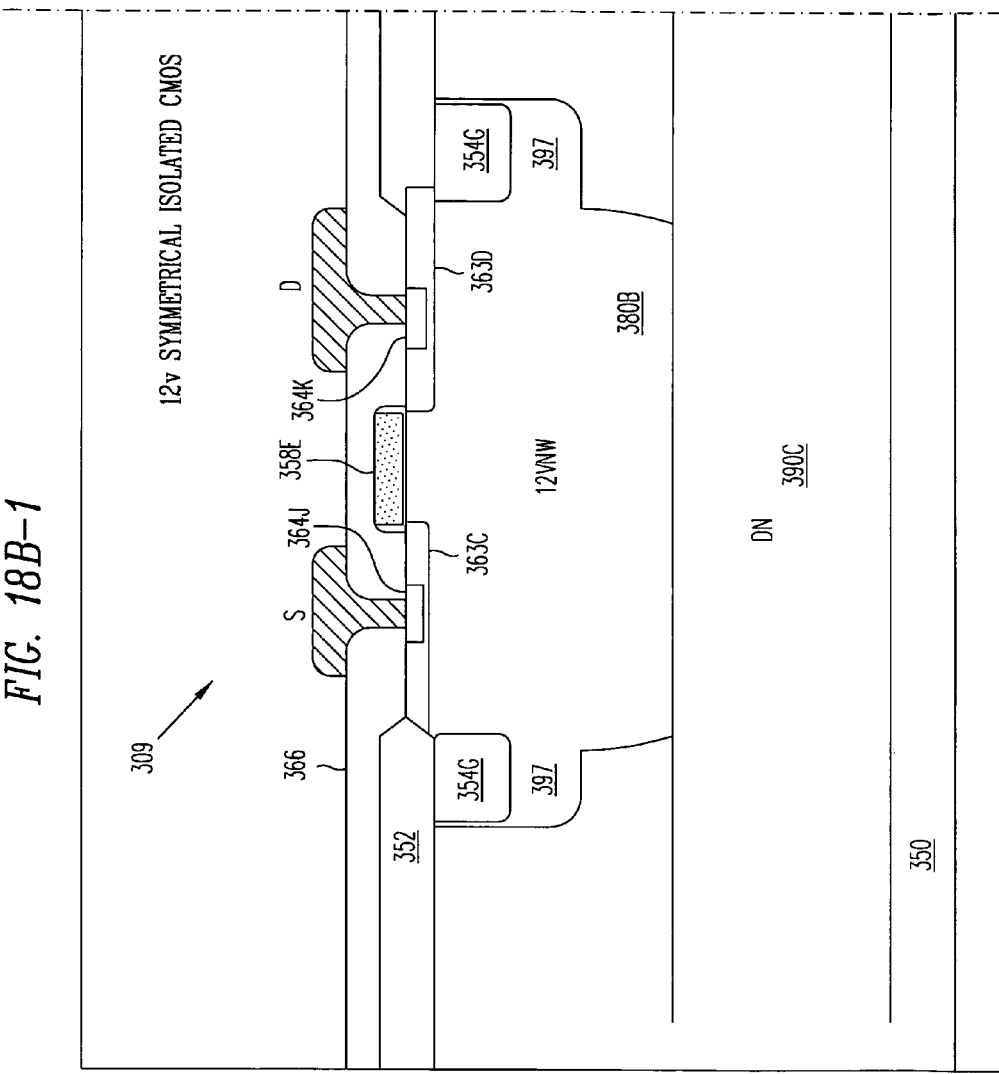
Figures 2, 18B:
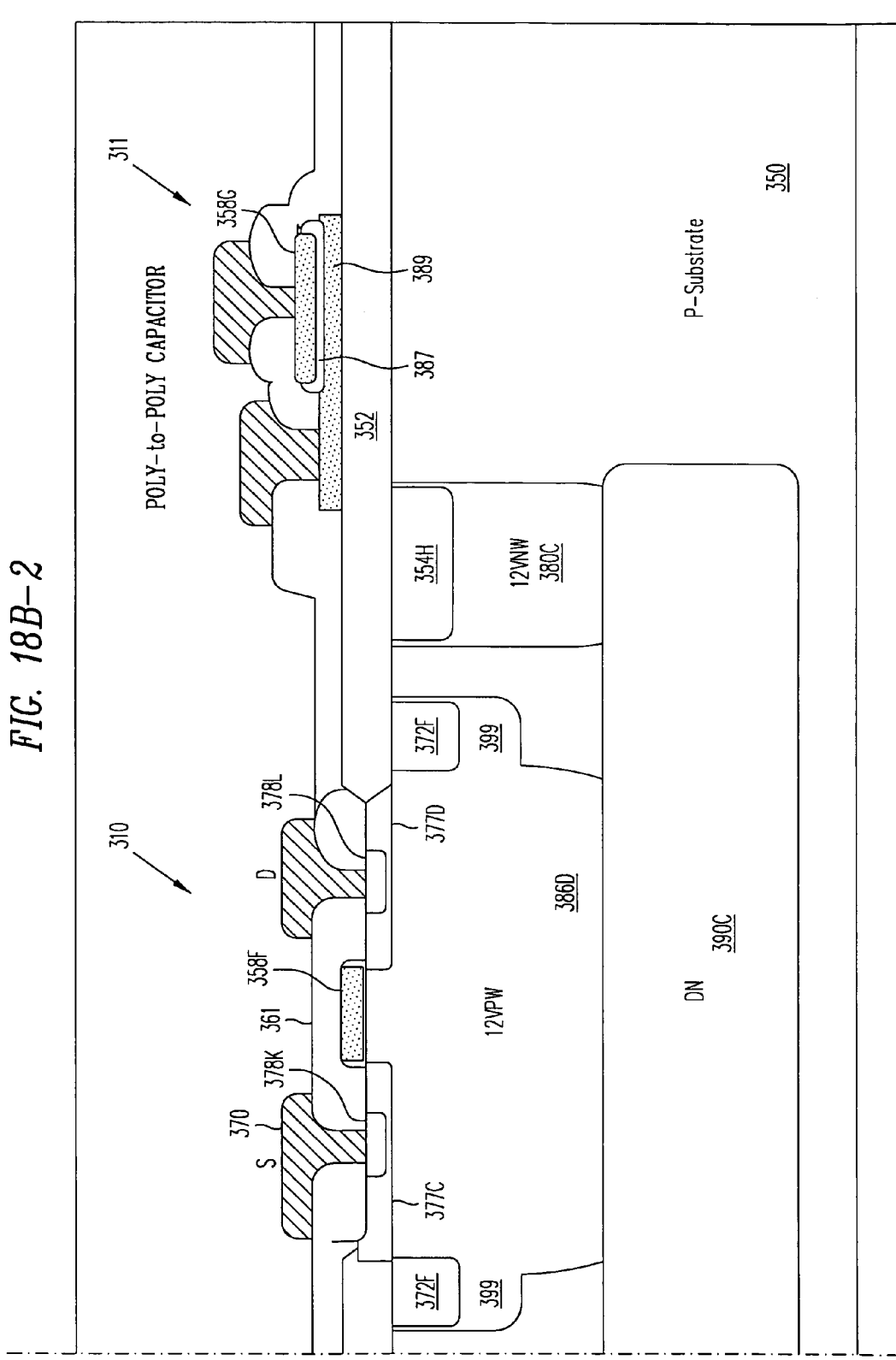
Figures 3, 18B:
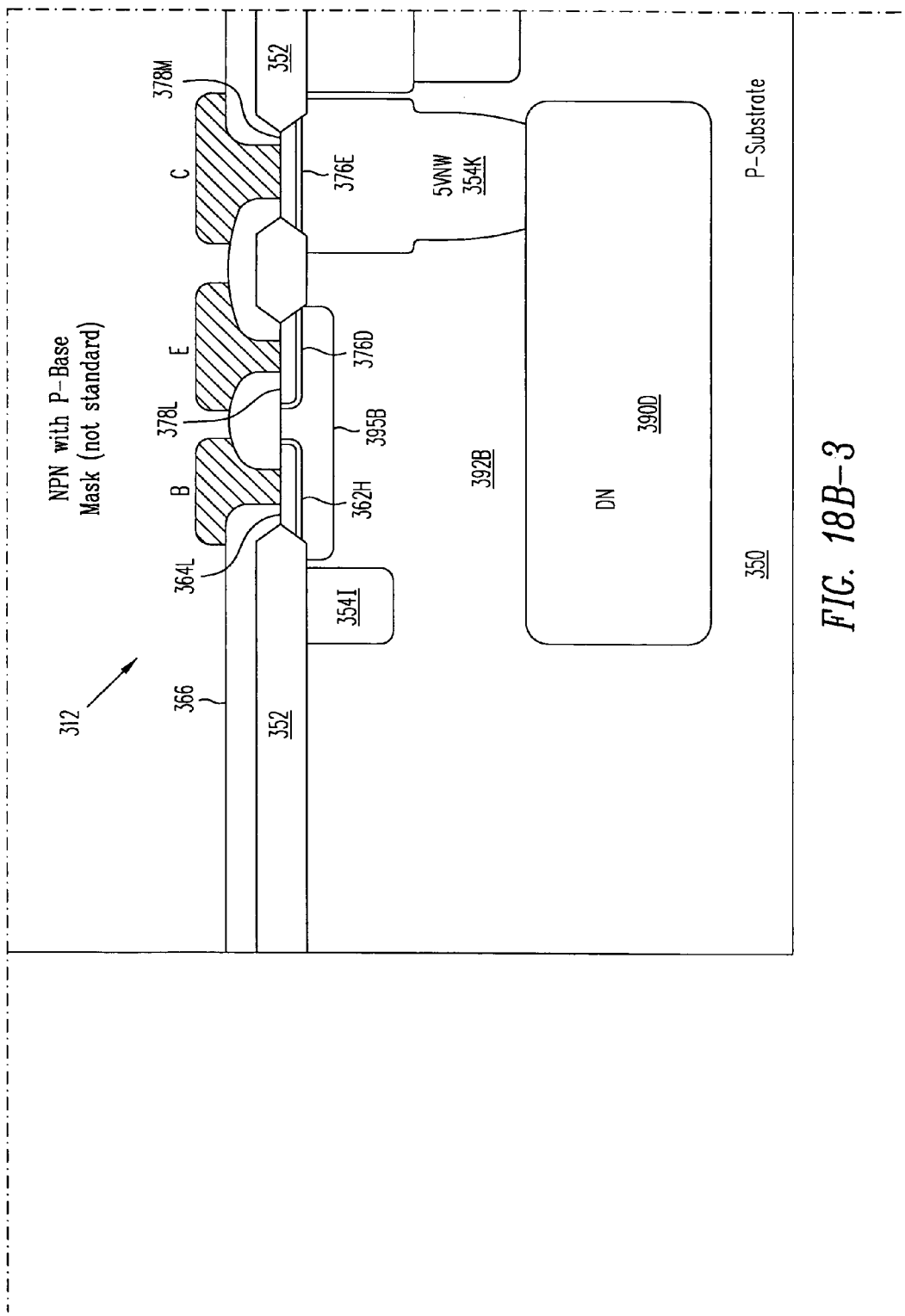
Figures 4, 18B:
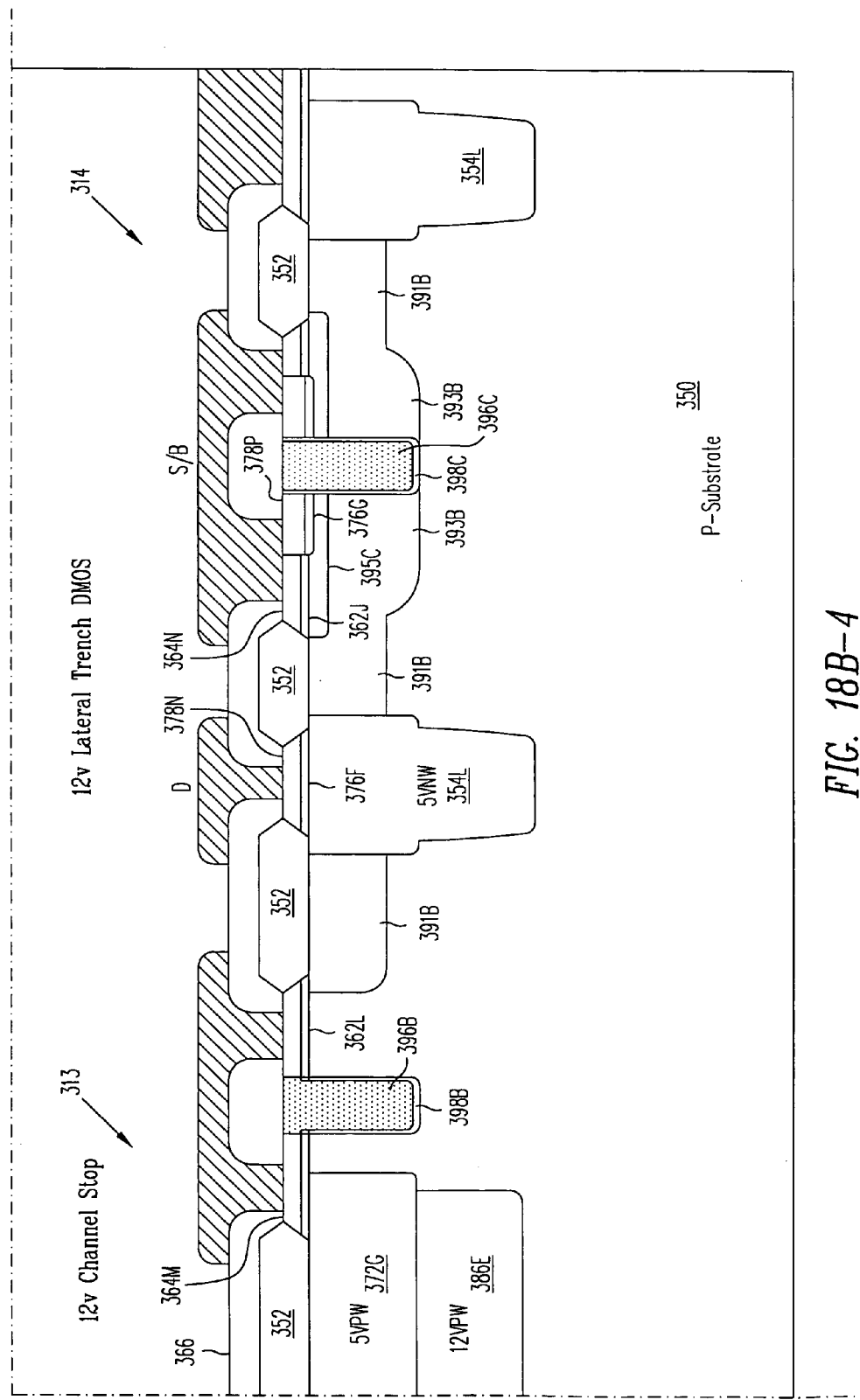
Figure 18C:
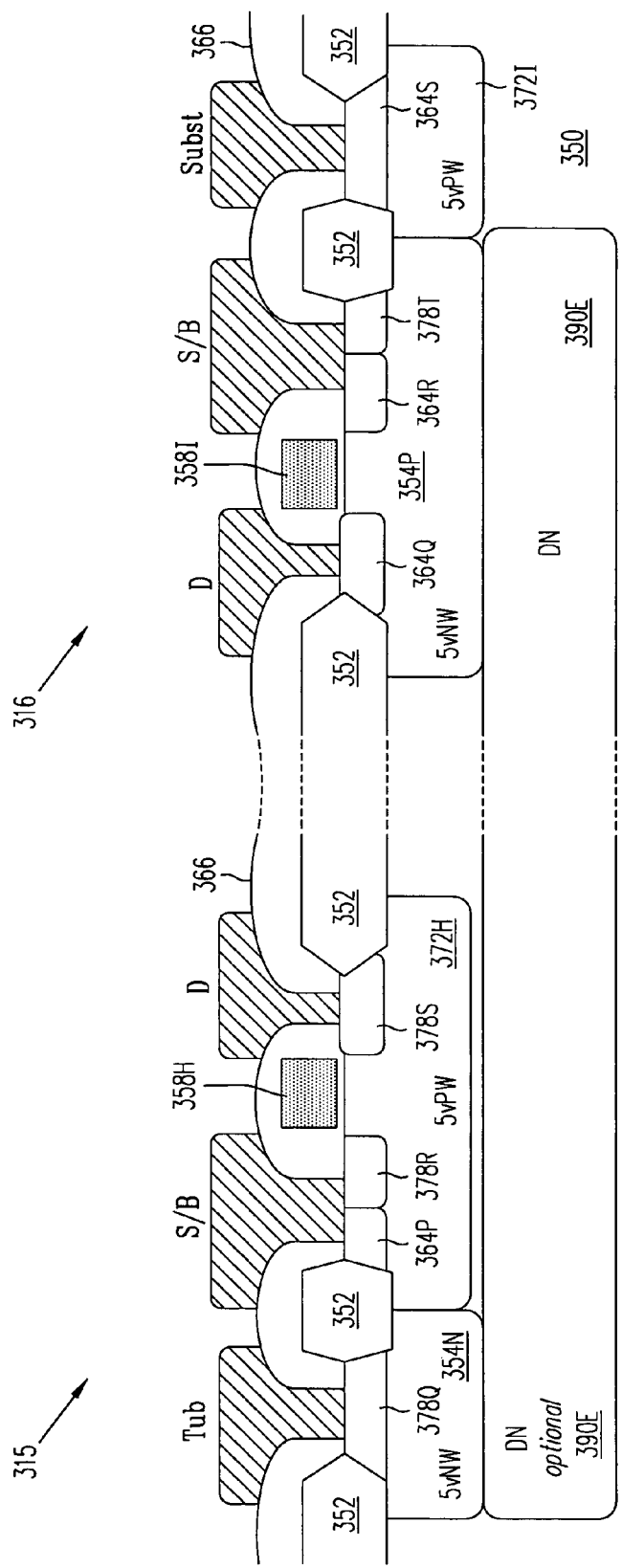
Figure 18D:
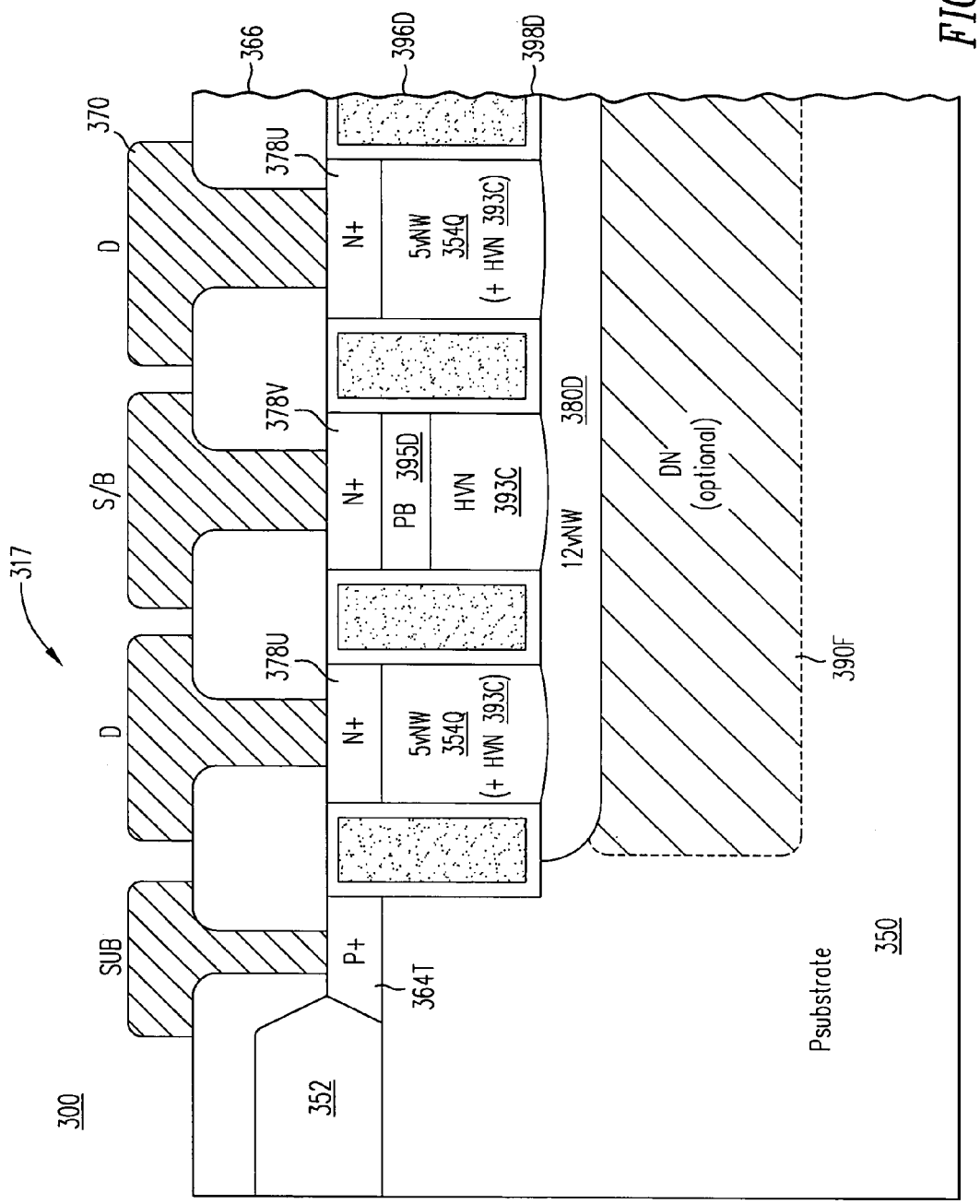
Figure 18E:
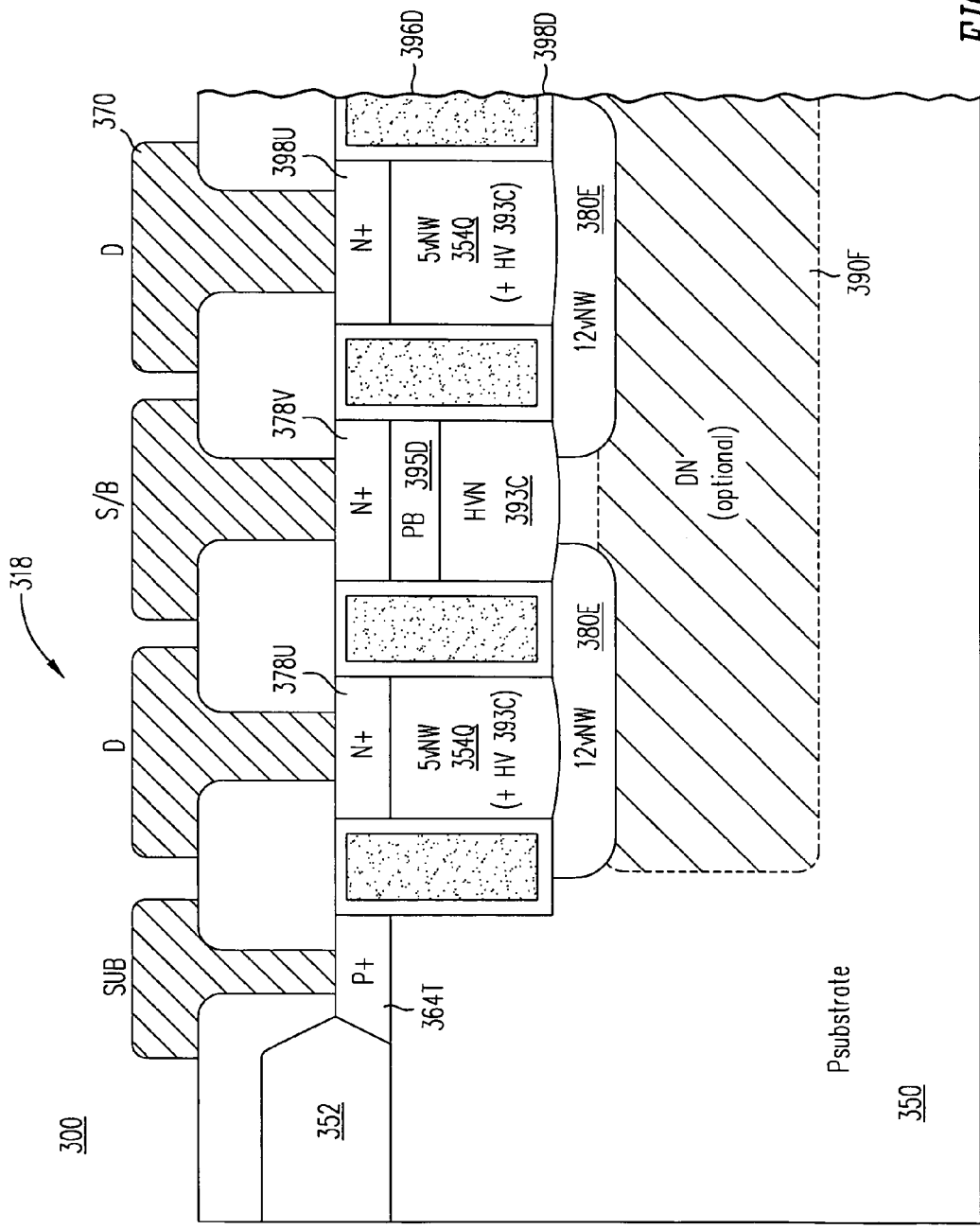
Figure 18F:
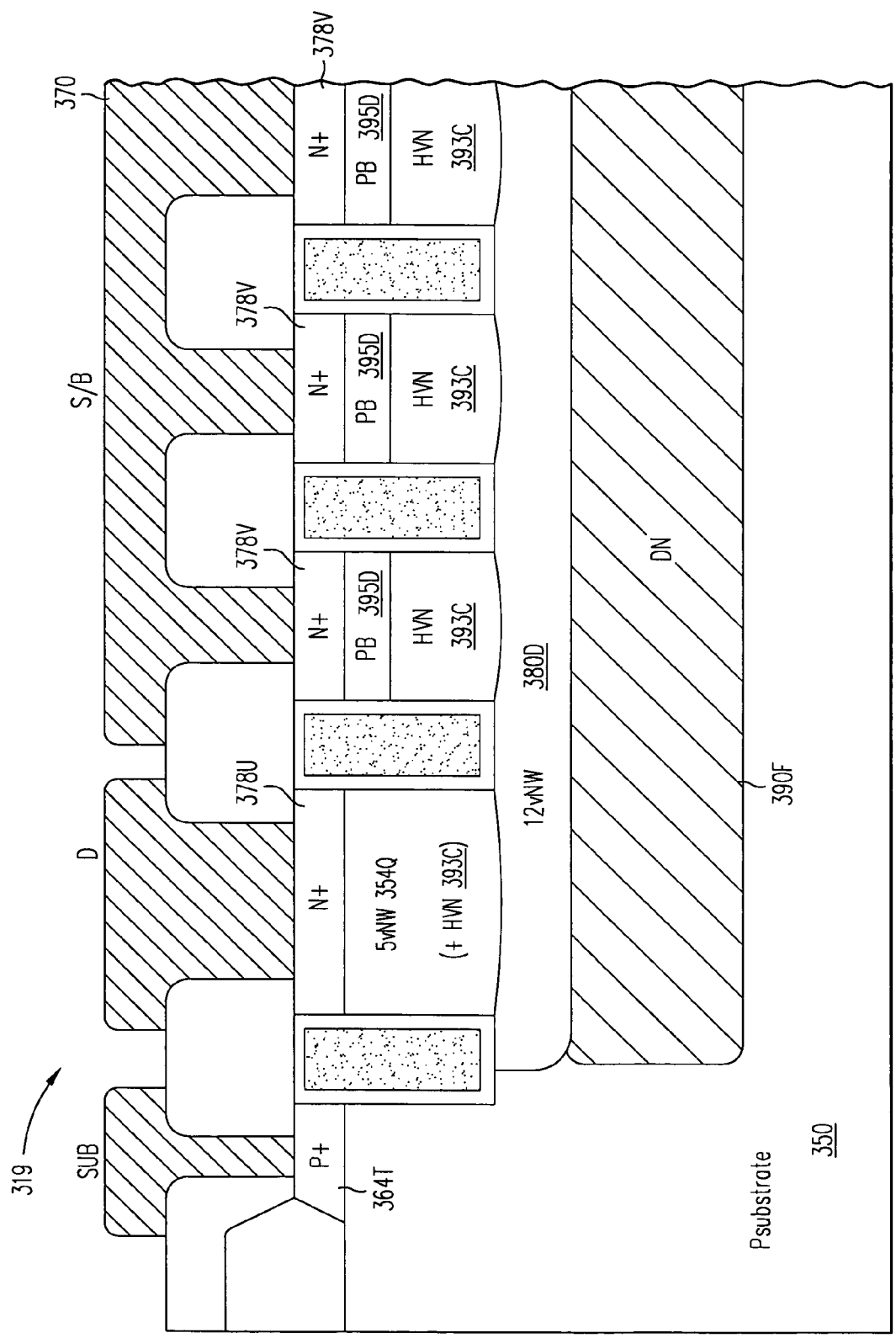
Figure 18G:
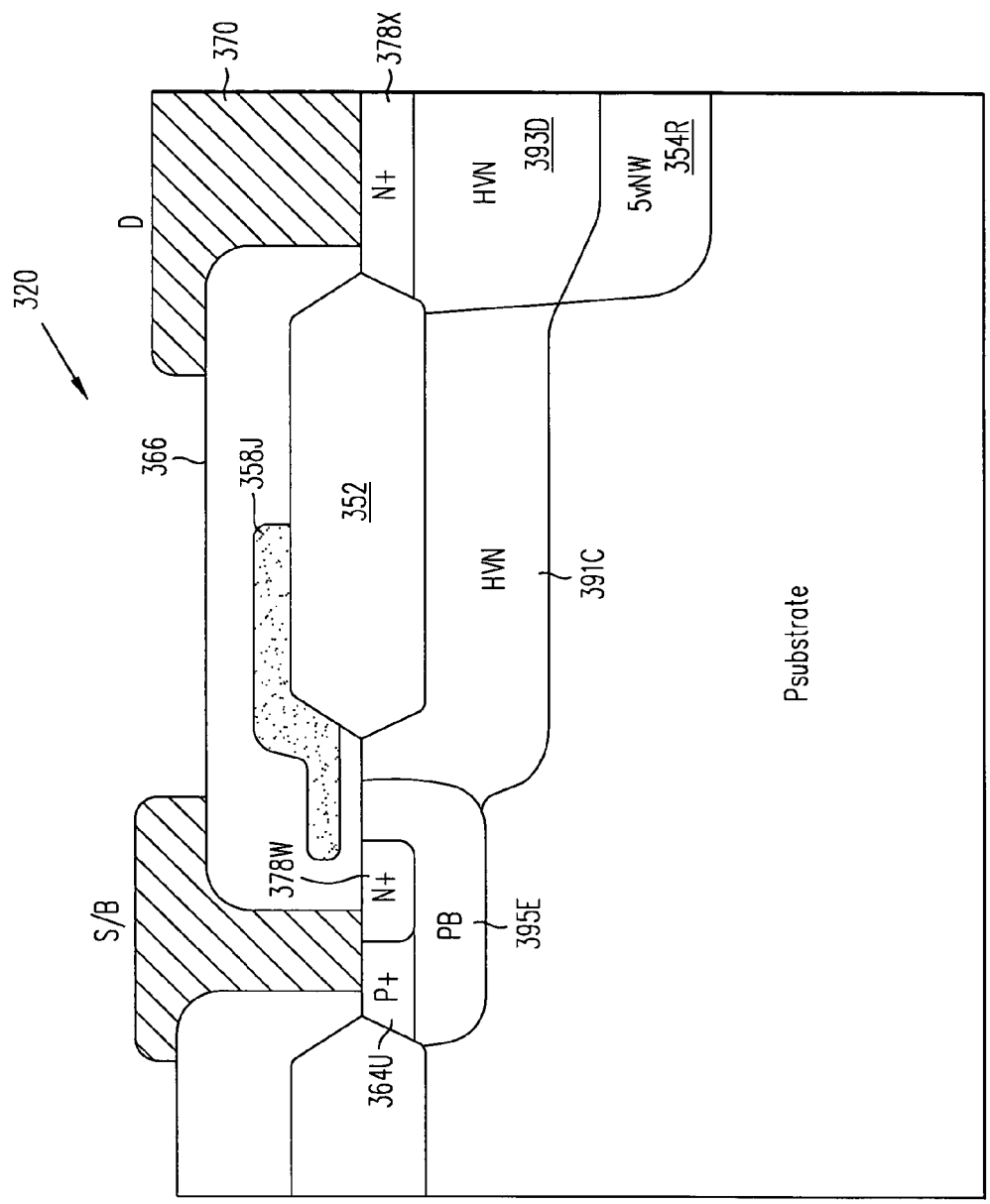
Figure 18H:
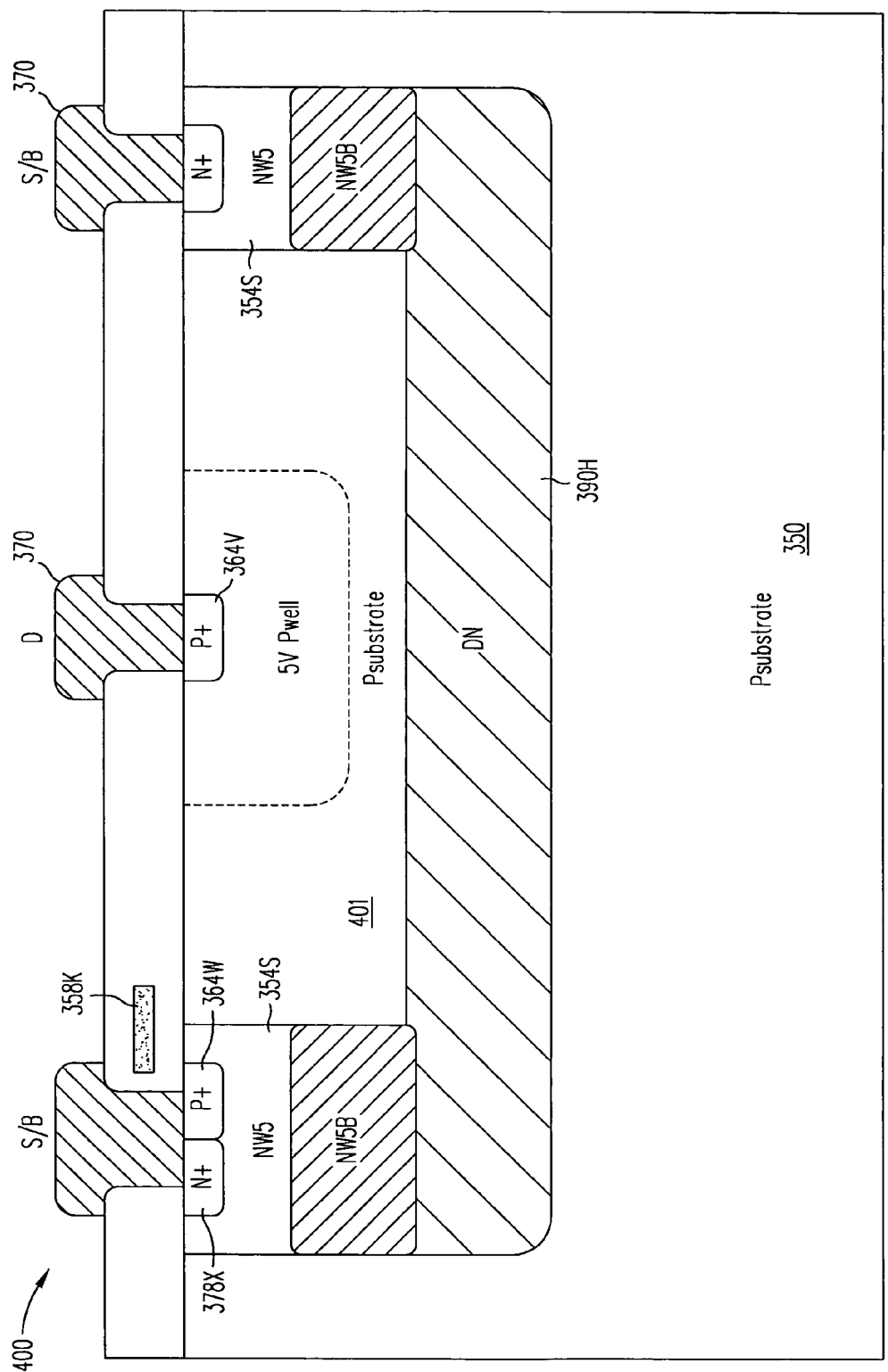

FIG. 18H shows a shows a lateral P-channel DMOS.

FIGS. 19A–19H are equivalent circuit diagrams of some of the devices shown in FIGS. 18A-1 to 18A-4, 18B-1 to 18B-4 and 18C–18H.

FIG. 19A shows the 5V CMOS shown in FIG. 18A-1.

FIG. 19B shows the 12V CMOS shown in FIG. 18A-2.

Figure 1A:
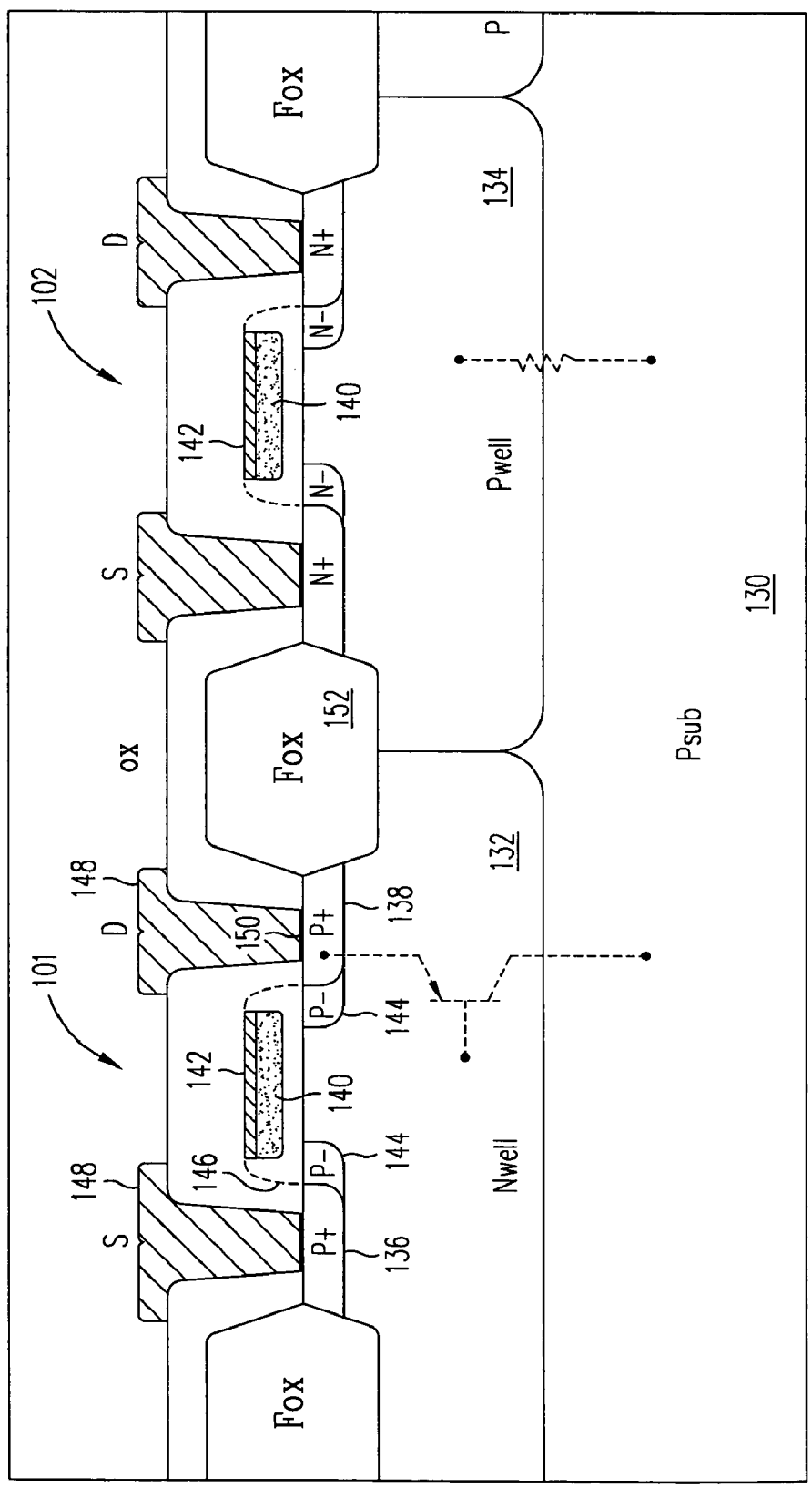
FIGS. 1A–1C describe attributes of a prior art conventional epi-less twin well CMOS process and its variants.
Figure 1B:
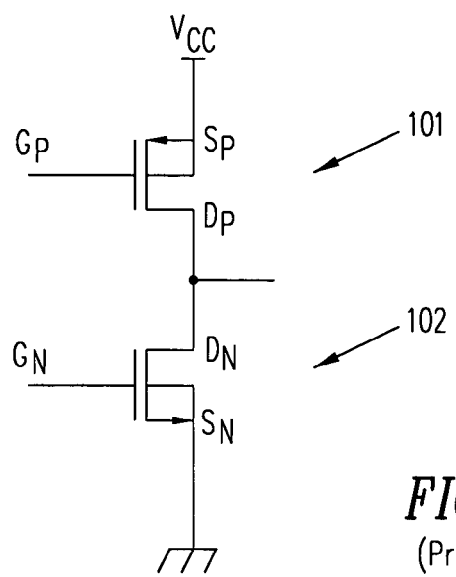
Figure 1C:
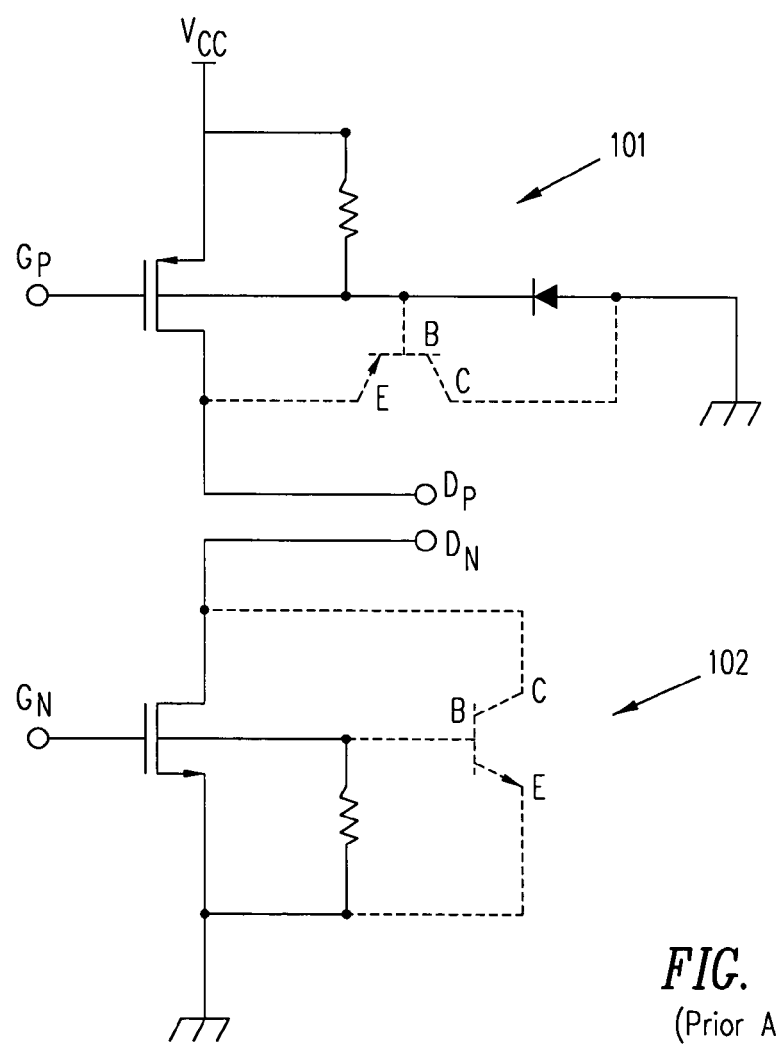
Figure 2A:
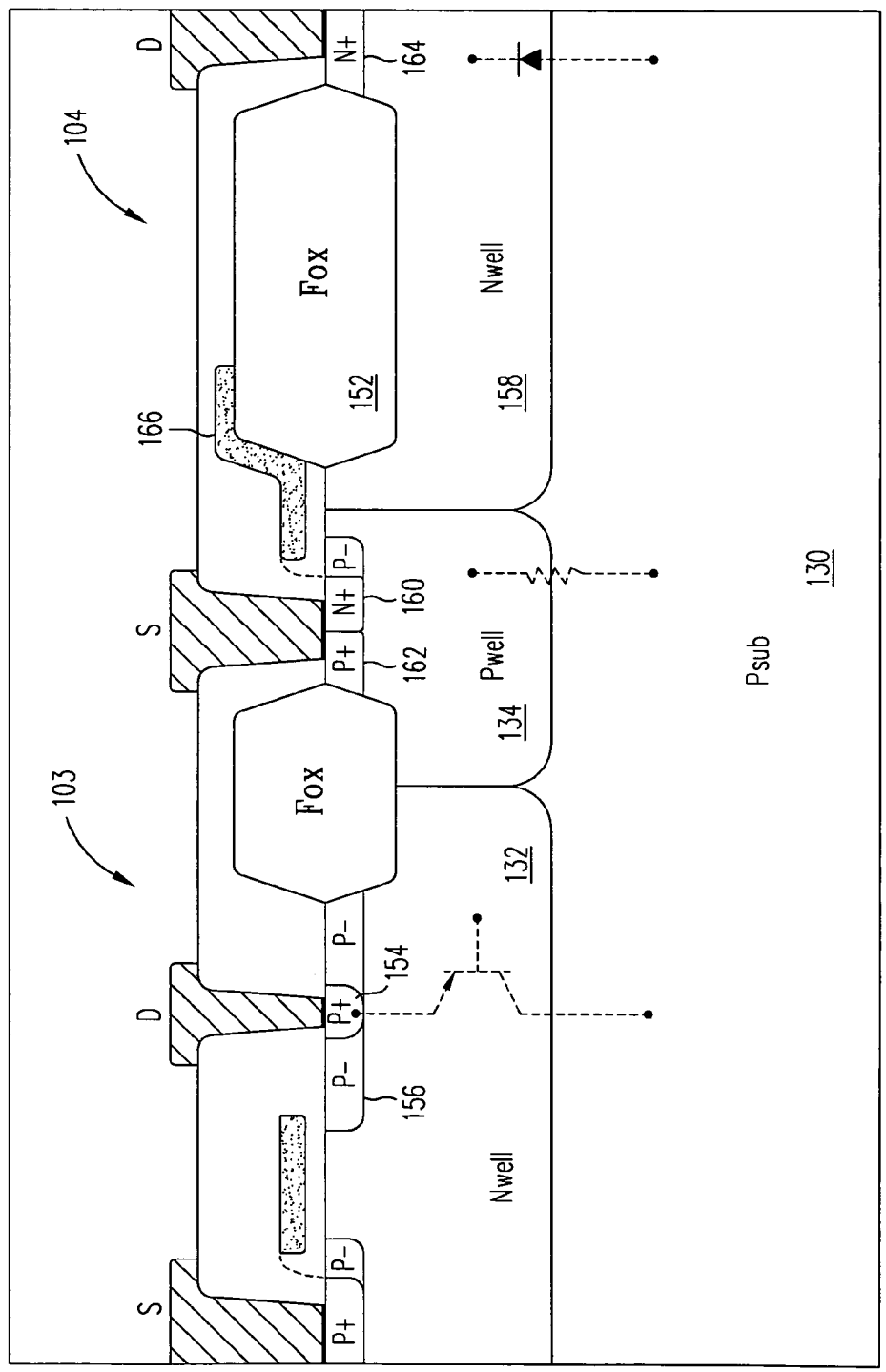
FIGS. 2A–2C describe the integration of high voltage elements into a conventional epi-less twin-well CMOS and the problems arising from such an implementation.
Figure 2B:
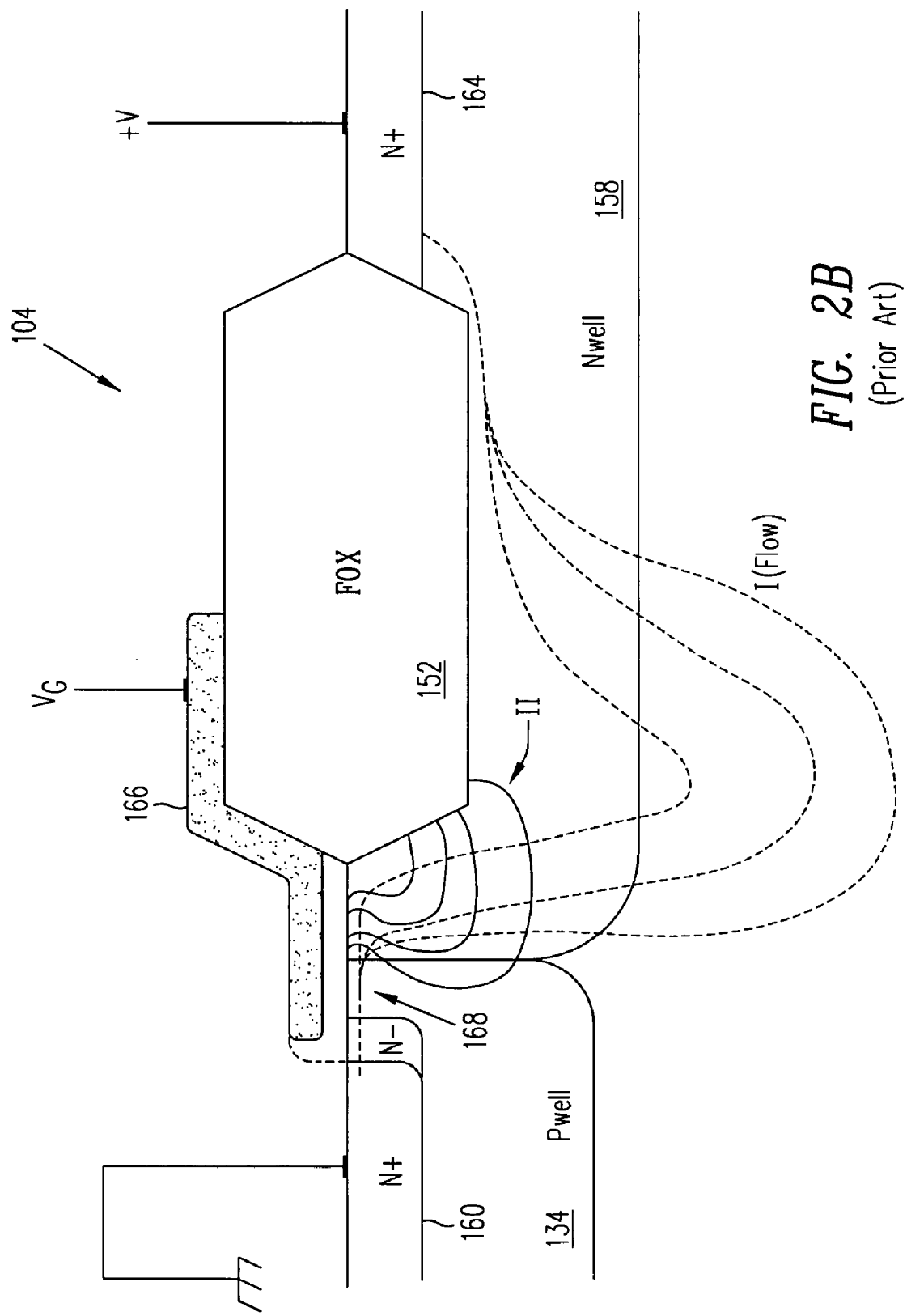
Figure 2C:
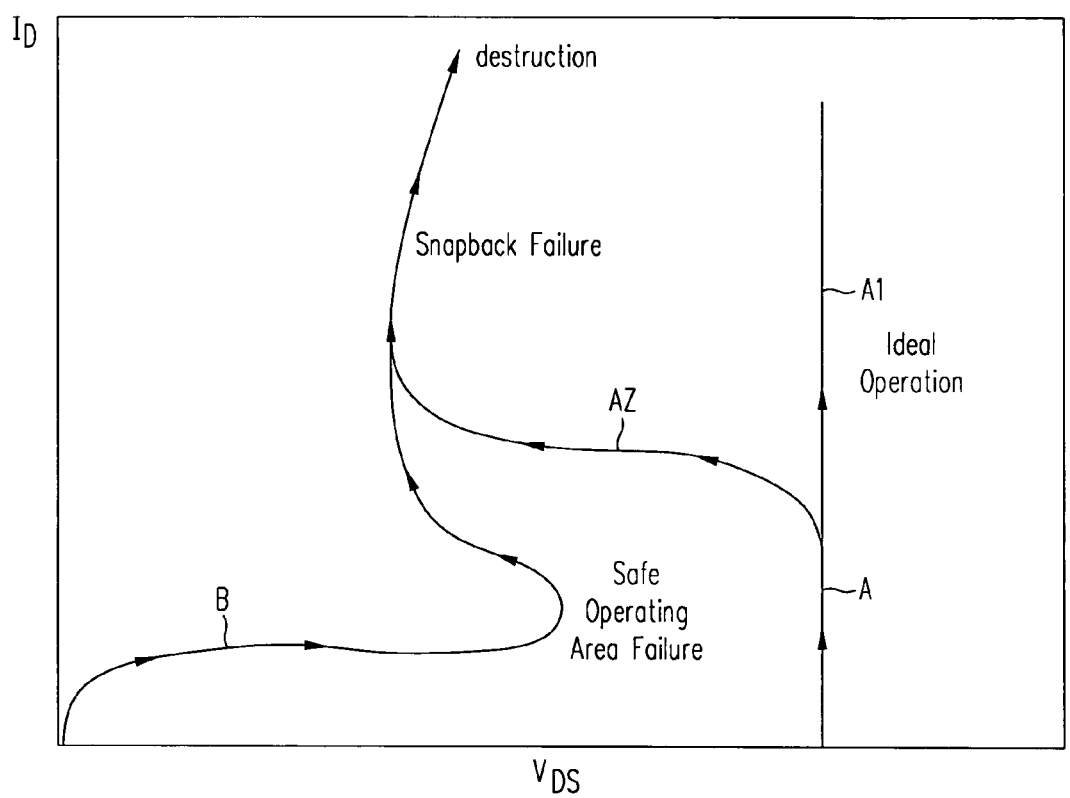
Figure 2D:
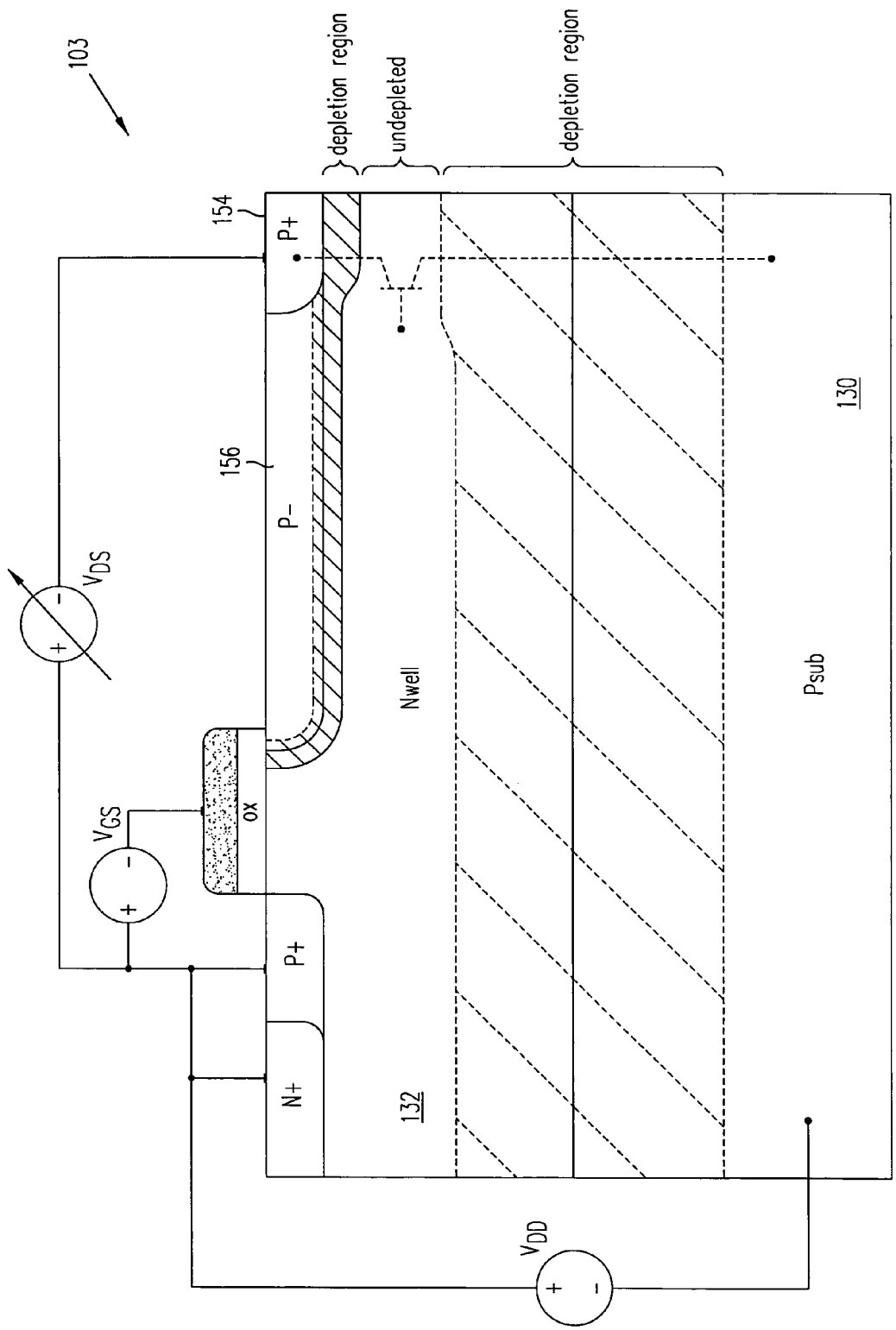
FIG. 2D is a cross-sectional view of a conventional prior-art extended-drain N well-enclosed PMOS illustrating depletion regions (cross hatched), bias conditions, and the potential parasitic bipolar intrinsic to the device.
Figure 3:
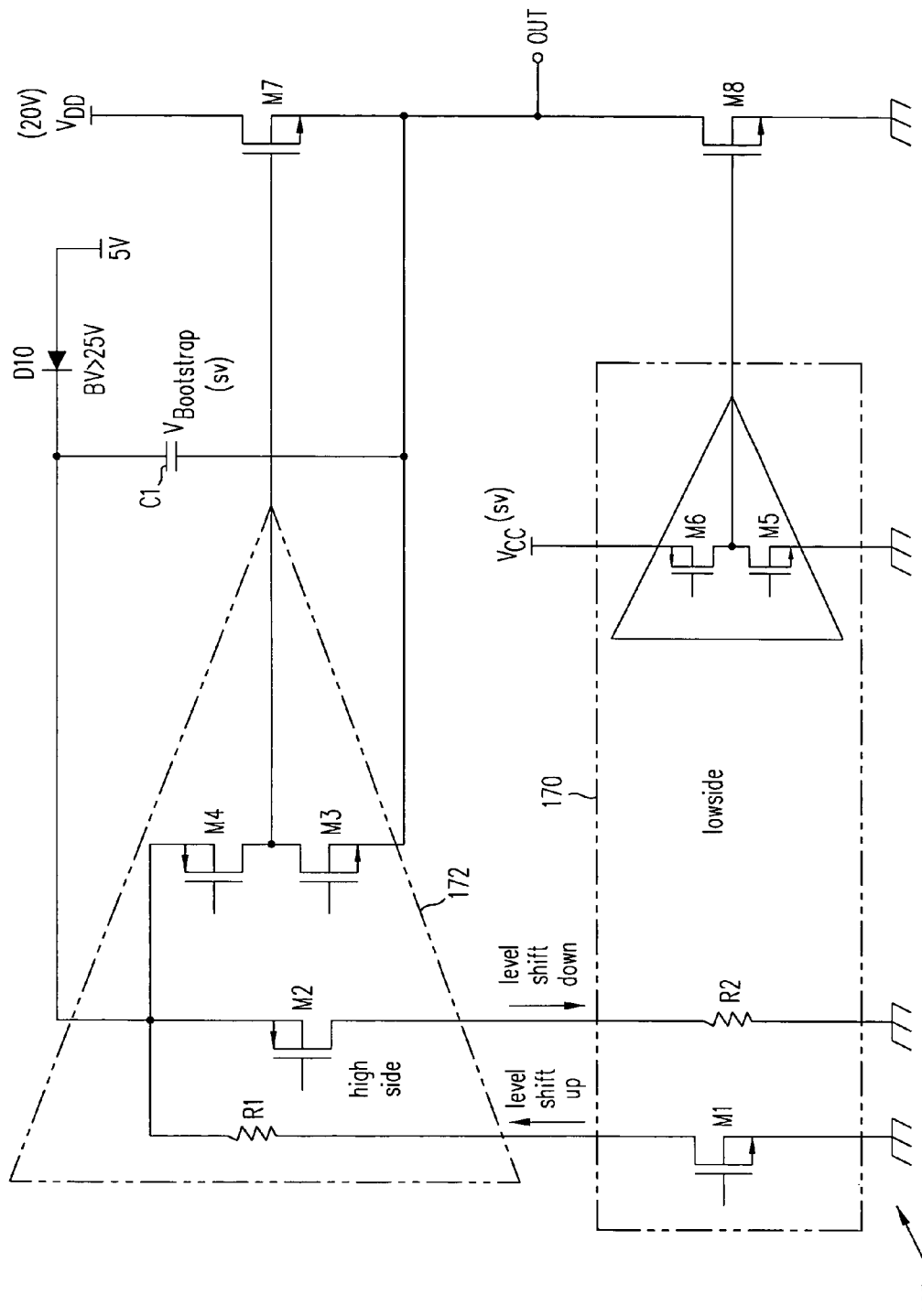
FIG. 3 shows a prior art circuit for driving an all N-channel push-pull (totem-pole) power MOSFET output stage with bootstrap powered floating high-side driver, including high voltage elements for up-link and down-linked level shifted signals.
Figure 4A:
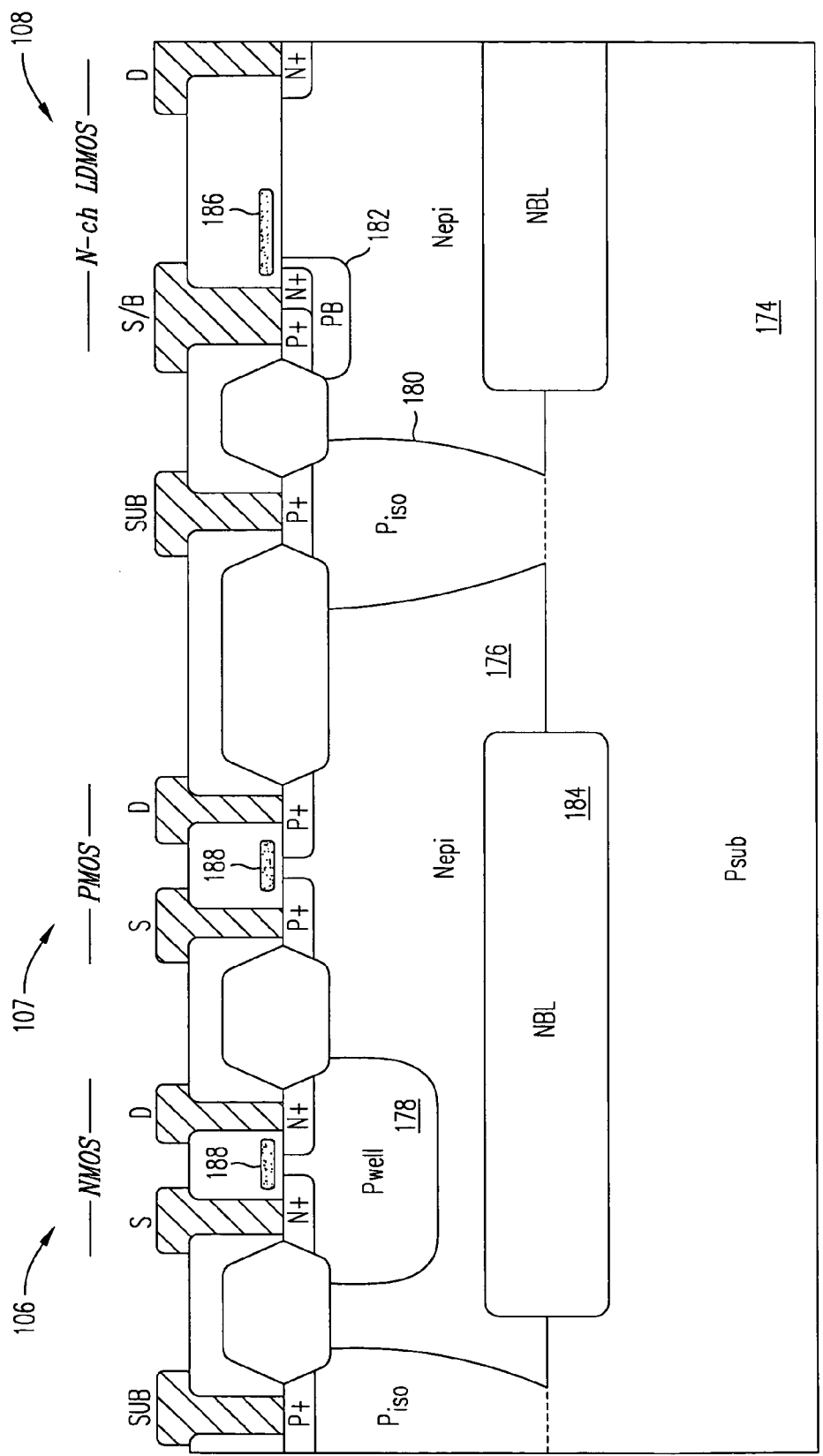
FIGS. 4A–4C are cross-sectional views of the epitaxial junction isolation (epi-JI) of CMOS, bipolar and DMOS components using deep "down-only" isolation diffusions.
Figure 4B:
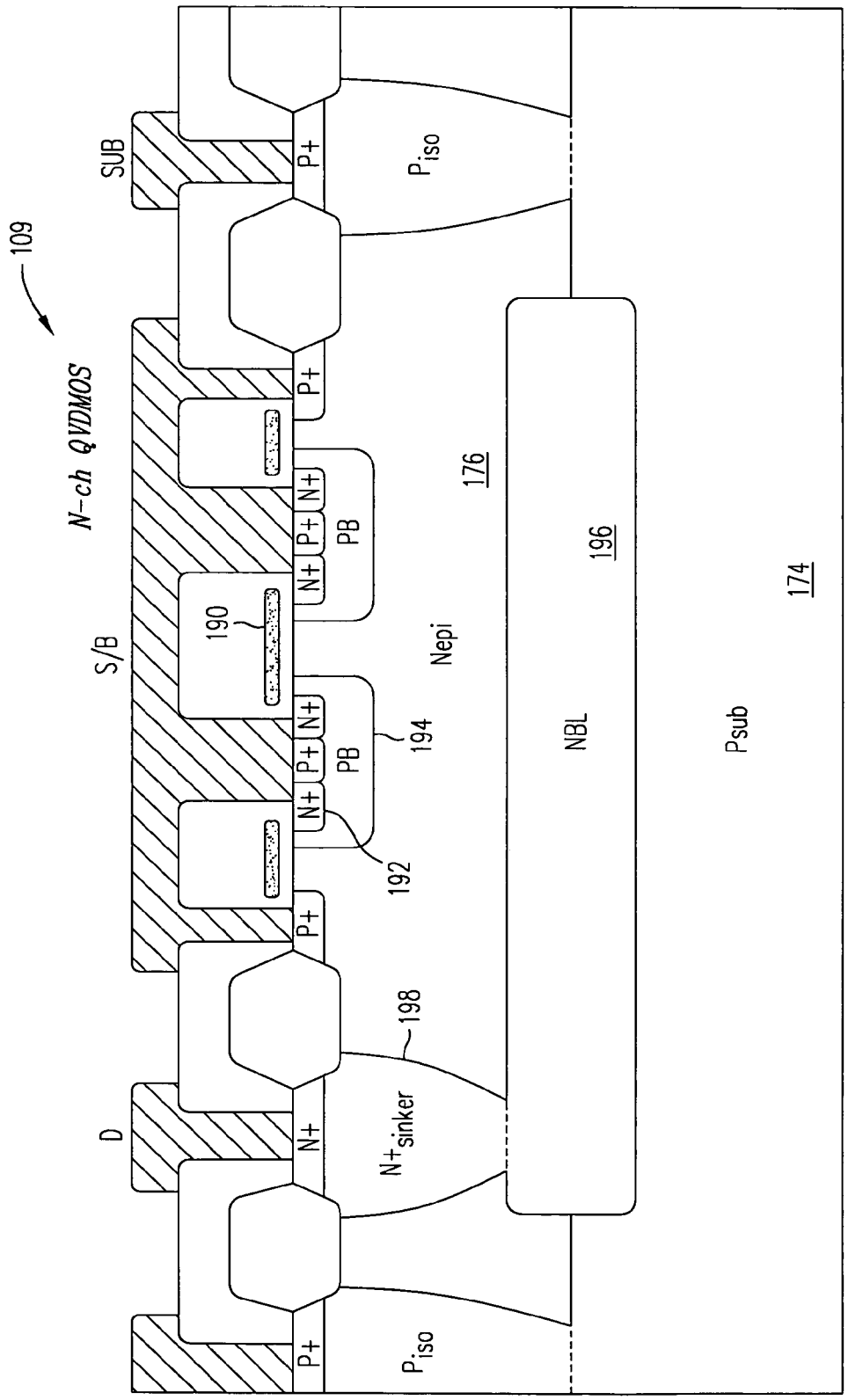
Figure 4C:
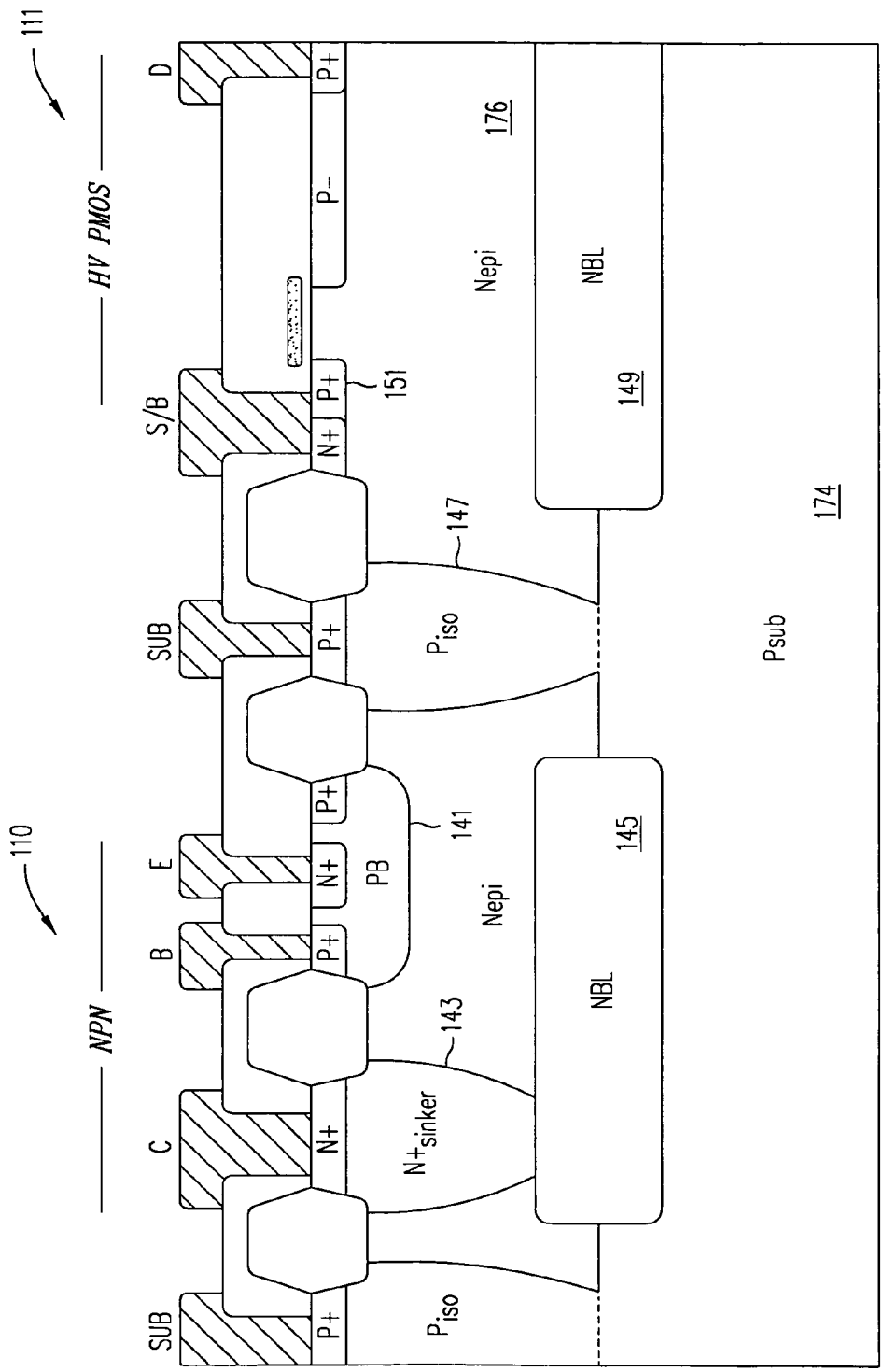
Figure 5A:
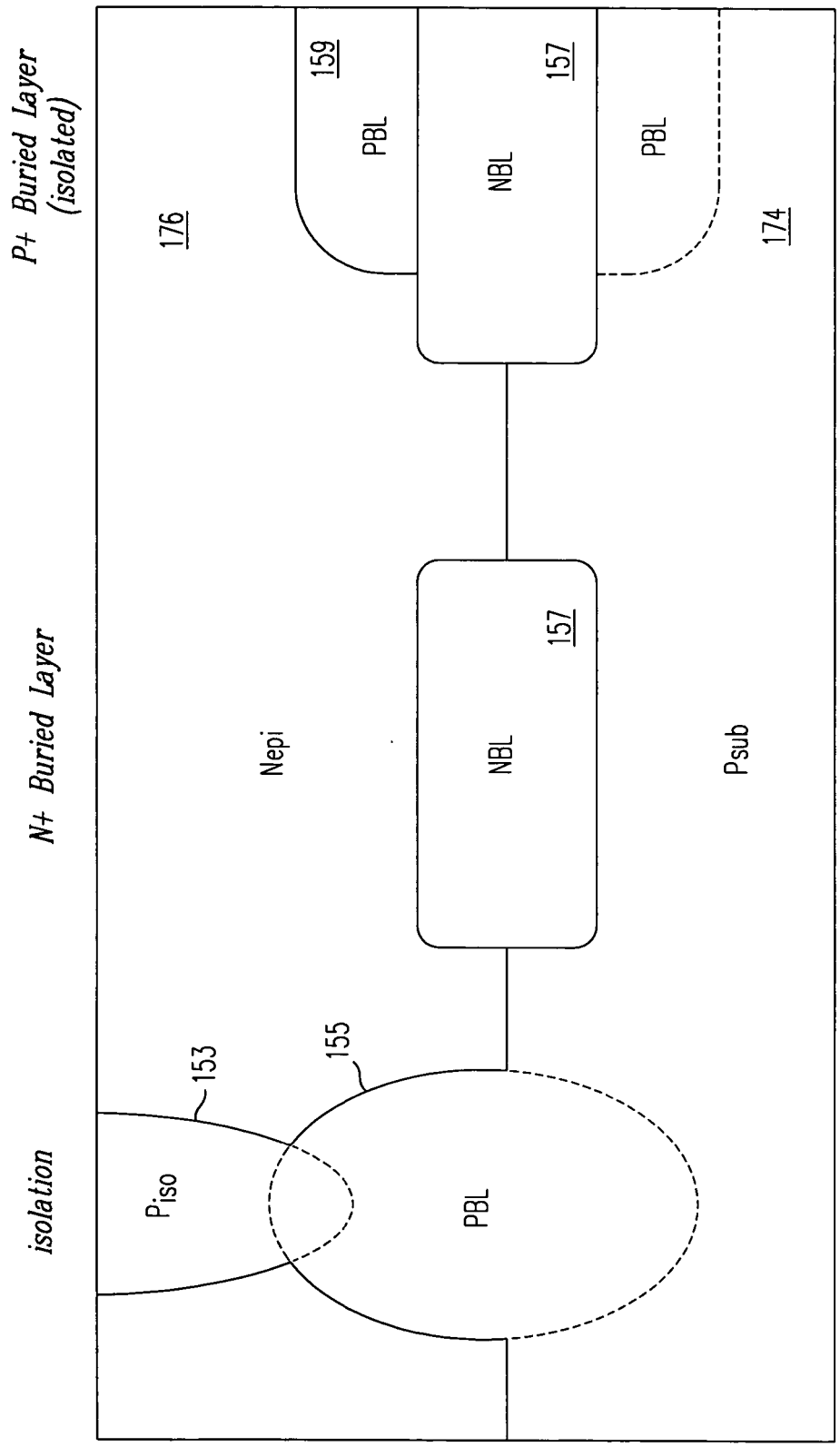
FIGS. 5A–5C are cross-sectional views of the epitaxial junction isolation (epi-JI) of CMOS, bipolar and DMOS components using various buried layers combined with a deep-diffused isolation diffusion to produce "up-down" isolation diffusions having less lateral diffusion than a down-only isolation.
Figure 5B:
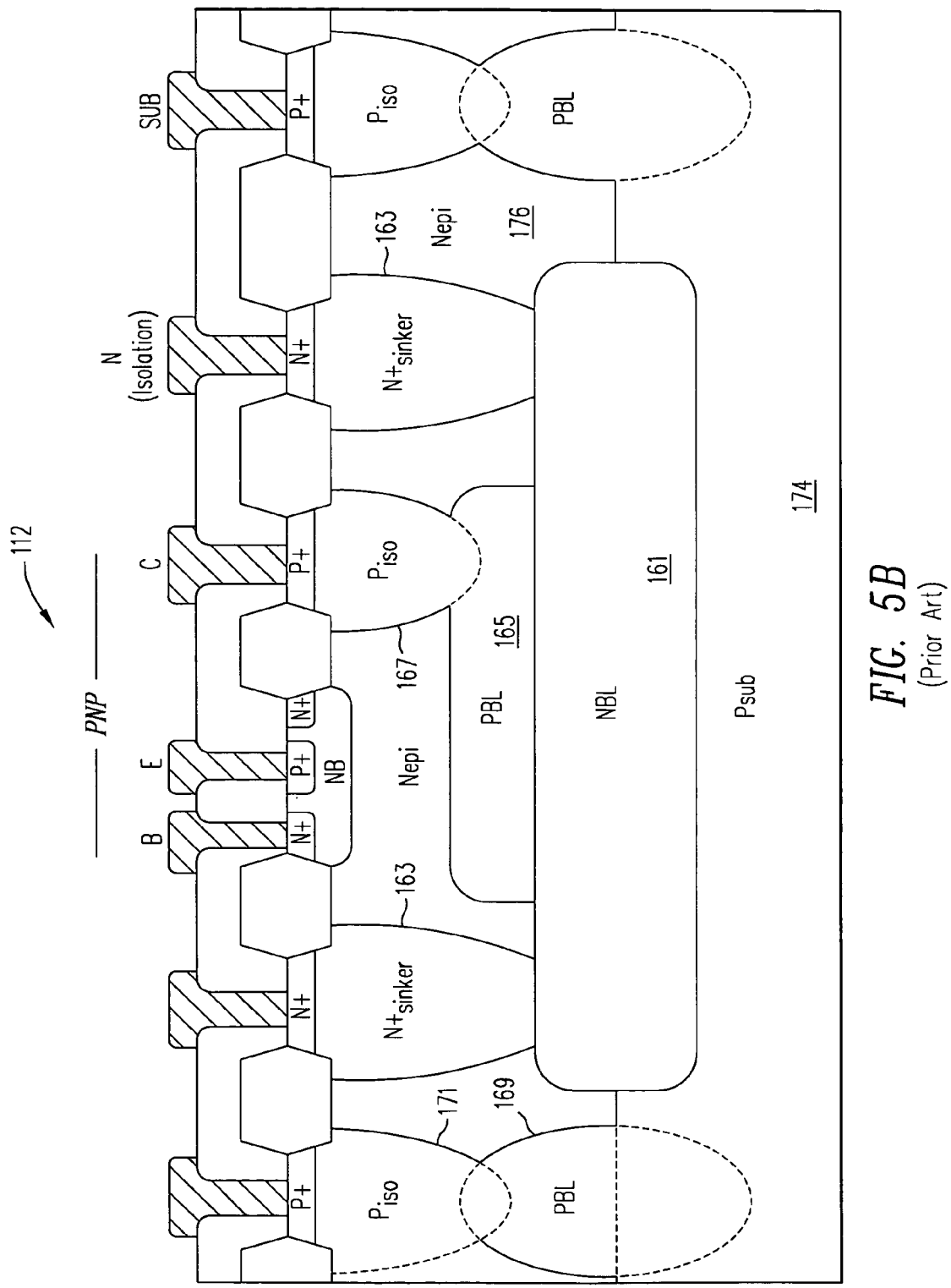
Figure 5C:
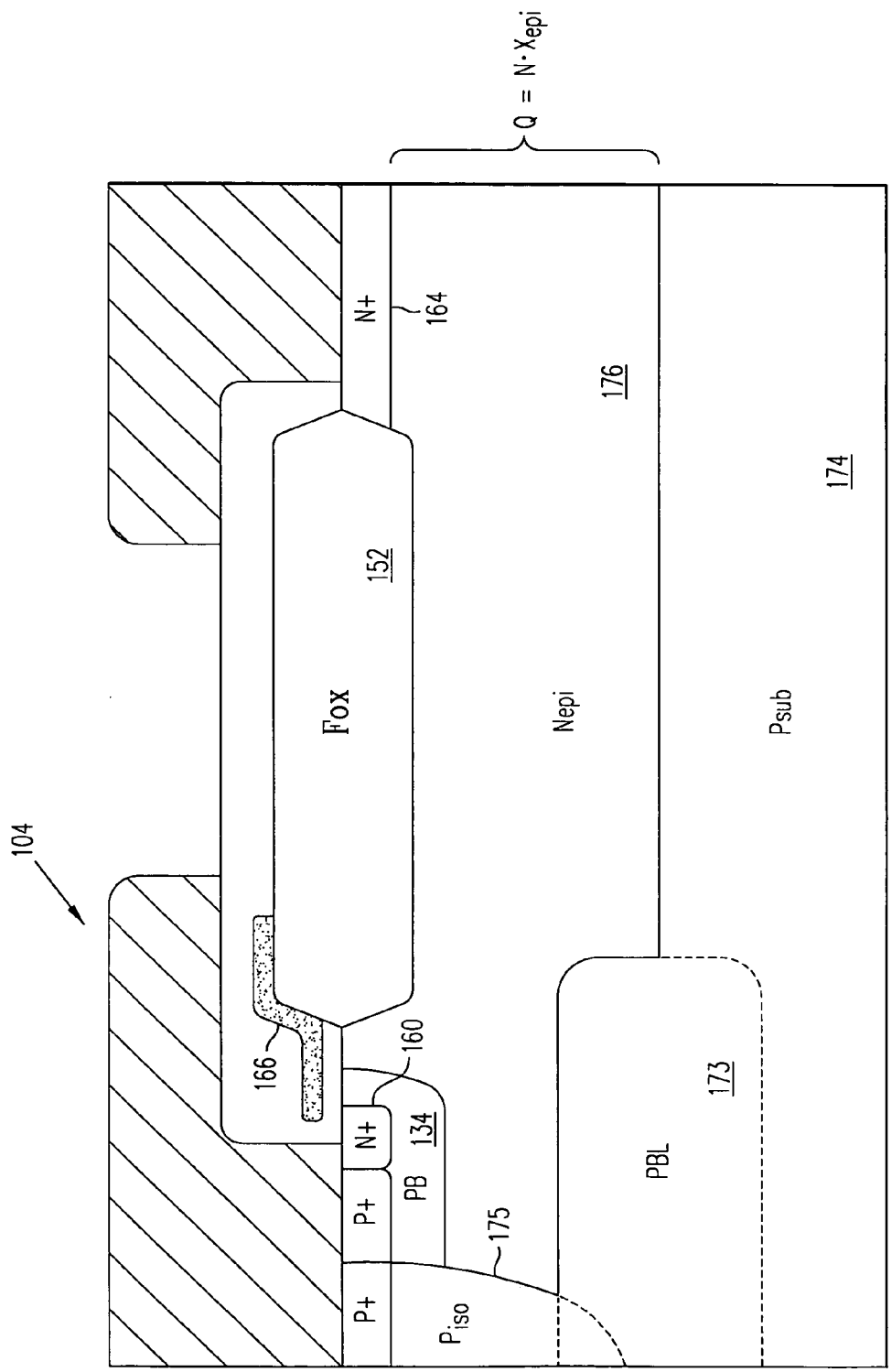
Figure 6A:
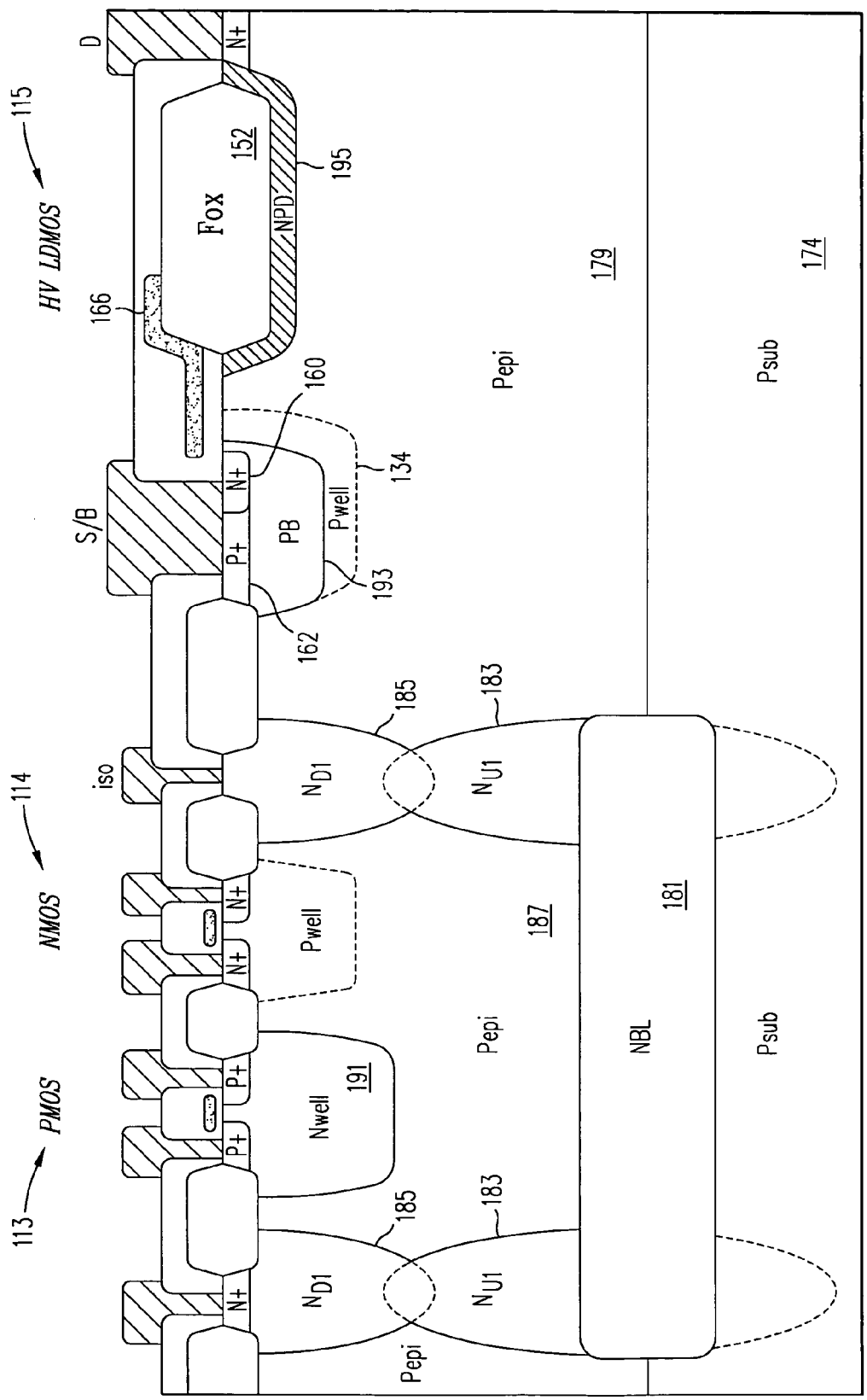
FIGS. 6A–6C are cross-sectional views of a wrap-around junction isolation (epi-WAJI) of CMOS, bipolar and DMOS components using various buried layers and combined with isolation diffusions with an epitaxial layer having the same conductivity type of the substrate.
Figure 6B:
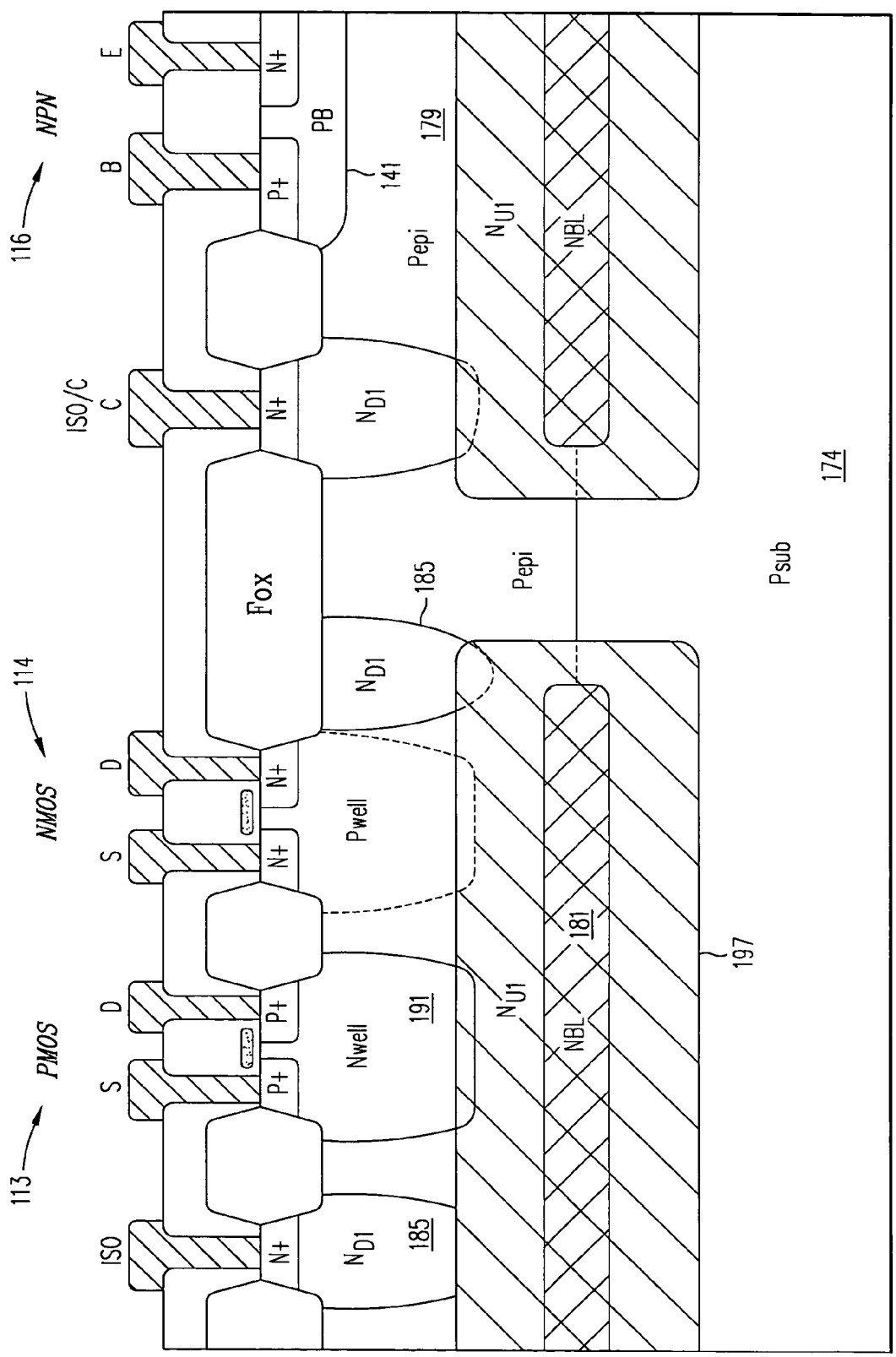
Figure 6C:
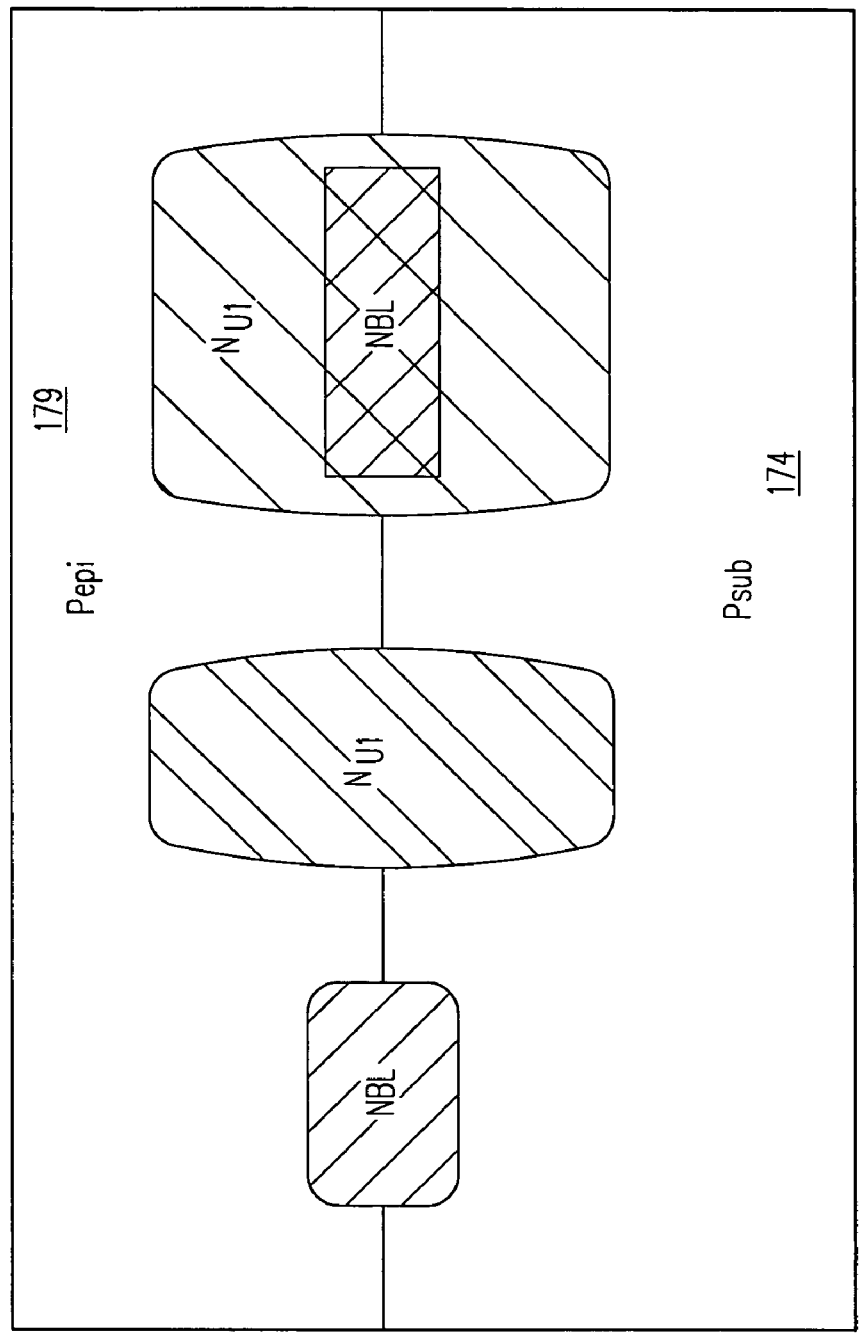

FIG. 19C shows the 5V NPN shown in FIG. 18A-3.

Figure 19D:
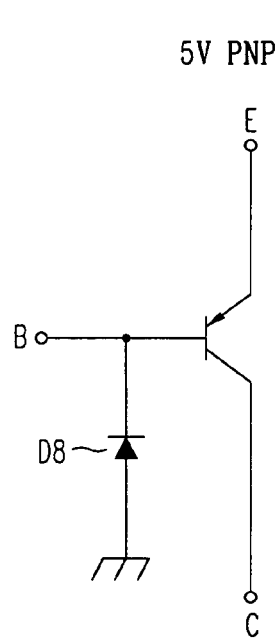

FIG. 19D shows the 5V PNP shown in FIGS. 18A-3 and 18A-4.

Figure 19E:
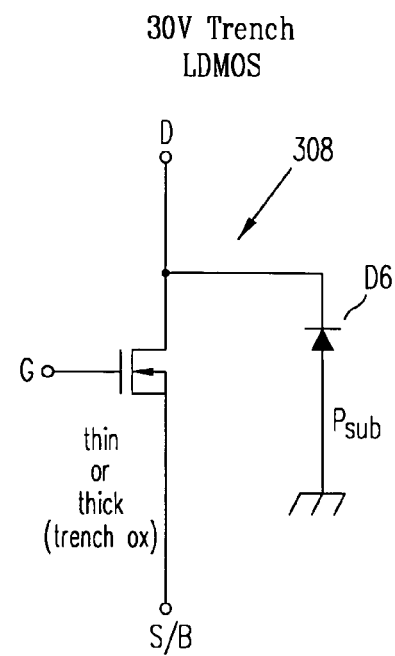

FIG. 19E shows the 30V trench lateral DMOS shown in FIG. 18A-4.

Figures 19F, 19G:
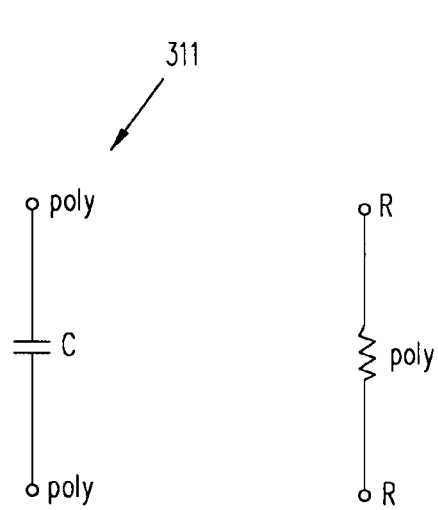

FIG. 19F shows the poly-to-poly capacitor shown in FIG. 18B-2.

FIG. 19G shows a poly resistor (not shown in FIGS. 18A–18H).

Figure 20:
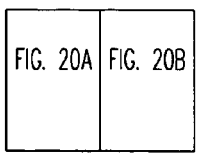
Figure 20A:
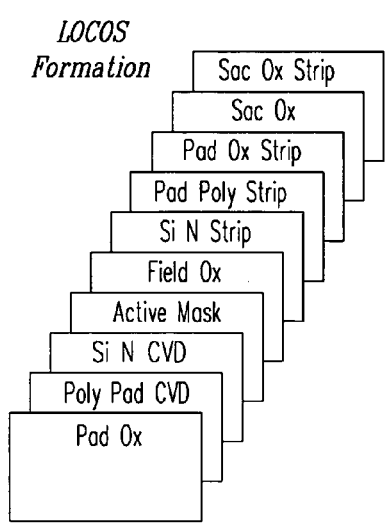
Figure 20A:
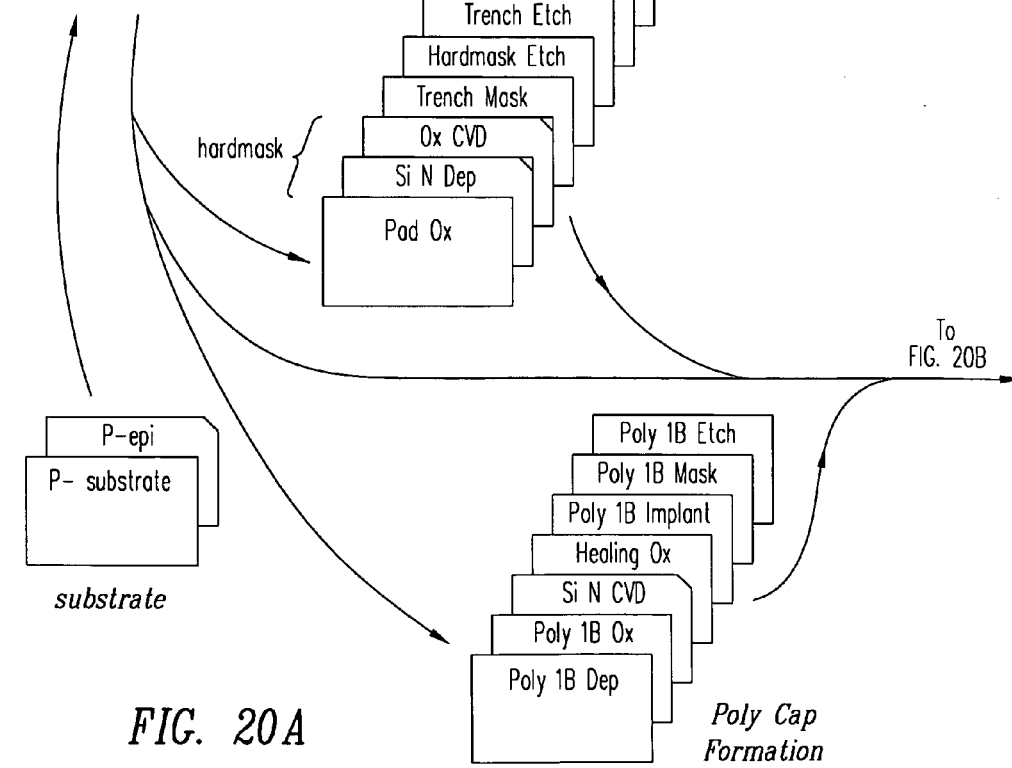
Figure 20B:
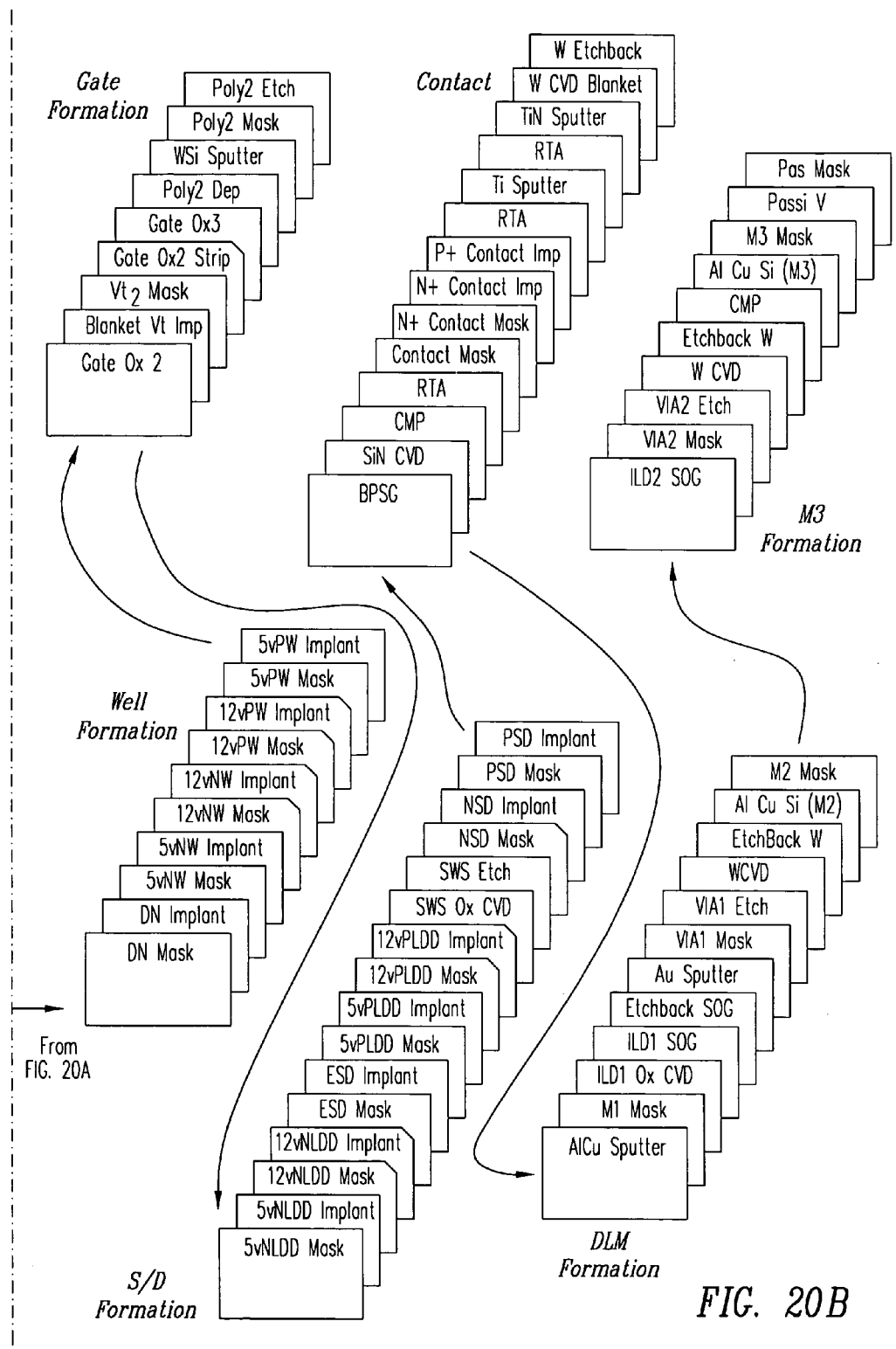

FIGS. 20A–20B show a flow diagram of a process in accordance with this invention.

FIGS. 21–67 illustrate the steps of a process for fabricating several of the devices shown in FIGS. 18A-1 to 18A-4, 18B-1 to 18B-4, and 18 C–18H, including the 5V CMOS, the 5V NPN and 5V PNP (high $F_T$ layout), the 5V NPN and 5V PNP (conventional layout), the 30V lateral trench CMOS, and the symmetrical 12V CMOS. The letter suffix of each drawing number indicates the device to which it pertains, as follows:

| Suffix | Device |
|---|---|
| "A" | 5 V CMOS (FIG. 18A-1) |
| "B" | 5 V NPN and 5 V PNP (high $F_T$ layout) (FIGS. 18A-3 and 18A-4) |
| "C" | 5 V NPN and 5 V PNP (conventional layout) (not shown) |
| "D" | 30 V lateral trench DMOS (FIG. 18A-4) |
| "E" | Symmetrical 12 V CMOS (FIGS. 18B-1 and 18B-2) |

Generally, drawings are not included for steps which do not affect the ultimate structure of the device. For example, where a layer is formed that will later be removed with affecting the structure of the underlying substrate, no drawing is included. As a result, the letter suffixes of the drawings are not sequential.

Figure 21:
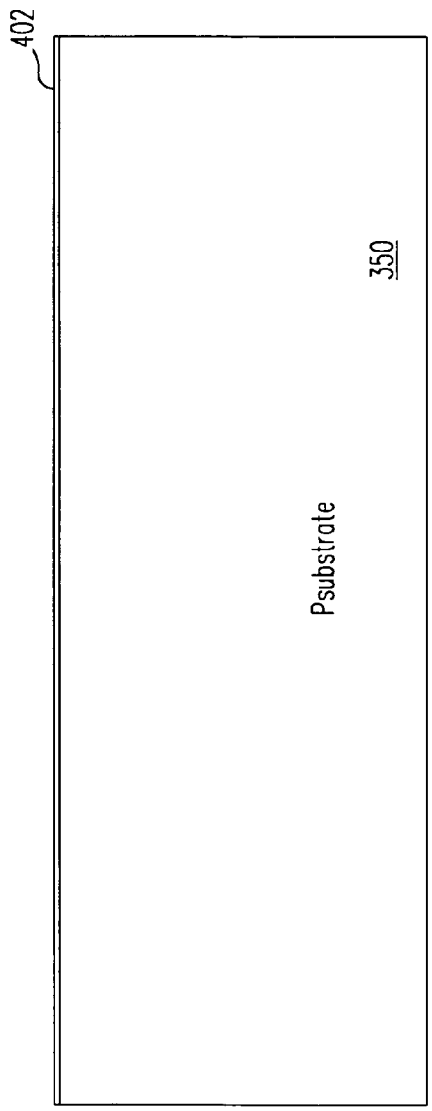
Figure 22A:
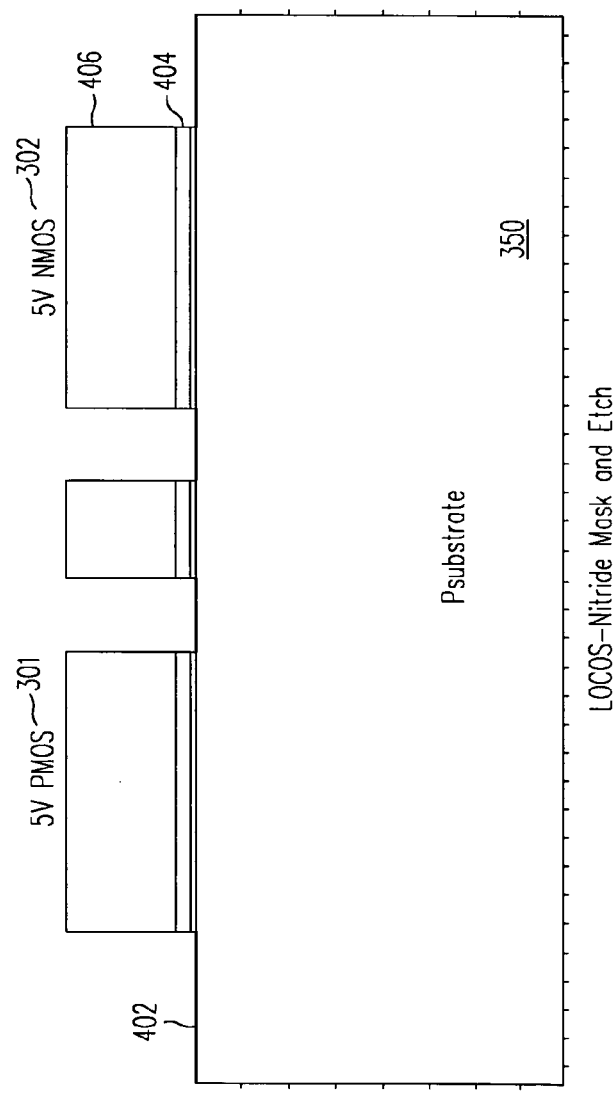
Figure 22D:
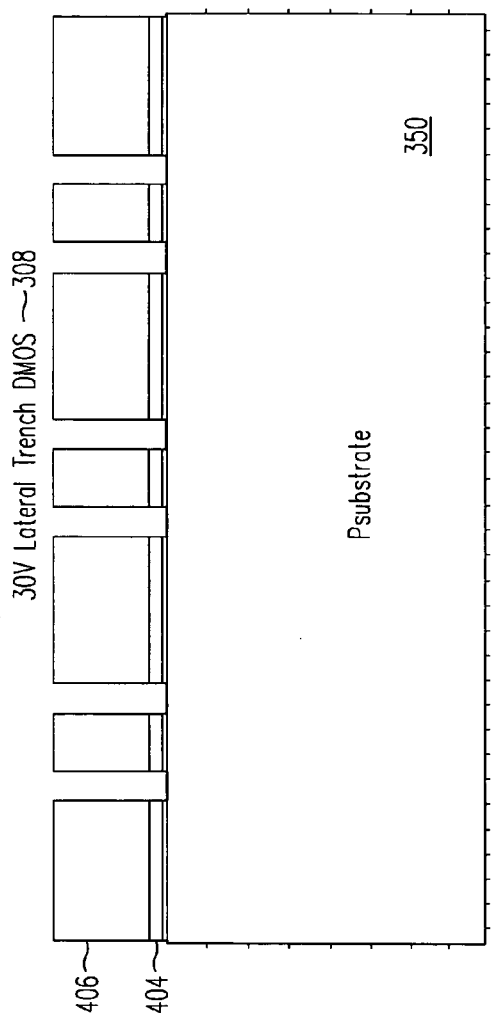
Figure 22E:
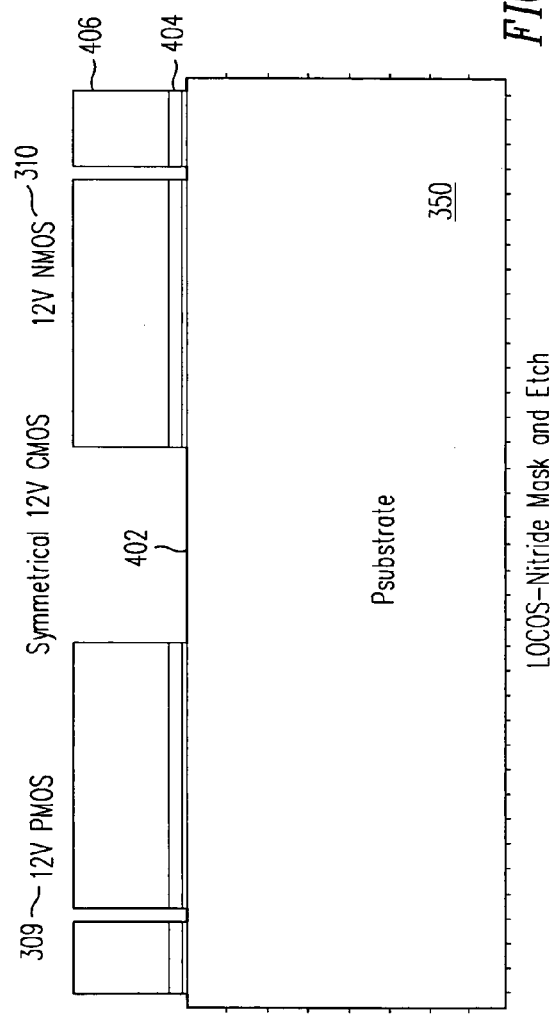
Figure 23A:
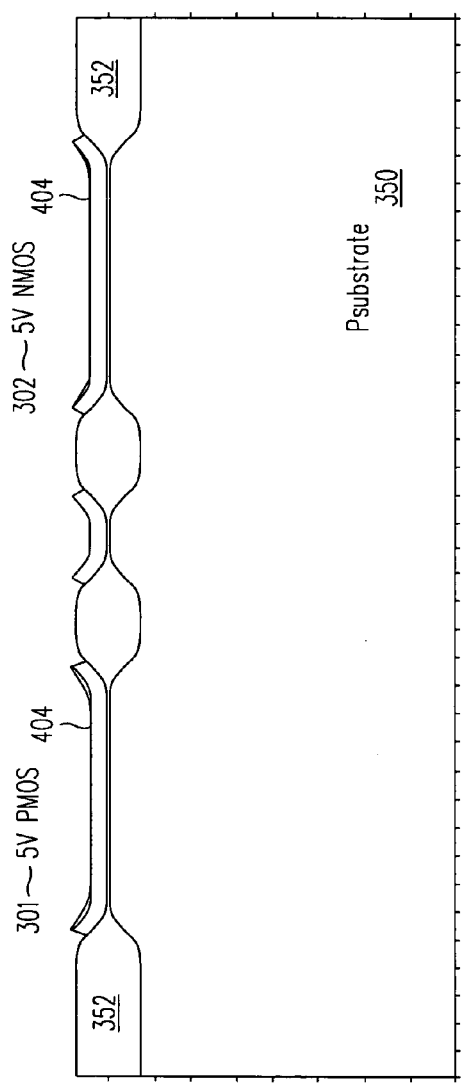
Figure 23B:
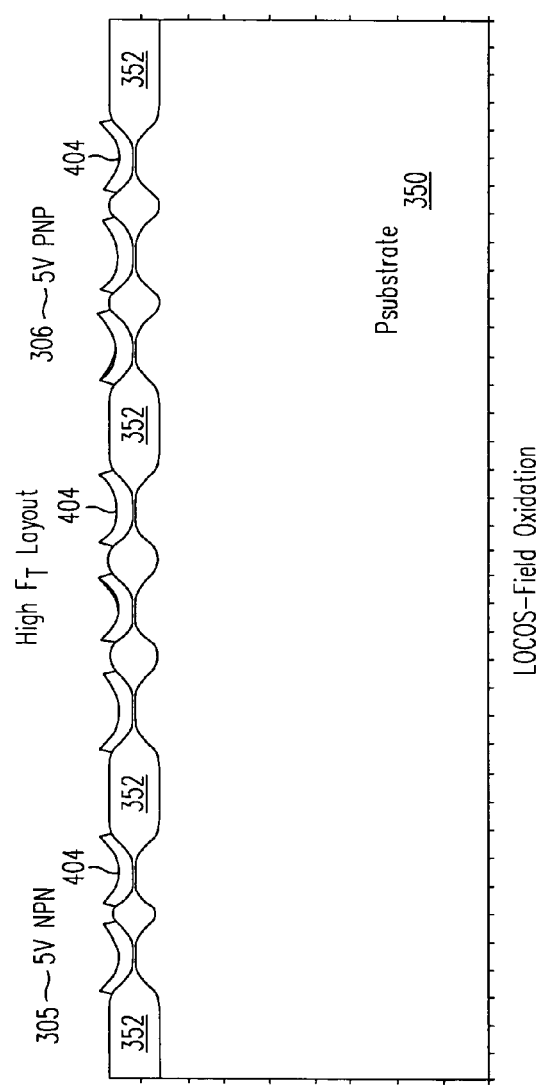
Figure 23C:
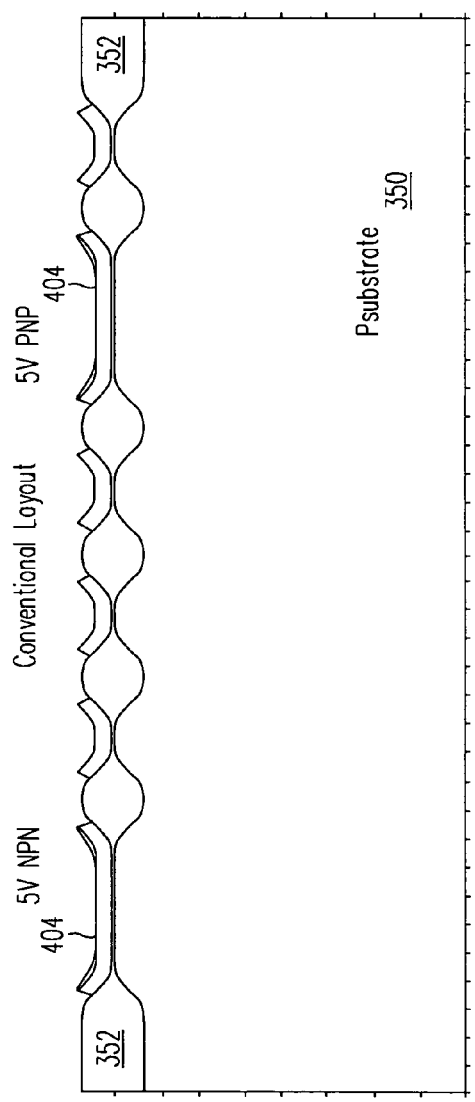
Figure 23D:
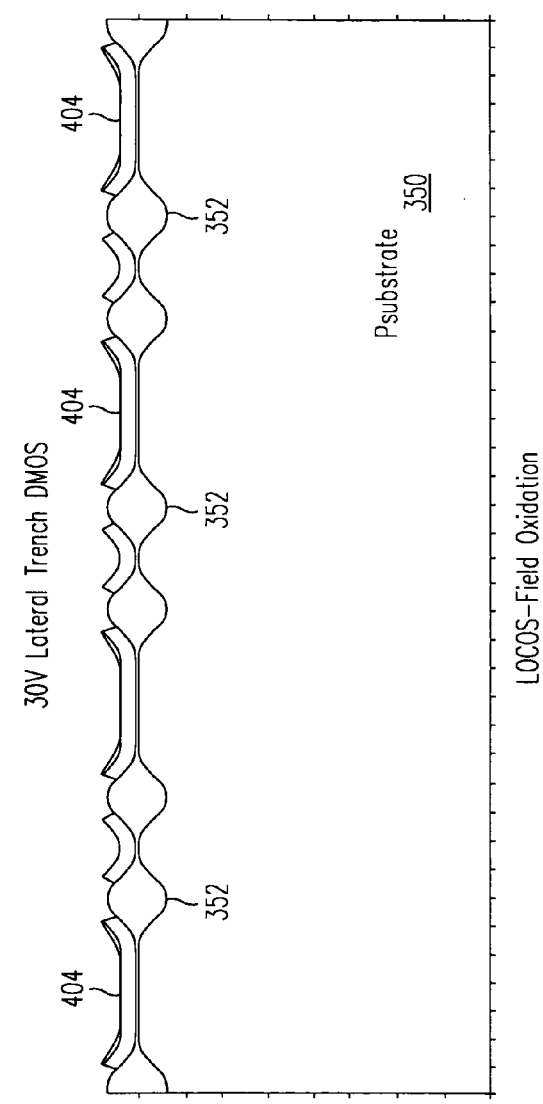
Figure 24B:
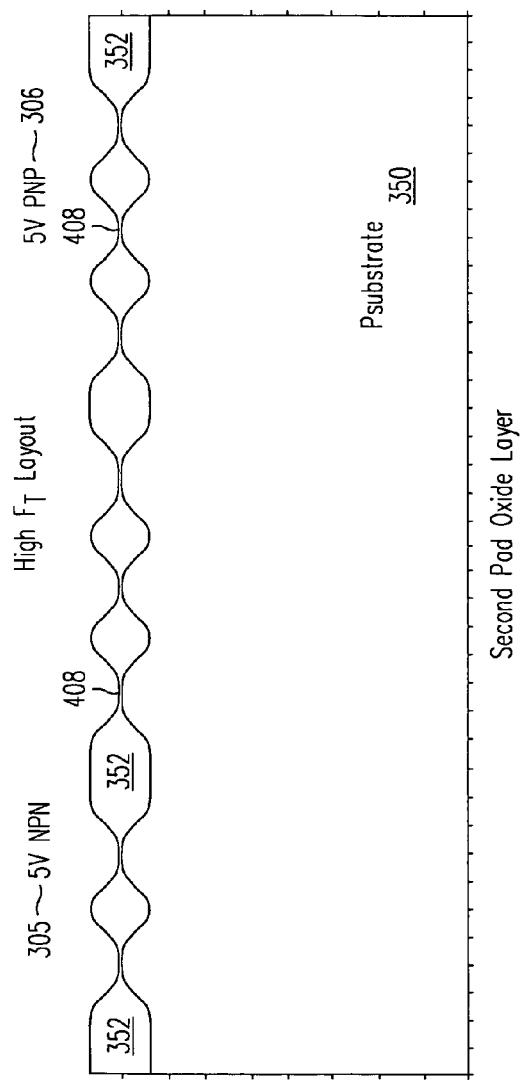
Figure 24C:
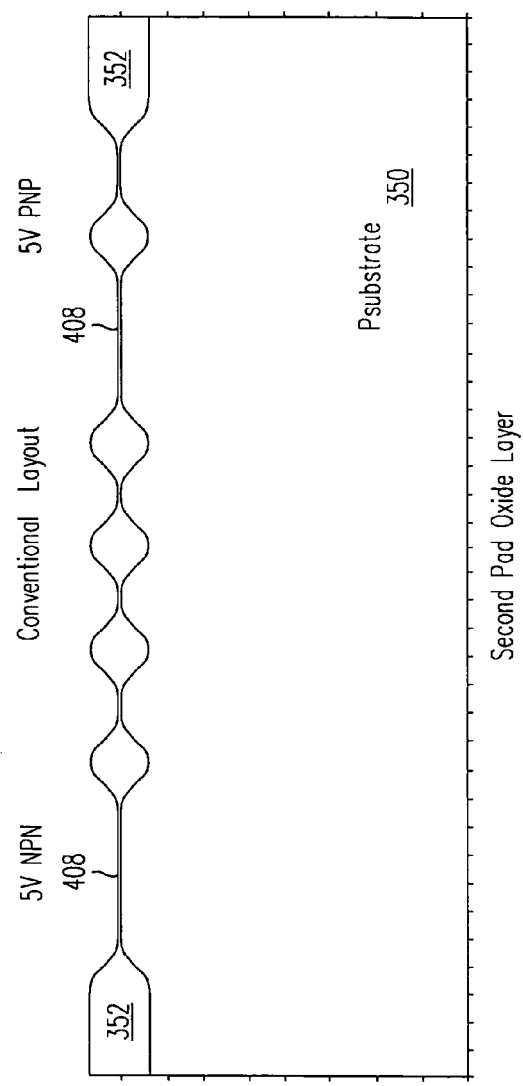
Figure 24D:
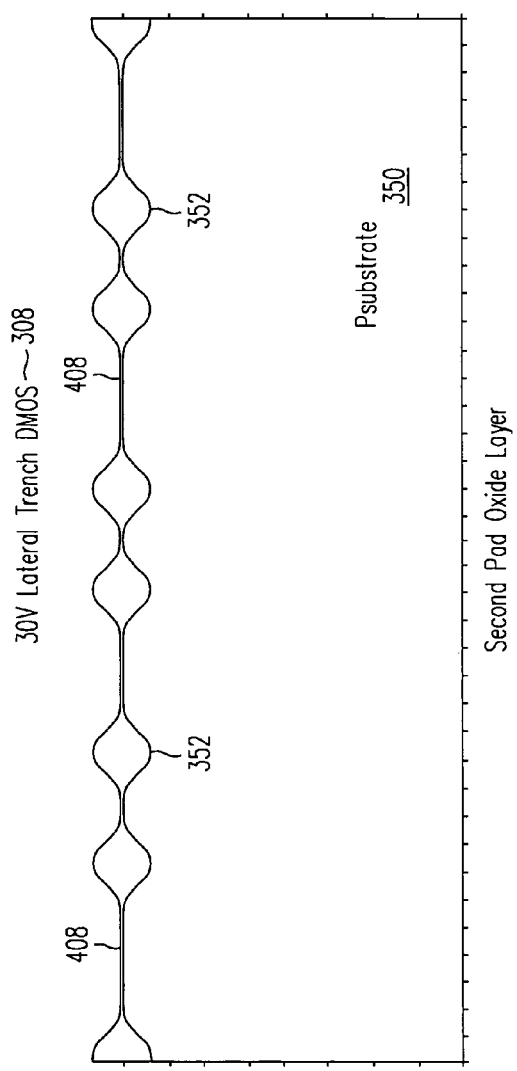
Figure 24E:
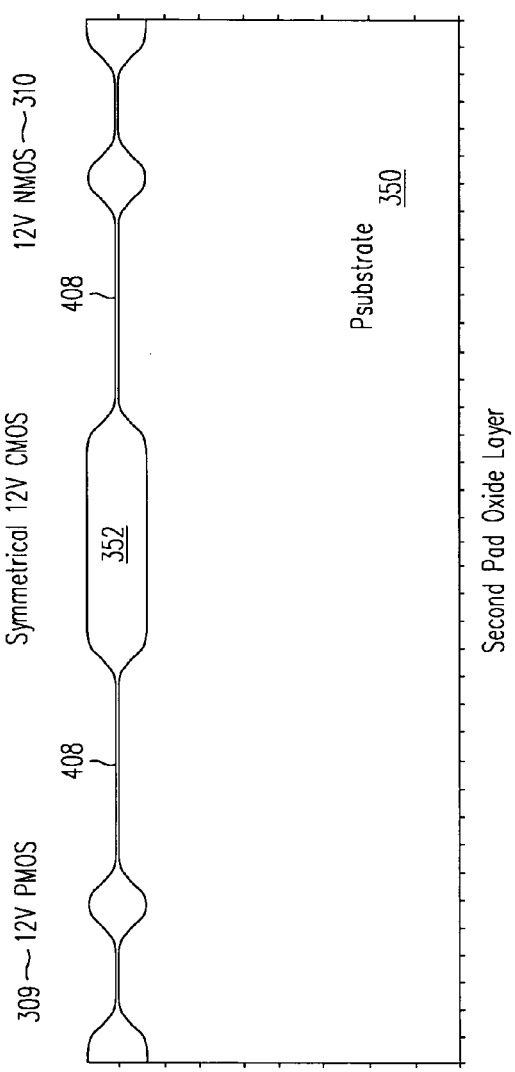

FIG. 21 shows the growth of a first pad oxide layer on the substrate.

FIGS. 22A–22E shows the deposition and patterning of a nitride mask.

FIGS. 23A–23E shows the growth of a field oxide layer.

FIGS. 24A–24E show the growth of a second pad oxide layer on the substrate.

Figure 25D:
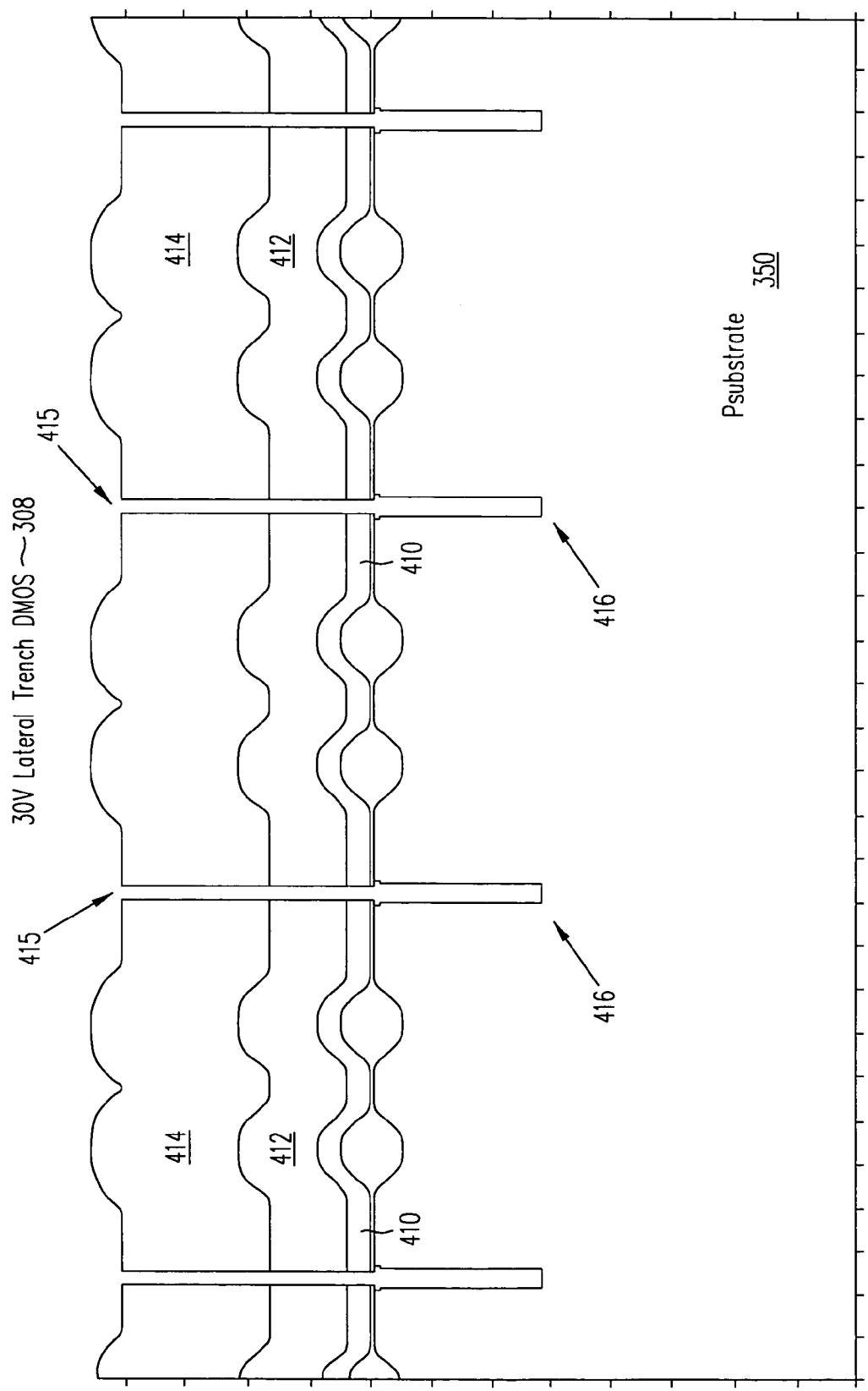

FIG. 25D shows the formation and patterning of a trench hard mask.

Figure 26D:
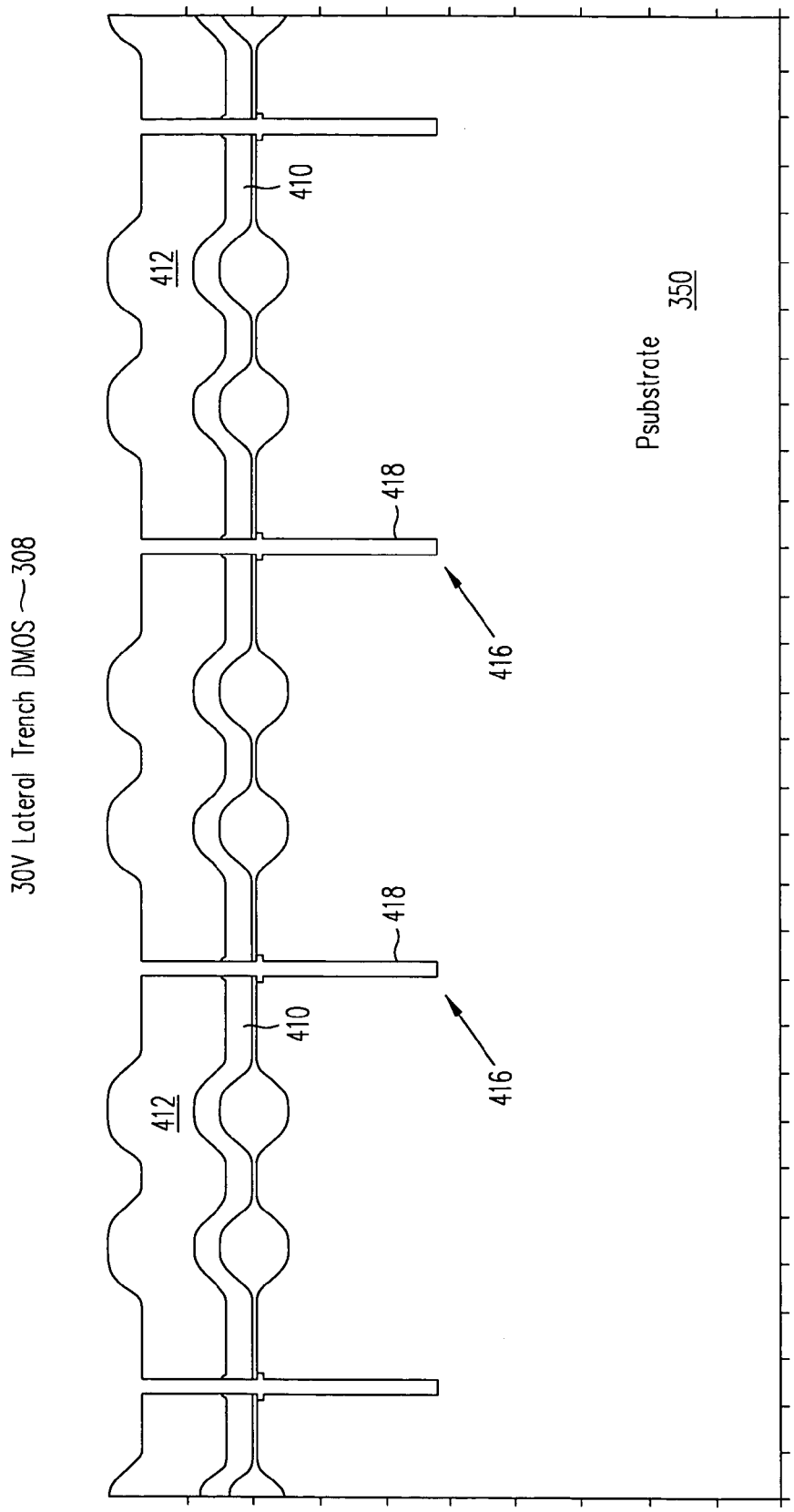

FIG. 26D shows the growth of a sacrificial oxide layer.

Figure 27D:
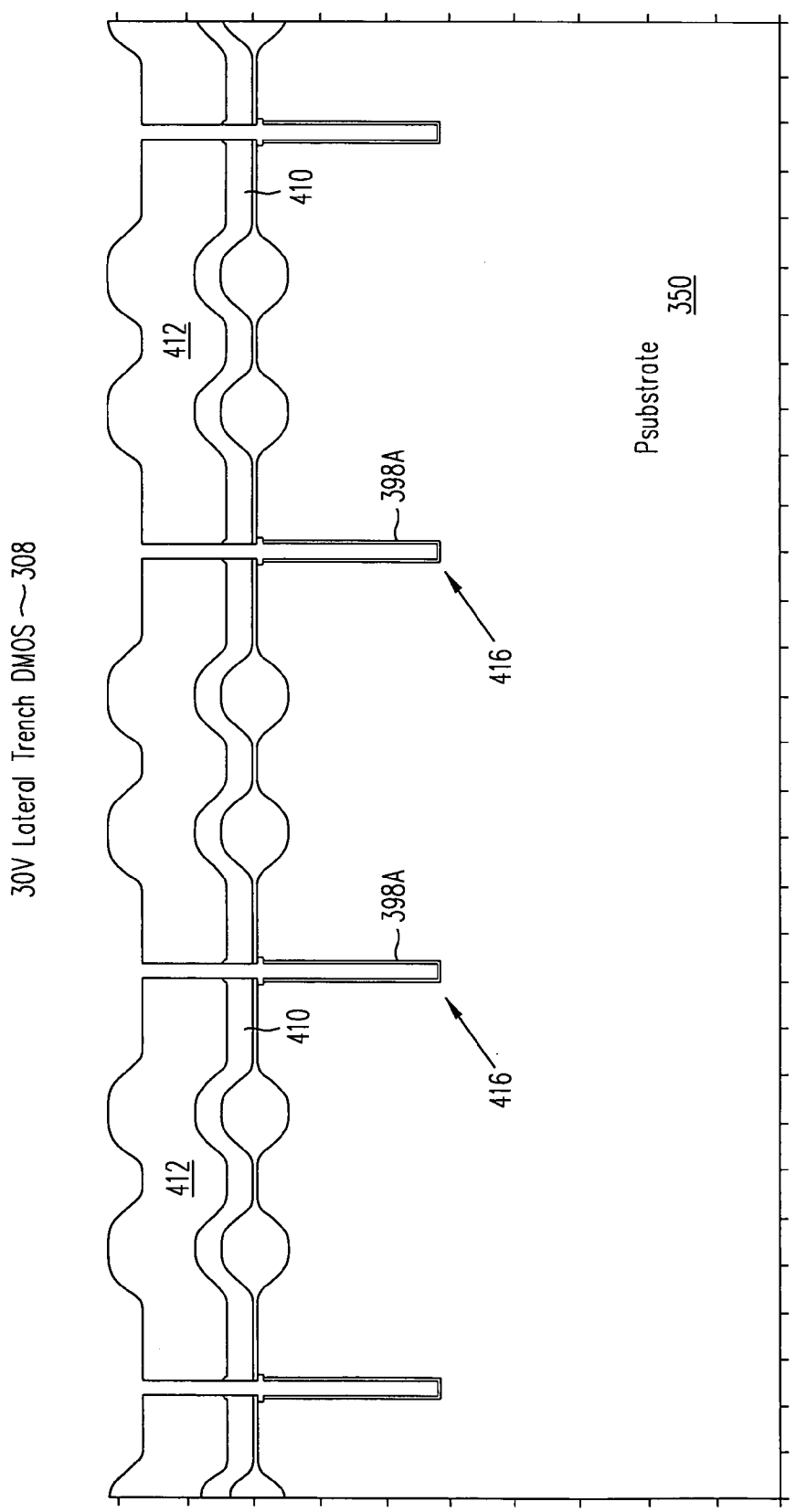

FIG. 27D shows the growth of a trench gate oxide.

Figure 28D:
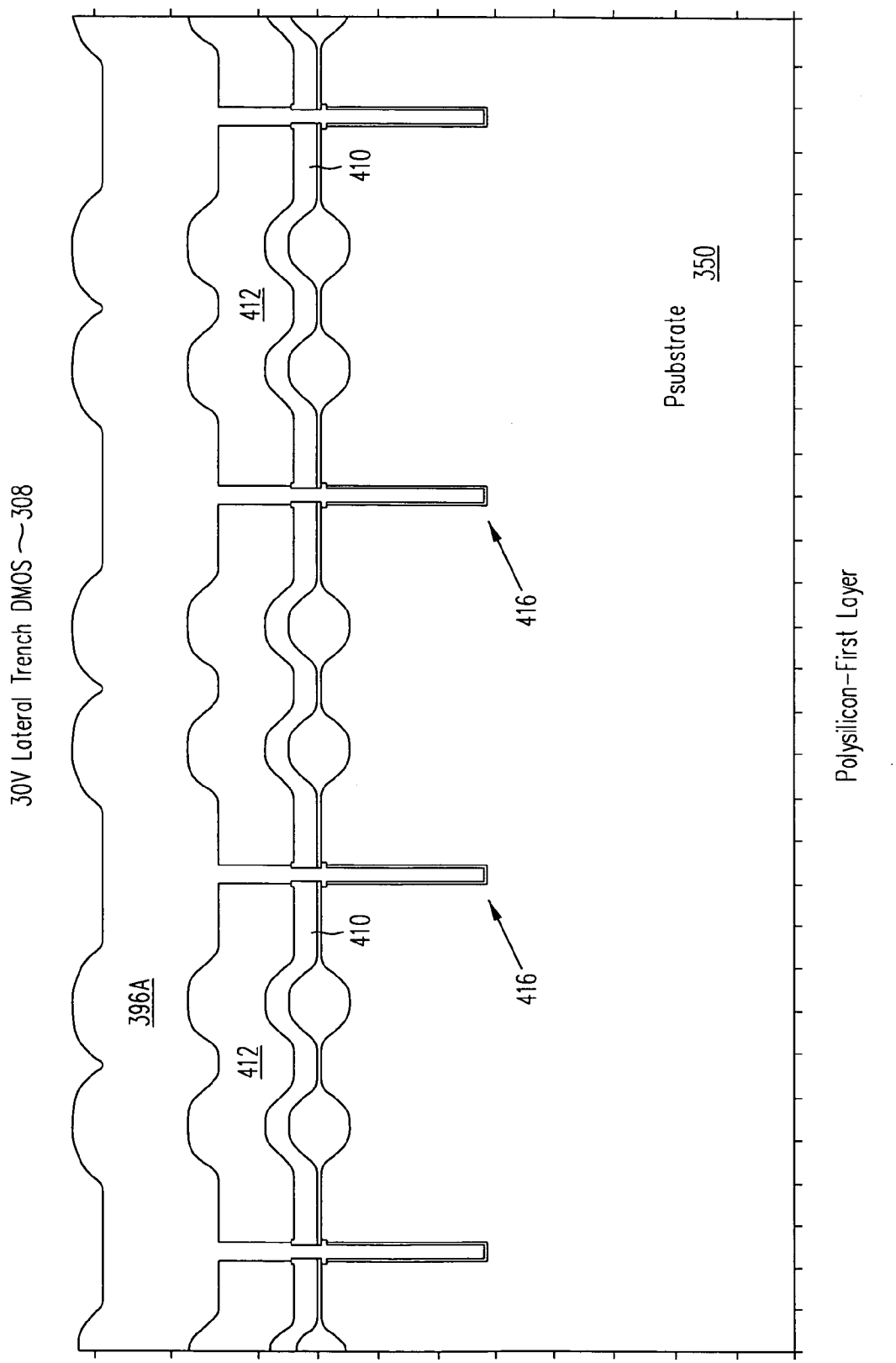

FIG. 28D shows the deposition of a first polysilicon layer.

Figure 29D:
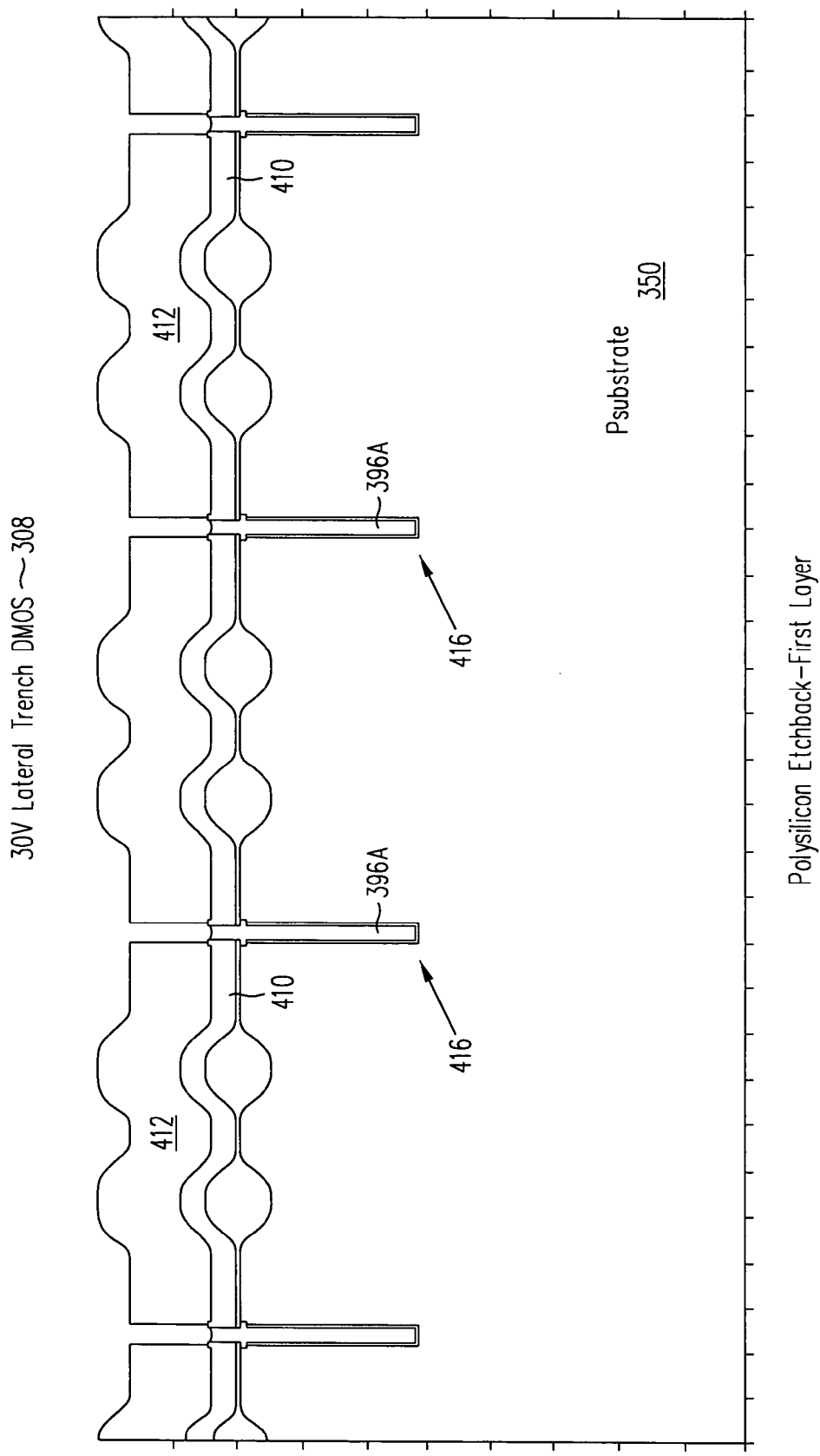

FIG. 29D shows the first etchback of the first polysilicon layer.

Figure 30D:
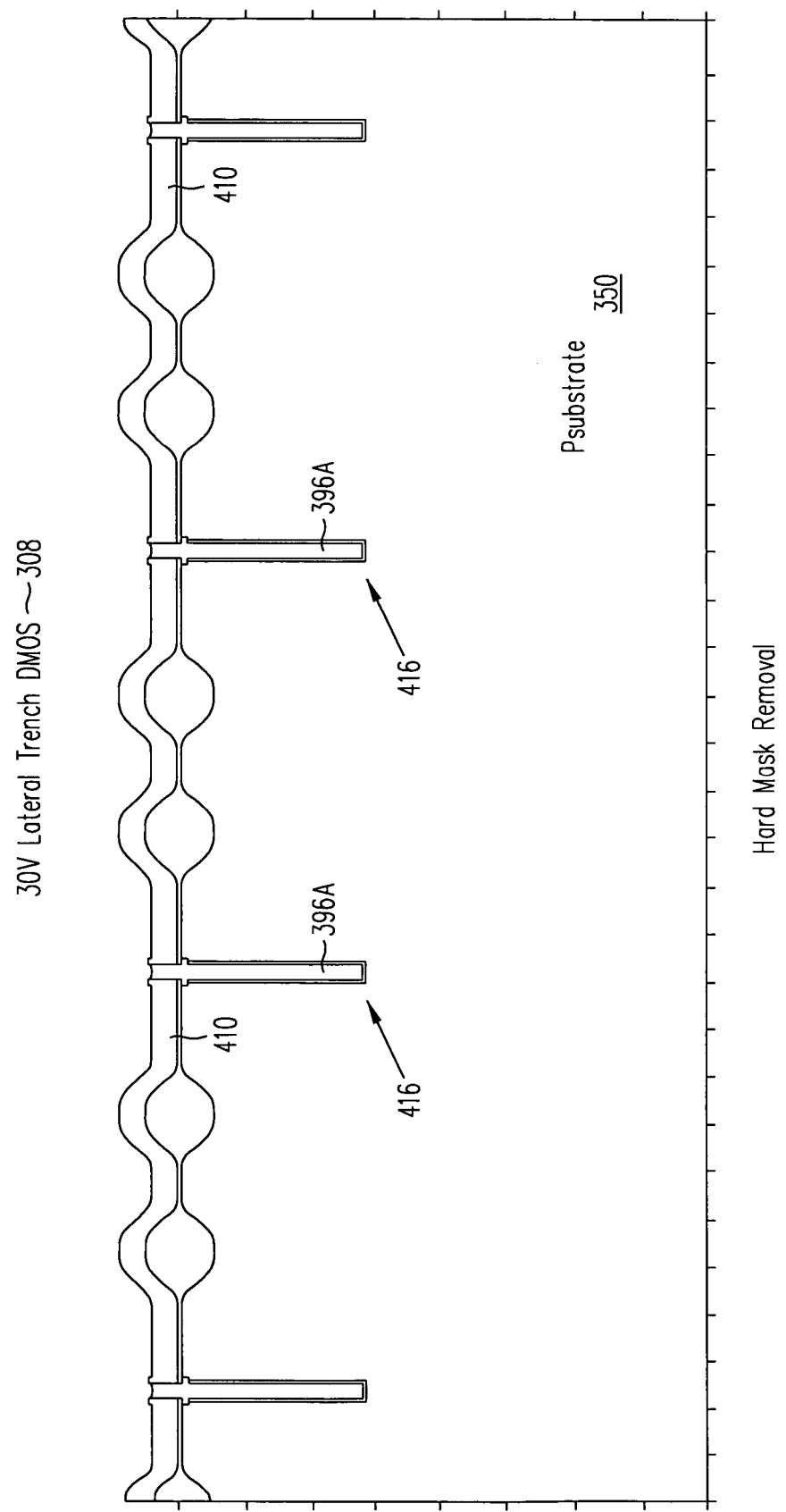

FIG. 30D shows the removal of the trench hard mask and the deposition of a second polysilicon layer.

Figure 31D:
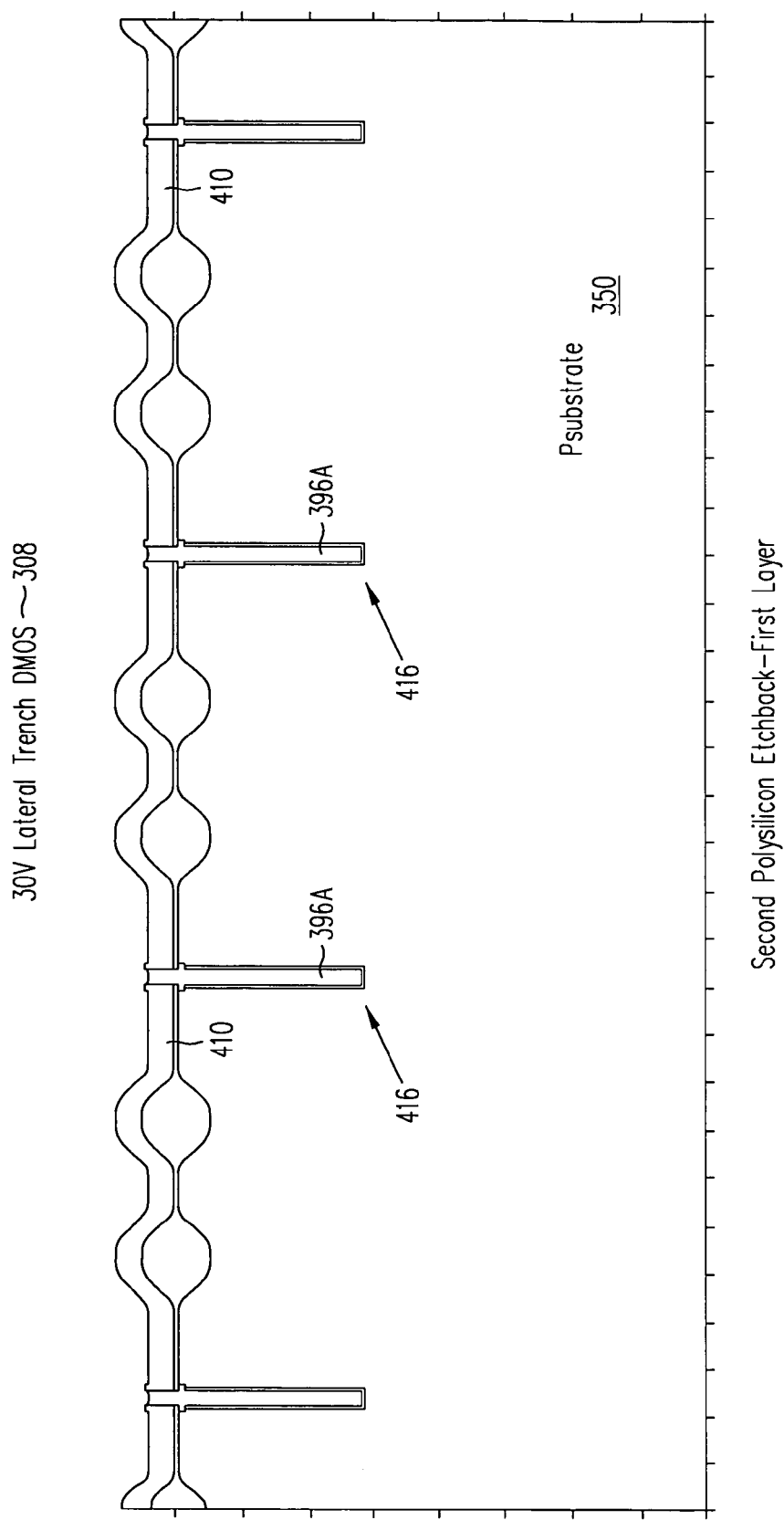

FIG. 31D shows the second etchback of the first polysilicon layer.

Figure 32D:
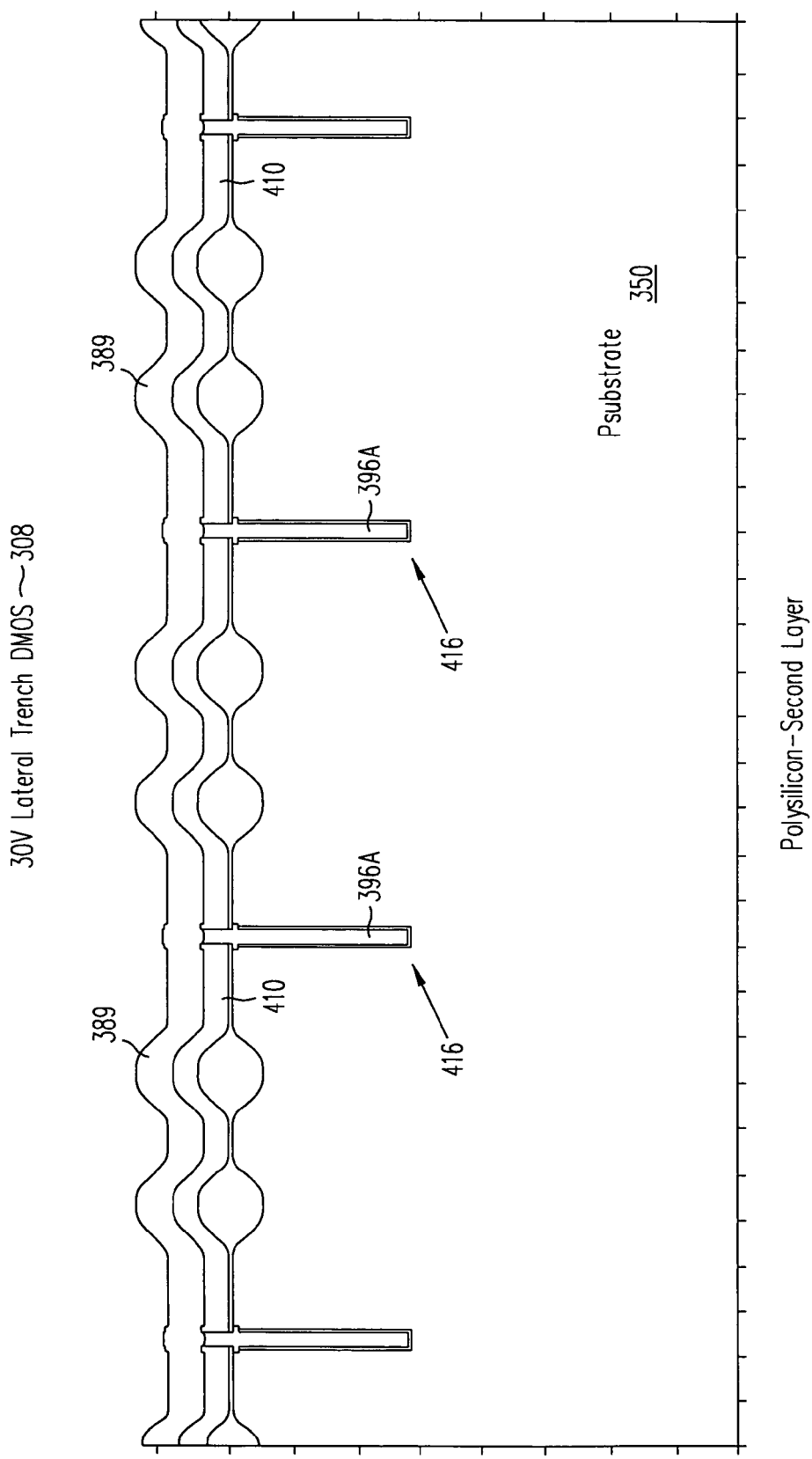

FIG. 32D shows the deposition of the second polysilicon layer.

Figure 33D:
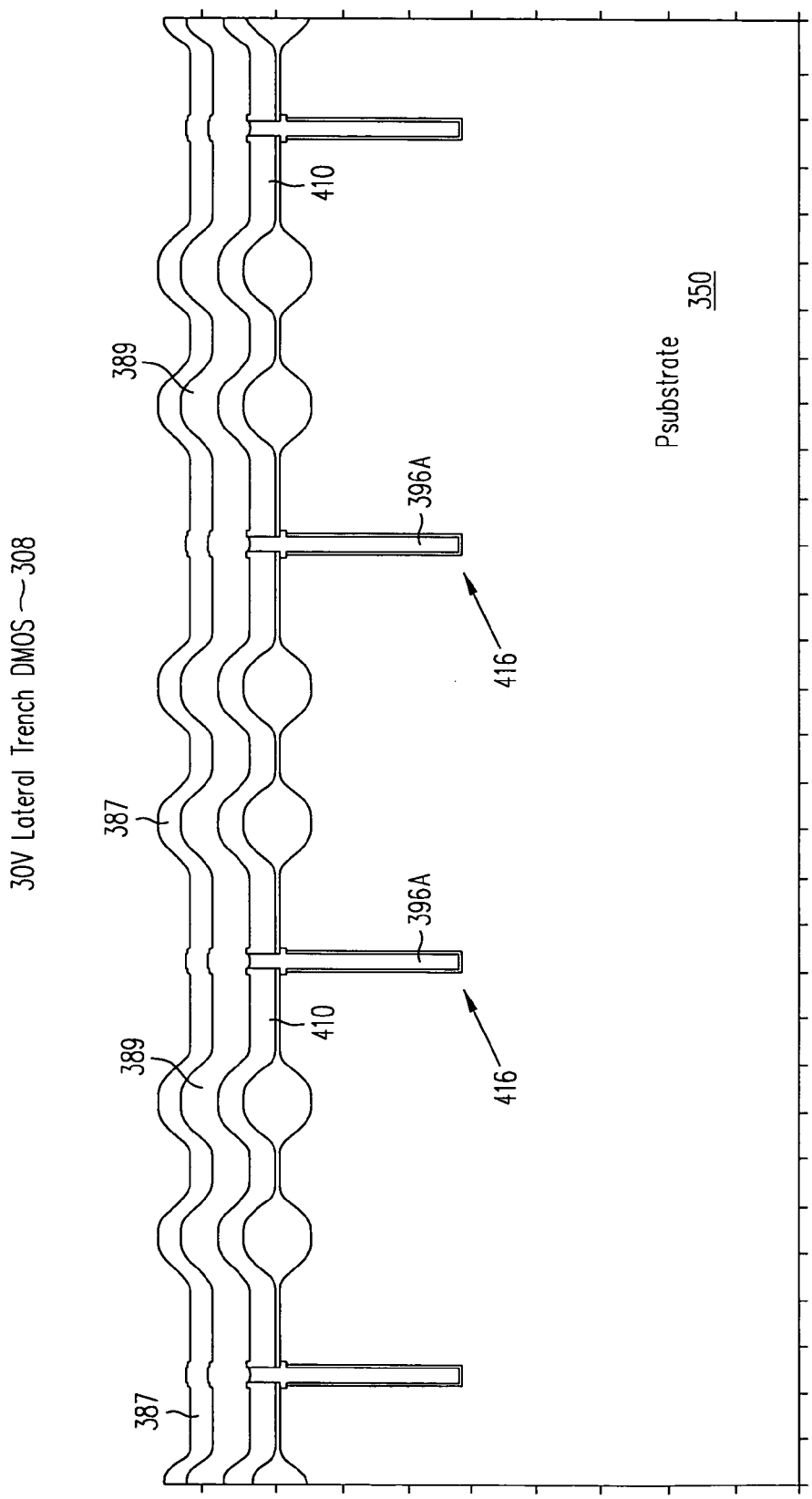

FIG. 33D shows the formation of a first interlayer dielectric.

Figure 34D:
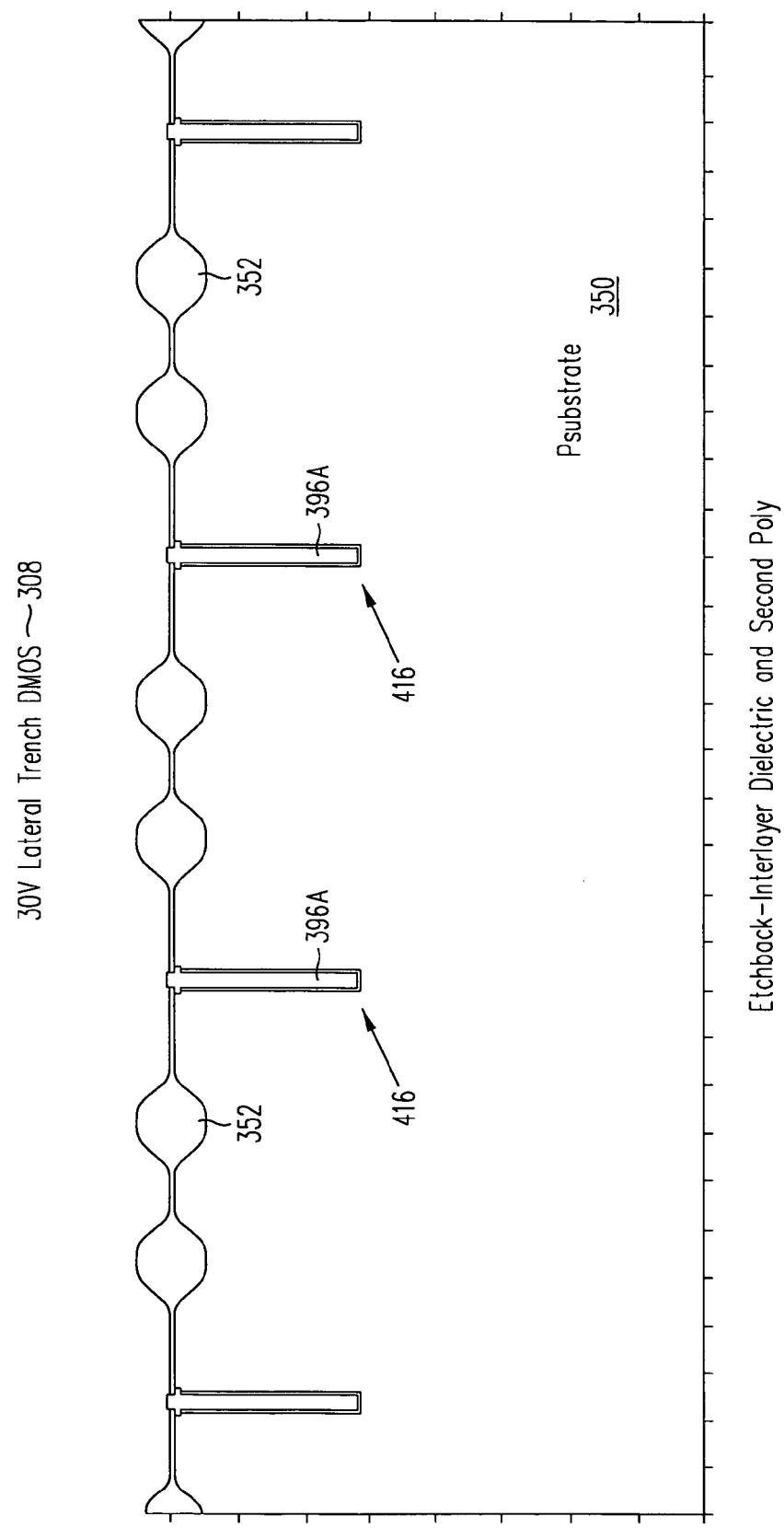

FIG. 34D shows the etchback of the first interlayer dielectric and the second polysilicon layer.

FIGS. 35A–35E show the formation of the deep N mask and the implanting of the deep N layer.

Figure 36D:
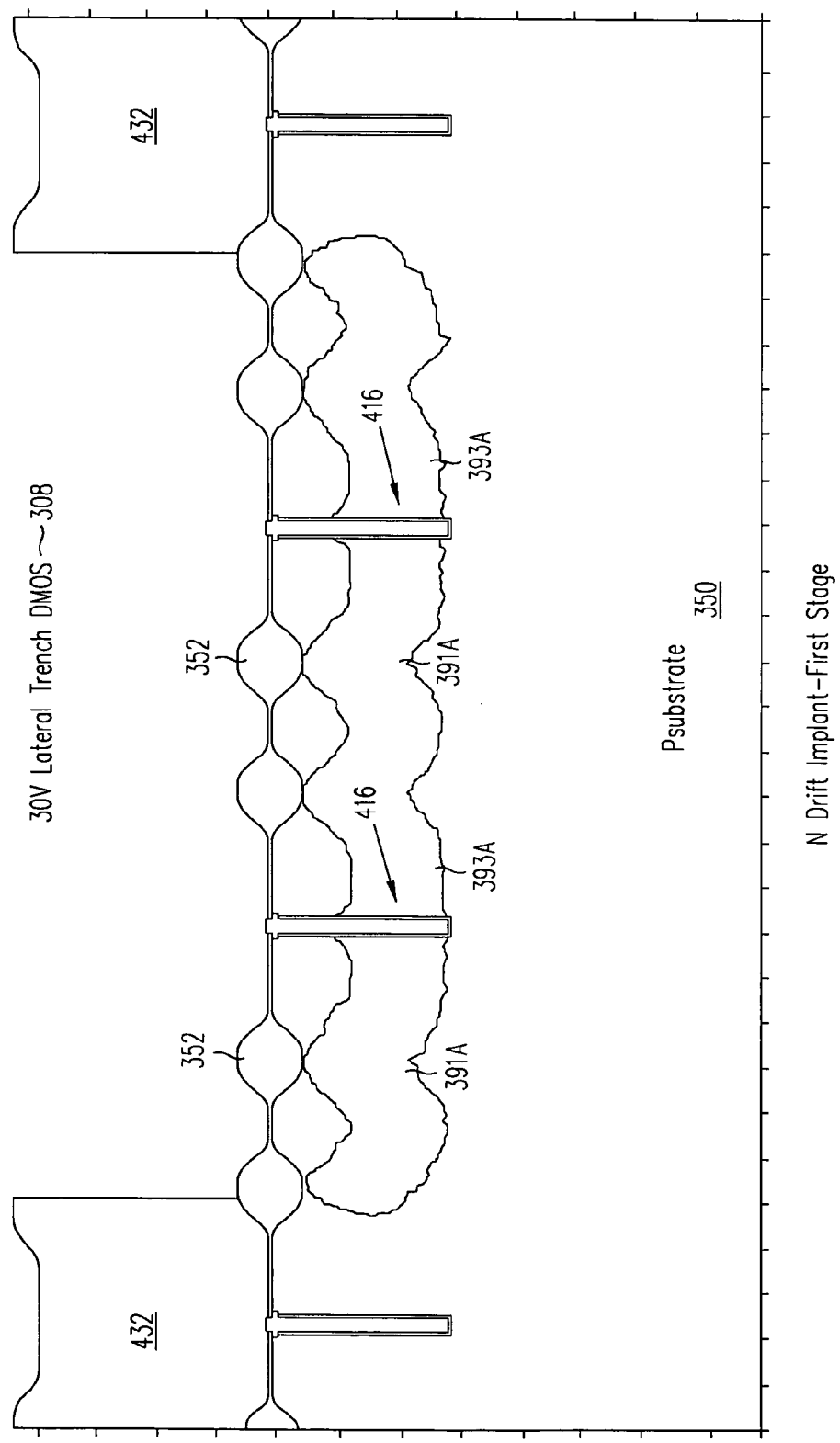

FIG. 36D shows the first stage of the implanting of the N drift region.

Figure 37D:
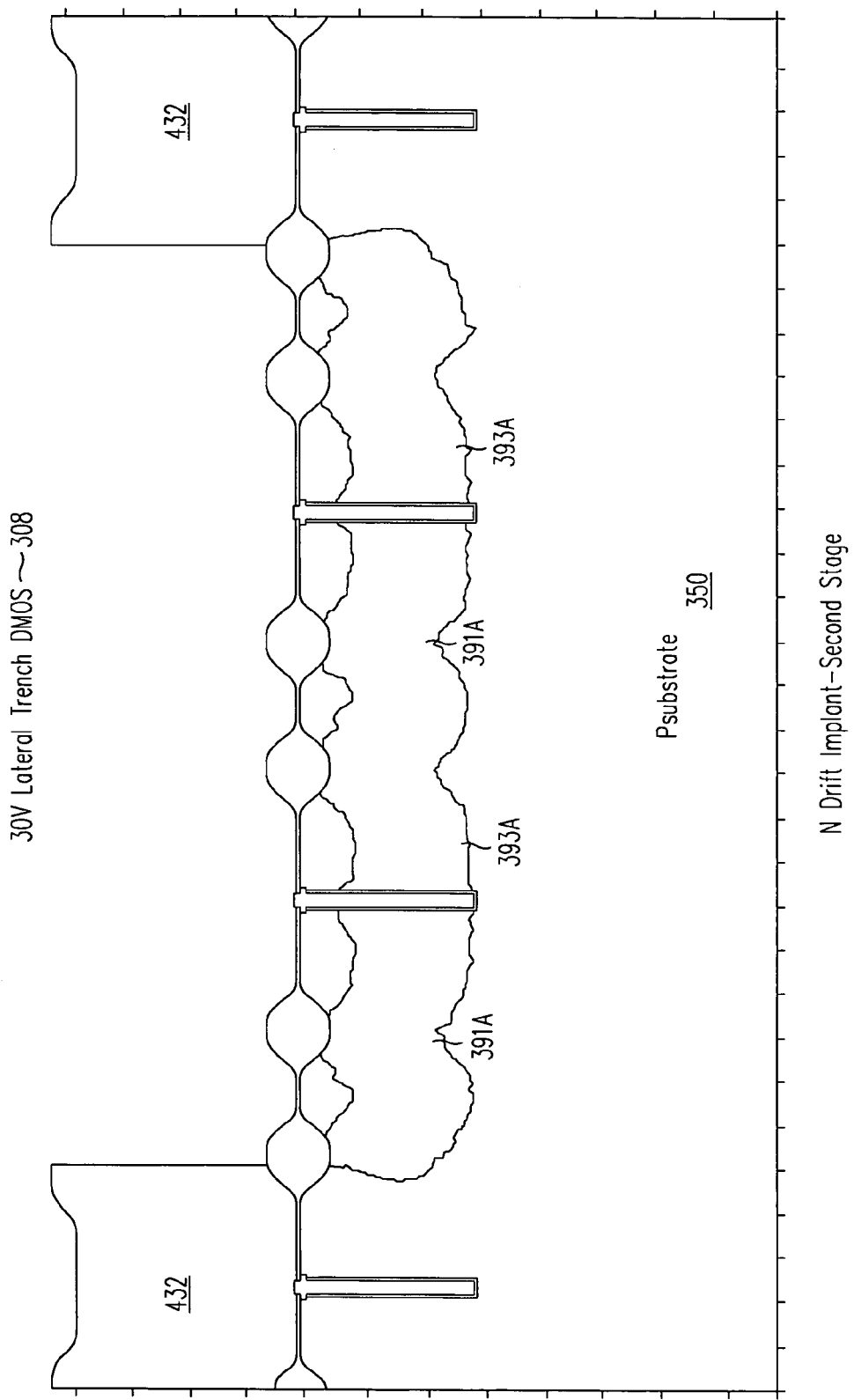

FIG. 37D shows the second stage of the implanting of the N drift region.

Figure 38E:
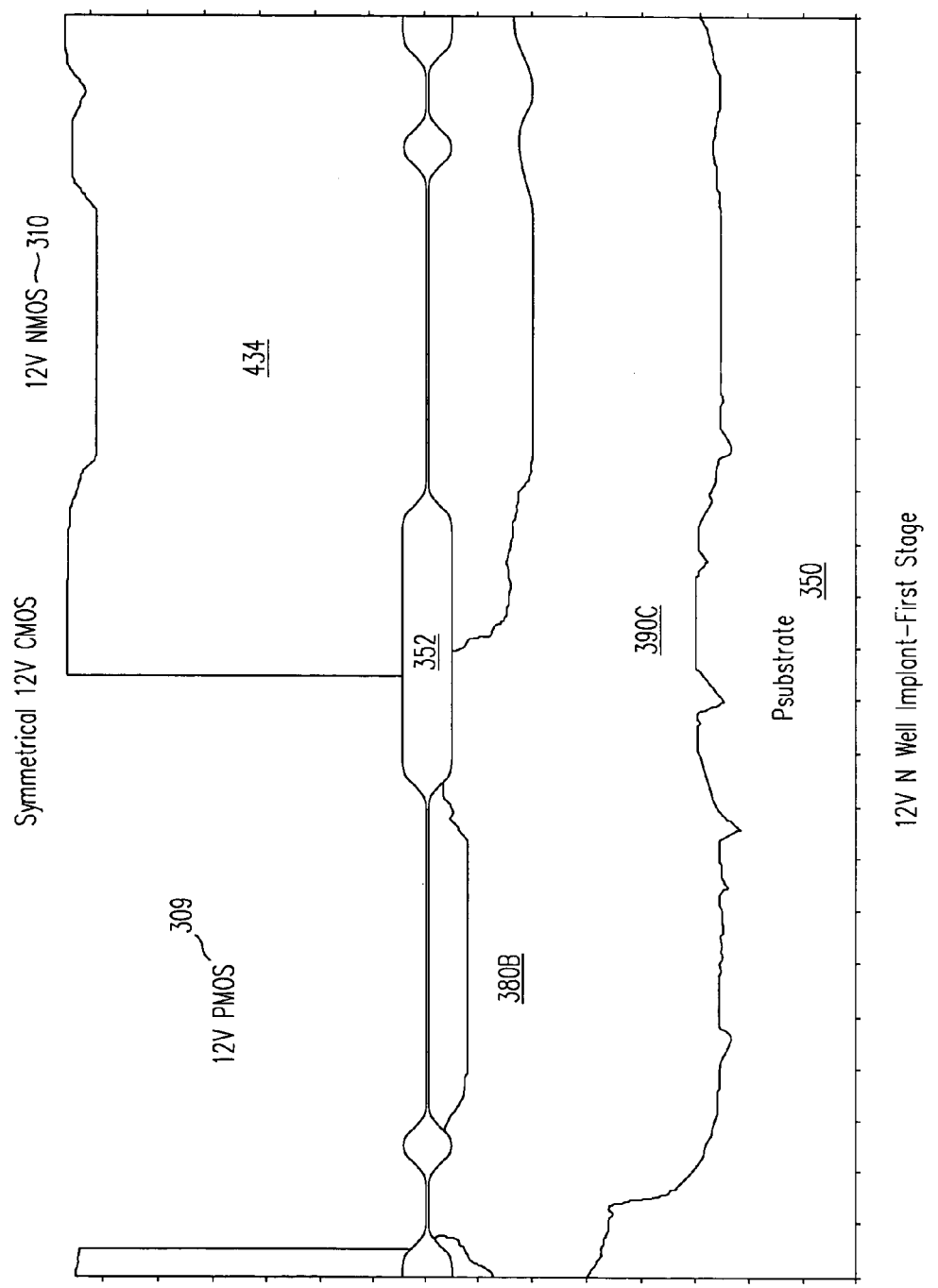

FIG. 38E shows the first stage of the implanting of the 12V N well.

Figure 39E:
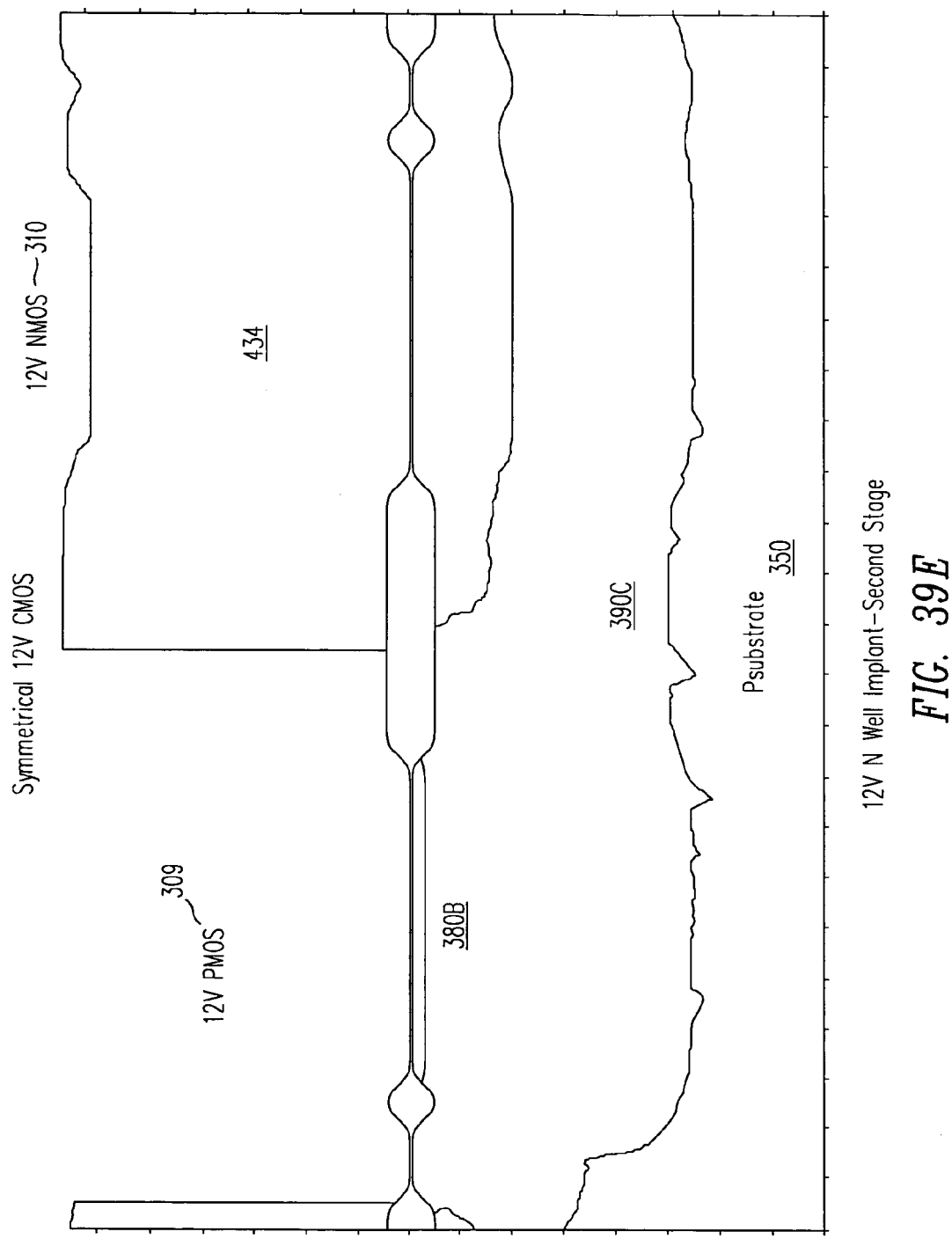
Figure 40A:
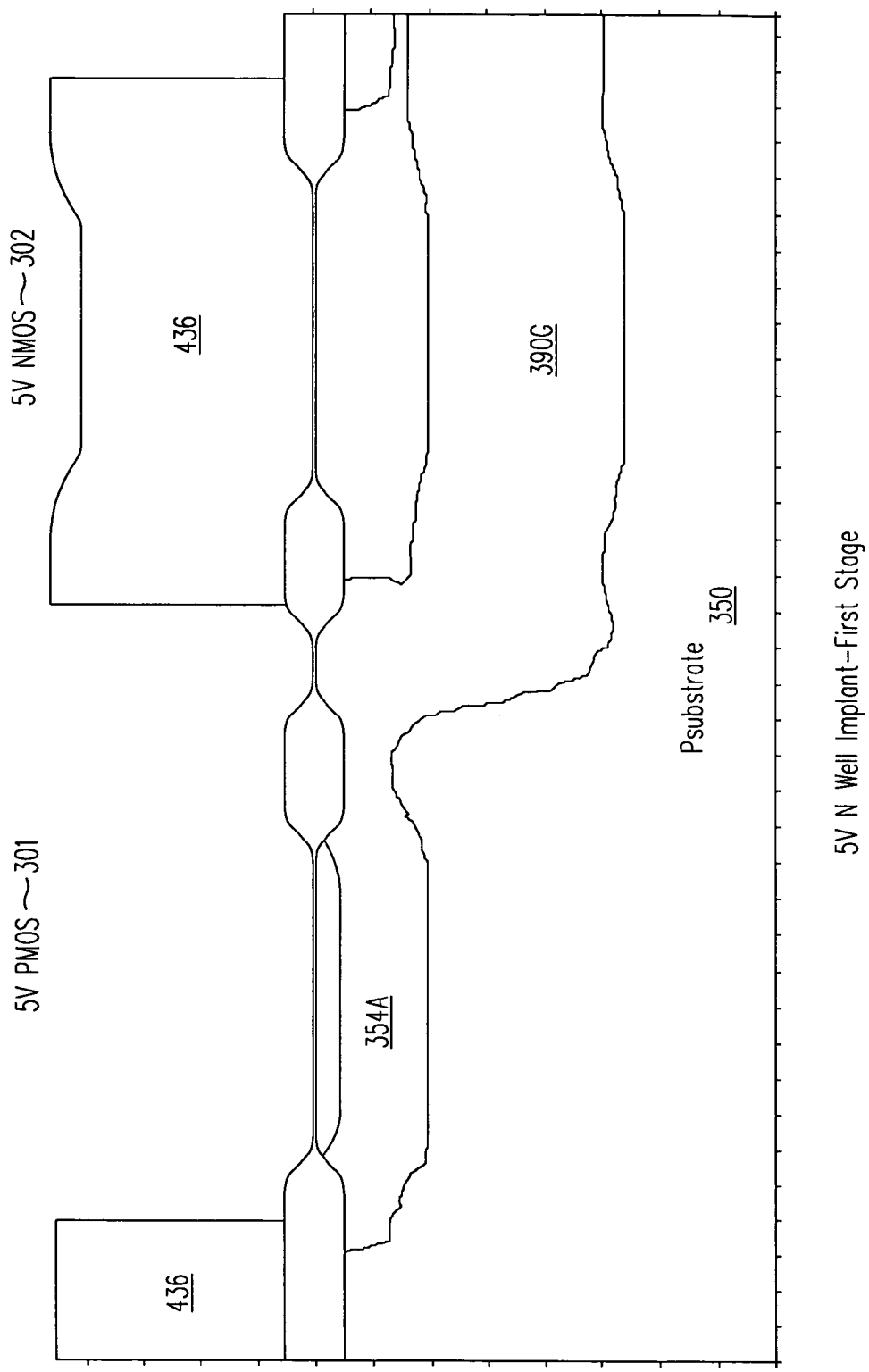
Figure 40B:
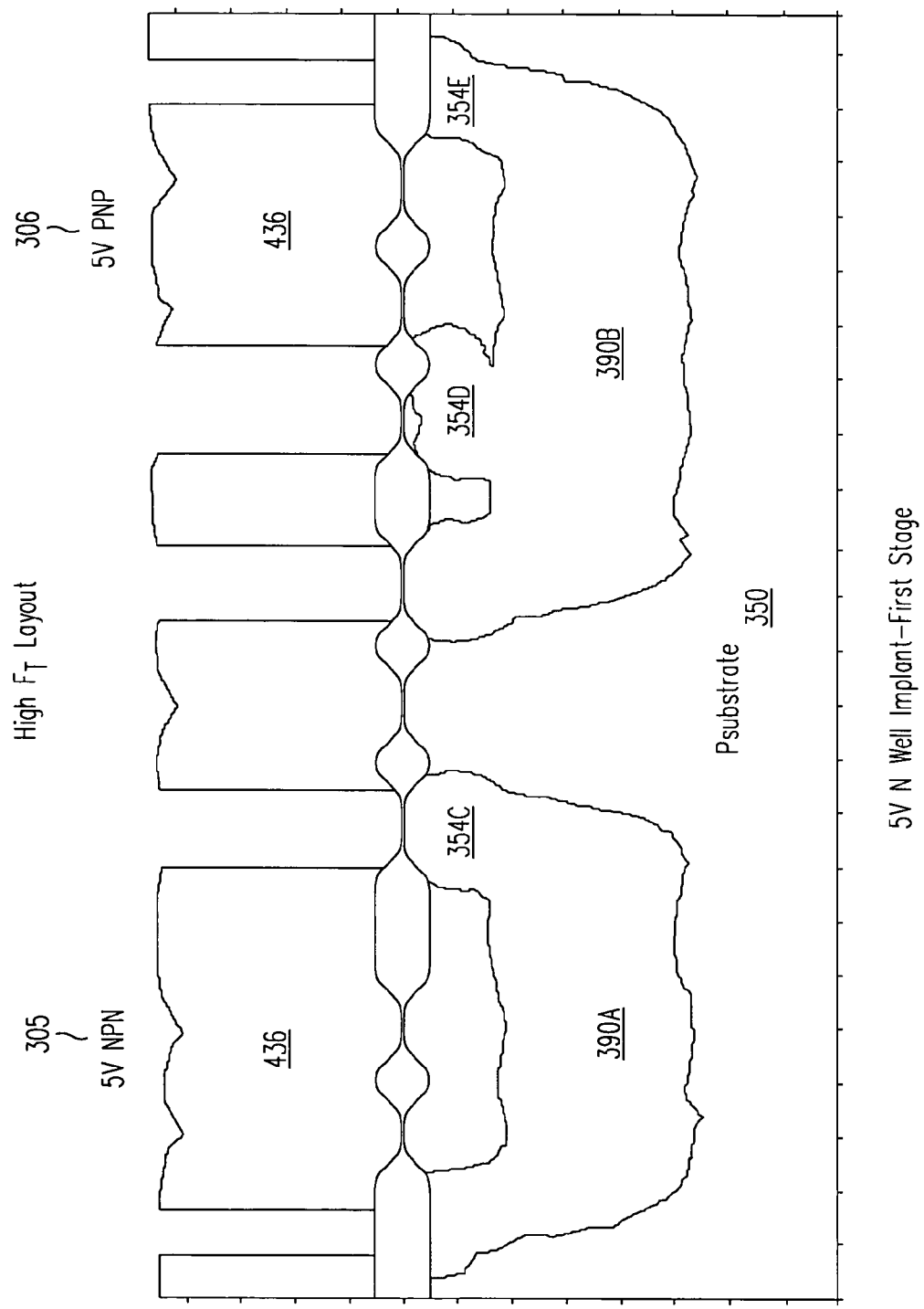
Figure 40C:
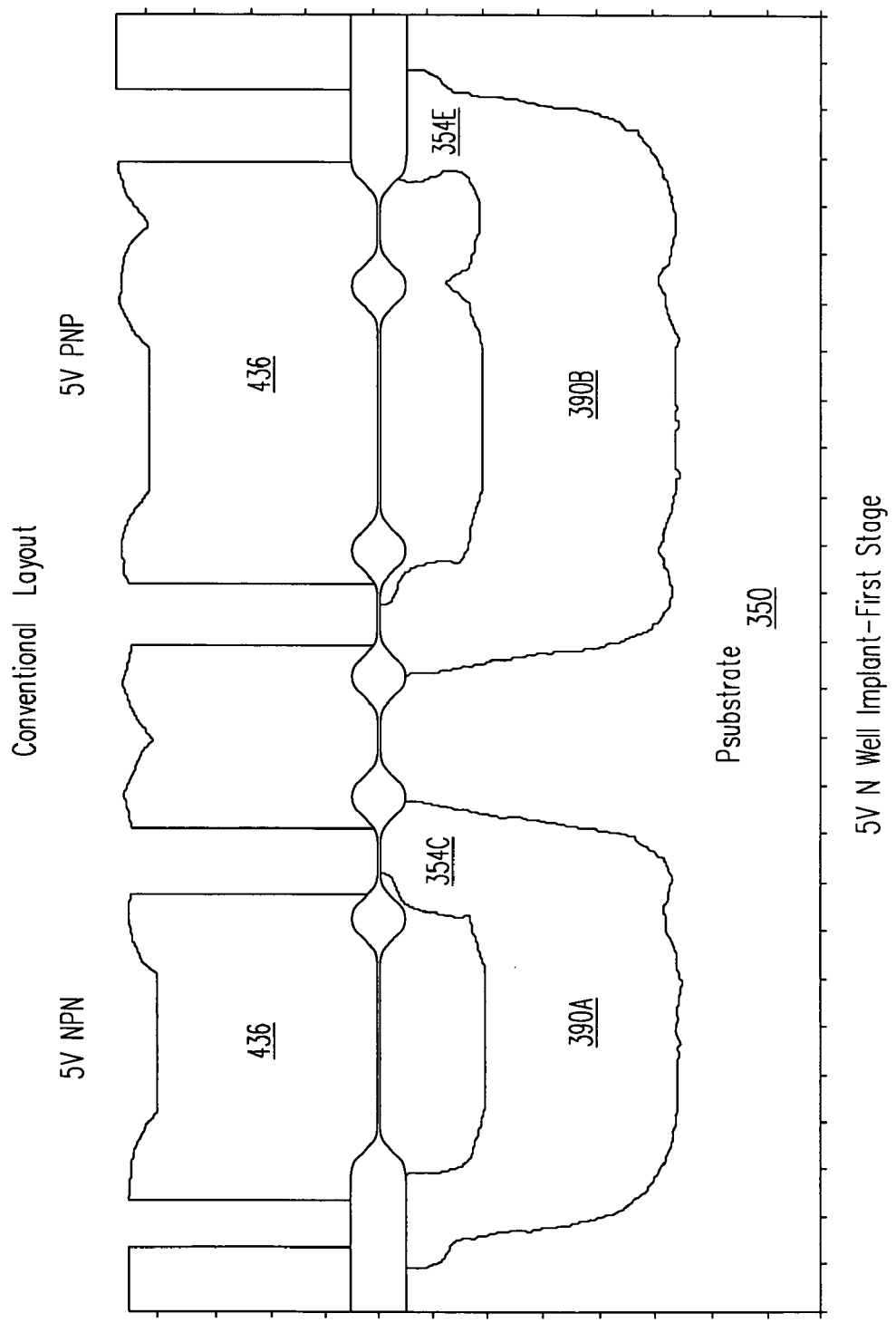
Figure 40D:
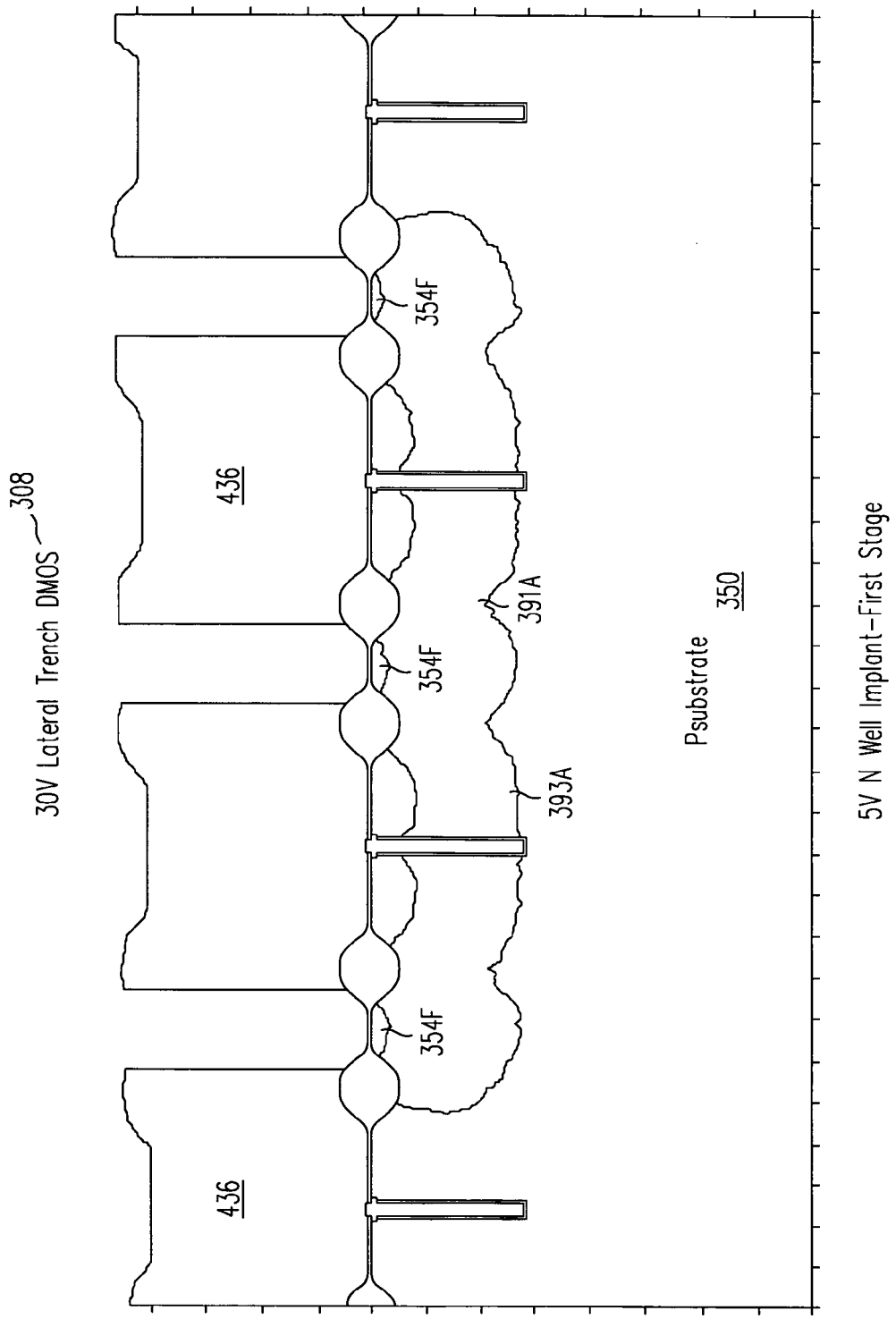
Figure 40E:
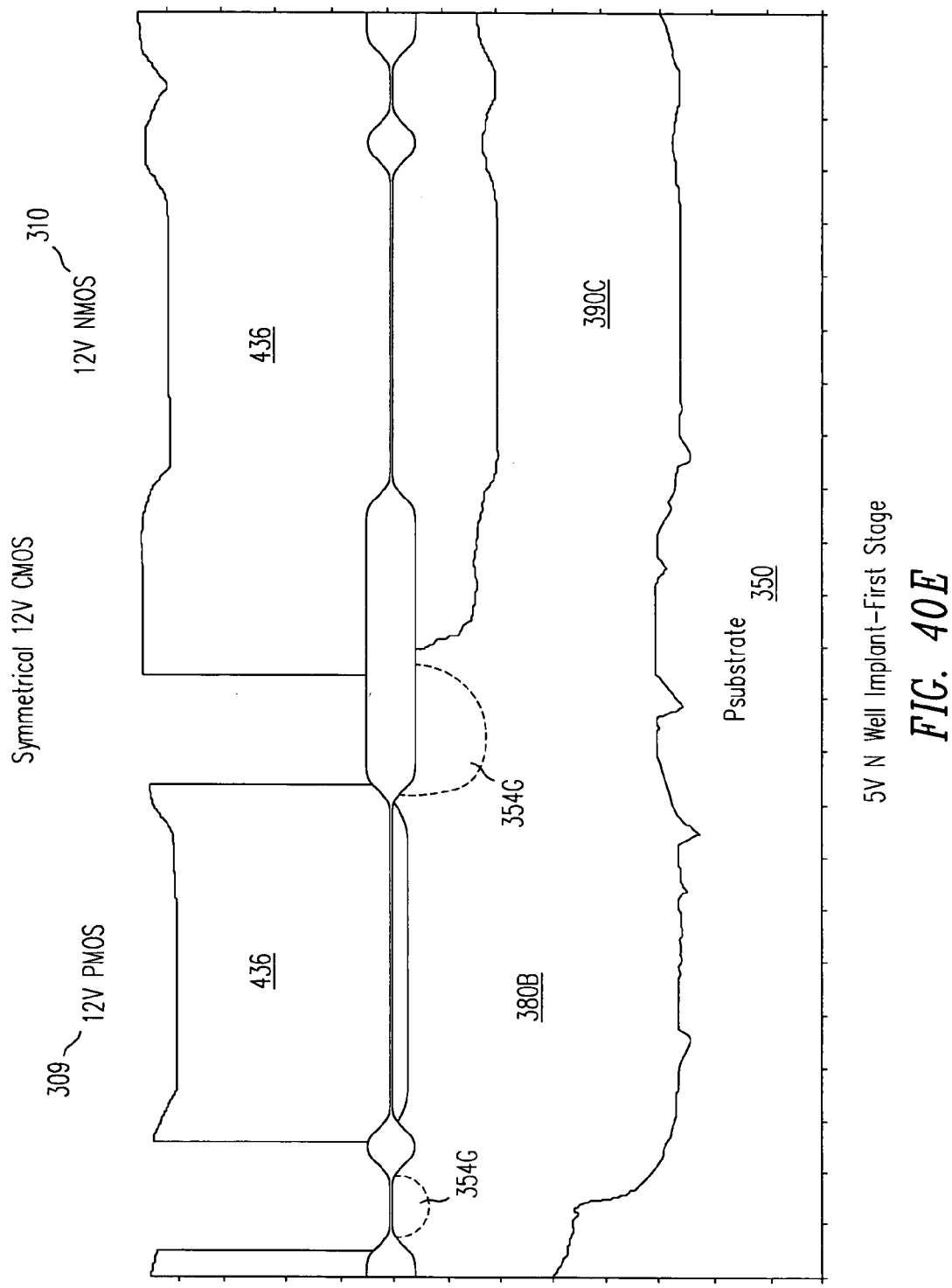
Figure 41A:
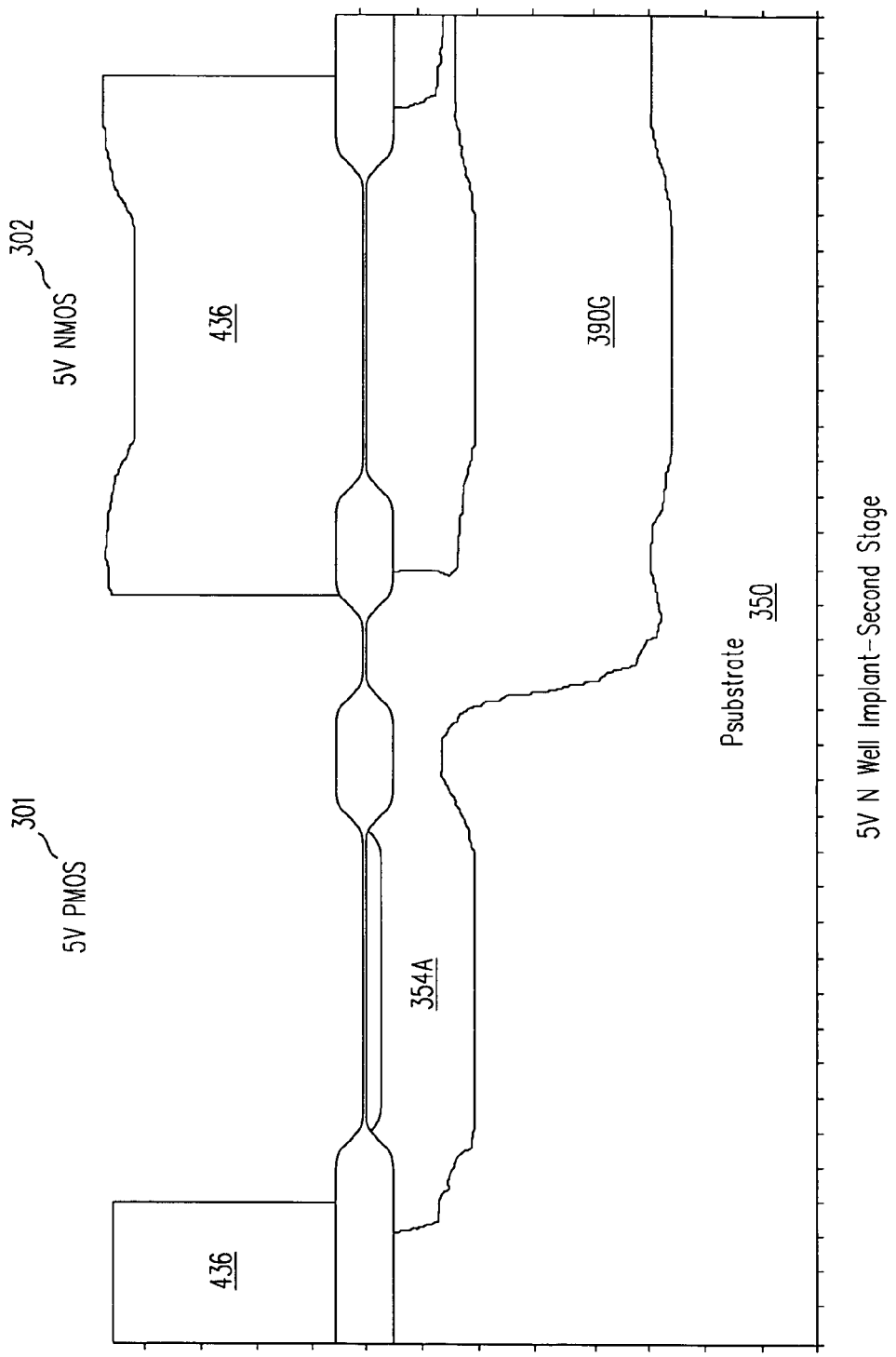
Figure 41B:
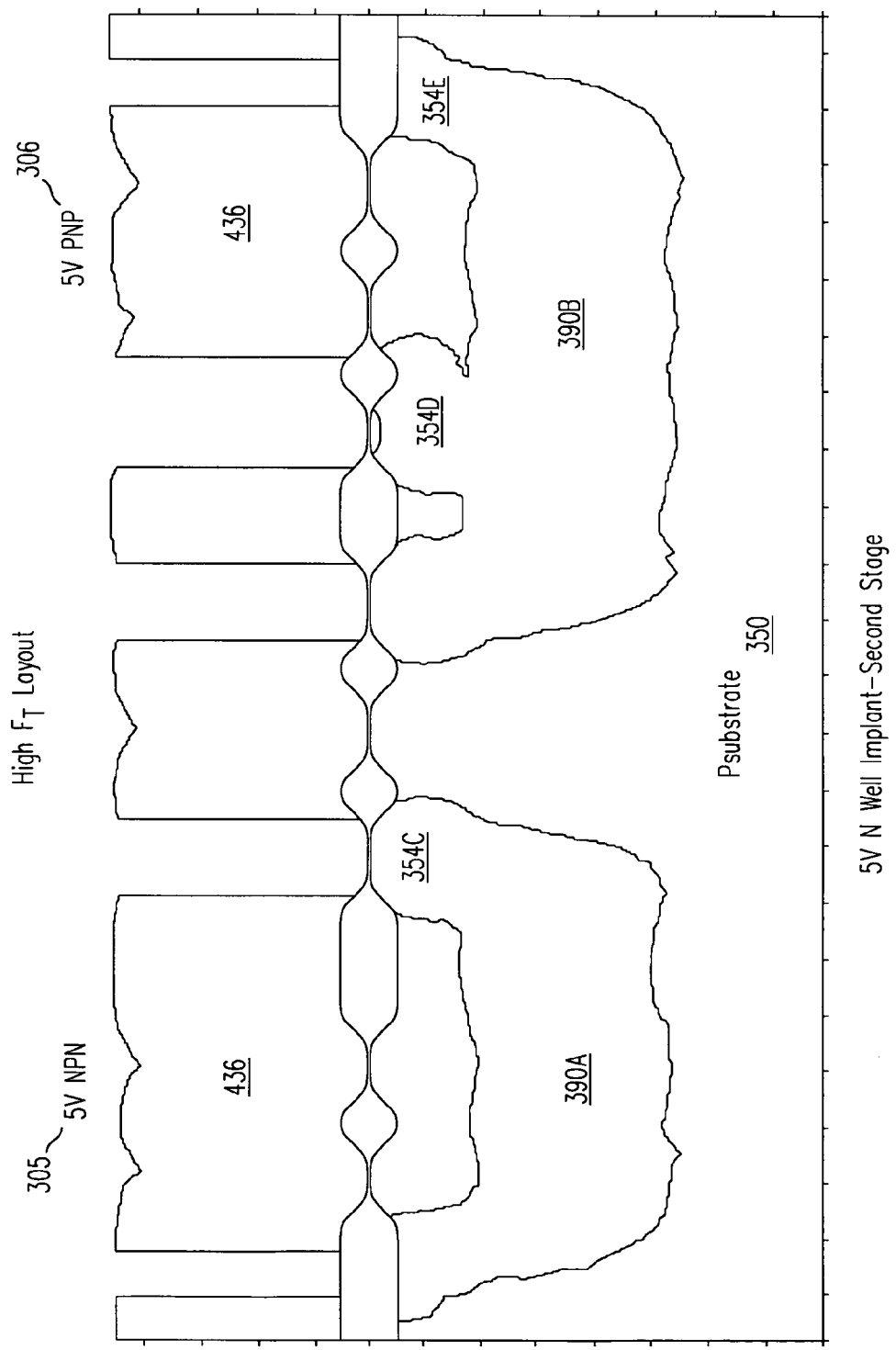
Figure 41C:
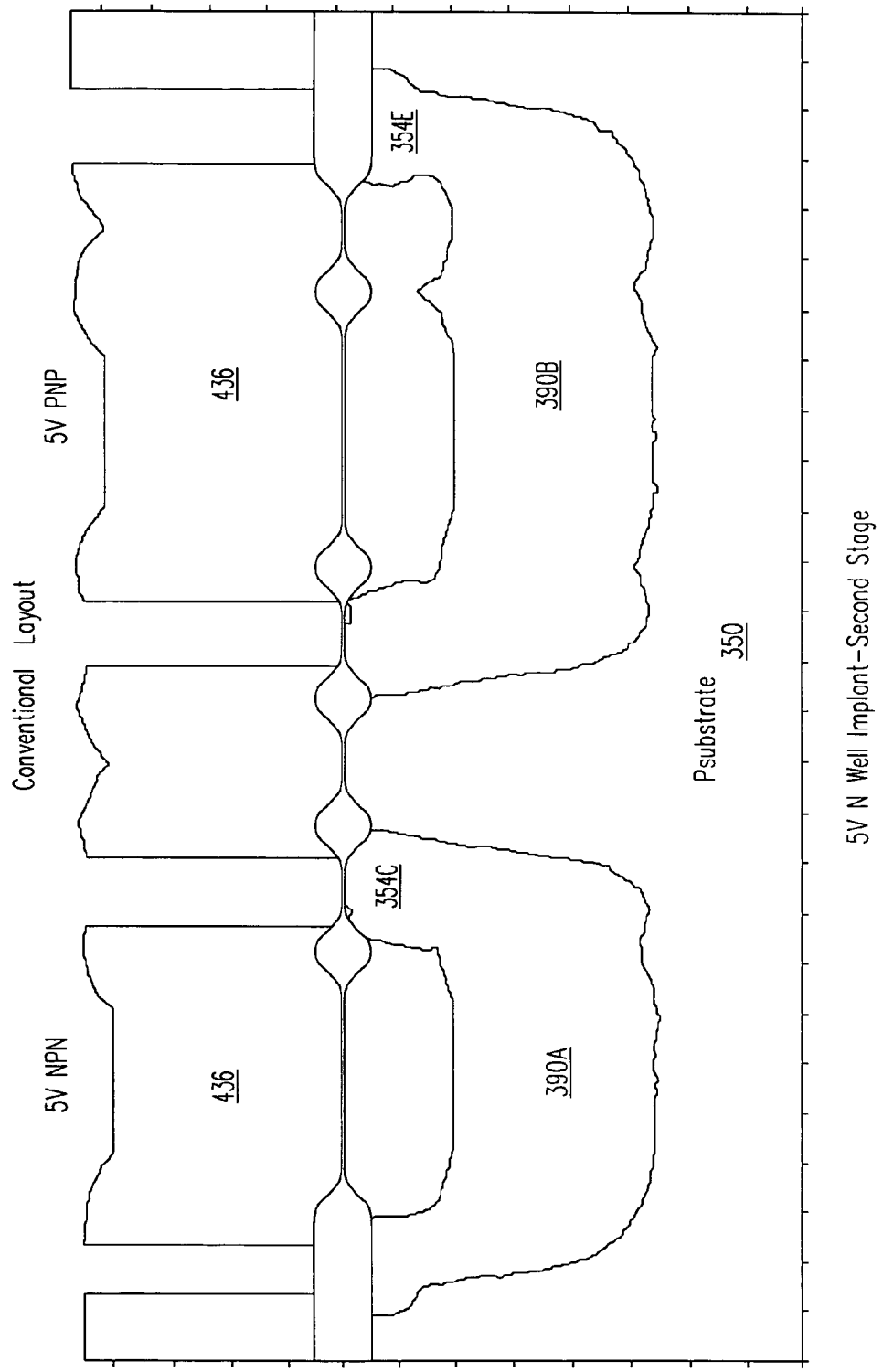
Figure 41D:
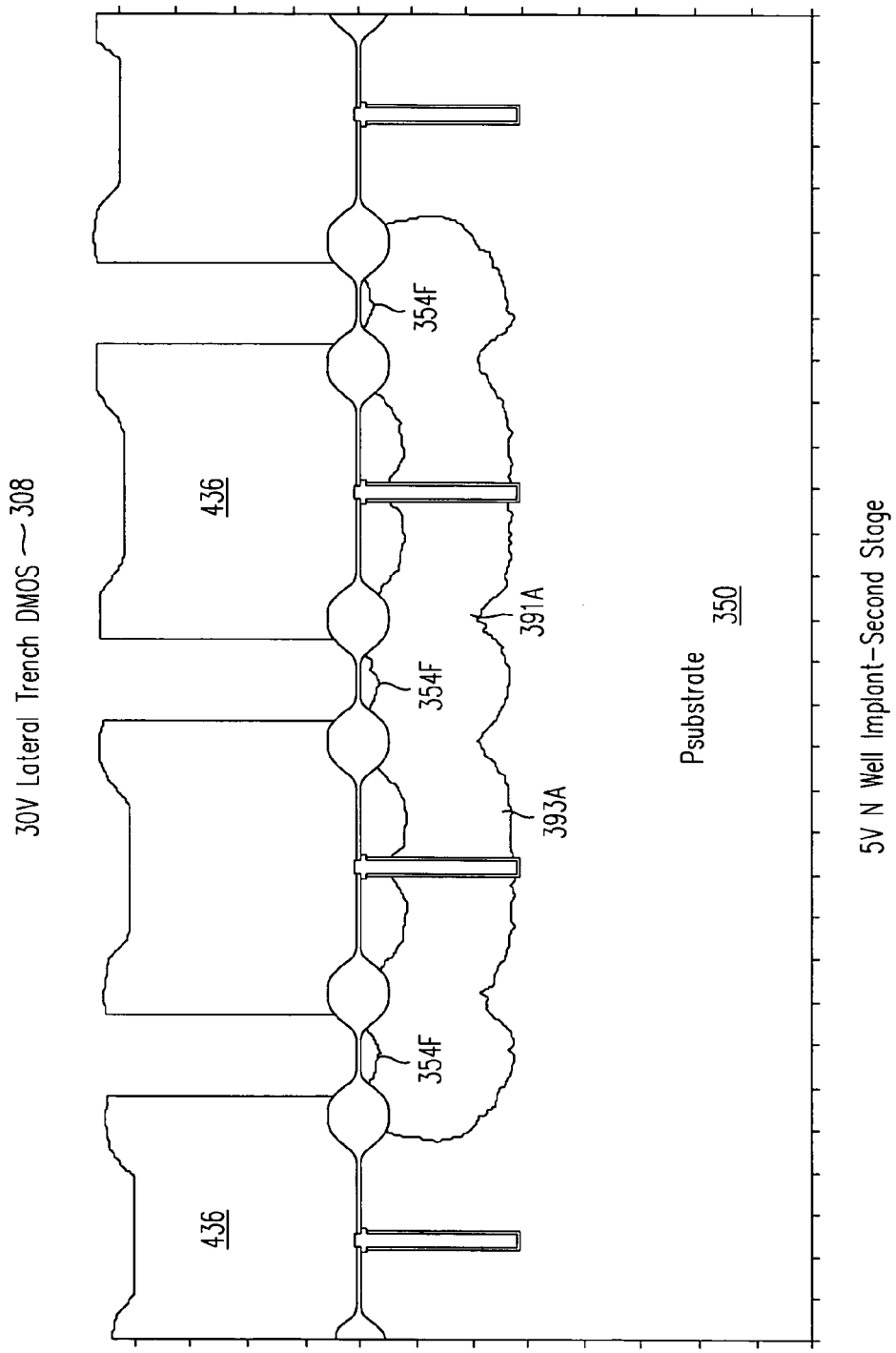
Figure 42A:
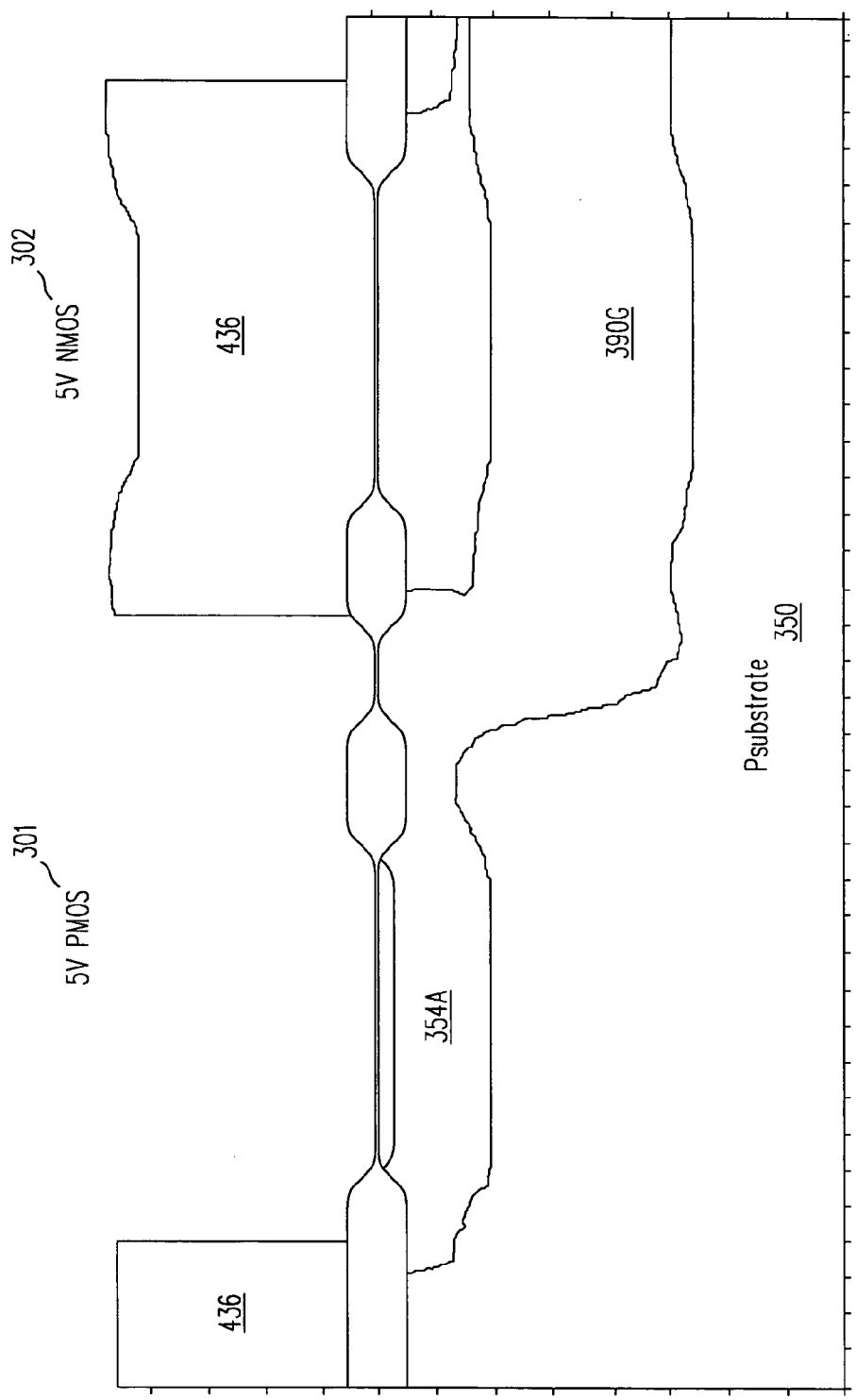
Figure 42B:
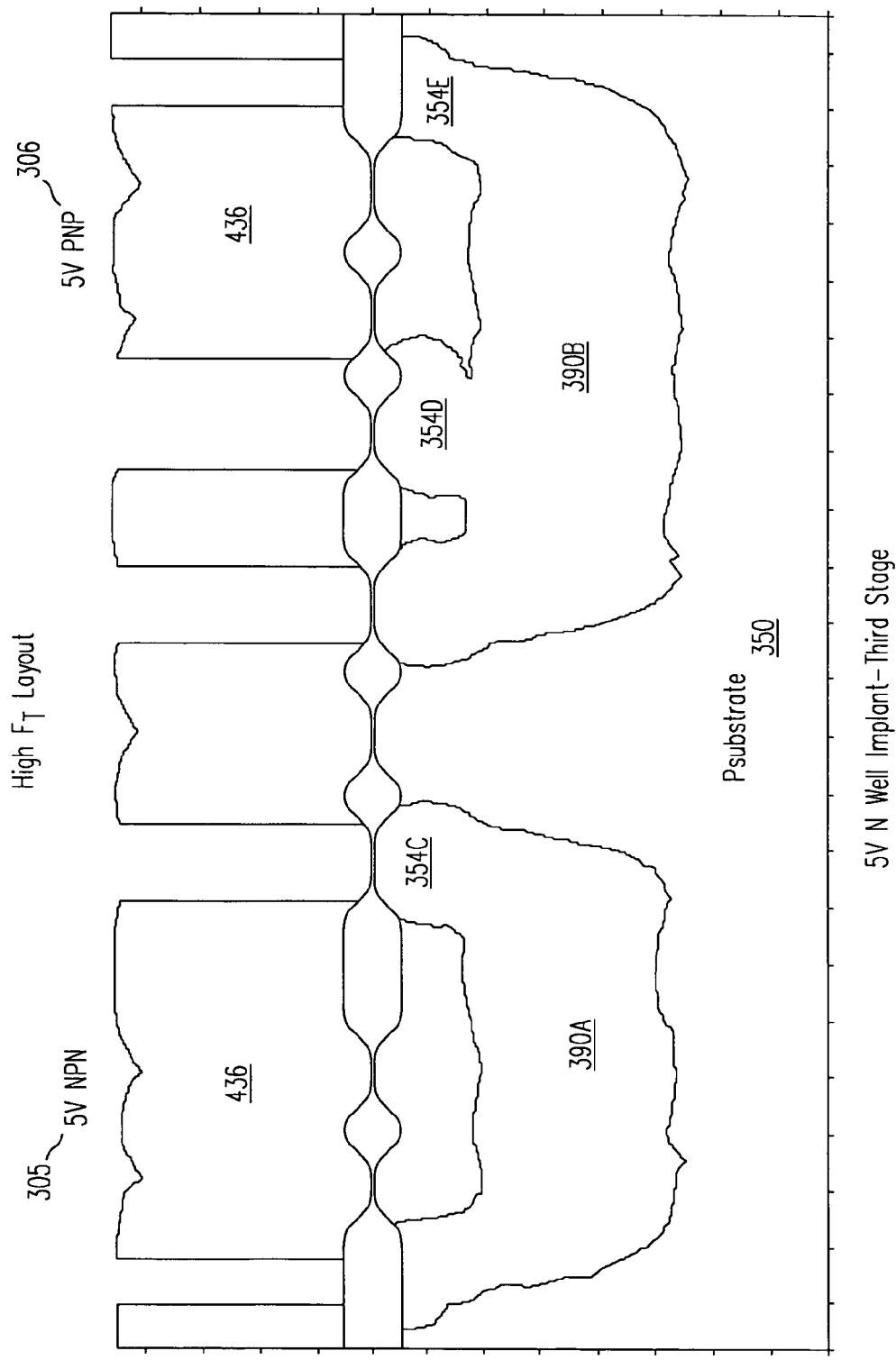
Figure 42C:
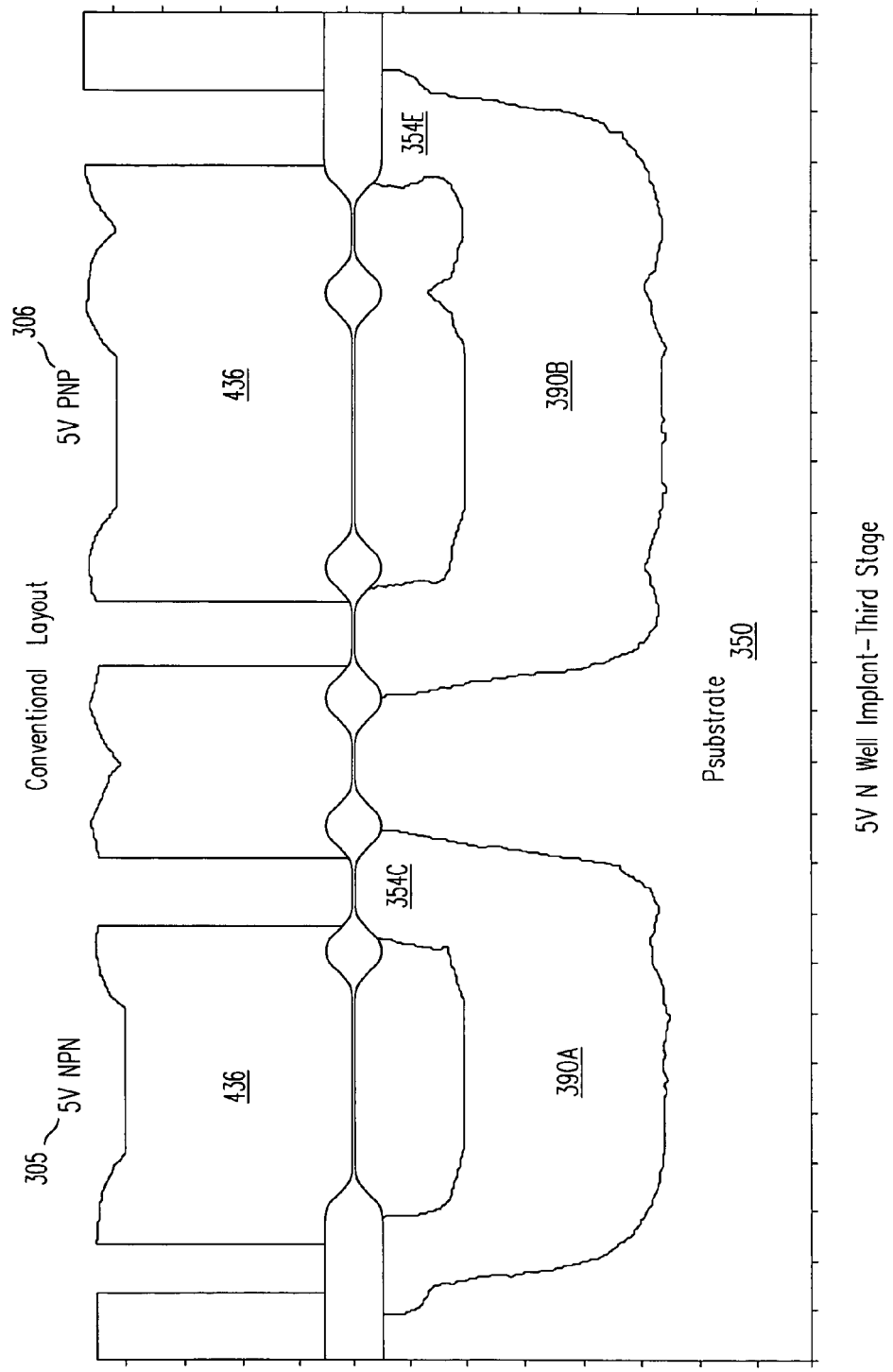
Figure 42D:
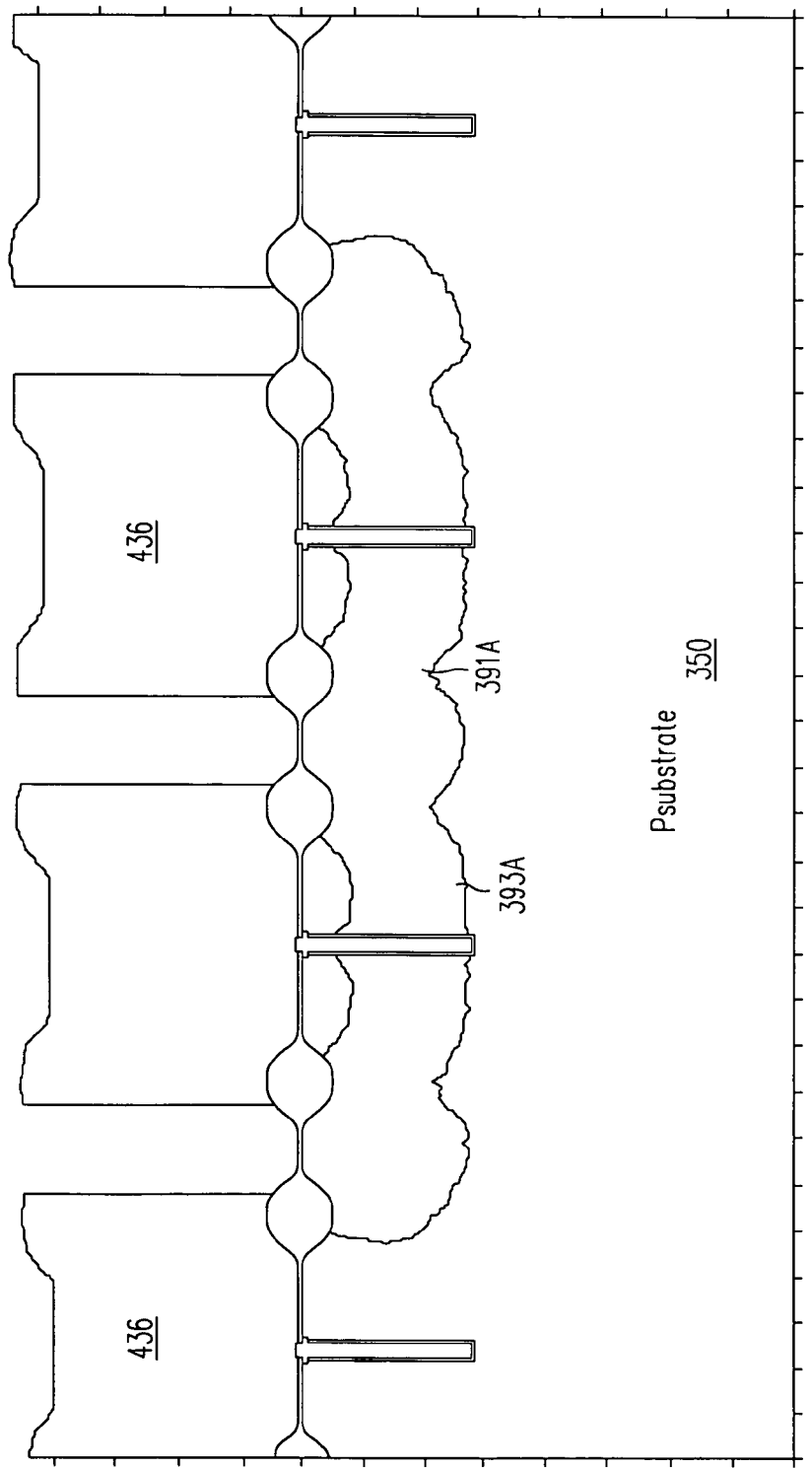
Figure 42E:
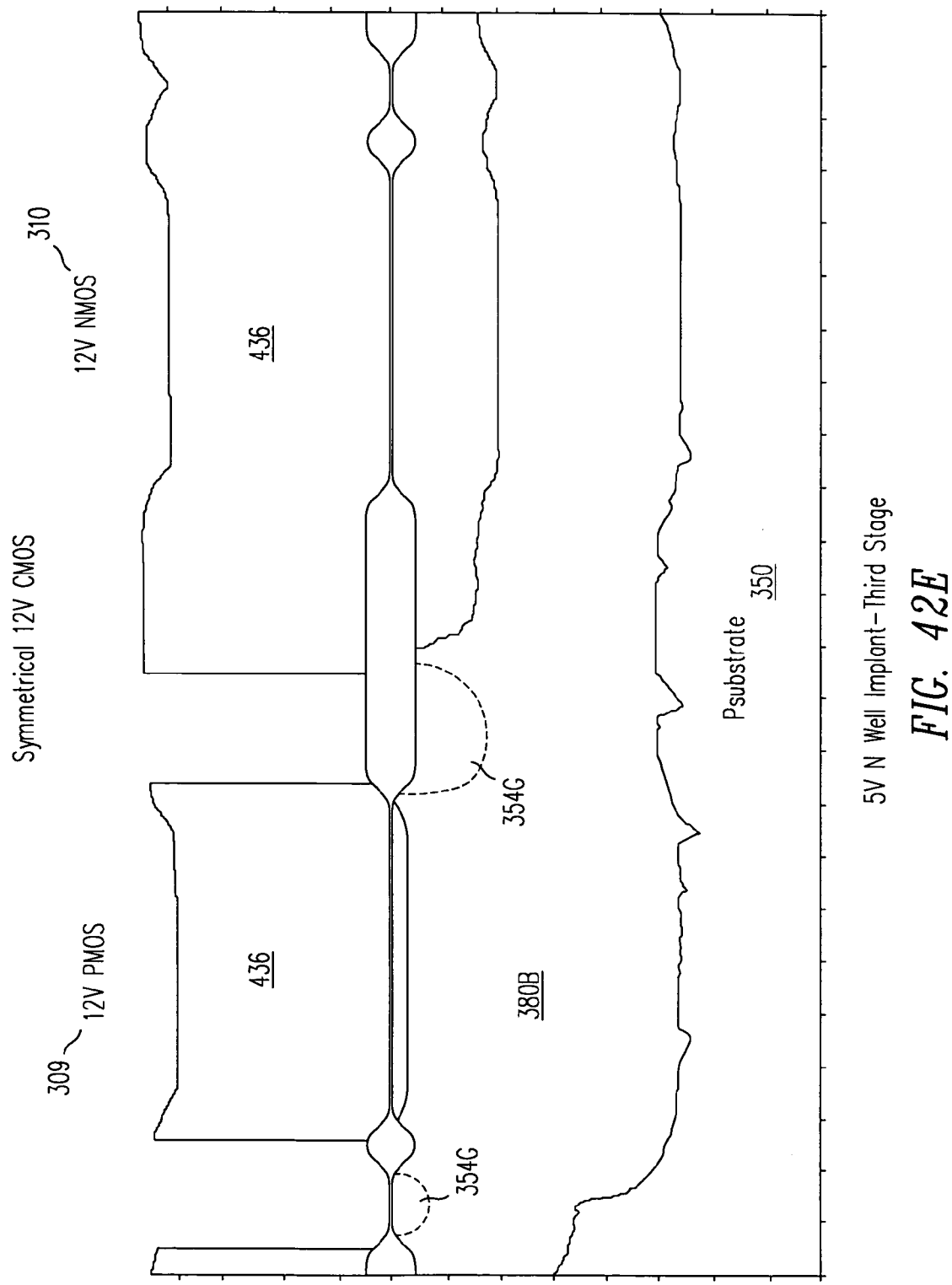

FIG. 39E shows the second stage of the implanting of the 12V N well.

FIGS. 40A–40E show the first stage of the implanting of the 5V N well.

FIGS. 41A–41E show the second stage of the implanting of the 5V N well.

FIGS. 42A–42E show the third stage of the implanting of the 5V N well.

Figure 43B:
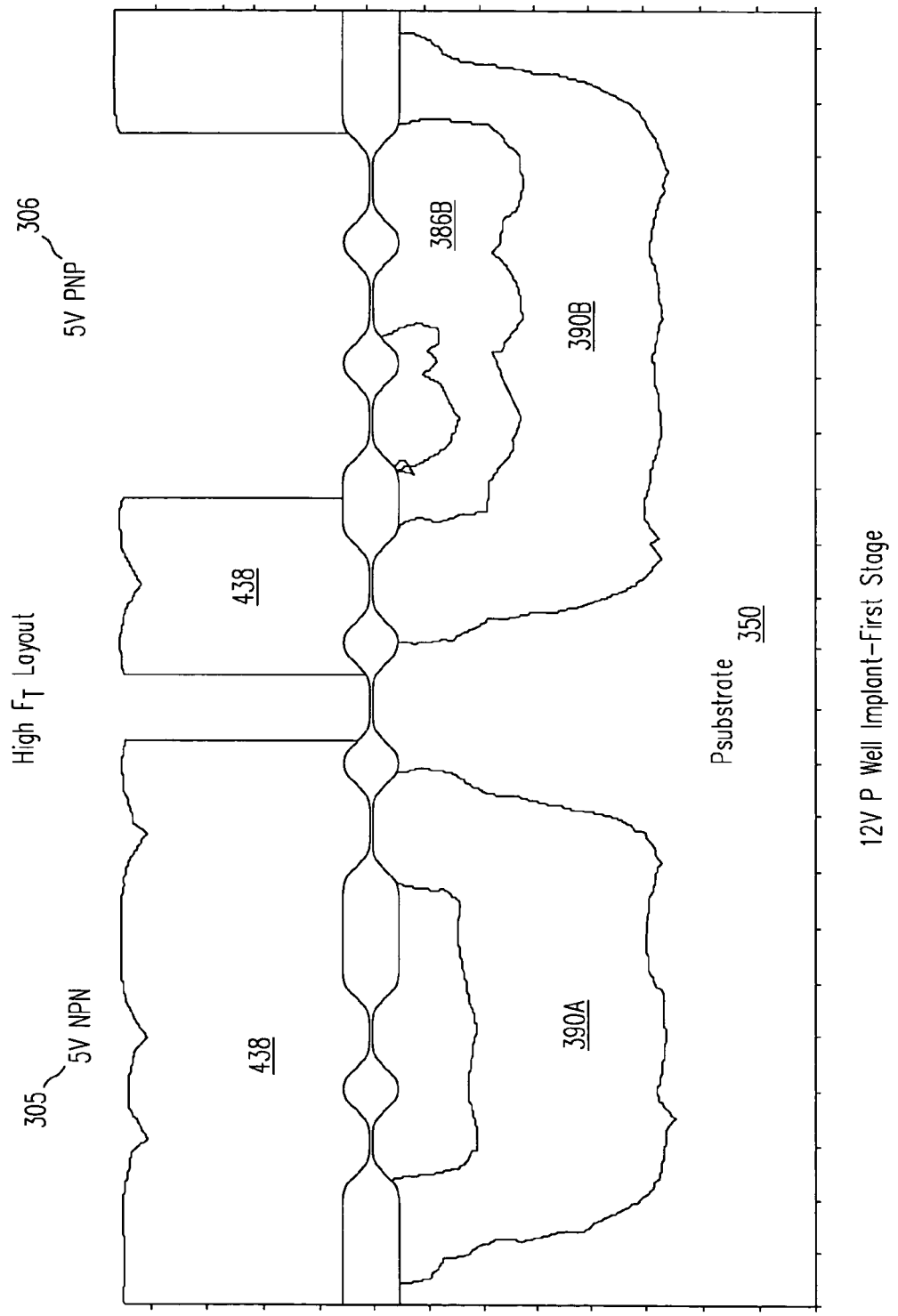
Figure 43C:
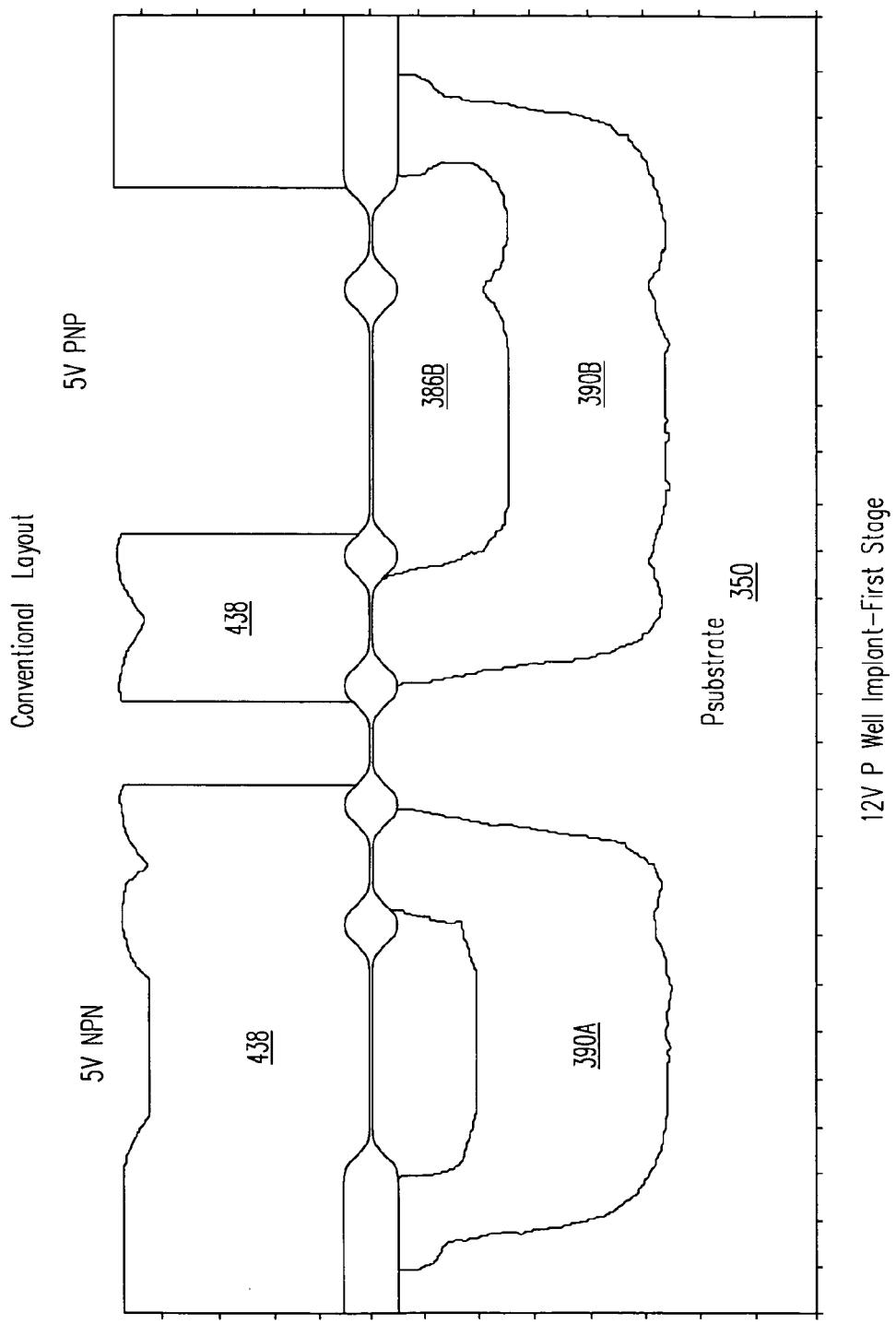
Figure 43E:
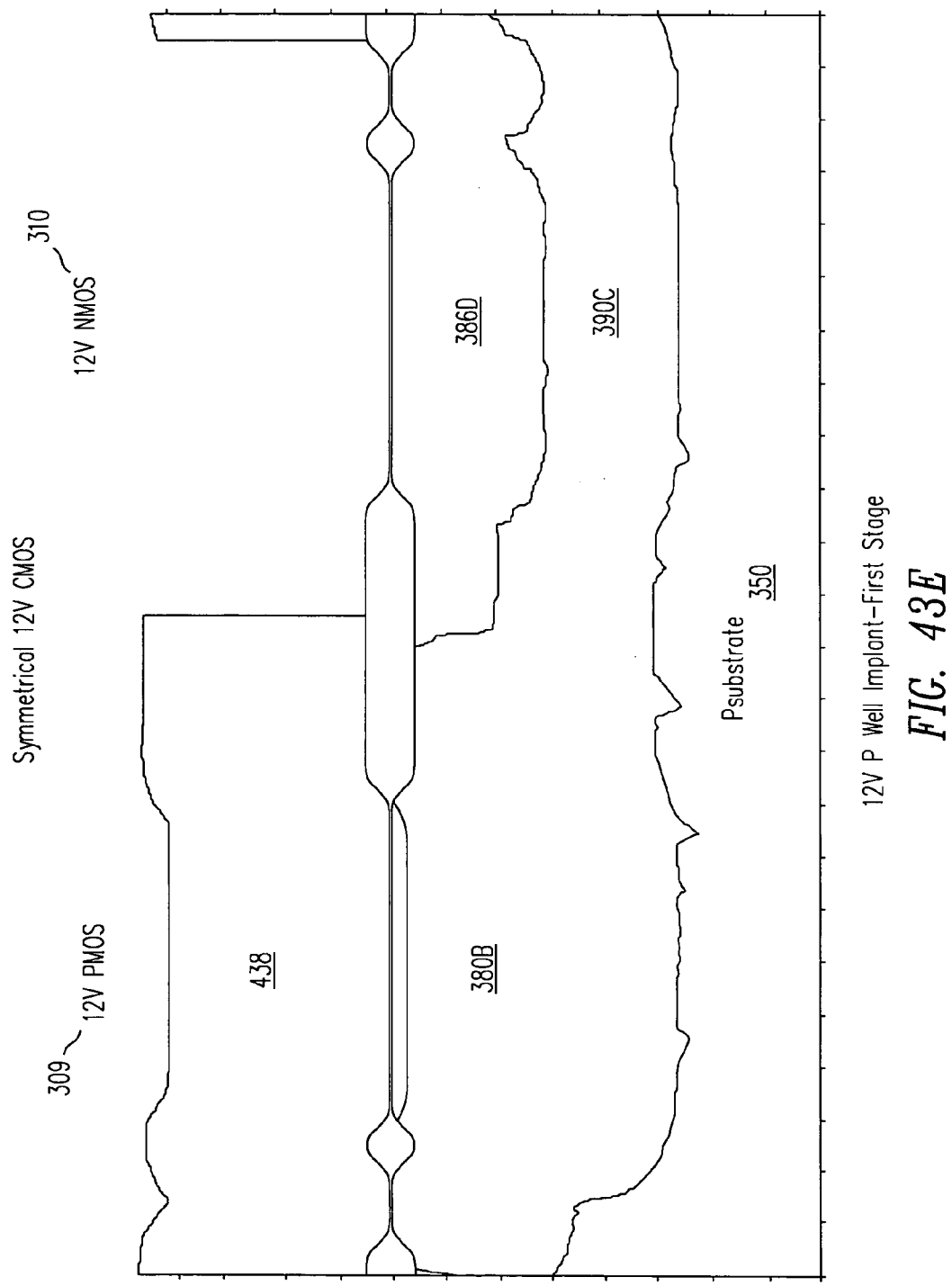

FIGS. 43B, 43C and 43E show the first stage of the implanting of the 12V P well.

Figure 44B:
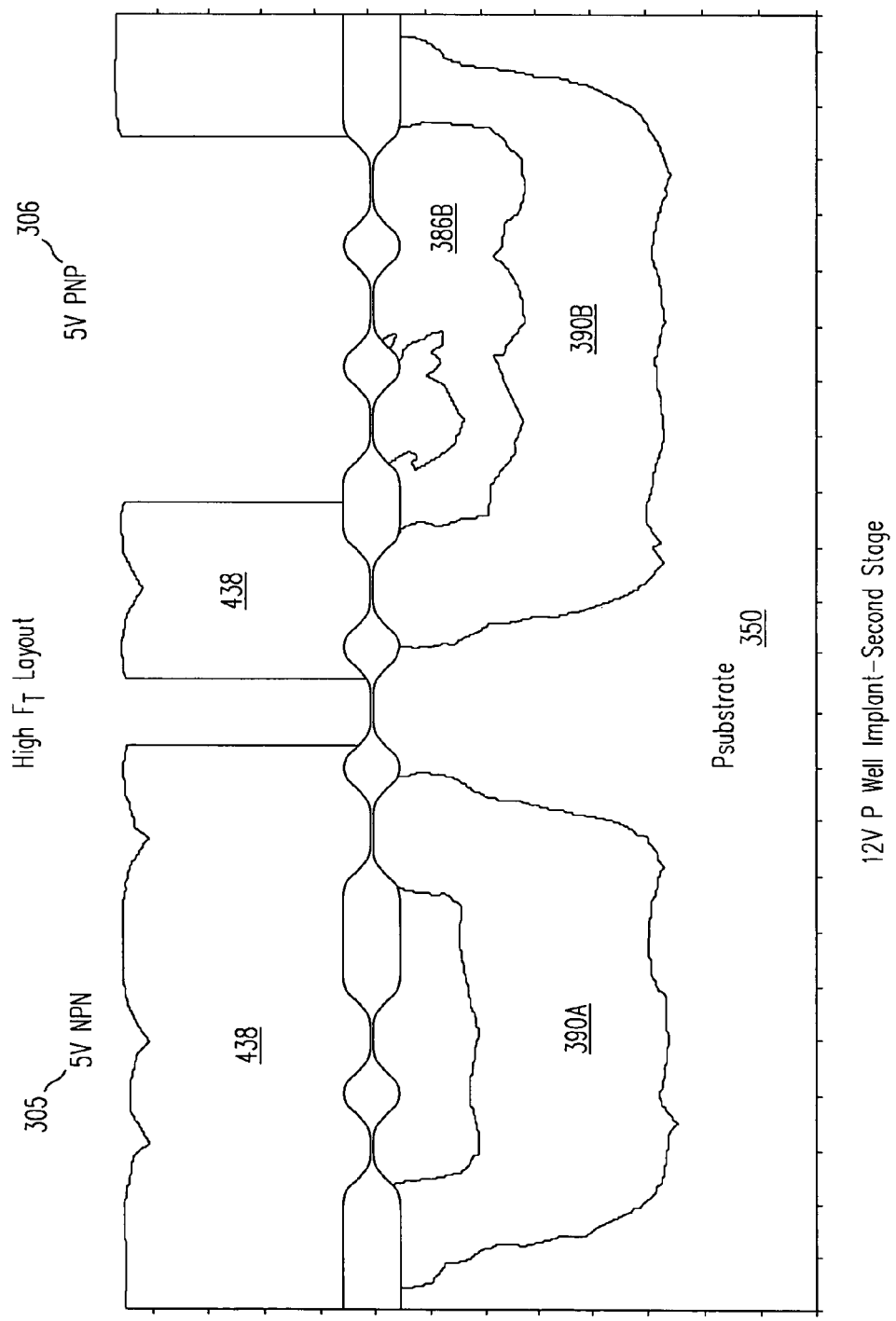
Figure 44C:
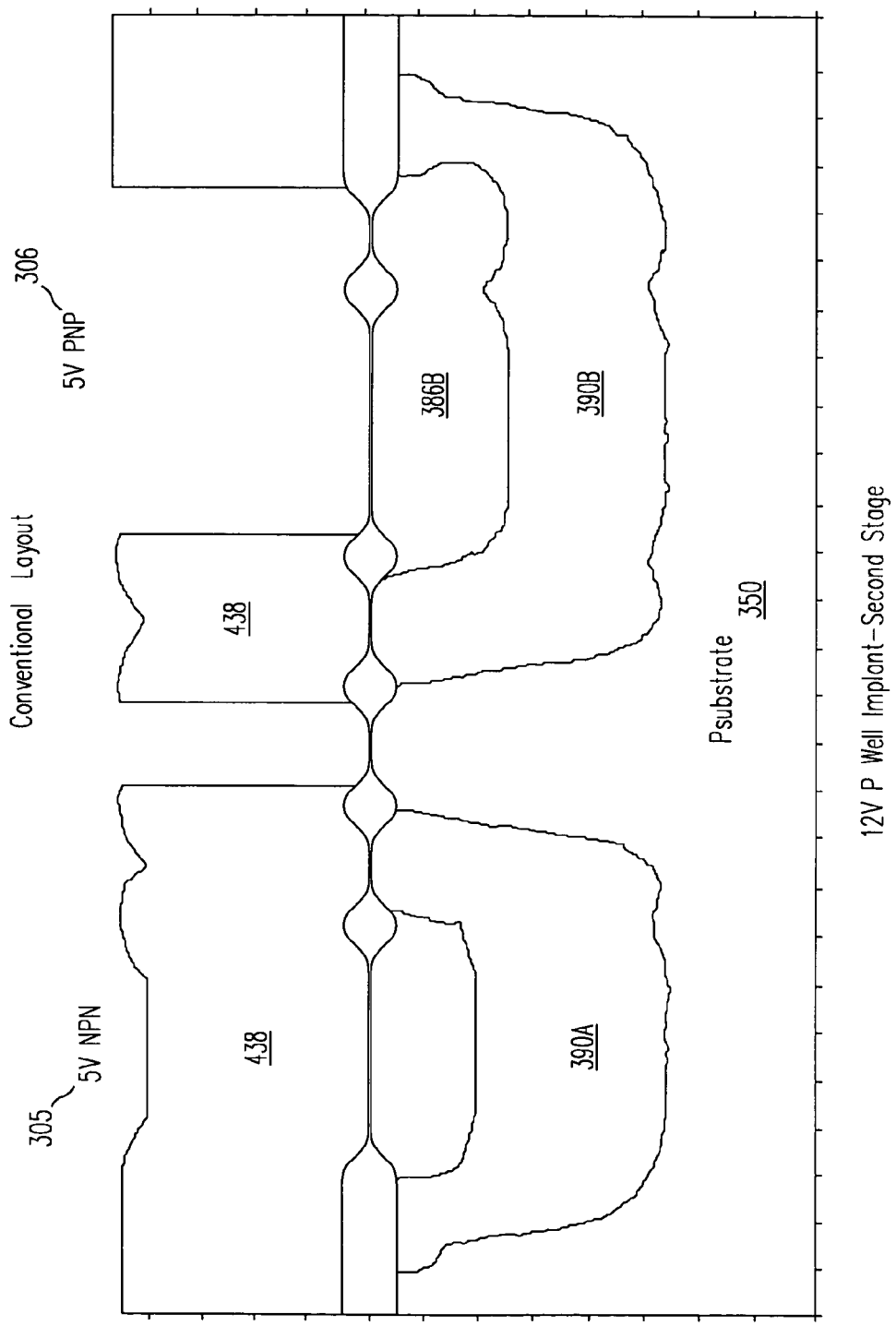
Figure 44E:
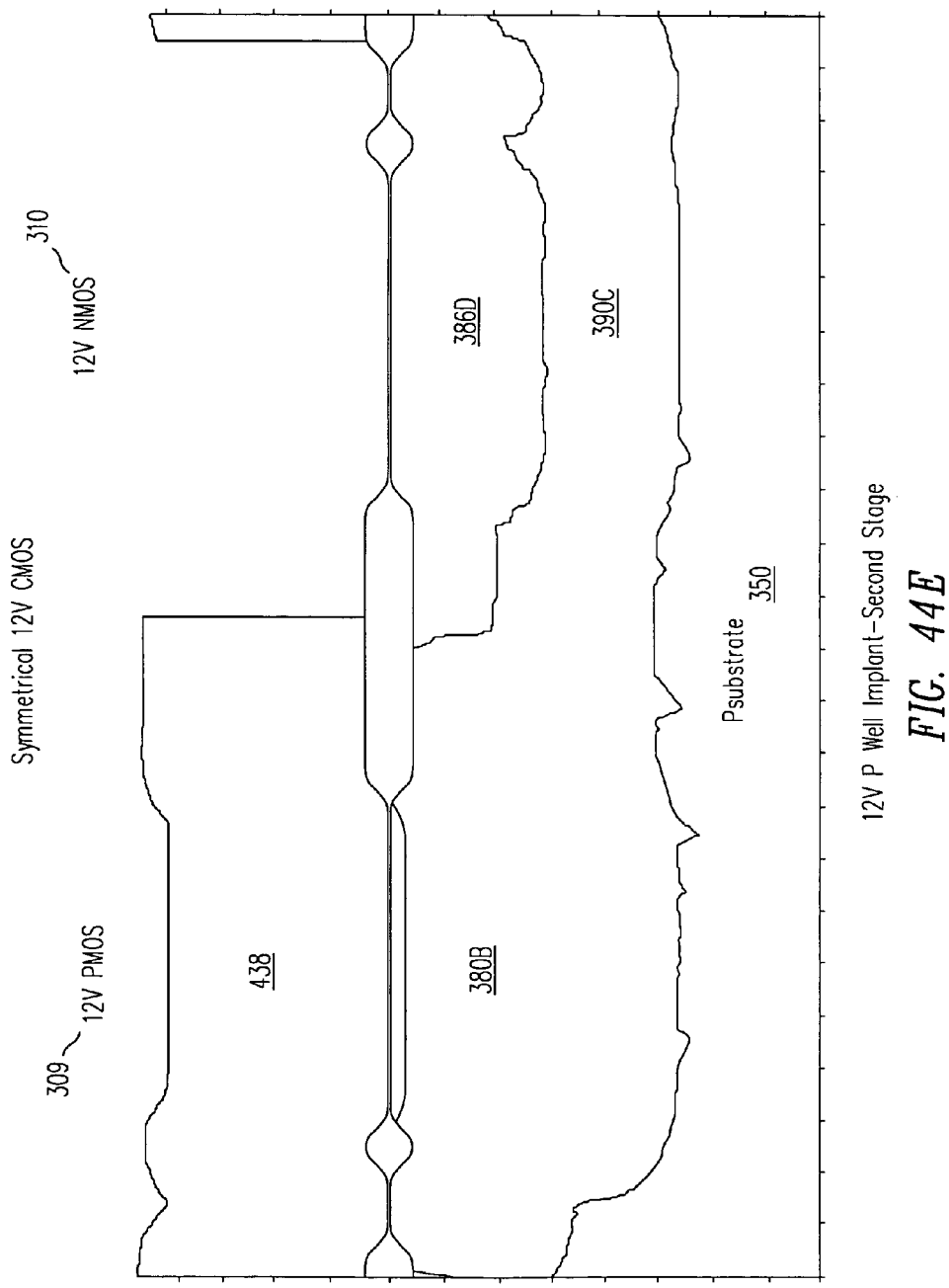
Figure 45A:
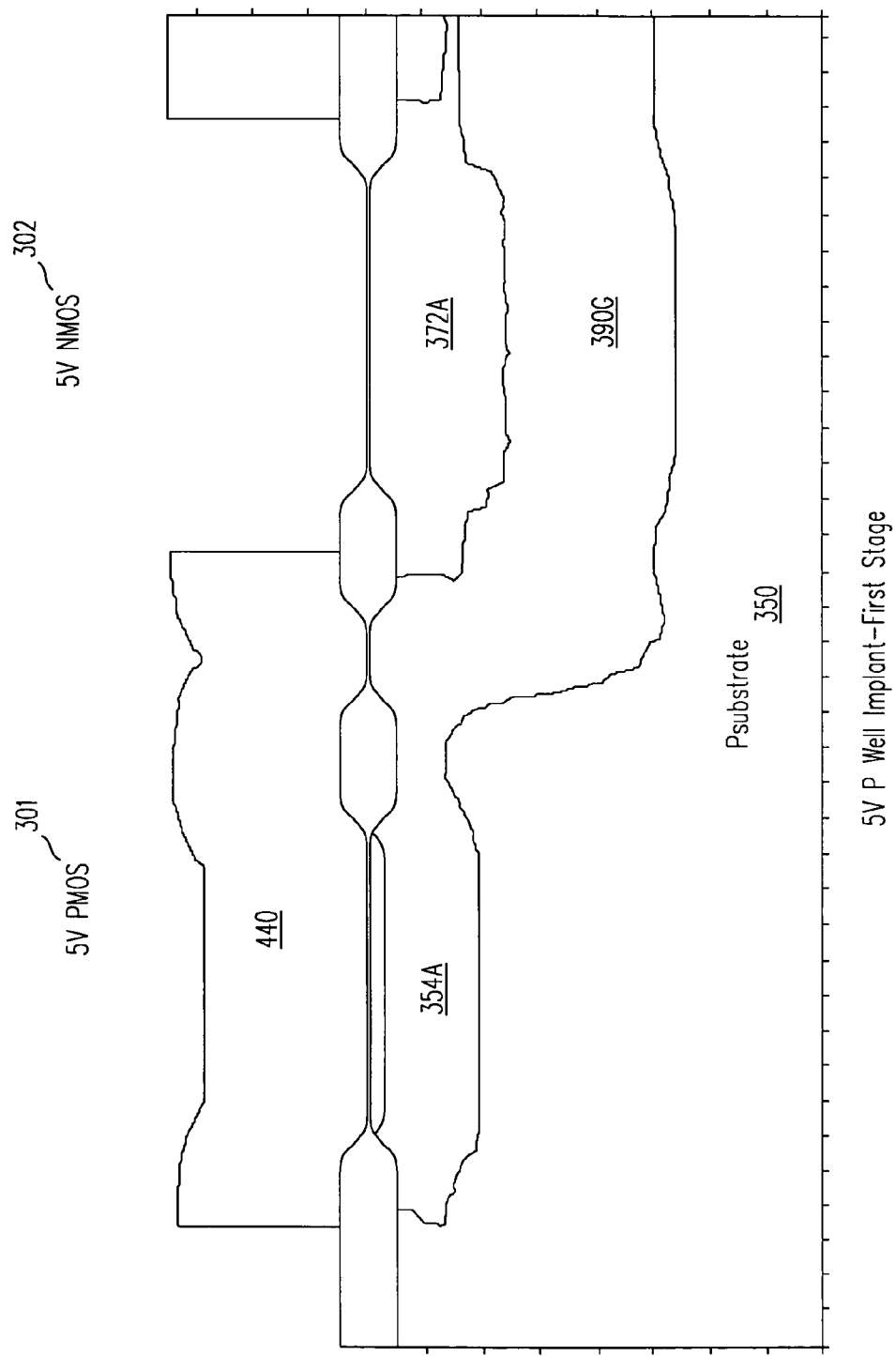
Figure 45B:
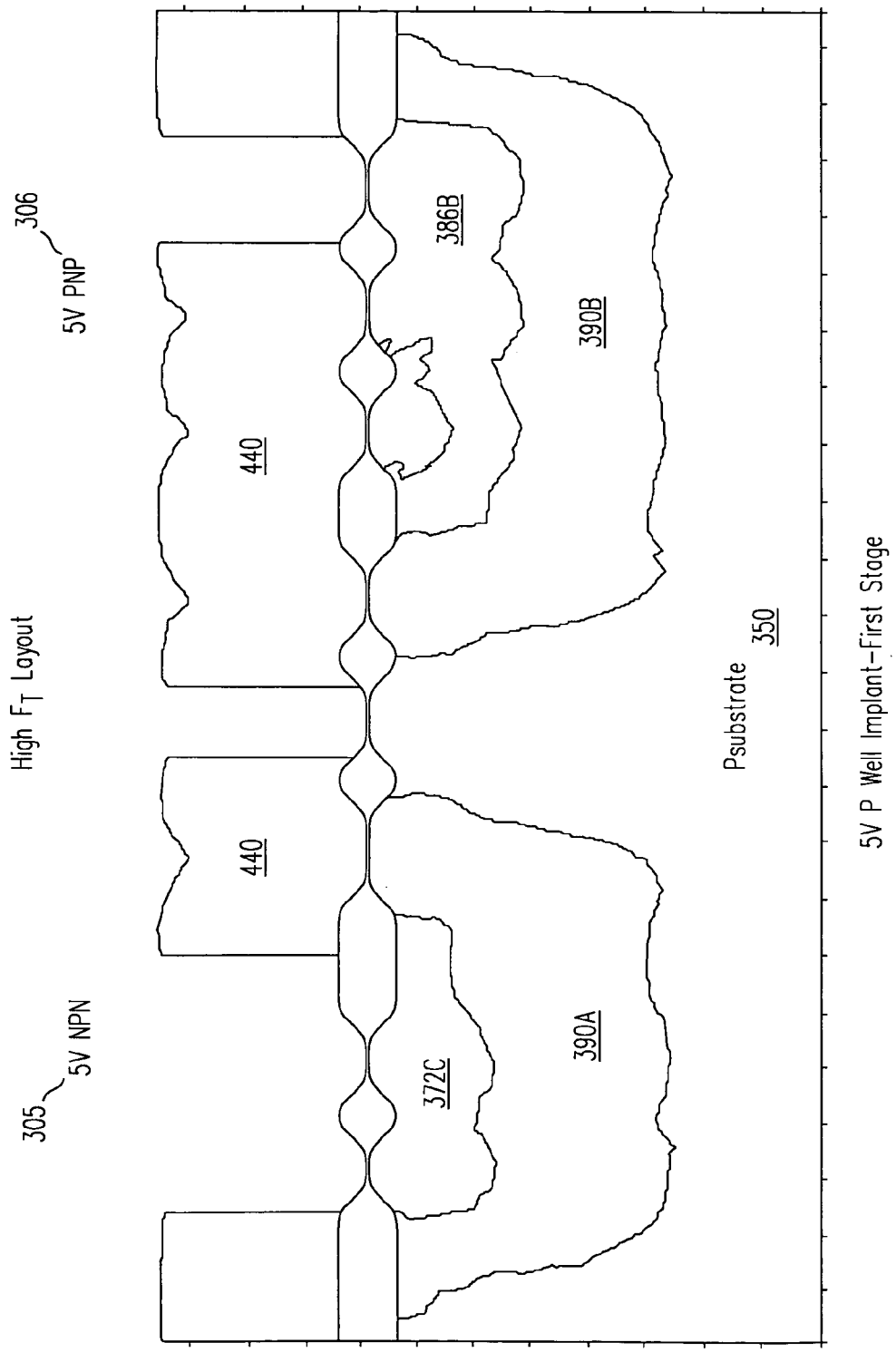
Figure 45C:
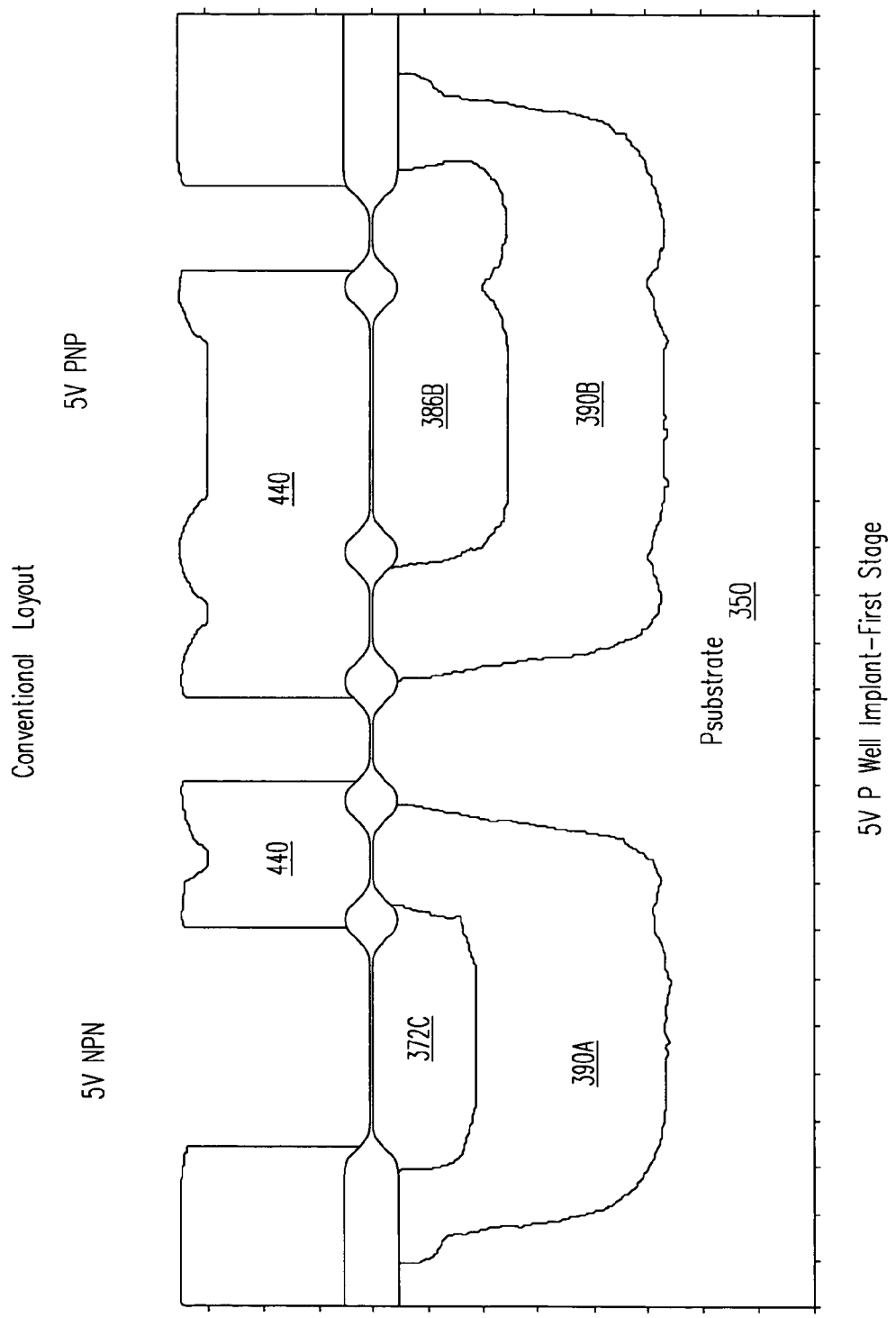
Figure 45E:
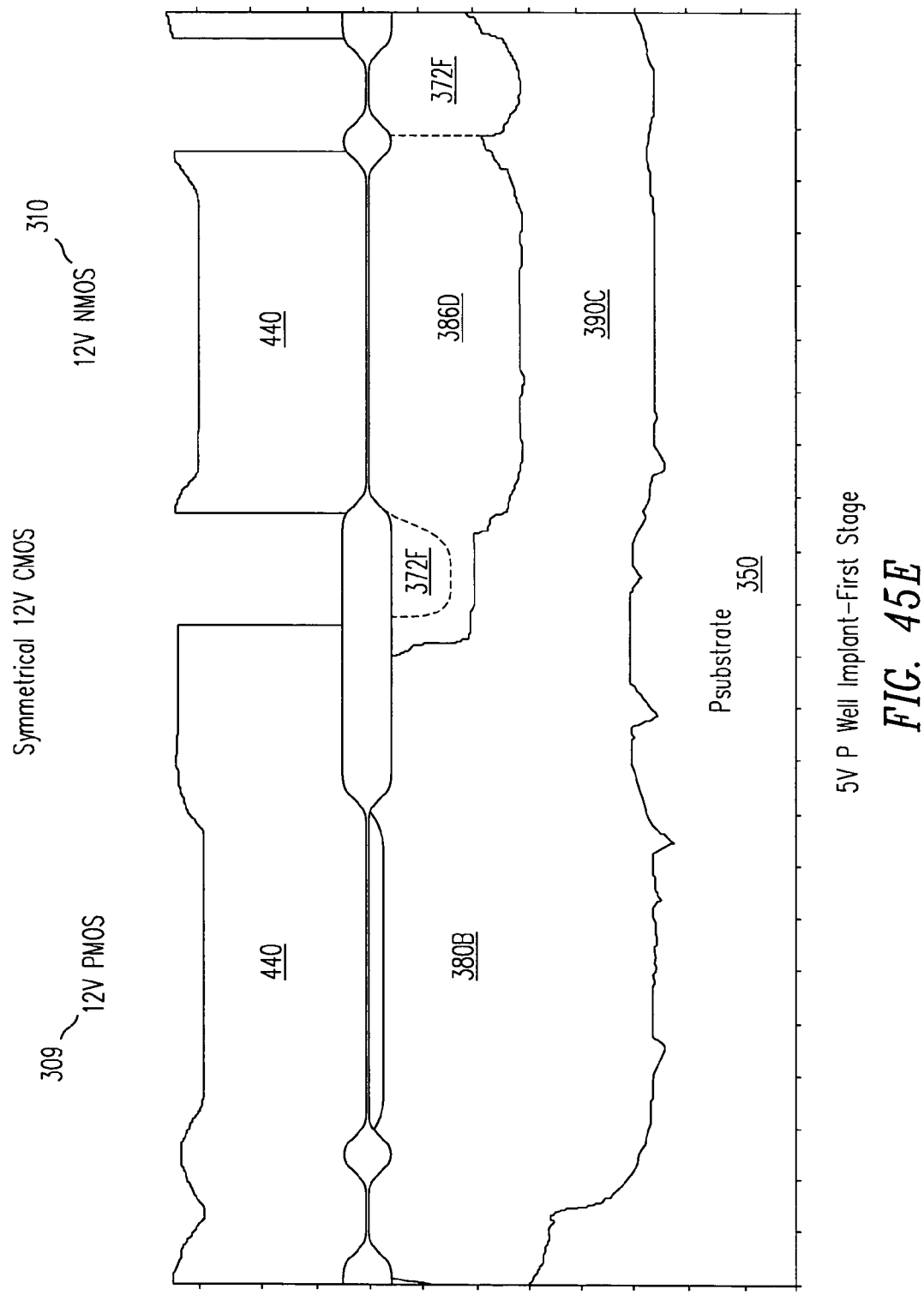
Figure 46A:
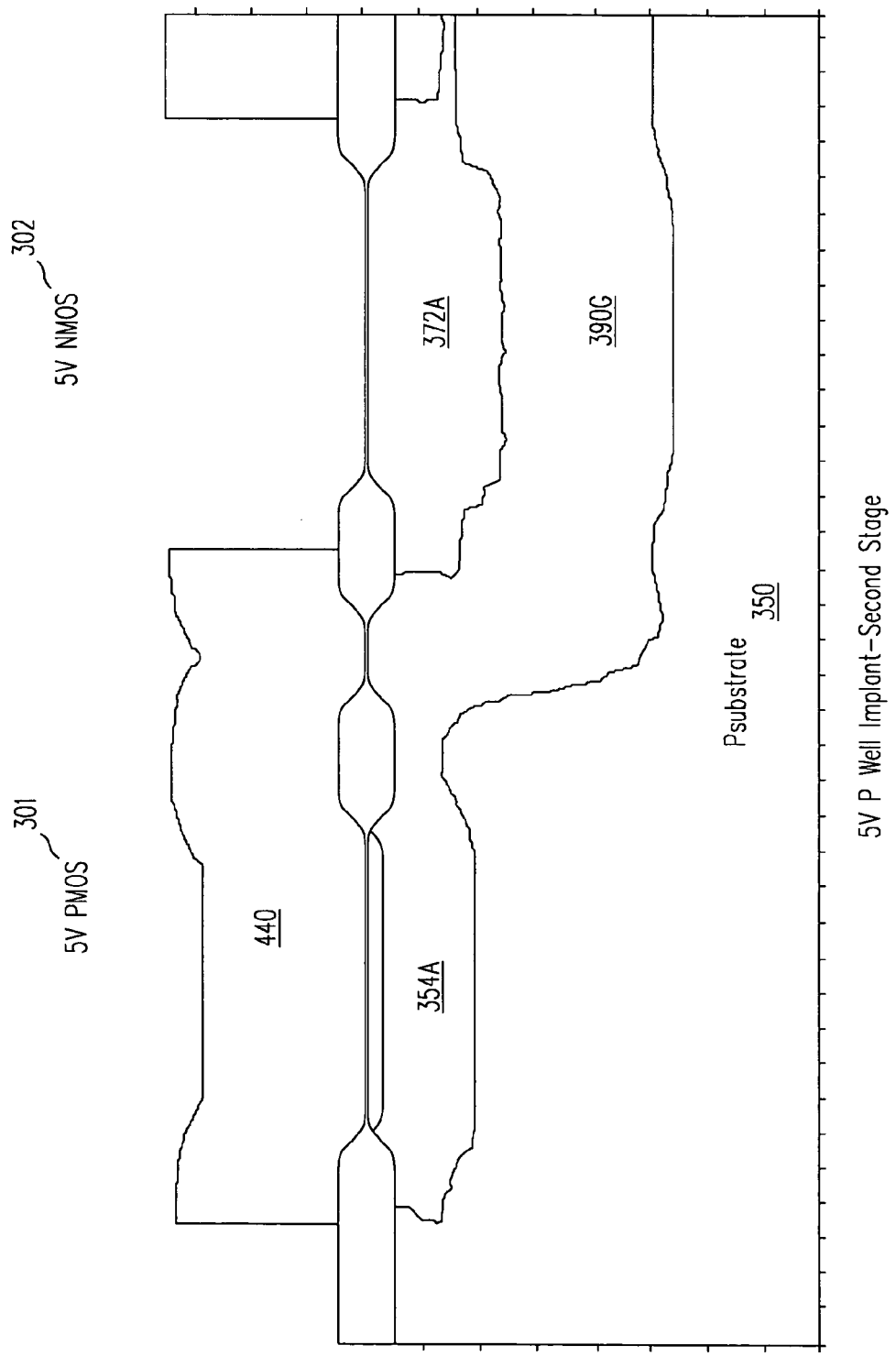
Figure 46B:
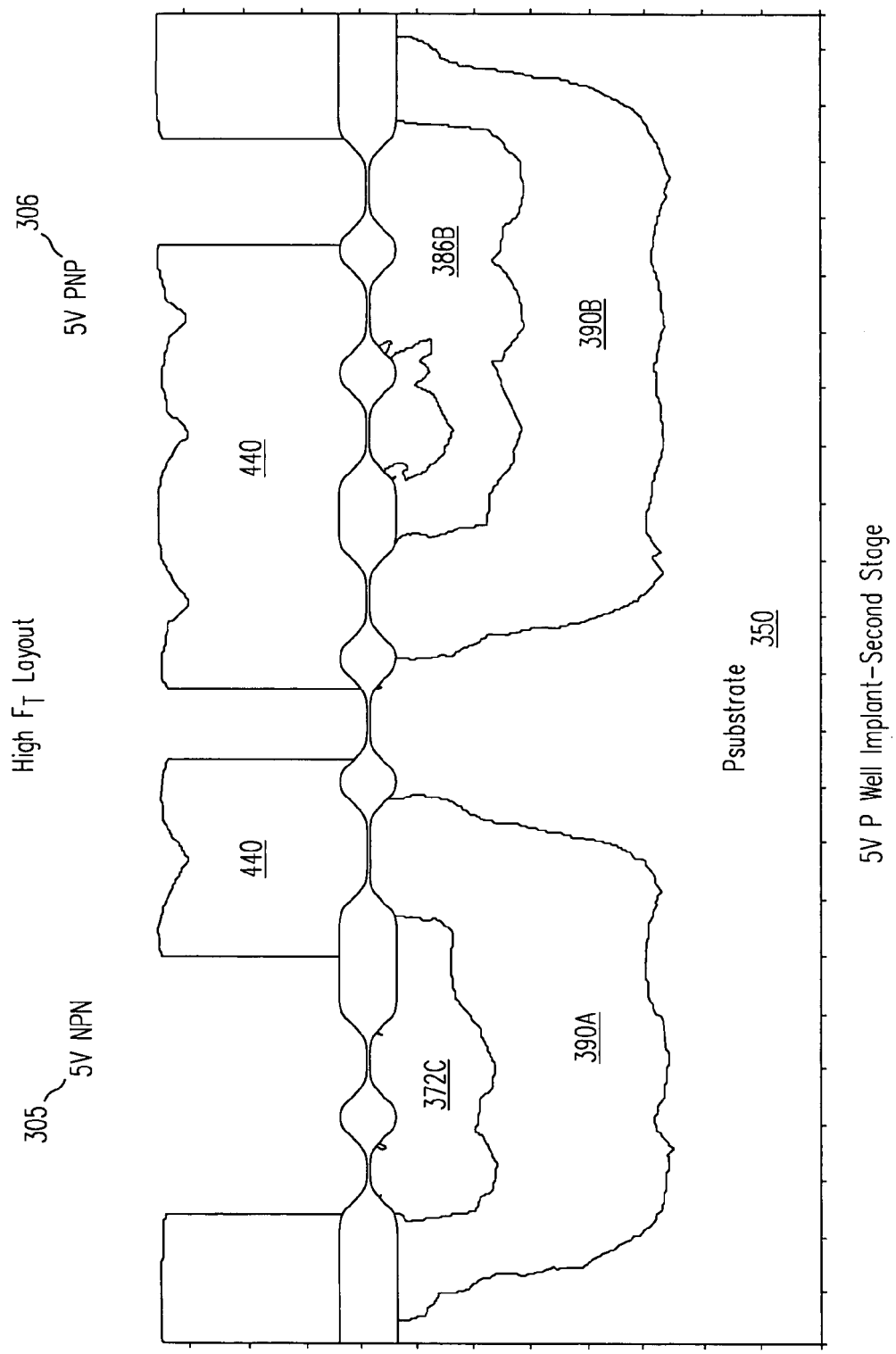
Figure 46C:
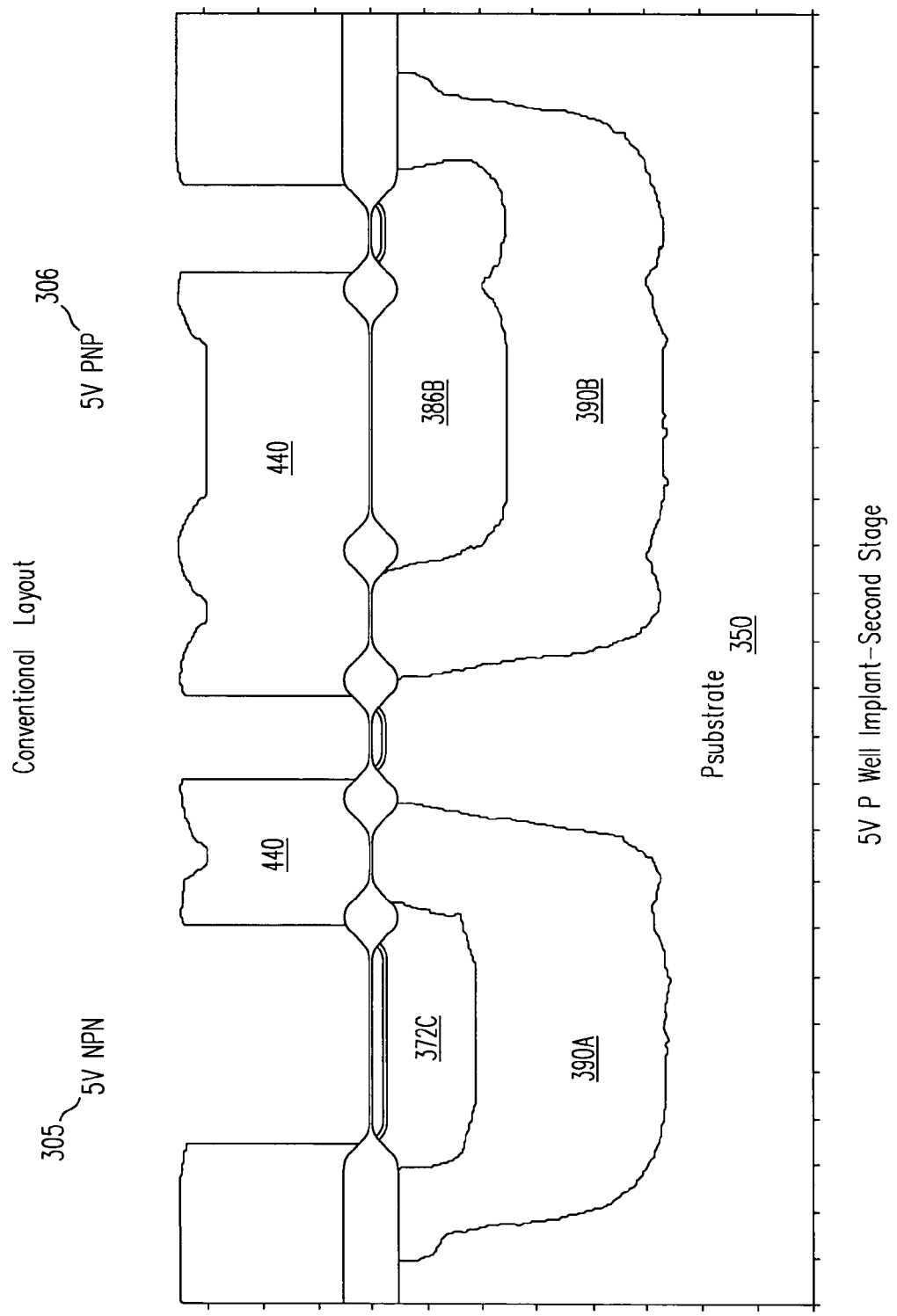
Figure 46E:
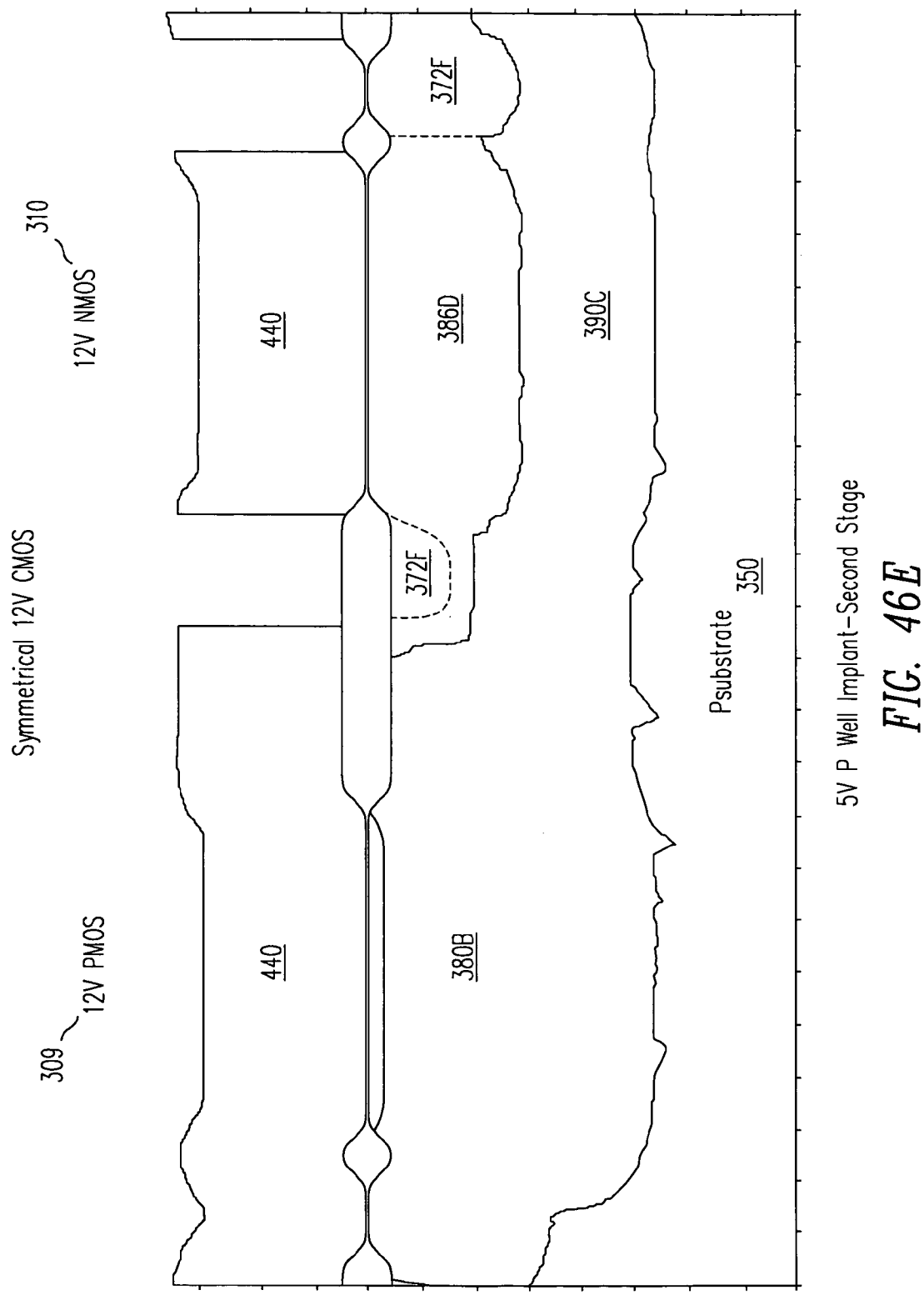

FIGS. 44B, 44C and 44E show the second stage of the implanting of the 12V P well.

FIGS. 45A–45C and 45E show the first stage of the implanting of the 5V P well.

FIGS. 46A–46C and 46E show the second stage of the implanting of the 5V P well.

Figure 47D:
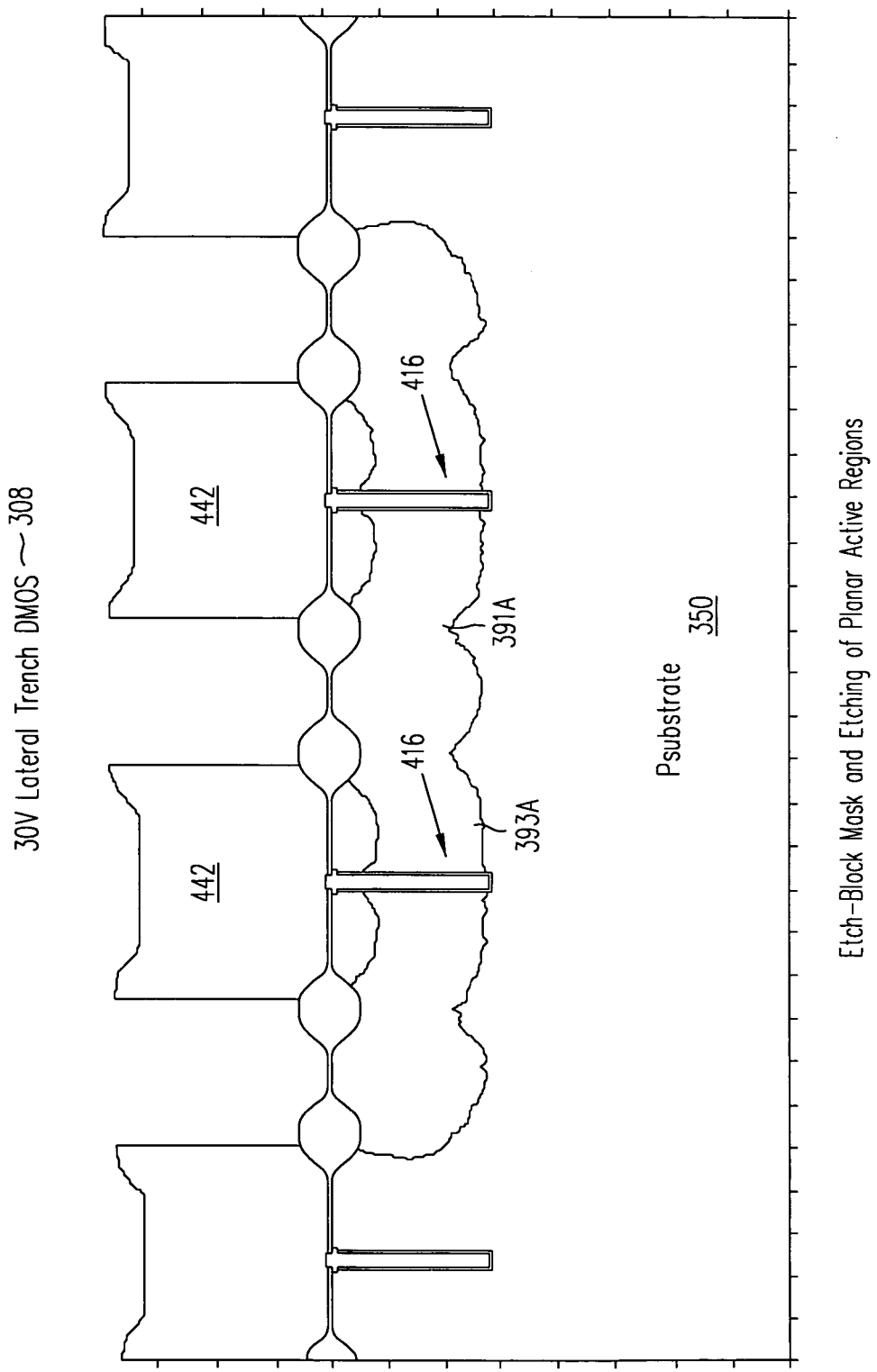

FIG. 47D shows the formation of an etch-block mask and the etching of the active regions of the planar devices.

Figure 48A:
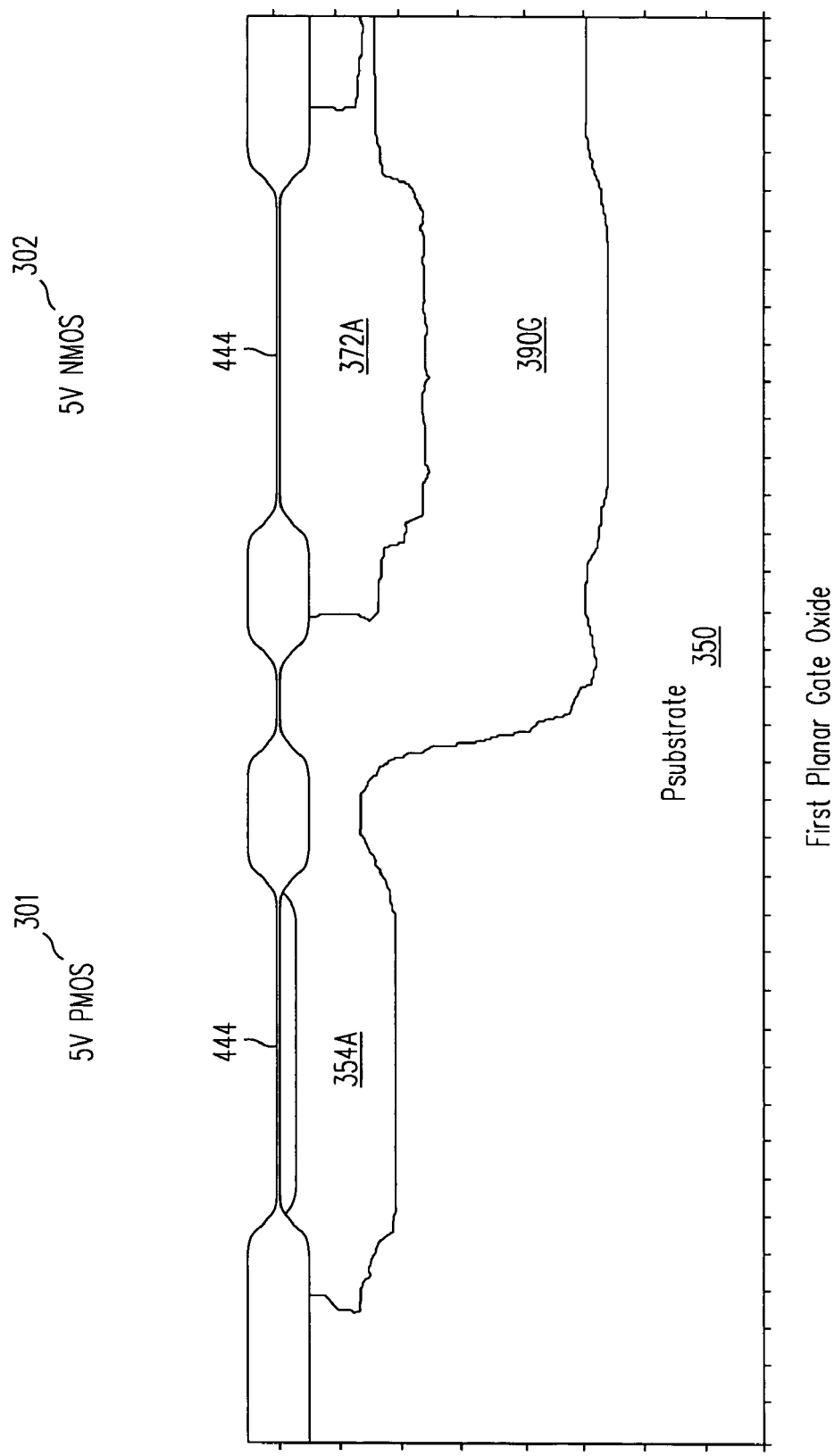
Figure 48E:
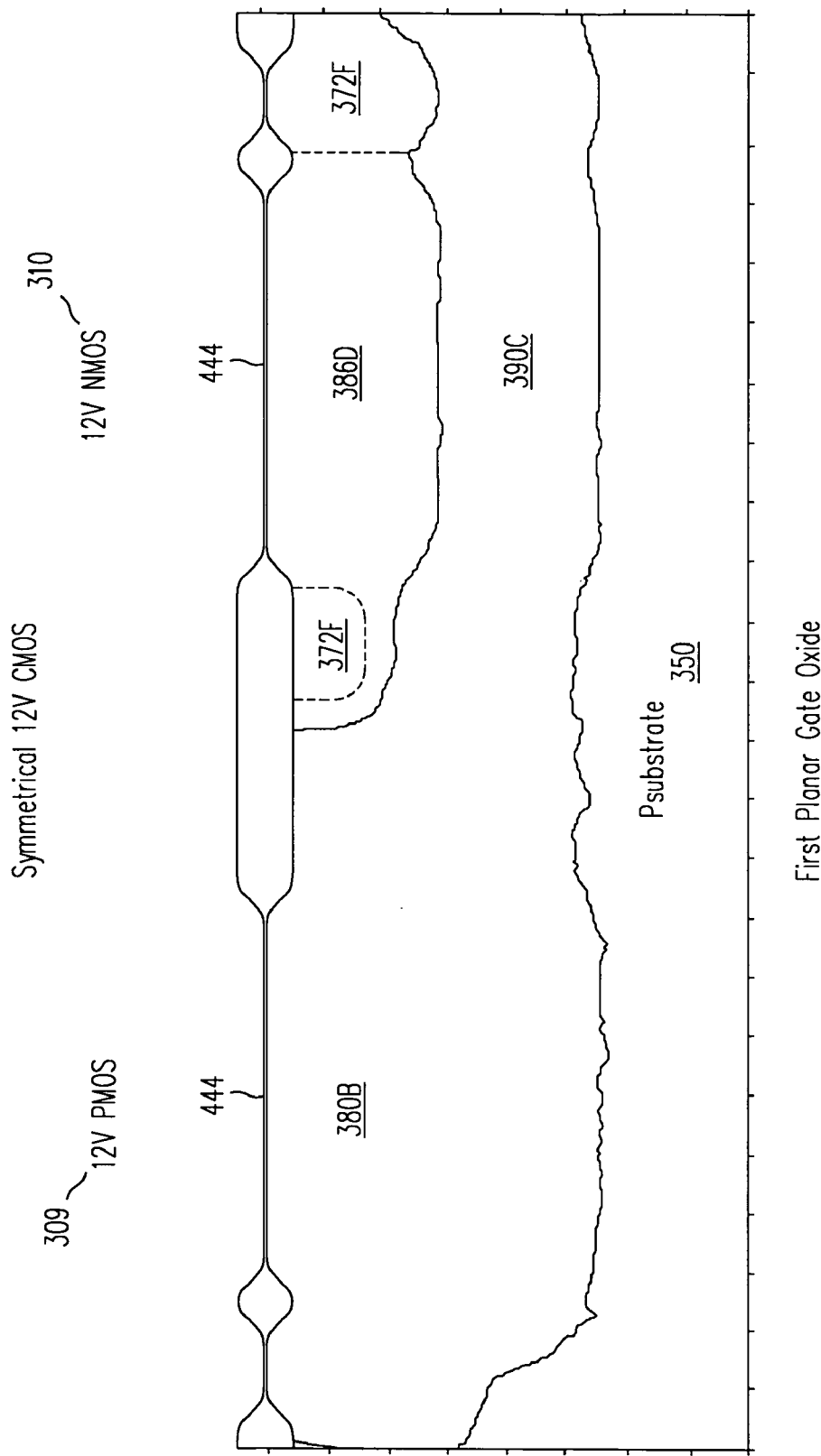

FIGS. 48A and 48E show the formation of the first gate oxide layer for the planar devices.

Figure 49E:
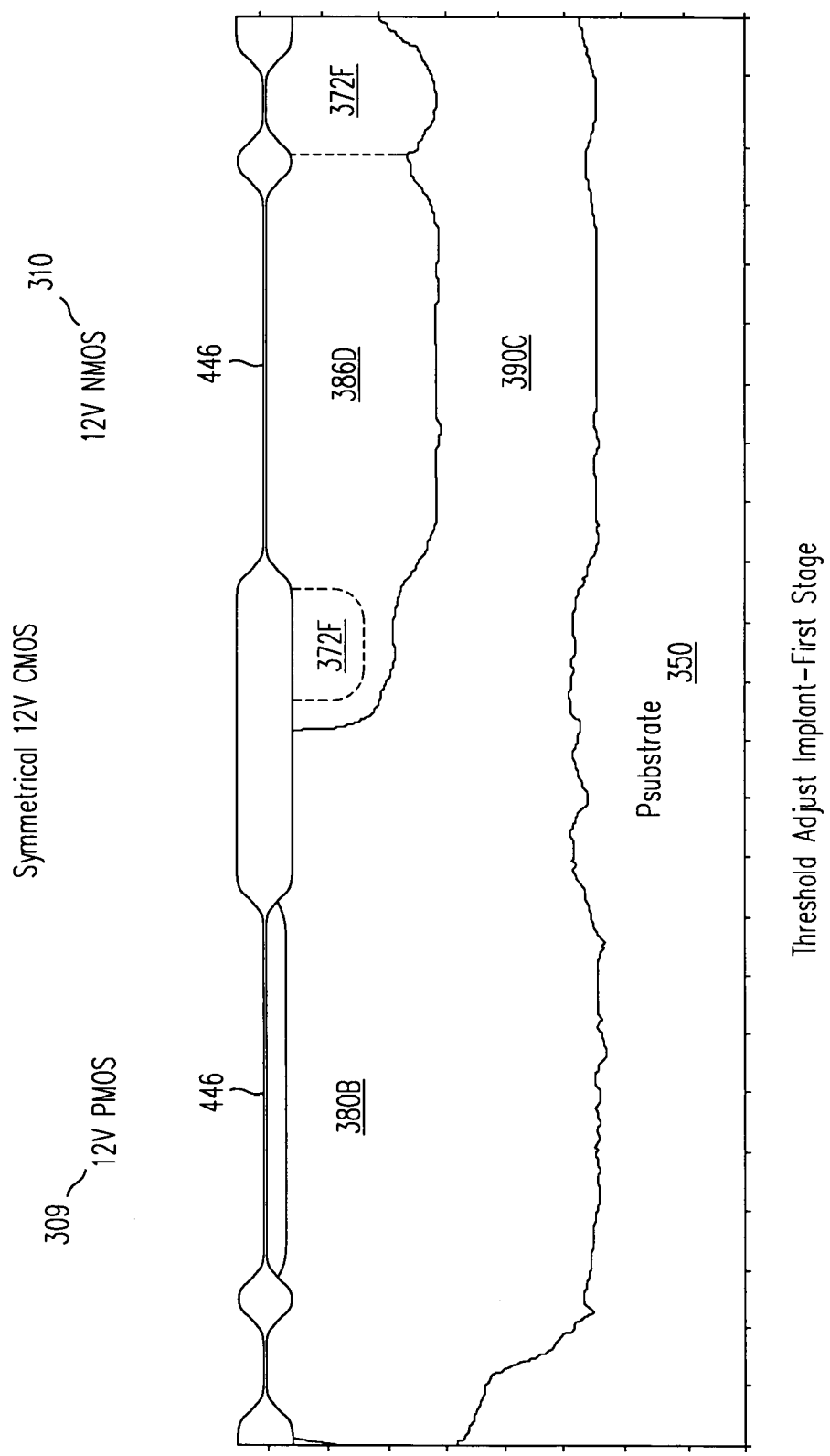

FIGS. 49A and 49E show the first stage of the threshold adjust implant.

Figure 50A:
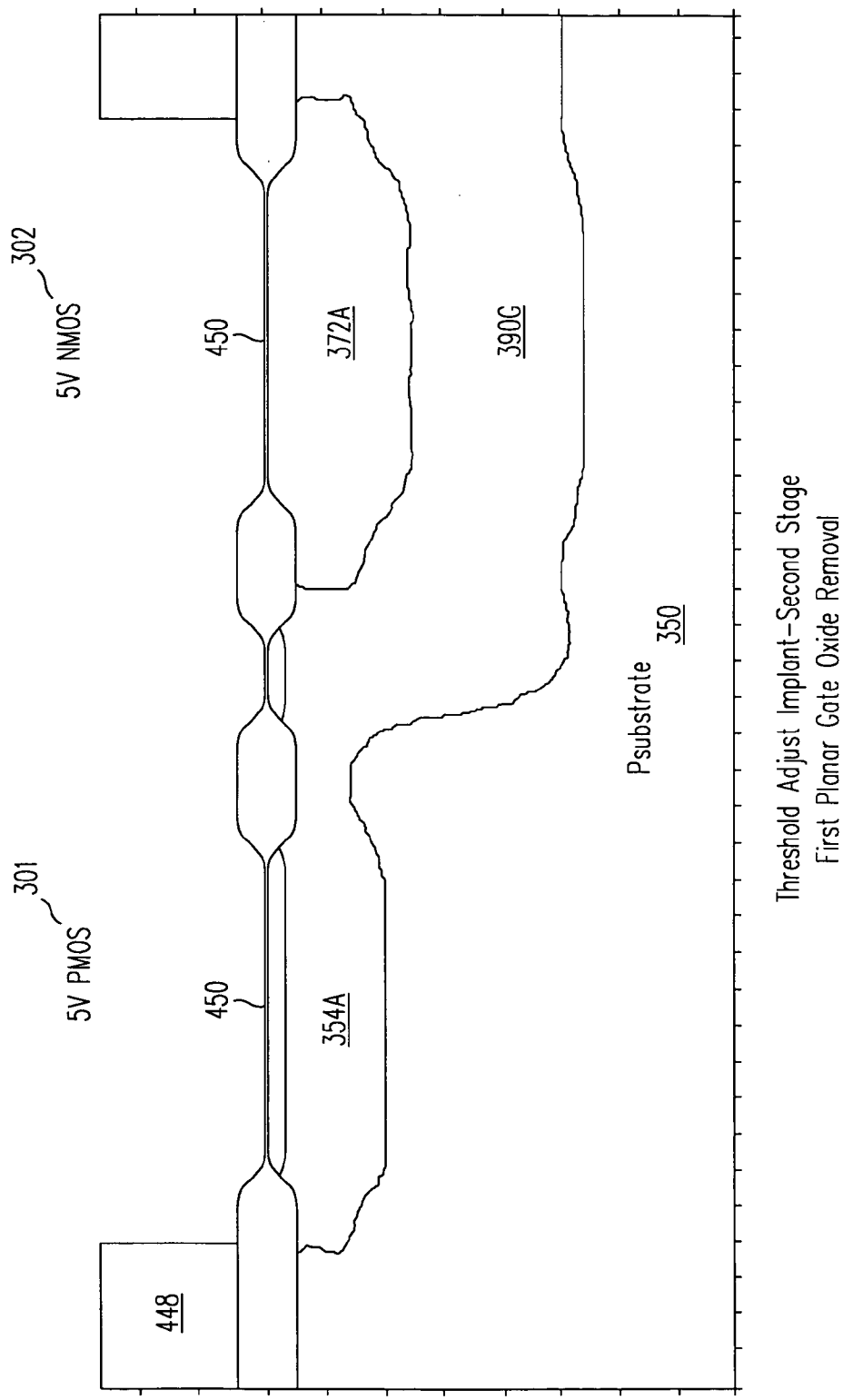
Figure 50E:
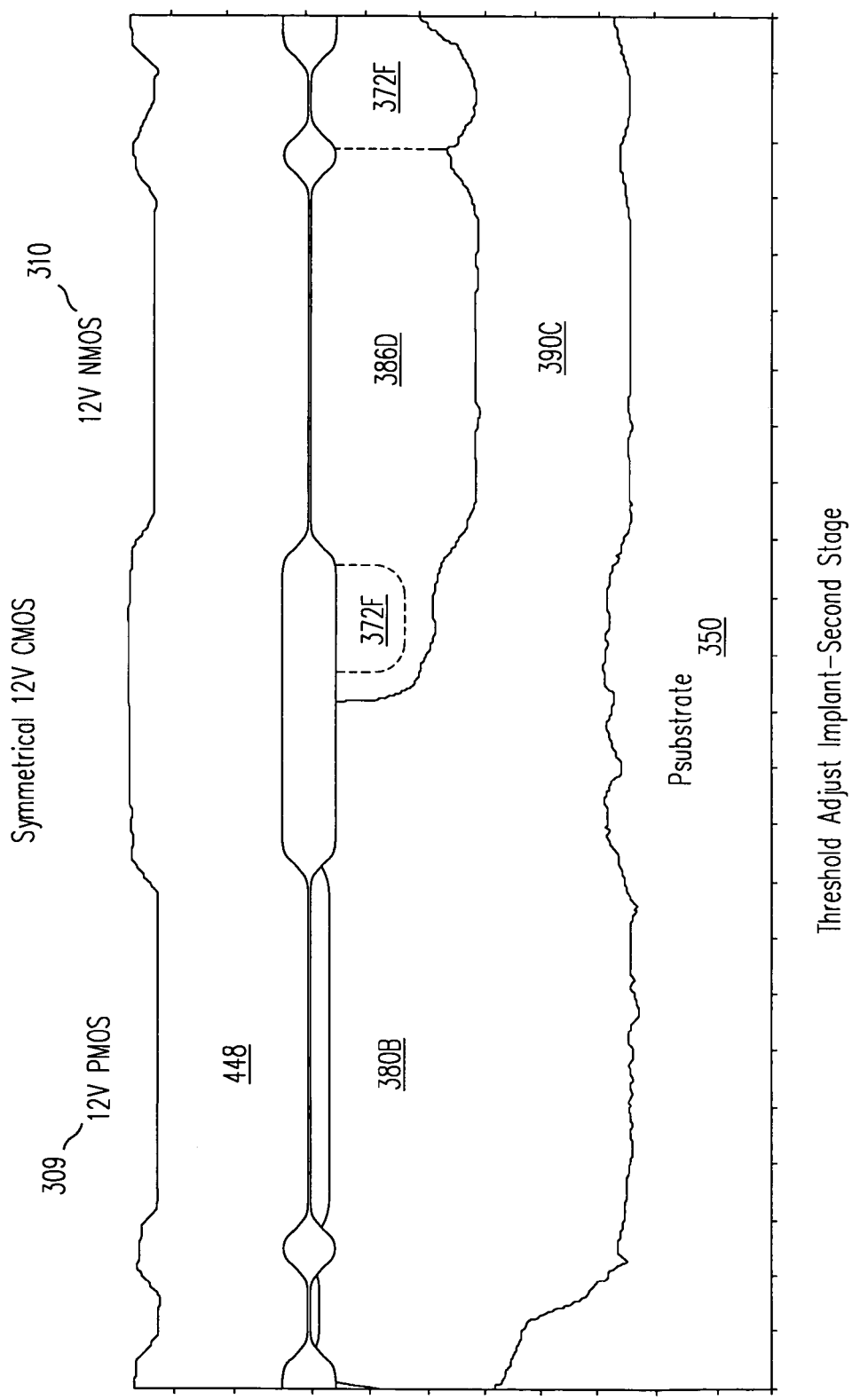

FIGS. 50A and 50E show the second stage of the threshold adjust implant and the removal of the first planar gate oxide layer.

Figure 51A:
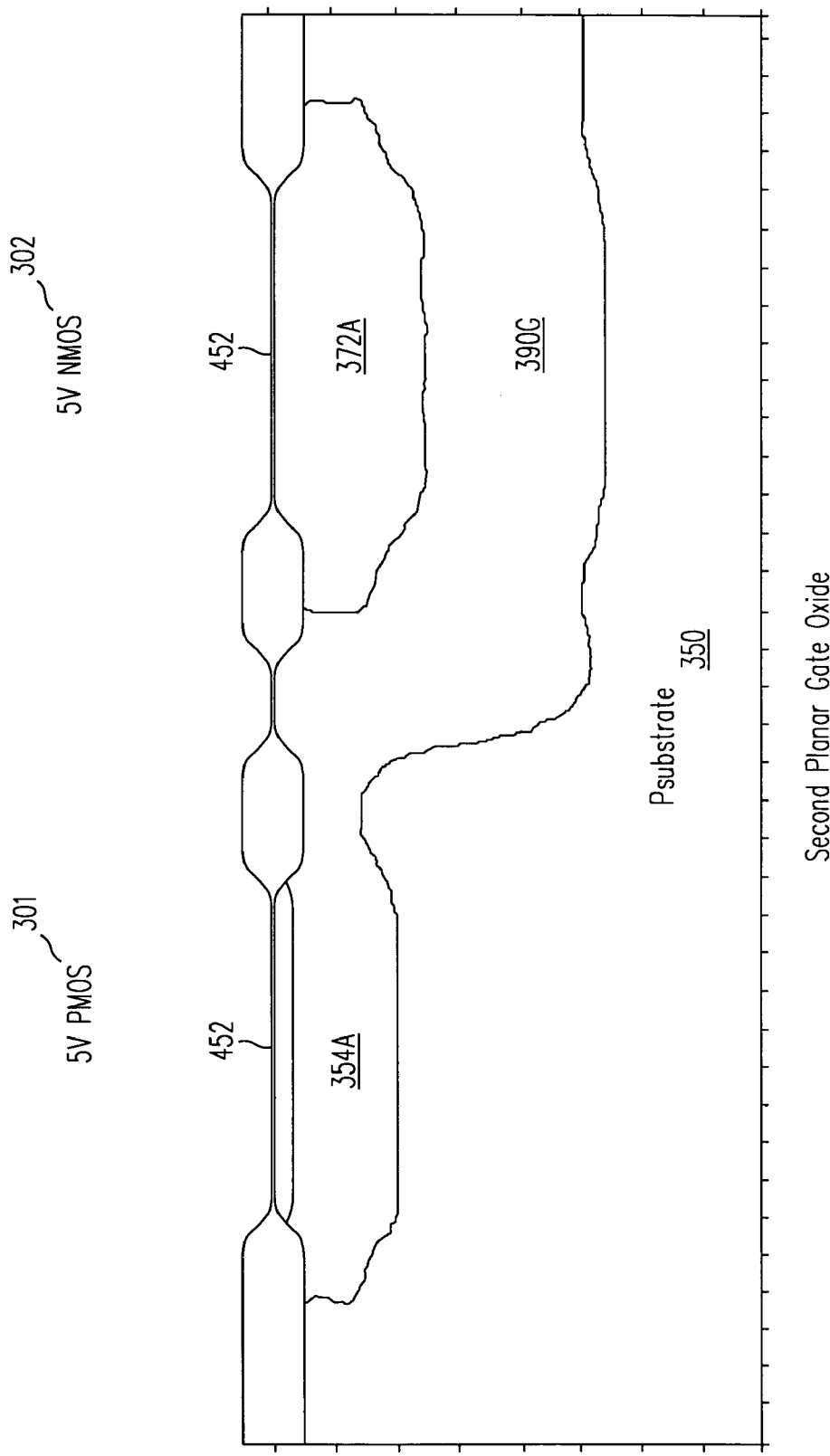
Figure 51E:
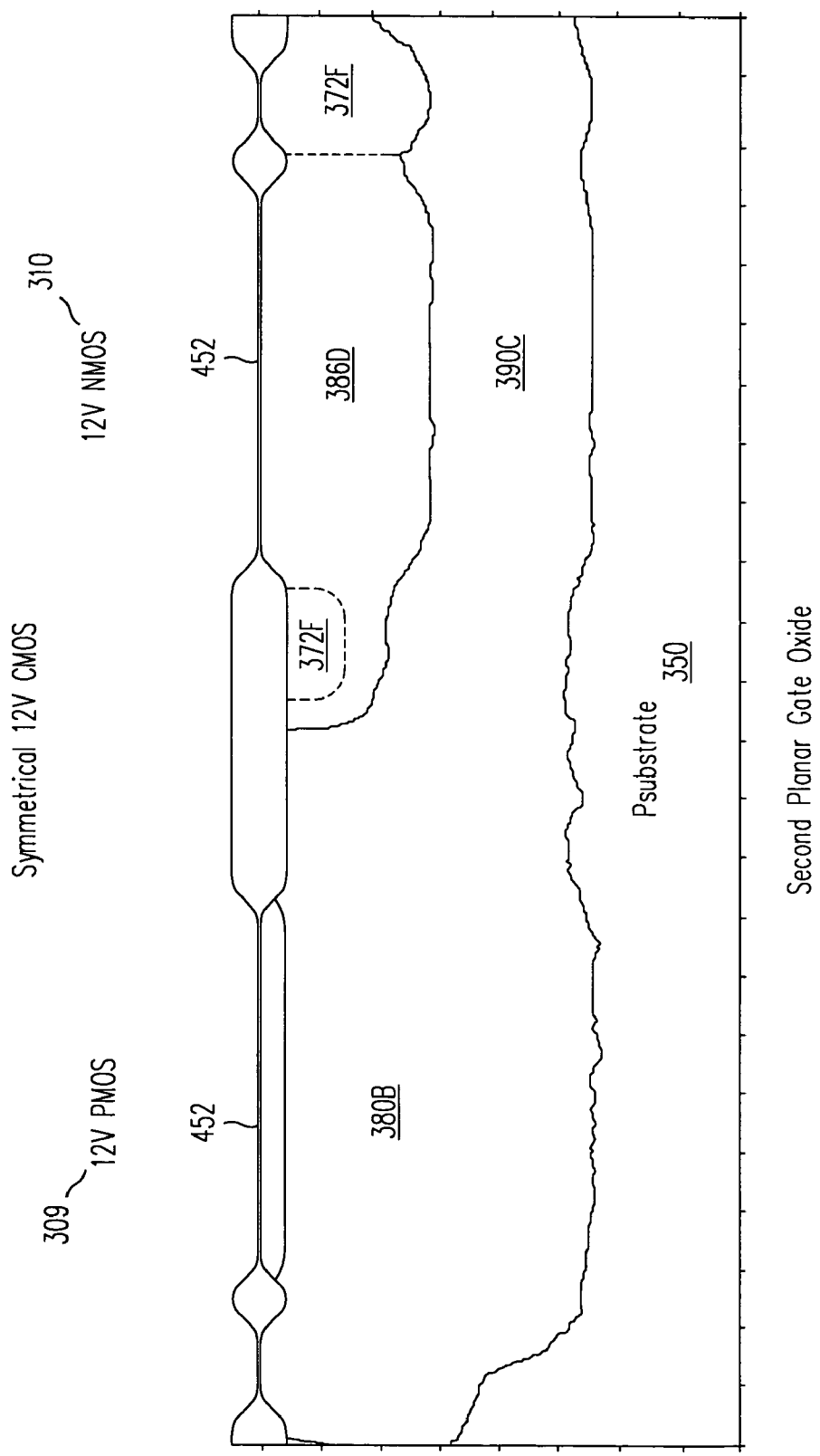

FIGS. 51A and 51E show the formation of the second gate oxide layer for the planar devices.

Figure 52A:
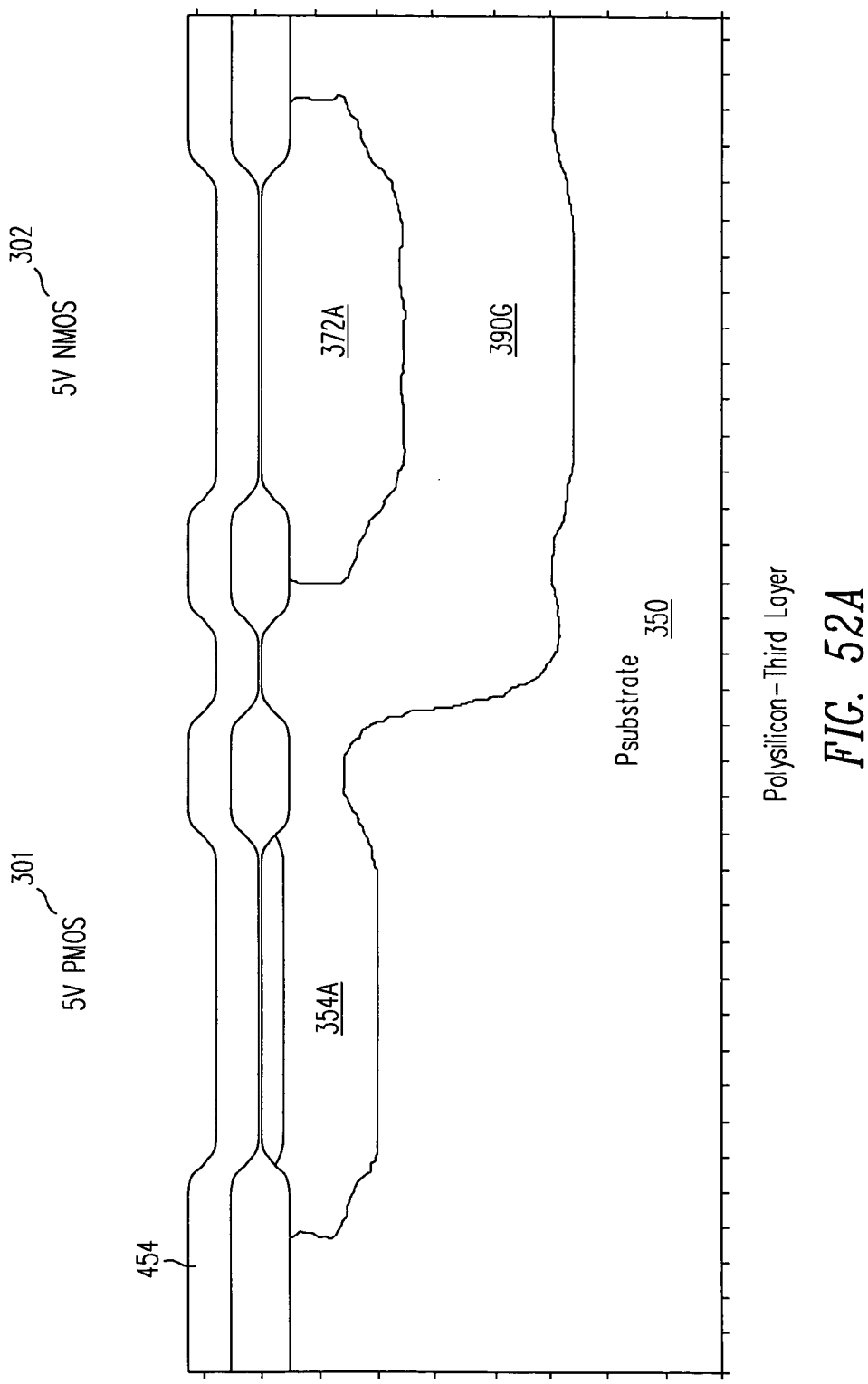
Figure 52E:
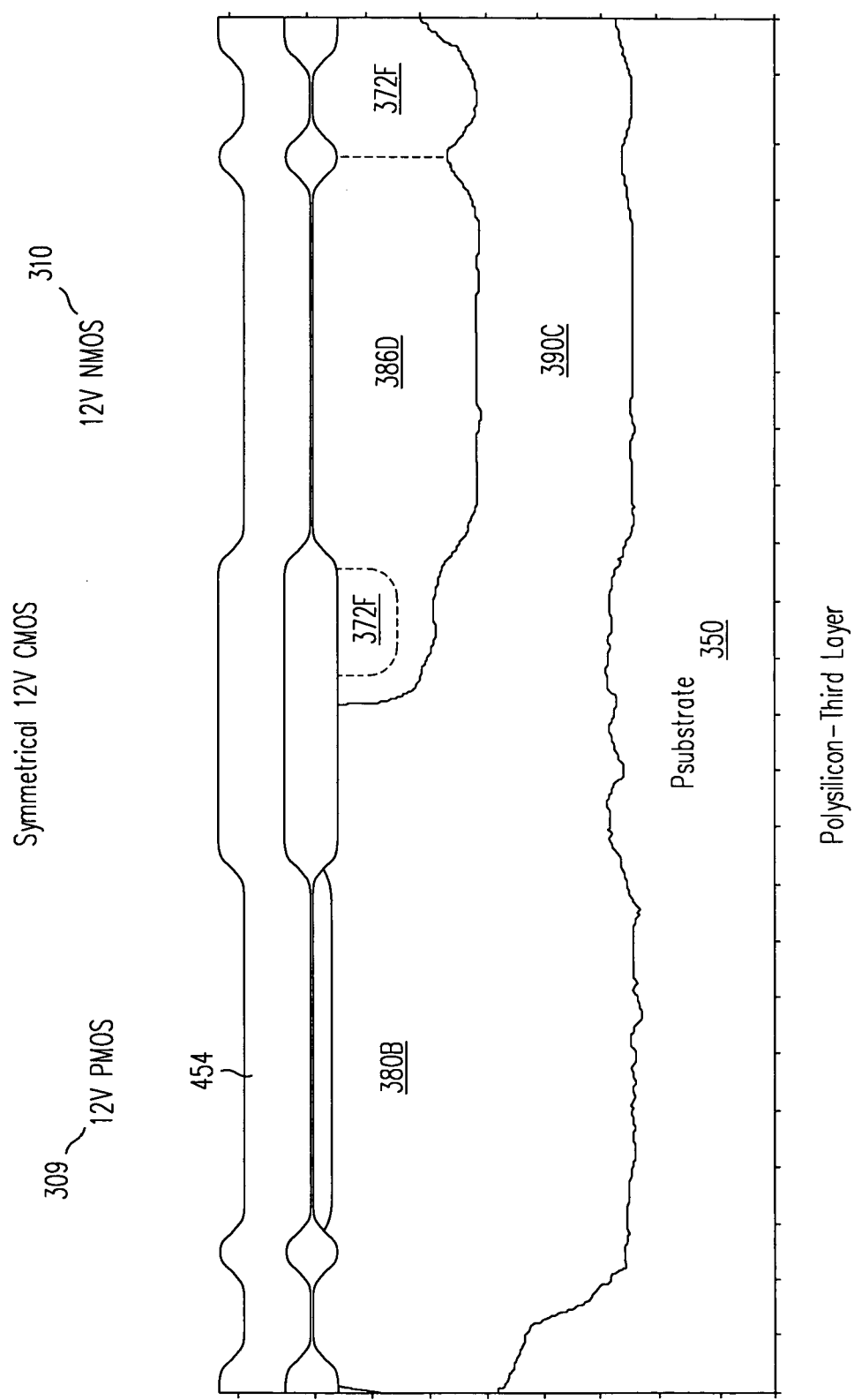

FIGS. 52A, 52D and 52E show the deposition of the third polysilicon layer.

Figure 53A:
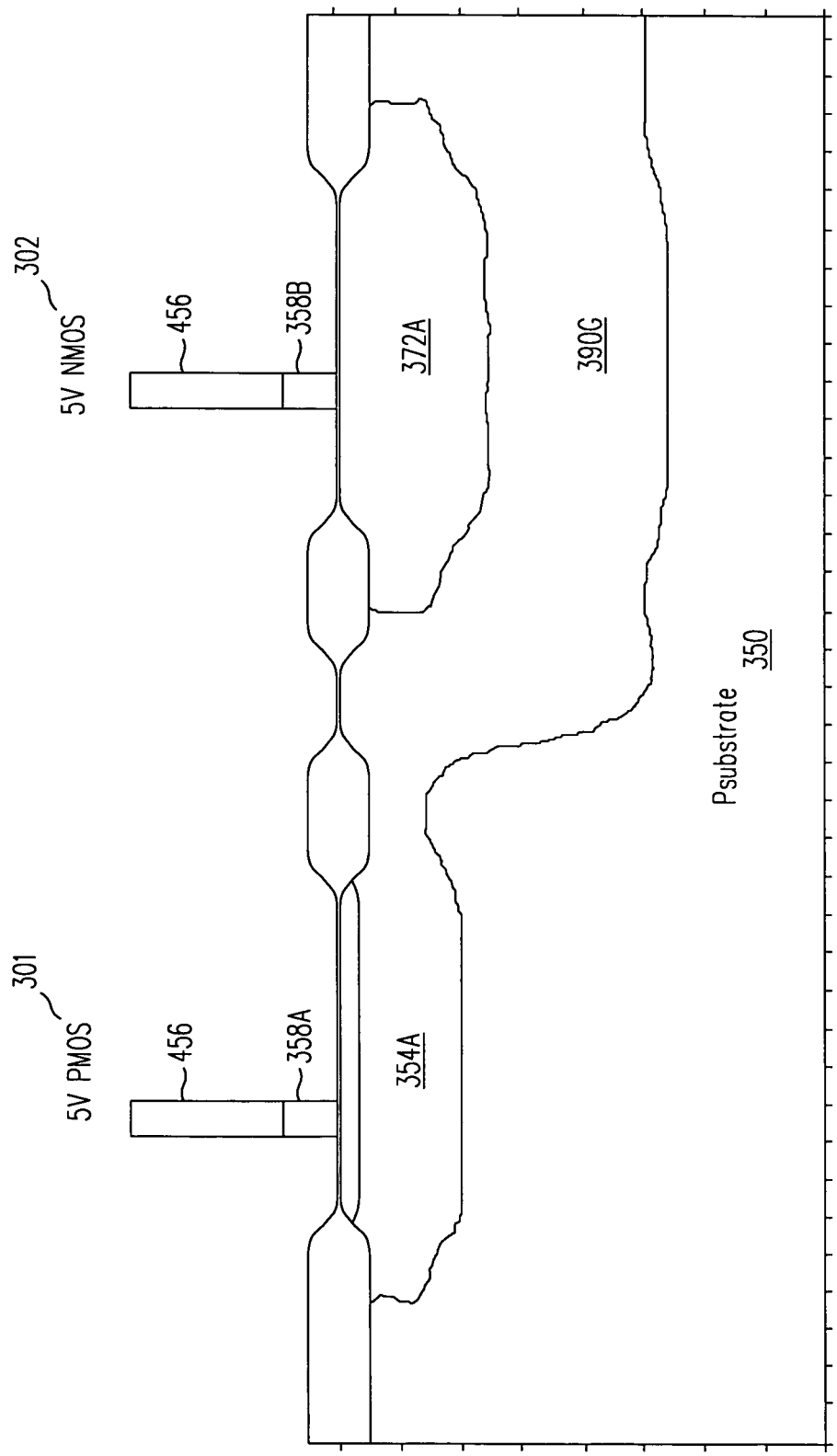
Figure 53D:
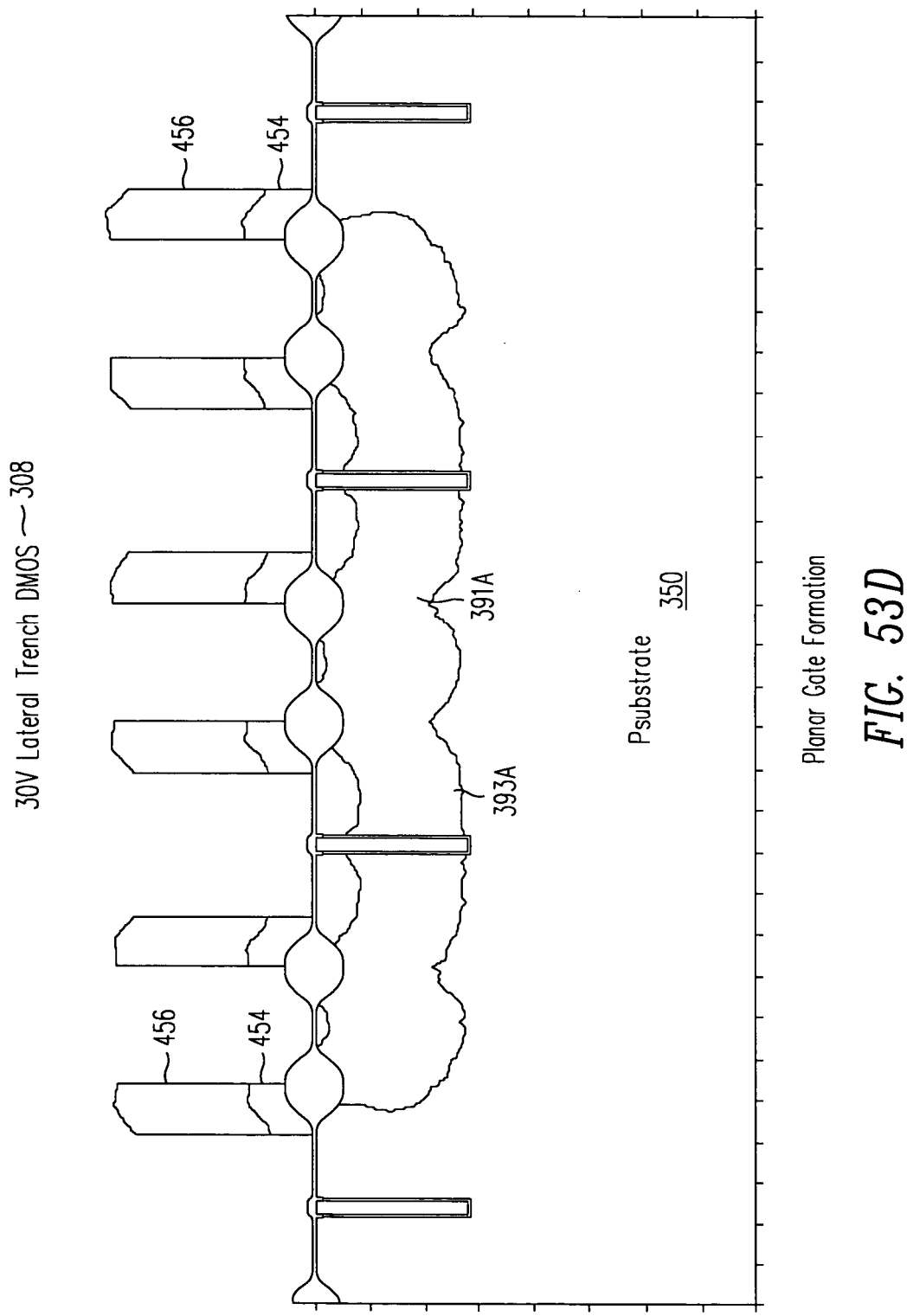
Figure 53E:
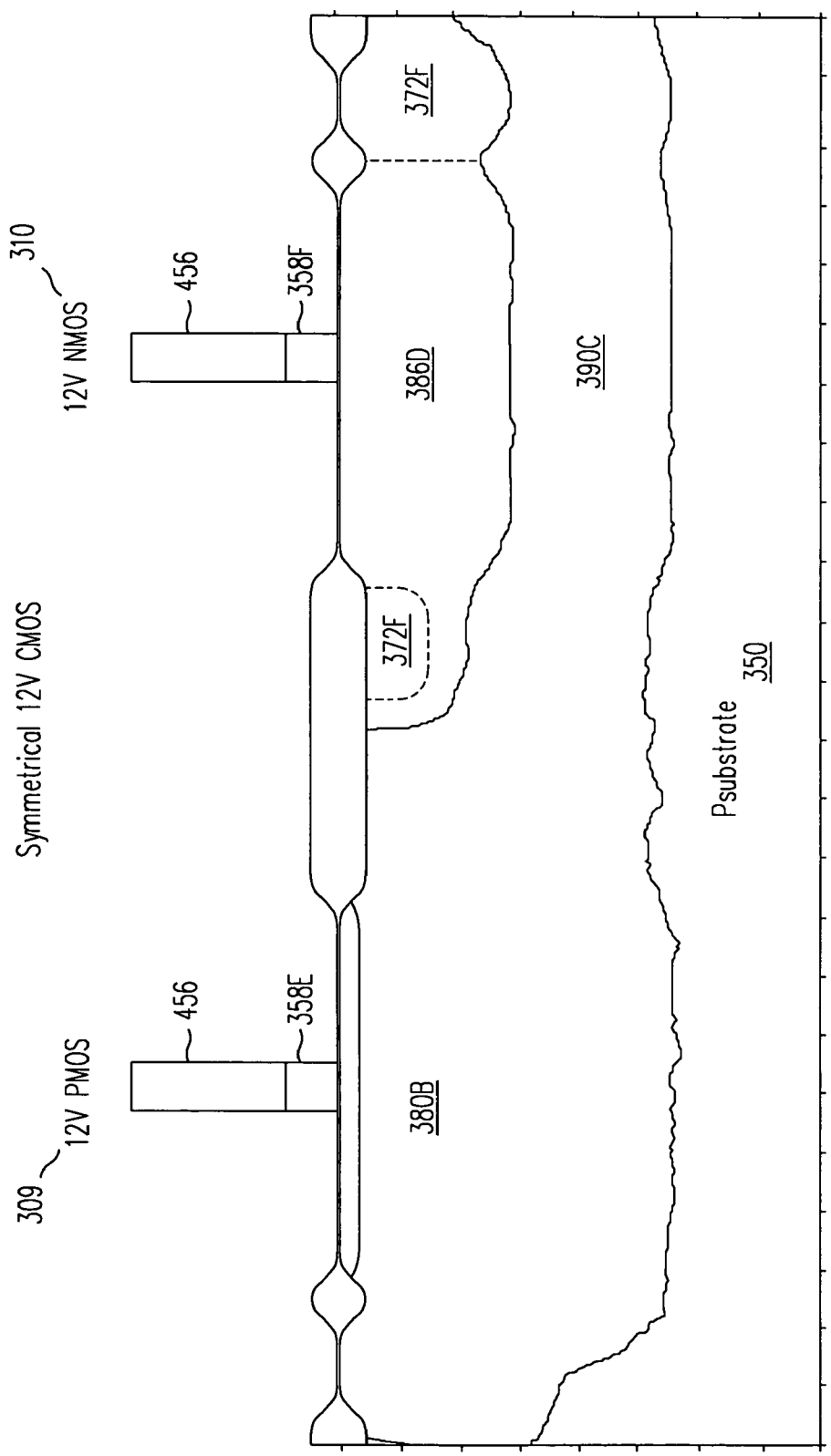
Figure 54B:
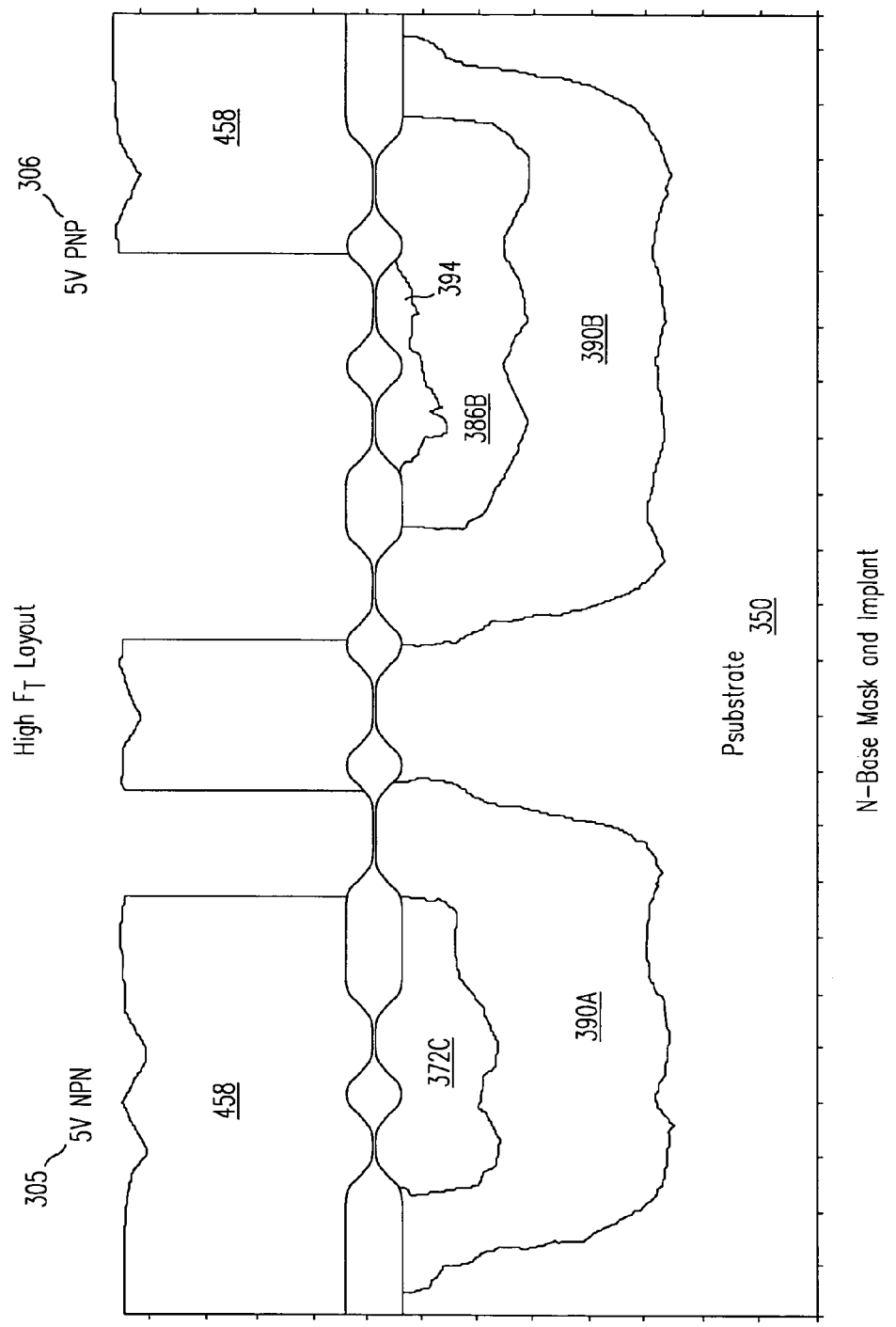
Figure 54C:
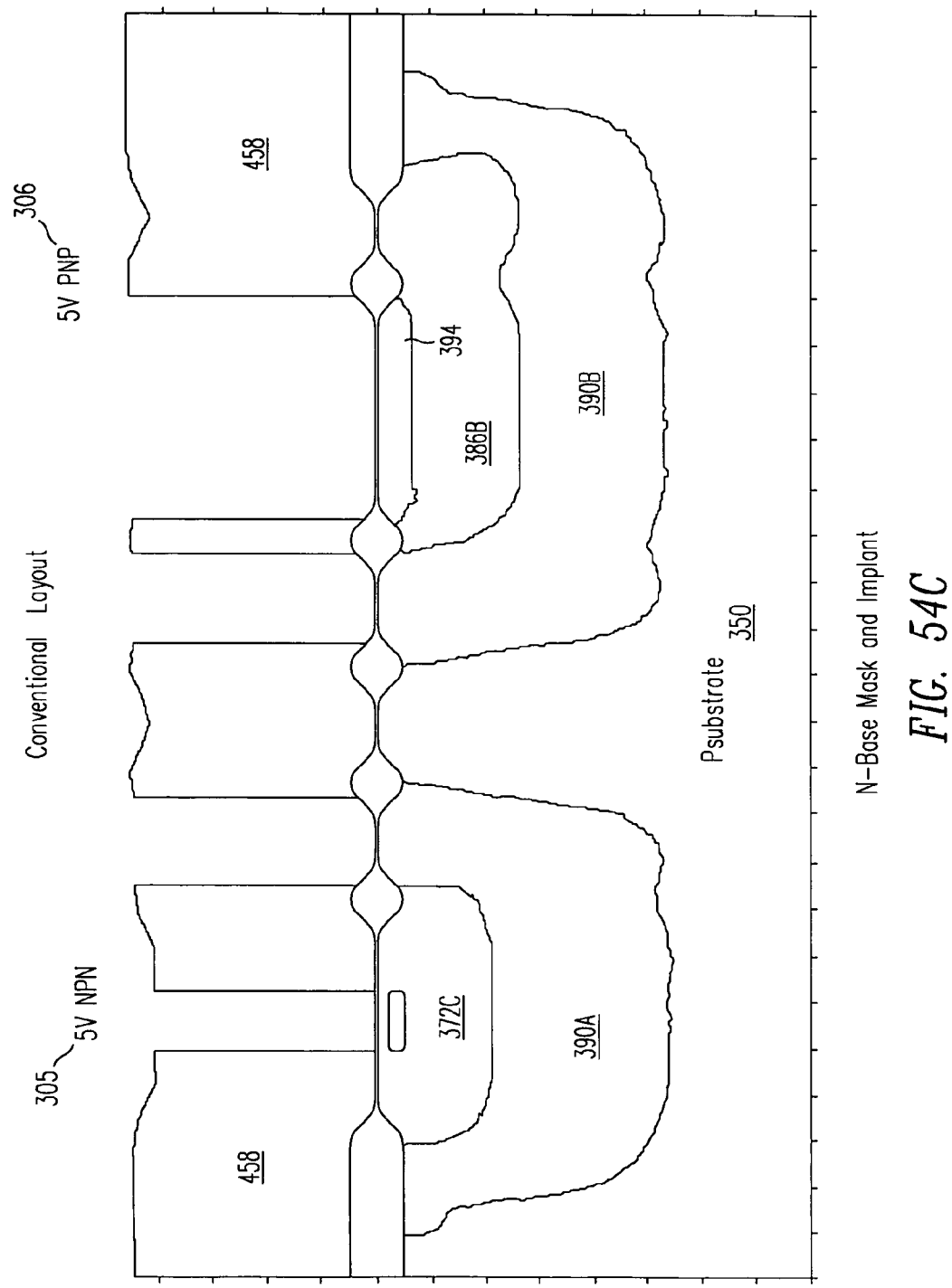
Figure 54D:
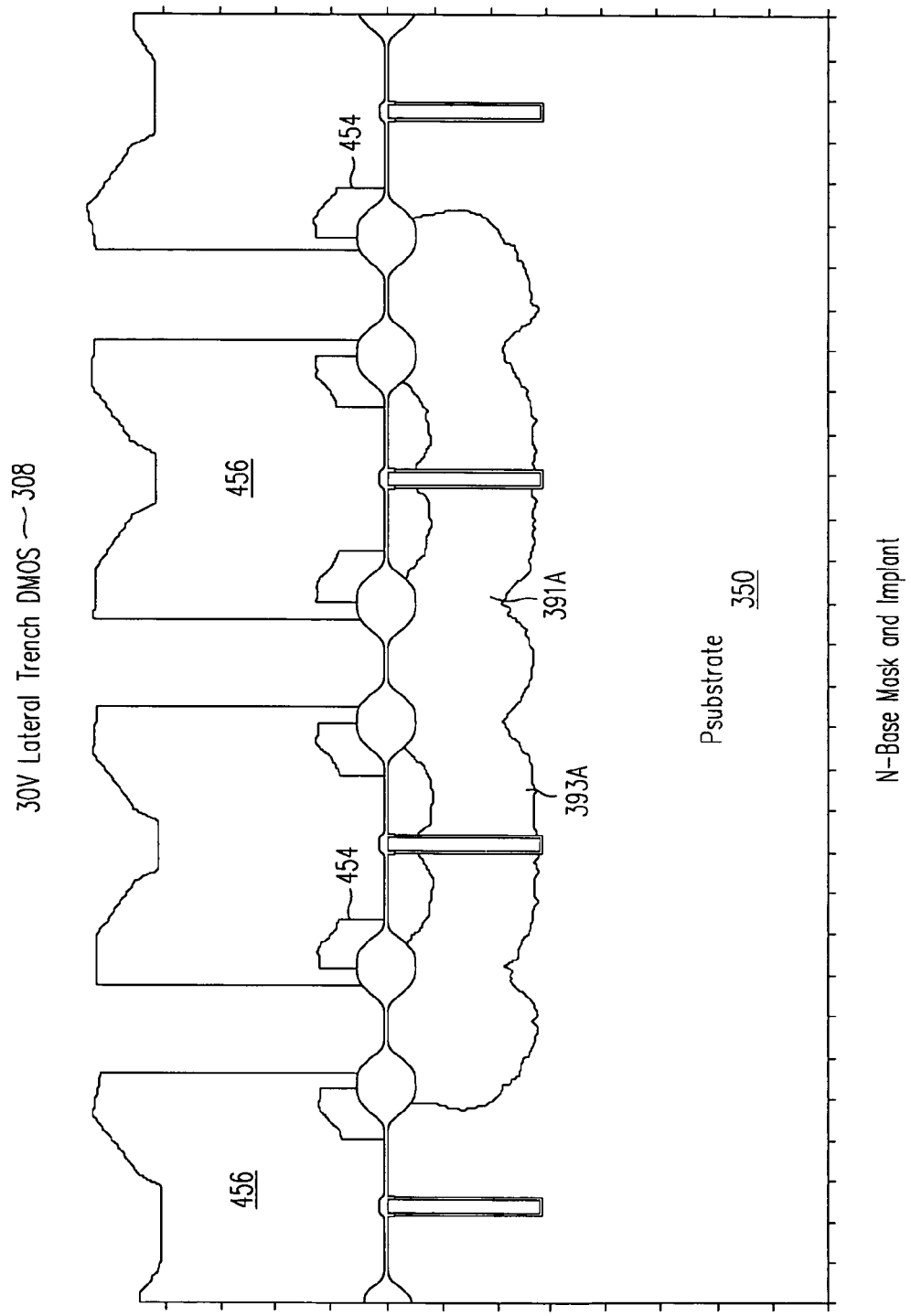
Figure 54E:
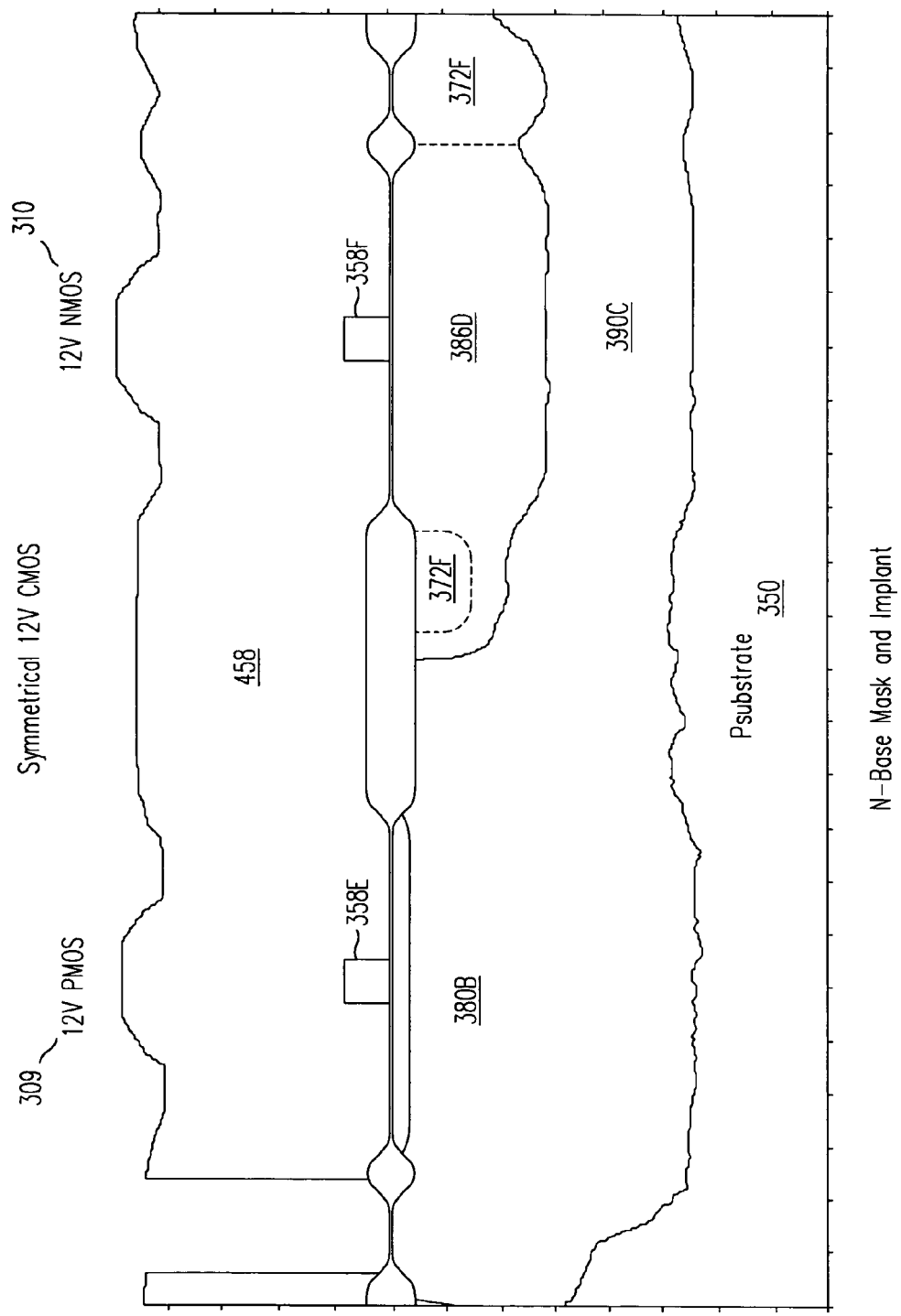

FIGS. 53A, 53D and 53E show the formation of the gates of the planar devices.

FIGS. 54A–54E show the formation of N-base mask and implanting of the N-base regions.

Figure 55D:
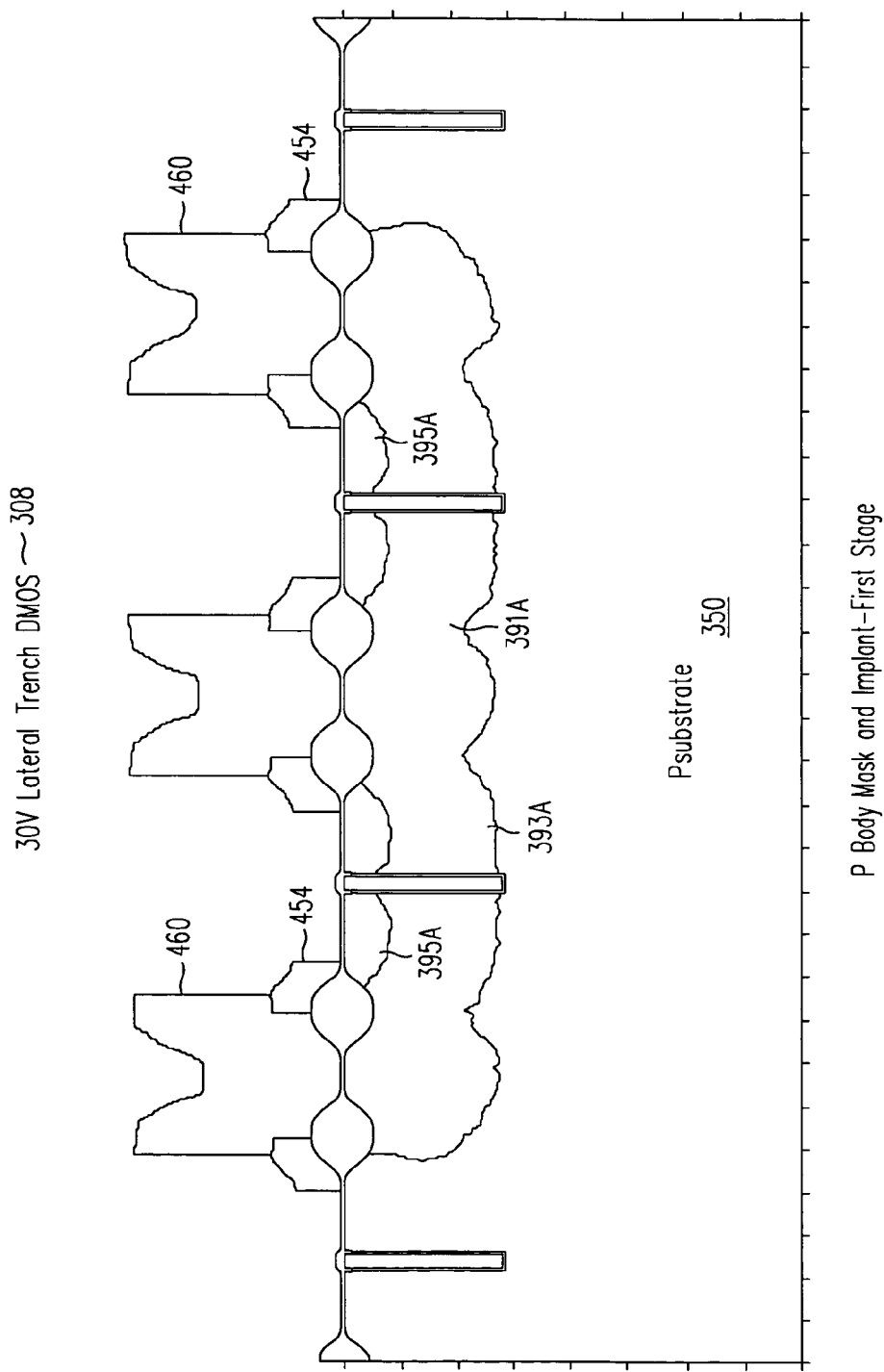

FIG. 55D shows the formation of the P body mask and the first stage of the implanting of the P body regions.

Figure 56D:
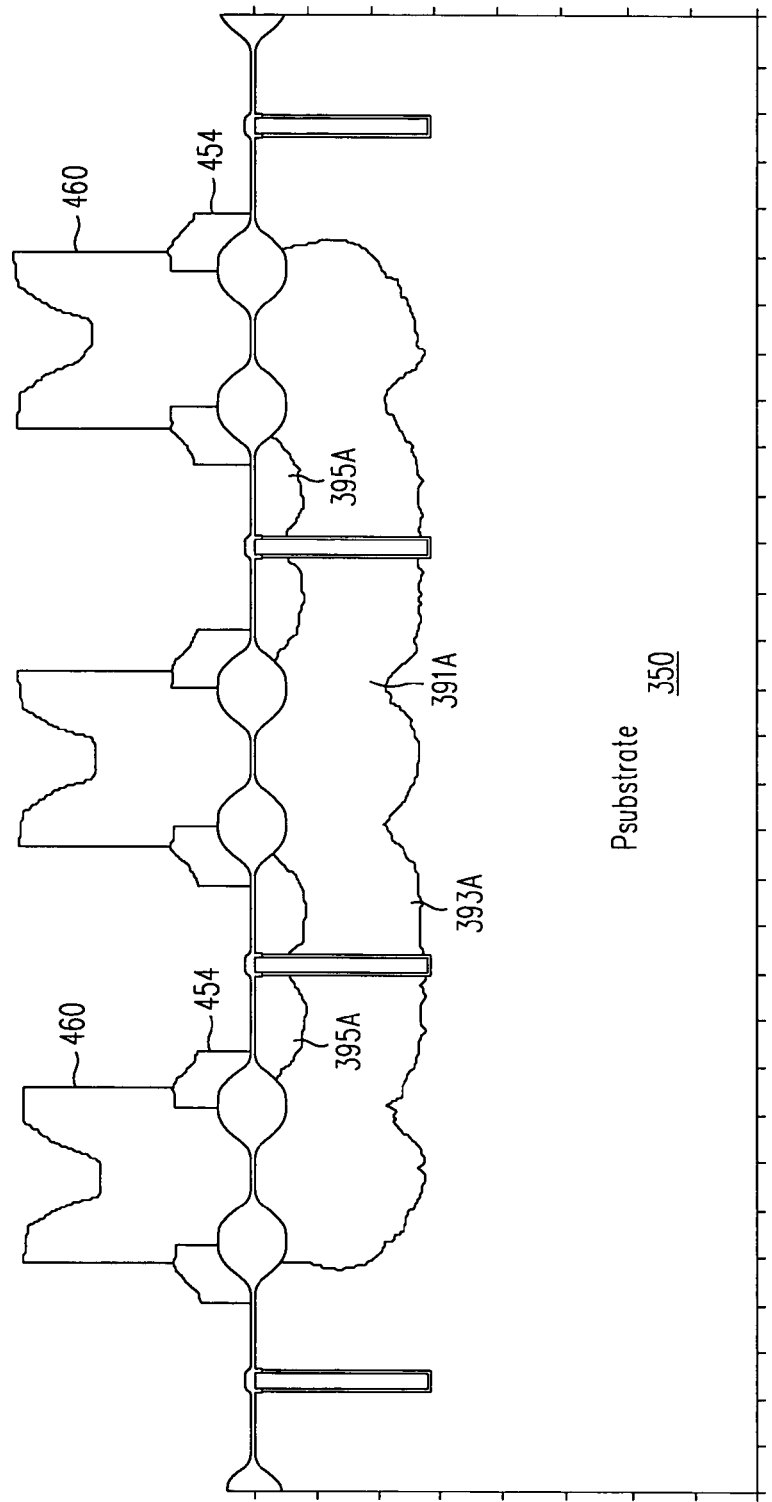

FIG. 56D shows the second stage of the implanting of the P body regions.

Figure 57E:
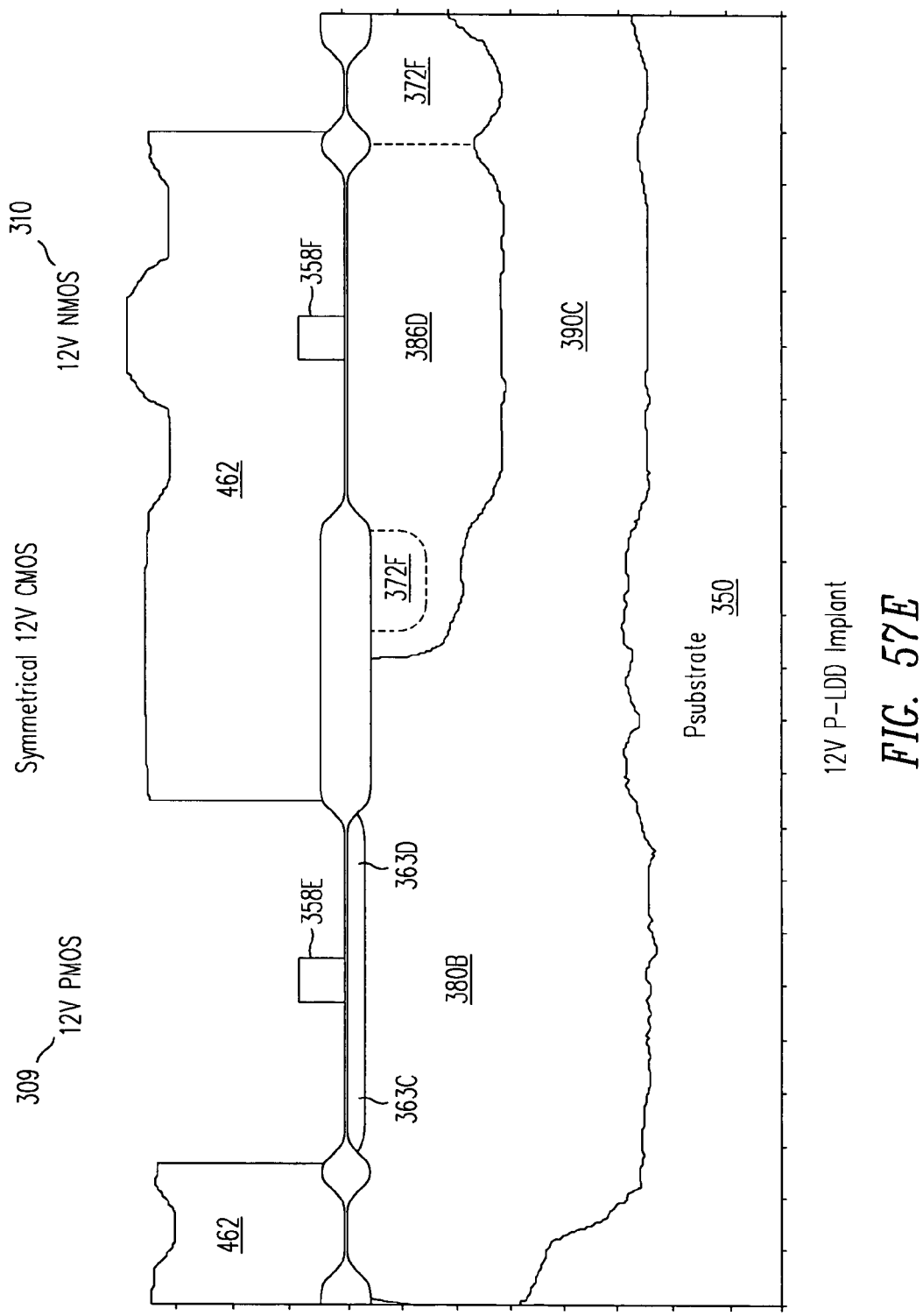

FIG. 57E shows the masking and implanting of the P lightly-doped drain (P-LDD) regions for the 12V devices.

Figure 58E:
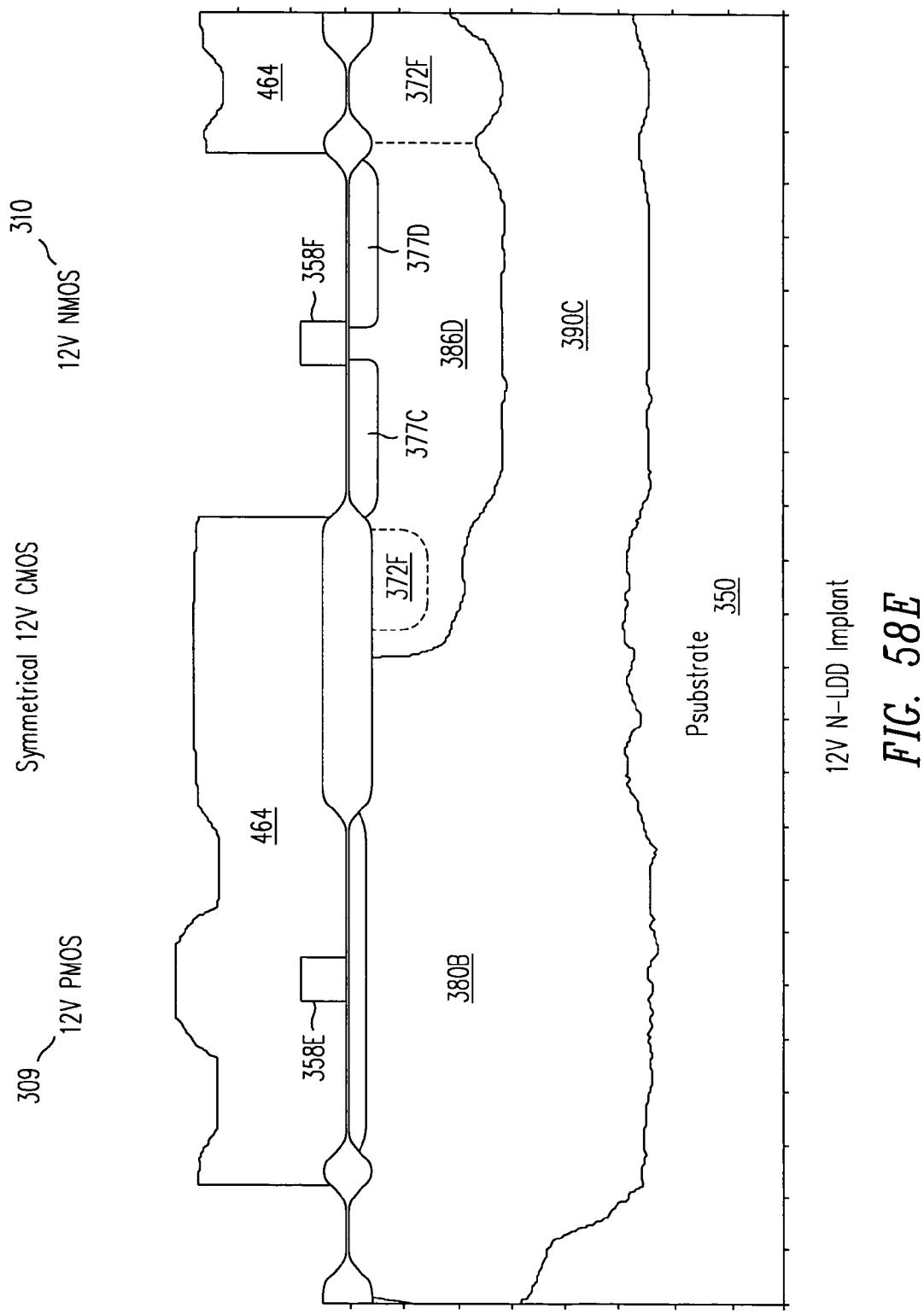
Figure 59A:
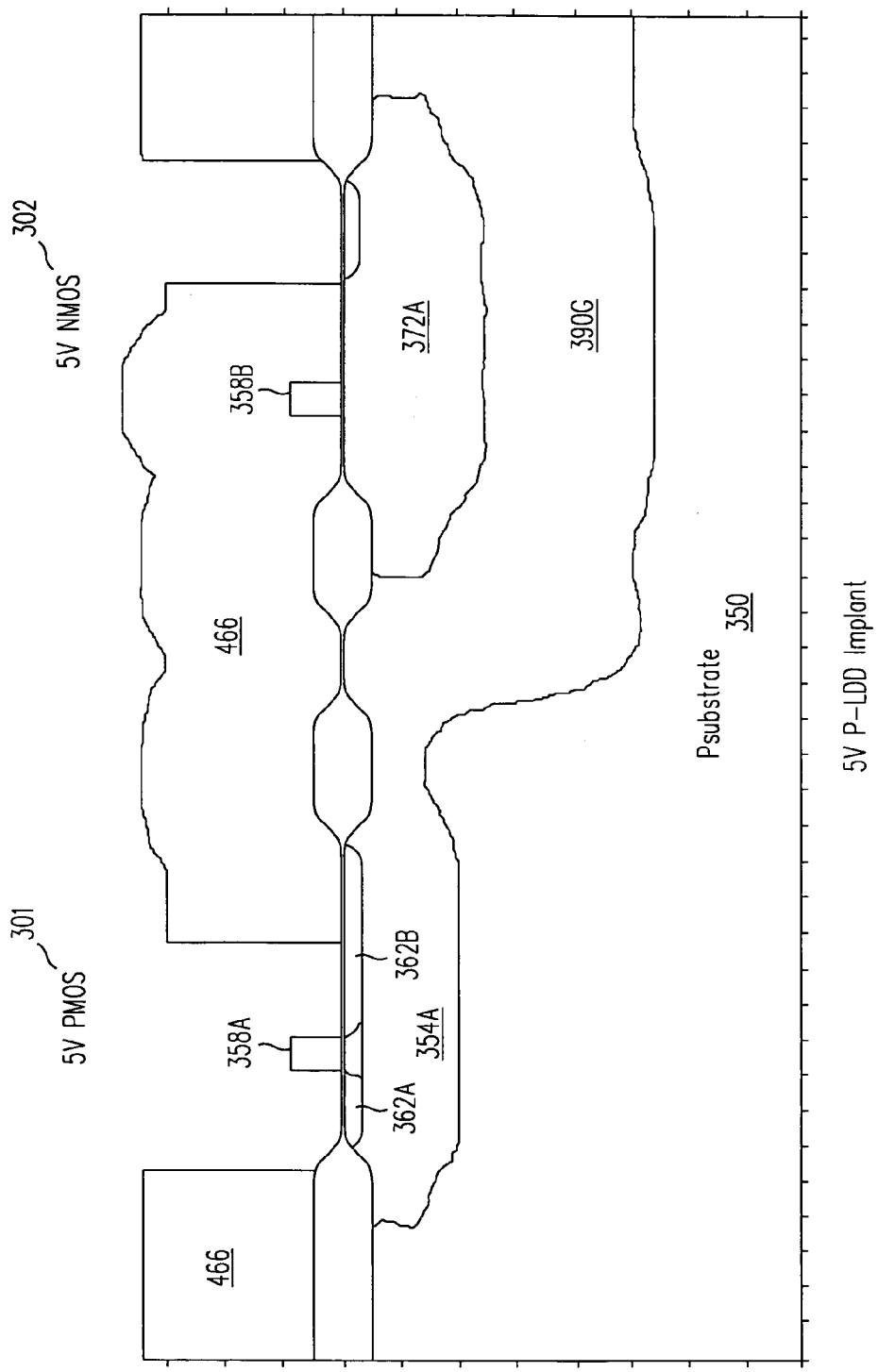
Figure 59B:
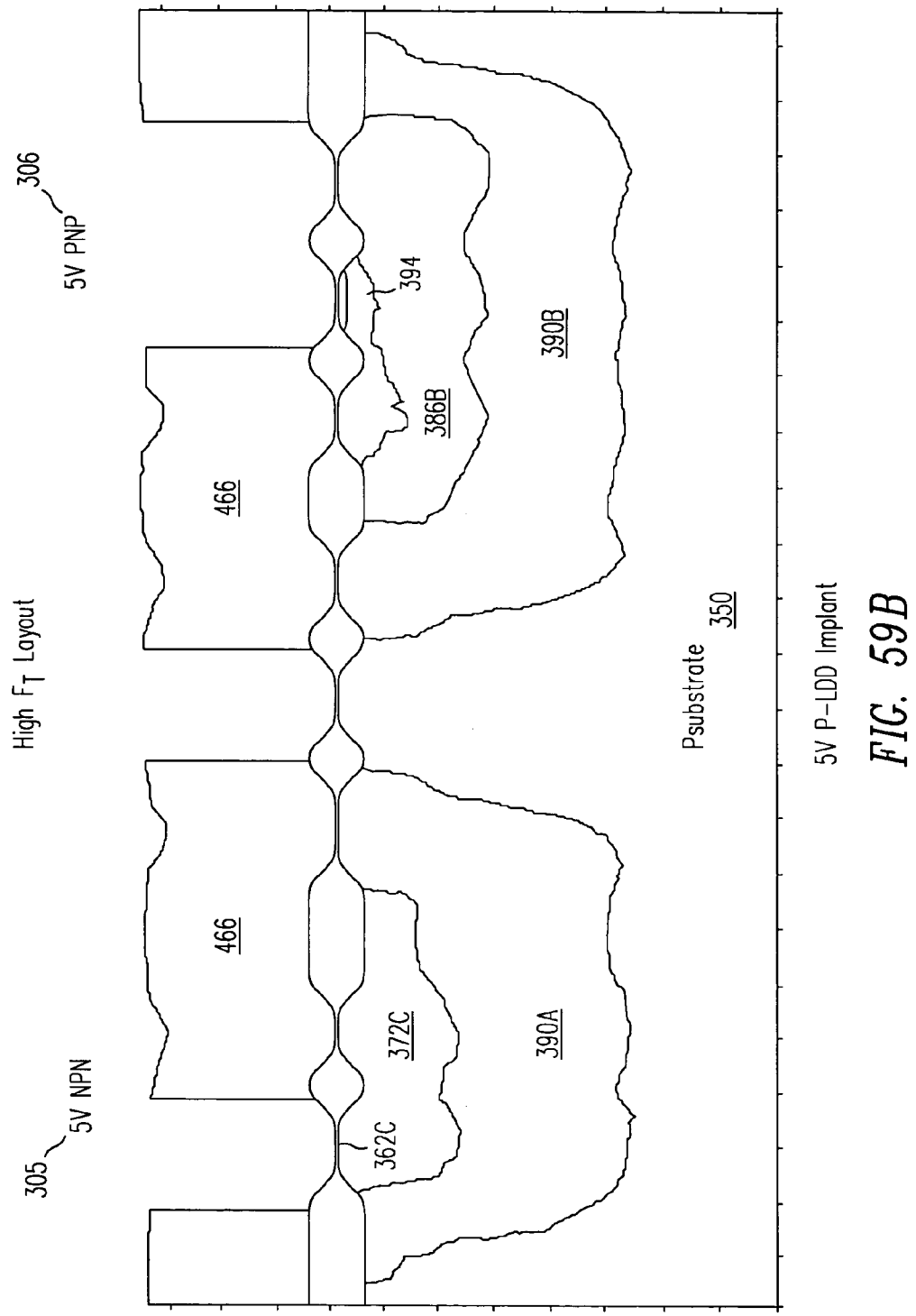
Figure 59C:
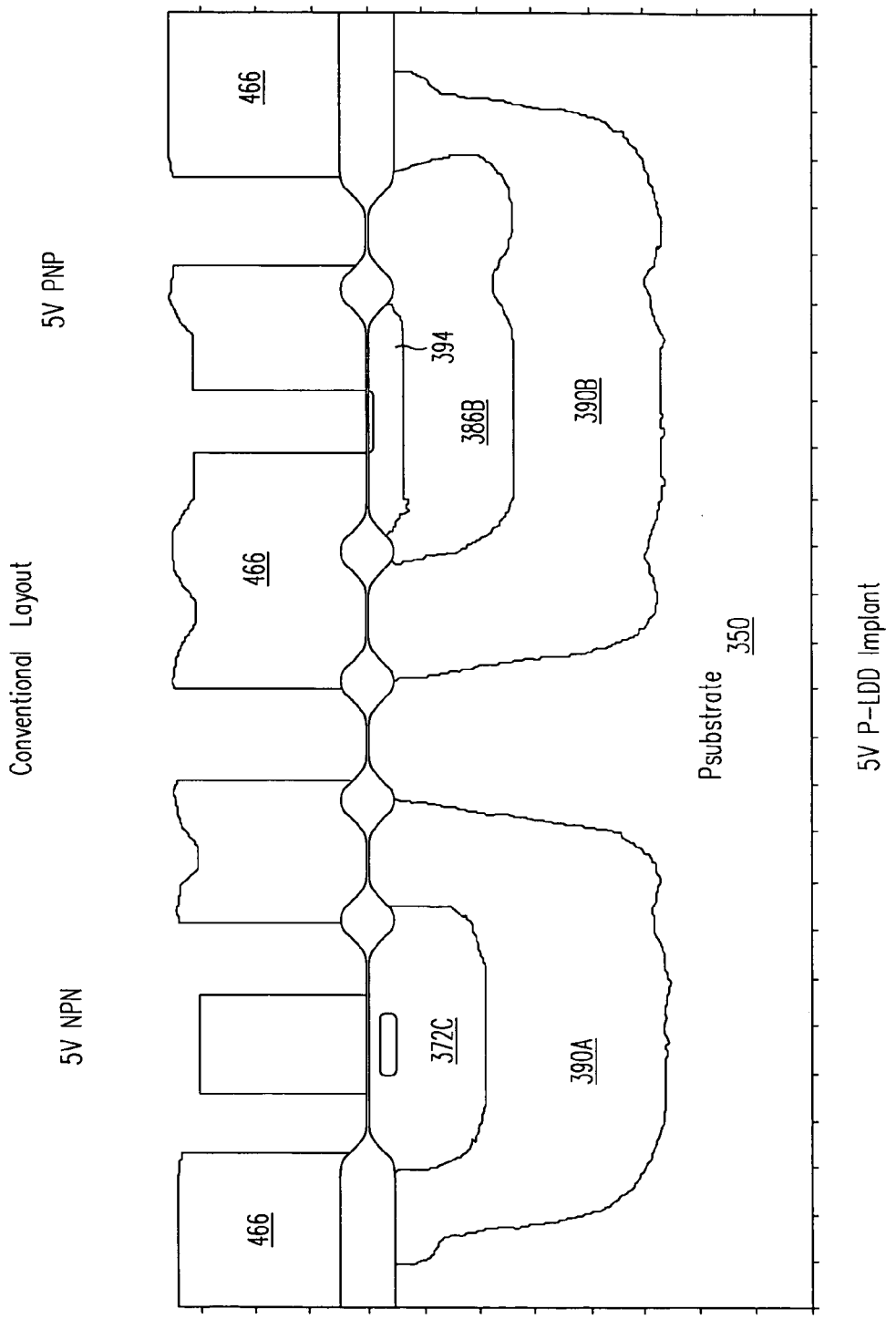
Figure 59D:
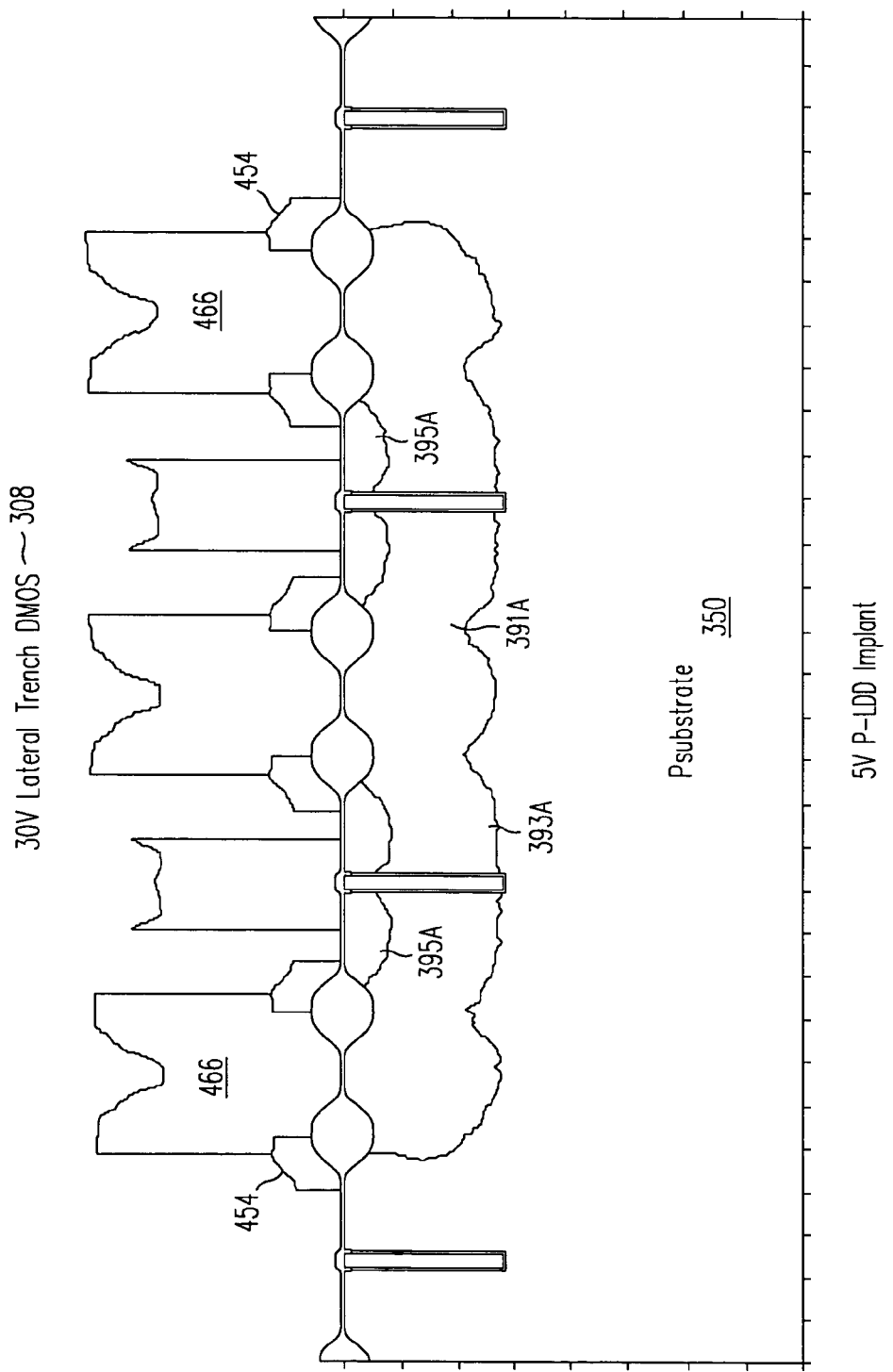
Figure 60A:
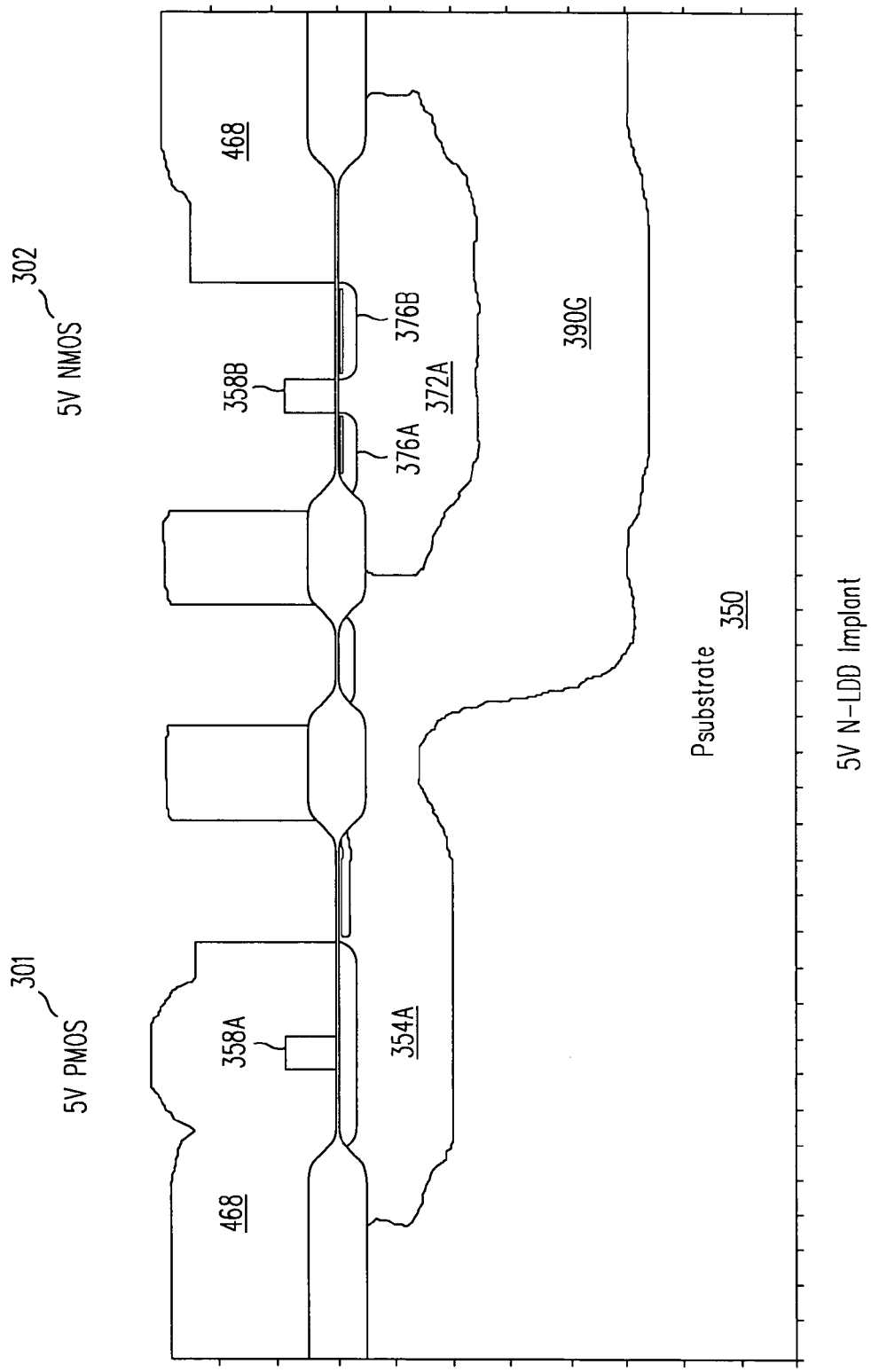
Figure 60B:
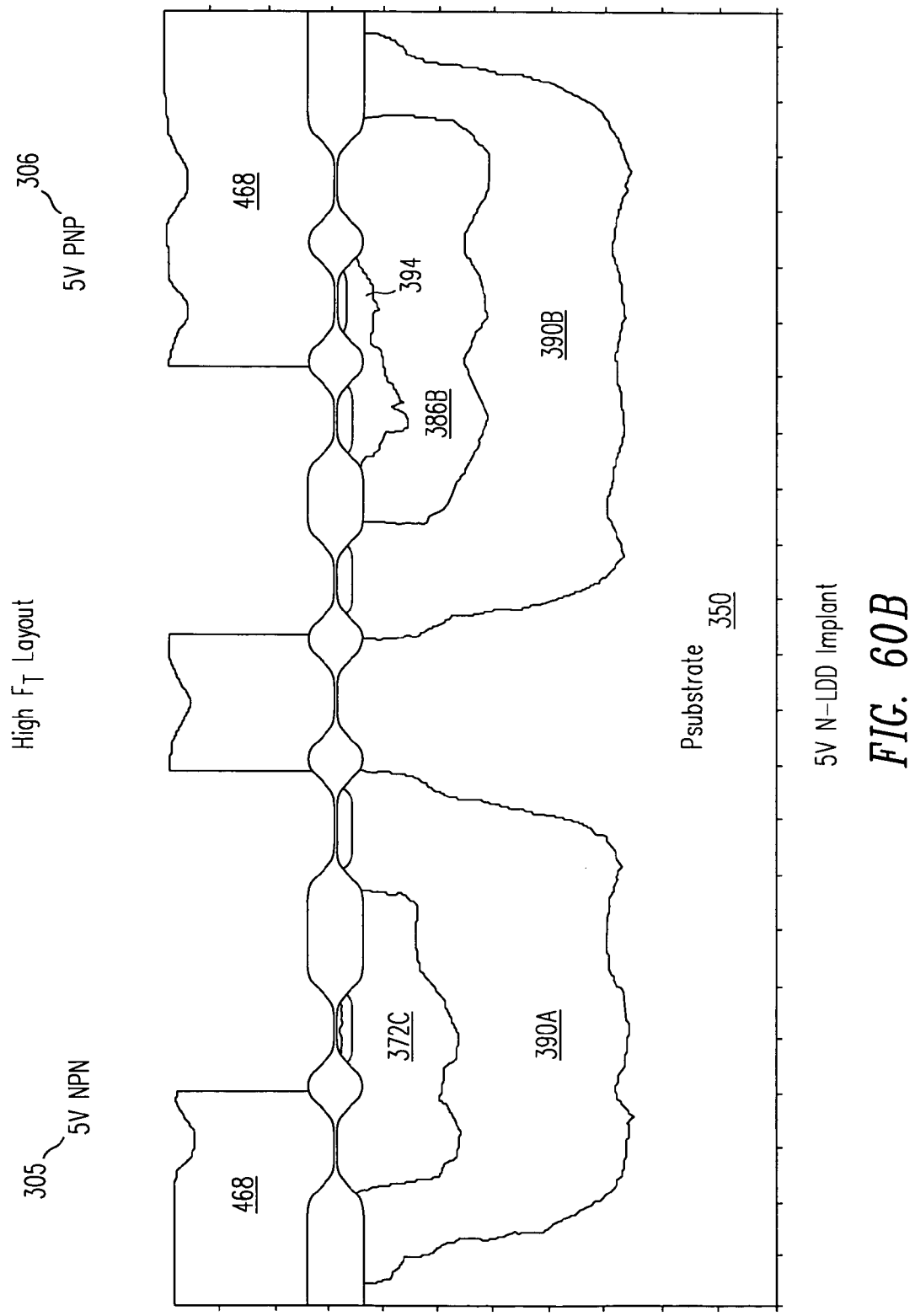
Figure 60C:
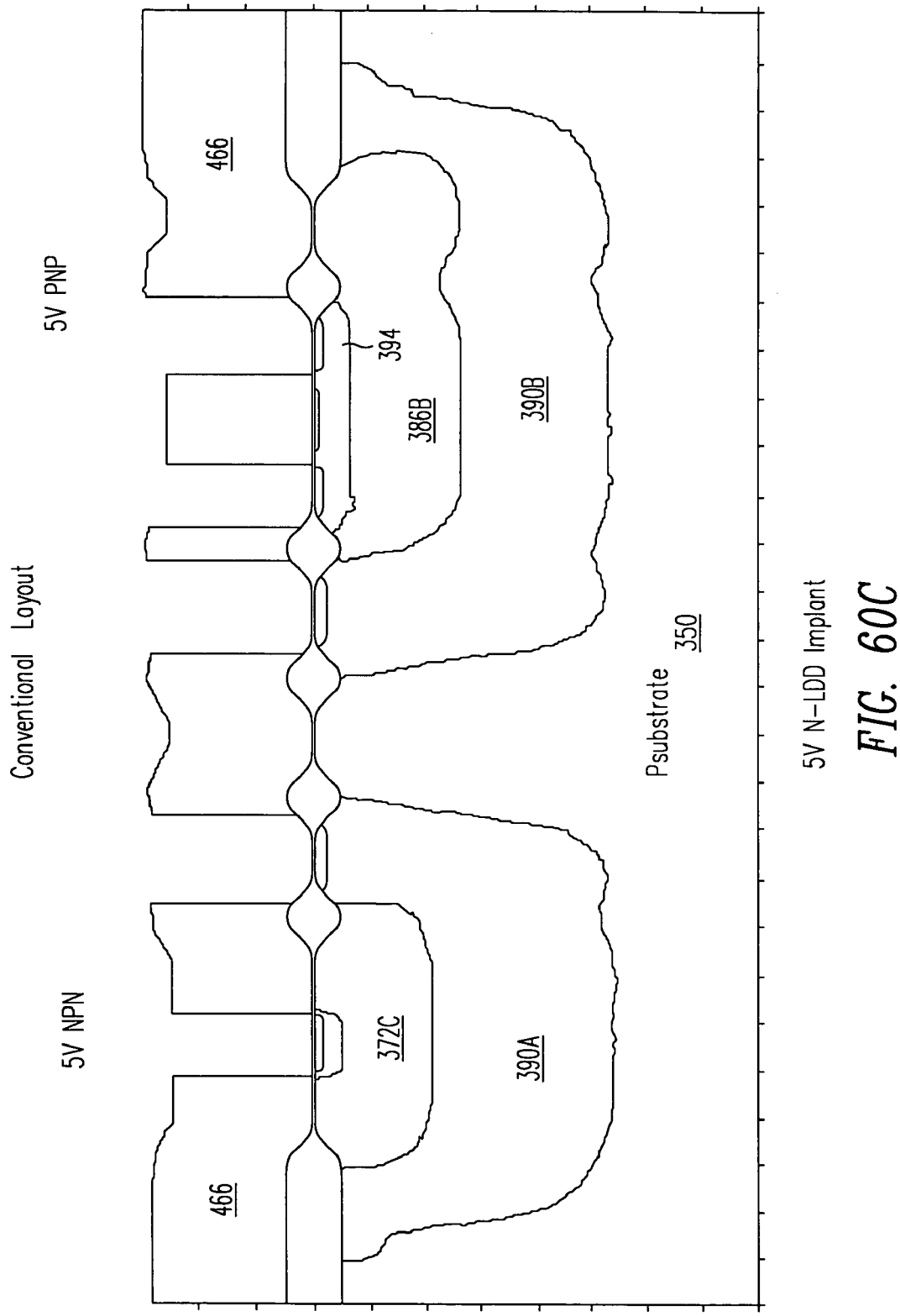
Figure 60D:
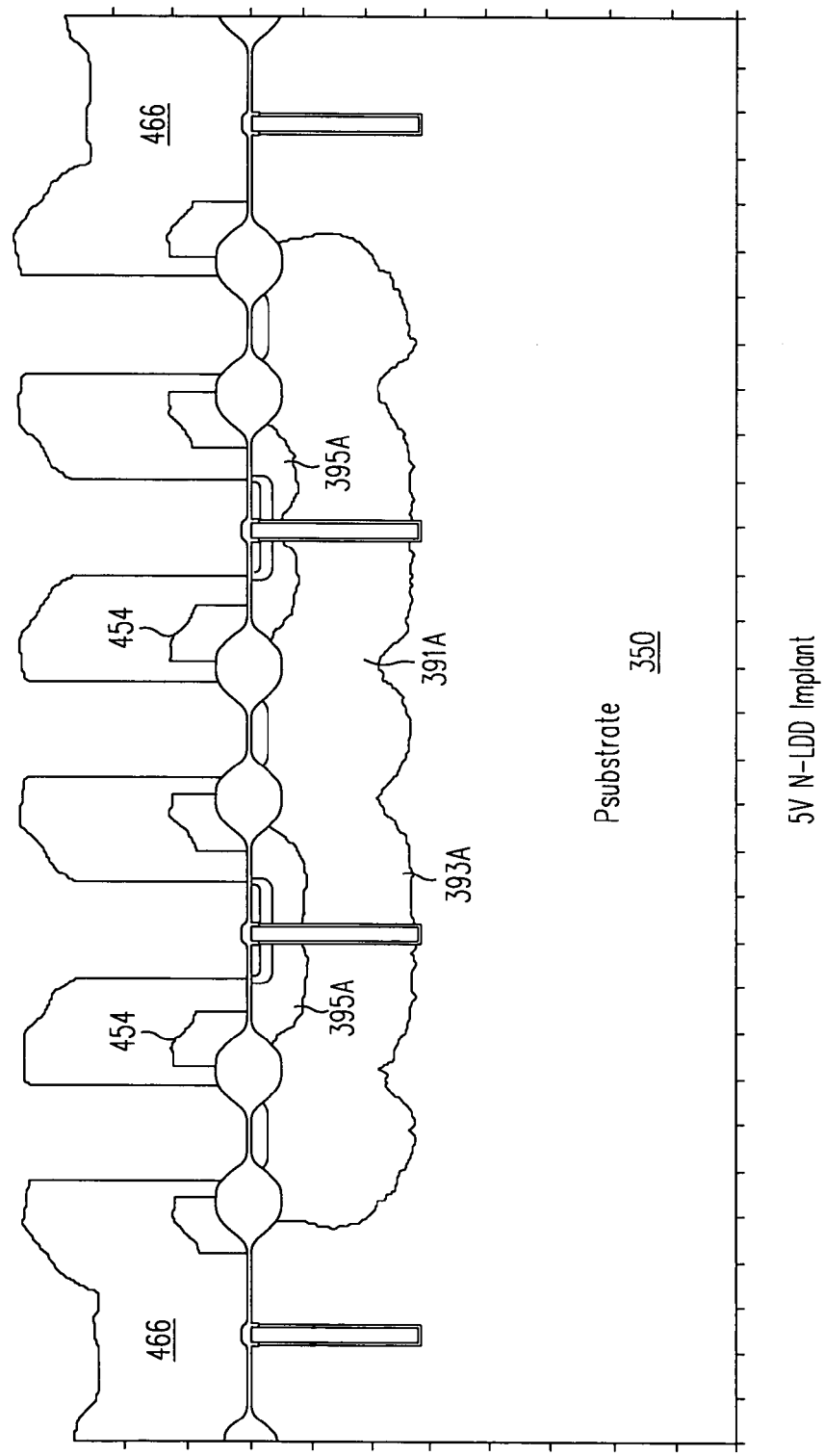

FIG. 58E shows the masking and implanting of the N lightly-doped drain (N-LDD) regions for the 12V devices.

FIGS. 59A–59D show the masking and implanting of the P lightly-doped drain (P-LDD) regions for the 5V devices.

FIGS. 60A–60D show the masking and implanting of the N lightly-doped drain (N-LDD) regions for the 5V devices.

Figure 61A:
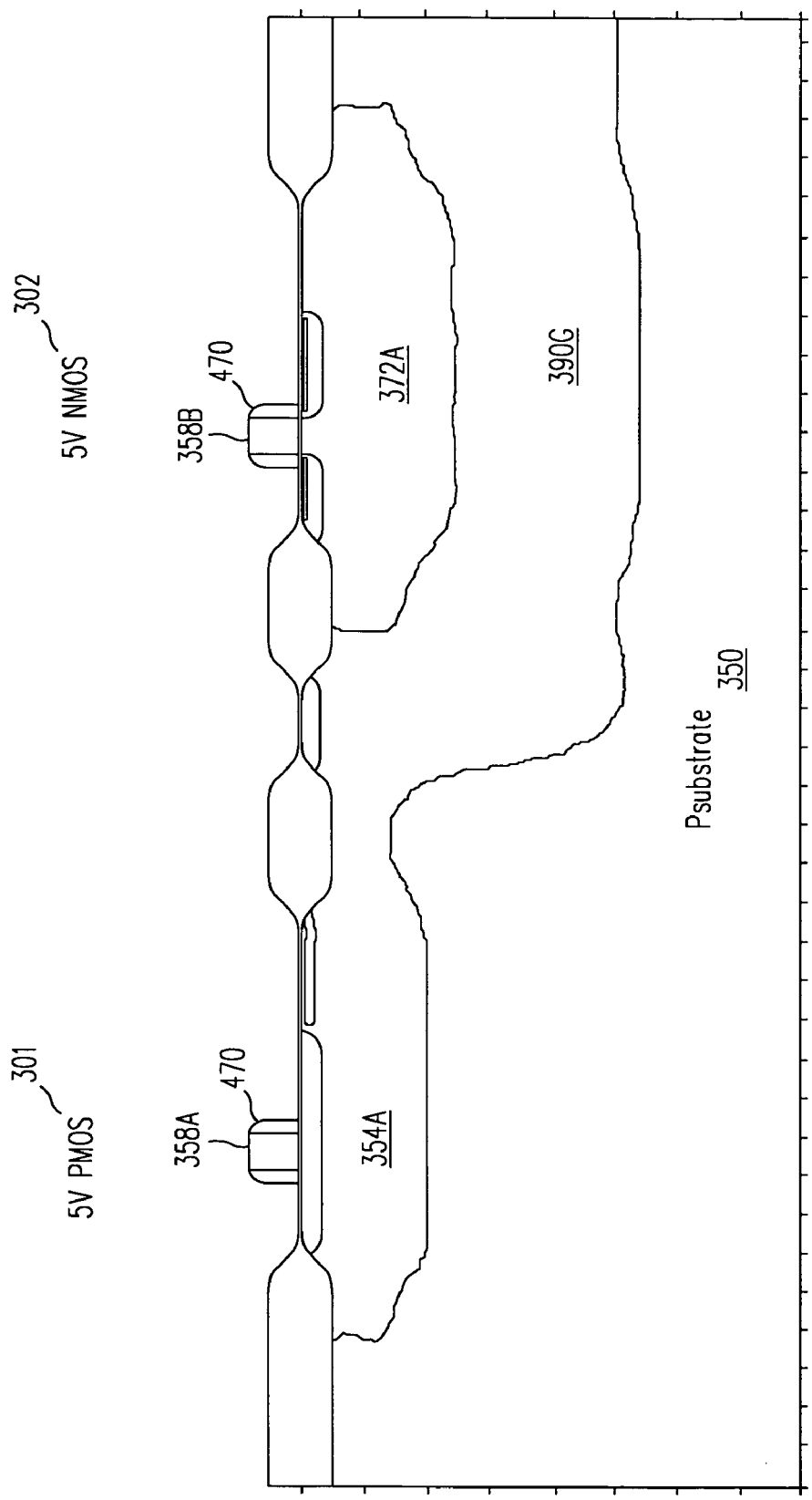
Figure 61D:
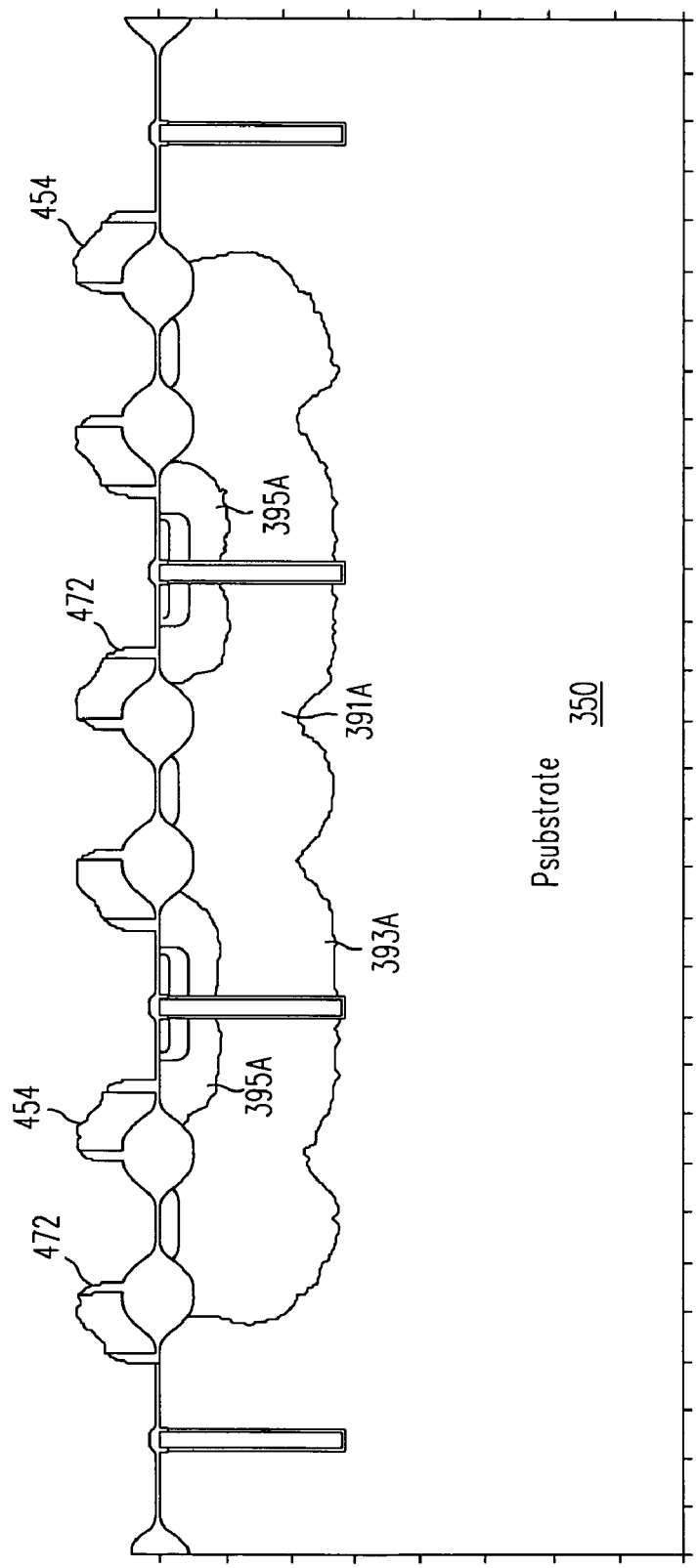
Figure 61E:
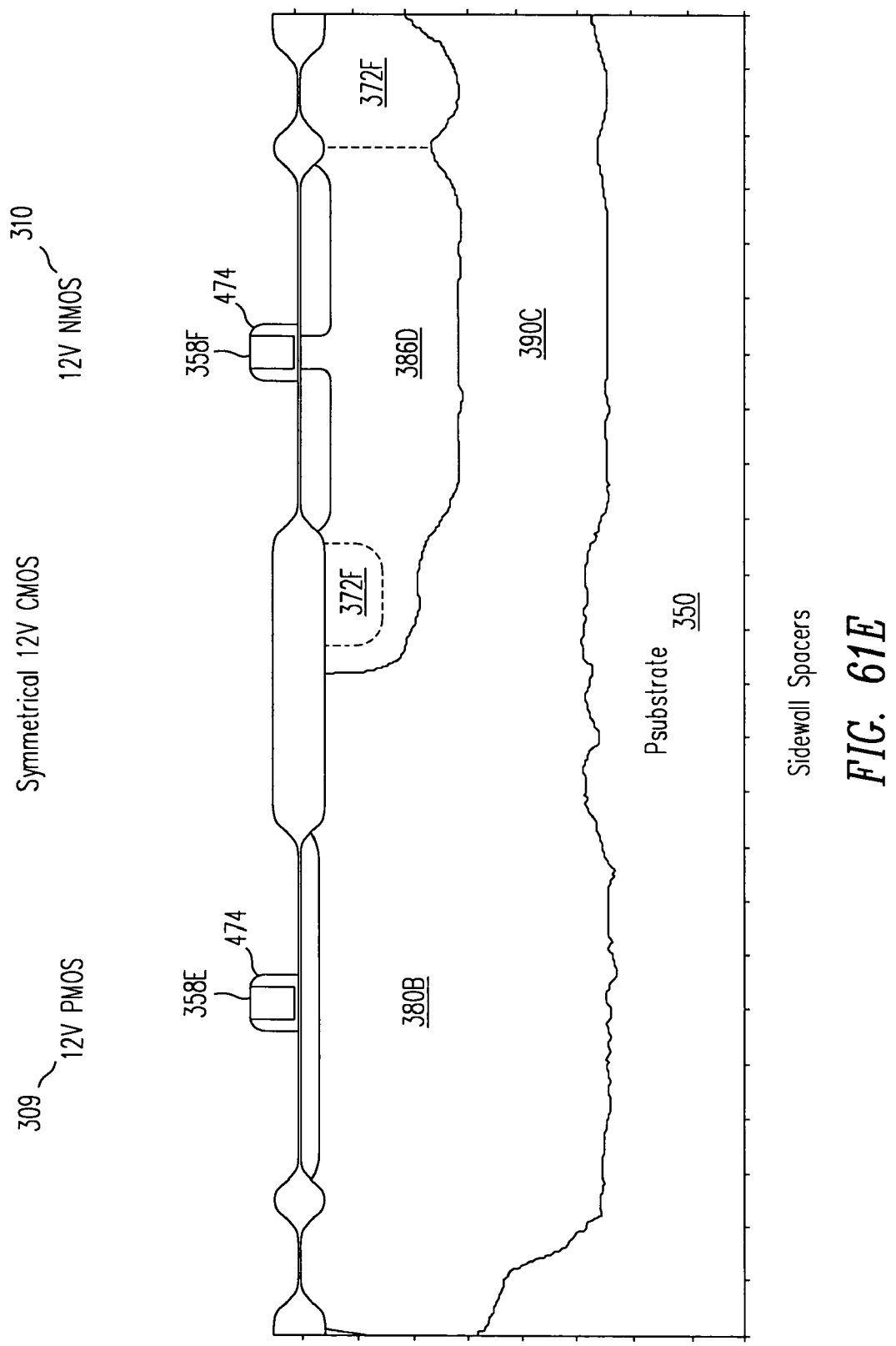
Figure 62A:
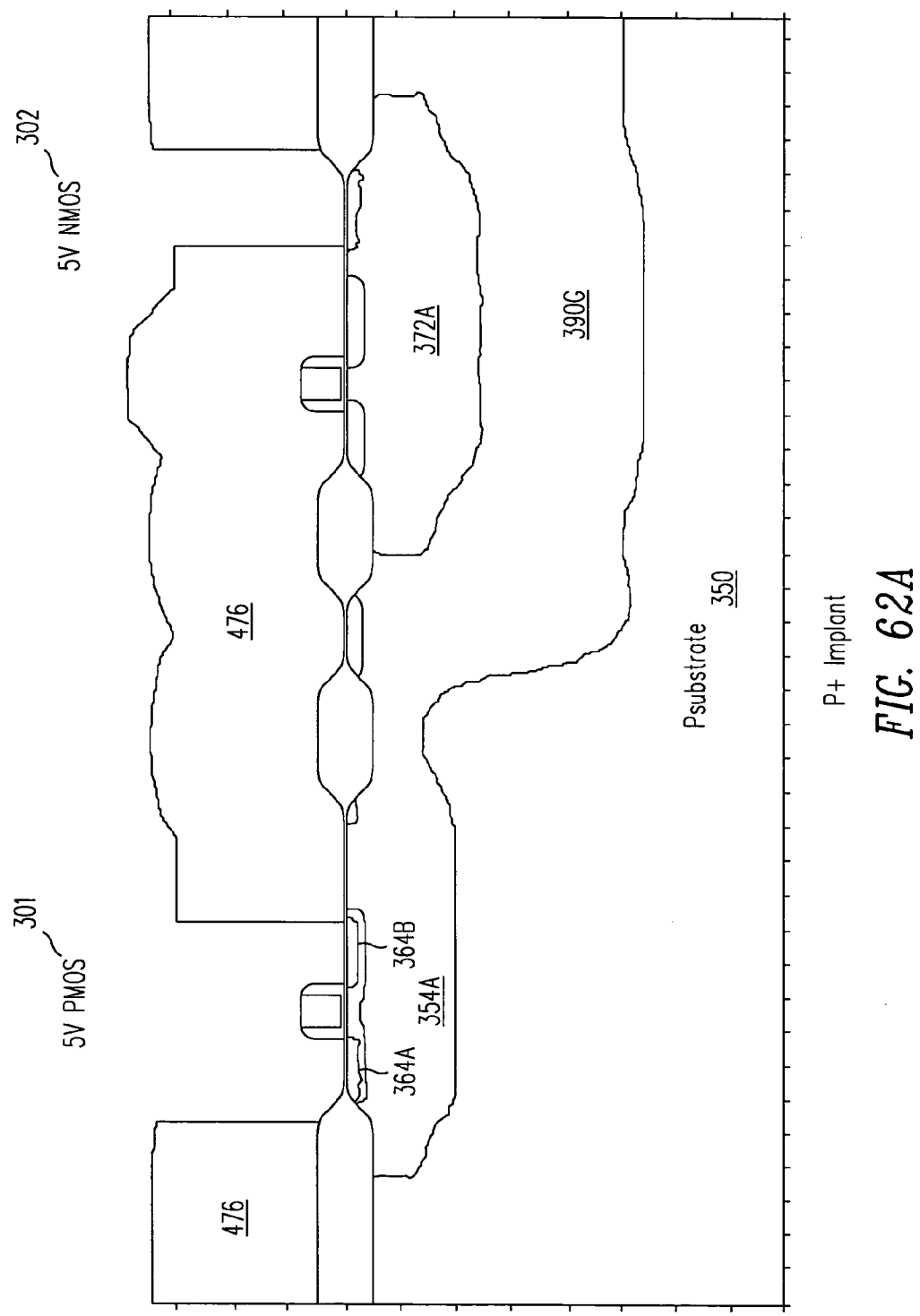
Figure 62B:
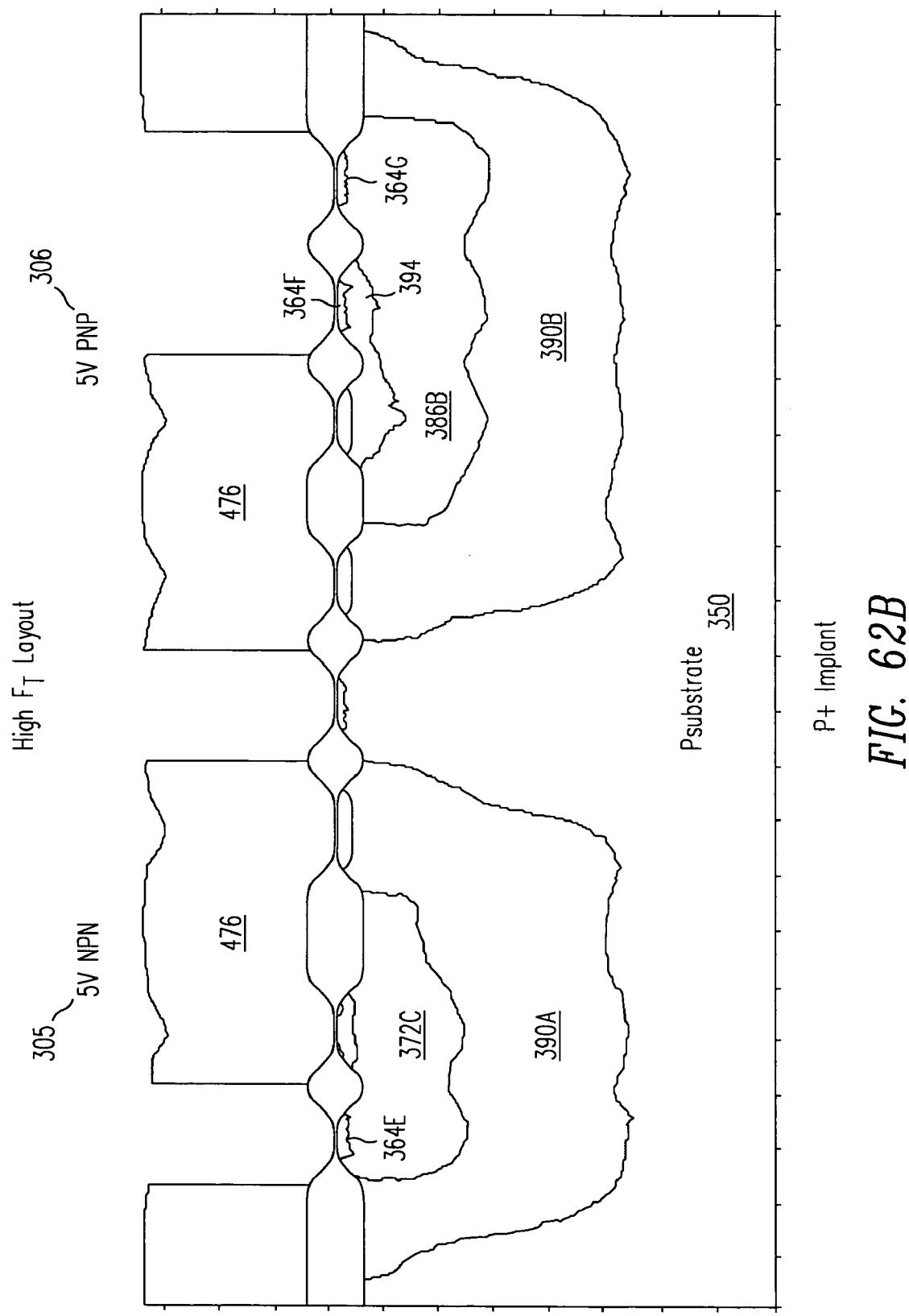
Figure 62C:
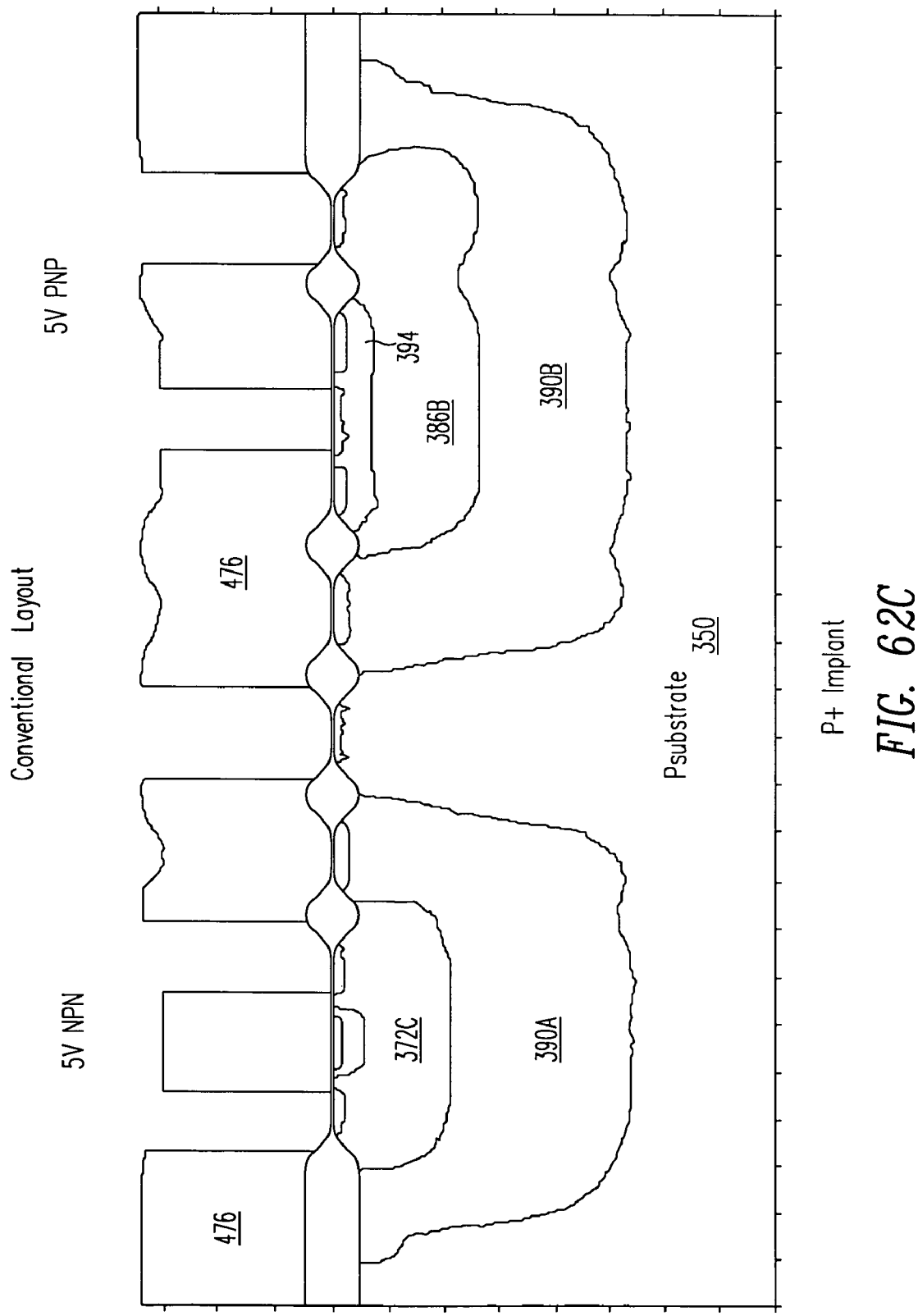
Figure 62D:
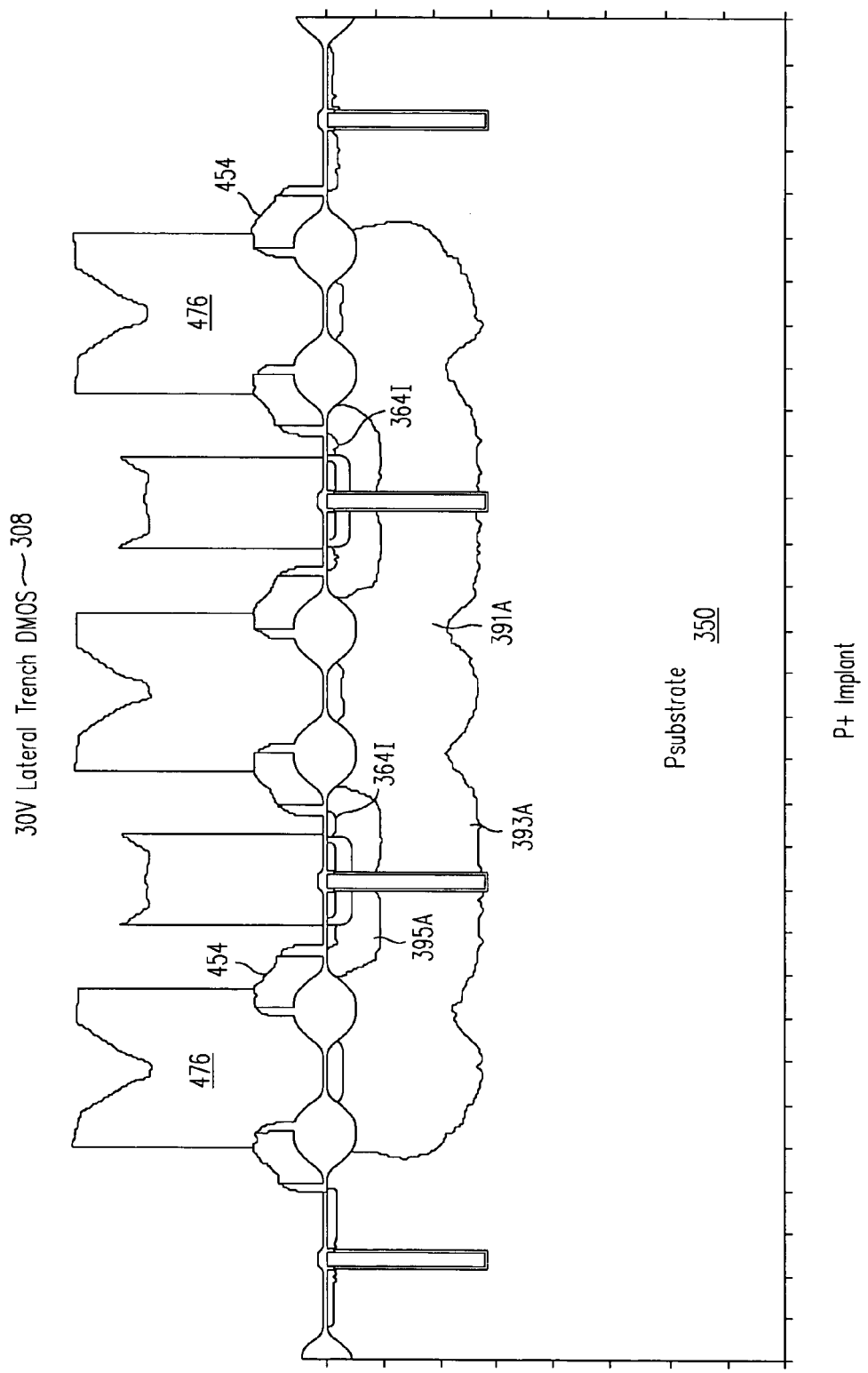
Figure 62E:
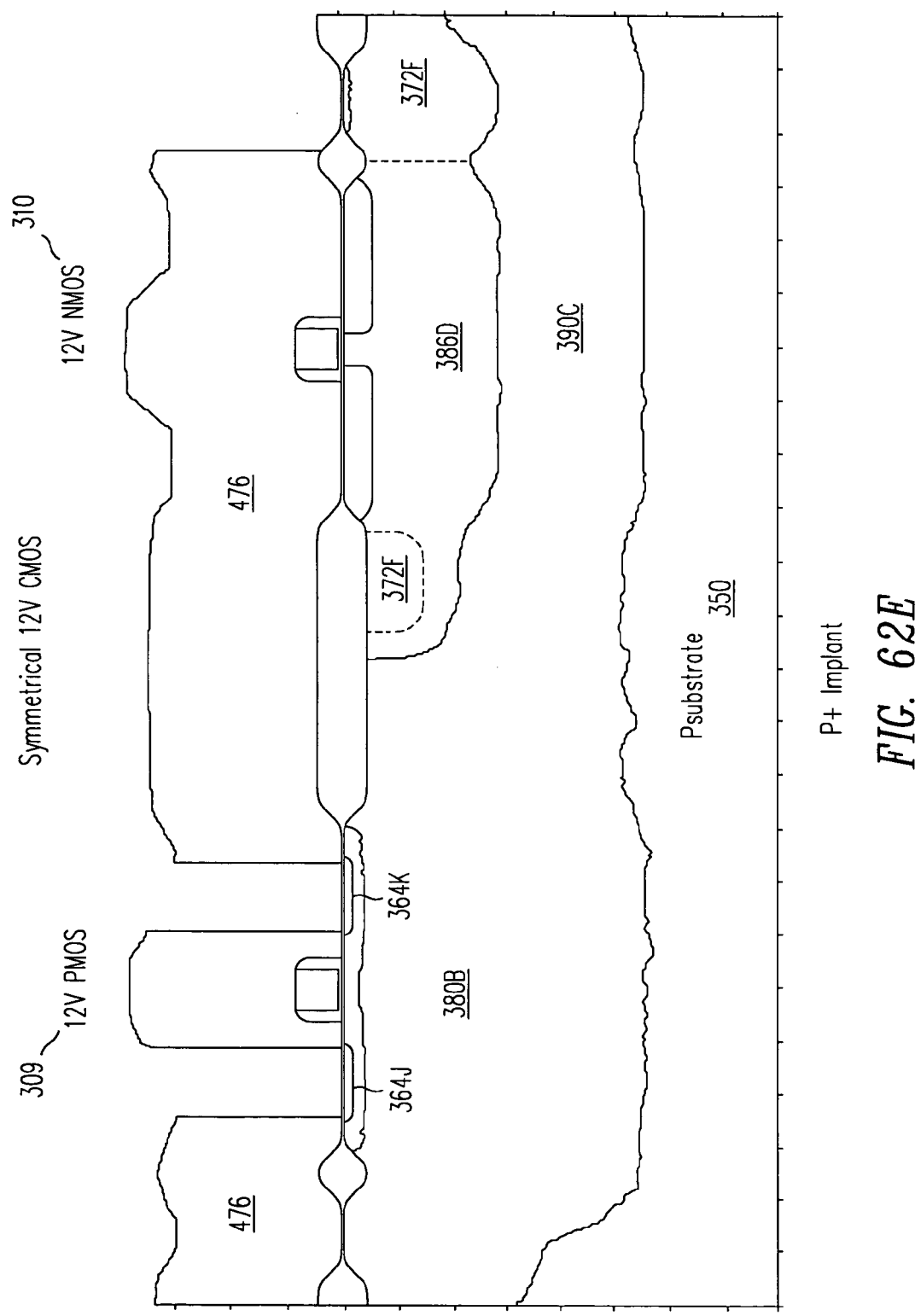
Figure 63A:
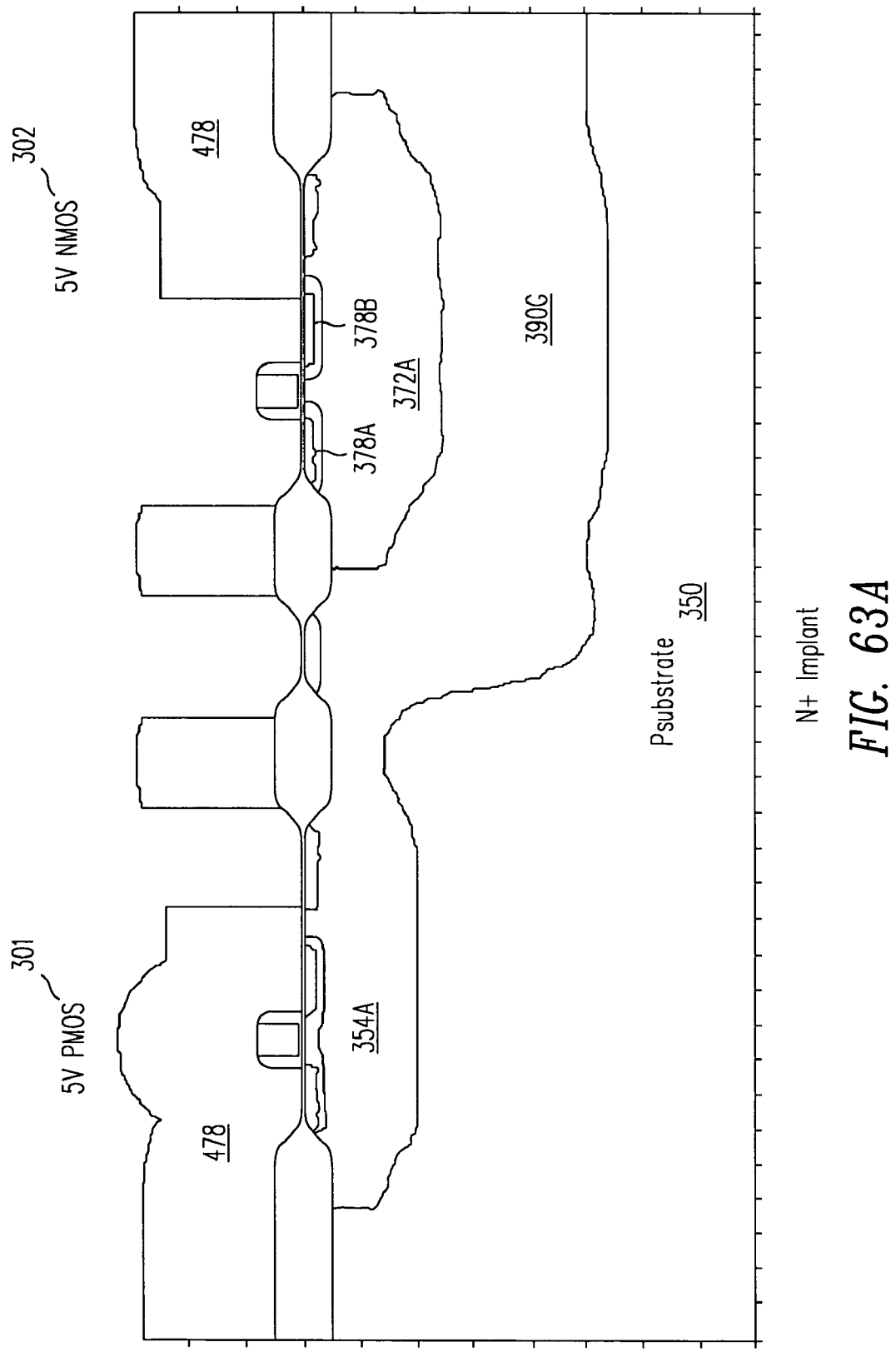
Figure 63B:
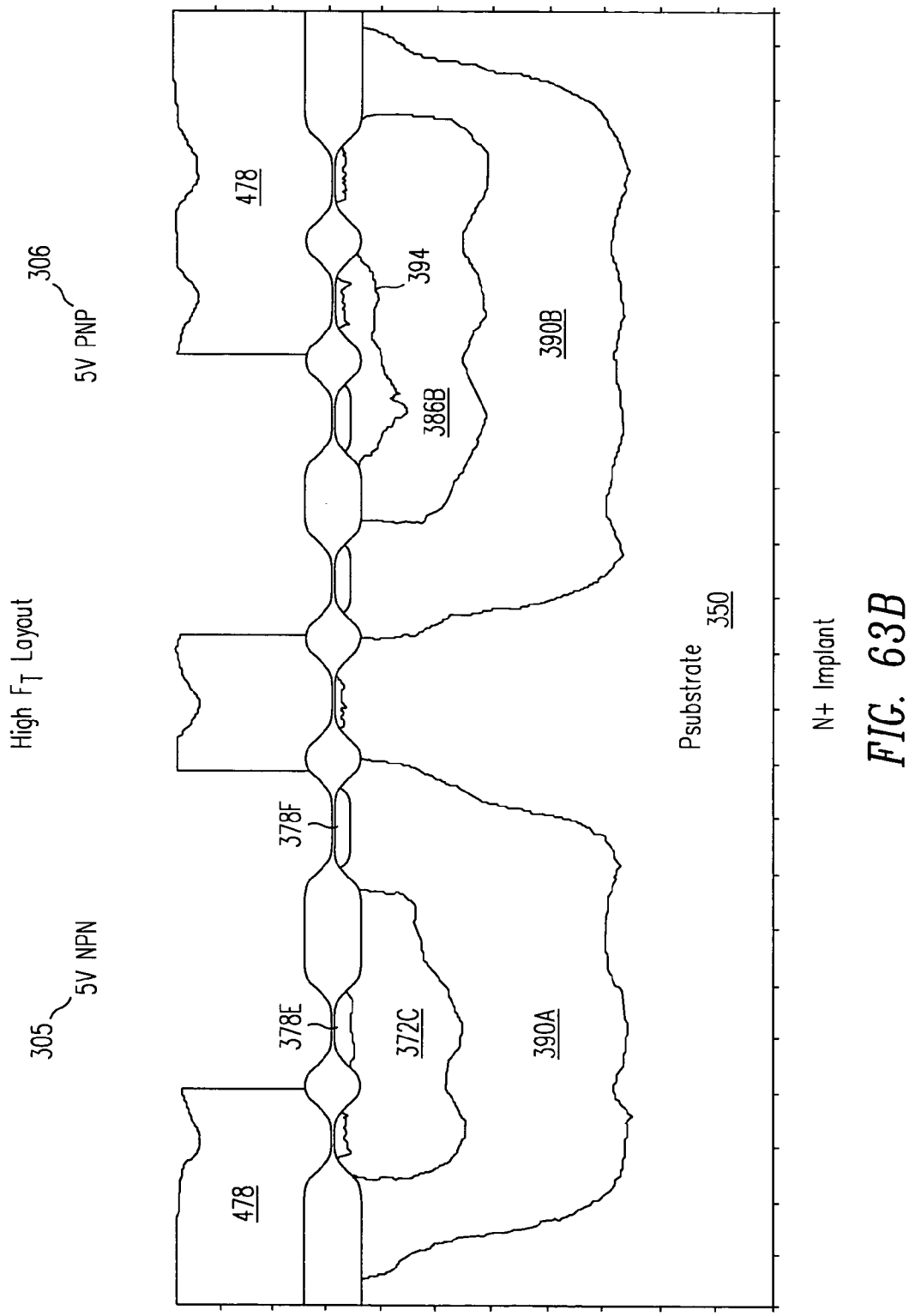
Figure 63C:
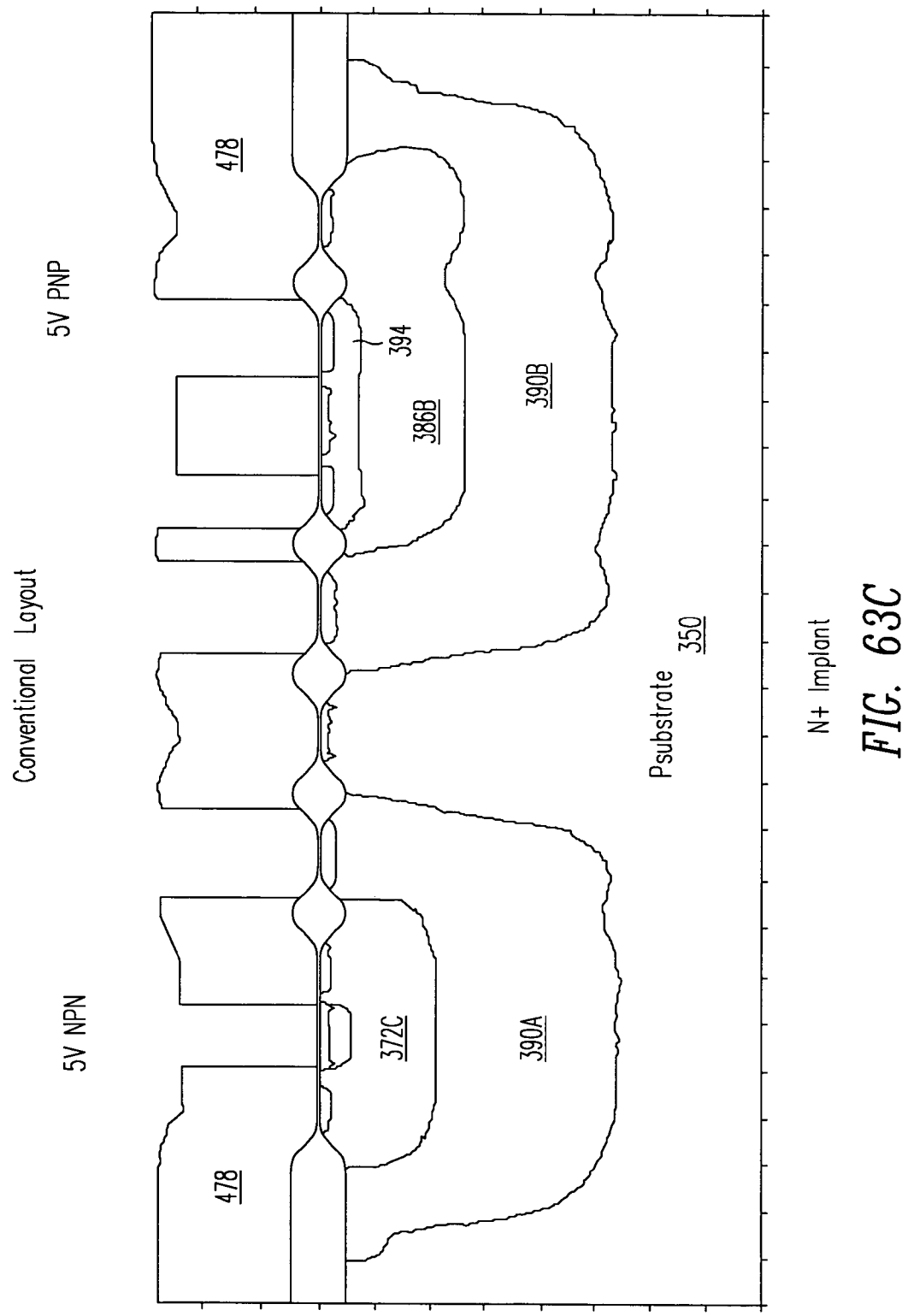
Figure 63D:
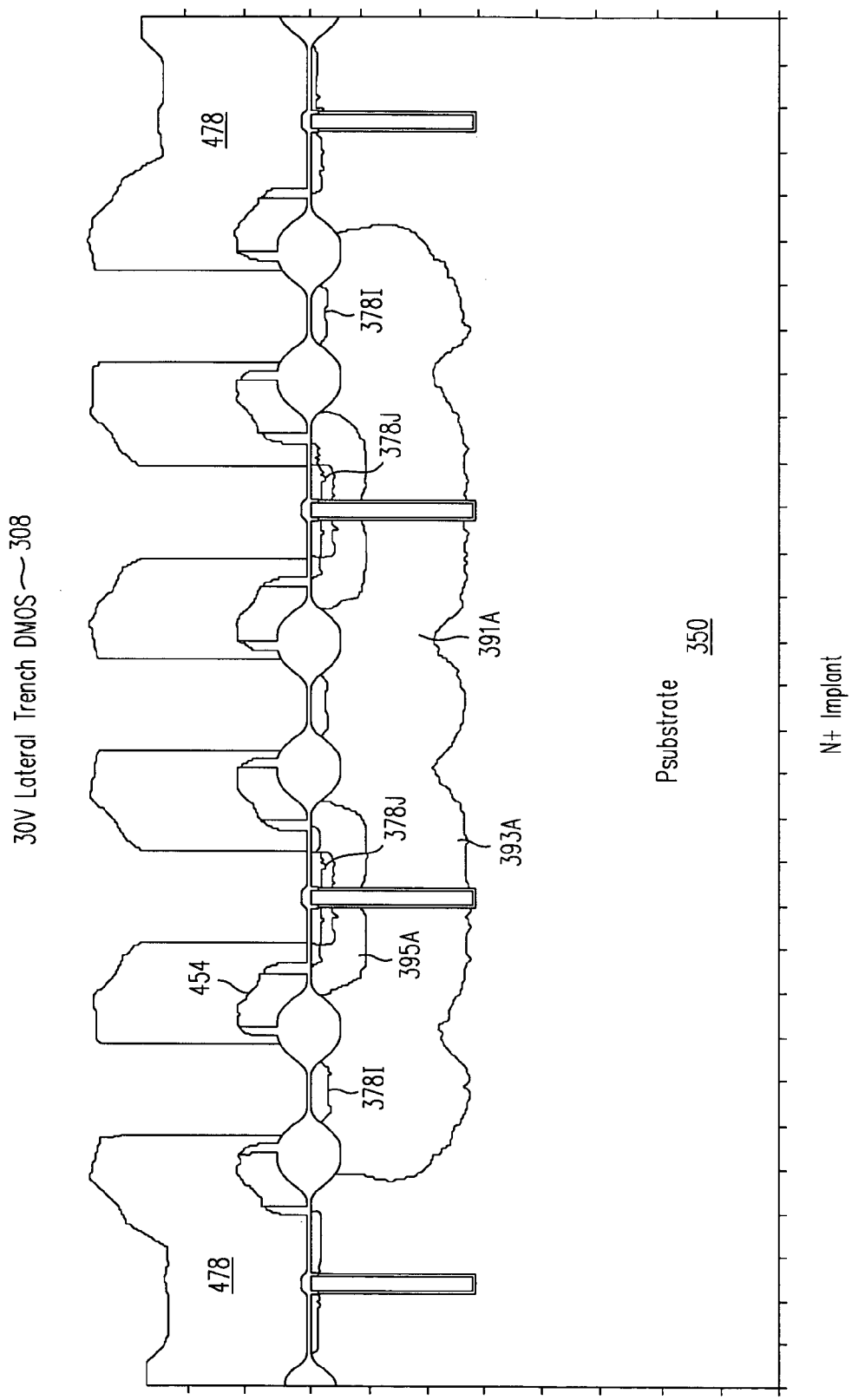
Figure 63E:
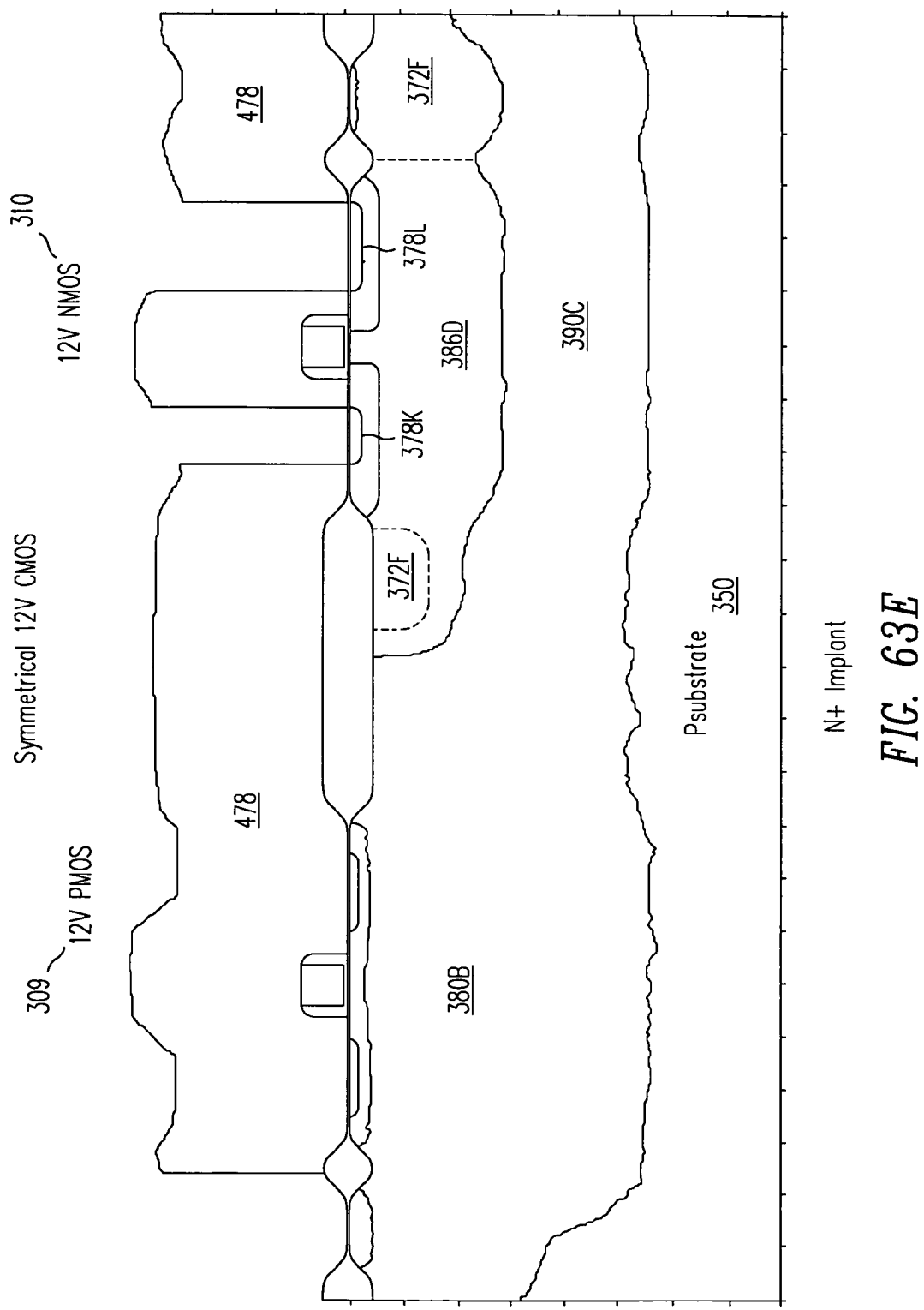
Figure 64A:
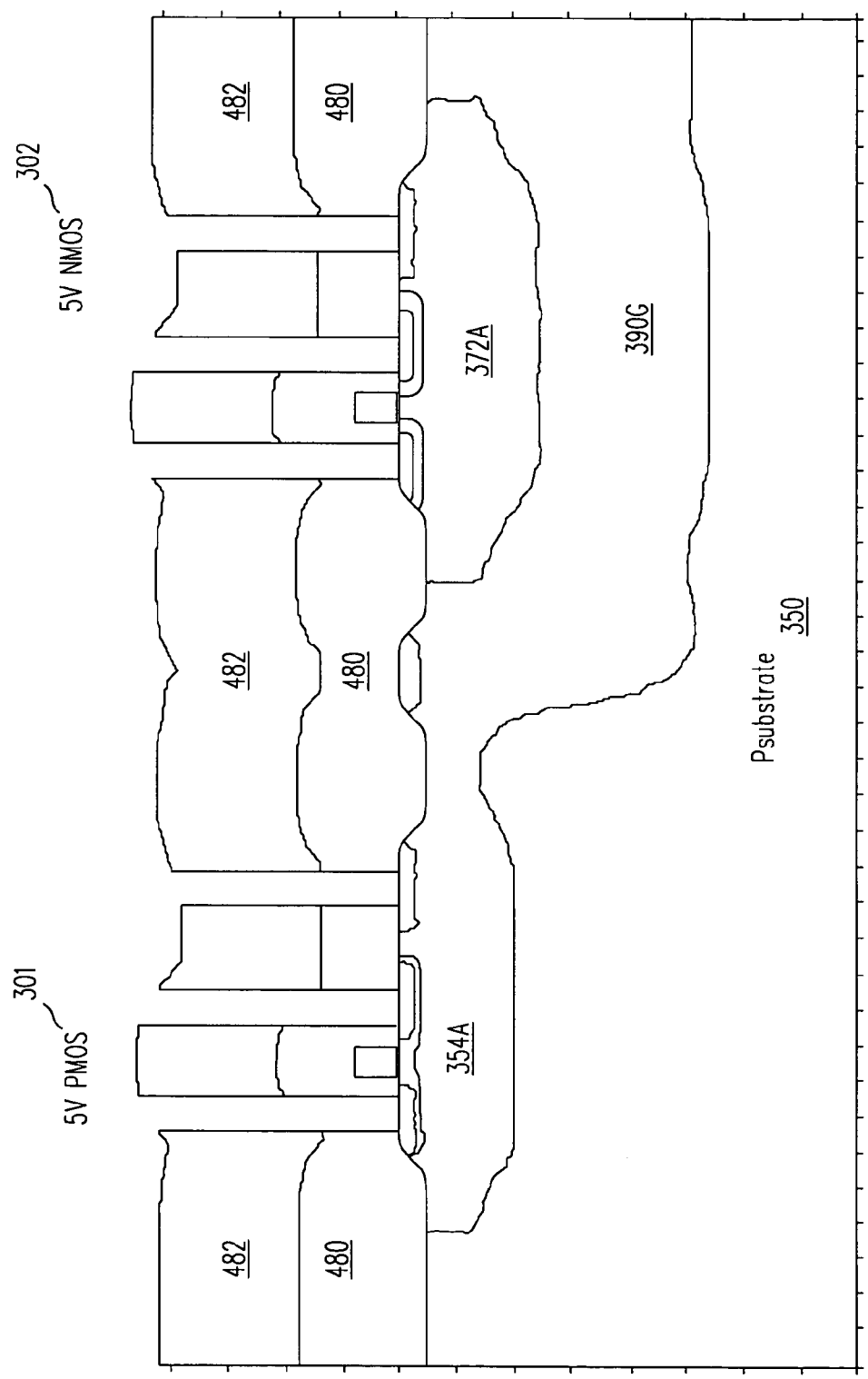
Figure 64B:
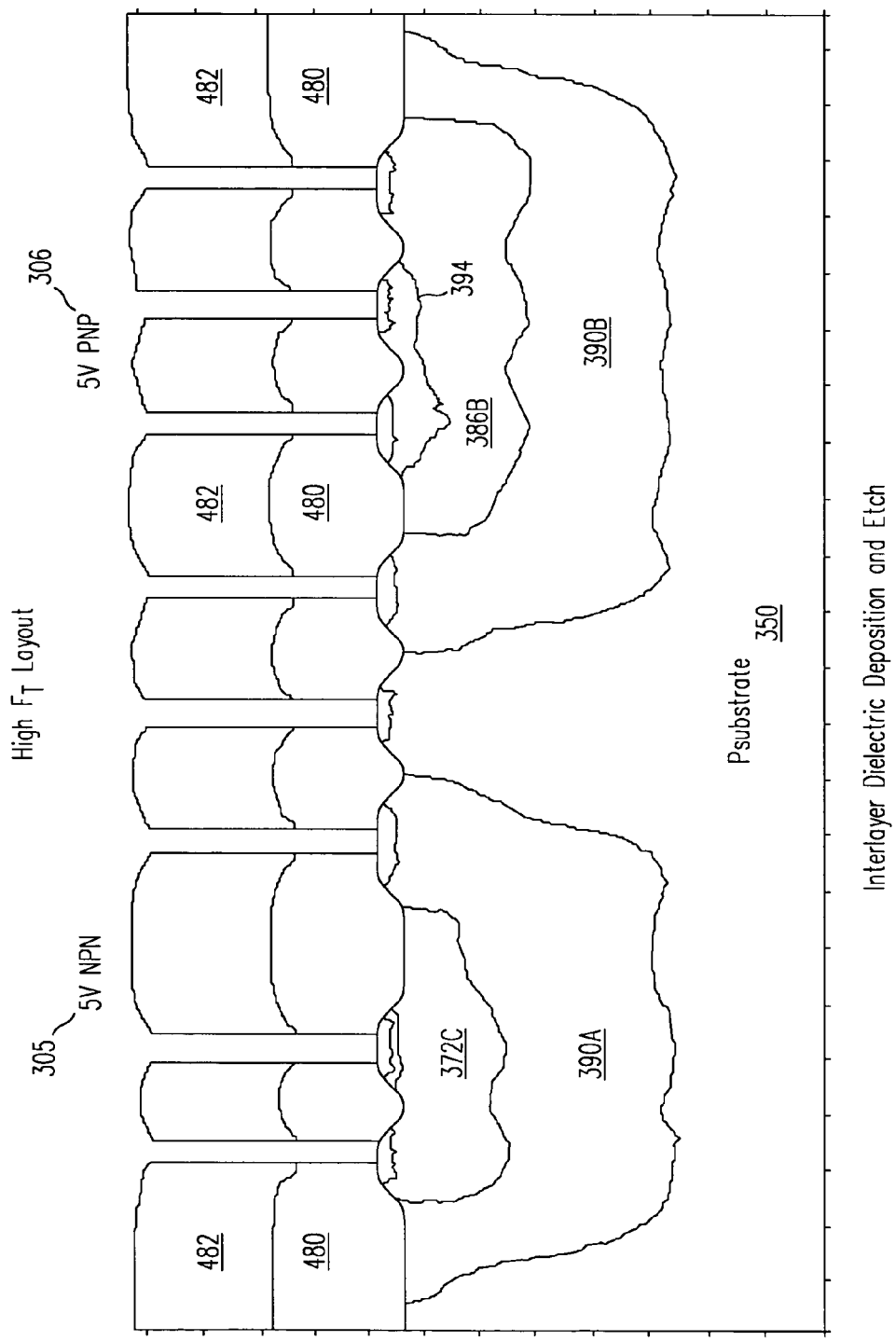
Figure 64C:
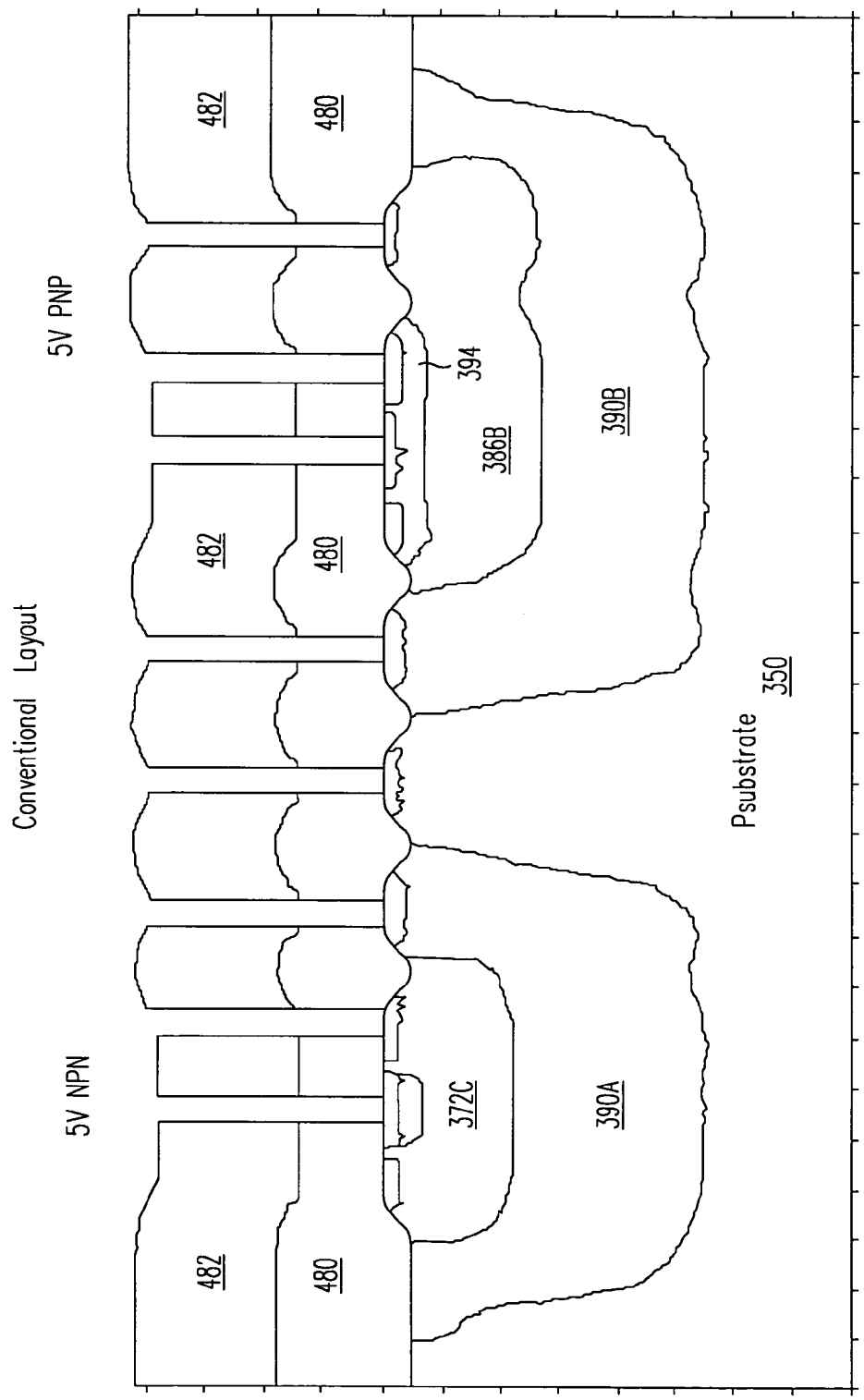
Figure 65A:
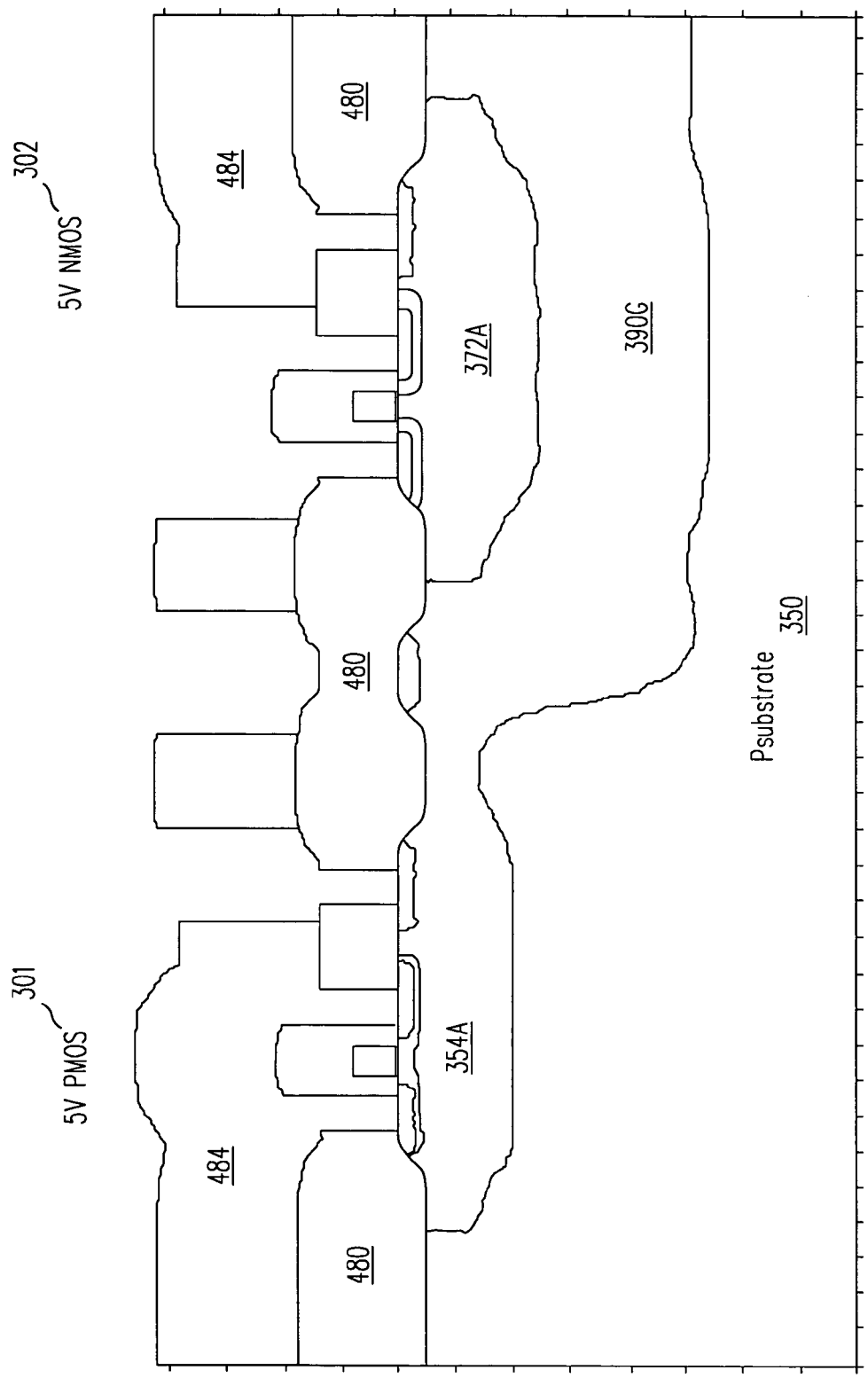
Figure 65B:
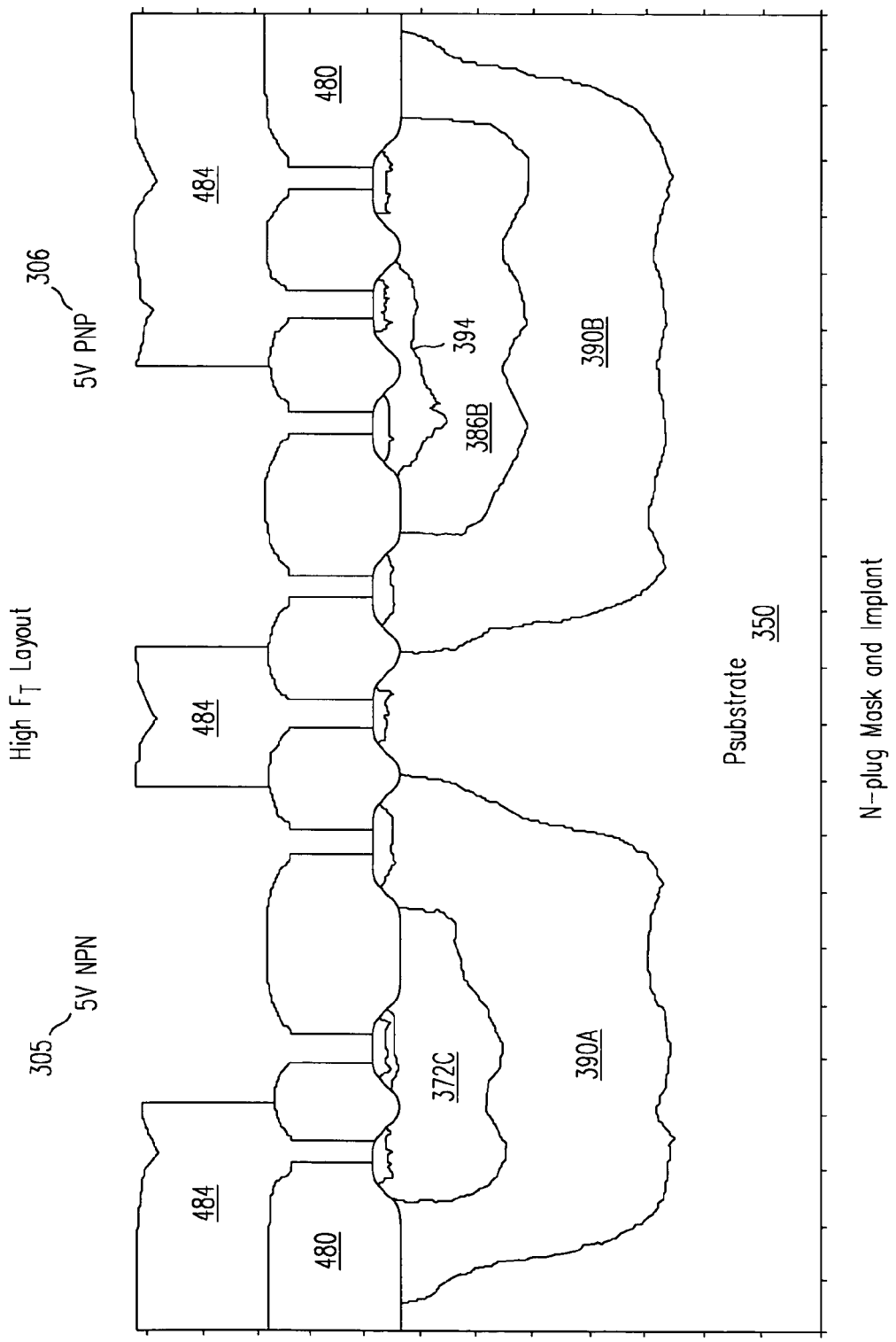
Figure 65C:
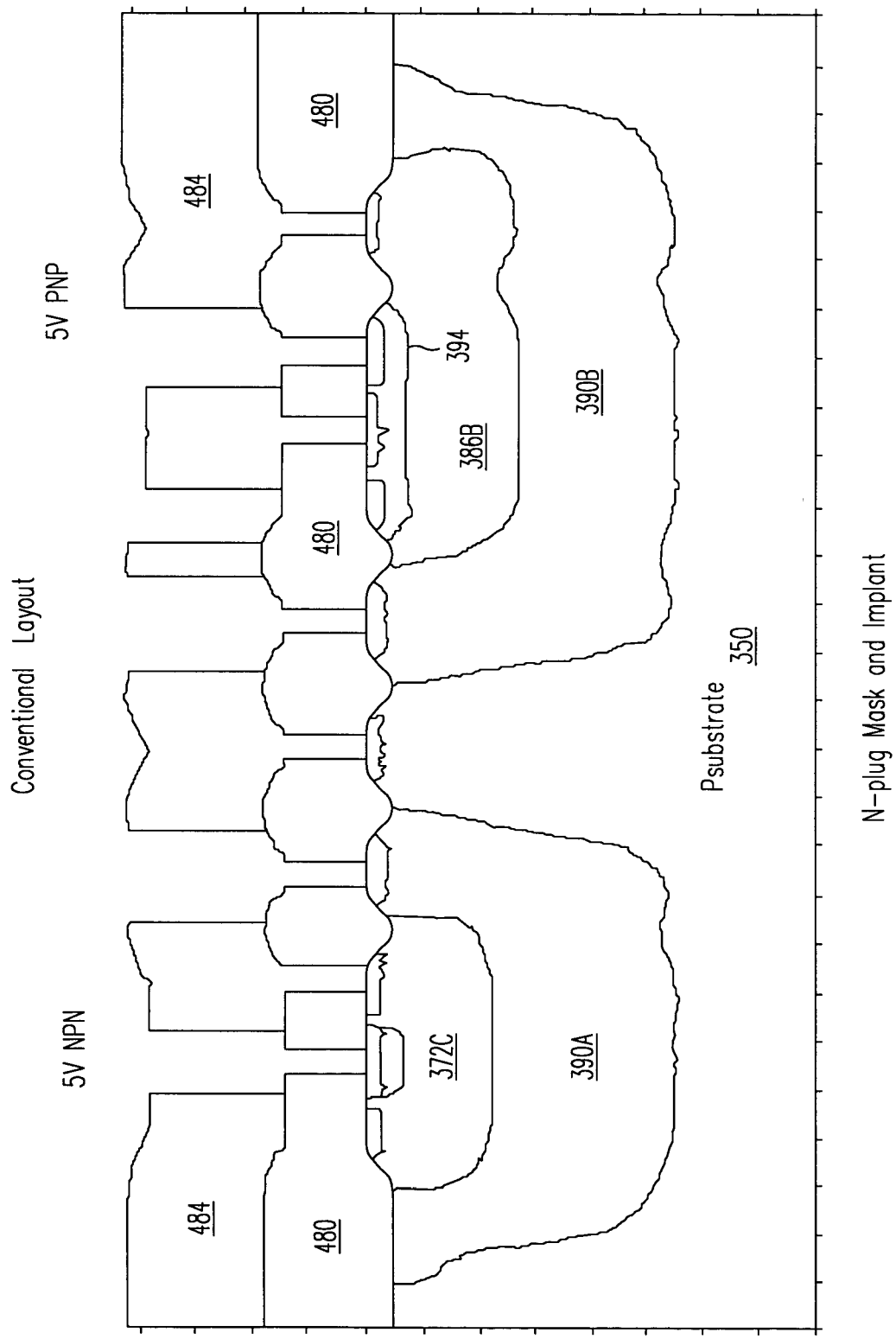
Figure 65D:
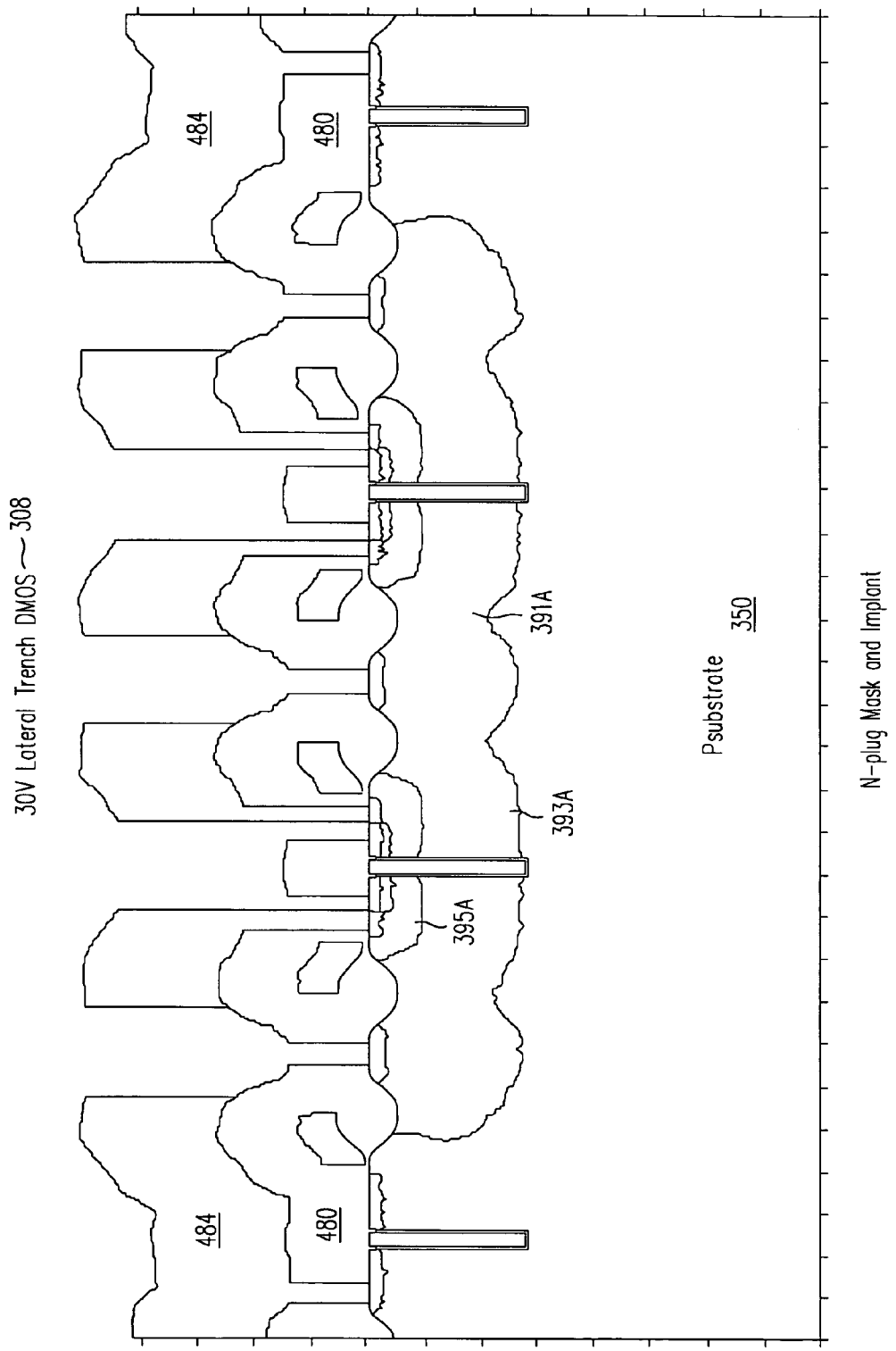
Figure 65E:
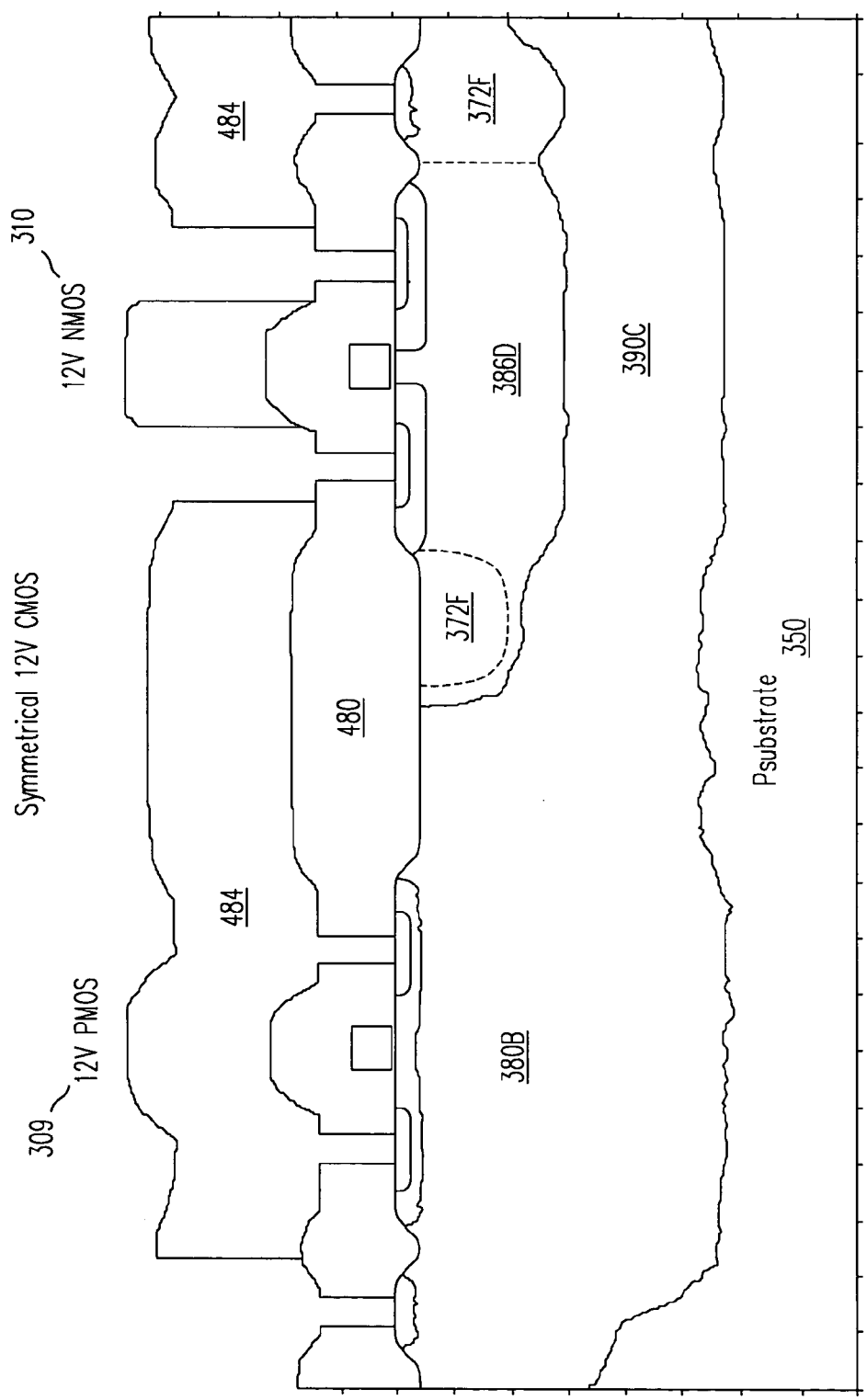
Figure 66A:
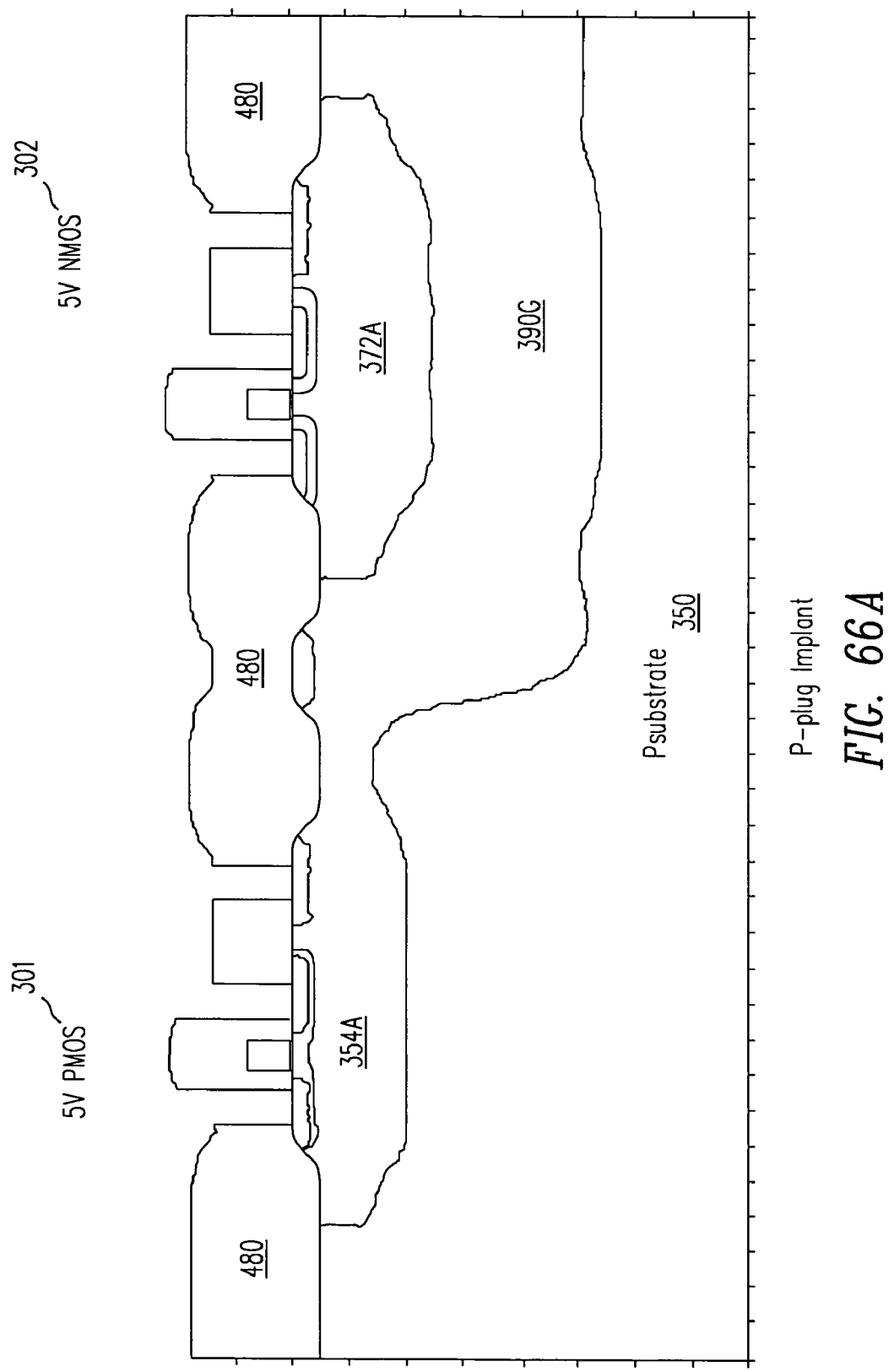
Figure 66B:
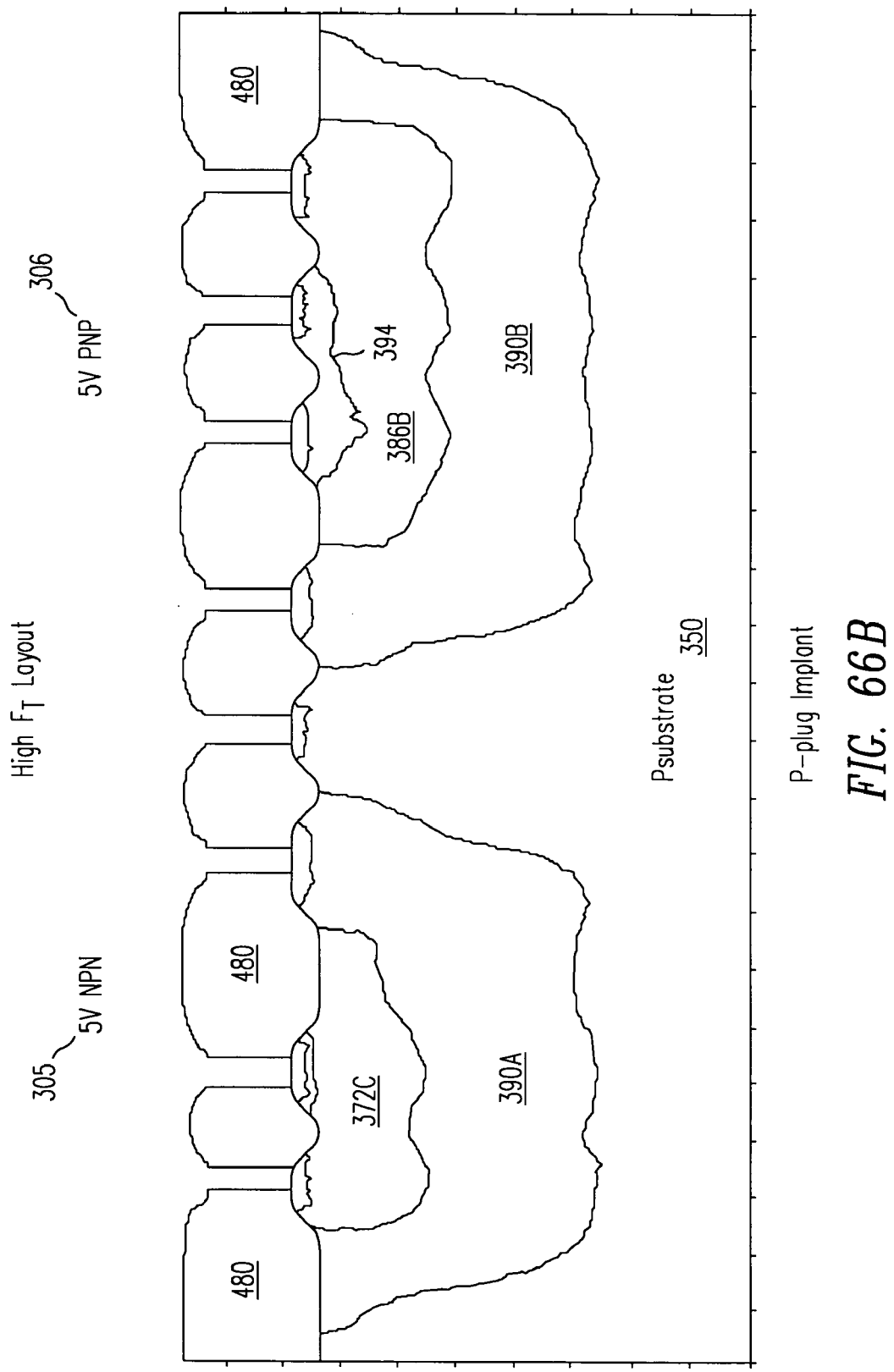
Figure 66C:
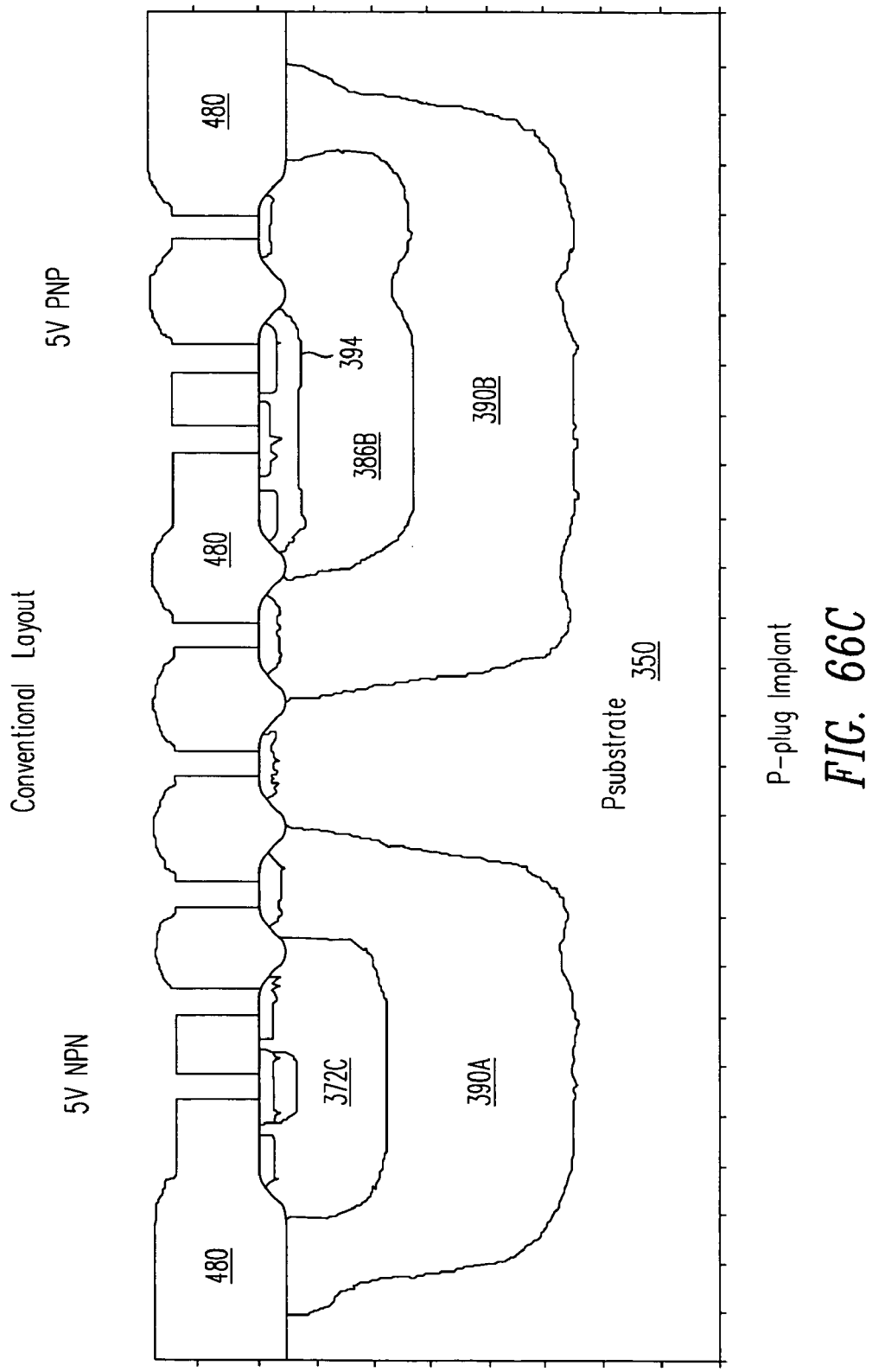
Figure 66D:
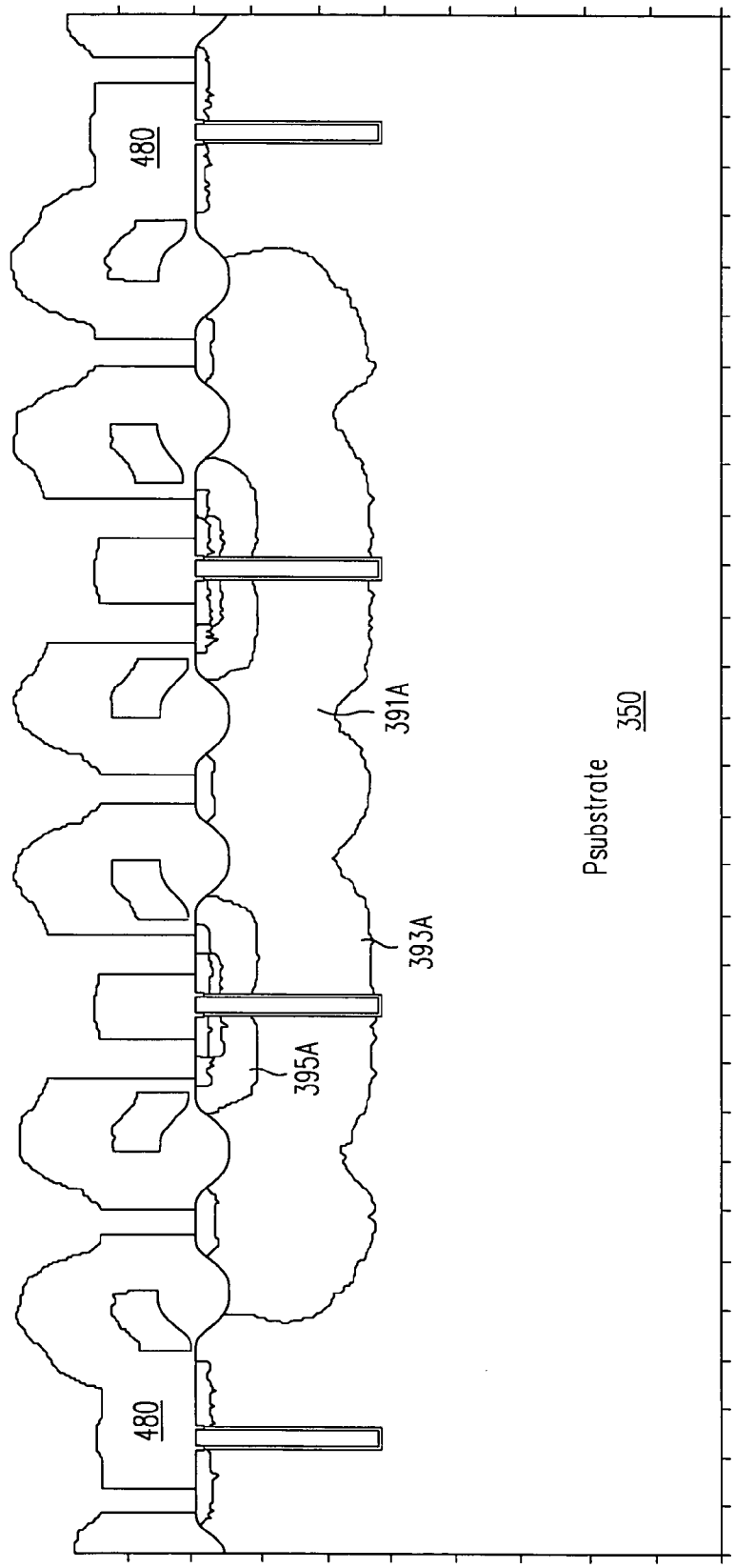
Figure 66E:
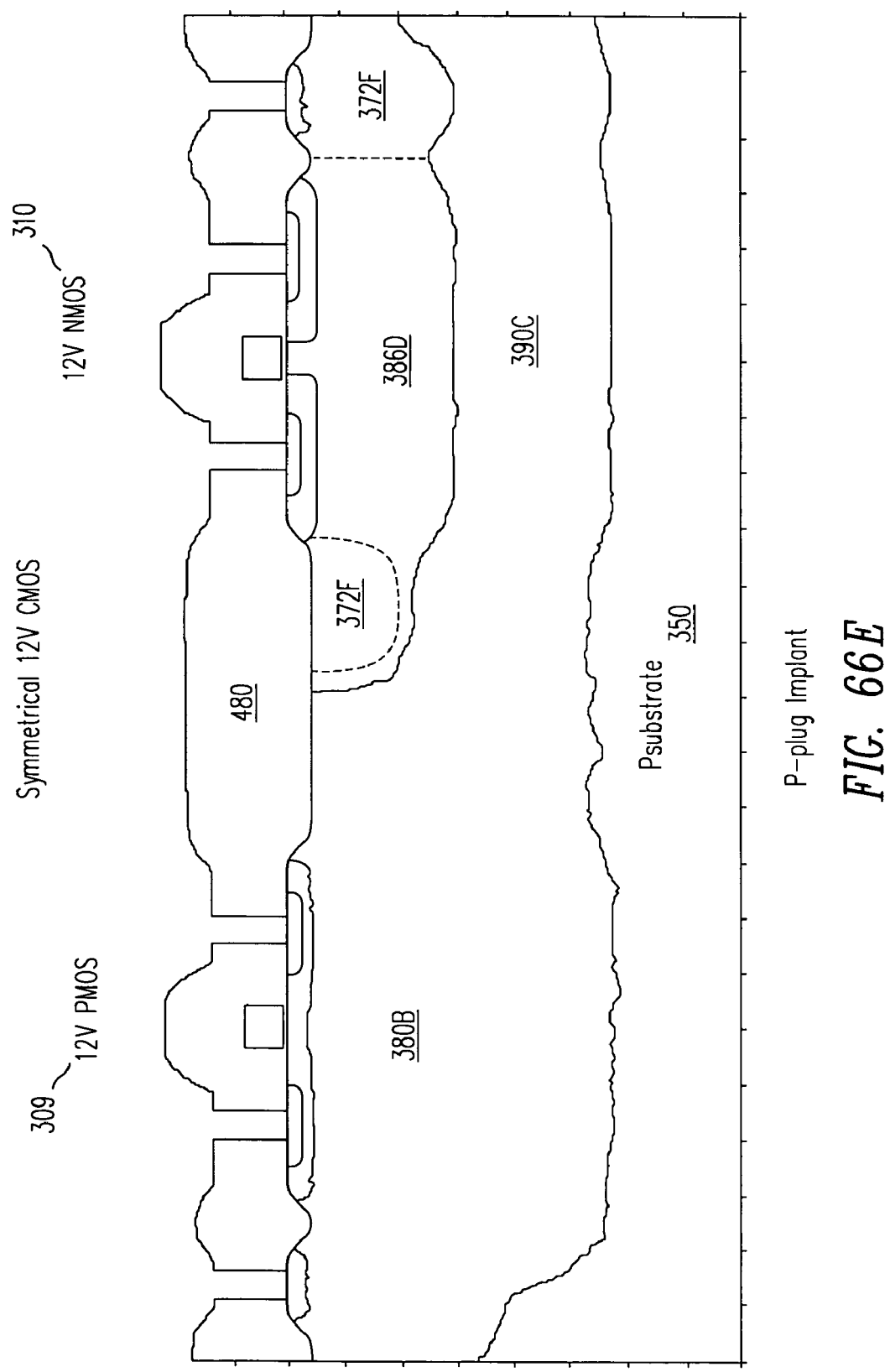
Figure 67A:
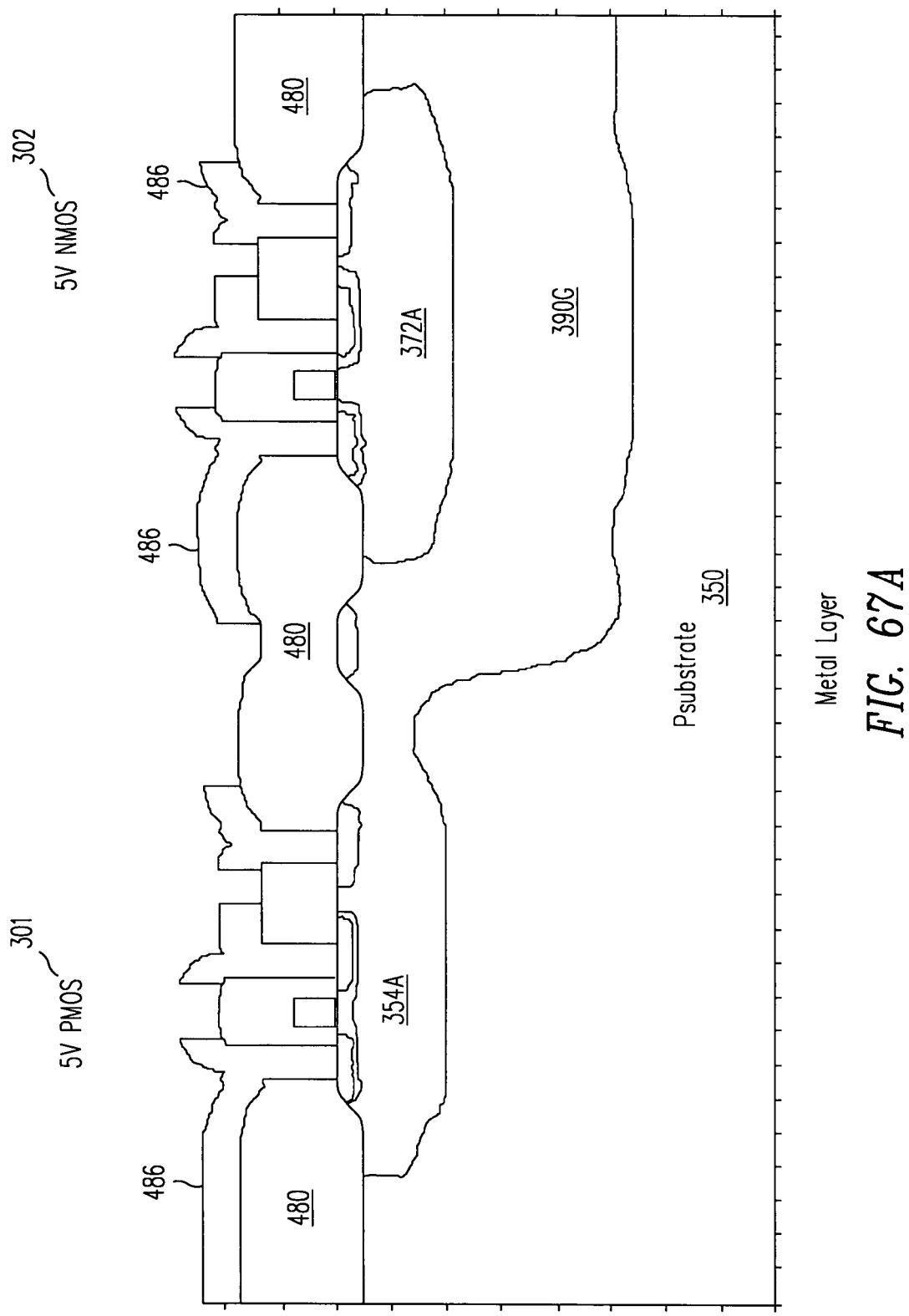
Figure 67B:
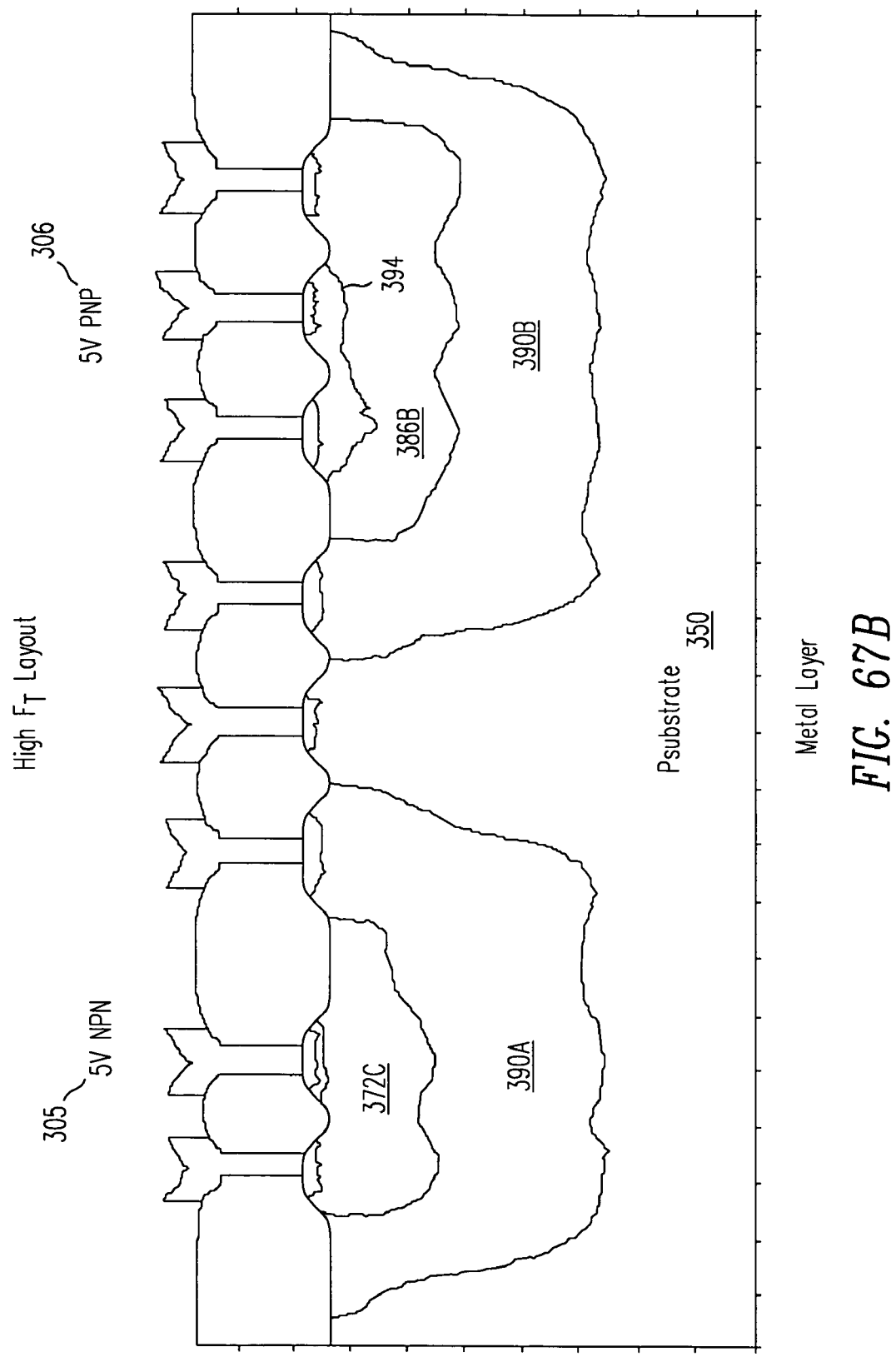
Figure 67C:
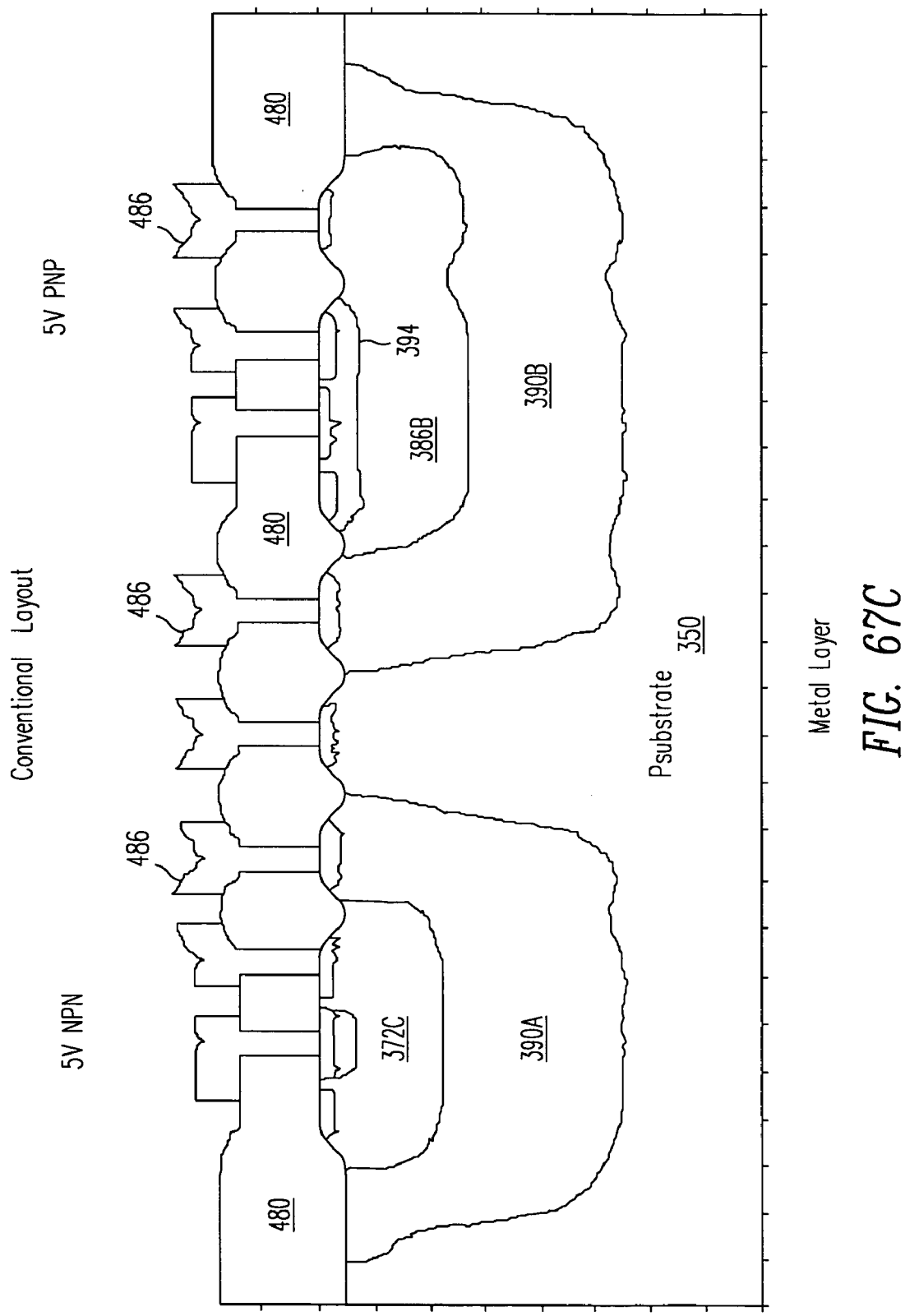
Figure 67D:
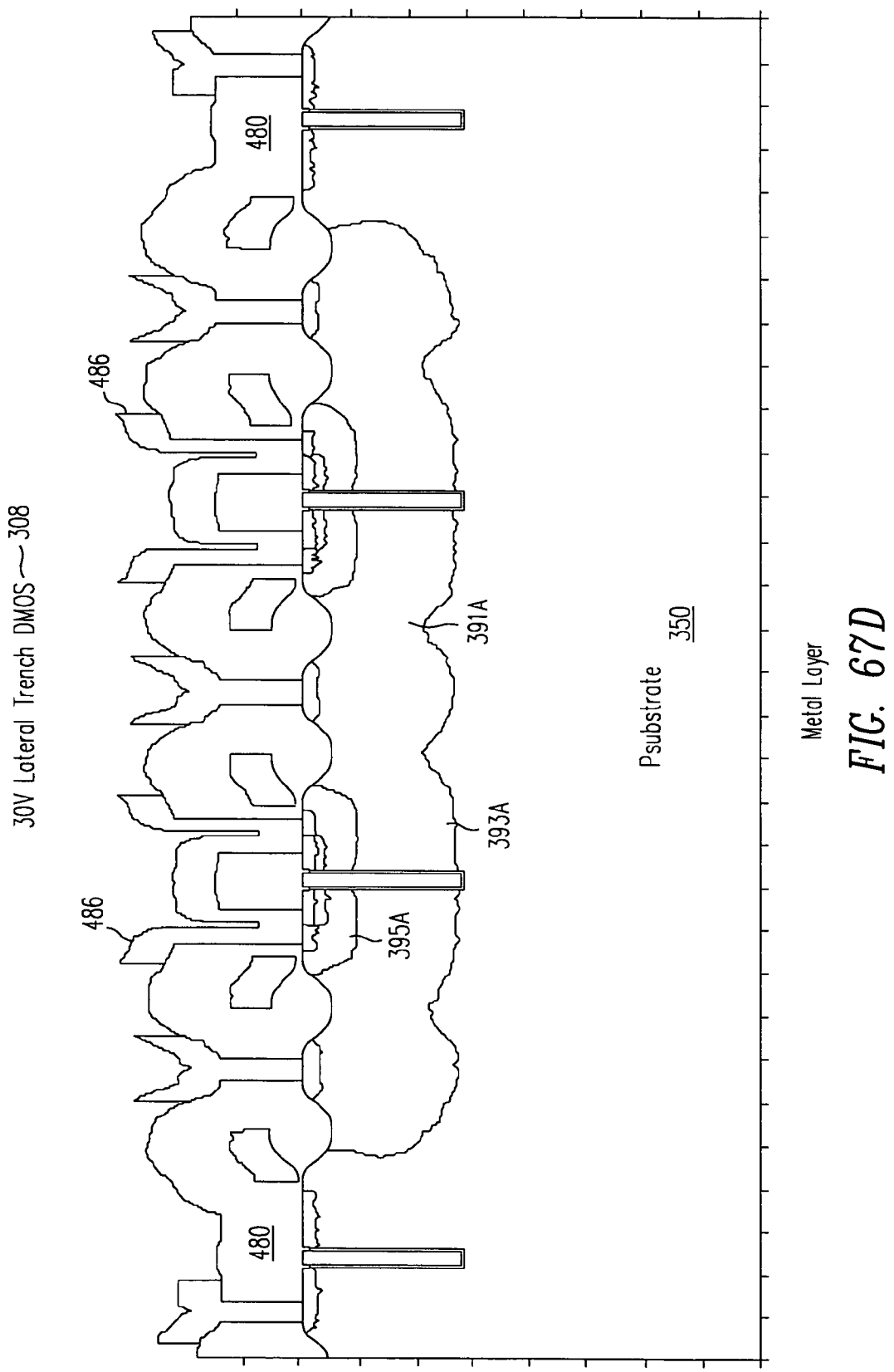
Figure 67E:
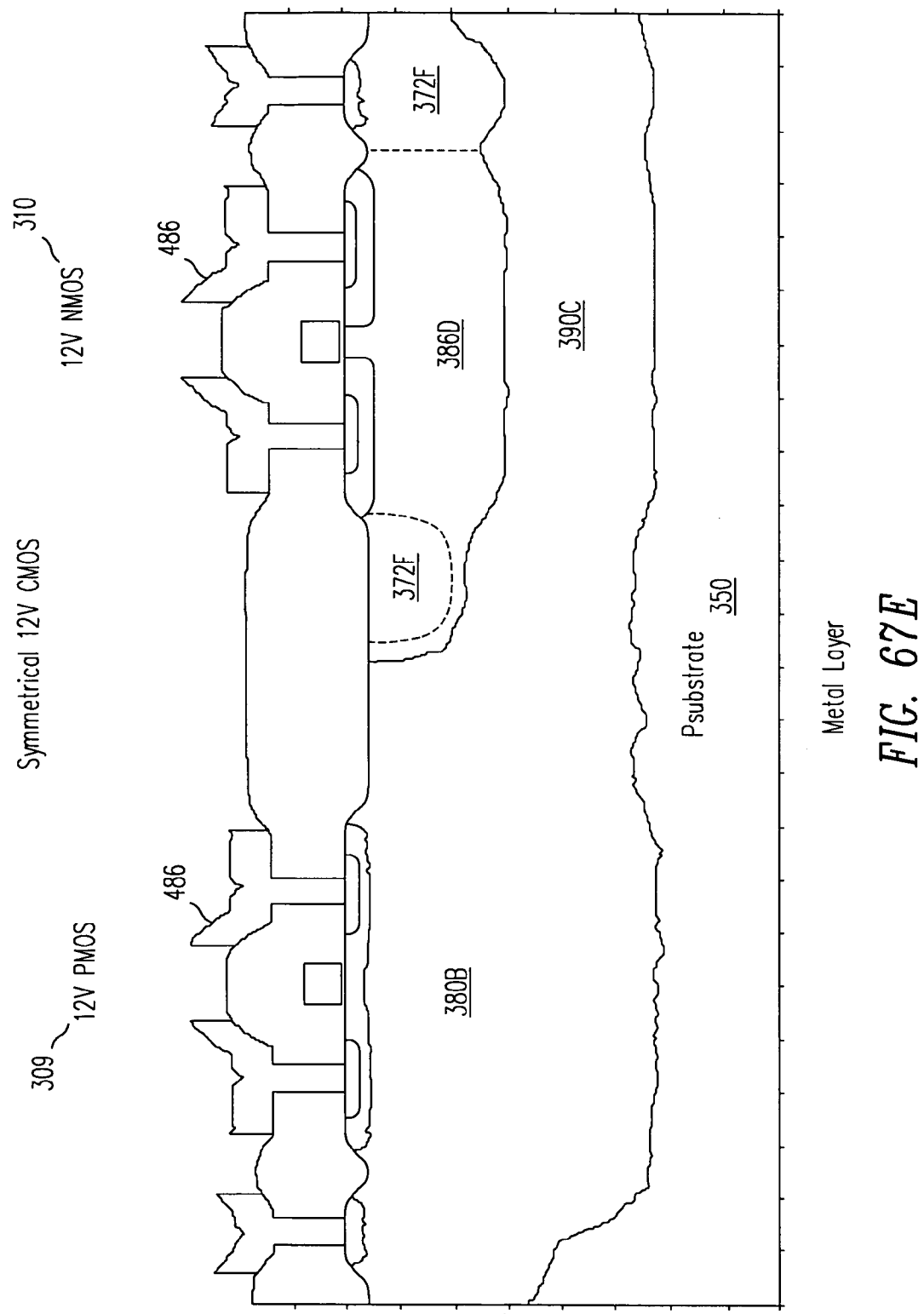

FIGS. 61A, 61D and 61E show the formation of oxide sidewall spacers on the gates of the planar devices.

FIGS. 62A–62E show the masking and implanting of the P+ regions.

FIGS. 63A–63E show the masking and implanting of the N+ regions.

FIGS. 64A–64E show the deposition and etching of the second interlayer dielectric.

FIGS. 65A–65E show the masking and implanting of the N-plugs.

FIGS. 66A–66E show the masking and implanting of the P-plugs.

FIGS. 67A–67E show the formation and patterning of a metal layer.

DESCRIPTION OF THE INVENTION

The problems of the prior art are overcome in a modular process which involves minimal thermal processing and in which the steps can be performed in almost any sequence. As a result, the devices can be tightly packed and shallow. In addition, the process allows the doping profiles of the doped regions to be set to meet virtually any specification, offering better control of conduction characteristics, electric fields, parasitics, hot carriers, snapback breakdown, noise, threshold (turn-on characteristics), and switching speed.

In many embodiments there is no epitaxial layer and so the variability (and higher manufacturing cost) introduced by epitaxial growth is not present. Moreover, the voltage capability of any given device can be chosen and implemented to be completely different than other integrated devices on the same IC without affecting those devices whatsoever. The packing density of devices in 5V circuitry, for example, is not affected by the integration of 30V devices on the same IC. Devices of specific voltage ratings can be added or removed from a design without affecting other components and their electrical models or requiring modification or "re-tuning" of a circuit design and its intended operation.

The process of this invention allows the fabrication of metal-oxide-silicon (MOS) devices and bipolar devices that are completely isolated from the substrate and from each other and therefore can "float" at any potential with respect to ground. The maximum voltage at which a component may float above ground (the substrate) need not be equal to the rating of the device itself. For example a pocket of dense 5V components can float 30V above ground without affecting the design rules of the 5V section of the layout.

The process of this invention also includes the formation of narrow junction isolation regions using a low thermal budget process of multiple ion implantations of differing energies, commonly through a single mask opening, to avoid the need for substantial diffusion times, and likewise to avoid the adverse effects of the lateral diffusion of isolation and sinker regions (wasting space). The low thermal budget process also avoids the problems associated with the unwanted updiffusion of buried or deep layers (or the substrate) which, using conventional fabrication methods, generally requires the growth of even thicker epitaxial layers.

The process of forming a doped region through a sequence of successive implants of multiple energies (generally through a single mask) is herein referred to as a "chained implant." In one aspect of this invention a single-mask chained implant is used to form an isolation structure as the sidewall isolation of an isolated pocket. Such an isolation structure is herein referred to as "chained-implant junction isolation" (or CIJI for short). The CIJI sidewall isolation structure may be formed by two or more implants (with five to six being preferred for deeper isolations) and may be used in conjunction with an epitaxial layer or used in an all implanted epi-less isolation structure. In some instances the CIJI structure is combined with an oxide-filled trench to further narrow the lateral extent of the isolation doping.

Another feature of this invention is the ability to form fully isolated devices (including CMOS and bipolars of differing voltage) without the need for epitaxy. Such "epi-less" isolation combines a CIJI sidewall isolation structure in a ring, annular, or square donut-shape structure overlapping a deeply implanted floor isolation or buried dopant region having the same conductivity type as the CIJI sidewall isolation. Unlike devices made in epitaxial processes, the deep layers are not formed at the interface between a substrate and epitaxial layer, but by implanting the deep floor isolation dopant at high energies. An isolated pocket, having the same concentration and conductivity type as the original substrate, is the result of such a process. The content of such an isolated pocket may contain any number of doped regions of either P-type or N-type polarity including CMOS N well and P well regions, bipolar base regions, DMOS body regions, or heavily-doped source/drain regions.

Another attribute of this invention is the ability to form well regions of differing concentration, and hence voltage capability, within a common substrate. In each case, the dopant profile is chosen to have a low enough concentration to meet required junction breakdown voltages, yet still allow the integration of a high performance active device. In the case of a CMOS for example, the well has a retrograde profile with a higher subsurface concentration that is chosen to prevent bulk punchthrough breakdown, and a lighter surface concentration balancing a low threshold against surface punchthrough, yet still allow subsequent threshold adjusting implants to be performed immediately before (or immediately after) polysilicon gate formation.

In one embodiment of this invention, these wells, along with the deep-implanted floor isolation, are implanted after the formation of field oxide regions. The implant energies and oxide thickness are chosen so that some of the wells' multiple implants penetrate the overlying field oxide regions and other portions may be blocked (or partially blocked) from reaching the silicon. The implants therefore follow the topography of the field oxide, being shallower where the oxide is thicker and deeper in active areas. The oxide thickness is chosen to be thick enough such that, when combined with the ion implanted layers, it exhibits a field threshold sufficiently high to prevent the formation of surface channels and parasitic MOSFET conduction. This goal is preferably accomplished by selection and dose of the buried or retrograde portion of a well implant, which can be chosen to produce a surface concentration under the field oxide high enough to raise the field threshold of the parasitic MOSFETs.

This multi-implant approach relies on maintaining a low thermal budget, so that the dopants remain substantially where they are initially implanted. Such "as-implanted" structures allow multiple implants to be used to "program" any given well region to produce a device having a predetermined voltage rating, e.g. a 5V NPN or a 12V PMOS, or a 3V NMOS. Moreover, the minimum feature size of low voltage well regions may in fact be drawn at smaller feature sizes than in higher voltage wells because the doping of the low voltage well regions can be optimized to prevent punchthrough and short channel effects in the low voltage devices without affecting the other devices.

Initially, we describe a series of process steps by which N wells and P wells can be isolated from the substrate and from each other. For purposes of explanation, we assume the fabrication of a 5V N well, a 5V P well, a 12V N well, and a 12V P well. By "5V" and "12V" we refer to a well that is doped to a concentration and doping profile that allows the fabrication of a junction within the well that can withstand a reverse bias of the specified voltage and further that devices within the well will not leak or communicate with other devices so long as they are operated at the specified voltage level. In general, a 12V well is more lightly doped and deeper than a 5V well. In reality, a 5V well might be able to hold devices that can operate up to 7V, and a 12V well might be able to hold devices that can operate up to 15V. Thus "5V" and "12V" are somewhat arbitrary designations and generally used to describe the nominal voltage supply where such a device is meant to operate.

Furthermore, it will be understood that "5V" and "12V" represent, respectively, a well having a relatively low breakdown voltage and a well having a relatively high breakdown voltage. The voltages need not be 5V and 12V. For example, in another embodiment the "low voltage" well could be a 1V well and the "high voltage" well could be a 3V well. Another embodiment of particular interest is combining 3V devices with 5V devices on the same IC. In the event these devices are CMOS, the 3V devices may be constructed and optimized using a minimum gate dimension of 0.25 microns, while the 5V device may use a minimum dimension of 0.35 microns, so long as the wafer fabrication equipment is capable of photolithographically resolving, defining, and etching the smaller of the two feature sizes. Moreover, although we describe wells having two voltage ratings, it will be apparent that the invention applies to arrangements that include wells with three or more voltage ratings.

Figure 7A:
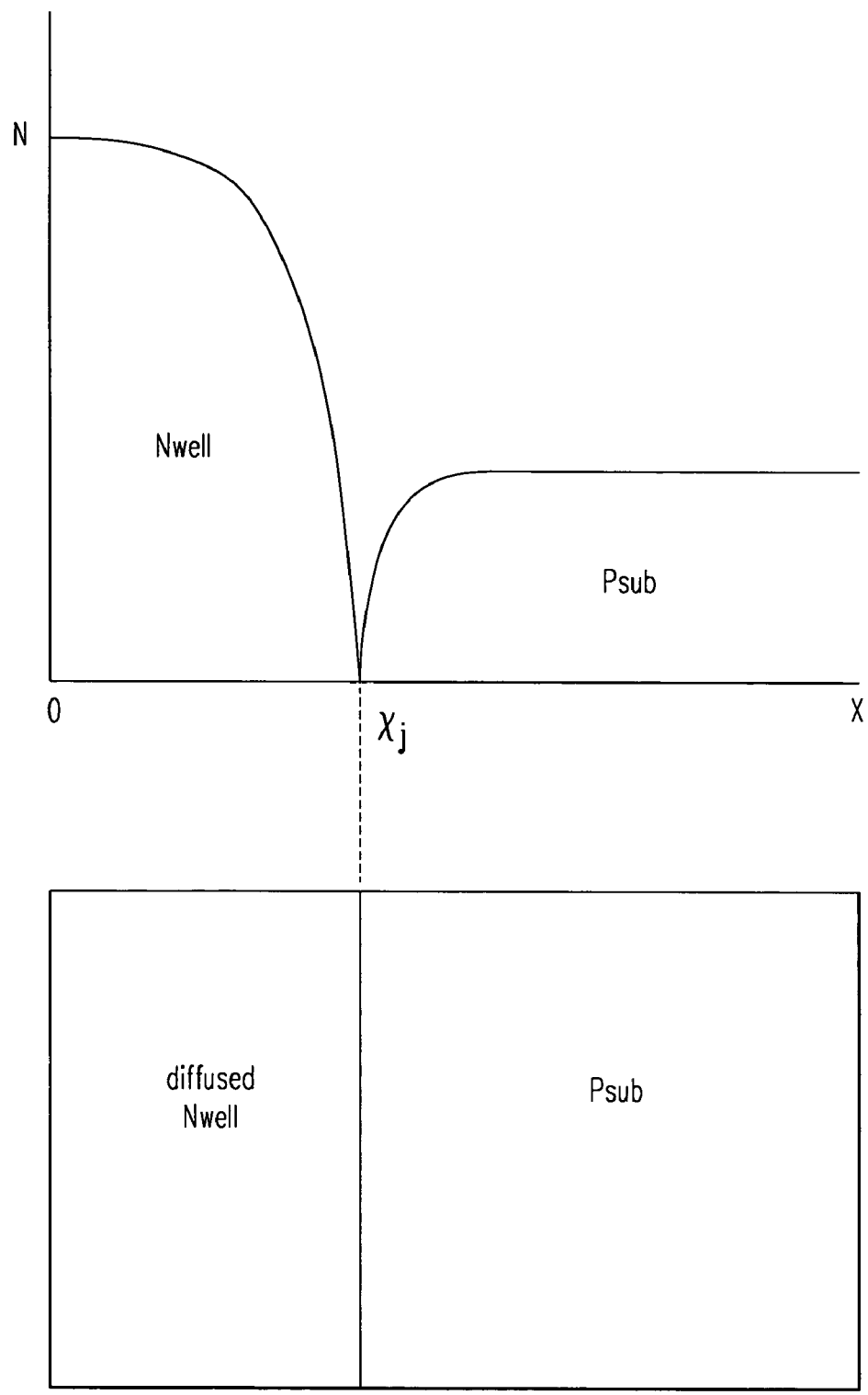
FIG. 7A illustrates the doping profile of a conventional diffused N well.

As background, FIG. 7A illustrates the doping profile of a diffused N-type well formed in a P-type substrate according to the prior art. The top portion is a graph of the doping concentration (vertical axis) as a function of the depth below the surface of the substrate (horizontal axis). The bottom portion is a physical representation of the N well in the P substrate which conforms with the horizontal axis of the graph. As is apparent, the doping concentration of the N well is at a maximum at or very near the surface of the substrate and decreases as a Gaussian function with increasing depth in the substrate until it reaches zero at the depth "$x_j$", which represents the PN junction between the N well and the P substrate. This Gaussian doping profile is essentially unchangeable in wells than are formed by ion implantation and thermal diffusion. In practice, it is very limiting, because one cannot get dopant to a deep level without altering the concentration at the surface and because the depletion region formed around the junction between the N well and P substrate will spread very quickly into the N well because the doping concentration is relatively low directly above the junction, which could cause interactions between the junction and other junctions within the N well. Also since the highest concentration is located at the surface, the lowest junction breakdowns may occur at the silicon surface (exacerbating the surface electric fields which are already higher due to the presence of the silicon dioxide and various conductors leading to field plate effects) and where damage to dielectric from hot carriers may result. Thus, in many situations it would be desirable to have a well with a non-Gaussian doping profile.

Figure 7B:
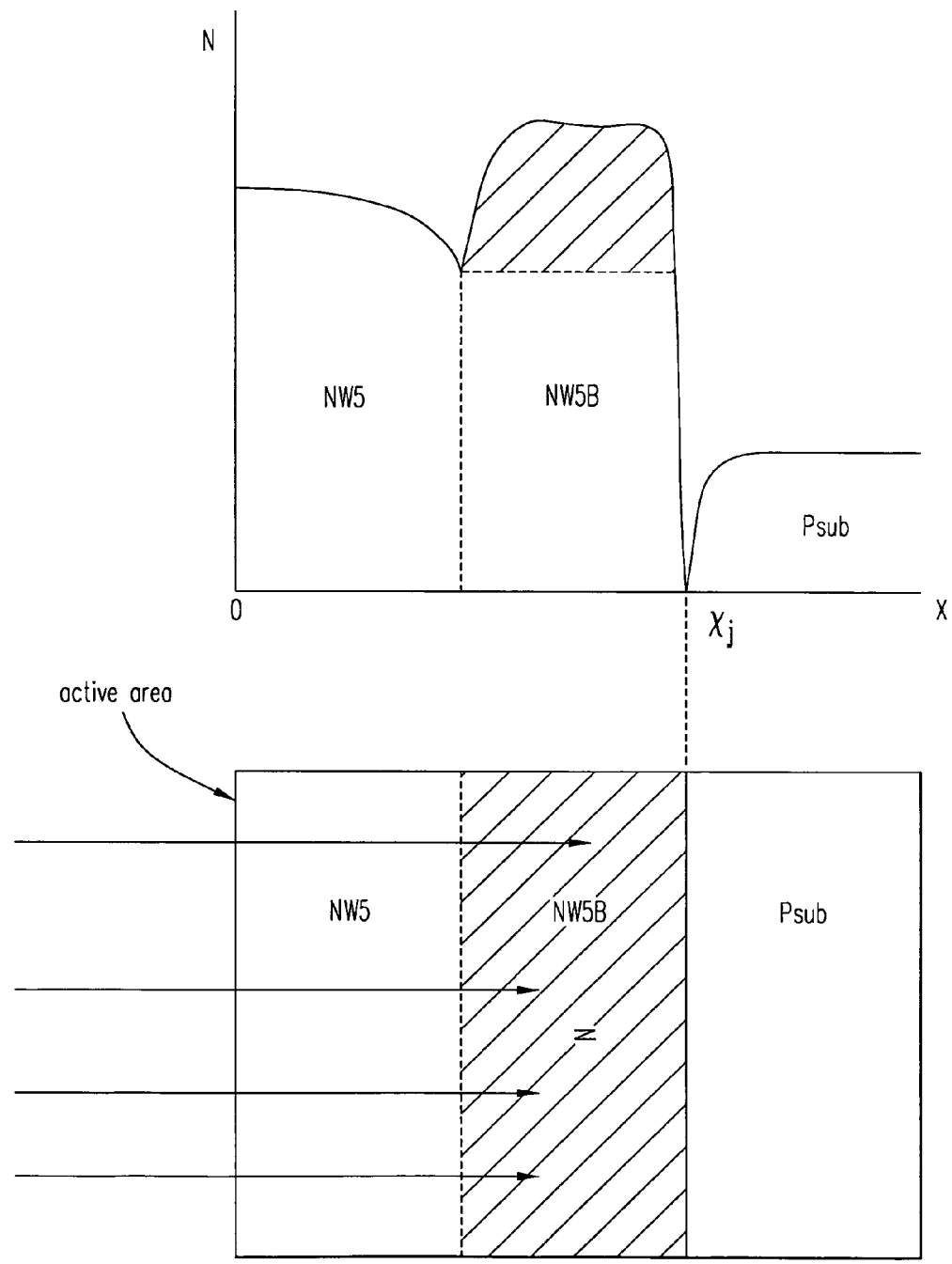
FIG. 7B illustrates the doping profile of a conventional diffused N well with an N layer implanted into the N well.
Figure 7C:
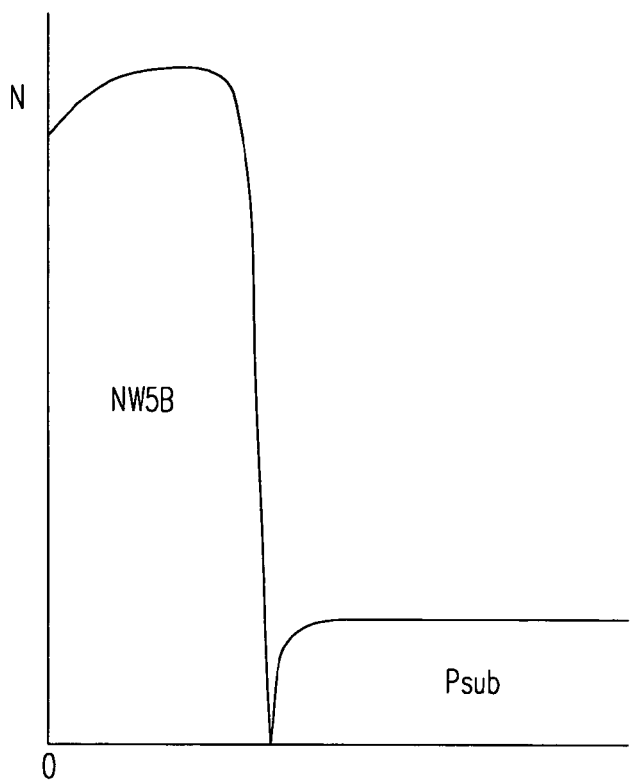
FIG. 7C illustrates the doping profile of the structure shown in FIG. 7B with an oxide layer overlying the surface of the substrate.
Figure 7C:
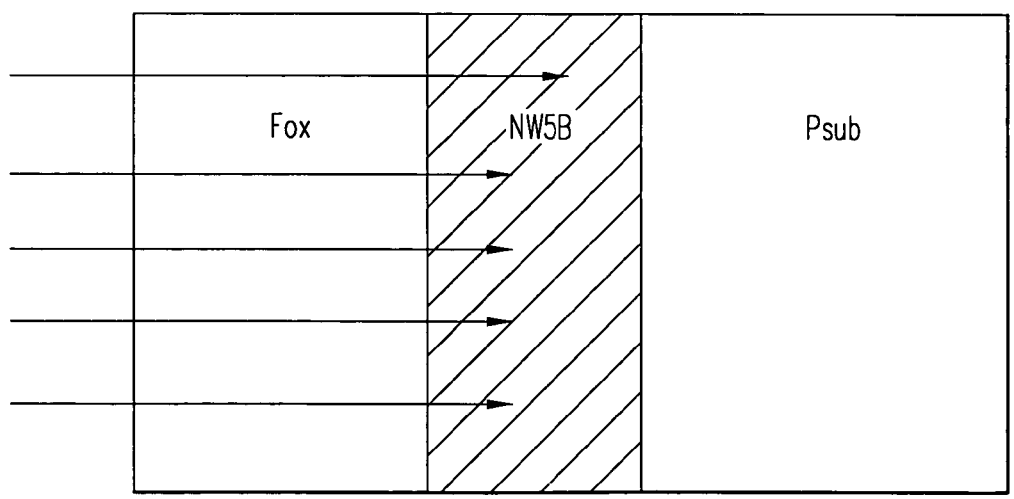

FIG. 7B shows similar information when an N layer has been implanted in the N well in an active area of the substrate at a higher energy than that used to implant the N well. "NW5" represents the diffused N well, and "NW5B" represents the implanted N layer. As indicated, the doping concentration in the N well declines as shown in FIG. 7A until it reaches the N layer, where it actually increases (and may then flatten out) until it reaches the P substrate. The concentration of the buried region may be 20% higher than the top well's peak concentration or in some instances it may be double the concentration. FIG. 7C shows the structure of FIG. 7B in an inactive area of the substrate, where the P substrate is covered by a field oxide layer (Fox). Here, the original N well is substantially blocked by the field oxide layer, and all that is visible within the silicon portion of the device is the N layer "NW5B". In accordance with one aspect of this invention, this concept is used to fabricate a variety of completely isolated devices, with different voltage ratings, on a single substrate, using a minimal number of processing steps. That is to say, the field oxide layer and the implant energies are engineered such that a subsurface layer of enhanced conductivity is formed in the active regions of the substrate, and that same layer is formed at or near the surface of the substrate under a field oxide layer in the inactive areas of the substrate. This layer helps to suppress parasitic interactions between transistors formed in the substrate without requiring added field threshold implants under the field oxides. Such field implants are undesirable, since being implanted prior to field oxidation, substantial diffusion of field threshold implants occurs during field oxidation. The lateral diffusion of field threshold implants in conventional methods thereby interferes with operation of devices, especially narrow or short ones, and prevents the benefit of maximizing device packing densities from being fully realized. Using the buried well doping to help achieve higher field threshold is therefore advantageous in comparison with older conventional prior art methods.

In the embodiment described herein, five implants are used to form a variety of device structures: a 5V N well implant NW5, a 5V P well implant PW5, a 5V N layer NW5B, a 5V P layer PW5B, and a deep N layer DN. Each one of these implants could be a single implant or series or "chain" of implants at particular doses and energies designed to achieve a particular doping profile for the implant.

Figure 8A:
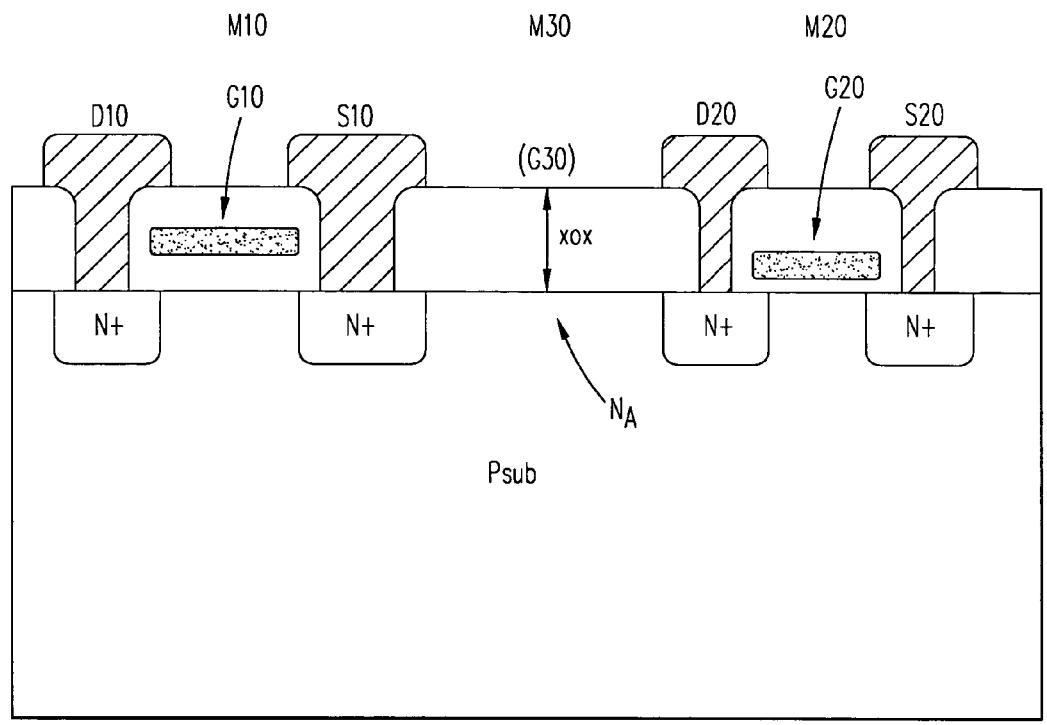
FIG. 8A is a cross-sectional view and FIG. 8B is a schematic diagram showing the formation of a parasitic MOSFET between two adjacent lateral MOSFETs when no field oxide layer is located between the MOSFETs.
Figure 8B:
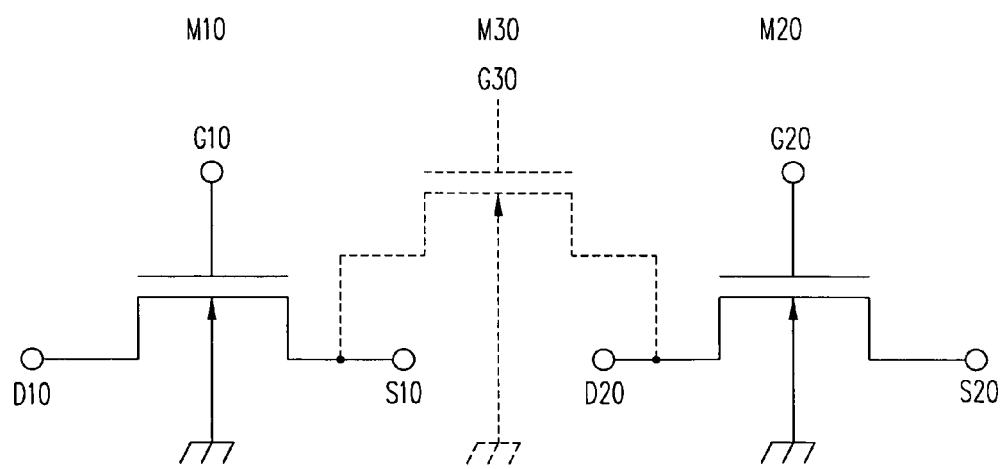

FIG. 8A is a cross-sectional view and FIG. 8B is a schematic view of two MOSFETs M10 and M20 formed adjacent to each other in a P substrate. MOSFET M10 has a source S10, a drain D10 and a gate G10. MOSFET M20 has a source S20, a drain D20 and a gate G20. The background doping concentration of the P substrate is $N_A$. A field oxide layer having a thickness $X_{OX}$ is located between source S10 and drain D20. As indicated in FIG. 8B, charge on the surface of the field oxide layer can create a parasitic MOSFET M30 between MOSFETs M10 and M20, and this parasitic MOSFET M30 can conduct current if the voltage of source S10 is different from the voltage of drain D20. The only way to ensure that the parasitic MOSFET M30 does not conduct current is to make sure that the combination of the thickness $X_{OX}$ of the field oxide layer and the doping concentration beneath the field oxide layer are such that the parasitic MOSFET M30 has a threshold voltage that is high enough to prevent it from turning on at the rated voltage of the arrangement plus a margin of safety. This is referred to as the "field threshold" of the device, i.e., the threshold voltage of a parasitic MOSFET in the field oxide area that separates the active areas of the substrate.

Figure 9B:
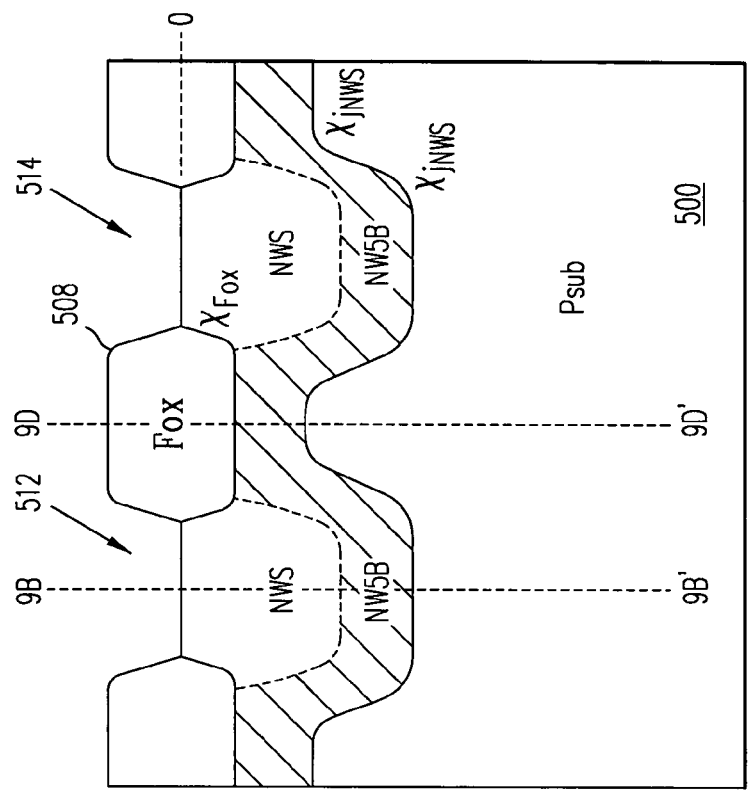
FIG. 9B is a cross-sectional view showing an alternative structure wherein a field oxide layer is formed in a P substrate.
Figure 9A:
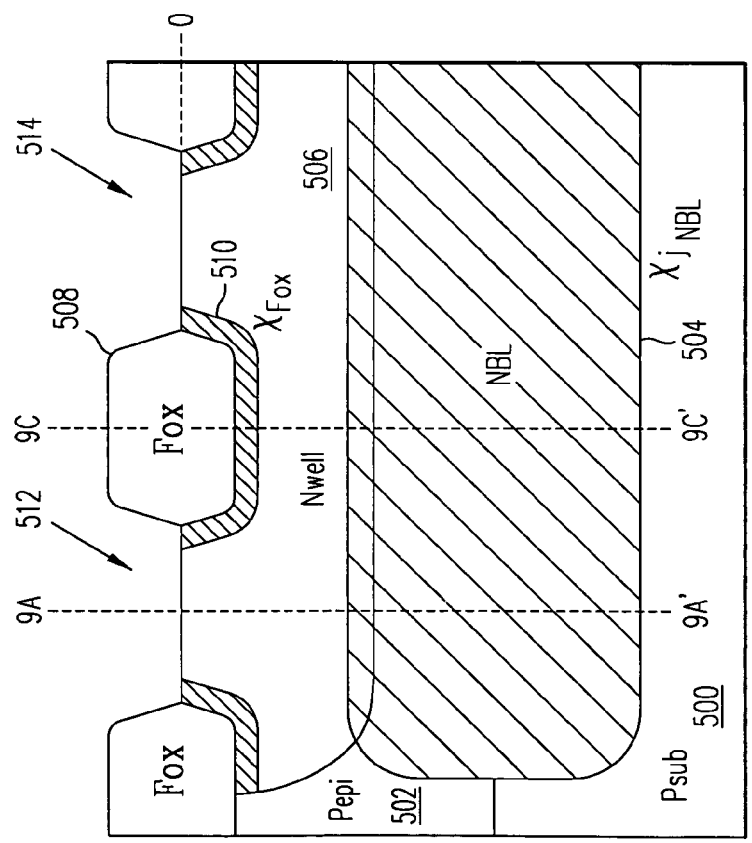
FIG. 9A is a cross-sectional view showing a field oxide layer between two active regions in an N well formed in a P epitaxial layer.
Figure 9D:
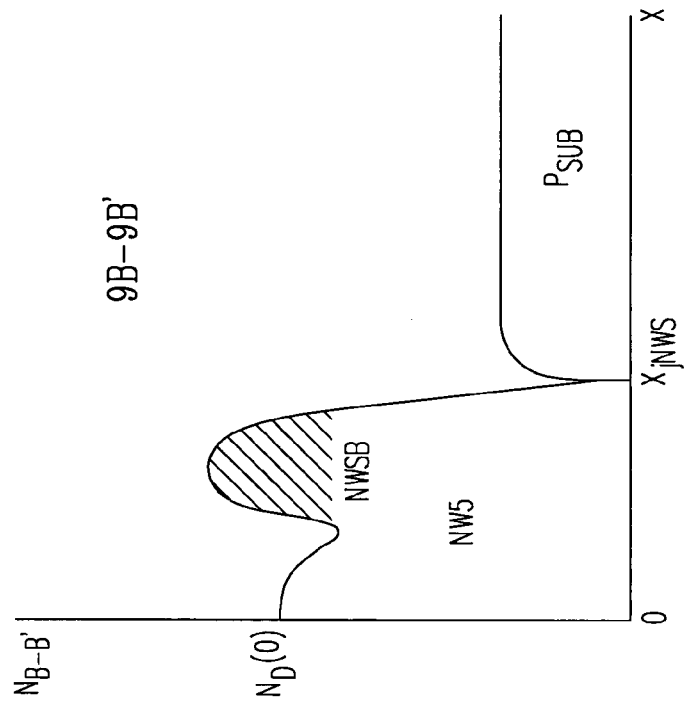
FIG. 9D shows the doping profile at cross-section 9B–9B' of FIG. 9B.
Figure 9C:
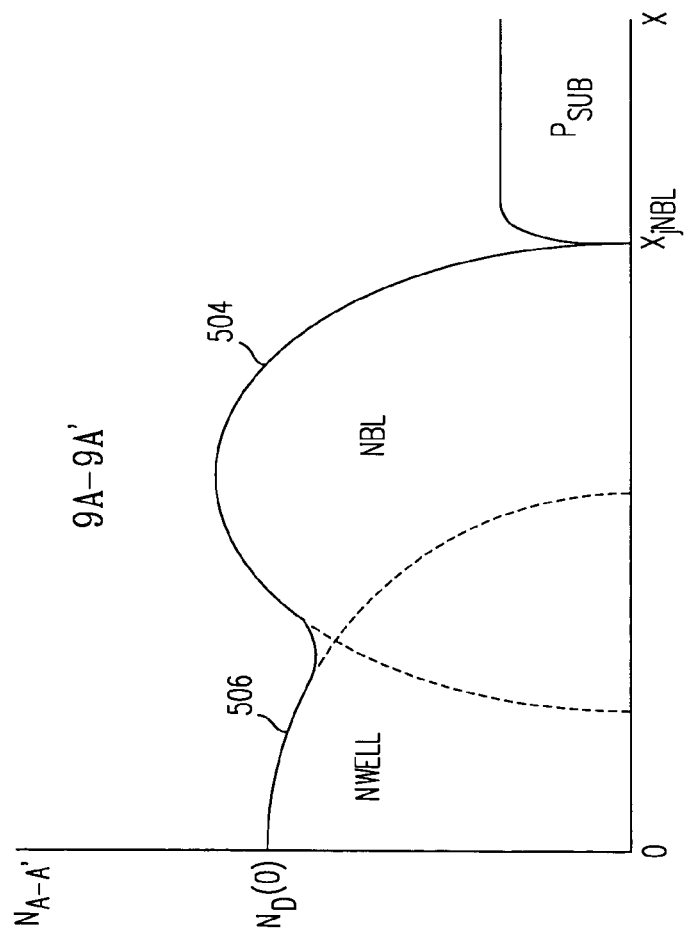
FIG. 9C shows the doping profile at cross-section 9A–9A' of FIG. 9A.

FIG. 9A shows a conventional structure with a P epitaxial (P-epi) layer 502 formed on a P substrate 500. An N buried layer (NBL) 504 is formed by conventional means at the interface between P-epi layer 502 and P substrate 500, by implanting an N-type dopant such as phosphorus into P substrate 500 before P-epi layer 502 is formed. An N well 506 overlaps N buried layer 504. A field oxide layer 508 is formed between active areas 512 and 514, and a field dopant region 510 is formed under field oxide layer 508 to raise the field threshold voltage and thereby prevent conduction between MOSFETs (not shown) formed in active areas 512 and 514, respectively. Despite being self-aligned to the field oxide region 508, field implant 510 naturally diffuses into the active areas 512 and 514 and may adversely affect the electrical characteristics of devices produced in those regions. FIG. 9C shows the doping profile through cross-section 9A–9A', the active area 512, and FIG. 9E shows the doping profile through cross-section 9C–9C', the field oxide layer 508. In both cases, the N buried layer 504 is relatively thick, e.g., 1 to 3 μm thick and in some cases as thick as 5 μm, and extends relatively deep into P substrate 500, e.g., 6 to 10 μm below the surface, and also diffuses laterally by comparable amounts.

FIG. 9B shows a greatly improved alternative structure consistent with the inventive methods disclosed herein in which the field oxide layer 508 is formed directly in P substrate 500. A 5V N well NW5 is implanted and diffused in active areas 512 and 514, and an N layer NW5B is subsequently implanted, or preferably NW5 and NW5B are formed using a chained implant where the energy of the NW5 implant is chosen so that it cannot penetrate field oxide 508, but where NW5B has an implant energy sufficient to penetrate field oxide 508 and reach the silicon surface. Depending on the field oxide thickness the buried implant may be implanted at a 20% to 200% higher dose than the top well with as much as 1.5 to 3 times the energy of the top well implant.

As described above in connection with FIGS. 7A–7C, layer NW5B provides isolation for devices formed in active areas 512 and 514 where layer NW5B is below the surface, and also provides field doping below field oxide layer 508 where layer NW5B approaches or is centered on the surface. In FIG. 9B, the retrograde portion of the 5V N well (i.e. NW5B) is therefore subsurface in active regions 512 and 514 but reaches the surface under field oxide 508. Because the region of NW5B is implanted through field oxide 508, and reaches the surface under field oxide 508 (and only under field oxide regions), the heavily doped portion of the implant is "self aligned" to the field oxide with virtually no lateral diffusion, and contours itself to the shape of the LOCOS slope (bird's beak). FIG. 9D shows the doping profile at cross-section 9B–9B' where the lower edge of layer NW5B is relatively shallow, e.g., only 1.5 to 4 μm below the surface. FIG. 9F shows the doping profile at cross-section 9D–9D' under the field oxide, where only the N layer NW5B is present within the silicon.

Thus FIGS. 9A–9F show that using a single implanted layer to provide isolation in the active regions and a field dopant in the inactive regions produces a much shallower, tighter structure than using an epitaxially-formed buried layer in the active areas and a separate field dopant in the inactive areas. Moreover, the improved structure shown follows the topography of the field oxide, a characteristic not exhibited by the diffused well process. One unique challenge of the inventive approach herein is to use this concept in a structure with both 5V and 12V devices or with any combination of integrated devices of differing voltages. In so doing, it is also important to minimize the variability of the device laterally through self-alignment and vertically through the use of ion implanted subsurface layers rather than epitaxial buried layers.

Figures 10A, 10B:
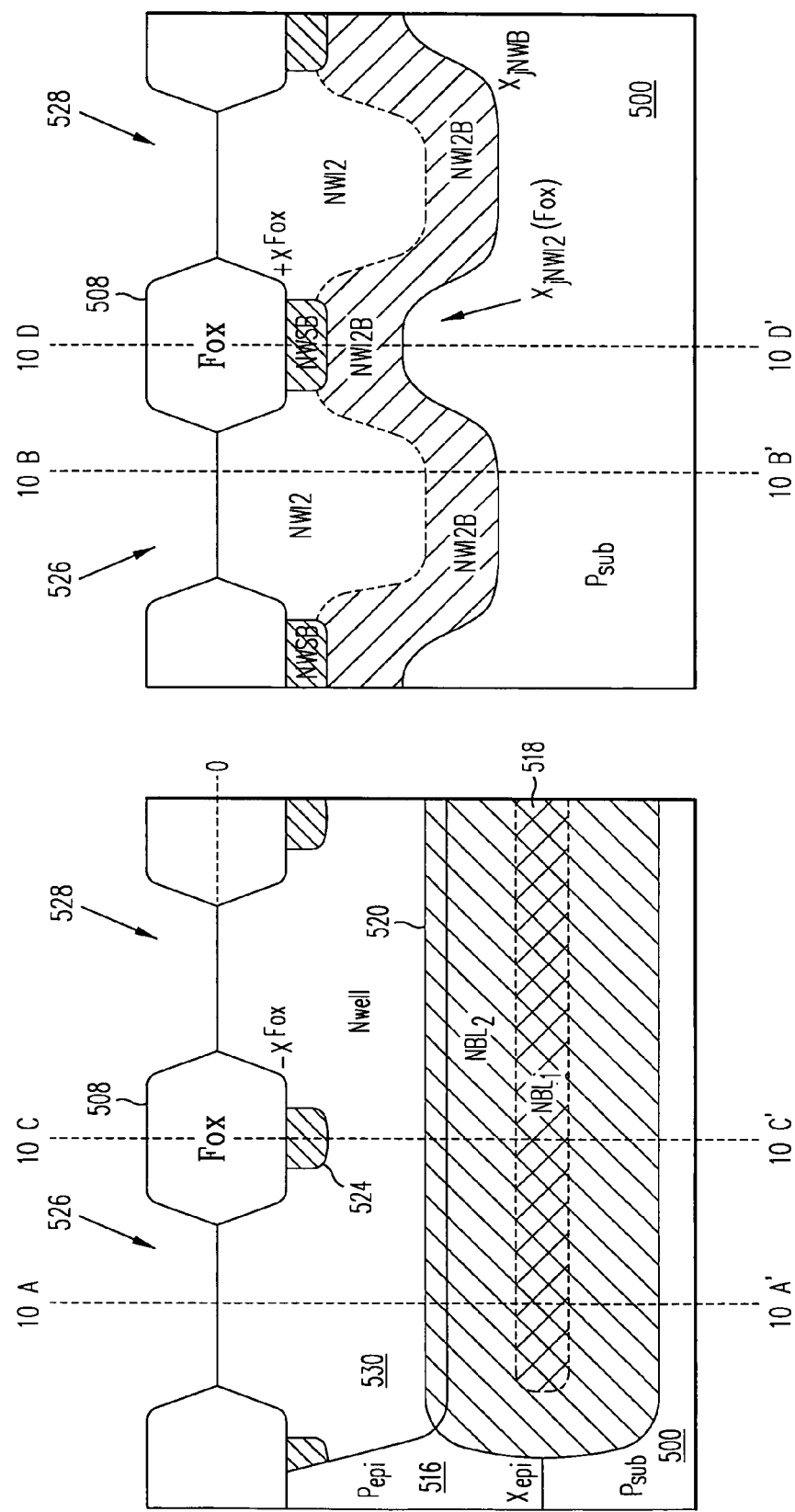
FIG. 10A is a cross-sectional view of a conventional isolated 12V N well formed in a P epitaxial layer grown on a P substrate.
FIG. 10B is a cross-sectional view of an isolated 12V N well formed in accordance with the invention.

FIG. 10A shows a conventional 12V structure that is formed in a P-epi layer 516 grown on P substrate 500. P-epi layer 516 would typically be thicker than P-epi layer 506, shown in FIG. 9A. Two N buried layers 518 and 520 are formed at the interface of P-epi layer 516 and P substrate 500. N buried layer 518 is formed with a relatively slow-diffusing dopant such as antimony or arsenic and N buried layer 520 is formed of a relatively fast-diffusing dopant such as phosphorus. An N well 530 overlaps N buried layer 520, and a field oxide layer 508 separates active regions 526 and 528. To raise the field threshold, a field dopant 12V guard ring 524 underlies field oxide layer 508.

The 12V N-type guard ring is generally not self-aligned to field oxide 508. With misalignment, the guard ring may overlap into active areas 526 or 528 and adversely affect the electrical characteristics of devices produced in those regions. In extreme cases of misalignment, the guard ring can lower the breakdown voltage of the device produced in the N well below its 15V (12V operating) required rating. Even if guard ring 524 were somehow self-aligned to the field oxide region 508, implant 524 naturally diffuses laterally into the active areas 526 and 528 and may adversely affect the electrical characteristics of devices produced in those regions. To prevent this problem, the minimum dimension of field oxide 508 must then be increased, lowering the packing density of the devices.

Figures 10E, 10F:
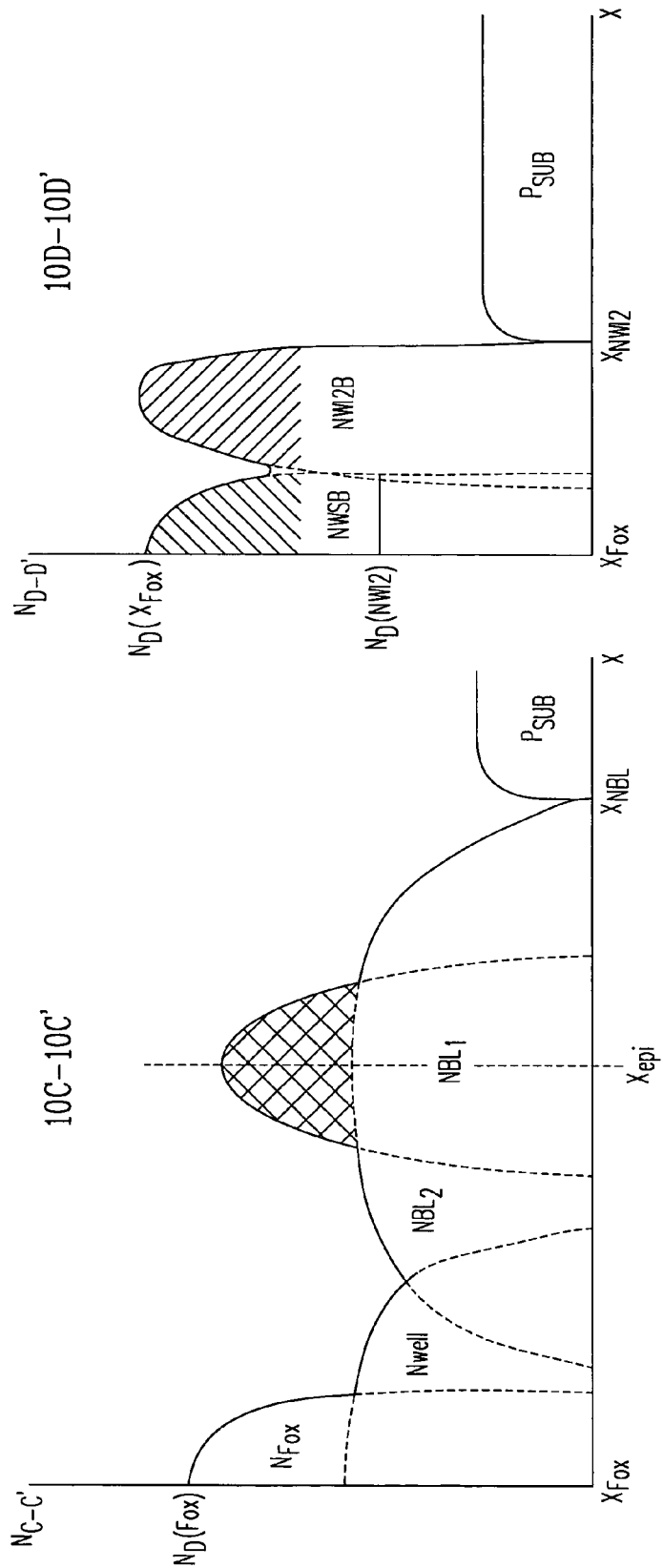
FIG. 10E shows the doping profile at cross-section 10C–10C' of FIG. 10A.
FIG. 10F shows the doping profile at cross-section 10D–10D' of FIG. 10B.

FIG. 10C shows the active-area doping profile at cross-section 10A–10A' and FIG. 10E shows the non-active area doping profile at cross-section 10C–10C'. Since the N+ buried layer is located at the epi-substrate interface and the N well is diffused from the top of the epitaxial layer, the degree of overlap between the buried layer and the N well is highly variable. If the fast-diffusing lighter-concentration $NBL_2$ layer (520) were not present, higher concentration $NBL_1$ (518) would have to overlap onto N well 530, and including variation in epitaxial thickness, could degrade the breakdown of devices formed in N well 530.

Moreover, the dopant profile of the 12V N well shown in FIGS. 10A and 10C is dramatically different from the dopant profile of the 5V N well shown in FIGS. 9A and 9C because the heavier doped buried layer must be located farther from the surface in the 12V device. If the 12V N well of FIG. 10A were used to fabricate a 5V device (normally made in an N well like that of FIG. 9A), the buried layer would have less effect in improving the 5V device because it is too deep to influence a lower voltage device. Using a 12V N well, the snapback breakdown in a 5V PMOS would be worse, as would the collector resistance in a 5V NPN. So the N well and NBL structure needed for optimizing 5V devices is different than that of 12V devices. Since the epitaxial thickness of both processes is different, the conventional 5V N well/buried-layer of FIG. 9A and the 12V N well/buried-layer of FIG. 10A are incompatible and mutually exclusive in a single epitaxial deposition process.

FIG. 10B shows a 12V structure in accordance with the invention. 12V N wells NW12 are implanted and diffused into P substrate 500 after field oxide layer 508 is grown, separating active areas 526 and 528. Given the enhanced concentration of N layer NW5B, field oxide layer 508 must therefore be thick enough to meet the 12V criteria as well as the 5V criteria. The doping concentration on 12V N well NW12 is lighter than the doping of 5V N wells NW5. An N layer NW12B is implanted and forms an isolation layer for the 12V N wells in active areas 526 and 528 and approaches the surface under field oxide layer 508. Because the 12V N well NW12 is relatively deep, N layer NW12B must be implanted at a higher energy than N layer NW5B. Because of the implant energy of N layer NW12B and the thickness of field oxide layer 508, however, N layer NW12B does not reach the surface of P substrate under field oxide layer 508. Instead there is a gap, which would allow the parasitic MOSFET represented by field oxide layer 508 to turn on and allow a leakage current between active areas 526 and 528. To fill this gap, the structure is masked, and the N layer NW5B is allowed to pass through field oxide layer 508, forming an additional guard ring and yielding the structure shown in FIG. 10B. Thus the dose of N layer NW5B must be set to prevent inversion under field oxide layer 522 between the 12V devices.

The NW5B implant is not self aligned to the field oxide 508. Even so, it remains less sensitive to misalignment than guard ring 524 in FIG. 10A, since it is implanted after the formation of field oxide 508 and therefore follows the topography of the field oxide, (meaning it is deeper in active regions and less likely to adversely influence the operation of a device formed in NW12). Furthermore, the lateral diffusion of NW5B is minimal since it sees no high temperature processing unlike guard ring 524 (which necessarily experiences the entire field oxidation drive in diffusion cycle. FIG. 10D shows the active area doping profile at cross-section 10B–10B' and FIG. 10F shows the doping profile at non-active area cross-section 10D–10D'.

Both active and field dopant profiles illustrate the compact well-controlled minimally-diffused well structure of an "as-implanted" low thermal-budget process.In this method 12V devices can be produced using wells as shallow as a few microns. FIG. 10F shows how N layers NW5B and NW12B overlap under field oxide layer 508 in the 12V area. N layer NW12B could extend only 1.5 µm below the surface of P substrate 500. This shallow depth is obtained because there is no substantial thermal budget to redistribute the dopants. In contrast, the very thick N buried layer 520 of FIG. 10C and FIG. 10E could extend 10 to 14 µm below the surface.

Since N layer NW5B was already used in the 5V areas (FIG. 9B) the introduction of N layer NW5B in the 12V areas does not require an additional implant or masking step. This distinguishes the process of this invention from the prior art shown in FIG. 10A, where a dedicated field dopant 524 must be implanted in a separate masking and implant step. Moreover the process of this invention allows the integration of both 5V N well regions NW5 and 12V N well regions NW12 without complication or interaction since it remains an all integrated process. As stated above, the use of conventional epitaxially formed buried layer structures for integrating 5V and 12V devices is problemmatic, since each type of device requires a different epitaxial thickness.

Figures 10G, 10H, 10I:
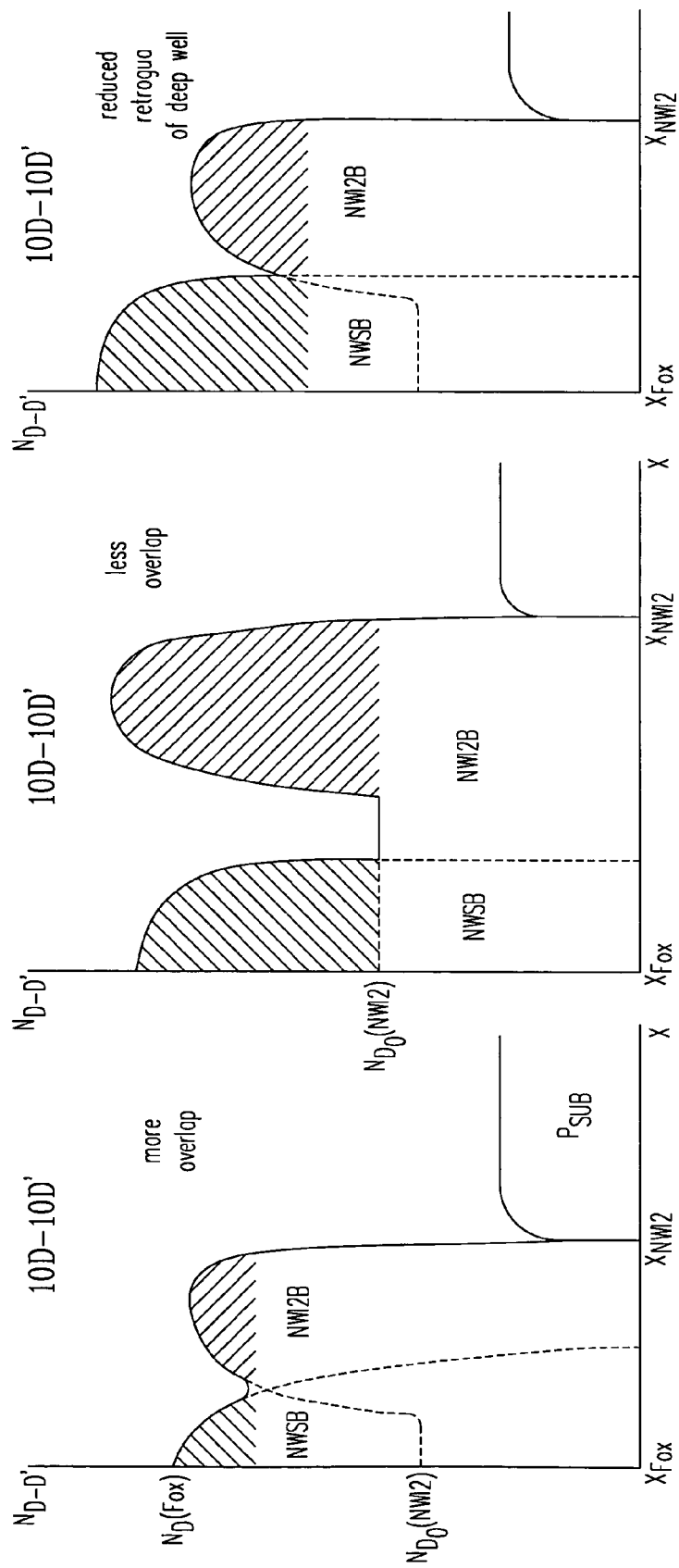
FIGS. 10G–10I show alternative doping profiles that can be obtained at cross-section 10D–10D' of FIG. 10B by varying the implant energies of the N layers.

FIGS. 10G–10I show how the doping profiles at cross-section 10D–10D' can be varied by altering the energies at which N layers NW5B and NW12B are implanted. In FIG. 10G either the implant energy of N layer NW5B has been increased or the implant energy of N layer NW12B has been reduced and as a result the overlap between these layers is increased. In FIG. 10G either the implant energy of N layer NW5B has been reduced or the implant energy of N layer NW12B has been increased and as a result the overlap between these layers is eliminated, with the background doping of the 12v N well prevailing in the area between the two layers. In FIG. 10I the dose of the implant of N layer NW12B has been reduced to give a doping profile that is more similar to Gaussian. The as-implanted low-thermal budget method of this invention offers many advantages over the conventional epitaxial IC process since these dopant profiles do not require changes in an epitaxial process that could affect other devices on the same IC.

FIG. 10J is a cross-sectional view and FIG. 10K is a doping profile taken at cross-section 10D–10D' that show what the result would be if N layer NW5B were not implanted through field oxide layer 508 in the 12V areas. As indicated above, there would be a gap between the upper edge of N layer NW12B and the lower surface of field oxide layer 508, which would allow a leakage current to flow between active areas 526 and 528, unless oxide 508 were excessively thick. Thick field oxide, however, suffers from a long bird's beak (the sloped portion of the oxide) area, and therefore is undesirable for and incompatible with densely packed low voltage devices needed on the same IC.

Figure 10L:
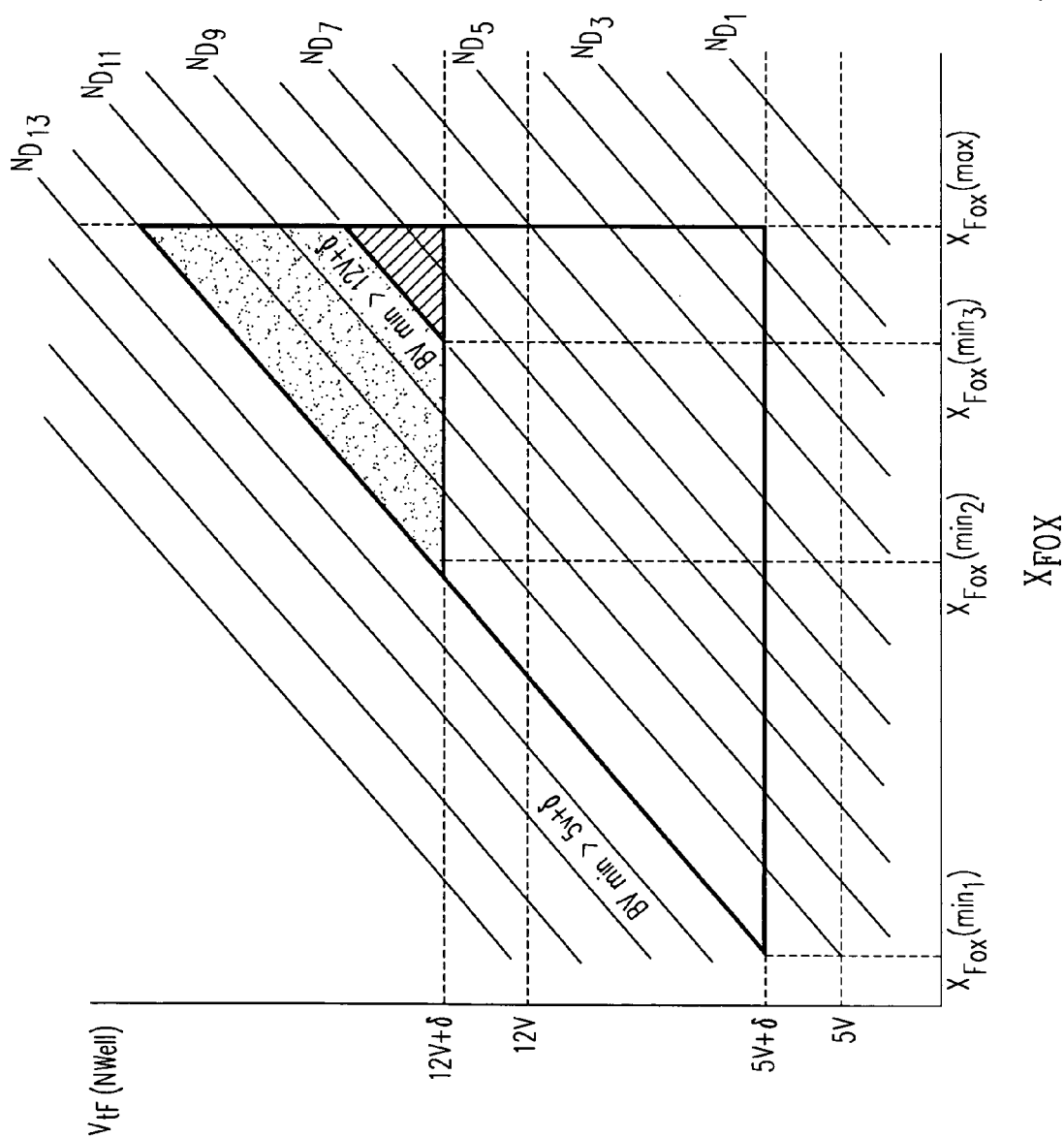
FIG. 10L is a graph showing the field threshold voltage of an N well as a function of the thickness of a field oxide layer for various levels of doping concentration below the field oxide layer.

FIG. 10L is a graph showing the field threshold voltage ($V_{tf}$) of an N well as a function of the thickness of the field oxide layer for various levels of doping concentration ($ND_1$, $ND_2$, etc.) below the field oxide layer. As indicated, for a given doping concentration the field threshold increases roughly linearly with field oxide thickness. The maximum oxide thickness ($X_{FOX}$ (max)) is set by topological and process conditions and by the need to achieve good packing densities in the lower voltage devices. The minimum field threshold is set at 5V or 12V plus some margin of safety ($\delta$). The maximum doping concentration is set by the minimum breakdown voltage ($BV_{min}$) and decreases with increasing $BV_{min}$. Thus a given set of conditions define a triangle. The triangle is relatively large for a minimum field threshold and breakdown voltage of 5V+$\delta$, i.e., the area bounded by $X_{FOX}=X_{FOX}$ (max), $V_{tf}=5V+\delta$, and a doping concentration equal to $ND_{12}$. The triangle is very small, however, for a minimum field threshold and breakdown voltage of 12V+$\delta$, i.e., the area bounded by $X_{FOX}=X_{FOX}$ (max), $V_{tf}=12V+\delta$, and a doping concentration equal to $ND_9$. However, implanting the N layer NW5B under the field oxide layer to assist with raising the field threshold in the 12V regions, but not allowing layer NW5B to get into the active areas increases the field doping concentration without reducing the breakdown voltage. In effect, this increases the size of the triangle, i.e., the hypotenuse goes from $ND_9$ to $ND_{12}$. This provides much greater process flexibility, since much higher doping concentrations can be used.

Figure 11B:
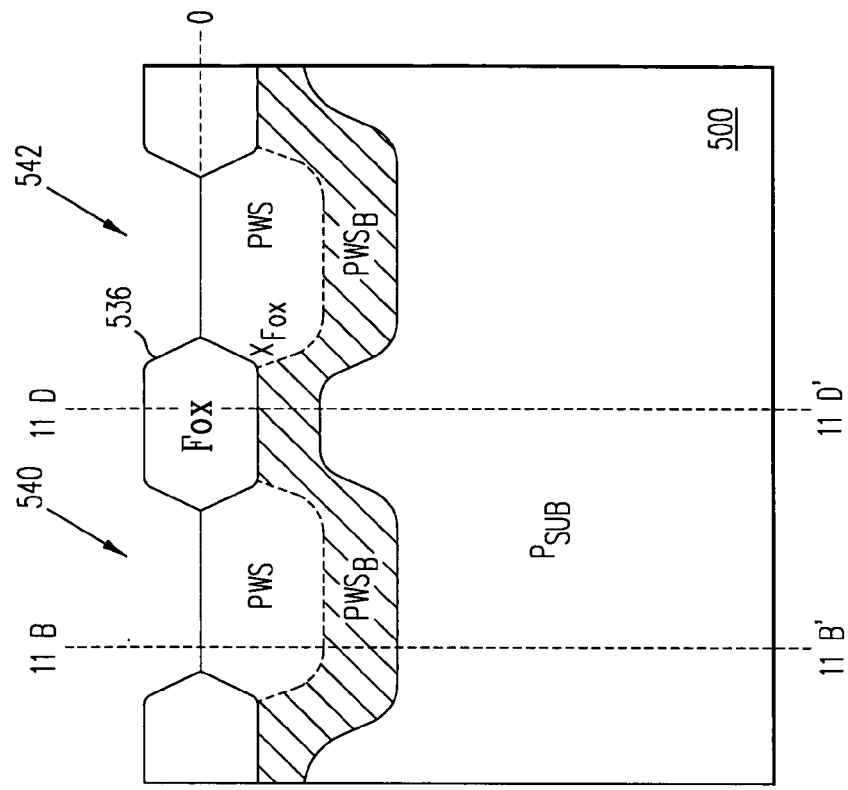
FIG. 11B is a cross-sectional view of a 5V P well formed in accordance with the invention.
Figure 11A:
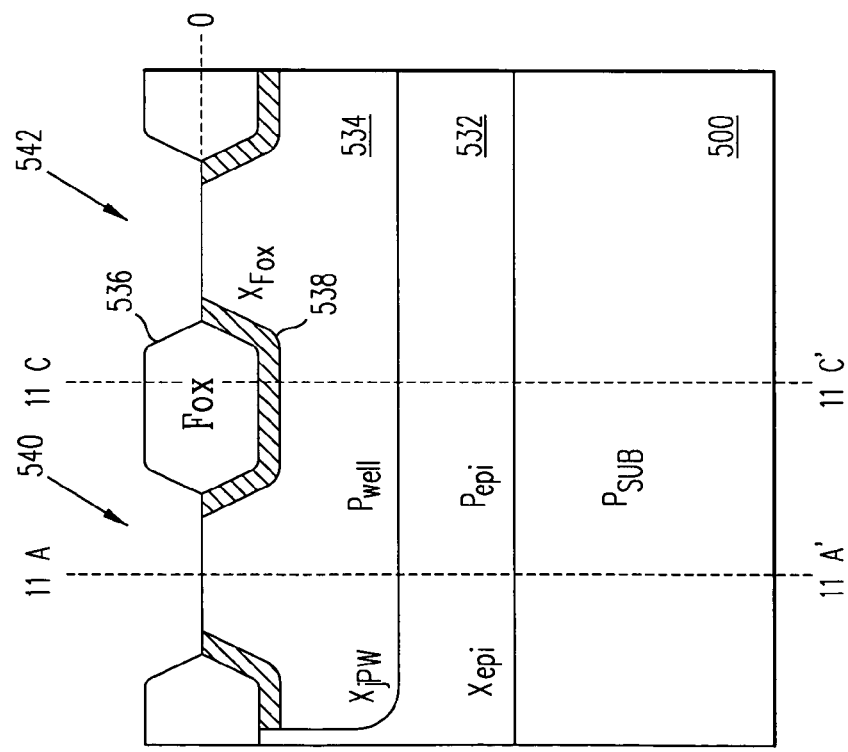
FIG. 11A is a cross-sectional view of a conventional P well formed in a P epitaxial layer grown on a P substrate.

FIG. 11A shows a conventional structure that includes a P well, typical for use at 5V. A P-epi layer 532 is grown on P substrate 500, and a P well 534 is implanted and diffused into P-epi layer 532. Active areas 540 and 542 are separated by a field oxide layer 536, and a field dopant 538 is located under field oxide layer 536. Despite being self-aligned to the field oxide region 536, field implant 538 naturally diffuses into the active area 540 and 542 and may adversely affect the electrical characteristics of devices produced in said regions.

FIG. 11B shows a 5V P well PW5 implanted and diffused into P substrate 500 (there is no epi layer) and a 5V P layer PW5B implanted through field oxide layer 536. 5V P layer PW5B is submerged in active areas 540 and 542 and reaches the bottom of field oxide layer 536 in the inactive areas. In FIG. 11B, the retrograde portion of the 5V P layer PW5B is subsurface in active regions 540 and 542 but reaches the surface under field oxide 536. Because P layer PW5B is implanted through field oxide layer 536, and reaches the surface under field oxide layer 536 (and only under the field oxide layers), the heavily doped portion of the implant is self aligned to the field oxide with virtually no lateral diffusion.

Figures 11C, 11D:
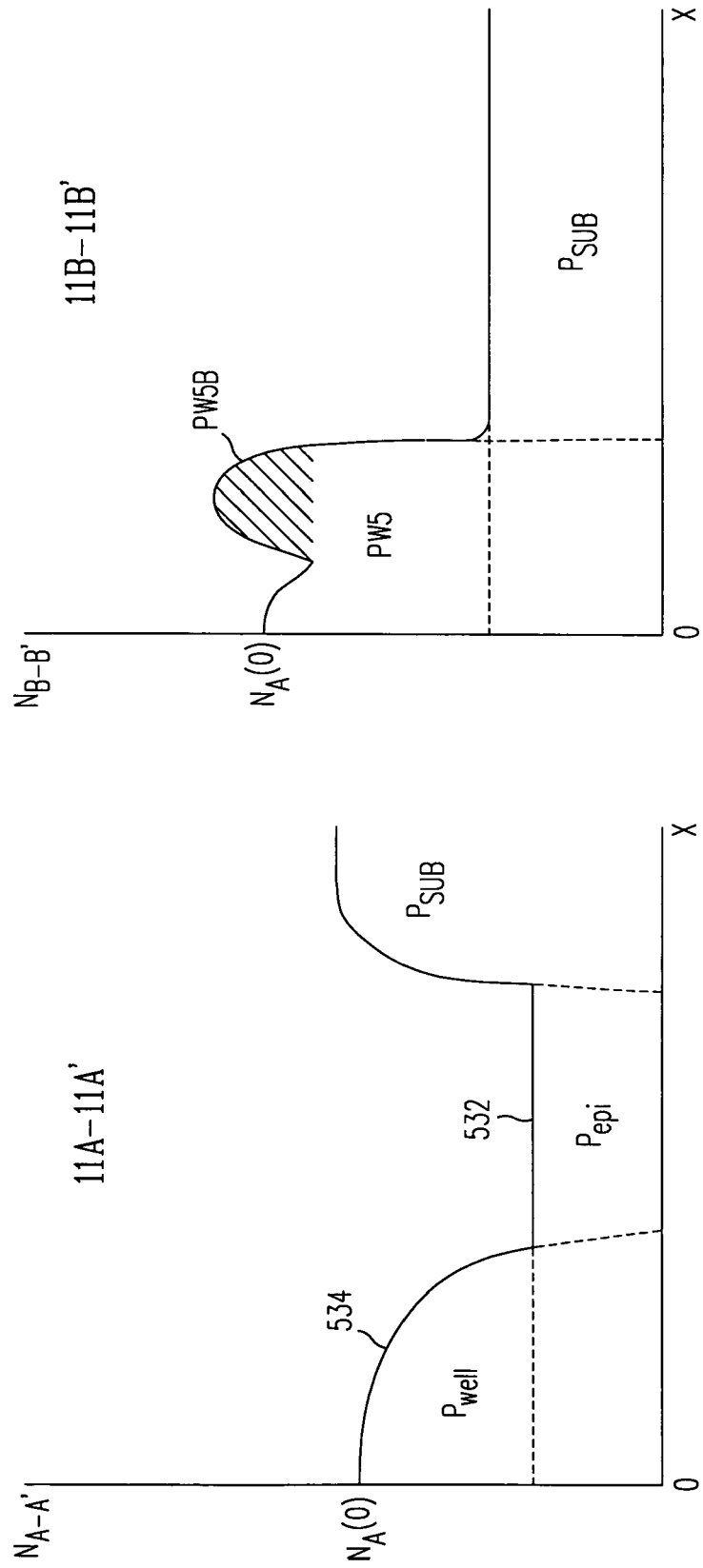
FIG. 11C shows the doping profile at cross-section 11A–11A' of FIG. 11A.
FIG. 11D shows the doping profile at cross-section 11B–11B' of FIG. 11B.
Figure 11F:
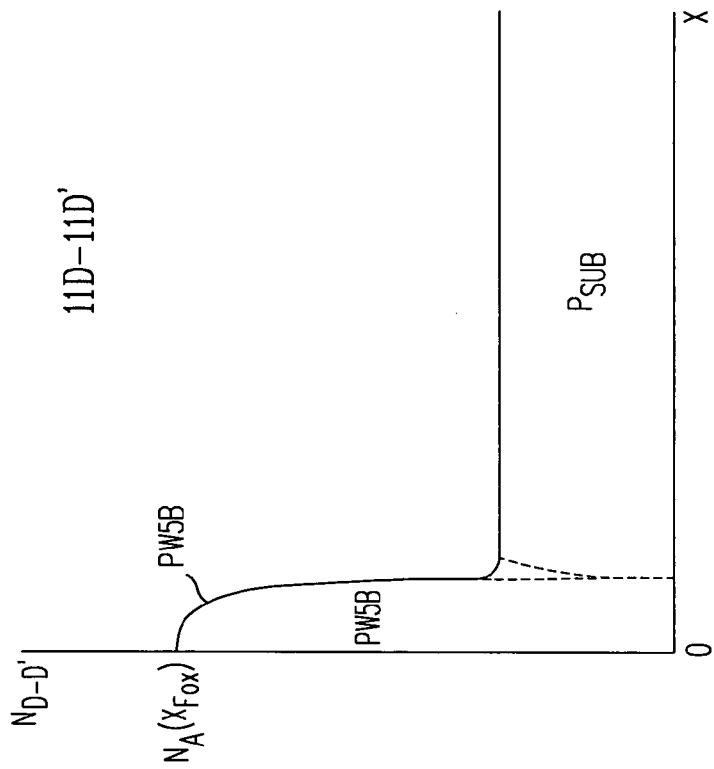
FIG. 11F shows the doping profile at cross-section 11D–11D' of FIG. 11B.
Figure 11E:
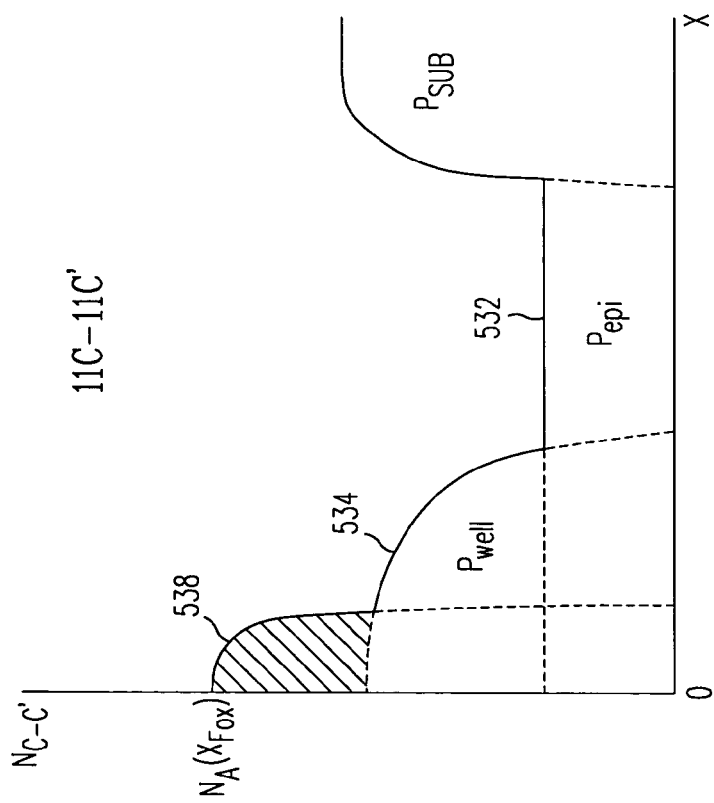
FIG. 11E shows the doping profile at cross-section 11C–11C' of FIG. 11A.

FIGS. 11C and 11D contrast the doping profiles in active area 540 at the active-area cross-sections 11A–11A' and 11B–11B', respectively. This comparison illustrates the dramatic difference in the doping profiles of a conventional LOCOS field oxide and the high-energy ion-implanted version. In the as-implanted version of FIG. 11D, P layer PW5B may have a concentration 20% to 200% that of P well PW5 itself and may be implanted up to 3× the implant energy of the shallow P well PW5 with almost no variation in the degree of overlap of the P well PW5 and the subsurface P layer PW5B. In the conventional version of FIG. 11C there is no buried layer within close proximity to the P well. Therefore, device snapback can be problematic in such structures. Similarly, FIGS. 11E and 11F contrast the doping profiles under the field oxide layer 536 at the cross-sections 11C–11C' for conventional methods and 11D–11D' using the method of this invention, respectively.

Figure 11H:
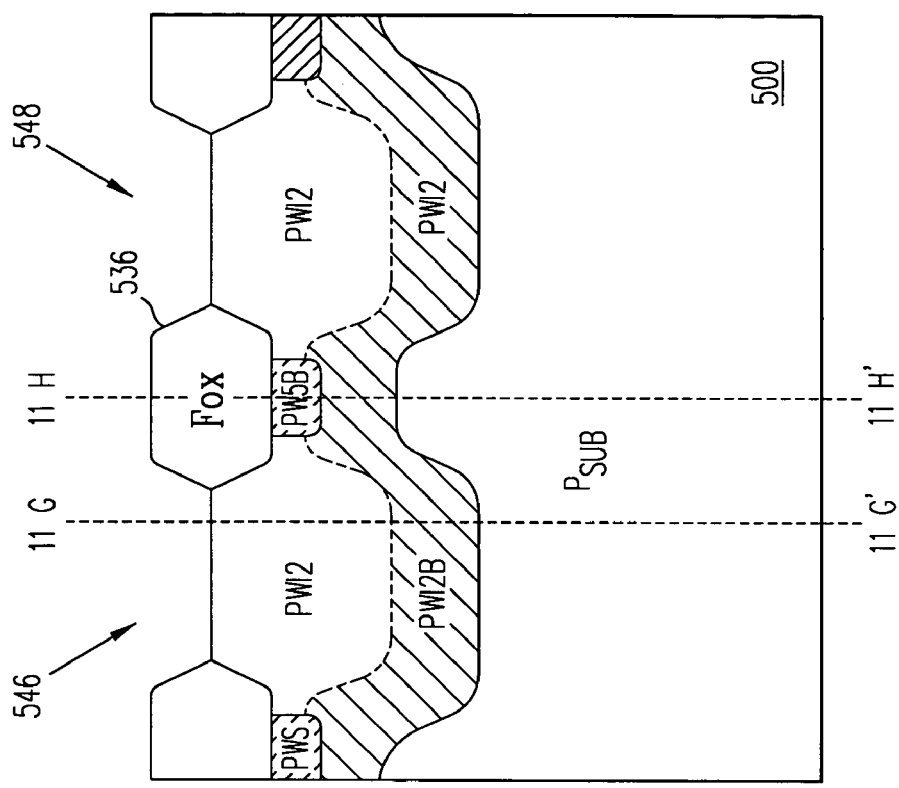
FIG. 11H is a cross-sectional view of a 12V P well formed in accordance with the invention.
Figure 11G:
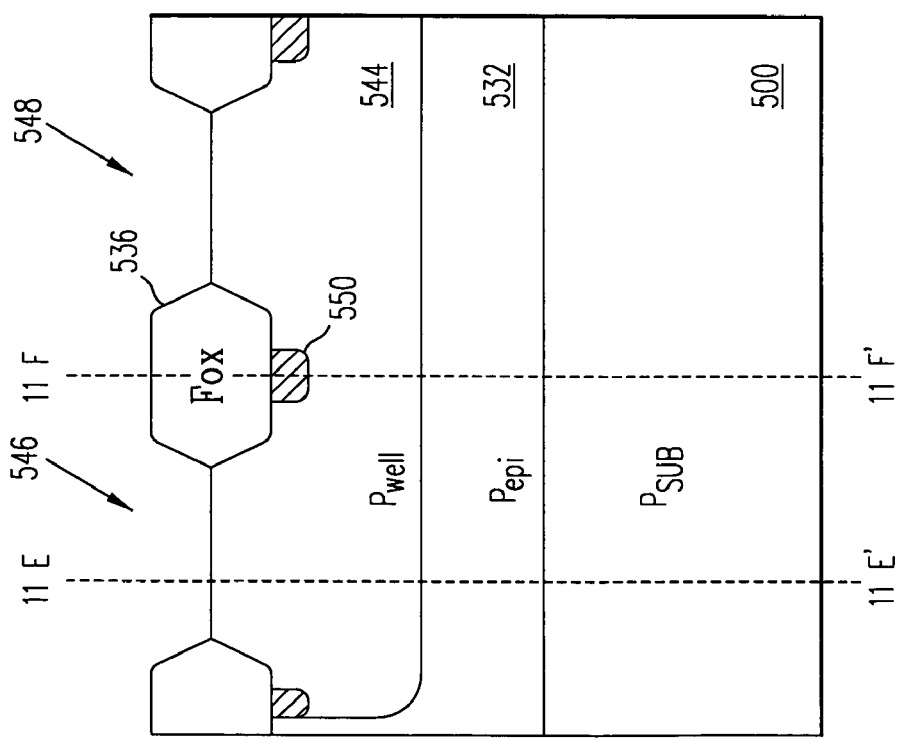
FIG. 11G is a cross-sectional view of a modified version of the structure shown in FIG. 11A with a guard ring under the field oxide layer.

FIG. 11G is a 12V version of a P well formed using a conventional process similar to that of the 5V version of FIG. 11A. To achieve sufficient field thresholds to prevent parasitic surface channels, guard ring 550 is formed under field oxide layer 536 prior to field oxidation. Accordingly, guard ring 550 diffuses laterally and must be spaced far away from active areas 546 and 548 to avoid adversely affecting devices fabricated in the active P well. Moreover, P well 544 must be more lightly doped than its 5V counterpart in FIG. 11A. In an attempt to reduce mask count, the same P well is sometimes used for both 5V and 12V devices. This compromise of under-doping the 5V P well can lead to many problems, especially in causing snapback and punch-through breakdown effects in 5V NMOS. In some cases the minimum allowed channel length for N-channel devices must be lengthened to avoid these issues, but only by sacrificing packing density.

Figure 11J:
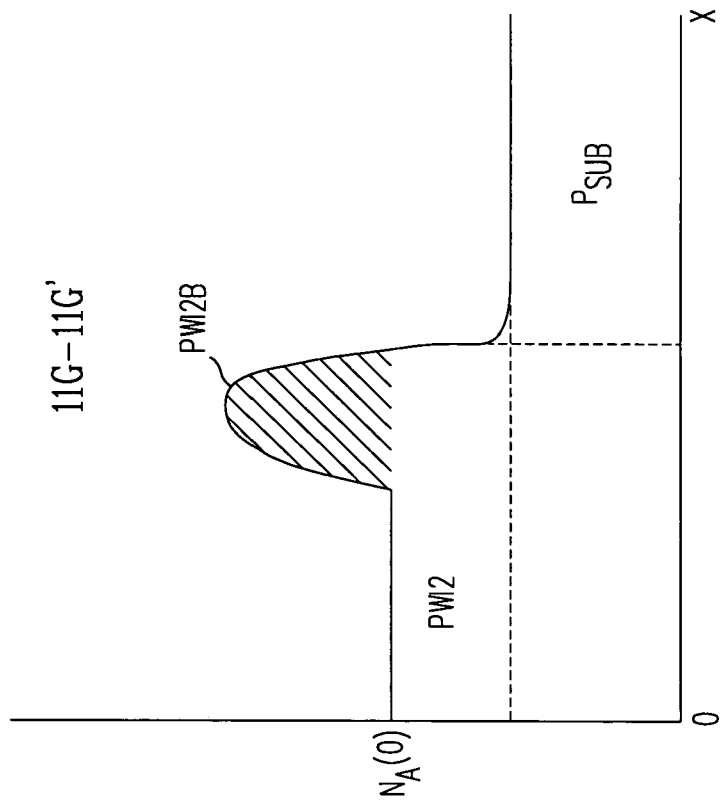
FIG. 11J shows the doping profile at cross-section 11G–11G' of FIG. 11H.
Figure 11I:
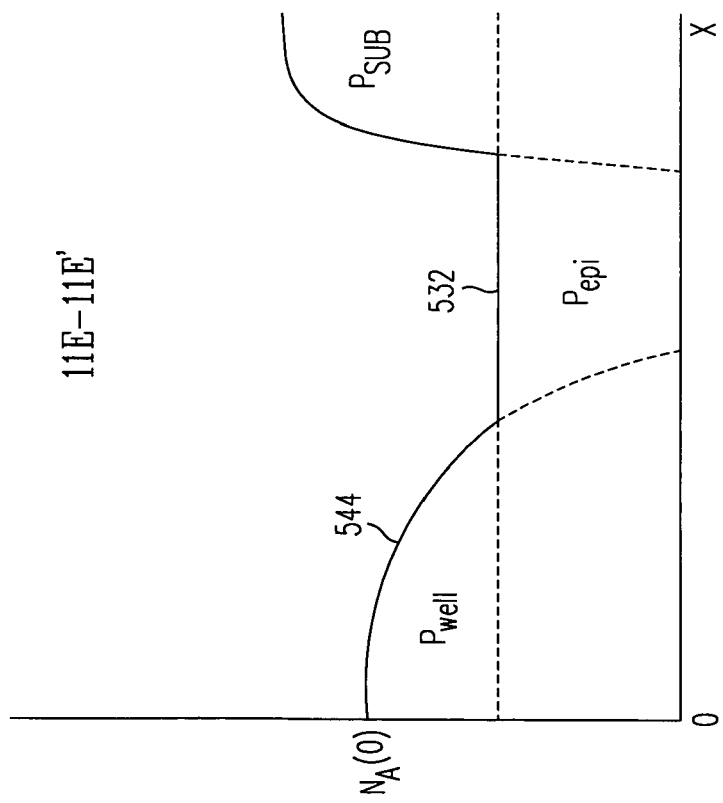
FIG. 11I shows the doping profile at cross-section 11E–11E' of FIG. 11G.
Figure 11K:
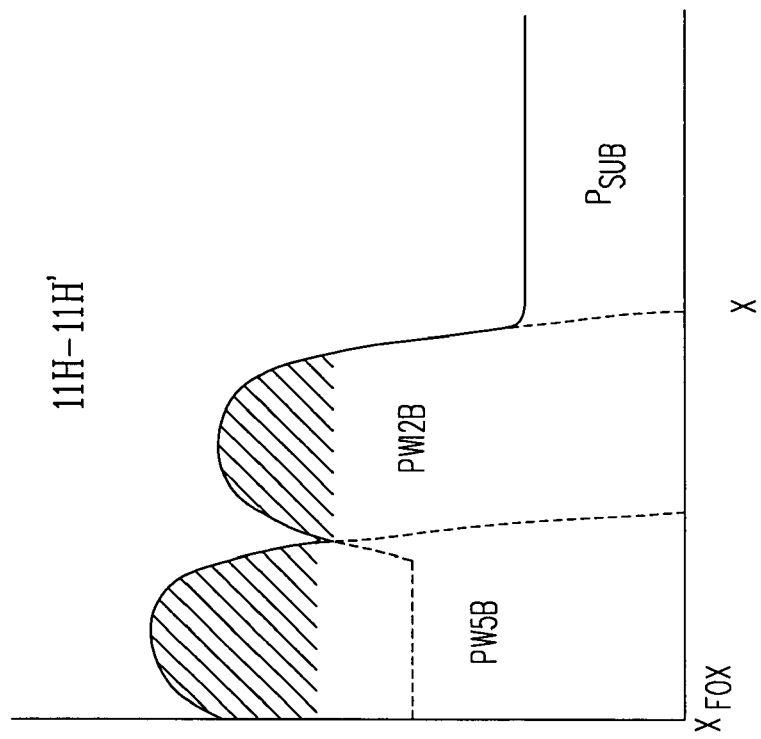
FIG. 11K shows the doping profile at cross-section 11F–11F' of FIG. 11G.
Figure 11L:
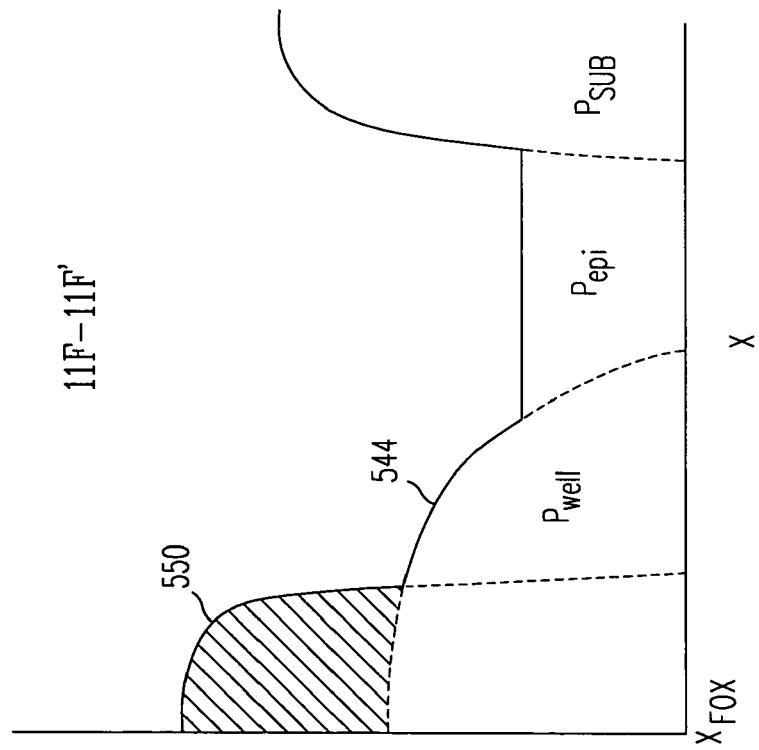
FIG. 11L shows the doping profile at cross-section 11H–11H' of FIG. 11H.

FIG. 11H shows a 12V structure in accordance with the invention. A 12V P well PW12 is implanted into P substrate 500, followed by the implant of a P layer PW12B, all subsequent to the formation of field oxide 536. Accordingly the regions of P well PW12 and P layer PW12B follow the contour of the field oxide topography in an accurate self-aligned manner. The energy of P layer PW12B must be sufficiently high to allow 12V breakdown for devices formed in P well PW12. Accordingly, P layer PW12B penetrates field oxide 536 to a depth deeper than the surface of P substrate 500, and therefore approaches (but does not reach) the surface of P substrate 500 under field oxide layer 536. To fill the vertical gap between P layer PW12B and the underside of field oxide layer 536, the substrate is masked and 5V P layer PW5B is implanted through field oxide layer 536. Since this layer is already being employed in the formation of the 5V P well regions, its use in the 12V device section does not constitute an added processing step. The concentration of the 5V P layer PW5B is, however, set by the requirements of 12V devices (rather than the 5V devices). While this principle may seem somewhat counterintuitive, the doping of the heavily doped 5V guard ring (and its use to set the 12V field threshold) is really an independent variable in the process since the "exact dose" of the subsurface deep implanted P layer PW5B is not critical in preventing NMOS snapback breakdown (its depth is more important). FIGS. 11I and 11J contrast the doping profiles in active area 540 at the cross-sections 11E–11E' of the conventional device type and of the inventive process cross section 11G–11G', respectively. FIGS. 11K and 11L contrast the doping profiles under the field oxide layer 536 at the cross-sections 11F–11F' and 11H–11H', respectively, again emphasizing the dramatic difference between the conventional and the as-implanted doping profiles of the low thermal budget process of this invention.

In summary, the integration of 12V CMOS with 5V CMOS using common well diffusions in a conventional CMOS process is problematic since the ideal well doping profiles to prevent snapback and punchthrough in each device differ significantly and ideally require epitaxial depositions of differing thicknesses to locate the buried layers where they are needed. Lastly the introduction of field dopant during the LOCOS sequence to achieve 15V field thresholds in both the N well and P well regions is complicated by the fact that implants formed prior to LOCOS field oxidation redistribute and diffuse laterally, potentially impacting the breakdown voltage or performance characteristics of nearby active devices.

These adverse interaction problems can be avoided by decoupling the variables using high-energy ion-implantation to form optimized as-implanted well profiles for each of the four well regions, the 5V N well, the 12V N well, the 5V P well, and the 12V P well. In each case the buried or retrograde portion is used to adjust the snapback of the device independently and optimally. As a matter of convenience, it is reasonable and straightforward to use the 5V buried implants to set the field threshold of the 12V structures without making compromises in device performance, whereby the buried 5V P layer PW5B is used as a guard ring in the 12V P well and related devices, and where the buried 5V N layer NW5B is used as a guard ring in the 12V N well and related devices.

In the structures described thus far, the 5V and 12V N well regions can be used to integrate isolated devices but the P well formations were not isolated from the substrate. We now describe how the optimized P well regions may also be fabricated in a manner where such P wells may be made fully isolated from the substrate without the need for epitaxy. The method of this invention (i.e. epi-less isolation technology) is then contrasted to conventional junction isolation methods used today.

Figure 12B:
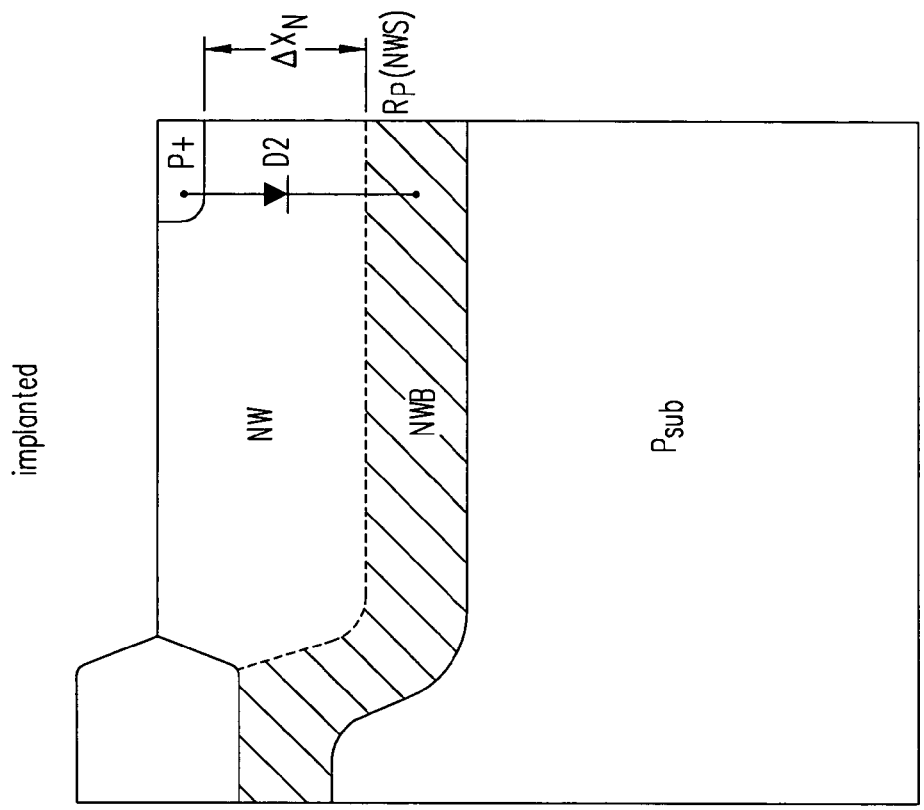
FIG. 12B is a cross-sectional view showing how the breakdown voltage between an implanted deep N layer and a shallow P+ region is determined in a structure according to this invention.
Figure 12A:
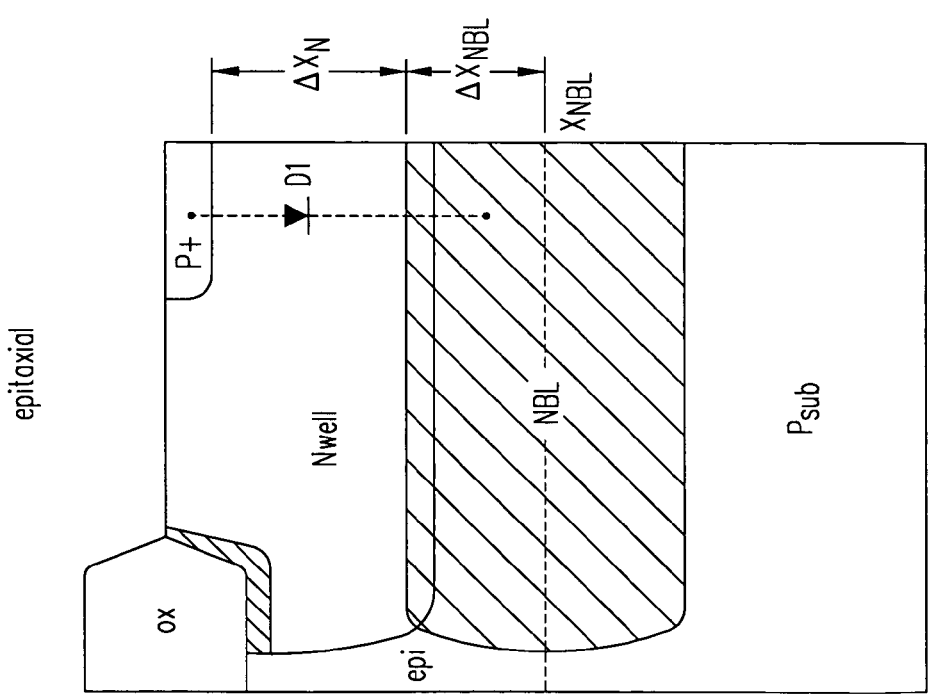
FIG. 12A is a cross-sectional view showing how the breakdown voltage between an N buried layer and a shallow P+ region is determined in a conventional structure.

FIG. 12A shows that the breakdown in a conventional device between an N buried layer and a shallow P+ region near the surface is represented by a diode D1, whose breakdown potential is determined by the distance $\Delta X_N$ between the upper edge of the N buried layer and the lower edge of the P+ region. The P+ region could represent any P+ region within the N well. The distance $\Delta X_N$ is in turn determined by the thickness of the epi layer and the up-diffusion of the N buried layer, both of which are highly variable phenomena. Therefore, a large safety margin is required to insure that breakdown does not occur. Contrast a device of this invention, shown in FIG. 12B. Here the breakdown of diode D2 is determined by the distance $\Delta X_N$, which is a function of the range and scatter of the implant used to form the N layer NWB. These quantities are much more controllable and predictable than an epi layer thickness or the up-diffusion distance.

Figure 12C:
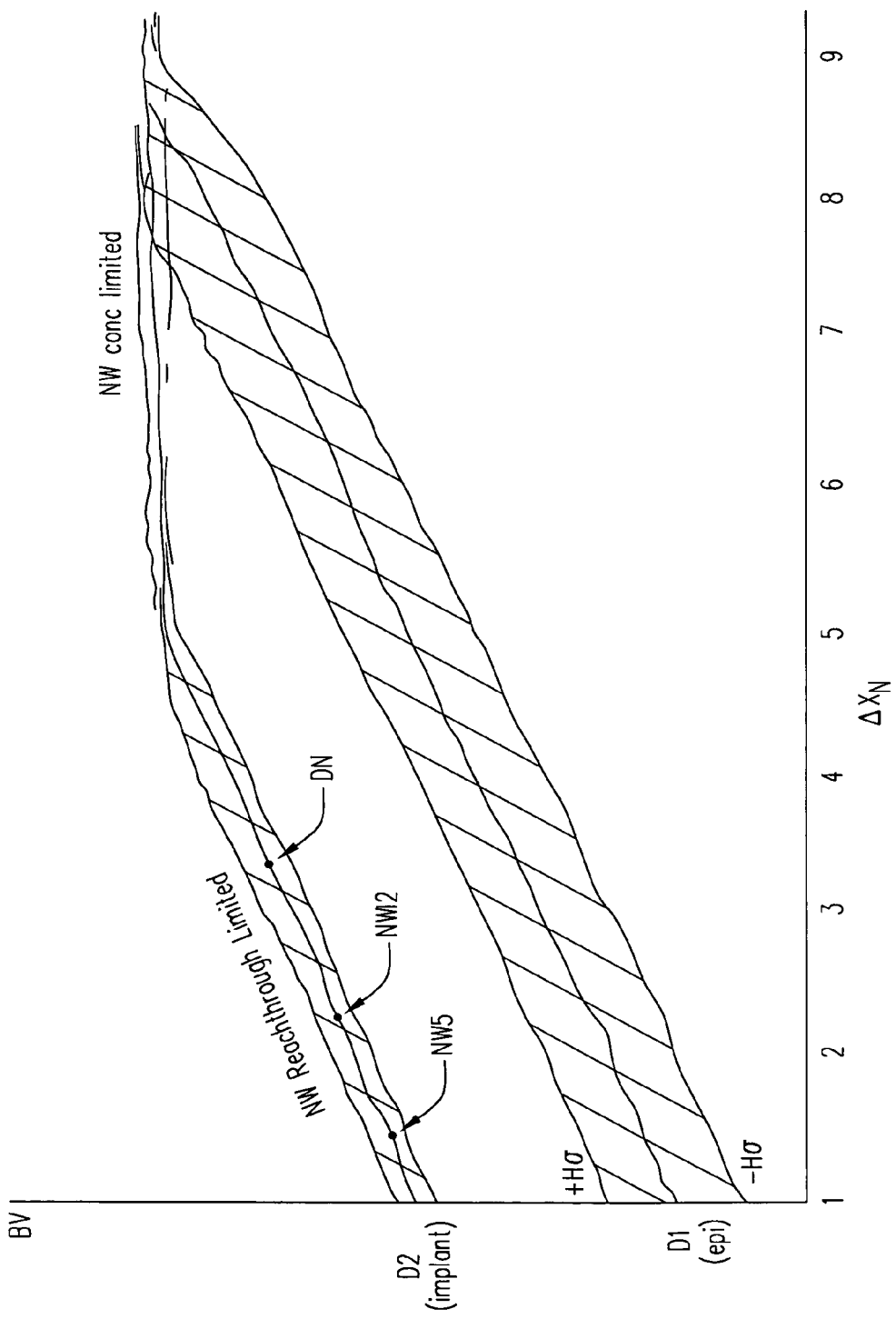
FIG. 12C is a graph of the breakdown voltages in the structures of FIGS. 12A and 12B as a function of the separation between the N layer and the shallow P+ region.

FIG. 12C shows a graph of the breakdown voltage of diodes D1 and D2 as a function of the distance $\Delta X_N$. As indicated, not only is the breakdown voltage of the diode D2 greater than the breakdown voltage of the diode D1, but the variability of the breakdown voltage of diode D2 is less. The breakdown voltage of diode D1 is lower because diffusion and dopant redistribution naturally occur during epitaxial growth and through diffusion. From dopant redistribution, the net thickness $\Delta X_N$ will naturally be reduced from the nominal amount leading to a decline in breakdown of several volts. Variation in thickness is the major cause for diode D1's wide band in breakdown shown by the labels ±4σ. Typical values of 4σ of thickness for epitaxial depositions are on the order of ±20% while for implants the variation is only a few percent. Also, the breakdown voltage of diode D2 reaches its full breakdown potential in a thinner layer (becoming concentration-limited at a lower value of $\Delta X_N$) primarily because of the lack of updiffusion. No updiffusion allows the target value for $\Delta X_N$ to be set at a far lower value in devices according to the invention, limiting the vertical dimensions of the device. For example an N well for integrating 5V PMOS requires around 0.5 µm using the as-implanted method of this invention, but needs around 6 µm using epitaxy and conventional diffused junction processing. This phenomena is applicable for both N well and P well regions.

Figure 13B:
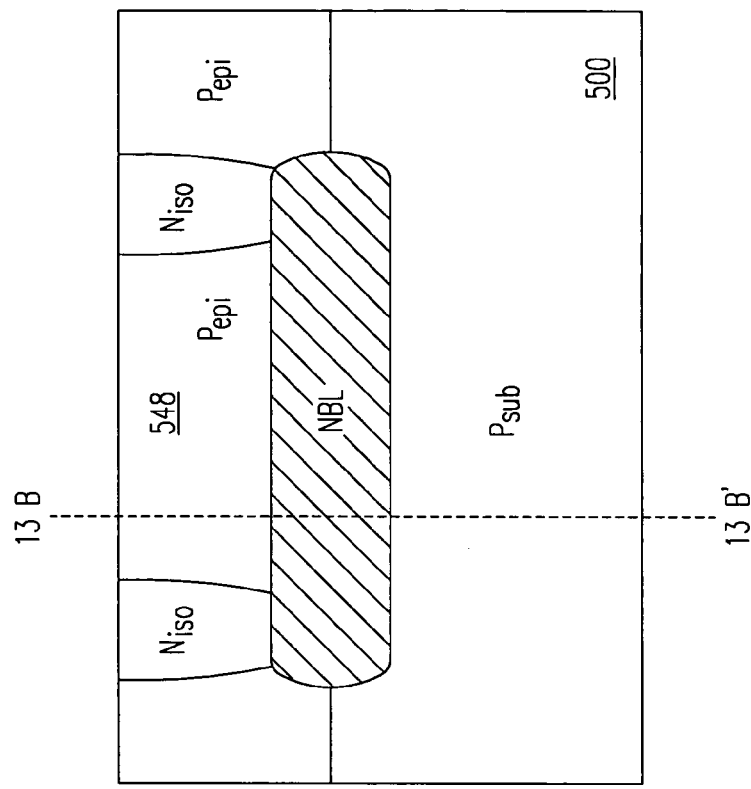
FIGS. 13A and 13B show two conventional techniques for forming an isolated pocket in an epitaxial layer.
Figure 13A:
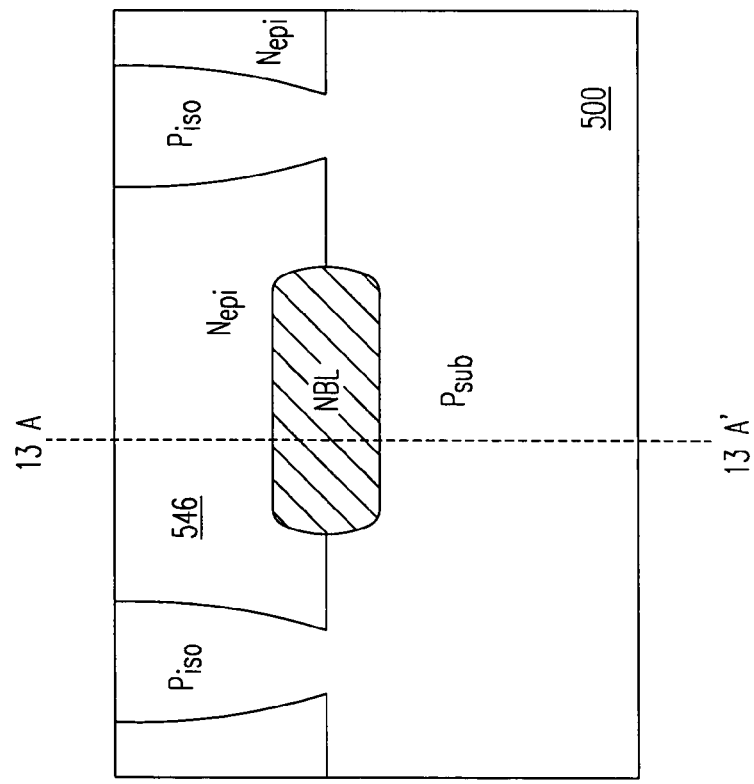

FIGS. 13A and 13B show ways or forming isolated pockets in an epi layer. FIG. 13A shows a conventional junction-isolation process wherein an N-epi layer is grown on a P substrate. An N buried layer is formed at the junction of the N-epi layer and the P substrate. The N buried layer is used as a sub-collector in bipolar transistors or to help suppress parasitic diodes in MOS circuits. To contact the P substrate P isolation regions are diffused downward from the surface of the N-epi layer in a ring shape, forming an isolated pocket 546 of the N-epi layer. To diffuse the P isolation regions through the N-epi layer requires a long thermal process, however, and this in turn causes the N buried layer to diffuse upward, creating the controllability problems described above. Such a process is known as conventional junction isolation (epi-JI). The epi-JI process relies on growing N-type epitaxy on a P-type substrate.

In FIG. 13B a P-epi layer is grown on the P substrate and N isolation regions are diffused downward to merge with the N buried layer, forming an isolated pocket 548.

Figure 13C:
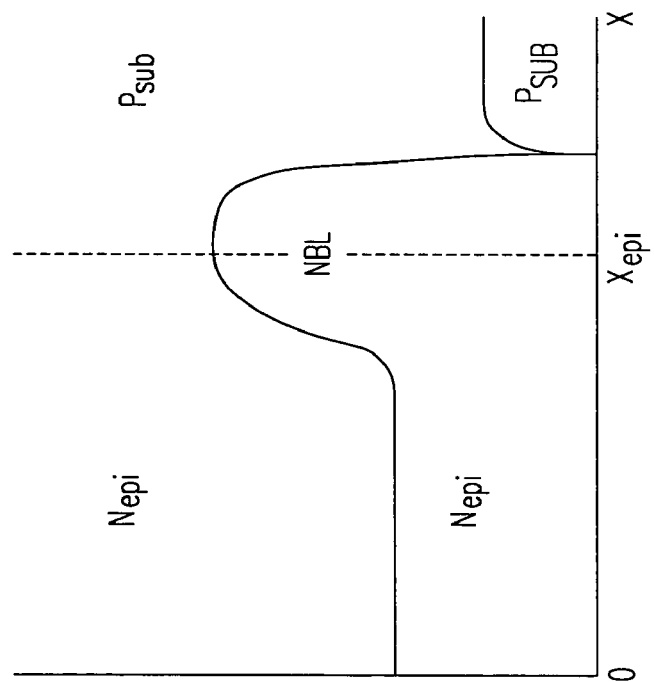
FIG. 13C shows the doping profile at cross-section 13A–13A' of FIG. 13A.
Figure 13D:
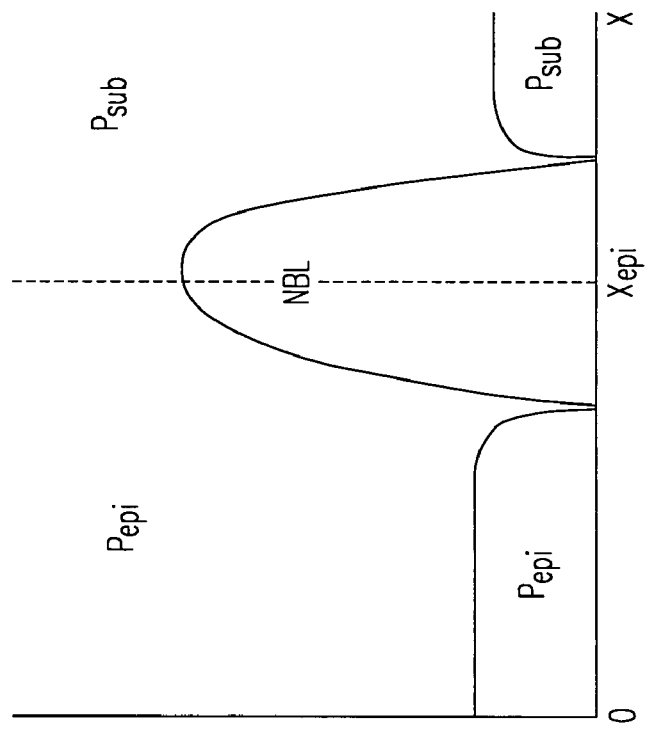
FIG. 13D shows the doping profile at cross-section 13B–13B' of FIG. 13B.

This type of junction isolation is sometimes referred to as wrap-around junction isolation (or epi-WAJI). Note it still however relies on the growth of epitaxy, in this case P-type epi on a P-type substrate. Similar problems occur. Both epi-JI and epi-WAJI structures (and the methods used to form them) depend heavily on control of the epitaxial deposition concentration and most of all on the epi thickness and thickness uniformity. Both exhibit updiffusion of the substrate and buried layers during the epitaxial growth, during the isolation diffusion and during subsequent processing. FIG. 13C is a doping profile taken at cross-section 13A–13A' in FIG. 13A and FIG. 13D is a doping profile taken at cross-section 13B–13B' in FIG. 13B.

Figure 13F:
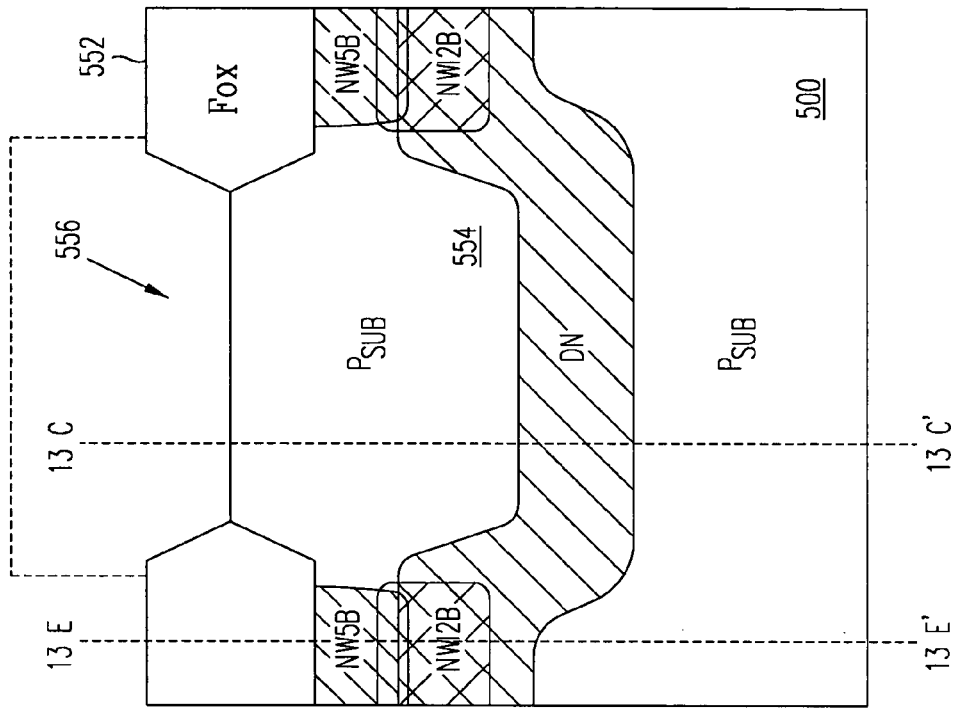
FIGS. 13E and 13F show two conventional techniques for forming an isolated pocket in a substrate in accordance with the invention.
Figure 13E:
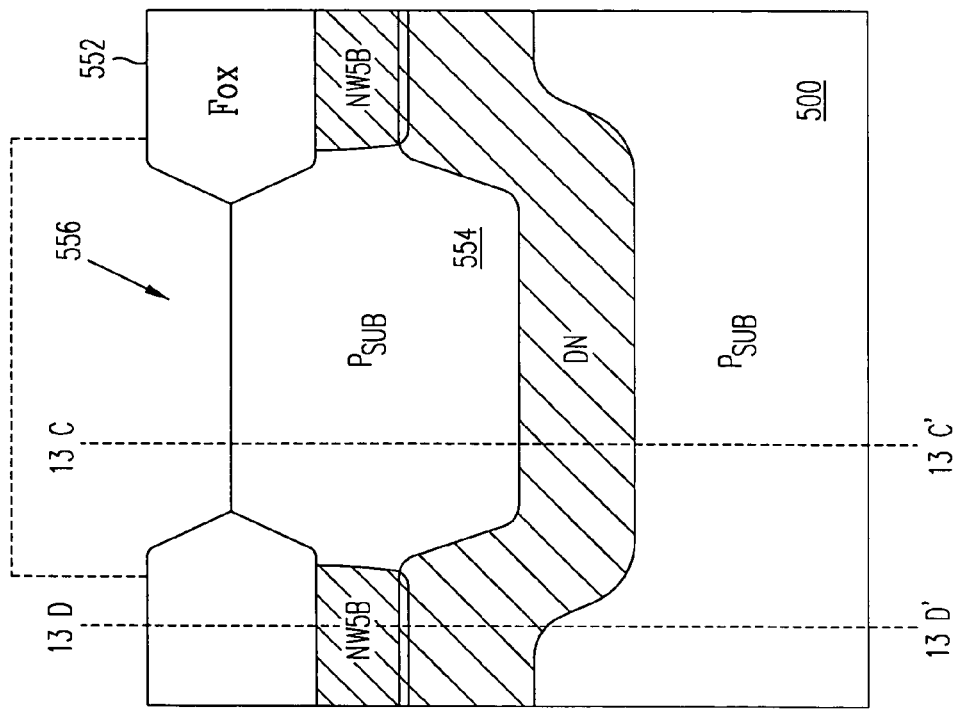

FIGS. 13E and 13F illustrate techniques of creating isolated pockets in accordance with the invention. A deep N layer DN is implanted at a high energy, typically 1.7 to 2.5 MeV phosphorus, at a dose ranging from 1E12 cm$^{-2}$ to 5E15 cm$^{-2}$ but preferably in the range of 9E13 cm$^{-2}$. Deep N layer DN is deeper in the active area 556 than under field oxide layer 552, but it does not touch the surface even under field oxide layer 552. To create a completely isolated pocket a sidewall isolation implant is necessary. The sidewall implant may be a dedicated chained implant junction isolation (CIJI) or a stack of as-implanted well regions used in other devices within the IC. The sidewall, to obtain the highest concentration should preferably comprise a 5V N layer NW5B, as shown in FIG. 13E, or a combination of a 5V N layer NW5B and a 12V N layer NW12B, as shown in FIG. 13F. The deep N layer DN combined with the sidewall isolation isolates P-type pocket 554 from P-type substrate 500. The combined N-type isolation shell-like structure must be biased at a potential equal to or more positive than the substrate potential to avoid causing substrate injection problems. To achieve such a contact, the sidewall isolation requires some portion overlap onto an active (non-field oxide) area so as to allow electrical contact to the isolation structure (not shown).

To minimize costs and maximize flexibility, it is preferable that the 5V N layer NW5B should be designed so that it overlaps the deep N layer DN, thereby eliminating the need for the 12V N layer NW12B to form the isolated pocket 554. If that event, the 12V N layer NW12B does not need to be deposited in processes that do not contain 12V devices. In short, the 12V N layer NW12B can be used when it is available, but it should not be necessary to form the pocket 554. This is an important feature of modularity, namely, the ability to eliminate all 12V process steps when 12V devices are not part of the structure.

Figure 13H:
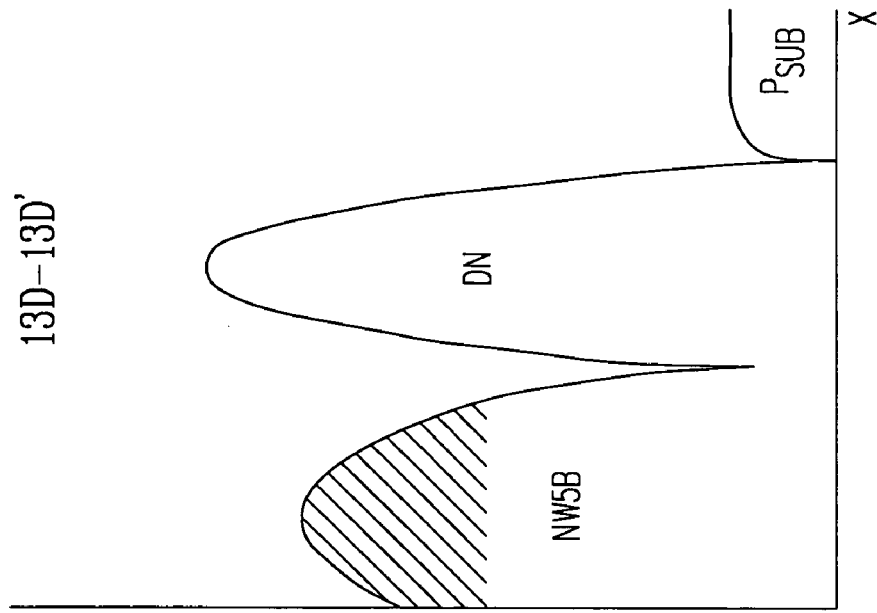
FIG. 13H shows the doping profile at cross-section 13D–13D' of FIG. 13E.
Figure 13G:
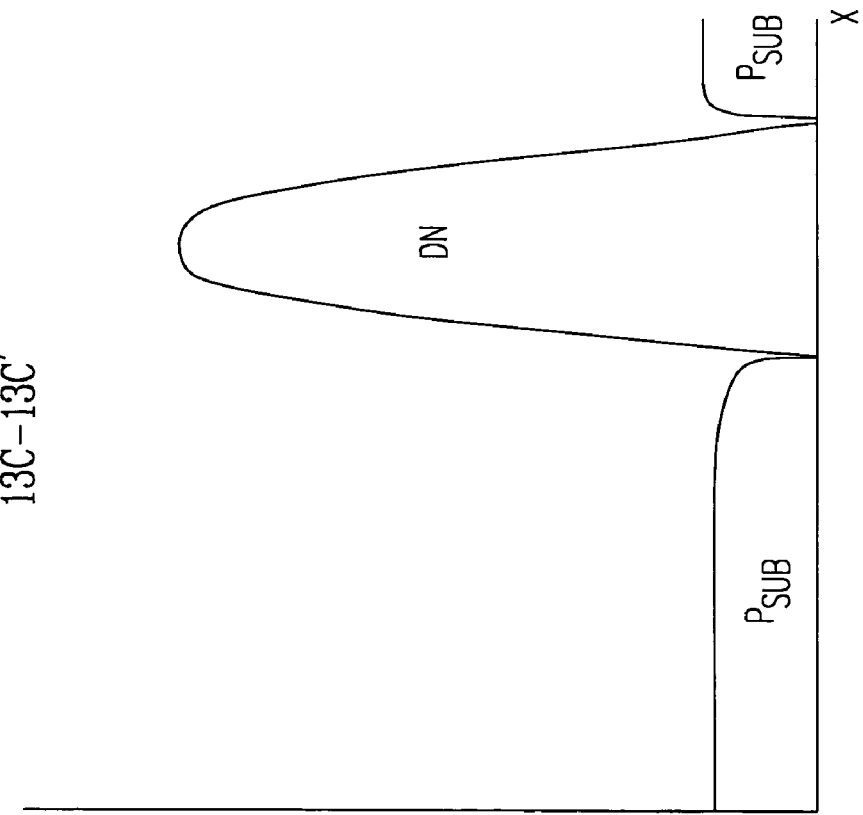
FIG. 13G shows the doping profile at cross-section 13C–13C' of FIGS. 13E and 13F.
Figure 13I:
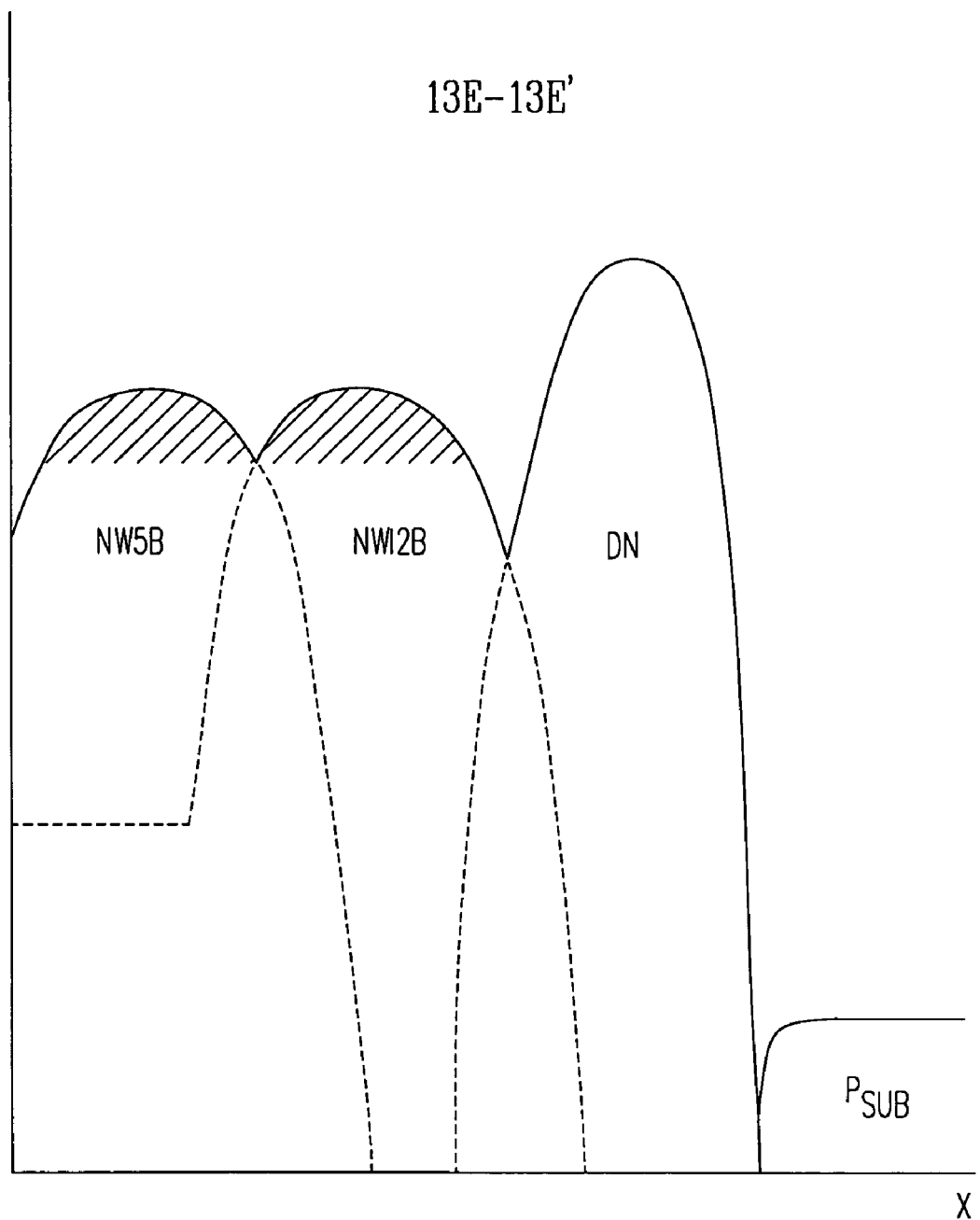
FIG. 13I shows the doping profile at cross-section 13E–13E' of FIG. 13F.

FIG. 13G shows the doping profile of the isolated pocket at cross-section 13C–13C' in both FIGS. 13E and 13F (which are identical). FIG. 13H shows the doping profile at cross-section 13D–13D' through the sidewall isolation in FIG. 13D, and FIG. 13I shows the sidewall isolation doping profile at cross-section 13E–13E' in FIG. 13F. While the NW5B merges with and overlaps onto the DN layer as shown in FIG. 13H, the minimum concentration at the overlapping area is much lower than if the NW12B implant is added to the sidewall structure as shown in FIG. 13I. Also note that in this concentration profile the shallow portion of NW12 is present in the silicon, but since its concentration is low compared to the overlapping NW5B dopant, it has no influence on the electrical performance of the isolation stack.

Figure 14A:
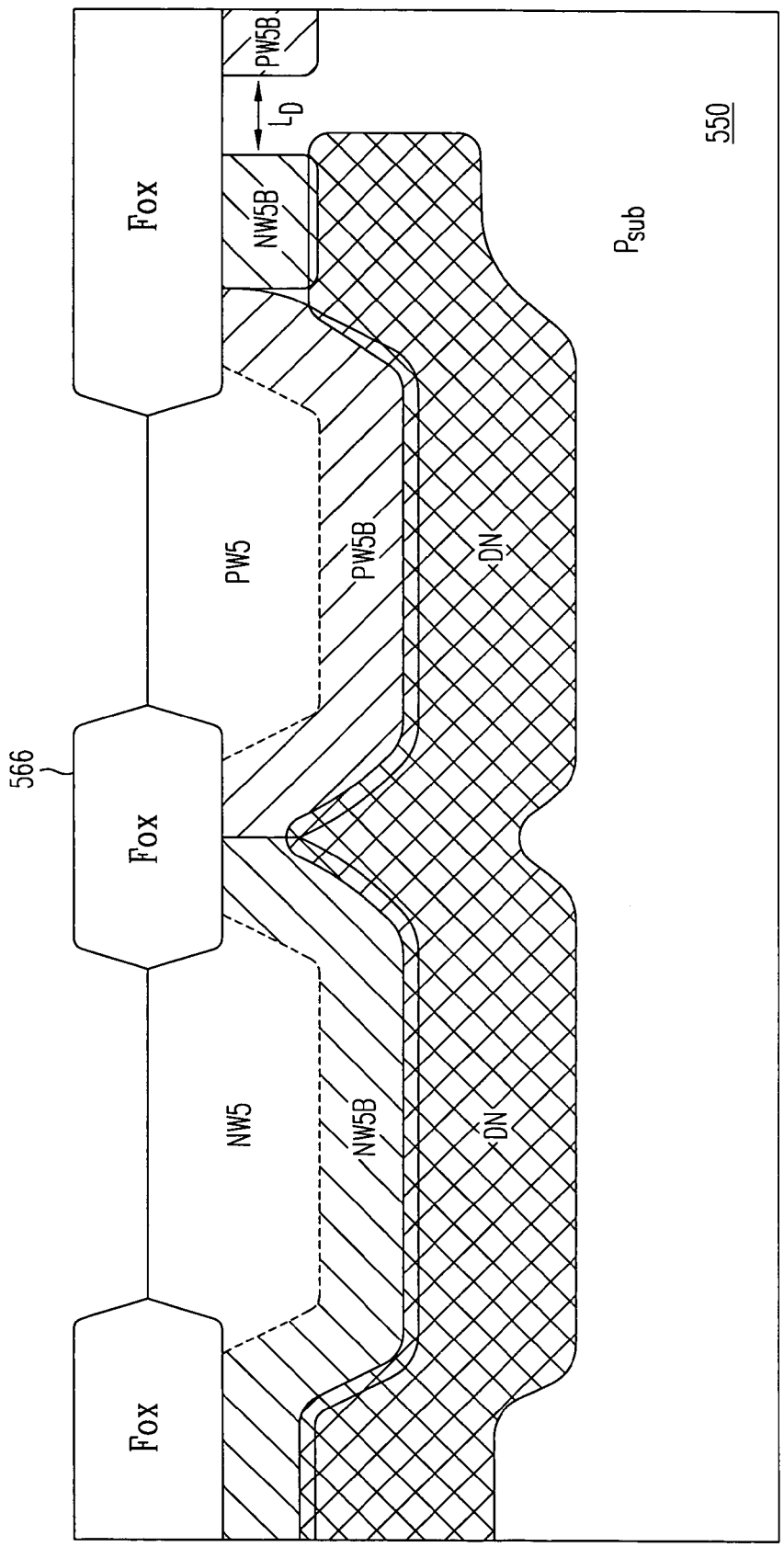
FIG. 14A is a cross-sectional view of how a single deep N layer can be used to isolate complementary wells.

FIG. 14A shows how a single deep N layer can be used to isolate complementary wells. 5V N well NW5 is similar to 5V N well NW5 in FIG. 9B, for example, and is surrounded by an 5V N layer NW5B. 5V P well PW5 and 5V P layer PW5B are similar but with reversed polarities, and where they meet at the surface the breakdown voltage will be adequate for 5V device ratings (typically from 8V to 12V). 5V N layer NW5B and 5V P layer PW5B are implanted with energies such that they contact the underside of field oxide layer 566. Deep N layer DN is the same as deep N layer DN shown in FIGS. 13E and 13F and is implanted with an energy such that it overlaps 5V N layer NW5B and 5V P layer PW5B. 5V N well NW5 is clearly isolated from P substrate 550 since any N well or DN region forms a reverse biased junction with the surrounding P-type substrate. A portion of 5V N layer NW5B is allowed to pass through field oxide layer 566 on the right side of 5V P well PW5 in a ring or substantially annular shape so that 5V P well PW5 is likewise isolated from P substrate 500 because it is completely surrounded by N regions on all sides and beneath. 5V N well NW5 and 5V P well PW5 can float upward from the potential of P substrate 500, the limit being set by the distance $L_D$ between a 5V P guard ring PW5B and the 5V N layer NW5B on the right side of 5V P well PW5. For example, the complementary wells could hold 5V devices and float 30V above P substrate 500. With proper field shaping the maximum voltage of the floating region above the substrate could be extended to 60V, 200V or even 600V if it were desirable to do so. All of this is accomplished without any isolation diffusion or even a single epitaxial layer.

Figure 14B:
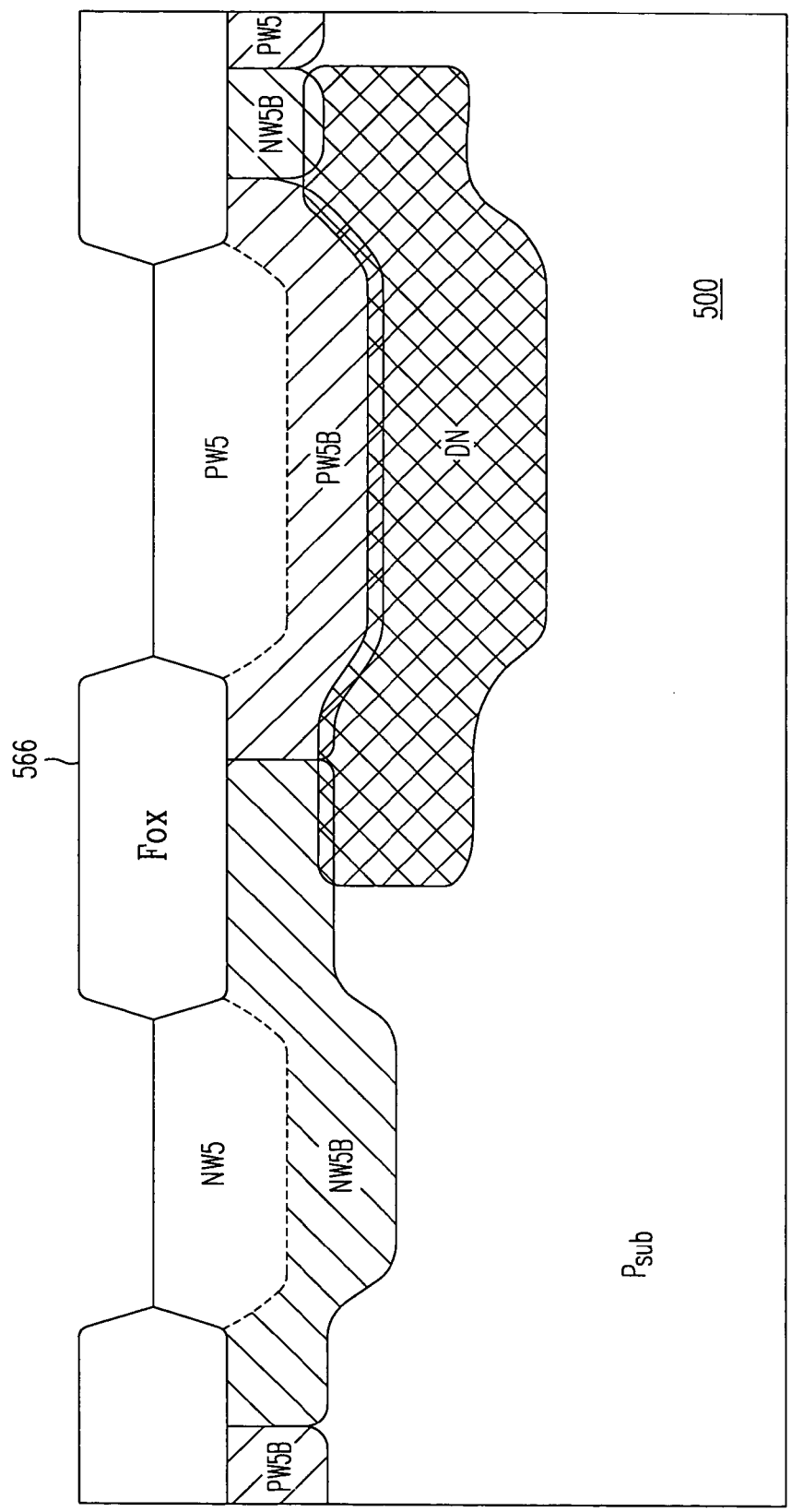
FIG. 14B is a cross-sectional view of a structure similar to that shown in FIG. 14A, except that the deep N layer is restricted to the area under the 5V P well.

The structure shown in FIG. 14B is similar to that shown in FIG. 14A, but here the deep N layer DN is restricted to the area under 5V P well PW5, and 5V P layer PW5B and 5V N layer NW5B are shown as touching. 5V N well NW5 is already isolated from P substrate 500. While the structures of FIGS. 14A and 14B have the same electrically equivalent circuit schematic, the quality of isolation of the deep N layer DN underlying NW5 is better than if it is not present, making the structure FIG. 14A preferred over its counterpart.

Figure 14C:
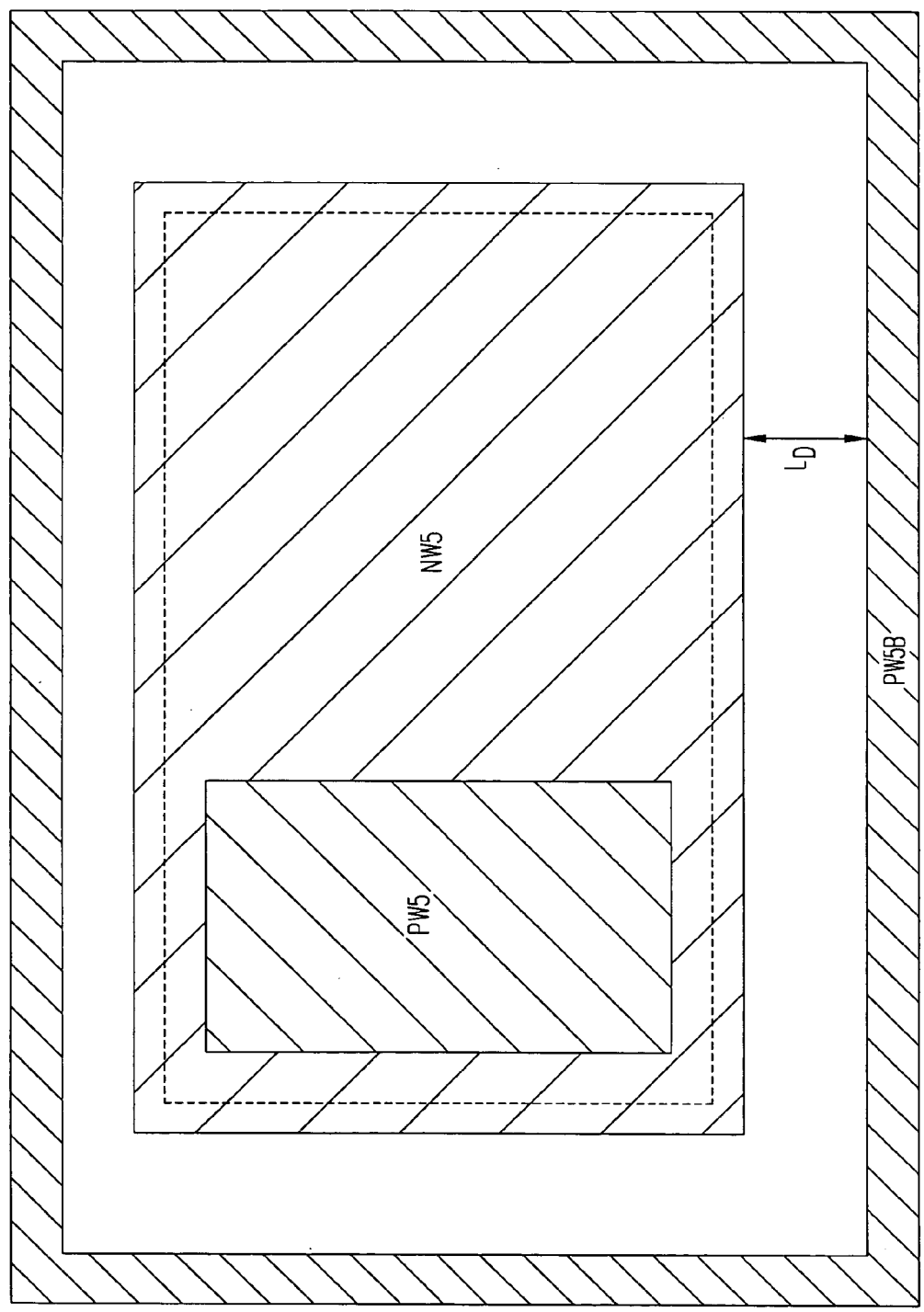
FIG. 14C is a plan view of the structure of FIG. 14A.

FIG. 14C shows a plan view of the structure of FIG. 14A, showing the distance $L_D$ forming a drift region between the isolated structure and the surrounding 5V P guard ring PW5B. The dashed line represents the deep N layer DN, underlying both the Pwell and Nwell regions. The Pwell and the Nwell regions are shown touching, but could have a gap between them without causing any adverse affects. The Nwell NW5 (including its deep implanted portion NW5B) is shown to surround and circumscribe the Pwell region PW5 (which includes its subsurface portion PW5B). The shape of the entire isolated island can be rectangular as shown, but may include rounded corners to achive higher breakdown voltages.

Figure 14E:
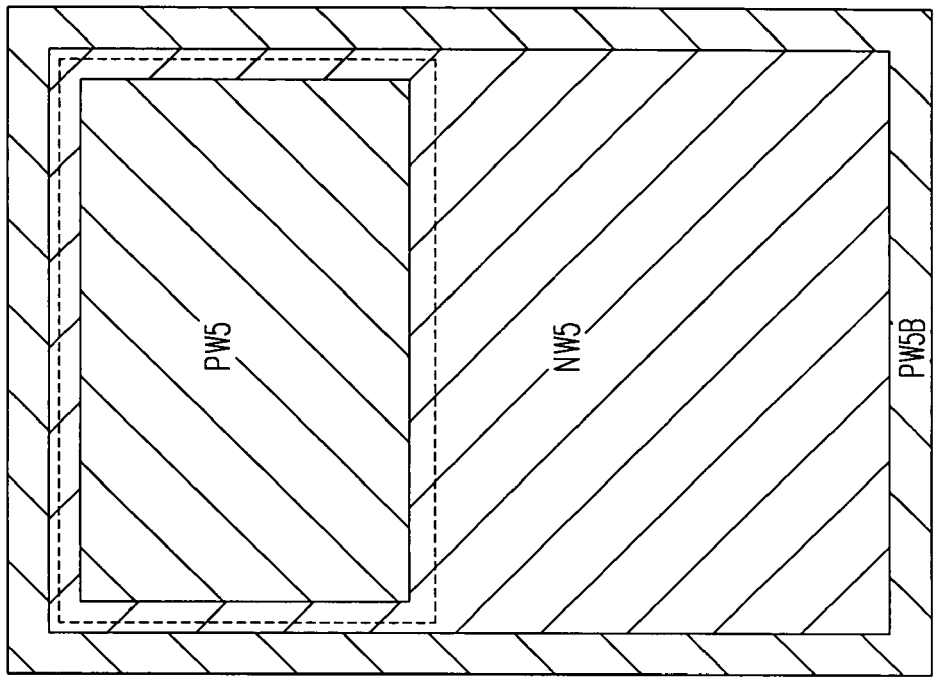
FIG. 14E is a plan view of the structure of FIG. 14B.
Figure 14D:
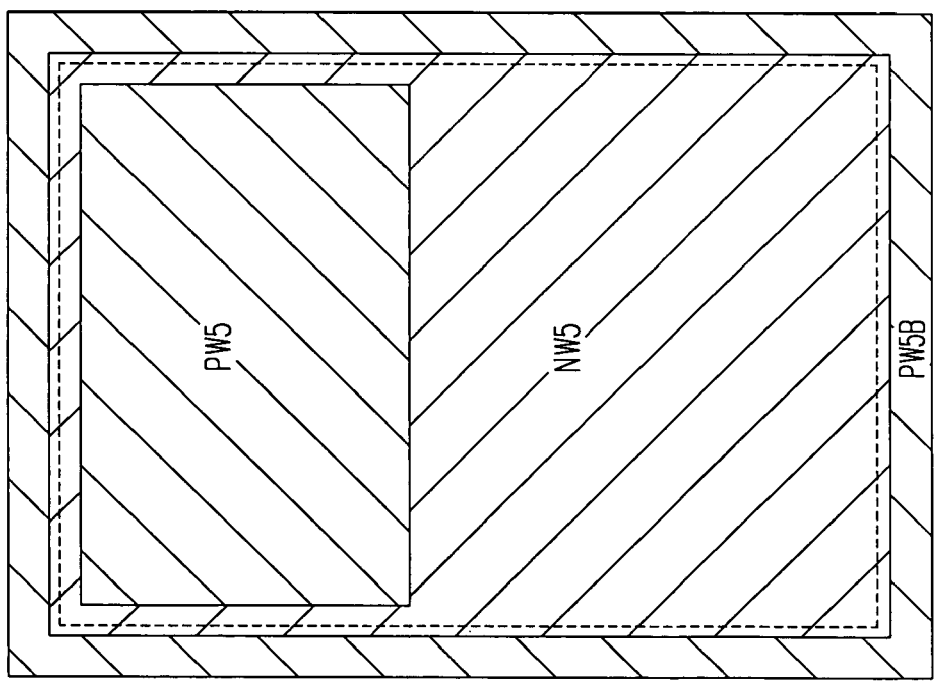
FIG. 14D is a plan view of an alternative structure wherein the P well guard ring touches the isolated structure.

FIG. 14D shows a plan view of an alternative embodiment wherein the grounded 5V P guard ring PW5B touches the isolated structure (the same as FIG. 14C but with Ld=0), and FIG. 14E shows a plan view of the structure of FIG. 14B, with the deep N layer DN (dashed line) being located only under (and slightly larger than) the 5V P well PW5.

Figure 14F:
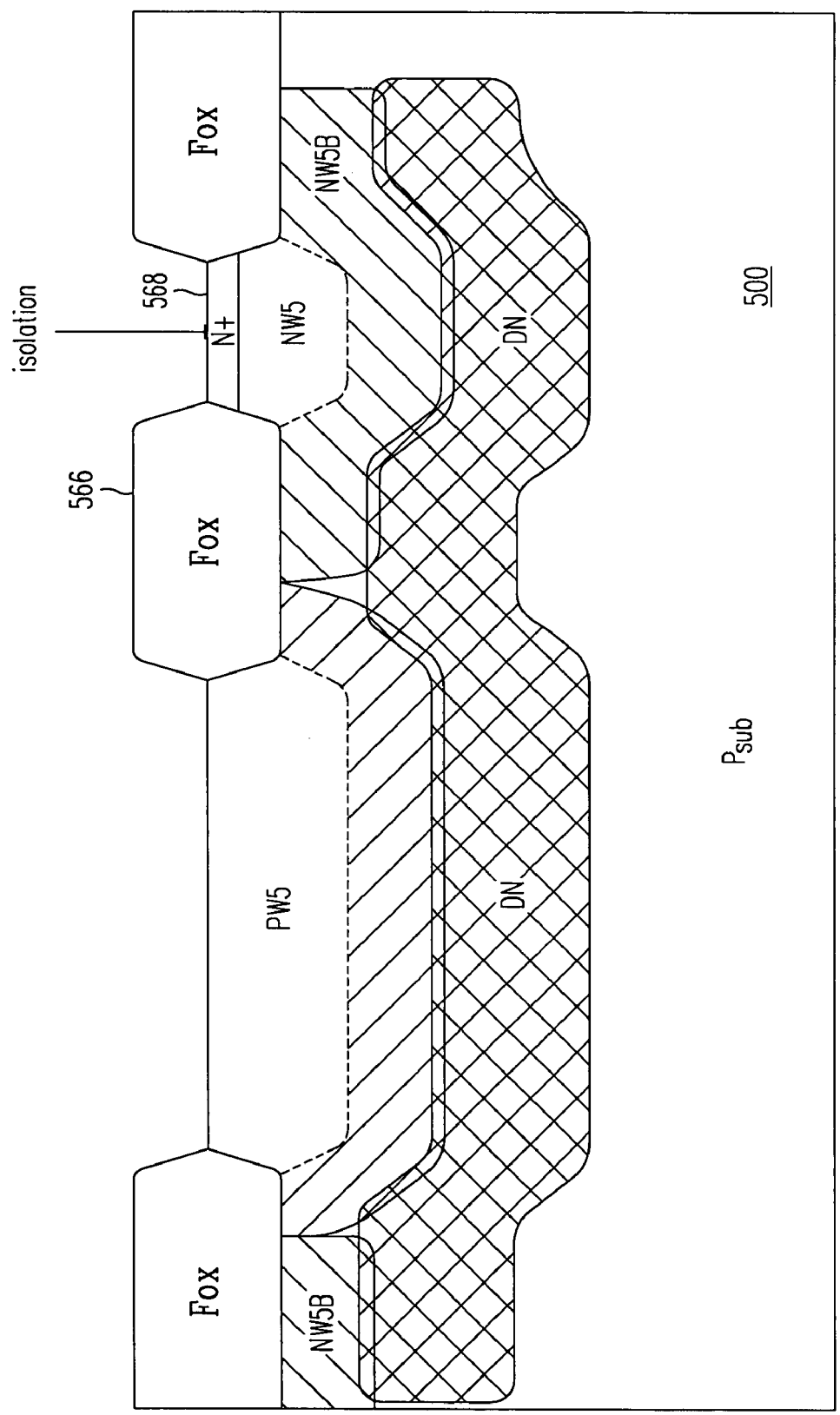
FIG. 14F is a cross-sectional view showing an N+ contact region that is used to contact a portion of the N well and the deep N layer through an opening in the field oxide layer.
Figure 14G:
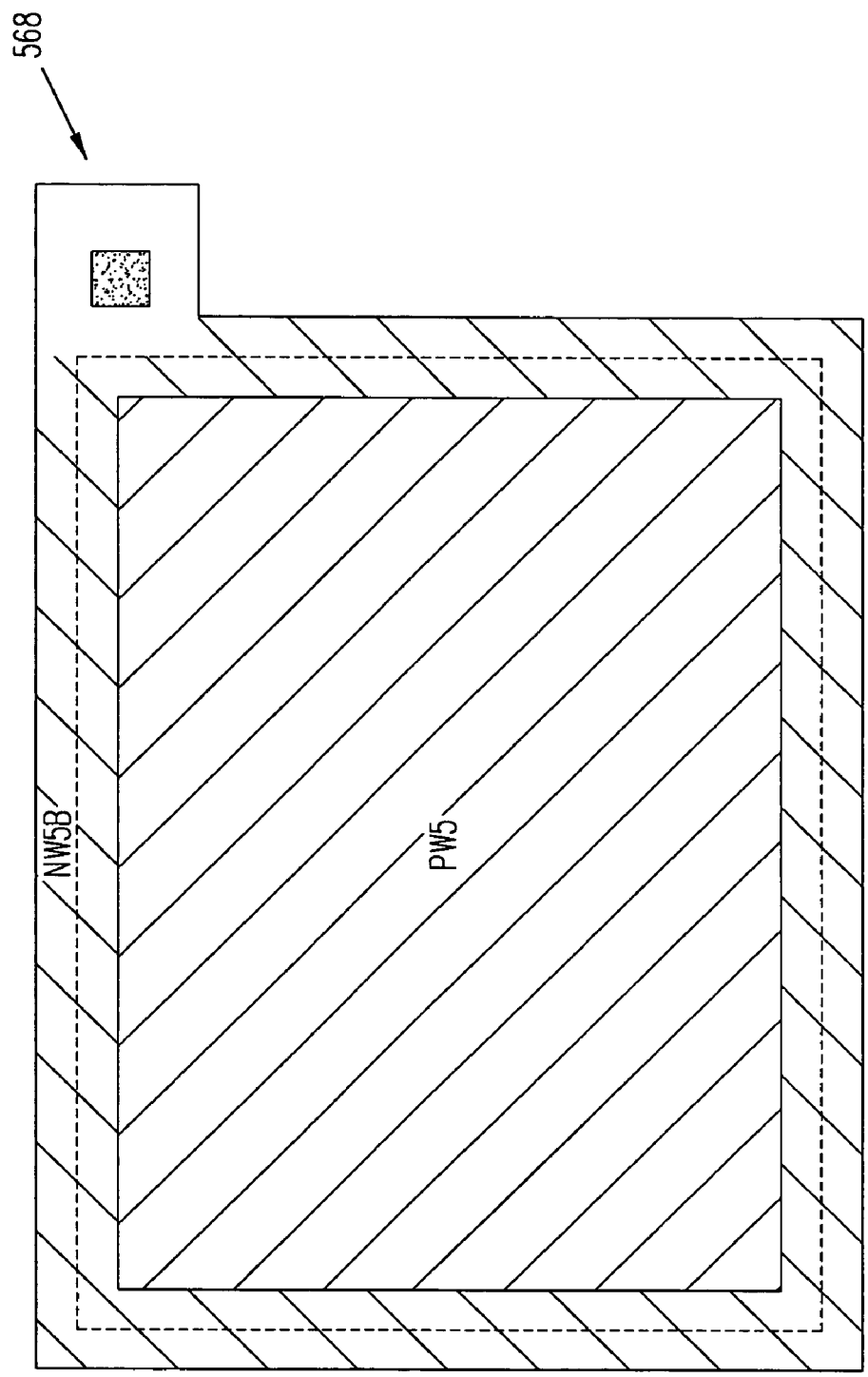
FIG. 14G is a plan view of the N+ contact region shown in FIG. 14F.
Figure 14H:
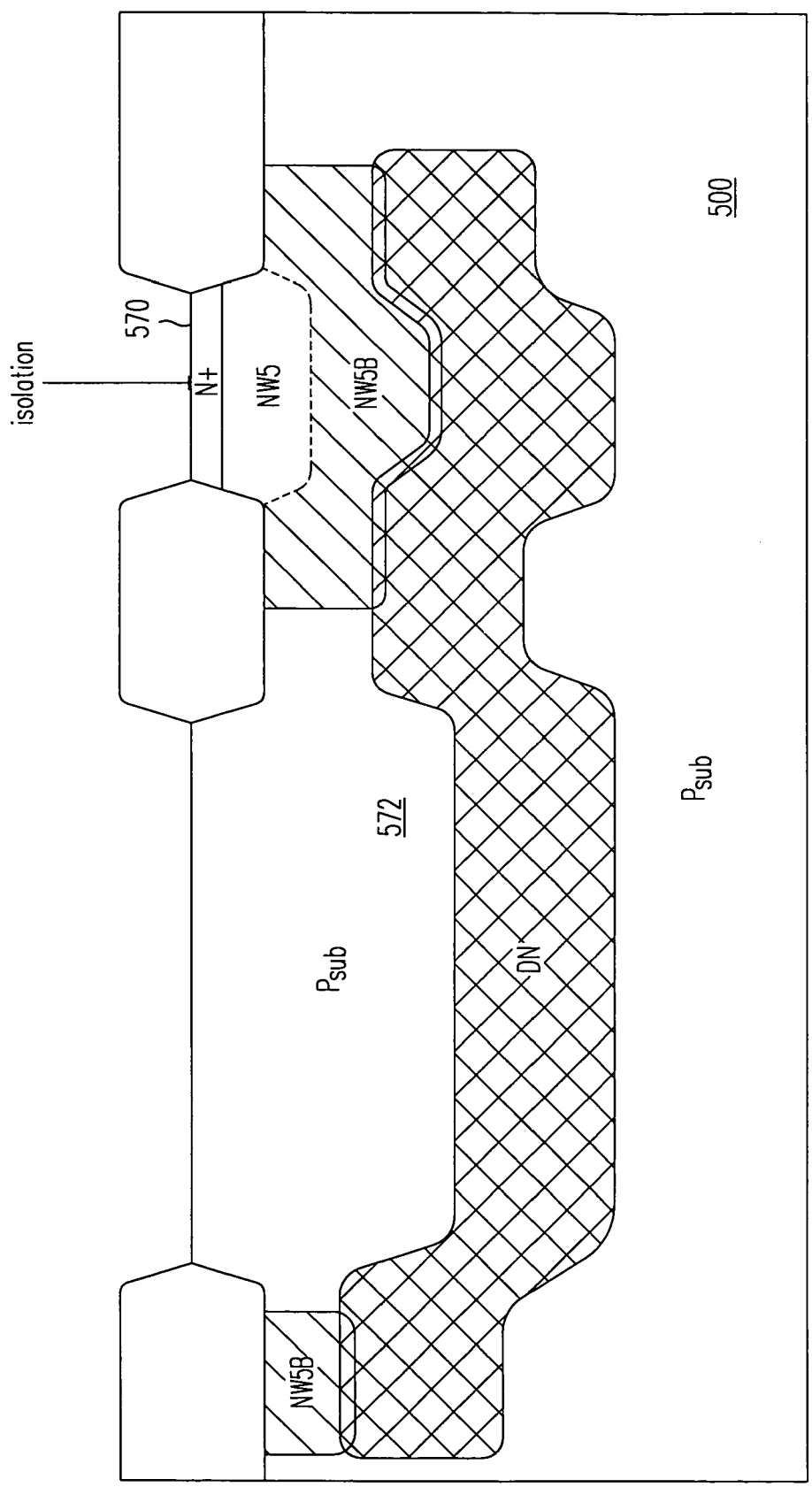
FIG. 14H is a cross-sectional view showing an N+ contact region that is used to contact a deep N layer that isolates a pocket of a P substrate.

FIG. 14F shows an N+ contact region 568 that is one means used to electrically bias the isolation structure (or shell) by contacting a portion of the 5V N well NW5 and the deep N layer DN through an opening in the field oxide layer 566. FIG. 14G illustrates one possible plan view of an N+ contact region 568 used to contact the shell-shaped N-type isolation structure. FIG. 14H shows an N+ contact region 570 that is used to contact a deep N layer DN and sidewall isolation that isolates a pocket 572 of P substrate 550. A deep N layer according to this invention can be used to isolate a 5V P well, a 5V N well, a 12V P well, a 12V N well, and an isolated pocket of the P substrate 500. The more lightly doped P substrate pocket 572 can be used to integrate higher voltage or lower capacitance devices than those made inside P well regions PW5 or PW12.

Figure 14I:
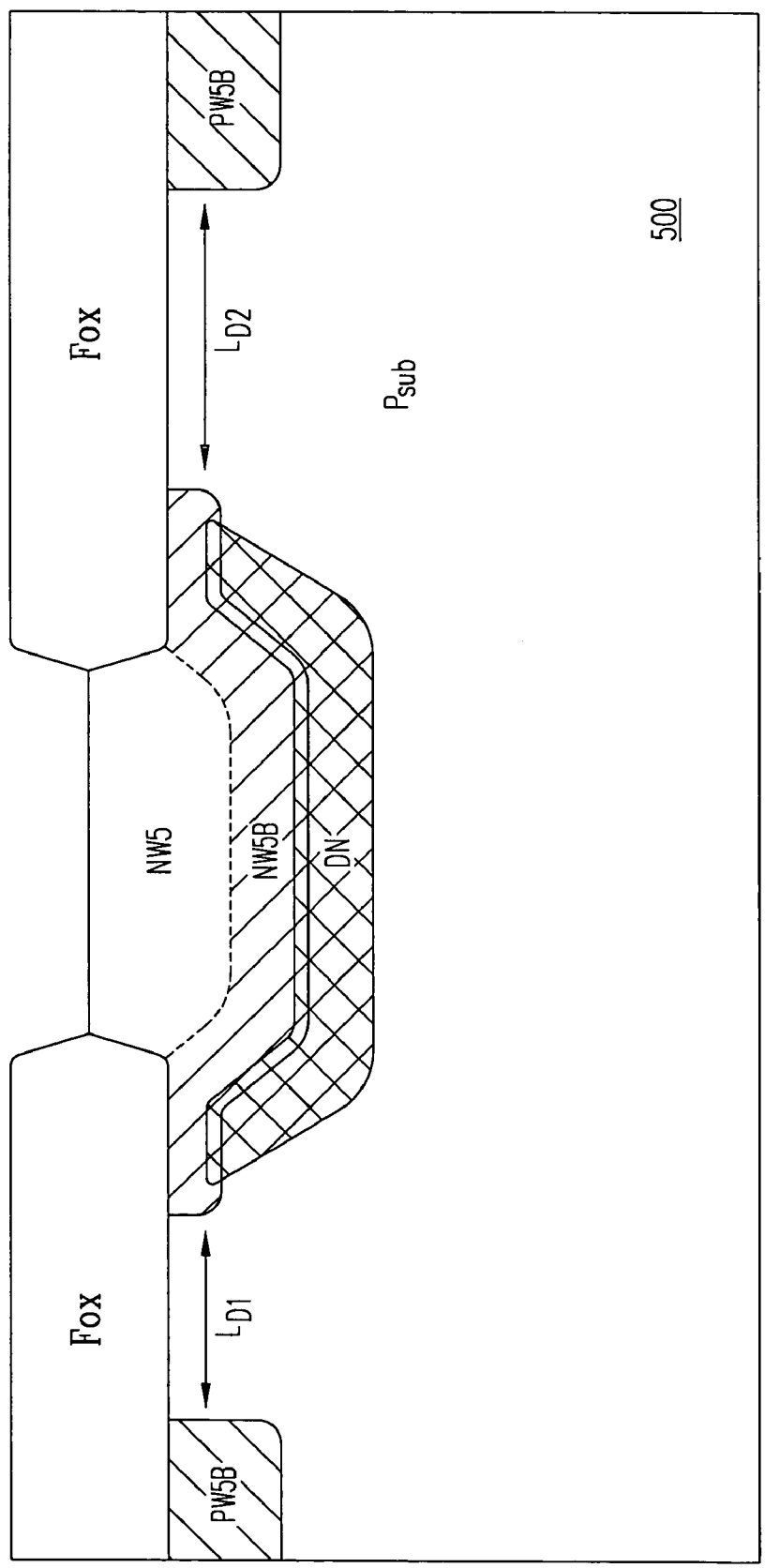
FIG. 14I is a cross-sectional view of a deep N layer that extends around a 5V N well and towards the surface of a P substrate, under a field oxide layer.
Figure 14J:
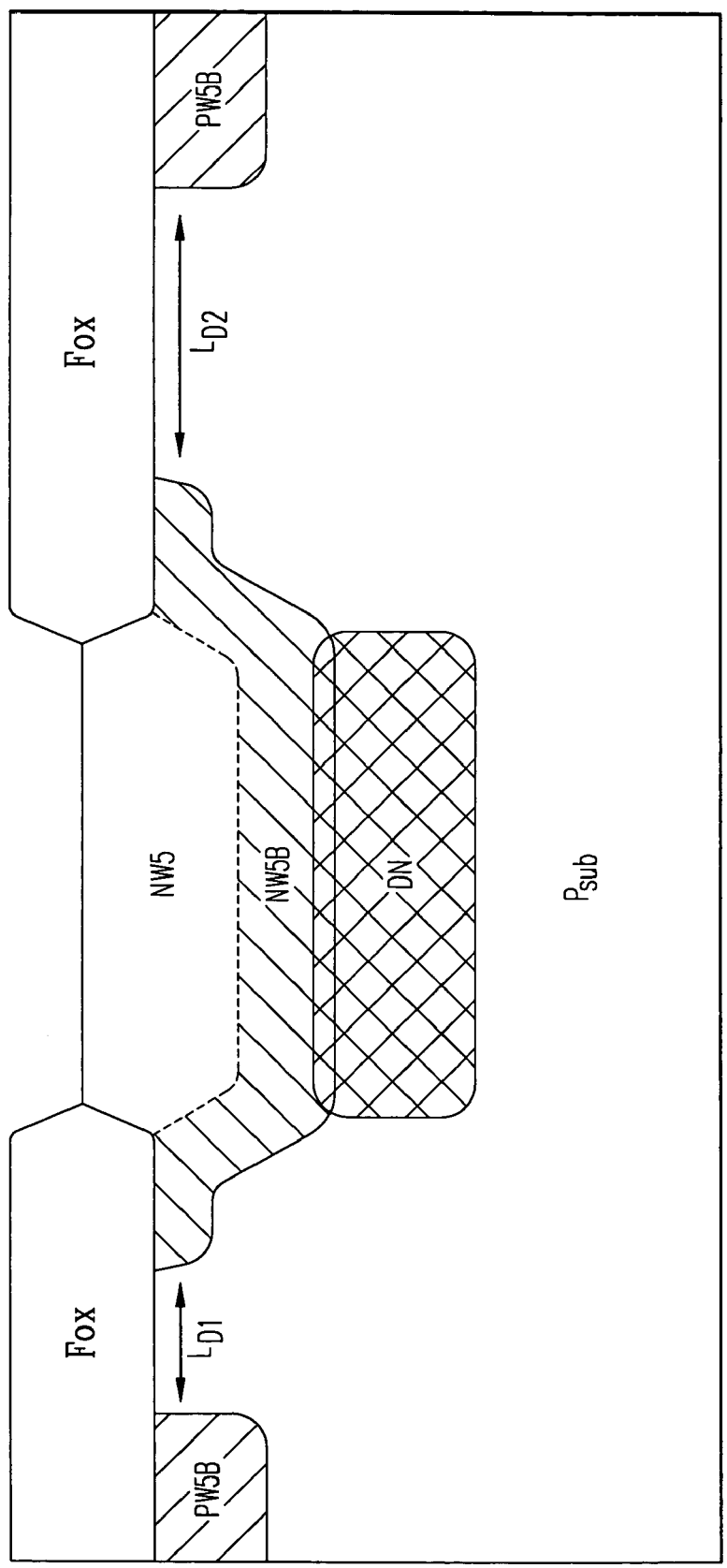
FIG. 14J is a cross-sectional view of a structure similar to that shown in FIG. 14I, except that the deep N layer is restricted to the area directly below the 5V N well.

FIG. 14I shows a deep N layer DN that extends around a 5V N well NW5 and toward the surface of P substrate 500, under the field oxide layer. In FIG. 14J the deep N layer DN is restricted to the area directly below the 5V N well NW5. While the N well overlaps onto the field oxide, the entire N well pocket is isolated by the artifact that it is opposite in conductivity type to the P-type substrate that surrounds it. The entire island can float to a high voltage above the substrate, especially since the drift area $L_{D2}$ contains no well doping or field doping, either N-type or P-type. This structure and process sequence offer a distinct advantage over conventional junction isolation in that no additional masks are required to remove well or blanket field doping implants from this region.

Figure 14L:
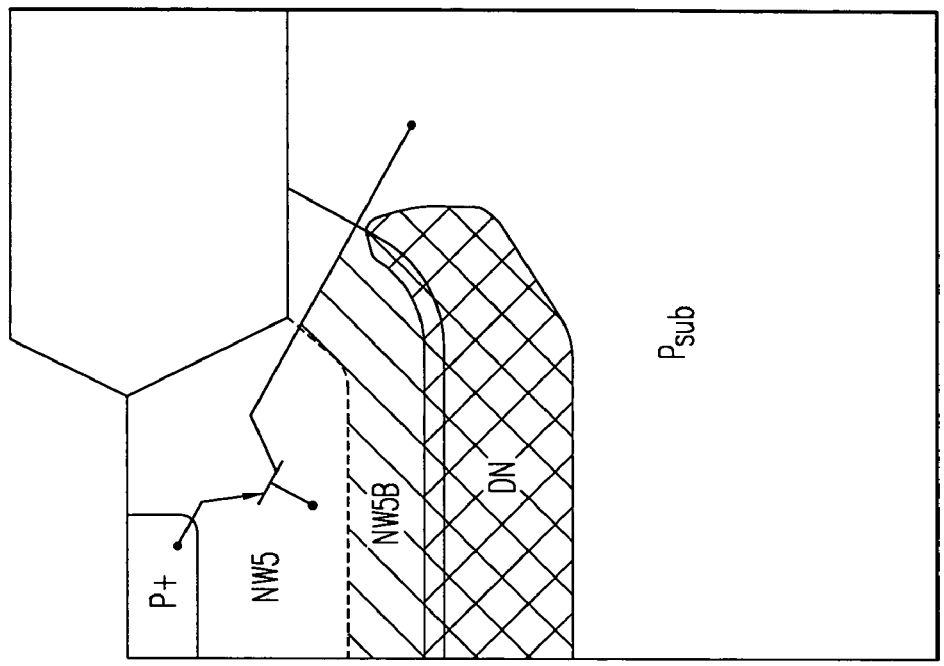
FIG. 14L is a cross-sectional view illustrating the tilted parasitic bipolar transistor that is formed if the deep N layer is laterally restricted.
Figure 14K:
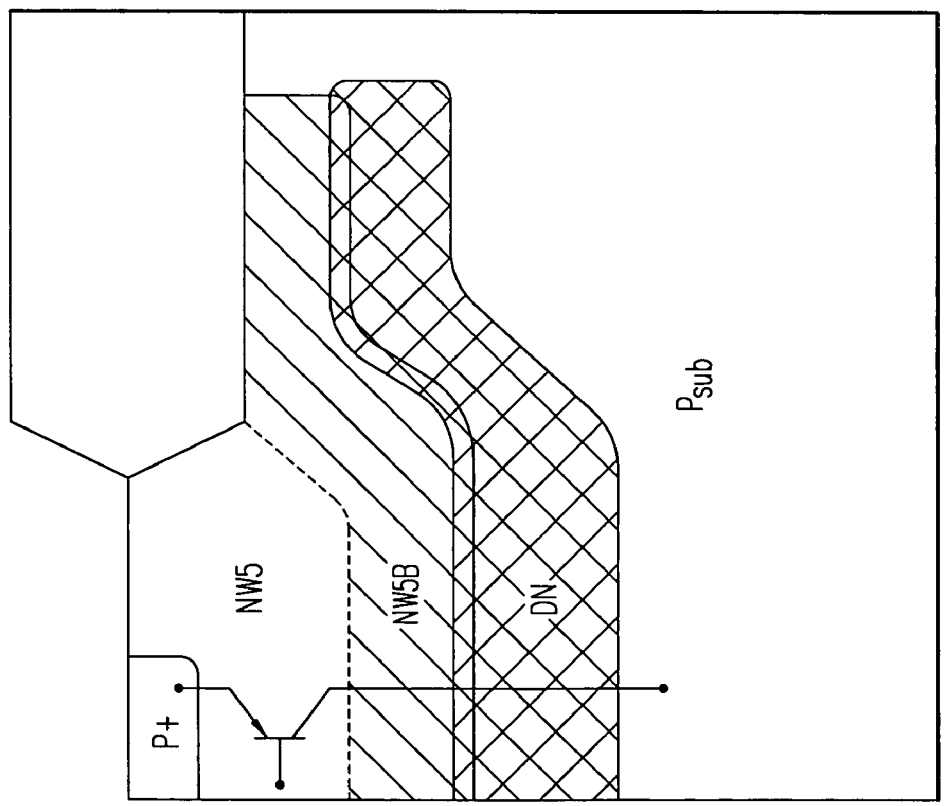
FIG. 14K is a cross-sectional view illustrating the vertical parasitic bipolar transistor that is formed if the deep N layer is allowed to extend laterally.

FIG. 14J illustrates a structure similar to that of FIG. 14I except that the DN layer has been pulled back within the lateral confines of the N well itself. The embodiment of FIG. 14J would tend to have a higher breakdown voltage because the doping concentration at the surface is lower. Another distinction between these embodiments is shown in FIGS. 14K and 14L. If the deep N layer DN is allowed to extend laterally as shown in FIG. 14K, the parasitic bipolar transistor between any P+ region within the 5V N well and the P substrate is vertical through the heavily doped DN region where the gain will be low, whereas if the deep N layer DN is laterally restricted as shown in FIG. 14L the parasitic bipolar transistor will conduct along the angled patch as illustrated, through less heavily doped material, and would therefore have a higher gain.

Figure 14M:
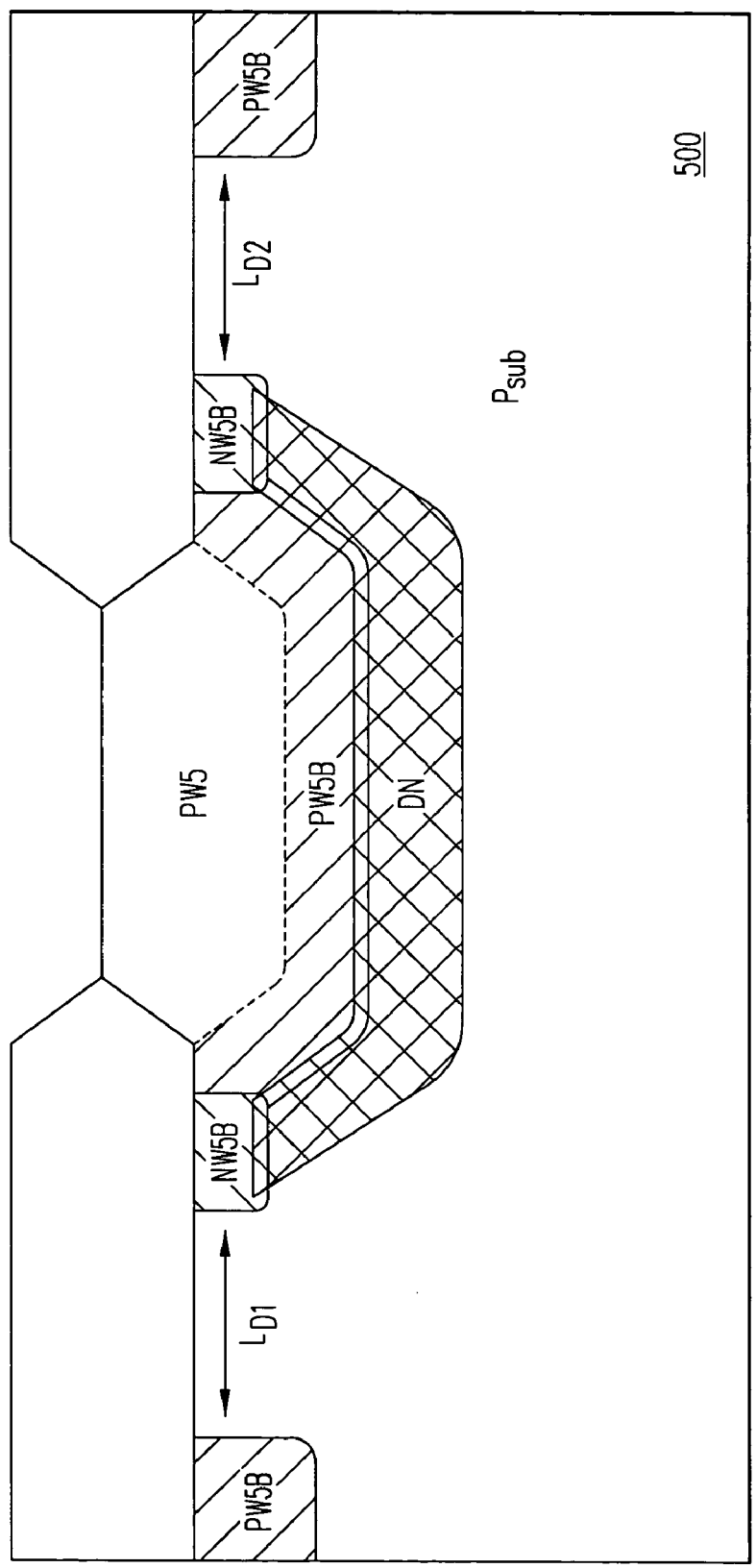
FIG. 14M is a cross-sectional view showing how a deep N layer can be used a single 5V P well, with sidewalls from a 5V N layer.
Figure 14P:
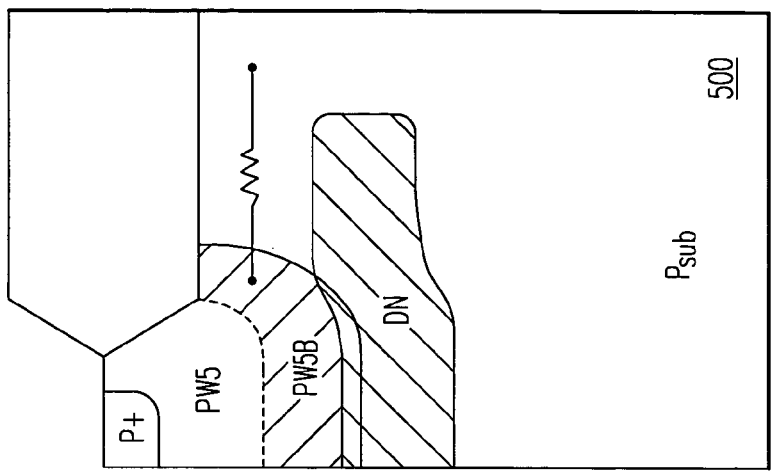
FIG. 14P is a cross-sectional view showing how, if the 5V N layer of FIG. 14M is omitted, a resistive connection is formed between the P well and the P substrate.
Figure 14O:
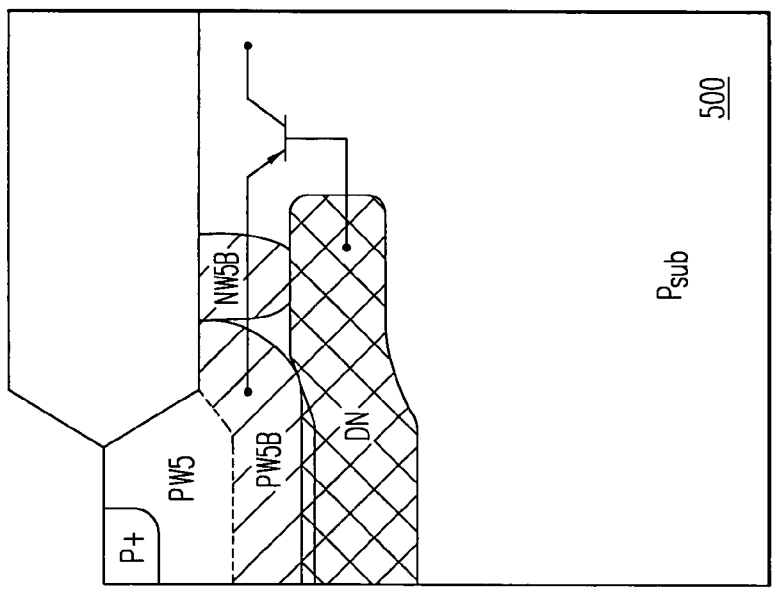
FIG. 14O is a cross-sectional view showing how, if the 5V N layer of FIG. 14M is made narrow enough, the parasitic bipolar transistor is made horizontal.
Figure 14N:
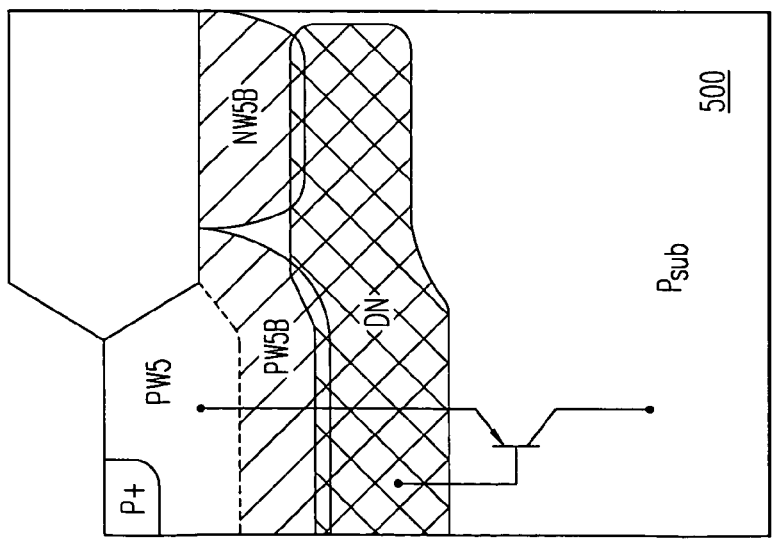
FIG. 14N is a cross-sectional view showing how, if the 5V N layer of FIG. 14M is made wide enough, the parasitic bipolar transistor is made vertical.

FIG. 14M shows that a deep N layer DN can be used to isolate a single 5V P well PW5, with sidewalls formed from the 5V N layer NW5B. As shown in FIG. 14N, if the DN layer completely overlaps and extends beyond the P well region and if a ring shaped sidewall isolation comprising (at least) 5V N layer NW5B is made wide enough, the parasitic bipolar transistor between 5V P well PW5 and P substrate 500 will be limited to vertical conduction through a heavily doped DN layer and the parasitic gain will be low, whereas if the 5V N layer NW5B is narrow the parasitic bipolar transistor conduction may include a more substantial horizontal component (having a higher gain than the more heavily doped vertical path), as shown in FIG. 14O. As shown in FIG. 14P, if the 5V N layer NW5B sidewall is omitted altogether, 5V P well PW5 is not isolated, and there is a resistive connection or dead short between 5V P well PW5 and P substrate 500.

In the invention described, the isolation of N well regions by the deep DN layer is optional and serves to suppress parasitic bipolar transistors, while for the isolation of P well regions (whether 12V or 5V), the entire P well must be encased in the N-type shell of isolation comprising DN beneath the P well and a sidewall isolation ring circumscribing the P well (comprising either a CIJI structure, or one or more N well regions like the NW5 region or a stack of NW5 and NW12 regions), or otherwise the P well will not be isolated from the surrounding substrate. These requirements will be further clarified by a number of unique isolation structures formed using the epi-less isolation method of the invention, all without the need for diffusion.

Figure 15A:
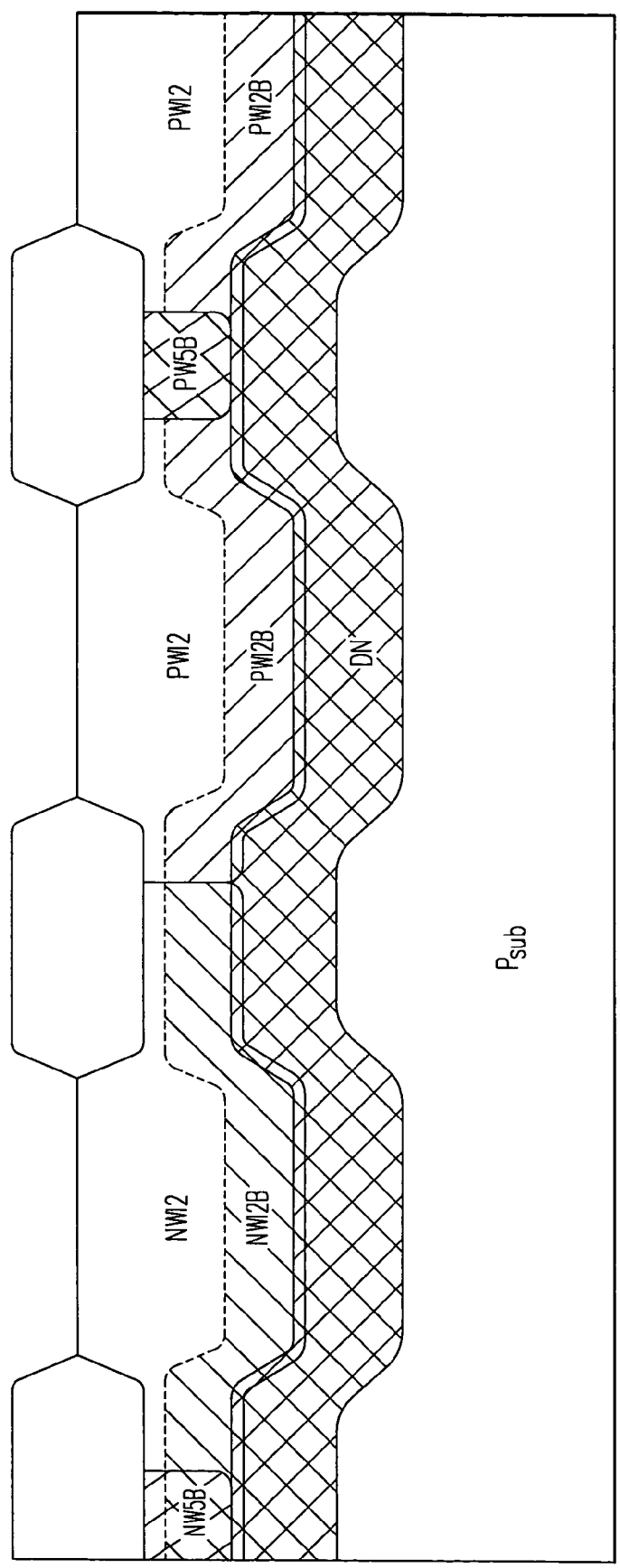
FIG. 15A is a cross-sectional view showing two 12V P wells and one 12V N well isolated from a P substrate by a single deep N layer.

FIG. 15A shows two 12V P wells PW12 and a 12V N well NW12, all isolated by a single deep N layer DN. The 12V P wells PW12 are separated by a 5V P layer PW5B, and the 12V N well NW12 is separated from the 12V N well adjacent to it (not shown) by a 5V N layer NW5B. The 12V P well PW12 and the 12V N well NW12 abut as shown. The wells would not all have to be 12V wells; some 5V wells could be included.

Figure 15B:
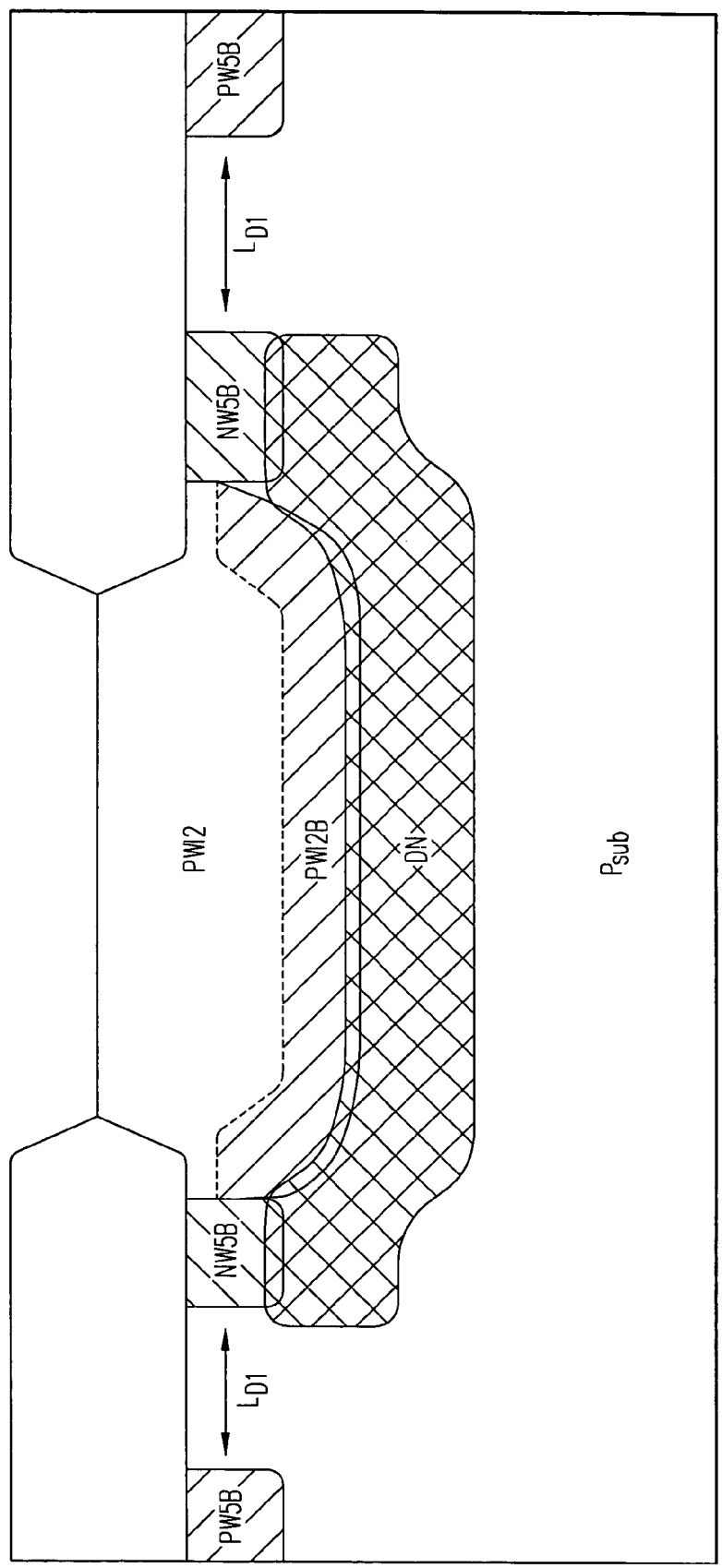
FIG. 15B is a cross-sectional view showing a single 12V P well isolated from a P substrate by a deep N layer and two sidewalls formed of 5V N layers, separated from a surrounding P guard ring.
Figure 15C:
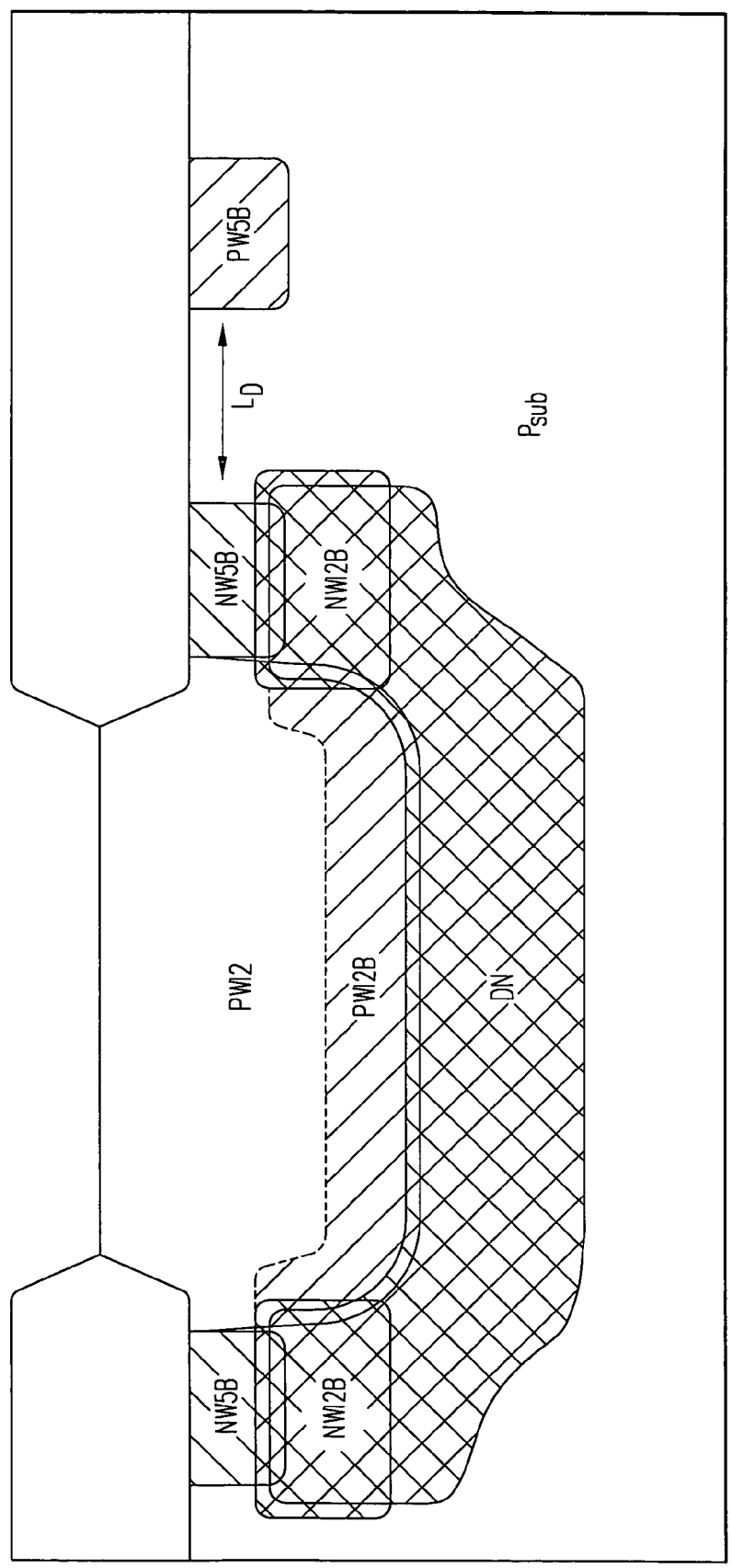
FIG. 15C is a cross-sectional view of a structure similar to that shown in FIG. 15B, except that the isolation sidewalls include a 12V N layer.

FIG. 15B shows a single 12V P well PW12 isolated by a deep N layer DN, with isolation sidewalls formed of 5V N layers NW5B, separated by a distance $L_{D1}$ from a surrounding guard ring P layer PW5B. FIG. 15C shows a similar structure except that the isolation sidewalls include a 12V N layer NW12B. Both structures are similar to the 5V isolated P well of FIG. 14M except that the buried portion of P well PW12, namely PW12B, does not reach the silicon surface beneath the field oxide regions.

Figure 15D:
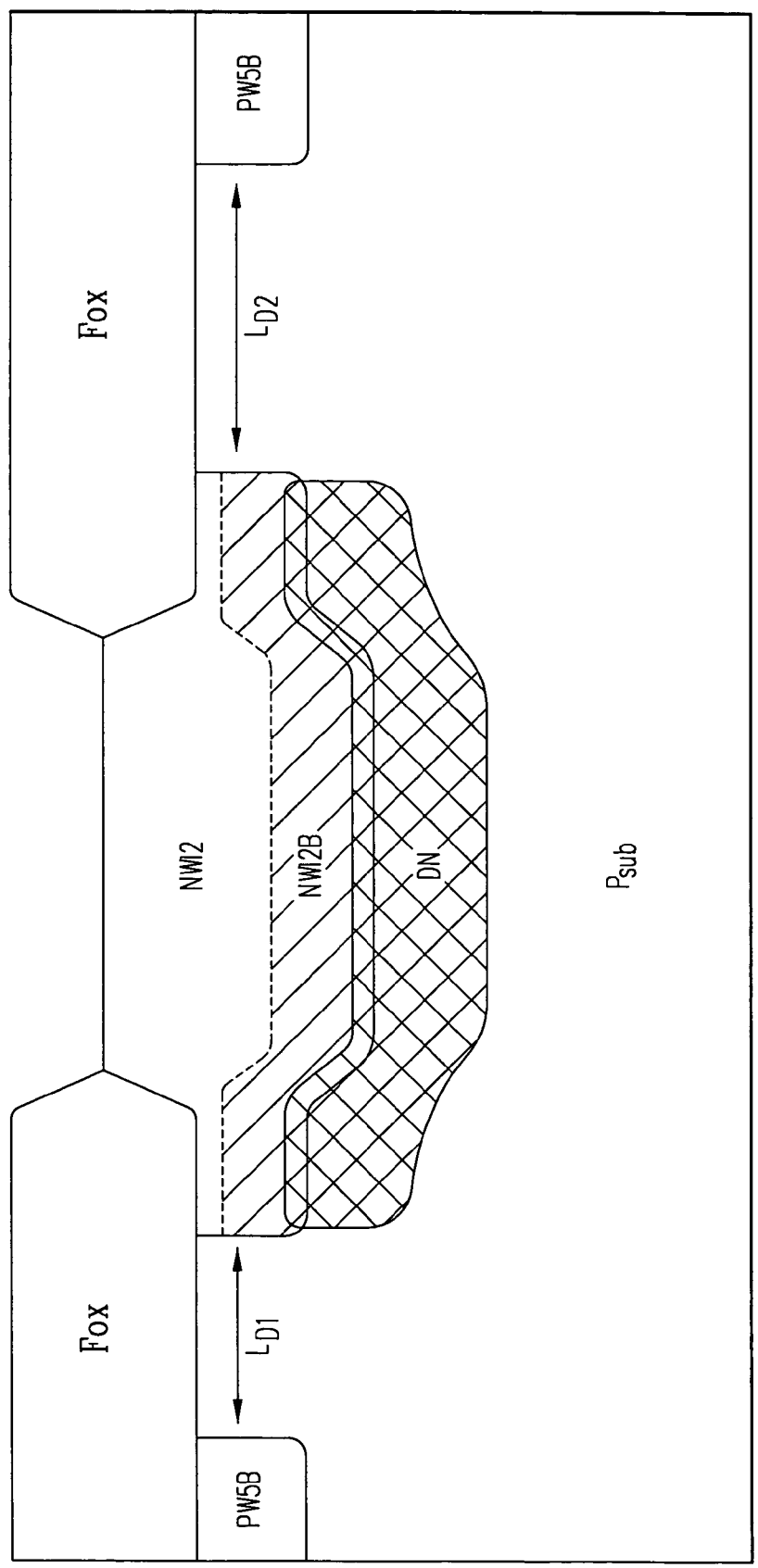
FIG. 15D is a cross-sectional view of a 12V N well isolated from a P substrate by a deep N layer that extends to the sides of the 12V N well.

FIG. 15D shows a deep N layer DN that extends to the side of a 12V N well NW12. Alternatively deep N layer DN could be pulled back to the region directly below the opening in the field oxide layer. The breakdown voltage is set by the distance $L_D$ between the isolation structure and a 5V P layer PW5B guard ring. The structures shown is similar to the 5V isolated N well of FIGS. 14I and 14J except that in FIG. 15D the buried portion of N well NW12, namely NW12B, does not reach the silicon surface beneath the field oxide regions whereas in FIGS. 14I and 14J the 5V buried N well NW5B does reach the silicon surface.

Figure 15F:
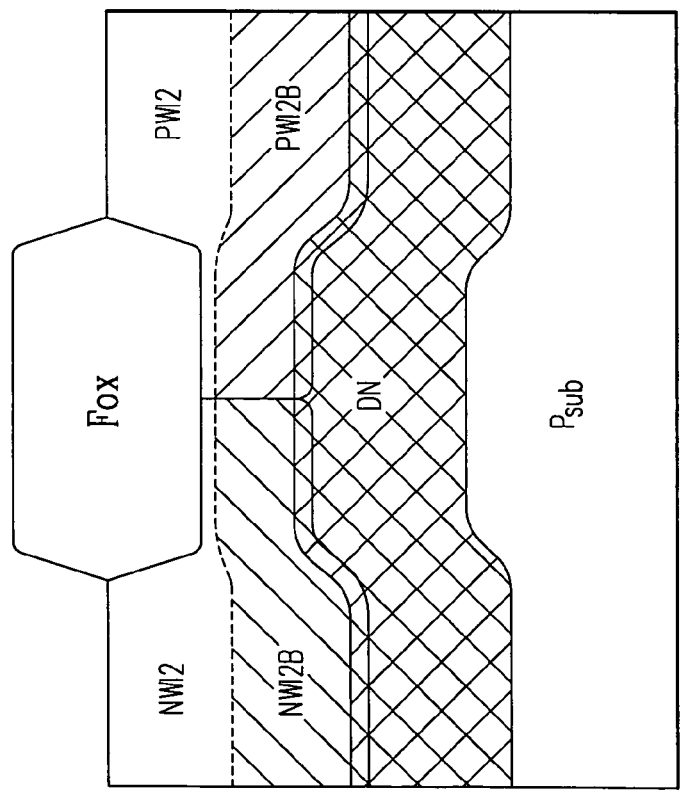
FIG. 15F is a cross-sectional view of a structure similar to that shown in FIG. 15E, except that a 5V N layer and a 5V P layer have been introduced between the 12V N well and the 12V P well.
Figure 15E:
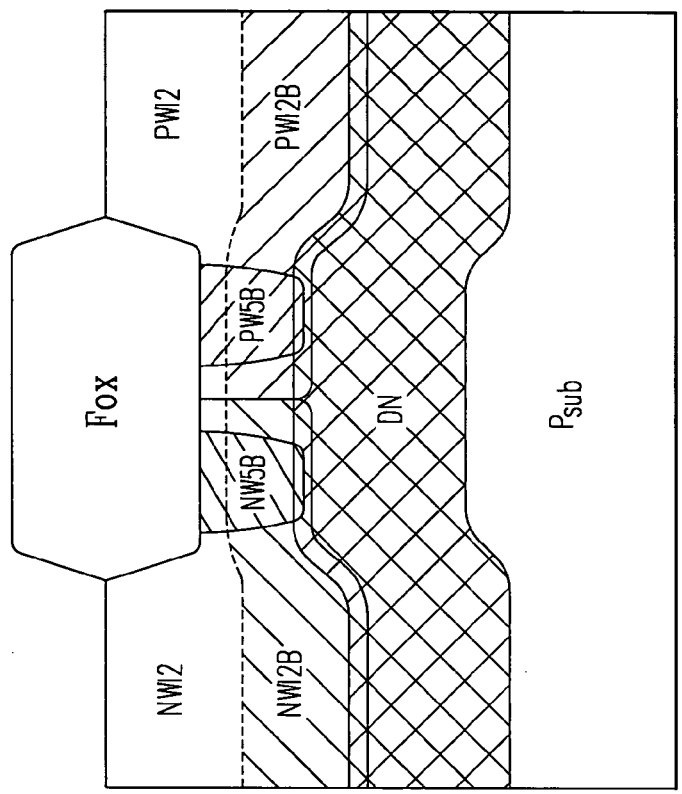
FIG. 15E is a cross-sectional view showing that an adjacent 12V N well and 12V P well can touch and still meet the breakdown condition at the surface.

FIG. 15E shows that the adjacent 12V N well NW12 and 12V P well PW12 can touch and still meet the breakdown condition at the surface. While the more heavily doped buried portion of each well, namely NW12B and PW12B will also touch in such a structure, the critical electric field of a junction in the bulk silicon is higher than along a surface or interface and therefore the required voltage can be achieved. Alternatively, as shown in FIG. 15F, a 5V N layer NW5B and a 5V P layer PW5B can be introduced between 12V N well NW12 and 12V P well PW12, but in that case 5V N layer NW5B and 5V P layer PW5B must be held back from each other or otherwise the breakdown condition (above 8V) would not be met. Of course, it is also possible to allow a space between the P well PW12 and N well NW12 so long as the DN layer continues under both wells and under the intervening gap.

Figure 16A:
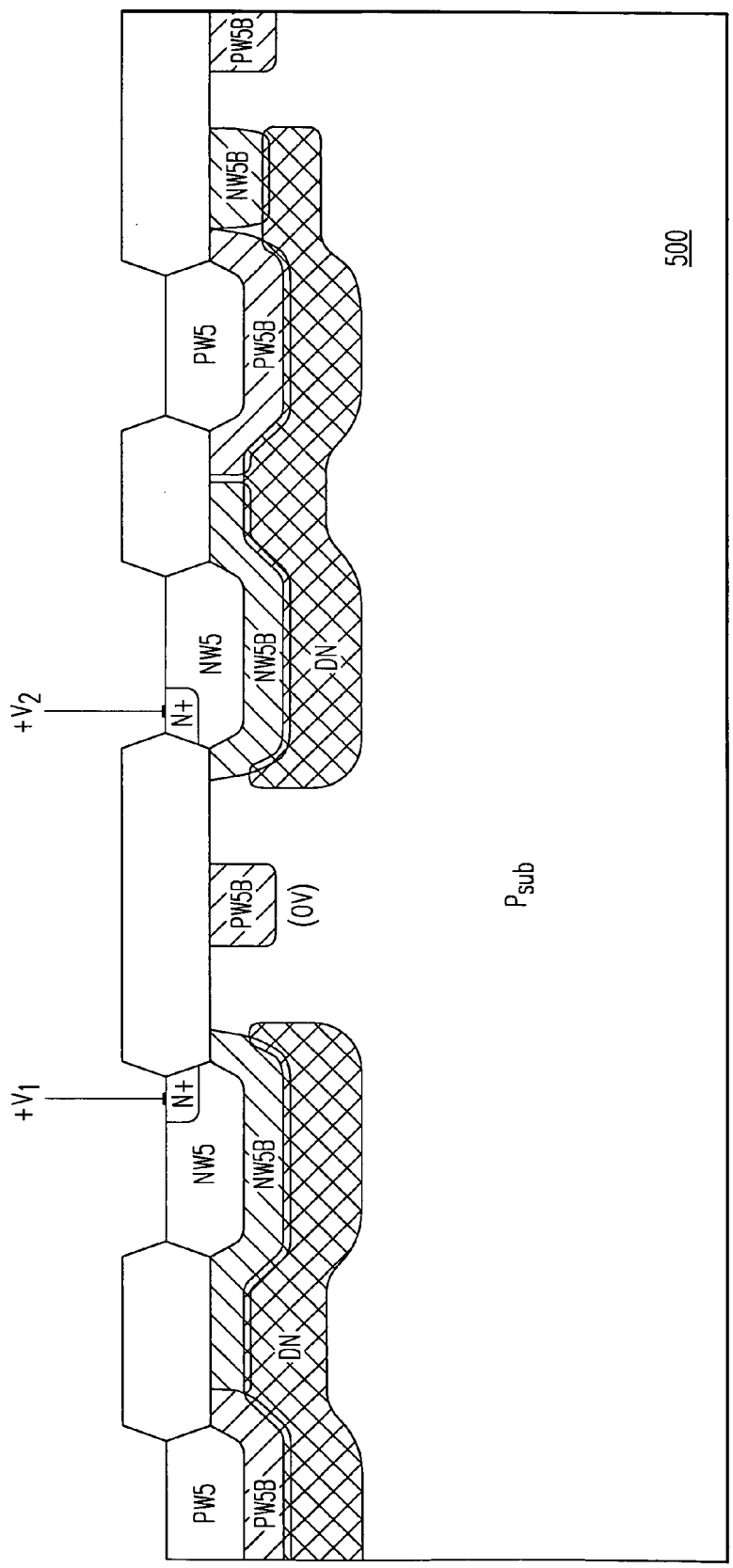
FIG. 16A is a cross-sectional view of two isolated 5V N wells, each associated with a complementary P well, biased by two different voltages and operated independently of each other.

FIG. 16A shows that two isolated 5V N wells NW5, each associated with a complementary 5V P well, can be based at different voltages $+V_1$ and $+V_2$ and can be operated independently of one another, even though they are formed in the same substrate. The isolation regions are biased through their connection with the N well NW5 to the labeled supply rails and stated potentials. The P well PW5 contained within the isolation structure biased to $+V_1$ can be biased to any voltage equal to or more negative than the isolation potential $+V_1$. The most negative potential at which P well PW5 can be biased is its maximum rated voltage, relative to $+V_1$. If the isolation region and $+V_1$ are biased at 5V, then P well PW5 can be biased and operated continuously at any potential from +5V down to 0V (ground), i.e. over the full range of the supply voltage. But if the isolation region and $+V_1$ are biased at 12V, then P well PW5 can be biased and operated continuously at any potential from +12V down to only 7V (i.e. 12V minus 5V max. operation) because a 5V well was employed. If a 12V P well were used, however, then P well PW12 could be operated at any potential from 12V down to 0V (ground).

Figure 16B:
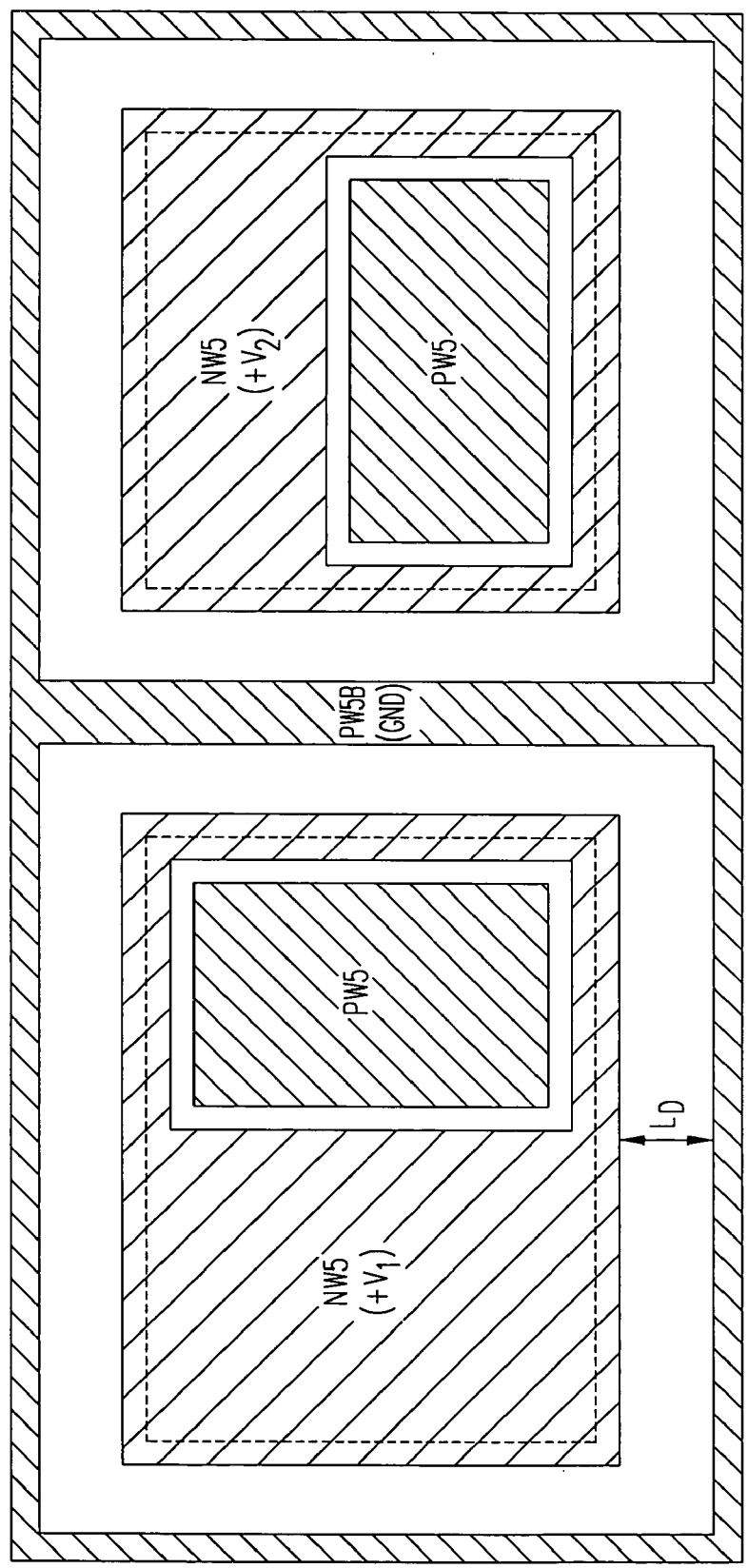
FIG. 16B is a plan view of the structure shown in FIG. 16A.
Figure 16C:
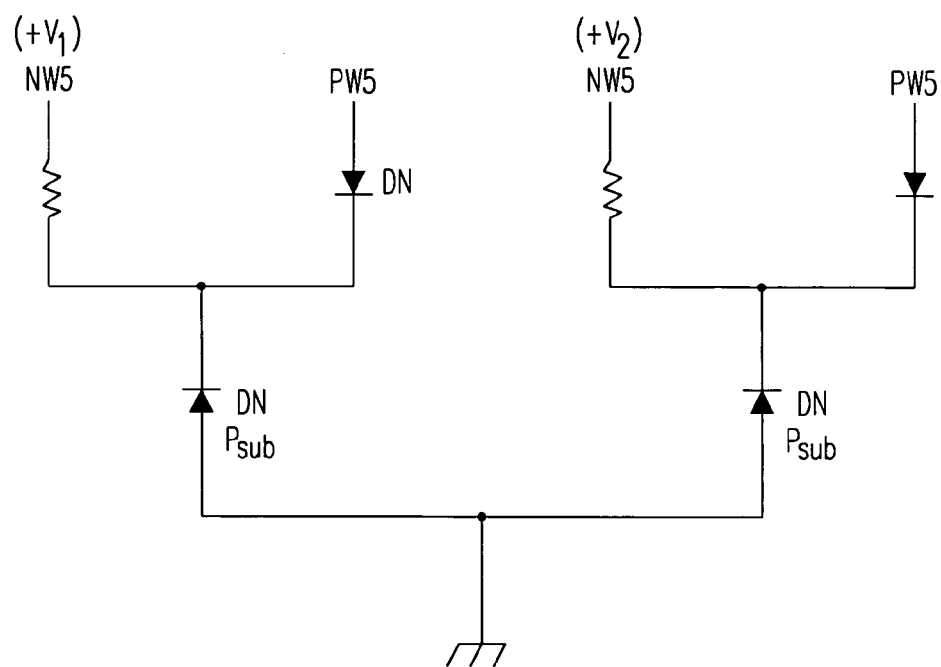
FIG. 16C is a schematic circuit diagram of the structure shown in FIG. 16A.

The same set of rules applies to the isolation island and wells biased to potential $+V_2$. Since the devices are fully isolated, they can operate completely independently of one another. Furthermore the isolated P well regions can in some cases operate below ground, i.e. below the substrate potential, if necessary. FIG. 16B is a plan view of the structure of FIG. 16A and FIG. 16C is a schematic representative of the structure and layout.

Figure 16E:
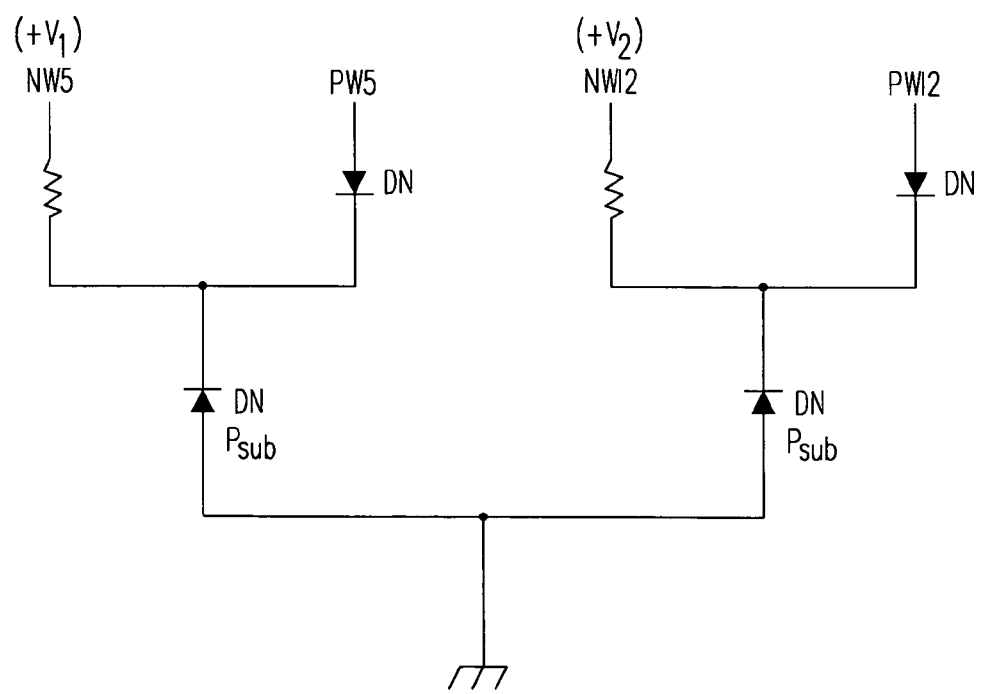
FIG. 16E is a schematic circuit diagram of the structure shown in FIG. 16D.
Figure 16D:
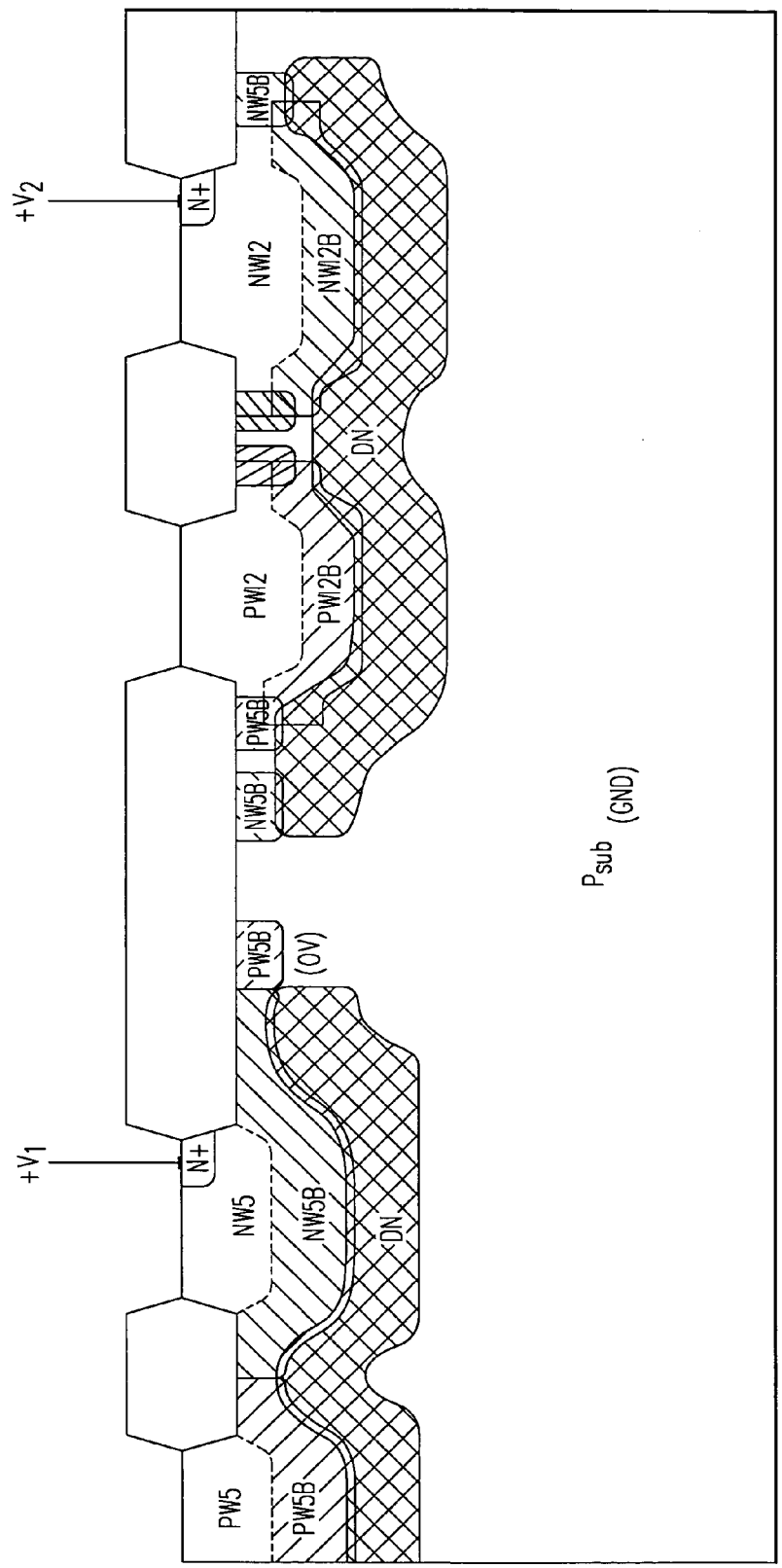
FIG. 16D is a cross-sectional view of a structure similar to that shown in FIG. 16A, except that one complementary set of wells is a 5V pair and the other set of complementary wells is a 12V pair.
Figure 16F:
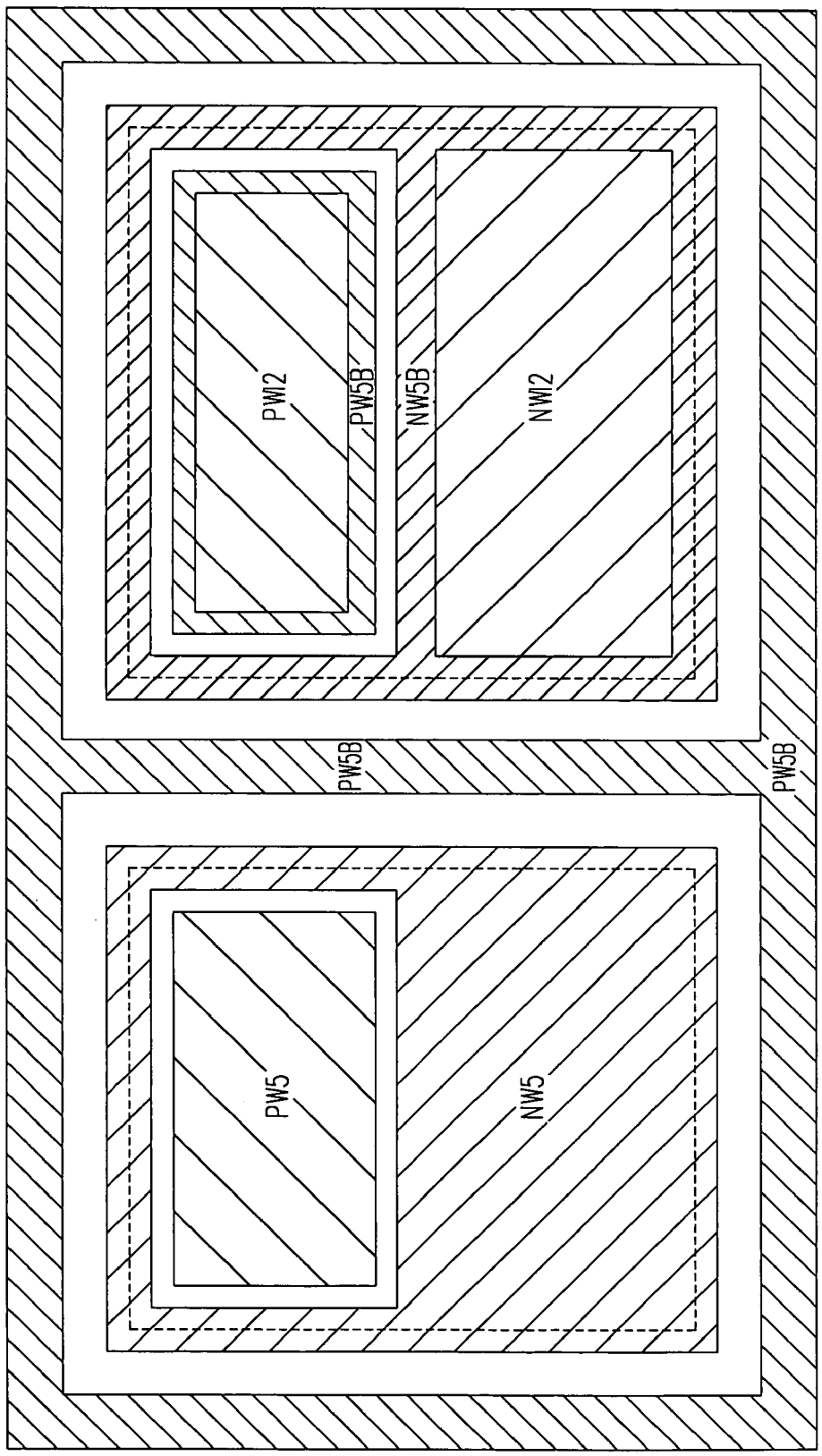
FIG. 16F is a plan view of the structure shown in FIG. 16D.

FIG. 16D is similar to FIG. 16A, except that one complementary set of wells is a 5V pair and the other set of complementary wells is a 12V pair. The 5V N well NW5 is biased at $+V_1$ (for example at 5V), and the 12V N well NW12 is biased at $+V_2$ (for example at 12V). The 5V wells touch each other whereas there is a 5V N layer NW5B and a 5V P layer PW5B separating the 12V wells. FIG. 16E is a schematic representation of the structure of FIG. 16D, and FIG. 16F is a plan view of one possible layout of the structure of FIG. 16D.

In addition to limiting the thermal diffusion cycles and the total number of masking steps, to improve the device characteristics and obtain high voltages it is highly desirable to control the doping profiles of the individual regions, especially those comprising elements of active devices. Formation of such structures should be performed in a low or zero thermal budget process consistent with the other elements of the invention, otherwise the benefit of the as-implanted low-thermal-budget epi-less isolation structures and processes will be nullified.

Figure 17D:
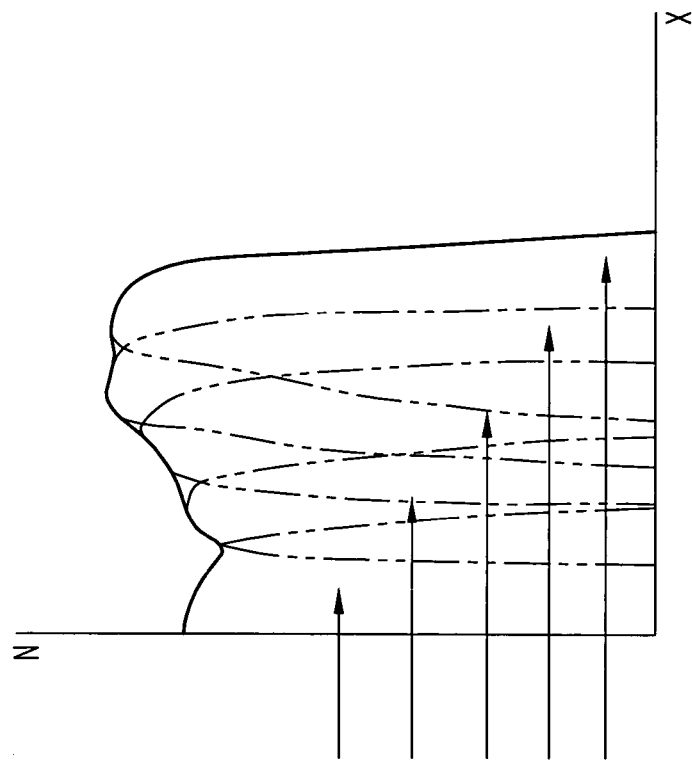
FIG. 17D shows a doping profile that is produced by a "chained" implant.
Figure 17C:
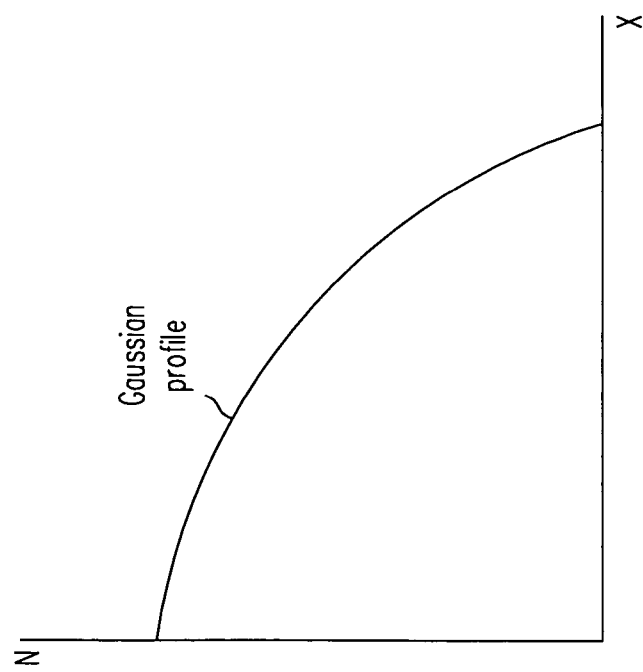
FIG. 17C shows a typical Gaussian doping profile that is produced by a conventional implant and diffusion process.
Figure 17F:
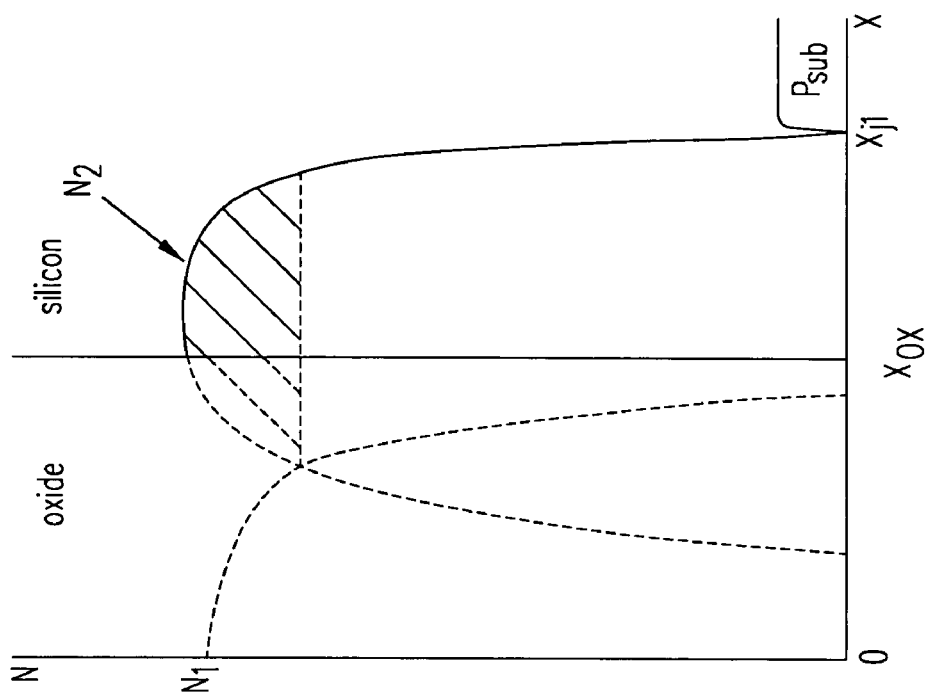
FIG. 17F shows detailed view of a doping profile of the two chained implants shown in FIG. 17E, performed though an oxide layer on the surface of the substrate.
Figure 17E:
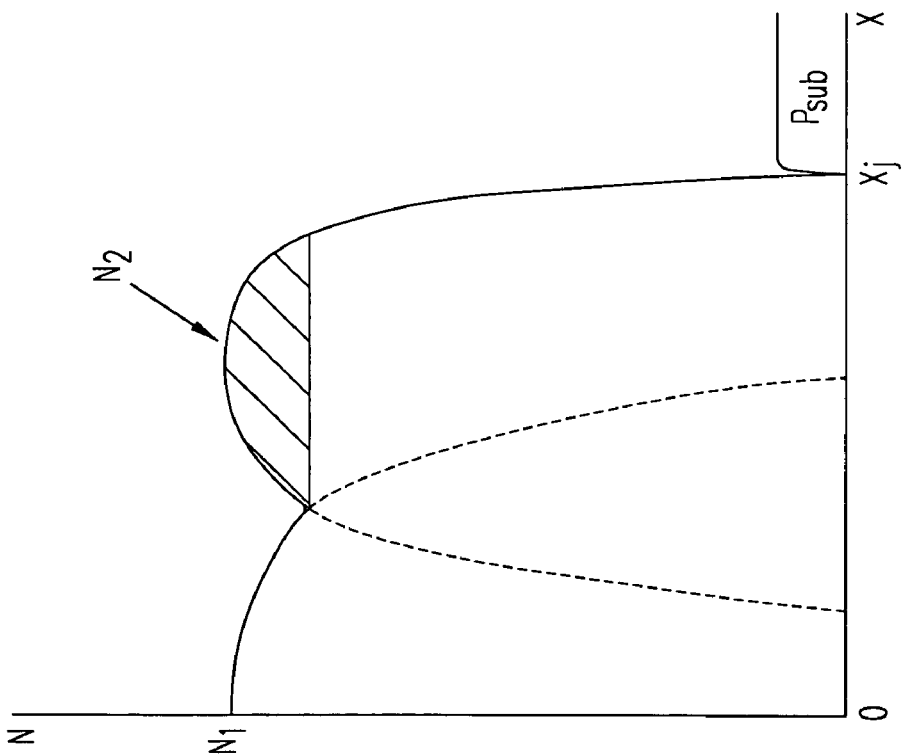
FIG. 17E shows detailed view of a doping profile of two chained implants.
Figure 17H:
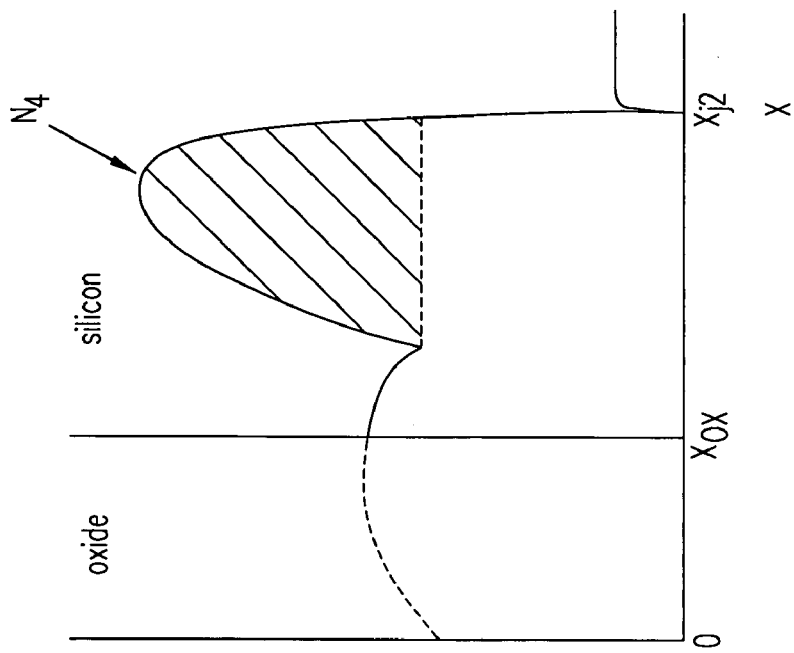
FIG. 17H shows detailed view of a doping profile of the two chained implants shown in FIG. 17G, performed though an oxide layer on the surface of the substrate.
Figure 17G:
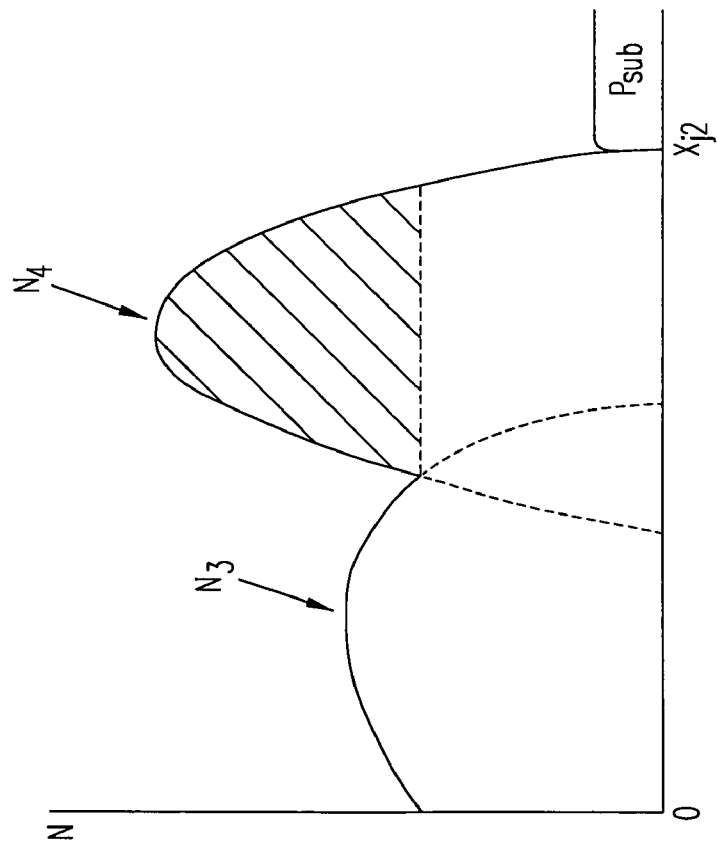
FIG. 17G shows detailed view of a doping profile of two chained implants where the peak doping concentration of the deep implant is greater than the peak doping concentration of the shallow implant.
Figure 17J:
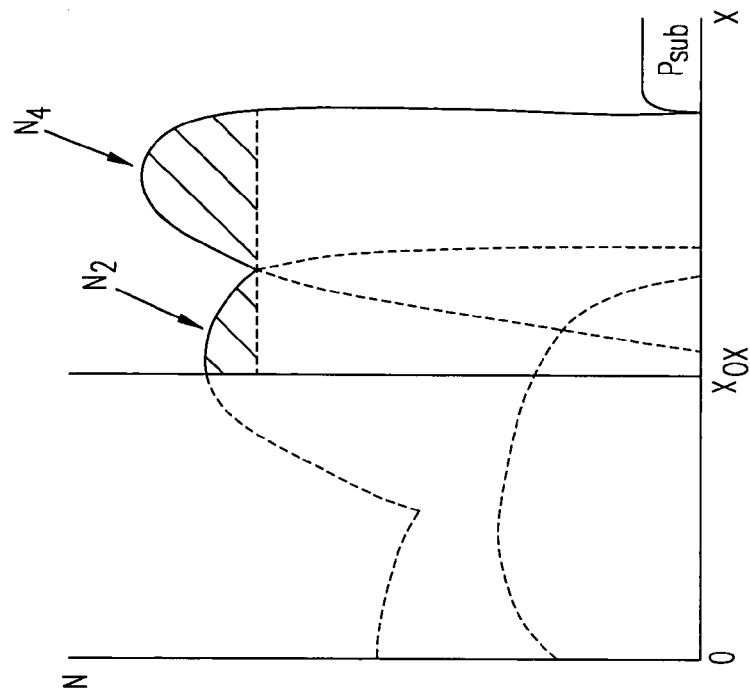
FIG. 17J shows the doping profile that results from combining the four implants of FIGS. 17F and 17H.
Figure 17I:
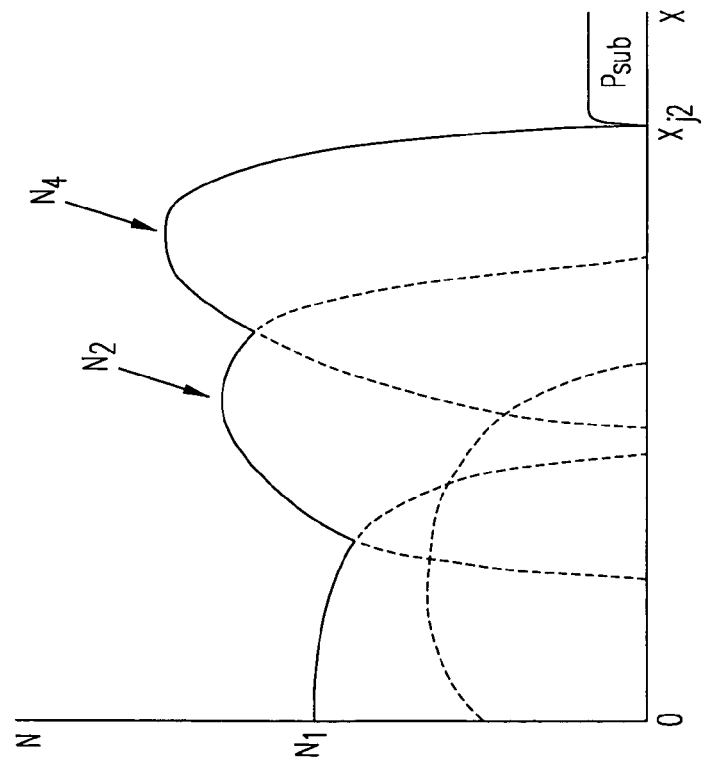
FIG. 17I shows the doping profile that results from combining the four implants of FIGS. 17E and 17G.
Figure 17K:
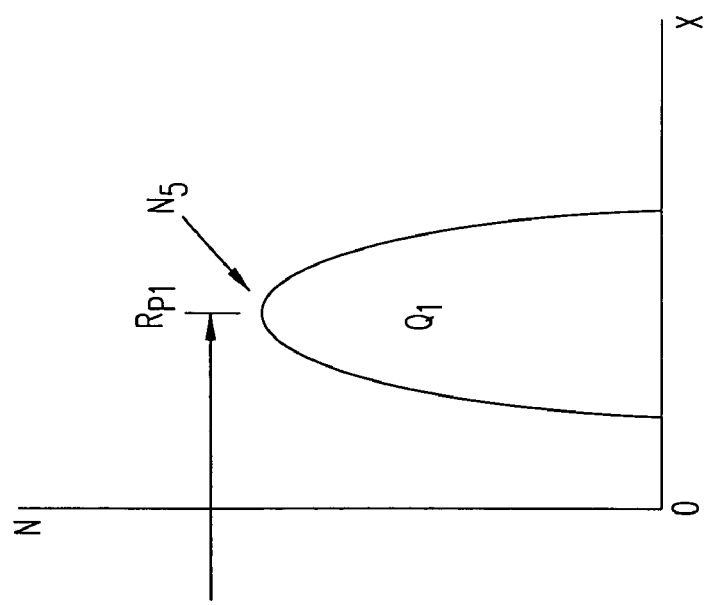
FIGS. 17K and 17L illustrate the physical phenomenon that an implant of a given dose spreads out more as it is implanted deeper into a substrate and therefore has a lower peak concentration.
Figure 17L:
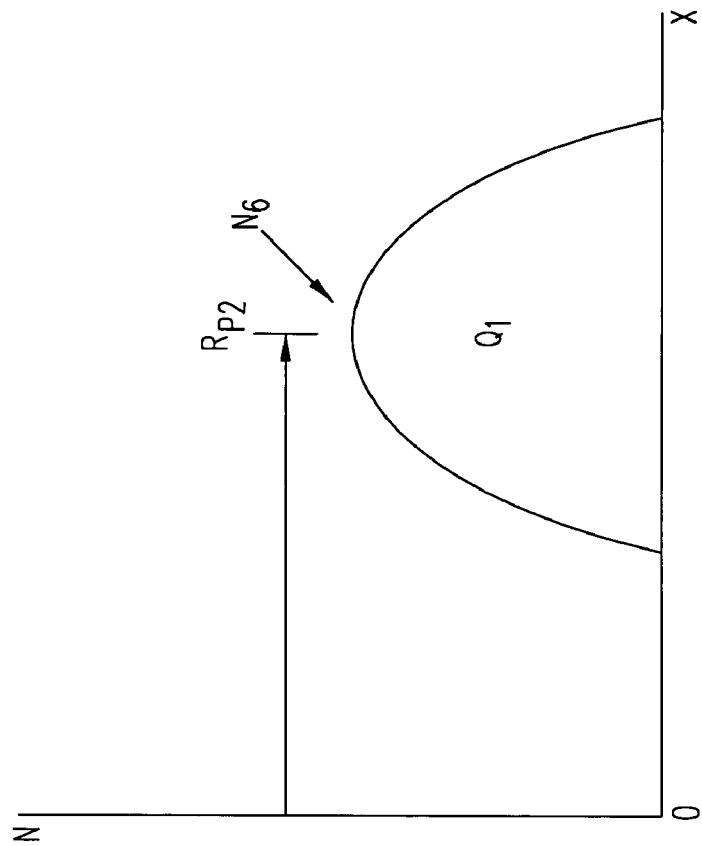
Figure 17N:
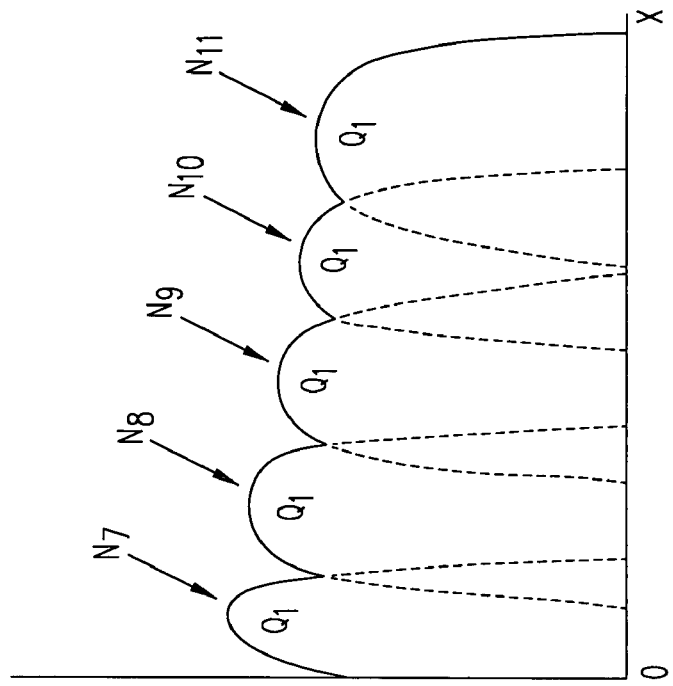
FIG. 17N shows a doping profile of a series of five implants, each having the same dose but implanted at a different energy.
Figure 17M:
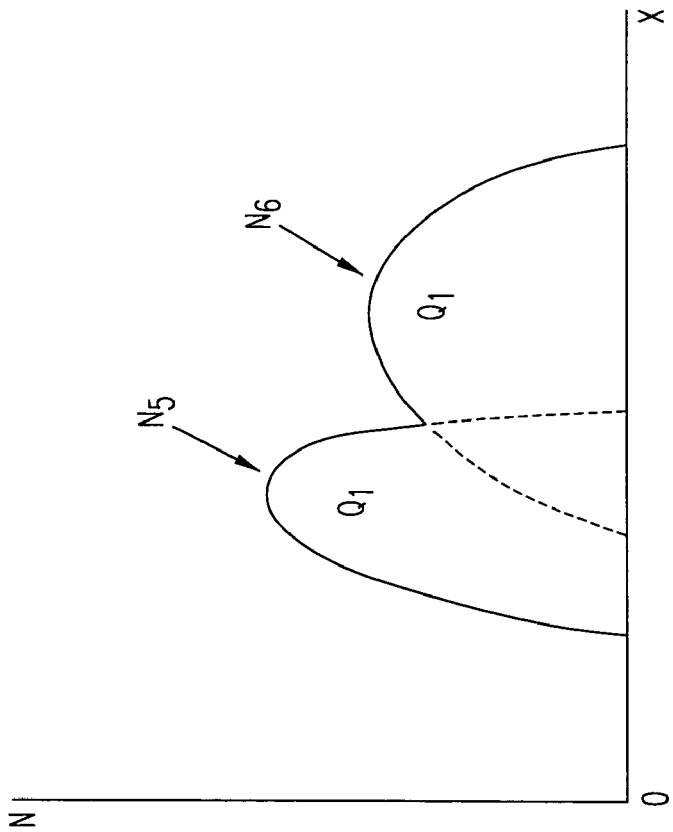
FIG. 17M shows the doping profile that would result if the implants of FIGS. 17K and 17L were carried out in the same substrate.
Figure 17P:
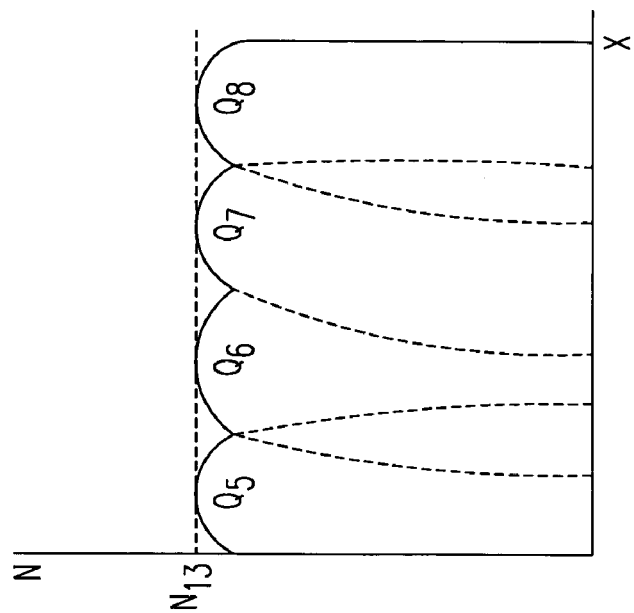
FIG. 17A is a flow diagram summarizing a conventional process for forming doped regions in a semiconductor material.
FIG. 17B is a flow diagram summarizing a process for forming doped regions in a semiconductor material in accordance with this invention.
FIG. 17O shows a doping profile of two implants, with the deeper implant having a greater dose such that the peak concentration of the implants is approximately the same.
FIG. 17Q is a cross-sectional view showing a series of implants through a window in a photoresist layer, showing the lateral spreading of the implants in the substrate.
FIG. 17R is a cross-sectional view similar to that shown in FIG. 17Q, except that the dopant is implanted into a region between two trenches filled with a nonconductive material to restrict the lateral spreading of the dopants.
FIG. 17S is a cross-sectional view similar to FIG. 17R, except that the deepest dopant is implanted to a level below the two trenches, allowing it to spread laterally.
FIG. 17T is a cross-sectional view of the implanted region that results from the series of implants shown in FIG. 17S.
FIG. 17U is a view of a series of chained P-type implants performed through an N-type epitaxial layer to a P-type substrate.
FIG. 17V is a view of the doping profile obtained from the implants shown in FIG. 17U.
FIG. 17W is a view of a series of chained implants similar to those shown in FIG. 17U except that the implants are constrained by a pair of dielectric-filled trenches.
FIG. 17X is a view of the doping profile obtained from the implants shown in FIG. 17W.
FIG. 17Y shows a CIJI sidewall isolation region comprising a series of implants into a P-substrate which overlaps onto a deep implanted N-type floor isolation region in an annular or ring pattern to form an isolated pocket separated from the common substrate.
FIG. 17Z is a view of the doping profile obtained from the implants shown in FIG. 17Y.
Figure 17O:
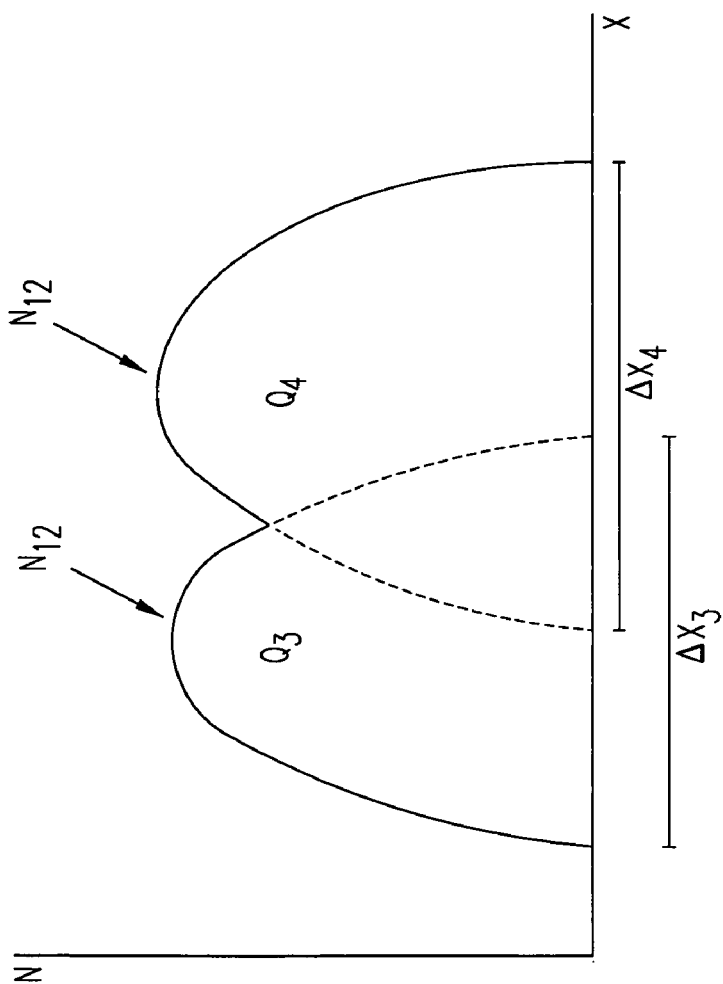
Figure 17R:
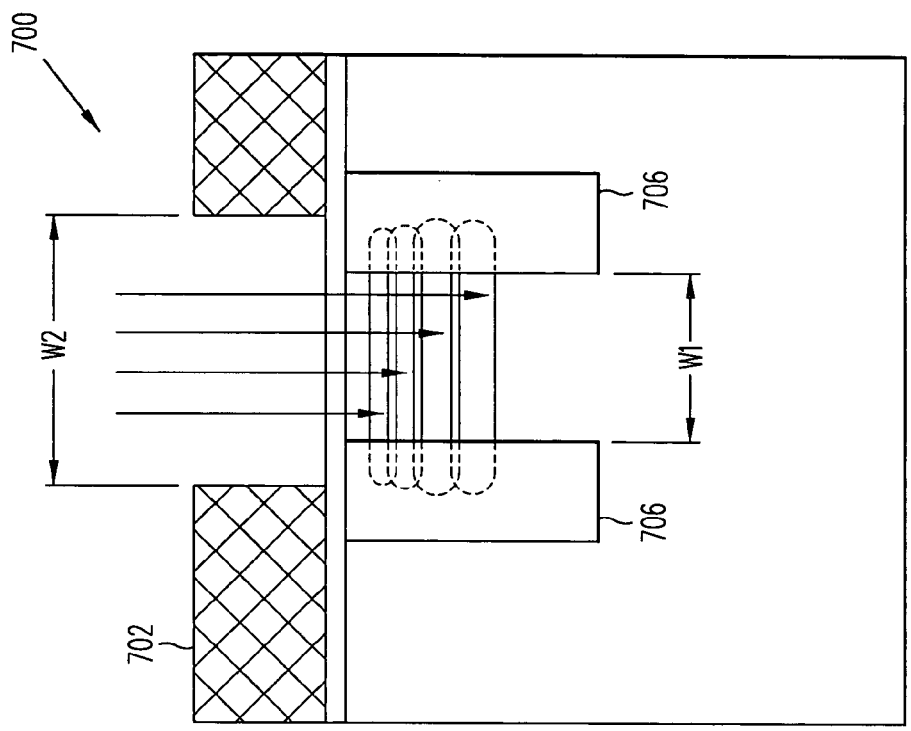
Figure 17Q:
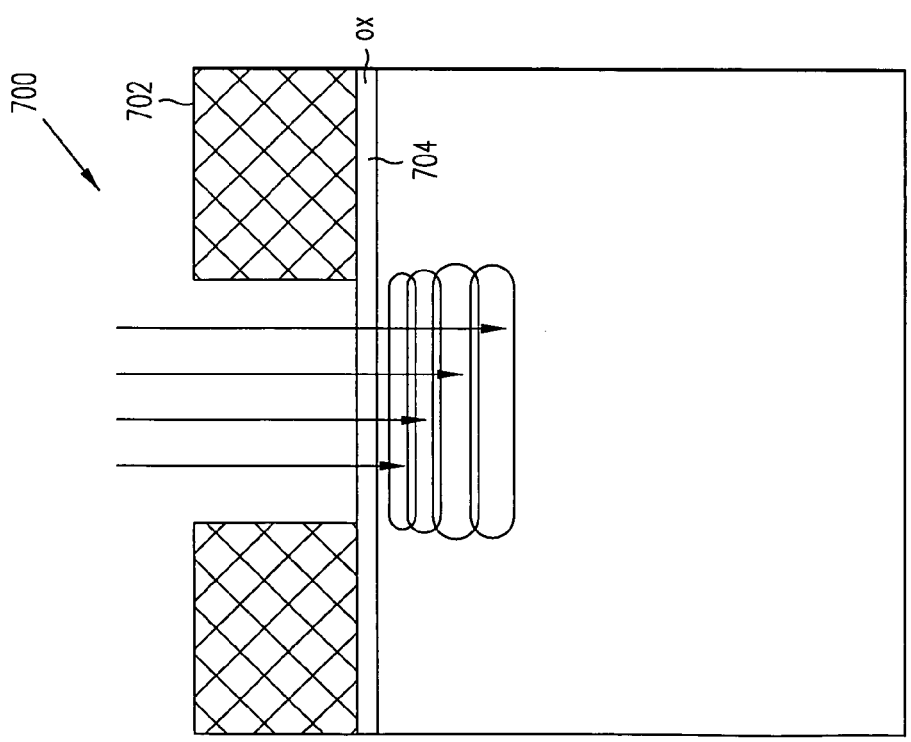
Figure 17T:
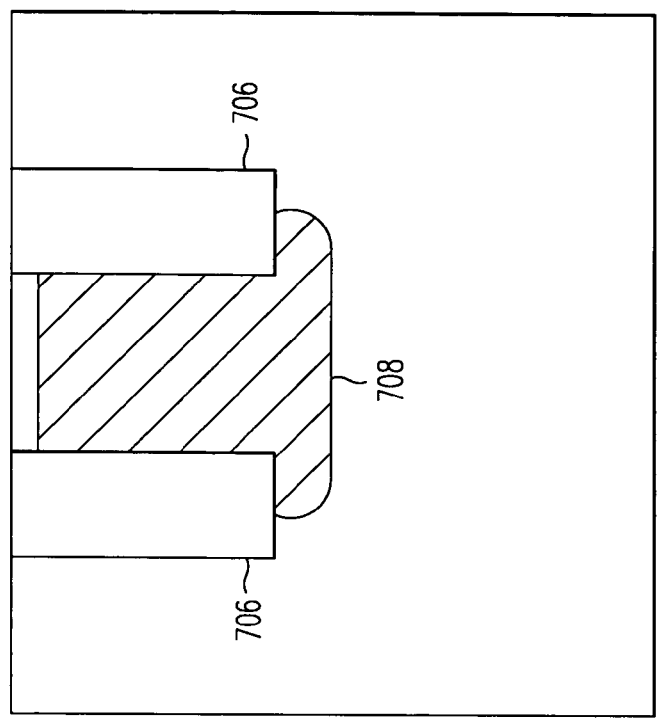
Figure 17S:
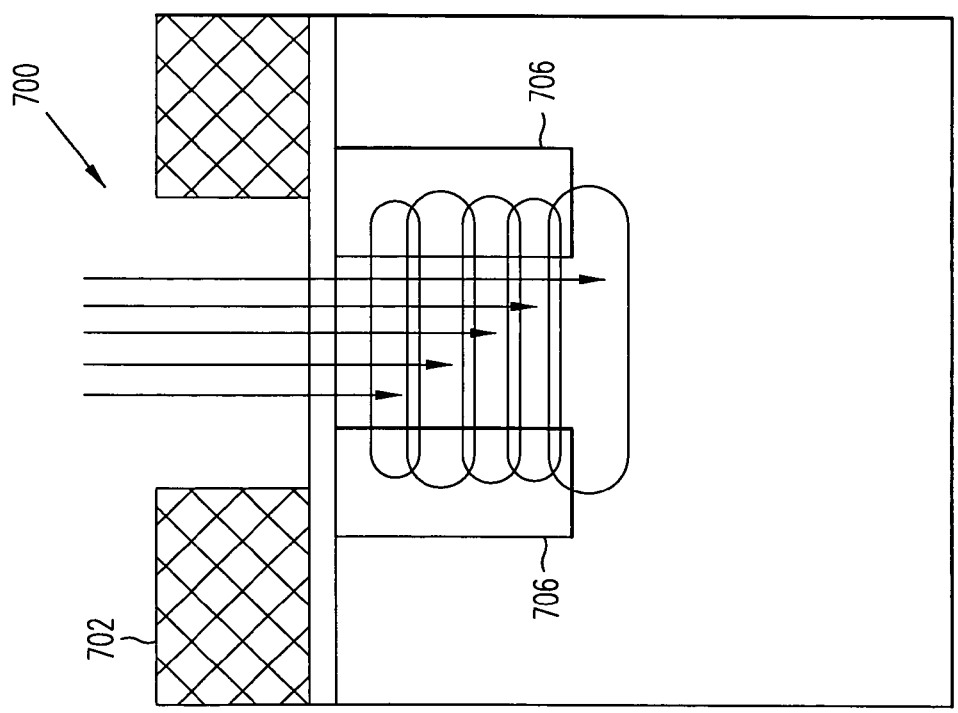
Figure 17V:
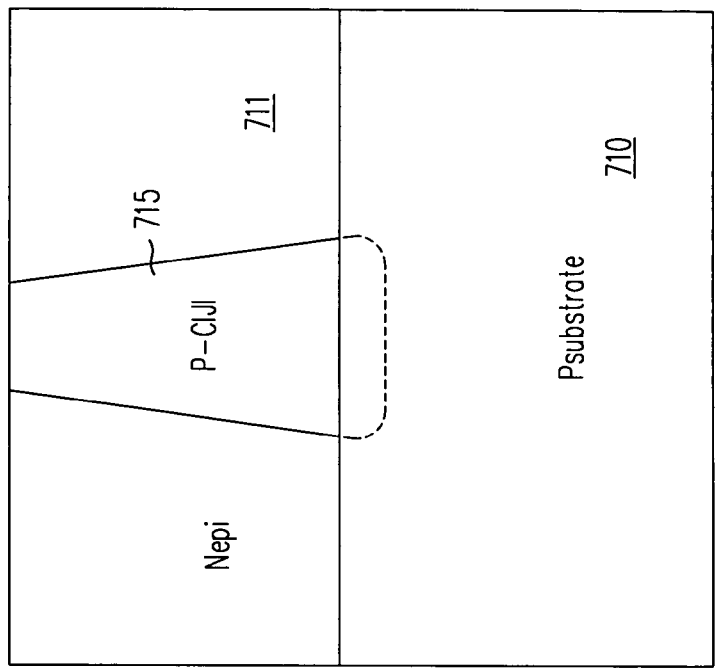
Figure 17U:
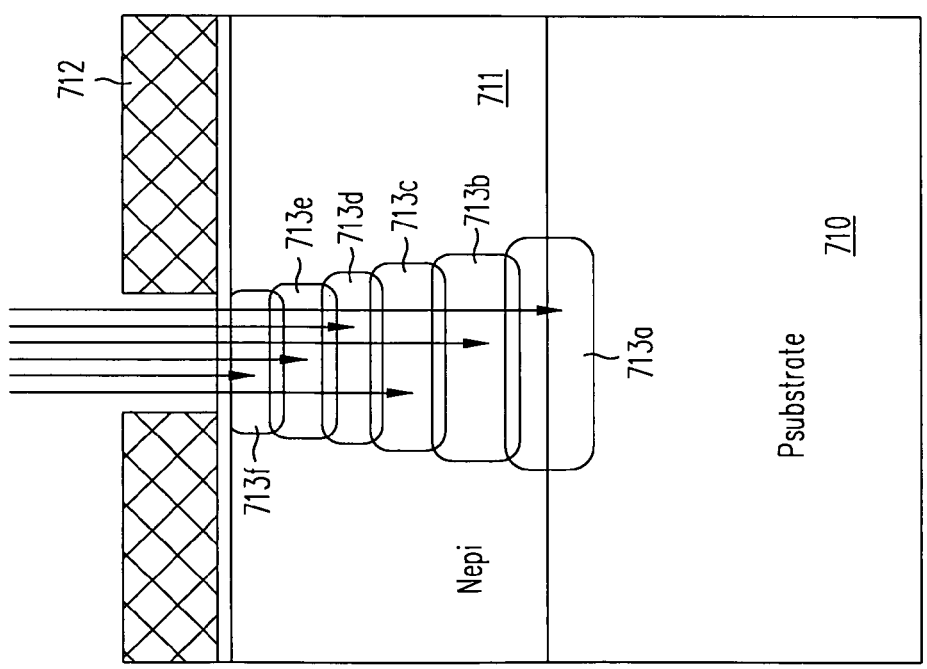
Figure 17X:
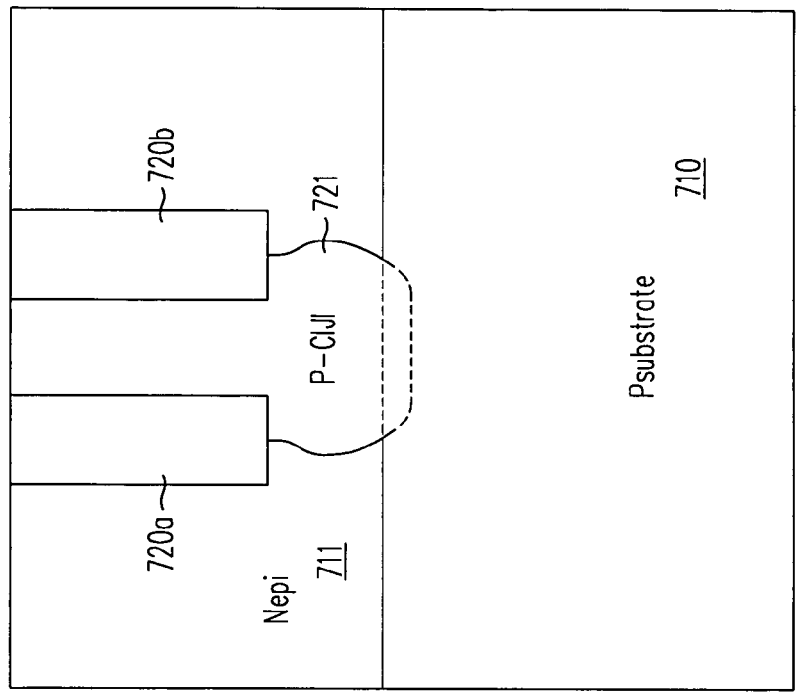
Figure 17W:
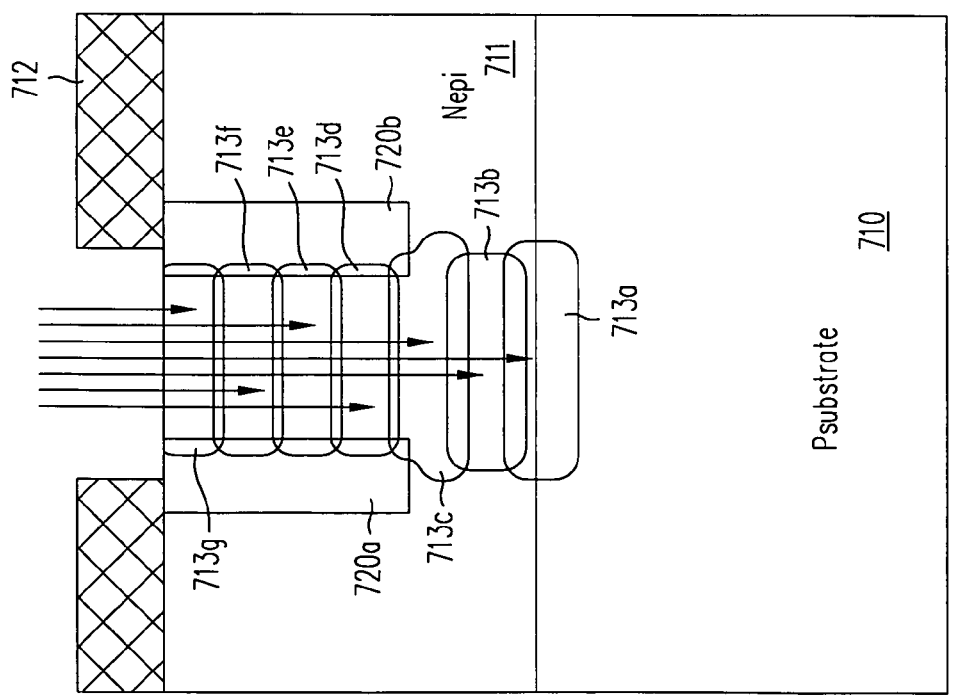
Figure 17Z:
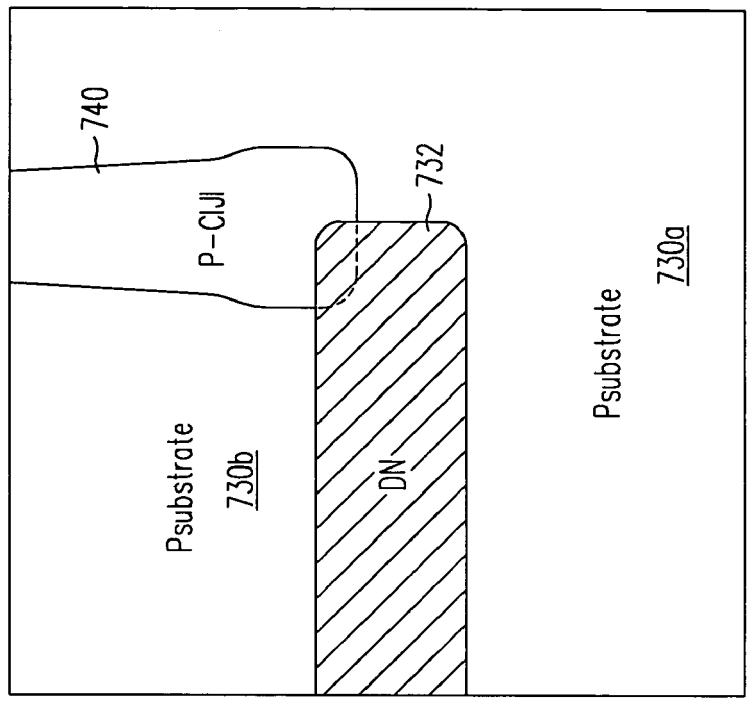
Figure 17Y:
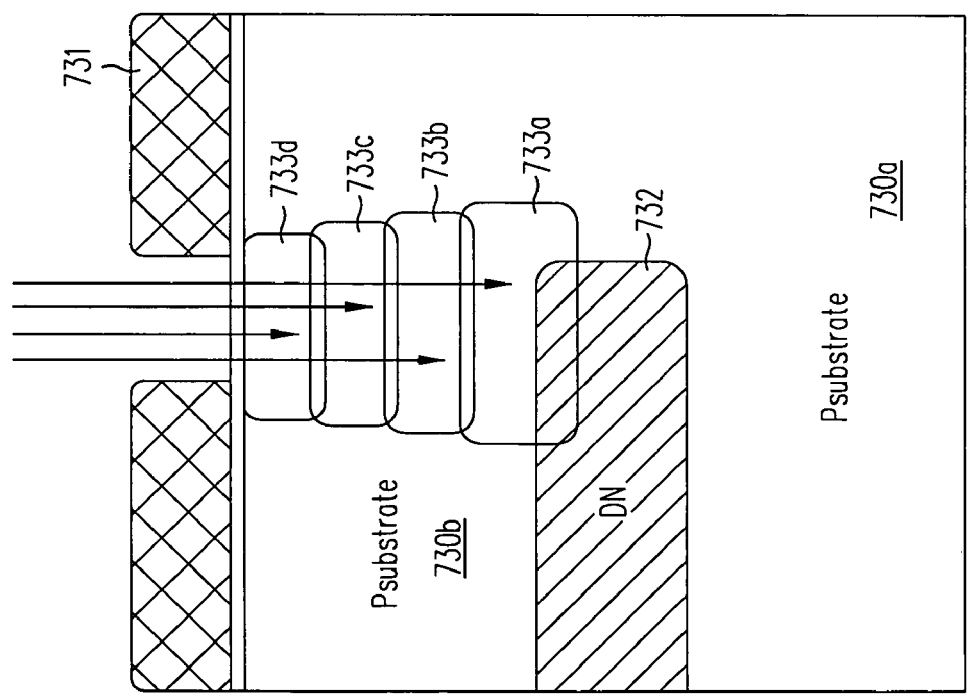
Figure 17B:
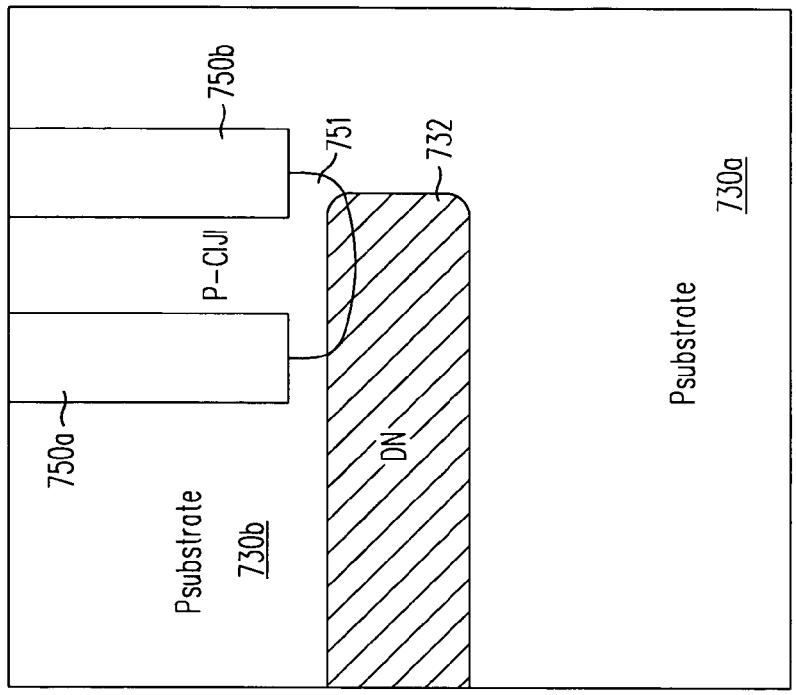
Figure 17A:
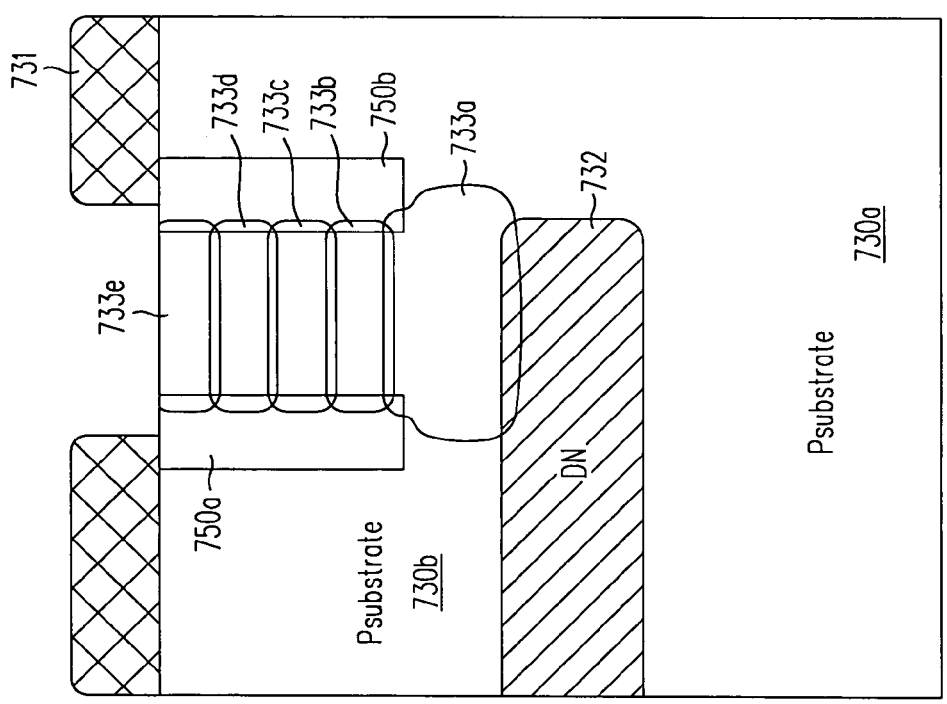

FIG. 17A summarizes the conventional process of forming doped regions in a semiconductor material, which typically includes a masking step, a relatively shallow implant of dopant through openings in the mask, and a high temperature diffusion to diffuse or "drive in" the implanted dopant. Of course, there are normally steps preceding and following the introduction of dopant but they are not of primary concern in this discussion (except that added diffusion affects, i.e. redistributes, dopants already present in the silicon at the time of the diffusion). In conventional CMOS and bipolar processes, shallow dopant layers are typically introduced by means of a single medium energy ion implantation, typically ranging from 60 keV to 130 keV. The implant is typically performed through a photoresist mask having a thickness of approximately 1 μm. Immediately post-implant, the dopant layer is, at most, only a few tenths of a micron in depth. The drive in diffusion is then performed using a high temperature process, ranging from 900° C. to 1150° C. over a period of 30 minutes to as much as 15 or 20 hours, but with 2 to 3 hours being common. Diffusion is often performed in nitrogen ambient, but oftentimes oxidation is performed during a portion of the diffusion cycle, leading to additional doping segregation effects and adding more variability in concentration and diffusion depth to the process. Final junction depths may range from 1 µm to 10 µm, with 1.5 µm to 3 µm junctions being common, except for the isolation and sinker diffusions discussed previously.

FIG. 17B summarizes a process according to this invention which allows one to accurately control the doping profiles of the implanted regions. Following the preliminary steps a relatively thick mask is deposited and patterned on the substrate or epi layer. The mask should be relatively thick (e.g., 3 to 5 µm) to block implants that are performed at relatively high energies, typically from 200 keV up to 3 MeV. There follows a series of "chained" implants, which can take many forms, shallow, deep, high dose or low dose. This allows the creation of a doped region having virtually any desired doping profile. The remaining steps might include a short anneal to activate the dopant and repair crystal damage, but there are no significant thermal cycles that would cause the dopants to be redistributed. For example, the short anneal could be at a temperature of 900° C. or less for 15 minutes or less. Alternatively, a "rapid thermal anneal" (RTA) might be performed lasting only 20 or 30 seconds at temperatures as high as 1150° C., but of sufficiently short duration that no significant diffusion occurs. Chained implants (like the ones described previously for creating the aforementioned CIJI isolation structure and the various as-implanted well structures) may be used to form the critical regions of active devices like the base of a bipolar transistor, the body of a DMOS, or the drift region of a drain extension, RESURF layer or high voltage JFET. By sequentially implanting a number of implants of differing energies preferably through a common mask, an entire multi-hour diffusion can be replaced by a several second implant, and with far better dopant profile control.

As background, FIG. 17C shows the shape of a typical Gaussian profile that is produced by the conventional implant and diffusion process. The vertical axis represents the doping concentration (N); the horizontal axis represents the depth below the surface of the semiconductor material (X). The dopant is implanted to a shallow level and diffused downward. The profile decreases with increasing depth according to a Gaussian function following the well-known mathematical relation $\exp[-x^2/(2(Dt)^{1/2})]$ where the diffusivity D of the diffusant has an exponential dependence on temperature T. The rate of the diffusion is driven by a concentration gradient. The longer a diffusion progresses, the slower it goes.

FIG. 17D shows a similar graph of a "chained" implant, which in this case is a series of five implants. The energy of each implant is set so that it has a projected range at a predetermined depth, and the five implants overlap to form the overall doping profile indicated by the curve at the top. While opposite conductivity type dopant species, e.g. boron and phosphorus, could be used to produce even more complex structures and dopant profiles, most devices benefit from concentration profiling using a single type of implant species.

FIG. 17E shows a detailed view of a chained implant that includes two implants. The peak doping concentration of the shallower implant ($N_1$) is at the surface, and the peak doping concentration of the deeper implant ($N_2$) is below the surface. As indicated, $N_2$ is well above the Gaussian profile (dashed line) that would prevail with the shallow implant alone (so the dashed portion indicates the non-Gaussian aspect of the well). FIG. 17F shows the same chained implant, but in this instance the dopant is implanted through an oxide layer. Here the shallower dopant is located entirely within the oxide layer; the semiconductor material sees only the deeper dopant, with its peak concentration $N_2$ being located closer to the surface of the semiconductor than in FIG. 17E. Thus, by implanting the same "chain" of implants through an uncovered semiconductor material and through an oxide (or other) layer on the surface, radically different results can be obtained. Note that in FIG. 17F the implant is performed through the oxide; the oxide is not formed after the implant.

FIGS. 17G and 17H show similar views of a different chained implant. Here the shallower implant has a peak concentration ($N_3$) than is slightly below the surface of the semiconductor material and the deeper implant has a peak concentration ($N_4$) than is greater than $N_3$. FIG. 17G shows the chained implant through the surface of the semiconductor; FIG. 17H shows the implant through an oxide layer.

FIGS. 17I and 17J show the results of combining the four implants of FIGS. 17E–17H. In the uncovered semiconductor (FIG. 17I) the total doping profile is dominated by the peak concentrations $N_1$, $N_2$ and $N_4$. The peak concentration $N_3$ is much lower than $N_1$ and $N_2$ and disappears. $N_2$ and $N_4$ provide a very heavily doped submerged layer. When the implants are made through an oxide layer (FIG. 17J), the peaks $N_1$ and $N_3$ are both "lost", since they end up in the oxide layer.

FIGS. 17K and 17L illustrate a physical phenomenon that is inherent in the doping process. Two implants having the same total dose $Q_1$ (in atoms/cm$^{-2}$) are shown. The projected range of $R_{P1}$ of the implant shown in FIG. 17K is greater than the projected range $R_{P2}$ of the implant shown in FIG. 17L. As indicated, even though the total dose $Q_1$ is exactly the same, the peak concentration $N_5$ of the implant in FIG. 17K is greater than the peak concentration $N_6$ of the implant shown in FIG. 17L. This illustrates the general principle that an implant of a given dose spreads out more as it is implanted deeper into the semiconductor and therefore has a lower peak doping concentration.

FIG. 17M illustrates this further by showing what would happen if the implants of FIGS. 17K and 17L were implanted into the same substrate, and FIG. 17N illustrates the same principle with a series of five implants, each having the same dose. As indicated, the peak concentrations $N_7$, $N_8$, $N_9$, $N_{10}$ and $N_{11}$ get progressively lower and the widths (straggles) of the implants get wider as the dopants are implanted deeper into the semiconductor.

This effect can be counteracted, as shown in FIG. 17O, by giving the deeper implant a dose $Q_4$ that is greater than the dose $Q_3$ of the shallower implant. As a result the straggle of the deeper implant $\Delta X_4$ is greater than the straggle $\Delta X_3$ of the shallower implant. FIG. 17P illustrates the same principle with four implants having progressively higher doses $Q_5$, $Q_6$, $Q_7$ and $Q_8$, which yield almost a "flat" profile with a doping concentration of $N_{13}$. If it were desired to have the doping concentration slope upward with increasing depth, $Q_6$, $Q_7$ and $Q_8$ would have to be made progressively even higher.

As indicated above, the photoresist mask that is typically used to define the location of these chained implants is typically relatively thick, e.g., 3 µm to 5 µm thick. This makes it more difficult to achieve extremely small feature sizes using a small mask opening. Moreover, higher energy implants exhibit more lateral straggle from the implanted ions ricocheting off of atoms in the crystal and spreading laterally. So in fact, deeper implants spread more laterally than shallower lower-energy implants. That means unlike a Gaussian diffusion that is much wider at the top than at the bottom a chained implant stack is much more vertical in shape and is actually widest at the bottom, not the top. FIG. 17Q shows a series of four implants through a window 700 in thick photoresist layer 702 and an oxide layer 704. Window 700 constrains the implants laterally, but window 700 cannot be made arbitrarily small as the thickness of photoresist layer 702 is increased. In addition, the implanted dopant spreads laterally somewhat after it enters the substrate, especially at the higher energies and deeper depths.

A technique for constraining the implants to their smallest possible lateral extent is to form trenches in the semiconductor, as shown in FIG. 17R. Trenches 706 can be filled with oxide or some other nonconductive material or with doped polysilicon. The implants overlap into the trenches 706, but have no effect there because the material filling the trenches 706 is nonconductive (or in the case of polysilicon, already heavily doped). The spacing W1 between trenches 706 can generally be made smaller than the width W2 of the opening 700 in the thick photoresist layer 702.

Moreover, as shown in FIG. 17S the dopant can be implanted at energies that propel it below the bottoms of trenches 706, producing a doped region 708 that has an inverted "mushroom" shape, as shown in FIG. 17T, and a top edge that is below the surface of the semiconductor.

The chained implant described can comprise a chained implant junction isolation (CIJI) region that may be implanted into and through an epitaxial layer or used to overlap onto a deeply implanted buried implant of like conductivity type. For example in FIG. 17U, an epitaxial layer 711 opposite in conductivity type to that of a substrate is isolated by a chain of implants 713a to 713f of the same conductivity type as the substrate (e.g. a boron chained isolation implant implanted into a P-substrate) implanted through a photolithographically-defined photoresist layer 712. The resulting isolation structure shown in FIG. 17V illustrates the resulting structure of CIJI structure 715 isolating epi layer 711.

In FIG. 17W, a similar CIJI isolation structure is constrained during implant not only by photoresist 712, but also by trenches 720a and 720b, filled with a dielectric material such as oxide, oxy-nitride, or by polysilicon. The resulting isolation structure is shown in FIG. 17X. The depth of trenches 720a and 720b may range from 0.7 µm to the depth of the epi layer itself, but preferably should extend roughly half to three-quarters the distance from the surface to the bottom of the epi layer 711 as a compromise between constraining the implant and facilitating the trench refill process.

In FIG. 17Y, a CIJI sidewall isolation, comprising implants 733a to 733d, into a P-substrate 730a, overlaps a deep implanted floor isolation region DN 732 in an annular or ring pattern to form an isolated pocket 730b that is separated from the substrate 730a. The resulting isolation structure including CIJI structure 740 is shown in FIG. 17Z.

In a structure similar to that of FIG. 17Y, the CIJI sidewall isolation structure of FIG. 17AA illustrates the use of dielectric filled trenches 750a and 750b to constrain the lateral straggle of successive implants 733a to 733e. The deepest implants (for example deep implant 733a) overlap a deep isolation region DN 732 to isolate pocket 730b from P substrate 730a. The resulting structure with CIJI sidewall isolation 751 is illustrated in FIG. 17BB. The depth of trenches 750a and 750b may range from 0.7 um to the depth of the DN layer itself, but preferably should extend roughly half to three-quarters the distance from the surface to the deep DN layer 732 as a compromise between constraining the implant and facilitating the trench refill process.

The methods for forming isolation structures that eliminate the need for epitaxy (or that minimize the impact of epi variability) have been detailed in a variety of processes and methods herein. The integration of devices into an integrated circuit using combinations of such methods is included here as illustrative examples of zero thermal budget isolation and device formation techniques, but should not be construed as limiting the use of such methods to the specific devices detailed and exemplified herein.

FIGS. 18A-1 to 18A-4, 18B-1 to 18B-4 and 18C–18H show a family of devices that can be fabricated by a process according to this invention. The process is performed on a single semiconductor chip, represented by a substrate 350, which is generally doped with a P-type impurity such as boron. The devices, and some of the regions within the devices, are separated laterally by a field oxide layer 352, which is grown at the surface of substrate 350 by a conventional local oxidation of silicon (LOCOS) process.

Starting with FIG. 18A-1, the family of devices includes a 5V complementary MOSFET pair (CMOS) comprising a P-channel MOSFET (PMOS) 301 and an N-channel MOSFET (NMOS) 302.

PMOS 301 is formed in an N well 354A that serves as the body of PMOS 301. N well 354A includes shallow regions 356 that are formed by implanting dopant through field oxide layer 352, as described below. A gate 358A is formed above substrate 350, typically made of polycrystalline silicon (polysilicon) that may be capped with a metal layer. Gate 358A is bordered by sidewall spacers 360 and is separated from N well 354A by a gate oxide layer (not shown). The thickness of the gate oxide layer may range from 100 A to 2000 A but typically is in the range of 200 A to 600 A. Lightly-doped P drift regions 362A and 362B are formed in N well 354A on the sides of gate 358A. PMOS 301 also includes a P+ source region 364A and a P+ drain region 364B. (Throughout FIGS. 18A-1 to 18A-4, 18B-1 to 18B-4, and 18C–18H dopant regions designated by the same reference numeral but different letter are formed during the same implant step.)

A borophosphosilicate glass (BSPG) layer 366 or other dielectric overlies substrate 350, and contact openings are formed in BSPG layer 366. A metal layer 370 contacts the source and drain of PMOS through the contact openings.

NMOS 302 is formed in a P well 372A that serves as the body of NMOS 302. P well 372A includes shallow regions 374 that are formed by implanting dopant through field oxide layer 352, as described below. A gate 358B, similar to gate 358A, is formed above substrate 350. Gate 358B is bordered by sidewall spacers 360 and is separated from P well 372A by a gate oxide layer (not shown). Lightly-doped N regions 376A and 376B are formed in P well 372A on the sides of gate 358B. NMOS 302 also includes an N+ source region 378A and an N+ drain region 378B. Metal layer 370 contacts the source and drain of NMOS 302 through contact openings in BPSG layer 366.

Referring to FIG. 18A-2, substrate 350 also contains a 12V PMOS 303 and a 12V NMOS 304. 12V PMOS 303 is formed in an N well 380A, which is implanted with dopant at a higher energy than N well 354A in PMOS 301. A gate 358C is formed from the same polysilicon layer as gates 358A, 358B, but the gate oxide layer that separates gate 358C from the substrate is typically thicker than the gate oxide layers beneath gates 358A, 358B. A minimum gate oxide thickness to sustain continuous operation at 12V should preferably meet or exceed 300A. The source is formed by a P+ region 364C and the drain is formed by a P+ region 364D. The drain is offset from the edge of gate 358C by a distance that is not determined by a sidewall spacer on gate 358C. Instead, as described below, P+ drain 364D is formed in a separate masking step. A lightly-doped P region 363B extends between the drain region 364D and the gate 358C and likewise between the drain and field oxide 352. On the other hand, the P+ source 364C of 12V PMOS 303 is aligned with a sidewall spacer 360 on gate 358C. Thus 12V PMOS 303 is not a symmetrical device. The drain 364D is offset by a considerable margin (e.g., 0.3–1.0 μm) from the edge of gate 358C, whereas the source 364C is offset by only a small margin (e.g., 0.15 μm).

N well 380A includes shallow regions 384, where the dopant implanted to form N well 380A passes through field oxide layer 352. However, the doping concentration of shallow regions 384 is typically not sufficient to prevent surface inversion and parasitic MOSFETs between 12V PMOS 303 and adjacent devices. Therefore, the implant that is used to form N well 354A in 5V PMOS 301 is introduced into shallow regions 384, forming N regions 354B and increasing the total doping concentration in shallow regions 384.

12V NMOS 304 is formed in a P well 386A, which is implanted with dopant at a higher energy than P well 372A in NMOS 302. A gate 358D, similar to gate 358C, is formed from the same polysilicon layer as gates 358A, 358B, 358C. N+ source region 378D is offset from the edge of gate 358D by a distance that is determined by the sidewall spacers 360 on gate 358D, whereas N+ drain region 378C is offset from the edge of gate 358D by a distance that is independent of sidewall spacers 360. A lightly-doped N region 377A extends between the drain and the gate and between the drain and the field oxide region 352.

P well 386A includes shallow regions 388, where the dopant implanted to form P well 386A passes through field oxide layer 352. The implant that is used to form P well 372A in 5V NMOS 302 is introduced into shallow regions 388, forming P regions 372B and increasing the total doping concentration in shallow regions 388. This prevents surface inversion and parasitic MOSFETs between 12V NMOS 304 and adjacent devices.

Referring to FIG. 18A-3, a 5V NPN bipolar transistor (NPN) 305 includes a double P well 372C as a base. Double P well 372C is formed during the same implant as P well 372A in NMOS 302. The use of a double P well allows the base to be contacted at a remote location through a P+ region 364E. Double P well 372C is relatively shallow (e.g., 0.5–1.0 μm deep), which is typical of junction depths used for bipolar transistors in prior art processes. An N+ region 378E acts as an emitter, which can be made very small, reducing the sidewall capacitance of the emitter to base. The collector of 5V NPN 305 includes an N well 354C, which merges with a deep N (DN) layer 390A.

Together, N well 354C and DN layer 390A form a wraparound N region around an isolated pocket 392A, which is isolated from the remainder of substrate 350. The N well surrounds the entire device to complete the isolation. However, the electrical characteristics of NPN 305 are primarily set by the doping concentration in double P well 372C, not the doping concentration of isolated pocket 392A since the P well doping is higher. The double P well, i.e. two side-by-side P well regions comprising the base and the base contact area are required to accommodate field oxide 352 interposed between emitter 378E and base contact region 364E without inadvertently "disconnecting" the P+ base contact 364E from the active intrinsic-base portion of the device, namely P well 372C located beneath N+ emitter 378E. Thus high speed operation and good emitter-to-base breakdown and leakage characteristics can be achieved.

Referring to FIGS. 18A-3 and 18A-4, a 5V PNP bipolar transistor (PNP) 306 has a wraparound "floor isolation" and sidewall isolation region that includes a 5V N well 354E and a deep N layer 390B. N well 354E is contacted through an N+ region 378H and can be biased at the collector voltage or at the most positive voltage on the chip, in which case the collector-to-"floor" junction would be either zero-biased or reverse-biased. The emitter of PNP 306 is a P+ region 364G. The collector includes a 12V P well 386B, which actually consists of three wells that merge together, and a 5V P well 372D, which is used as an additional collector sinker to reduce the resistance. The base includes a dedicated N base region 394 and is contacted through a 5V N well 354D and an N+ contact region 378G. Alternatively, the section of field oxide layer 352 between the emitter and base can be removed, in which case the N implant 394 will extend under the base contact and the emitter capacitance will increase.

Referring to FIG. 18A-4, a 30V channel stop 307 includes a non-contacted P+ region 364H, which sits over a 12V P well 386C and a 5V P well 372E. This not only prevents surface inversion, but if any minority carriers attempt to flow laterally, they can be collected.

30V lateral trench double-implanted MOSFET (DMOS) 308 includes a trench which is filled with a polysilicon gate 396A and lined with a gate oxide layer 398A. Lateral trench DMOS 308 also includes a drain consisting of a 5V N well 354F, an N+ contact region 378I and a dedicated lightly-doped N drift region, which includes a shallower drift portion 391A under field oxide layer 352 and a deeper drift portion 393A and may be produced using chained implant techniques described previously. A P body region 395A, which is a dedicated boron implant or a chained implant, is contacted through a P+ body contact region 364I. The source is represented by N+ regions 378J which are adjacent the trench. The current flows from N+ source regions 378J downward through a channel within P body region 395A and then turns and flows laterally towards 5V N well 354F and N+ contact region 378I. Gate 396A acts as a lateral current-spreader to spread the current in the high-voltage N drift region and thereby reduce the current density and resistance within that area.

As described below, polysilicon gate 396A is formed in two stages, with a first layer being deposited within the trench and a second layer overlapping the top surface of the trench. These layers are separate from the layer that is used to form the gates in the lateral MOSFETs 301 through 304.

To summarize, FIGS. 18A-1 to 18A-4 show a group of devices that include fully optimized 5V and 12V CMOS pairs (301, 302 and 303, 304), complementary bipolar transistors (305, 306) and a 30V lateral trench DMOS (308), all formed in a single chip, with no epitaxial layer and in a single process with no long diffusions. The bipolar transistors (305, 306) are fully isolated from the substrate 350, but it should be understood that the CMOS pairs (301, 302 and 303, 304) can similarly be isolated by adding the deep N layer 390 under them.

FIGS. 18B-1 to 18B-4 show a second group of devices that can be formed in the same process, including a 12V symmetrical isolated CMOS pair 309, 310, a poly-to-poly capacitor 311, an NPN 312, a 12V channel stop 313 and a 12V lateral trench DMOS 314.

Referring to FIGS. 18B-1 and 18B-2, a 12V symmetrical isolated CMOS pair 309, 310 is isolated from substrate 350 by a deep N layer 390C which merges with a 12V N well 380C. Within N well 380C is a 5V N well 354H, contacted by N+ and metal (not shown). PMOS 309 is isolated from substrate 350 so long as the potential of N well 380C is higher than the potential of substrate 350. NMOS 310 is isolated from substrate 350 because it is surrounded by N-type material.

PMOS 309 and NMOS 310 are generally similar to PMOS 303 and NMOS 304, except that they are symmetrical. The source region 364J and the drain region 364K in PMOS 309 are laterally offset from the gate 358E by an equal distance; the source region 378K and the drain region 378L in NMOS 310 are also laterally offset from the gate 358F by an equal distance. Similarly, the extended drift regions 363C and 363D are symmetrical about the gate 358E in PMOS 309, and the extended drift regions 377C and 377D are symmetrical about the gate 358F in NMOS 310. The symmetric drift design allows either source or drain to achieve a 12V (15V maximum) reverse bias relative to the enclosing well.

N well 380B includes shallow regions 397, where the dopant implanted to form N well 380B passes through field oxide layer 352. However, the doping concentration of shallow regions 397 is typically not sufficient to prevent surface inversion and parasitic MOSFETs between 12V PMOS 309 and adjacent devices. Therefore, the implant that is used to form N well 354A in 5V PMOS 301 is introduced into shallow regions 397, forming N regions 354G and increasing the total doping concentration in shallow regions 397.

12V P well 386D includes shallow regions 399, where the dopant implanted to form P well 386D passes through field oxide layer 352. The implant that is used to form P well 372A in 5V NMOS 302 is introduced into shallow regions 399, forming P regions 372F and increasing the total doping concentration in shallow regions 399. This prevents surface inversion and parasitic MOSFETs between 12V NMOS 310 and adjacent devices.

Poly-to-poly capacitor 311 includes two polysilicon layers, 389 and 358G, separated by an insulating layer 387. Polysilicon layer 358G is formed at the same time as the polysilicon layer that forms the gates of the lateral devices described above (i.e., gates 358A, 358B, etc.). Polysilicon layer 389 is formed at the same time as the polysilicon layer that overflows the trench of the trench devices discussed below.

Referring to FIG. 18B-3, an NPN 312 has a base which includes a P base region 395B (which is formed with a specific mask), an isolated region 392B of substrate 350, and a P+ base contact region 364L. The emitter of NPN 312 is an N region 378L. The collector is an N isolation region 354K, which merges with a deep N layer 390D. Unlike NPN 305 in FIG. 18A-3, which has a section of field oxide layer 352 between the base and the emitter and N well 372C underlying the field oxide layer 352, in NPN 312 the entire area is active and no N well is necessary. As a result, the base-to-emitter capacitance of NPN 312 is greater than the base-to-emitter capacitance of NPN 305.

The base width of NPN 312 is equal to the entire distance from the surface of substrate 350 down to the top surface of deep N layer 390D, but the gain characteristics are primarily determined by the thickness of P base region 395B, since the isolated region 392B immediately becomes depleted in normal operation. The width of the base adds some transit time, which limits the maximum frequency of NPN 312, but the maximum frequency would still be in the range of several GHz. The depth of isolated region 392B could be on the order of 0.7 to 1.5 μm.

Referring to FIG. 18B-4, a 12V channel stop 313 includes a 5V P well 372G and a 12V P well 386E, which are contacted via a P+ region 364M. P+ region 364M extends on opposite sides of a trench gate 396B, which is optional. The function of 12V channel stop 313 is to prevent the surface of substrate 350 from being inverted by any overlying metal lines biased at high voltages.

12V lateral trench DMOS 314 is essentially a smaller version of 30V lateral trench DMOS 308 in FIG. 18A-4. 12V DMOS 314 includes a trench which is filled with a polysilicon gate 396C and lined with a gate oxide layer 398C. Lateral trench DMOS 314 also includes a drain consisting of a 5V N well 354L, an N+ contact region 378N and a dedicated lightly-doped N drift region, which includes a shallower portion 391B under field oxide layer 352 and a deeper drift portion 393B. A P body region 395C, which is a dedicated implant, is contacted through a P+ body contact region 364N. The source is represented by N+ regions 378P which are adjacent the trench. The current flows from N+ source regions 378P downward through a channel within P body region 395C and then turns and flows laterally towards 5V N well 354L and N+ contact region 378N. Gate 396C acts as a lateral current-spreader to spread the current in the high-voltage N drift region and thereby reduce the current density and resistance within that area.

Like trench gates 396A and 396B, polysilicon gate 396C is preferably formed in two stages with a first layer being deposited within the trench and a second layer overlapping the top surface of the trench. These layers are separate from the layer that is used to form the gates in the lateral MOSFETs 301 through 304.

Referring to FIG. 18C, the device family includes a fully isolated 5V CMOS pair consisting of a 5V NMOS 315 and a 5V PMOS 316. NMOS 315 includes an N+ source region 378R and an N+ drain region 378S formed in a 5V P well 372H, which also includes a P+ body contact region 364P (shown as a butting contact to N+ region 378R). A gate 358H overlies a channel in P well 372H. NMOS 315 is isolated from substrate 350 by an underlying deep N layer 390E, which merges with an N-type sidewall isolation region 354N and an N+ contact region 378Q. In such device the wrap-around isolation may be biased to a different potential than the NMOS source and body, which still may be shorted locally by the butting contact. As described above, the NMOS may have a sidewall spacer with an underlying LDD (similar to an isolated version of NMOS 302 in FIG. 18A-1) or in simpler versions of the process, the sidewall spacer and shallow LDD implant may be omitted.

PMOS 316 includes a P+ drain region 364Q and a P+ source region 364R formed in a 5V N well 354P, which also includes an N+ body contact region 378T. A gate 358I overlies a channel in N well 354P. PMOS 316 is isolated from the substrate 350 as an artifact of its construction in an N well 354P, but may be further isolated from substrate 350 by extending deep N layer DN 390E under the N well to reduce any parasitic bipolar gain to the substrate. Electrical contact to substrate 350 is made via a P+ contact region 364S and a 5V P well 372I. As described above, the PMOS may have a sidewall spacer with an underlying LDD (similar to an isolated version of PMOS 301 in FIG. 18A-1) or in simpler versions of the process, the sidewall spacer and shallow LDD implant may be omitted. A butting contact between the P+ source 364R and the N+ body contact 378T illustrates a fully isolated PMOS can still employ local source to body shorts.

In device 317, shown in FIG. 18D, the mesas between the trench gates 396D alternate between one mesa that contains an N+ source region 378V, a P body 395D, and a high voltage N drift region 393C, and an alternate mesa that contains an N+ drain region 378U and a 5V N well 354Q (superimposed on a high voltage N drift region 393C). Beneath the trench gates is a 12V N well 380D and an optional deep N layer 390F. P body 395D contains a channel that is controlled by the gate 396D. Electrical contact is made to substrate 350 through a P+ region 364T. When device 317 is turned on by applying the proper potential on trench gate 396D, the electric field across gate oxide 398D inverts the PB region 395D so that current flows from N+ source region 378V, through the inverted channel in P body 395D, and down high voltage N drift region 393C in one mesa; then around the bottom of the trench gate 396D via 12V N well 380D; and up through 5V N well 354Q and N+ drain region 378U in the adjacent mesa. The contact to P-type body region PB395D is preferably made (in the third dimension not shown) along the length of stripe fingers and is typically shorted to the source region 378V via metal 370.

Device 318, shown in FIG. 18E, is identical to device 317 except that the 12V N well 380D is discontinued under the mesas that contain N+ source region 378V and P body 395D, and instead a 12V N well 380E underlies the mesas that contain the drain region 378U and the trench gate 396D that is adjacent to those mesas. This provides a slightly higher breakdown voltage or a less effective reverse-bias between N+ source 378V and P body 395D on the short-channel characteristics of the device.

Device 319, shown in FIG. 18F, is yet another version of device 317. In device 319, instead of an alternating mesa pattern, all of the mesas except one contain an N+ source region 378V, a P body 395D, and a high voltage N drift region 393C. Only one mesa contains an N+ drain region 378U and a 5V N well 354Q. Of course, FIG. 18F, shows only one portion of the device 319. Typically there would be a ratio between the number of mesas that contain a source-body and the number of mesas that contain a drain. There would be a number of "source-body" mesas, and then periodically there would be a "drain" mesa. The heavier 12V N well 380D is doped, the higher the ratio of "source-body" mesas to "drain" mesas can be.

In device 319, current flows down the mesas that contain an N+ source region 378V, laterally through 12V N well 380D, and up the mesa that contains an N+ drain region 378U. In this respect, device 319 is a true "quasi-vertical" device, albeit one formed entirely without diffusion or epitaxy.

FIG. 18G shows a lateral N-channel DMOS 320 that includes a gate 358J that steps up over field oxide region 352. DMOS 320 includes an N+ source region 378W, an N+ drain region 378X, and a P body 395E that is contacted via a P+ body contact region 364U. Current flows from N+ source region 378W through a channel in P body 395E (located under a gate oxide beneath the active portion of polysilicon gate 358J) and through a high-voltage drift region 391C into a 5V N well 354R (which includes a high-voltage drift region 393D and N+ drain region 378X).

FIG. 18H shows a lateral P-channel DMOS 400 that includes a gate 358K, an P+ source region 364W, an P+ drain region 364V, and an N well (acting as a DMOS body) 354S that is contacted via a N+ body contact region 378X. Current flows from P+ source region 364W through a channel in N well 354S (located under a gate oxide beneath the polysilicon gate 358K) and through a high-voltage drift region 401 (which is simply the isolated portion of P substrate 350) and (optionally into a 5V P well) to P+ drain region 364V.

To summarize, the entire family of devices described above can be fabricated on a single substrate 350 using a series of 11 basic implants, identified as follows in FIGS. 18A-1 to 18A-4, 18B-1 to 18B-4 and 18C–18H and in Table 1 (without the letter suffixes).

TABLE 1

| Implant | Description |
| --- | --- |
| 354 | 5 V N well |
| 372 | 5 V P well |
| 380 | 12 V N well |
| 386 | 12 V P well |
| 364 | P+ (shallow) |
| 362 | P-LDD |
| 378 | N+ (shallow) |
| 376 | N-LDD |
| 390 | Deep N layer |
| 391 | High Voltage N-drift (shallow) |
| 393 | High Voltage N-drift (deep) |
| 394 | N-base |
| 404 | P body |
| 446, 450 | Threshold adjust |

Since the substrate is exposed to practically no thermal cycle, there is practically no diffusion or redistribution of the implants after they are introduced into the substrate. Therefore the implants listed in Table 1 can be performed in any order. It will be understood, moreover, that the 5V and 12V devices are merely illustrative. Devices having voltage rating of less than 5V and/or more than 12V can also be fabricated using the principles of this invention.

FIGS. 19A–19H are equivalent circuit diagrams of some of the devices shown in FIGS. 18A-1 to 18A4, 18B-1 to 18B-4 and 18C–18H. In FIGS. 19A–19H, "S" represents the source, "D" represents the drain, "G" represents the gate, "B" represents the body or base, "C" represents the collector, "E" represents the emitter, "DN" represents a deep N layer, and FI represents the floor isolation connection (when applicable).

FIG. 19A shows the 5V CMOS including PMOS 301 and NMOS 302. Being 5V devices PMOS 301 and NMOS 302 have relatively thin gate oxide layers. PMOS 301 is isolated from the substrate by the diode labeled D1; NMOS 302 would normally not be isolated from the substrate but NMOS 302 is shown as having a deep N layer formed below it, and diodes D2 and D3 isolate NMOS 302 from the substrate. The deep N layer can be separately biased through the floor isolation terminal FI. Terminal FI can be reverse-biased or zero-biased to the body terminal B.

FIG. 19B shows 12V CMOS including PMOS 303 and NMOS 304. PMOS 303 and NMOS 304 have thicker gate oxide layers than PMOS 301 and NMOS 302. A deep N layer under NMOS 304 forms diodes D4 and D5 which isolate NMOS 304 from the substrate.

FIG. 19C shows 5V NPN 305 with a collector isolated from the substrate by a diode D7. FIG. 19D shows 5V quasi-vertical PNP 306 whose base is isolated from the substrate by the reverse-biased diode D8.

FIG. 19E shows 30V lateral trench DMOS 308, which can have either a thick or thin gate oxide layer. A reverse-biased diode D6 is formed between the drain and the substrate. The source/body terminal S/B is also isolated from the substrate.

FIG. 19F shows poly-to-poly capacitor 311, and FIG. 19G shows a polysilicon resistor (not shown in FIGS. 18A–18H). Both of these devices are isolated from the substrate by an oxide layer.

Figure 19H:
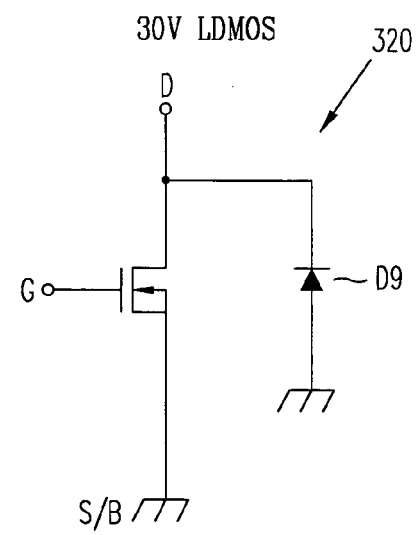

FIG. 19H shows a conventional 30V lateral DMOS 320 whose source and body terminals are shorted together and tied to the substrate and whose drain terminal is isolated from the substrate by a diode D9. Schematically the N-channel lateral (surface) DMOS 320 shown in FIG. 18G and the N-channel trench lateral DMOS 308 shown in FIG. 18A-4 appear to have identical schematics, but their construction is completely different. We include them both in the schematic to highlight their difference (one is a surface conduction device, the other one conducts in a channel vertically down a trench sidewall).

FIGS. 20A and 20B provide an overview of an illustrative process according to this invention that can be used to fabricate the devices shown in FIGS. 18A-1 to 18A-4, 18B-1 to 18B-4 and 18C–18H. The process is depicted as a sequence of "cards" that briefly summarizes the steps of the process. Cards that have clipped corners represent optional process steps. The process is described in greater detail below in the description of FIGS. 21–67.

The process begins with a substrate and the performance of a LOCOS (local oxidation of silicon) sequence to form field oxide regions at the surface of the substrate. The major portion of the thermal budget of the overall process occurs during the LOCOS sequence. Next, there are three options: the formation of a trench DMOS, the formation of a poly-to-poly capacitor, or the formation of N and P type wells in preparation for the fabrication of the 5V and 12V CMOS devices. In reality, the trench DMOS and poly-to-poly capacitor are not mutually exclusive. The polysilicon layers that are deposited in this and subsequent parts of the process can be used to form both a trench DMOS and a poly-to-poly capacitor.

After the wells have been formed, the gates for the lateral CMOS devices are formed. The process then proceeds to the formation of the source and drain regions, the deposition of a BPSG (borophosphosilicate glass or other dielectric) layer and the formation of contact openings in the BPSG layer, the formation of a dual-layer metal (DLM), and finally the formation of a third metal layer and a pad mask.

FIGS. 21–67 illustrate a process for fabricating several of the devices shown in FIGS. 18A-1 to 18A-4, 18B-1 to 18B-4 and 18C–18H: in particular the 5V PMOS 301, 5V NMOS 302, 5V NPN 305, 5V PNP 306, 30V lateral trench DMOS 308, 12V PMOS 309, and 12V NMOS 310. The 5V N PN 305 are 5V PNP 306 are shown both in a conventional form and in a form which provide high-speed operation (high $f_T$). The process uses a single substrate 350.

The figures labeled "A" show 5V PMOS 301 and 5V NMOS 302; the figures labeled "B" show 5V NPN 305 and 5V PNP 306 in the conventional form; the figures labeled "C" show 5V NPN 305 and 5V PNP 306 in the "high $f_T$" form; and figures labeled "D" show 30V lateral trench DMOS 308; and the figures labeled "E" show 12V PMOS 309 and 12V NMOS 310. For ease of reference, this scheme is summarized in Table 2.

TABLE 2

| Drawing | Subject |
|---|---|
| "A" | 5 V CMOS (5 V PMOS 310, 5 V NMOS 302) |
| "B" | 5 V NPN 305, 5 V PNP 306 (High $F_T$ Layout) |
| "C" | 5 V NPN, 5 V PNP (Conventional Layout) |
| "D" | 30 V Lateral Trench DMOS 308 |
| "E" | Symmetrical 12 V CMOS (12 V PMOS 309, 12 V NMOS 310) |

No drawing is provided where the particular stage of the process has no significant effect on the device or devices involved. For example, where an implanted dopant is prevented from reaching the substrate by an overlying nitride or oxide layer, or where a layer is deposited and later removed with no significant effect on the underlying device, the drawing is omitted. To preserve the identification of each letter with a particular device, this necessarily means that the drawings are not sequential. For example, a drawing with a particular reference numeral may have a "B" but no "A".

FIG. 21 shows the starting material for all devices, namely substrate 350. A pad oxide layer 402 is formed on substrate 350 to provide stress relief between the nitiride and the silicon substrate. For example, pad oxide layer 402 may be formed by heating substrate 350 to around 850 to 1100° C. for 30 minutes to 3 hours.

As shown in FIGS. 22A–22E, a nitride layer 404 is deposited on the surface of substrate 350, typically having a thickness ranging from 700 A to 4000 A with 1500 A being a nominal value. Photoresist mask layer 406 is deposited on nitride layer 404. Using conventional photolithographic processes photoresist layer 406 is photolithographically patterned and nitride layer 404 is etched through openings in photoresist layer 406 to form the structure shown in FIGS. 22A–22E. In general the nitride remains in any area not to receive field oxidation, i.e. the nitride covered areas correspond to active regions where devices are to be fabricated.

As shown in FIGS. 23A–23E, photoresist layer 406 is removed, and following a normal LOCOS active mask sequence substrate 350 is heated in an oxidizing ambient, for example, to 850 to 1100° C. but typically to 900° C. for 1 to 4 hours, but nominally for 2 hours. As a result, field oxide layer 352 forms in the spaces between the sections of nitride layer 404, not covered by nitride. Field oxide layer 352 may be in the range of 0.2 to 2 µm thick with 0.5 µm being nominal. Nitride layer 352 is then removed, as shown in FIGS. 24A–24E. This leaves field oxide layer 352 in predetermined areas within and between the devices to be formed in substrate 350. A pad oxide layer 408 is grown in the areas between the sections of field oxide layer 352.

As shown in FIG. 25D, in the area that will contain 30V Lateral Trench DMOS 308, a nitride layer 410, a TEOS oxide layer 412, and a photoresist mask layer 414 are deposited in succession on top of pad oxide layer 408. Nitride layer 410 can be in the range of 0.1 to 0.6 µm thick but typically 0.2 µm. TEOS oxide layer 412 is deposited by the well known process and can be 200 A to 2 µm thick, for example, but typically has a thickness of 700 A. Photoresist mask layer 414 is photolithographically patterned by forming relatively narrow openings 415, which are then used to etch through TEOS oxide layer 412 and nitride layer 410 and into substrate 350, forming trenches 416 in substrate 350. Preferably, a directional process such as reactive ion etch (RIE) is used to etch into substrate 350. Trenches 416 can be typically 0.5 µm wide (but can range from 0.25 µm to 1 µm) and between 0.8 to 2 µm (typically 1.5 µm) deep, for example. (Note that four trenches 416 are shown in FIG. 25D, whereas only a single trench for 30V lateral trench DMOS 308 is shown in FIG. 18A-4. It will be understood by those skilled in the art that lateral trench DMOS 308 could have any number of trenches while the basic structure of lateral trench DMOS 308 remains the same.)

As shown in FIG. 26D, photoresist layer 414 is stripped, and a sacrificial oxide layer 418 is grown on the walls of trenches 416 to repair any crystal damage that resulted from the RIE process. Then, as shown in FIG. 27D, sacrificial oxide layer 418 is removed and gate oxide layer 398A is formed on the walls of trenches 416. Gate oxide layer 398A can be 100 A to 1200 A thick but typically is around 200 A thick and can be formed by heating substrate 350 at 850 to 1000° C. but typically at 900 C for 30 minutes to 3 hours, but typically for 1 hour.

As shown in FIG. 28D, a first polysilicon layer 396A is deposited, filling trenches 416 and flowing over the surface of TEOS oxide layer 414. Polysilicon layer 396A is made conductive by depositing the layer with in-situ doped phosphorus at high concentrations. This would produce a first polysilicon layer 396A having a sheet resistivity of approximately 20 ohms per square. Then, as shown in FIG. 29D, polysilicon layer 396A is etched back until the surface of polysilicon layer 396A is roughly level with the surface of nitride layer 410 and, as shown in FIG. 30D, TEOS oxide layer 412 is removed. Polysilicon layer 396A is then etched back again, as shown in FIG. 31D, only slightly to below the nitride surface.

As shown in FIG. 32D, second polysilicon layer 389 is deposited on the surface of nitride layer 410 and first polysilicon layer 396A. Polysilicon layer 389 can be doped in the same manner as polysilicon layer 396A, or it can be implanted with phosphorus at 60 keV at a dose of 1 to 3E15 $cm^{-2}$ and can be 2000 Å thick, for example. As shown in FIG. 33D, an oxide-nitride-oxide (ONO) interlayer dielectric 387 is deposited over polysilicon layer 389 using a well known process to a thickness of 100 Å to 500 Å for example (with 350Å being typical). This ONO layer is used for forming the poly-to-poly capacitors in the IC.

A photoresist mask (not shown) is formed over interlayer dielectric 387, and interlayer dielectric 387 and polysilicon layer 389 are removed except in the areas where the photoresist mask remains. One of the areas where the photoresist mask remains is the portion of substrate 350 where poly-to-poly capacitor 311 is to be formed. As shown in FIG. 18B-2, polysilicon layer 389 forms the bottom plate and interlayer dielectric 387 forms the dielectric layer of poly-to-poly capacitor 311. After poly-to-poly capacitor 311 has been formed the photoresist mask (not shown) is removed.

FIG. 34D shows the structure in the area of 30V lateral trench DMOS 308 after interlayer dielectric 387 and polysilicon layer 389 have been removed. Note that the surface of polysilicon layer 396A is roughly level with the surface of substrate 350, and polysilicon layer 396A has become the polysilicon gate 396A of lateral trench DMOS 308, separated from substrate 350 by gate oxide layer 398A.

This completes the fabrication of the trench and gate of lateral trench DMOS 308. As described above, only the drawings labeled "D" are used to described this process. In the other areas of substrate 350 the various layers described above are deposited and removed without affecting the underlying portions of substrate 350.

Figure 35A:
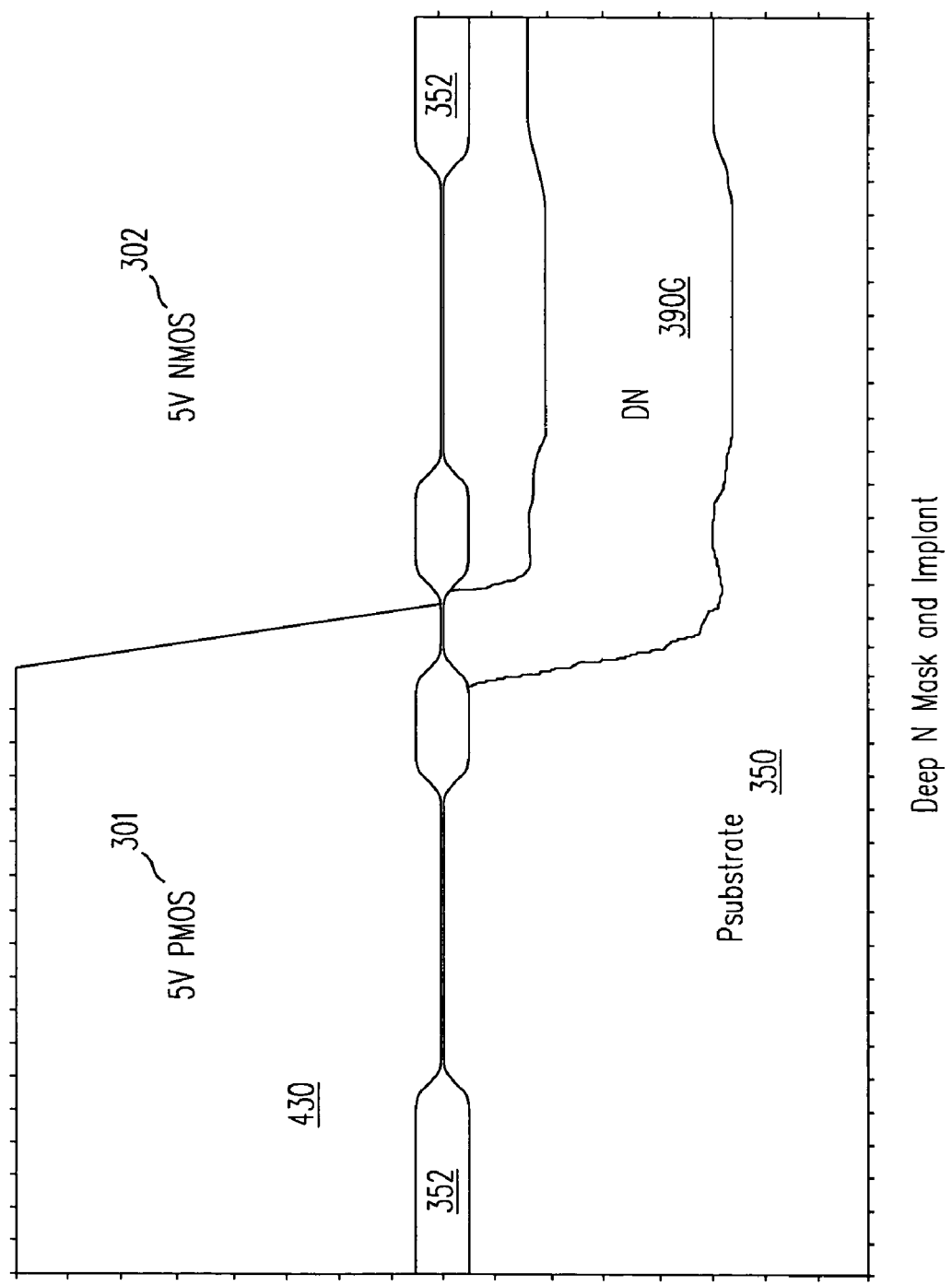
Figure 35B:
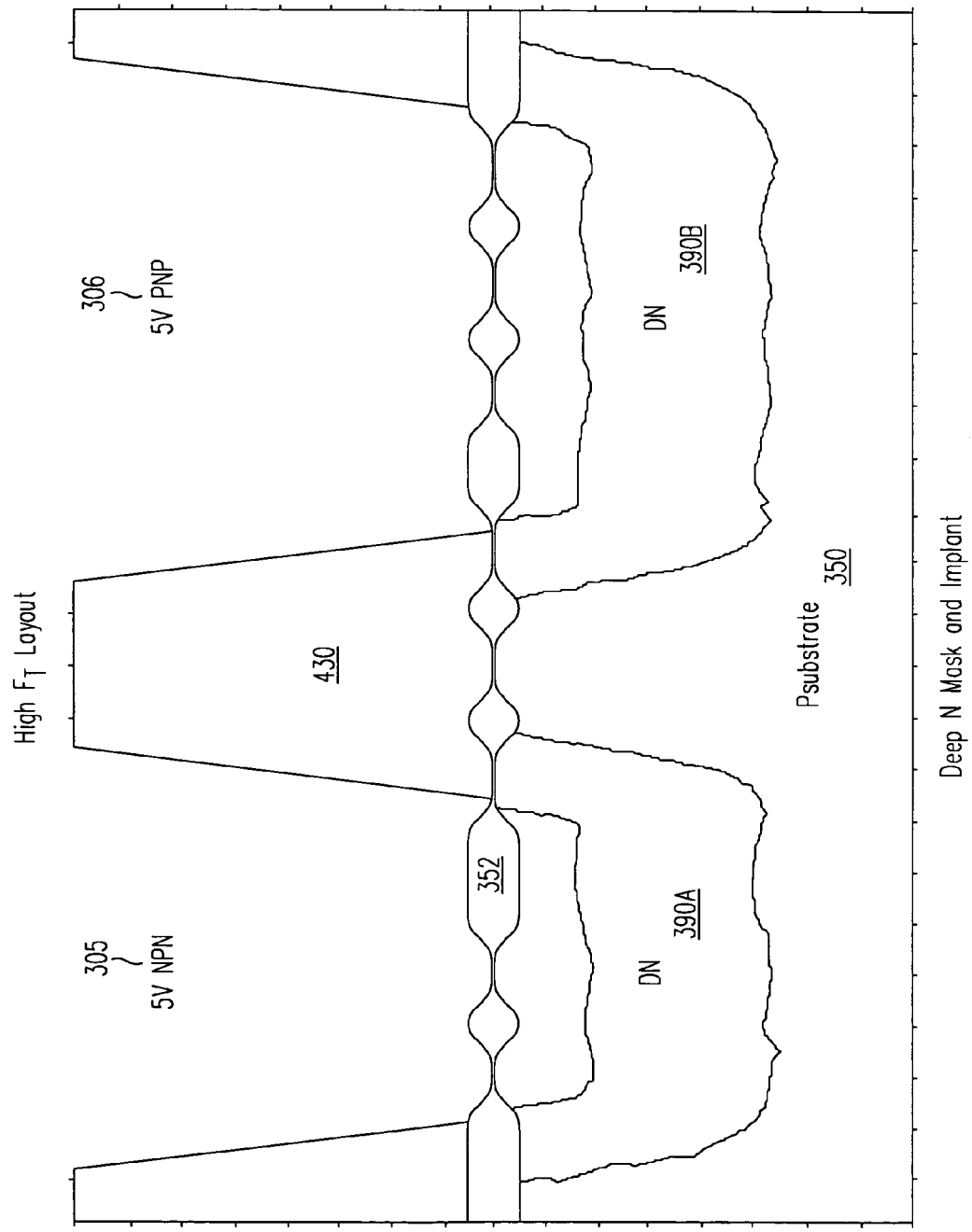
Figure 35C:
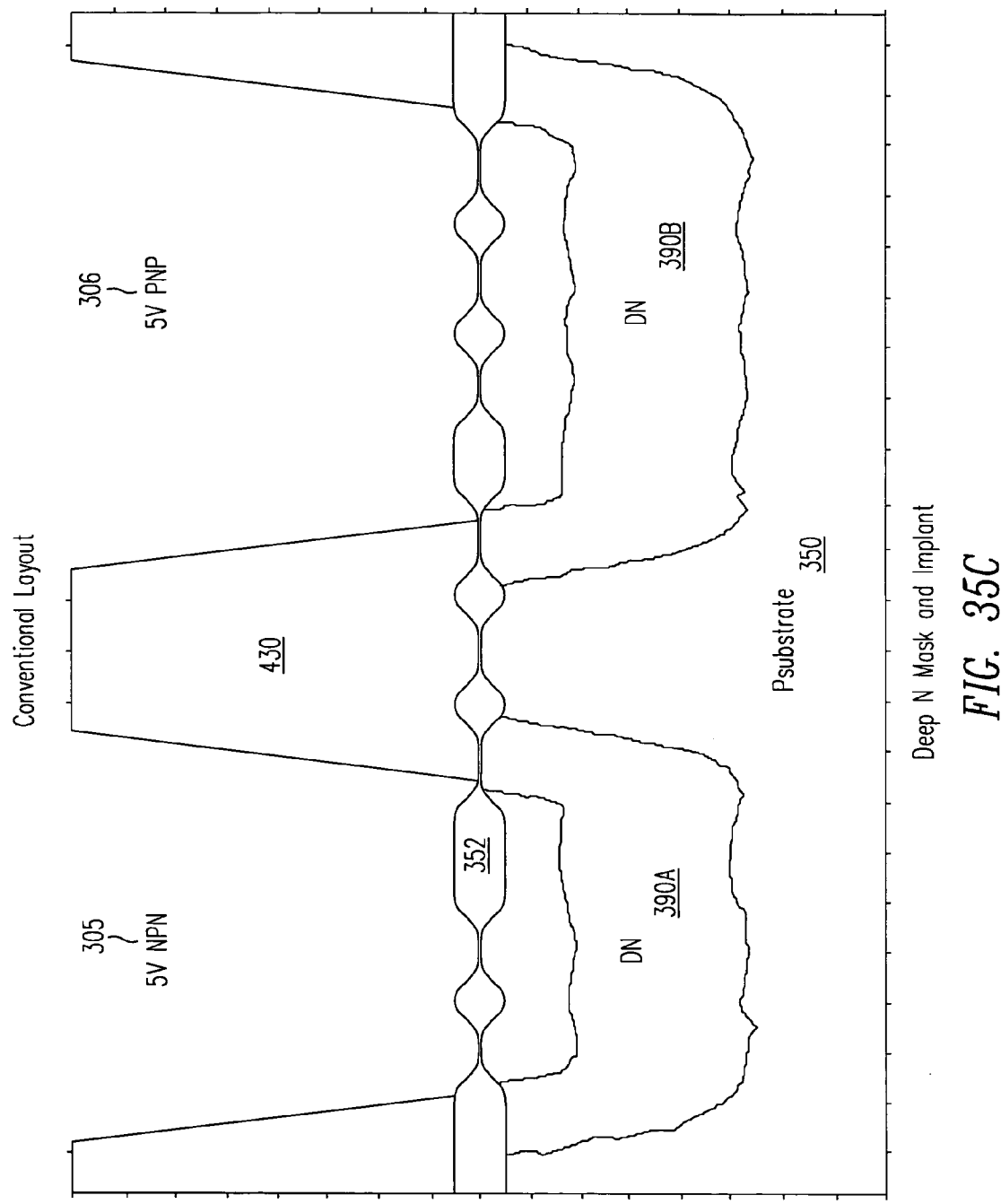
Figure 35D:
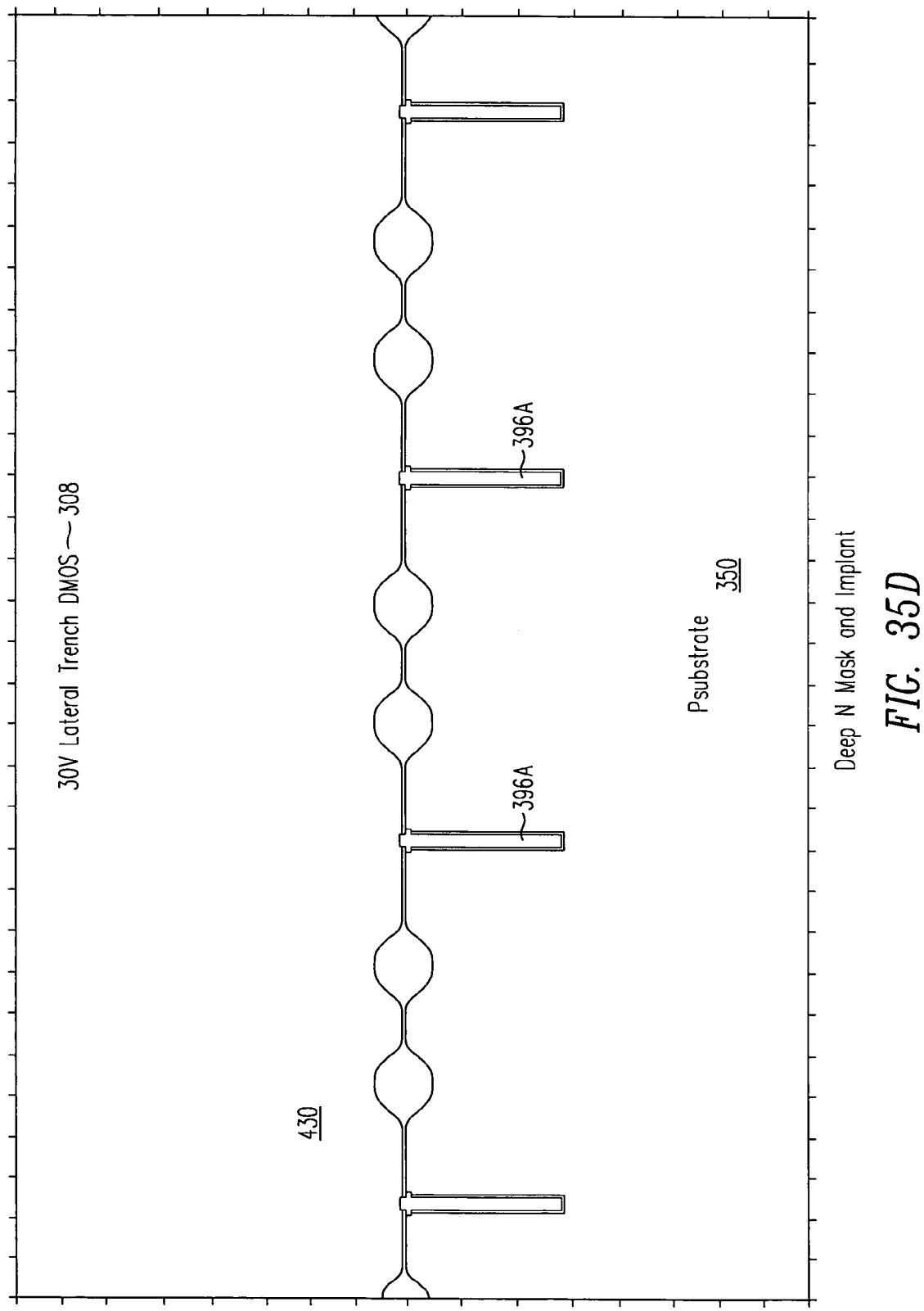
Figure 35E:
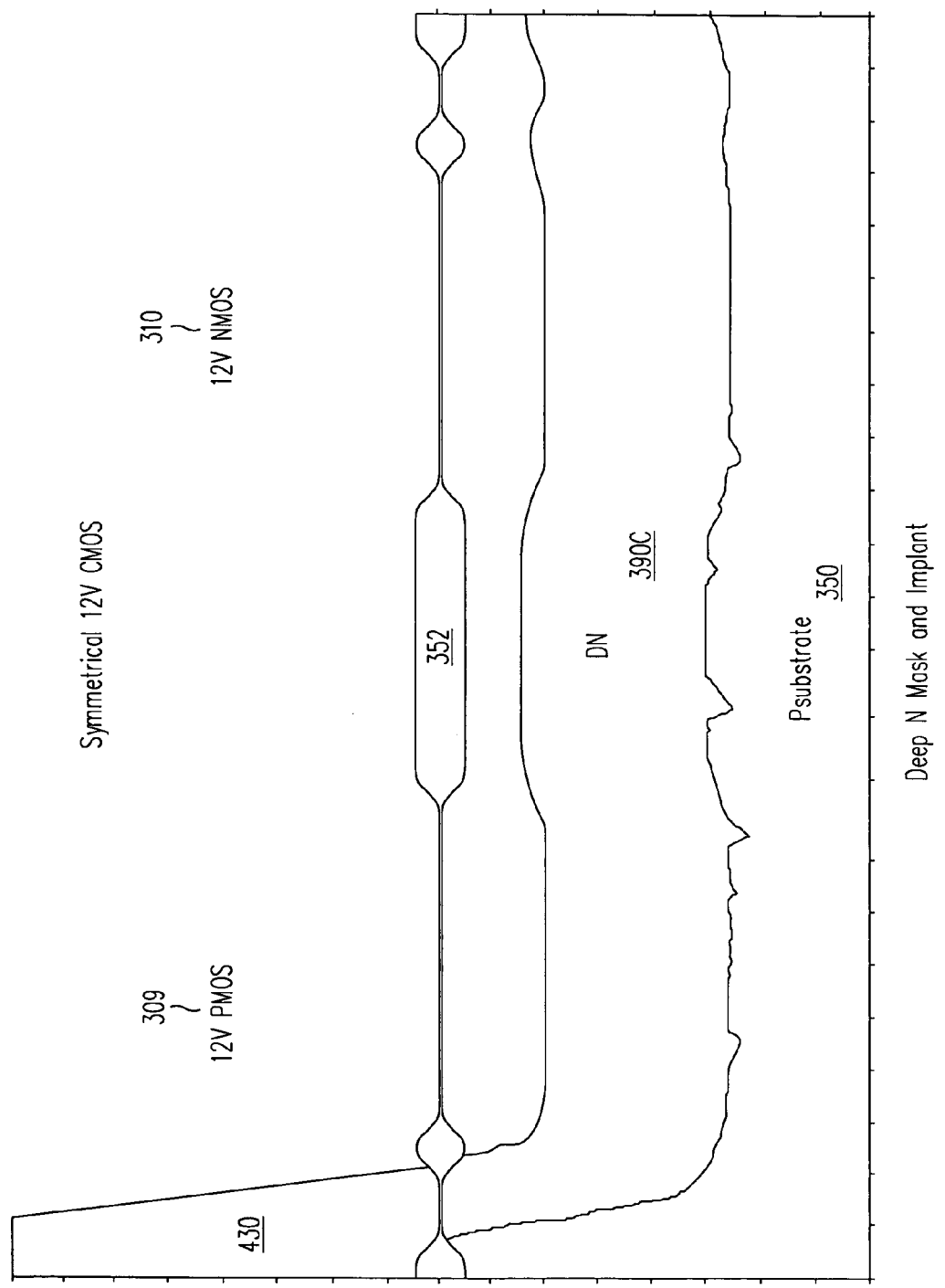

As shown in FIGS. 35A–35E, a photoresist mask layer 430 is deposited and photolithographically patterned to form openings in all areas except where the illustrated lateral trench DMOS is to be formed (FIG. 35D). Other trench DMOS variants which use a deep N (DN) layer in part of their structure would in fact also be masked and patterned to receive the implant. An N-type dopant is implanted through the openings in mask layer 430 to form the deep N (DN) layers. In the areas of the 5V PNP and 5V NPN (both the high $f_T$ and conventional layouts) deep N layers 390A and 390B are formed (FIGS. 35B and 35C). In the area of the symmetrical 12V CMOS, deep N layer 390C is formed (FIG. 35E). In the area of 5V NMOS 302, a deep N layer 390G is formed. (Note that this is a variation from the embodiment shown in FIG. 18A-1, where 5V NMOS 302 has no underlying deep N layer and is thus not isolated from substrate 350.) Deep N layer 390 could be formed, for example, by implanting phosphorus at a dose of 1E13 to 5E14 $cm^{-2}$ but typically at a dose of 5E13 $cm^{-2}$ and an energy of 1.5 MeV to 3 MeV but typically at 2.0 MeV. This would produce a deep N layer having a doping concentration of approximately 1E18 $cm^{-3}$ and a range of 2 to 3 μm below the surface of substrate 350 and a straggle of 0.3 μm. At 2 MeV, the thickness of the isolated P substrate above the DN layer without the addition of a P well is approximately 1 μm.

After the deep N implant has been completed, mask layer 430 is removed.

As shown in FIGS. 36D and 37D, a photoresist mask layer 432 is deposited and photolithographically patterned to form an opening in the area of 30V lateral trench DMOS 308. An N-type dopant is implanted in two stages through the opening in mask layer 432. The structure after the first implant is shown in FIG. 36D and the structure after the second implant is shown in FIG. 37D, together the implants constituting a chained implant drift region. The first implant can be phosphorus at a dose of 3E12 $cm^{-2}$ and an energy of 190 keV; the second implant can be phosphorus at a dose of 1.7E12 $cm^{-2}$ and an energy of 225 keV. This would form the shallower drift portions 391 A of the N-drift region, having a doping concentration of approximately 1E16 $cm^{-3}$, where the dopant passes through field oxide layer 352, and the deeper drift portions 393A of the N-drift region, having a doping concentration of approximately 4E16 $cm^{-3}$., where the dopant does not pass through field oxide region 352. In this embodiment, the shallower drift portions 391A abut the lower surface of field oxide layer 352 and the deeper drift portions 393A extend to the bottom of trenches 416. Of course any number of chained implants can be used to optimize the drift region as long as the total charge (total dopant implanted Q) remains relatively unaltered by decreasing the implant doses commensurate with number of implants being performed.

Mask layer 432 is stripped and a photoresist mask layer 434 is deposited and photolithographically patterned to have an opening in the area of the 12V symmetrical CMOS. An N-type dopant is implanted through the opening in mask layer 434 in two stages, shown in FIGS. 38E and 39E, respectively, to form N well 380B for 12V PMOS 309. The first stage may be phosphorus implanted at a dose of 1E12 $cm^{-2}$ and an energy of 250 keV. The second stage may be phosphorus implanted at a dose of 3E13 $cm^{-2}$ and an energy of 1 MeV. This would produce an N well 380B having a doping concentration in the range of approximately 5E16 $cm^{-3}$. An added implant, for example, an extra 7E12 $cm^{-2}$ may be also included at an intermediate energy such as 600 keV.

Mask layer 434 is removed and replaced by a photoresist mask layer 436, which is photolithographically patterned to have openings in the areas of 5V PMOS 301, 5V NPN 305, 5V PNP 306, 30V lateral trench DMOS 308 and 12V PMOS 309. An N-type dopant is implanted through these openings in three stages, yielding the structures shown in FIGS. 40A–40E, 41A–41E and 42A–42E, respectively. This forms the N well 354A (body) in 5V PMOS 301; N well 354C, which forms part of the collector in 5V NPN 305; N well 354D, which forms part of the base in 5V PNP 306 ("high $f_T$" version only); N well 354E, which forms part of wrap-around "floor isolation" region for 5V PNP 306; N well 354F, which forms part of the drain in 30V lateral trench DMOS 308; and isolation regions 354G in 12V PMOS 309. The first stage may be phosphorus implanted at a dose of 5E12 $cm^{-2}$ and an energy of 500 keV. The second stage may be phosphorus implanted at a dose of 6E11 $cm^{-2}$ and an energy of 250 keV. The third stage may be phosphorus implanted threshold adjust at a dose of 3E11 cm$^{-2}$ and an energy of 60 keV. This would produce N-type regions having a doping concentration of approximately in the range of 6E16 to 1E17 cm$^{-3}$.

Mask layer 436 is removed and replaced by a photoresist mask layer 438, which is photolithographically patterned to have openings in 5V PNP 306 and 12V NMOS 310. A P-type dopant is implanted through these openings in two stages, yielding the structures shown in FIGS. 43B, 43C, 43E, 44B, 44C and 44E. This forms P well 386B, which forms part of the collector in 5V PNP 306, and P well 386D, which forms the P well (body) for 12V NMOS 310. The first stage may be boron implanted at a dose of 4E13 cm$^{-2}$ and an energy of 500 keV. The second stage may be boron implanted at a dose of 2E13 cm$^{-2}$ and an energy of 100 keV. This would produce P-type regions having a doping concentration of in the range of approximately mid to high E16 cm$^{-3}$.

Mask layer 438 is removed and replaced by a photoresist mask layer 440, which is photolithographically patterned to have openings in 5V NMOS 302, 5V NPN 305, 5V PNP, and 12V NMOS 310. A P-type dopant is implanted through these openings in two stages, yielding the structures shown in FIGS. 45A, 45B, 45C, 45E, 46A, 46B, 46C and 46E. This forms P well 372A, which forms the P well (body) for 5V NMOS 302; double P well 372C, the base of 5V NPN 305; and region 372F, which helps to isolate 12V NMOS 310. The first stage may be boron implanted at a dose of 1E13 cm$^{-2}$ to 2E13 cm$^{-2}$ and an energy of 250 keV. The second stage may be boron implanted at a dose of 2E13 cm$^{-2}$ and an energy of 40 keV. This would produce P-type regions having a doping concentration in the low E17 cm$^{-3}$ range.

Mask layer 440 is removed and a photoresist mask layer 442 is deposited. Mask layer 442 covers only trenches 416 and the adjacent areas of 30V lateral trench DMOS 308. Mask layer 440 is shown in FIG. 47D. The remaining areas, which are the planar active regions of substrate 350, are then etched. (Note that the effects of the etch are not visible in the drawing.) Mask layer 442 is then removed.

As shown in FIGS. 48A and 48E, substrate 350 is heated to form a first gate oxide layer 444 in the MOS devices, i.e., 5V PMOS 301, 5V NMOS 302, 12V PMOS 309, and 12V NMOS 310. Substrate 350 can be heated to 800 to 1100° C. but preferably to 900° C. for 30 minutes to 4 hours, for example, but preferably for around 2 hours, to form a first gate oxide layer 444 that is 180 Å thick.

As shown in FIGS. 49A, 49E, 50A and 50E, an implant of a P-type dopant is performed, in two stages, to adjust the threshold voltage of the MOS devices, i.e., 5V PMOS 301, 5V NMOS 302, 12V PMOS 309, and 12V NMOS 310. As shown in FIGS. 49A and 49E, the first stage is a blanket (unmasked) implant that forms threshold adjust regions 446 in all four MOS devices. The first stage can be performed with boron at a dose of 2E11 cm$^{-2}$ and an energy of 60 keV. This implant is so light that it has no appreciable effect on the operation of the other devices in substrate 350. The second stage, shown in FIGS. 50A and 50E, is performed with a photoresist mask layer 448 in place, which covers all areas except for 5V PMOS 301 and 5V NMOS 302, and forms threshold adjust regions 450 in those devices. The second stage can be performed with boron at a dose of 8E11 to 2E12 cm$^{-2}$ and an energy of 60 keV.

After the second stage of the threshold adjust implant, and with mask layer 448 still in place, the first gate oxide layer 444 is etched from 5V PMOS 301 and 5V NMOS 302. With mask layer 448 still in place, first gate oxide layer 444 in 12V PMOS 309 and 12V NMOS 310 is not affected. Thereafter, mask layer 448 is removed.

As shown in FIGS. 51A and 51E, a second gate oxide layer 452 is grown in all areas of substrate 350. To form second gate oxide layer 452, substrate 350 may be heated to 800° C. to 1100° C. but preferably at 900° C. for 20 minutes to 2 hours, but commonly 50 minutes yielding a 150 Å-thick second gate oxide layer 452 in 5V PMOS 301 and 5V NMOS 302, where the first gate oxide layer 444 has been removed. In 12V PMOS 309 and 12V NMOS 310, since first gate oxide layer 444 is still present, the thicknesses of the first and second gate oxide layers 444, 452 are not additive. As a result, the combined thickness of first and second gate oxide layers 444, 452 in the 12V MOS devices is approximately 300 Å. To summarize, the gate oxide layer in the 5V MOS devices is approximately 150 Å thick; the gate oxide layer in the 12V MOS devices is approximately 300 Å thick. The growth of second gate oxide layer 452 does not significantly affect the structure or operation of the non-MOS devices.

As shown in FIGS. 52A, 52D and 52E, a third polysilicon layer 454 is deposited over all areas of substrate 350. Third polysilicon layer 454, which may be 2000 A thick, for example, is preferably a silicided layer, sometimes referred to as a "polycide". Next, as shown in FIGS. 53A, 53D and 53E, a photoresist mask layer 456 is deposited and photolithographically patterned, leaving relatively small sections of mask layer 456 in 5V PMOS 301, 5V NMOS 302, 30V lateral trench DMOS 308, 12V PMOS 309 and 12V NMOS 310. Polysilicon layer 454 is then etched. This leaves gate 358A in 5V PMOS 301, gate 358B in 5V NMOS 302, sections of polysilicon layer 454 in 30V lateral trench DMOS 308, gate 358E in 12V PMOS 309, and gate 358F in 12V NMOS 310. Mask layer 456 is removed.

As shown in FIGS. 54A–54E, a photoresist mask layer 458 is deposited and photolithographically patterned with openings in various devices, the openings defining those regions that are to receive the "N-base" phosphorus implant, whose primary function is to serve as the N-type base of PNP transistors including the base of 5V PNP 306. The dopant may be used in other devices in a non critical way, e.g. to improve contacts, lower resistance, reduce parasitics, etc. For example as shown in FIGS. 54A–54E, the N base implant is also used in the isolation contact window of PNP 306, but its function in the contact window is not as critical as it is in its role as the PNP base. In a similar manner, it may also be introduced between 5V PMOS 301 and 5V NMOS 302 in the contact window for the N well and isolation region; and in 5V NPN 305 in the collector contact window, in 30V lateral trench DMOS 308 in the drain contact window, in 12V PMOS 309 in the N well contact window. Maintaining the principal of modularity and device independence, the N base implant is not used to critically determine the performance of any other devices other than the various forms of PNP devices in the process. Mask layer 458 is removed.

As shown in FIGS. 55D and 55E, a photoresist mask layer 460 is deposited and photolithographically patterned with openings only in 30V lateral trench DMOS 308. A P-type dopant, typically boron, is implanted, as a chain implant (and specifically in the case shown in two stages) through the openings in mask layer 460, forming P body regions 395A in 30V lateral trench DMOS 308. The first stage of this implant can be boron at a dose of 3E12 cm$^{-2}$ and an energy of 190 keV. The second stage of this implant can be boron at a dose of 1.7E12 cm$^{-2}$ and an energy of 225 keV. This would produce P body regions 395A having a doping concentration of approximately 2.5E17 cm$^{-3}$. Mask layer 460 is removed. Maintaining the principal of modularity and device independence, the P body implant is not used to determine the performance of any devices other than the various lateral trench DMOS devices.

As shown in FIG. 57E, a photoresist mask layer 462 is deposited and photolithographically patterned with openings in 12V PMOS 309 and 12V NMOS 310. A P-type dopant, typically boron (herein referred to as a 12V P-LDD implant) is implanted through the openings to form lightly-doped drain (LDD) regions 363C and 363D on the sides of gate 358E in 12V PMOS 309. This implant can be performed with boron at a dose of 2E12 cm$^{-2}$ and an energy of 60 keV, yielding LLD regions 363C and 363D having a doping concentration of approximately $10^{17}$ cm$^{-3}$. Maintaining the principal of modularity and device independence, the 12V P-LDD implant is not used to determine the performance of any devices other than the various 12V PMOS devices. Mask layer 462 is removed.

As shown in FIG. 58E, a photoresist mask layer 464 is deposited and photolithographically patterned with openings in 12V NMOS 310. An N-type dopant, typically phosphorus (herein referred to as the 12V N-LDD implant) is implanted through the openings to form lightly-doped drain (LDD) regions 377C and 377D on the sides of gate 358F in 12V NMOS 310. The implant may also be introduced in non critical areas, e.g. the body contact in 12V NMOS 310. This implant can be performed with phosphorus at a dose of 2E12 cm$^{-2}$ and an energy of 80 keV, yielding LDD regions 377C and 377D having a doping concentration of approximately 8E16 cm$^{-3}$. Maintaining the principal of modularity and device independence, the 12V N-LDD implant is not used to determine the performance of any devices other than the various 12V NMOS devices. Mask layer 464 is removed.

As shown in FIGS. 59A–59D, a photoresist mask layer 466 is deposited and photolithographically patterned with openings in various devices, the openings of which define those regions receive the "5V P-LDD" boron implant, whose primary function is to serve as the drift or LDD in various 5V PMOS transistors including the LDD of 5V PMOS 301. The dopant may be used in other devices in a non critical way, e.g. to improve contacts, lower resistance, reduce parasitics, etc. For example as shown in FIGS. 59A–59D, the 5V P-LDD implant is also used in the P well contact window of 5V NMOS 302, in the base contact window of 5V NPN 305, in the emitter and collector contact windows of 5V PNP 306, and in the P body contact window of 30V lateral trench DMOS 308. This implant can be performed with boron at a dose of 5E12 cm$^{-2}$ and an energy of 60 keV, yielding P-type regions having a doping concentration of approximately 7E16 cm$^{-3}$. Maintaining the principal of modularity and device independence, the 5V P-LDD implant is not used to determine the performance of any devices other than the various 5V PMOS devices. Mask layer 466 is removed.

As shown in FIGS. 60A–60D, a photoresist mask layer 468 is deposited and photolithographically patterned with openings in various devices, the openings defining those regions that are to receive the "5V N-LDD", a phosphorus or arsenic implant whose primary function is to serve as the drift or LDD in various 5V NMOS transistors including the LDD of 5V NMOS 302. The dopant may be used in other devices in a non critical way, e.g. to improve contacts, lower resistance, reduce parasitics, etc. For example, as shown in FIGS. 60A–60D, the 5V N-LDD implant is also used in the N well contact window of 5V PMOS 301, in the emitter and collector contact windows of 5V NPN 305, in the base contact window of 5V PNP 306, and in the source/drain contact windows of 30V lateral trench DMOS 308. This implant can be performed with phosphorus or arsenic at a dose of 8E12 cm$^{-2}$. With phosphorus the energy could be 60 keV and with arsenic the energy could be 140 keV. This would yield N-type regions having a doping concentration of approximately 3E17 cm$^{-3}$. Mask layer 468 is removed.

An oxide layer is deposited on the surface of substrate and is then anisotropically etched in a reactive ion etcher using well known methods This removes the oxide from the horizontal surfaces, but leaves oxide spacers 470 on the vertical sidewalls of gates 358A, 358B in 5V PMOS 301 and 5V NMOS 302, respectively; oxide spacers 472 on the vertical sidewalls of field plate 454 in 30V lateral trench DMOS 308 and oxide spacers 474 on the vertical sidewalls of gates 358E, 358F in 12V PMOS 309 and 12V NMOS 310, respectively. The resulting structure is shown in FIGS. 61A, 61D and 61E.

As shown in FIGS. 62A–62E, a photoresist mask layer 476 is deposited and photolithographically patterned with openings in all of the devices. A P-type dopant is implanted through these openings, forming P+ source/drain regions 364A, 364B in 5V PMOS 301, a well contact region in 5V NMOS 302, P+ base contact region 364E in 5V NPN 305, P+ emitter and collector contact regions 364F and 364G in 5V PNP 306, P+ body contact region 364I in 30V lateral trench DMOS 308, P+ source/drain regions 364J and 364K in 12V PMOS 309, and P+ body contact region in 12V NMOS 310. This implant could be boron or BF2 at a dose of 2E15 cm$^{-2}$ to 9E15 cm$^{-2}$, but typically at 5E15 cm$^{-2}$ and an energy of 60 keV, yielding P+ regions having a doping concentration of 8E19 cm$^{-3}$. While P+ is used in many device structures, it has minimal effect on setting device characteristics. Mask layer 476 is removed.

As shown in FIGS. 63A–63E, a photoresist mask layer 478 is deposited and photolithographically patterned with openings in all of the devices. An N-type dopant is implanted through these openings, forming a well contact region in 5V PMOS 301, N+ source/drain regions 378A, 378B in 5V NMOS 302, N+ emitter and collector regions 378E and 378F in 5V NPN 305, N+ base contact regions in 5V PNP 306, N+ source and drain contact regions 378I, 378J in 30V lateral trench DMOS 308, N well contact region in 12V PMOS 309, and N+ source/drain regions 378K and 378L in 12V NMOS 310. This implant could be arsenic or phosphorus at a dose of 4E15 cm$^{-2}$ to 9E15 cm$^{-2}$ and an energy of 40 keV to 80 keV, yielding N+ regions having a doping concentration of 8E19 cm$^{-3}$. While N+ is used in many device structures, it has minimal effect on setting device characteristics. Mask layer 478 is removed.

As shown in FIGS. 64A–64E, an interlayer dielectric 480 is deposited over the surface of substrate 350. Interlayer dielectric could be borophosphosilicate glass (BPSG) or any other glass, deposited by CVD or spin coating to a thickness of 2000 A to 7000 A. A photoresist mask layer 482 is deposited on interlayer dielectric 480 and lithographically patterned with openings where electrical contact is to be made to substrate 350. Interlayer dielectric is etched through the openings in mask layer 482, and mask layer 482 is removed.

As shown in FIGS. 65A–65E, a photoresist mask layer 484 is deposited and photolithographically patterned with openings over certain of the openings in interlayer dielectric 480. An N-type dopant is implanted through the openings in mask layer 484 to form "N-plug" regions. The N-plug regions are heavily doped and improve the ohmic contact between the metal layer to be deposited later and the N-type regions of substrate 350. Note that since the N-type dopant enters the N+ regions previously formed the N-plug regions are not visible in FIGS. 18A-1 to 18A-4, 18B-1 to 18B-4, or 65A–65E. The N-plug implant could be phosphorus or arsenic at a dose of 6E19 cm$^{-2}$ and an energy of 30 keV, yielding shallow N-plug regions of nearly degenerate doping. Mask layer 484 is removed.

As shown in FIGS. 66A–66E, a P-type dopant is implanted through the openings in interlayer dielectric 480 to form "P-plug" regions. The p-plug regions are heavily doped and improve the ohmic contact between the metal layer to be deposited later and the P-type regions of substrate 350. The P-plug implant could be boron at a dose of 6E15 cm$^{-2}$ and an energy of 40 keV, yielding P-plug regions having very shallow nearly degenerately doped layers. The boron P-plug doping is not sufficient to counterdope the N-plug implants and therefore does not require a mask to restrict it to the P+ areas.

Finally, as shown in FIGS. 67A–67E, a metal layer 486 is deposited on the top surface of interlayer dielectric 480, filling the openings in interlayer dielectric 480 and making electrical contact with the underlying regions of substrate 350. Metal layer 486 could be Al/Si/Cu deposited by sputtering or co-evaporation to a thickness of 5000 A. A photoresist mask layer (not shown) is then deposited on metal layer 486 and patterned to form openings. Metal layer 486 is etched through the openings in the mask layer to separate the portions of metal layer 486 that are in electrical contact with the various terminals of the devices formed in substrate 350. The mask layer is then removed.

Subsequent process steps include the common steps involved in multilayer metal IC processes including the deposition of another interlayer dielectric such as spin on glass, an optional etchback or CMP planarization of the glass, followed by a photo-masking step (via mask) and etch, a tungsten deposition, a tungsten etch-back or CMP planarization. A second metal layer (not shown) is next deposited, generally by sputtering Al—Cu to a thickness greater than the thickness of metal layer 486, e.g. 7000 A, followed by a photo-masking and dry etching of the second metal layer.

Similarly, an optional third metal layer process includes common steps involved in multilayer metal IC processes including the deposition of a second interlayer dielectric such as spin on glass, a CMP planarization of the glass, followed by a photo-masking step (via 2 mask) and etch, a tungsten deposition, a tungsten etch-back or CMP planarization. A third metal layer is then deposited, generally by sputtering Al—Cu to a thickness greater than 1 um (but as thick as 4 um), followed by a photo-masking and dry etching of the third metal layer.

The final steps involve the CVD deposition of passivation material such as SiN (silicon nitride) to a thickness of 1000 A to 5000 A, followed by a passivation (pad) masking operation to open bonding pad regions.

This completes the fabrication of 5V PMOS 301, 5V NMOS 302, 5V NPN 305, 5V PNP 306, 30V lateral trench DMOS 308, 12V PMOS 309, and 12V NMOS 310. It will be understood that the additional interlayer dielectrics and metal layers described briefly can be deposited over the structure to facilitate making contact with the terminals of these devices and to reduce the interconnect resistance of such connections.

The embodiments described above are illustrative only and not limiting. Many alternative embodiments in accordance with the broad principles of this invention will be apparent to those skilled in the art.

We claim:

1. A CMOS arrangement of transistors formed in a semiconductor substrate, said substrate being doped with P-type impurity and not comprising an epitaxial layer, said CMOS arrangement comprising a CMOS pair, said CMOS pair comprising a PMOS and an NMOS, said PMOS comprising:
an N well having a relatively deep central portion and relatively shallow side portions, said relatively shallow side portions underlying a field oxide layer, said relatively deep central portion underlying a first opening in said field oxide layer, said N well having a breakdown voltage relative to said substrate;
a first gate overlying a channel region of said N well and separated from said substrate by a first gate oxide layer;
a P-type source region located at the surface of said substrate on one side of said first gate; and
a P-type drain region located at the surface of said substrate on an opposite side of said first gate from said P-type source region; and
electrical contacts connected to said first gate, P-type source region, P-type drain region and N well of said PMOS;
wherein said N well comprises an implanted N layer, said N layer comprising a deep section in said central portion of said N well, shallow sections in said side portions of said N well, and transition sections connecting said deep section and said shallow sections of said N layer, each vertical cross-section of said N layer comprising a location of peak doping concentration; said locations of peak doping concentration being relatively deep in said substrate in said deep section of said N layer and being at a shallower level in said substrate in said shallow sections of said N layer, the doping concentration of said N well at said surface of said substrate in said side portions of said N well being higher than the doping concentration of said N well at said surface of said substrate in said central portion of said N well; said NMOS comprising:
a P well having a relatively deep central portion and relatively shallow side portions, said relatively shallow side portions of said P well underlying said field oxide layer, said relatively deep central portion of said P well underlying a second opening in said field oxide layer;
a second gate overlying a channel region of said P well and separated from said substrate by a second gate oxide layer;
an N-type source region located at the surface of said substrate on one side of said second gate; and
an N-type drain region located at the surface of said substrate on an opposite side of said second gate from said N-type source region; and
electrical contacts connected to said second gate, N-type source region, N-type drain region and P well of said NMOS;
wherein said P well comprises an implanted P layer, said P layer comprising a deep section in said central portion of said P well, shallow sections in said side portions of said P well, and transition sections connecting said deep sections and said shallow sections of said P layer, each vertical cross-section of said P layer comprising a location of peak doping concentration; said locations of peak doping concentration being relatively deep in said substrate in said deep section of said P layer and being at a shallower level in said substrate in said shallow sections of said P layer, the doping concentration of said P well at said surface of said substrate in said side portions of said P well being higher than the doping concentration of said P well at said surface of said substrate in said central portion of said P well.

2. The CMOS arrangement of claim 1 wherein said PMOS has a maximum operating voltage and a field region of said N well under said field oxide layer has a field threshold voltage substantially greater than said maximum operating voltage of said PMOS, and wherein said NMOS has a maximum operating voltage and a field region of said P well under said field oxide layer has a field threshold voltage substantially greater than said maximum operating voltage of said NMOS.

3. The CMOS arrangement of claim 2 wherein said maximum operating voltage of said PMOS is less than 7 volts and said field threshold voltage of said field region of said N well is greater than 13.2 volts.

4. The CMOS arrangement of claim 2 wherein said breakdown voltage of said N well to said substrate is greater than 13.2 volts.

5. The CMOS arrangement of claim 2 wherein said maximum operating voltage of said NMOS is less than 7 volts and said field threshold voltage of said field region of said P well is greater than 13.2 volts.

6. The CMOS arrangement of claim 2 wherein said maximum operating voltage of said PMOS is less than 4 volts and said field threshold voltage of said field region of said N well is greater than 7 volts.

7. The CMOS arrangement of claim 6 wherein said breakdown voltage of said N well to said substrate is greater than 6.5 volts.

8. The CMOS arrangement of claim 2 wherein said maximum operating voltage of said NMOS is less than 4 volts and said field threshold voltage of said P well is greater than 7 volts.

9. The CMOS arrangement of claim 2 wherein said maximum operating voltage of said PMOS is less than 4 volts and said field threshold voltage of said N well is greater than 13.2 volts.

10. The CMOS arrangement of claim 9 wherein said breakdown voltage of said N well to said substrate is greater than 13.2 volts.

11. The CMOS arrangement of claim 2 wherein NMOS said maximum operating voltage of said NMOS is less than 4 volts and said field threshold voltage of said P well is greater than 13.2 volts.

12. The CMOS arrangement of claim 2 wherein said maximum operating voltage of said PMOS is less than or equal to 13.2 volts and said field threshold voltage of said N well is greater than 18 volts.

13. The CMOS arrangement of claim 12 wherein said breakdown voltage of said N well to said substrate is greater than 18 volts.

14. The CMOS arrangement of claim 2 wherein said maximum operating voltage of said NMOS is less than or equal to 13.2 volts and said field threshold voltage of said P well is greater than 18 volts.

15. The CMOS arrangement of claim 2 wherein said locations of peak doping concentration are at the surface of said substrate in said shallow sections of said N layer.

16. The CMOS arrangement of claim 2 wherein said locations of peak doping concentration are at the surface of said substrate in said shallow sections of said P layer.

17. The CMOS arrangement of claim 2 wherein said N well is biased to a positive voltage with respect to said substrate, said field threshold voltage of said N well being higher than said positive voltage.

18. The CMOS arrangement of claim 1 further comprising an isolation structure, said isolation structure comprising:
    an N layer located in said substrate and underlying said P well and at least a portion of said N well; and
    said N well, said N well laterally surrounding said P well, wherein said N layer extends laterally beyond said P well and said N well is sufficiently deep in said substrate such that said N well overlaps said N layer so as to form said isolation structure, said isolation structure isolating said P well from said P-type substrate.

* * * * *